US008001516B2

(12) United States Patent
Smith et al.

(10) Patent No.: US 8,001,516 B2
(45) Date of Patent: Aug. 16, 2011

(54) CHARACTERIZATION AND REDUCTION OF VARIATION FOR INTEGRATED CIRCUITS

(75) Inventors: Taber H. Smith, Fremont, CA (US); Vikas Mehrotra, Fremont, CA (US); David White, Cambridge, MA (US)

(73) Assignee: Cadence Design Systems, Inc., San Jose, CA (US)

( * ) Notice: Subject to any disclaimer, the term of this patent is extended or adjusted under 35 U.S.C. 154(b) by 452 days.

(21) Appl. No.: 12/131,833

(22) Filed: Jun. 2, 2008

(65) Prior Publication Data

US 2009/0031261 A1    Jan. 29, 2009

Related U.S. Application Data

(60) Division of application No. 11/005,651, filed on Dec. 6, 2004, now Pat. No. 7,383,521, which is a continuation of application No. PCT/US03/17655, filed on Jun. 4, 2003, and a continuation-in-part of application No. 10/321,298, filed on Dec. 17, 2002, now Pat. No. 7,367,008, and a continuation-in-part of application No. 10/321,290, filed on Dec. 17, 2002, now Pat. No. 7,325,206, and a continuation-in-part of application No. 10/321,281, filed on Dec. 17, 2002, now Pat. No. 7,243,316, and a continuation-in-part of application No. 10/321,283, filed on Dec. 17, 2002, now Pat. No. 7,174,520, and a continuation-in-part of application No. 10/321,777, filed on Dec. 17, 2002, now Pat. No. 7,353,475, and a continuation-in-part of application No. 10/200,660, filed on Jul. 22, 2002, now Pat. No. 7,363,099, and a continuation-in-part of application No. 10/164,842, filed on Jun. 7, 2002, now abandoned, and a continuation-in-part of application No. 10/164,844, filed on Jun. 7, 2002, now Pat. No. 7,124,386, and a continuation-in-part of application No. 10/164,847, filed on Jun. 7, 2002, now Pat. No. 7,152,215, and a continuation-in-part of application No. 10/165,214, filed on Jun. 7, 2002, now Pat. No. 7,393,755.

(51) Int. Cl.
*G06F 17/50* (2006.01)
*G06F 9/455* (2006.01)
*G06F 11/22* (2006.01)

(52) U.S. Cl. ......... 716/136; 716/100; 716/110; 716/132

(58) Field of Classification Search .................. 716/100, 716/110, 132, 136
See application file for complete search history.

(56) References Cited

U.S. PATENT DOCUMENTS 5,124,927 A    6/1992    Hopewell et al.
(Continued)

FOREIGN PATENT DOCUMENTS

EP    0453753    10/1991
(Continued)

OTHER PUBLICATIONS

Boning, D., et al., "Models for pattern dependencies: Cpaturing effects in oxide, sti, and copper cmp", Jul. 17, 2001, Seicon West, pp. 1-38.*

(Continued)

*Primary Examiner* — Stacy A Whitmore
(74) *Attorney, Agent, or Firm* — Vista IP Law Group, LLP

(57) ABSTRACT

A method and system are described to reduce process variation as a result of the semiconductor processing of films in integrated circuit manufacturing processes. The described methods use process variation and electrical impact to modify the design and manufacture of integrated circuits.

61 Claims, 172 Drawing Sheets

U.S. PATENT DOCUMENTS

| | | | |
|---|---|---|---|
| 5,433,651 A | 7/1995 | Lustig et al. |
| 5,581,475 A | 12/1996 | Majors |
| 5,597,668 A | 1/1997 | Nowak et al. |
| 5,655,110 A | 8/1997 | Krivokapic et al. |
| 5,663,076 A | 9/1997 | Rostoker et al. |
| 5,705,301 A | 1/1998 | Garza et al. |
| 5,763,955 A | 6/1998 | Findley et al. |
| 5,798,298 A | 8/1998 | Yang et al. |
| 5,821,621 A | 10/1998 | Jeng |
| 5,835,225 A | 11/1998 | Thakur |
| 5,838,448 A | 11/1998 | Aiyer et al. |
| 5,854,125 A | 12/1998 | Harvey |
| 5,861,342 A | 1/1999 | Gabriel et al. |
| 5,903,469 A | 5/1999 | Ho |
| 5,920,487 A | 7/1999 | Reich et al. |
| 5,923,563 A | 7/1999 | Lavin et al. |
| 5,923,947 A | 7/1999 | Sur |
| 5,948,573 A | 9/1999 | Takahashi |
| 5,972,541 A | 10/1999 | Sugasawara et al. |
| 6,049,789 A | 4/2000 | Frison et al. |
| 6,081,272 A | 6/2000 | Morimoto |
| 6,093,631 A | 7/2000 | Jaso |
| 6,109,775 A | 8/2000 | Tripathi et al. |
| 6,118,137 A | 9/2000 | Fulford et al. |
| 6,124,197 A | 9/2000 | Fulford |
| 6,157,947 A | 12/2000 | Watanabe et al. |
| 6,176,992 B1 | 1/2001 | Talieh |
| 6,230,299 B1 | 5/2001 | McSherry et al. |
| 6,249,904 B1 | 6/2001 | Cobb |
| 6,255,125 B1 | 7/2001 | Schmidt et al. |
| 6,259,115 B1 | 7/2001 | You et al. |
| 6,263,476 B1 | 7/2001 | Browen et al. |
| 6,289,499 B1 | 9/2001 | Rieger et al. |
| 6,309,956 B1 | 10/2001 | Chiang et al. |
| 6,323,113 B1 | 11/2001 | Gabriel et al. |
| 6,327,555 B1 | 12/2001 | Shimizu et al. |
| 6,328,872 B1 | 12/2001 | Talieh et al. |
| 6,343,370 B1 | 1/2002 | Taoka et al. |
| 6,344,408 B1 | 2/2002 | Chen et al. |
| 6,344,409 B1 | 2/2002 | Jaso et al. |
| 6,352,623 B1 | 3/2002 | Volodarsky et al. |
| 6,355,387 B1 | 3/2002 | Fujinaga et al. |
| 6,358,856 B1 | 3/2002 | Lyons et al. |
| 6,380,087 B1 | 4/2002 | Gupta et al. |
| 6,396,158 B1 | 5/2002 | Travis |
| 6,484,300 B1 | 11/2002 | Kim et al. |
| 6,486,066 B2 | 11/2002 | Cleaves et al. |
| 6,539,321 B2 | 3/2003 | Bruce et al. |
| 6,550,041 B1 | 4/2003 | McBride |
| 6,556,884 B1 | 4/2003 | Miller et al. |
| 6,556,947 B1 | 4/2003 | Scheiner et al. |
| 6,562,639 B1 | 5/2003 | Minvielle et al. |
| 6,567,964 B2 | 5/2003 | Shin et al. |
| 6,578,174 B2 | 6/2003 | Zizzo |
| 6,578,188 B1* | 6/2003 | Pang et al. ............ 716/19 |
| 6,611,045 B2 | 8/2003 | Travis et al. |
| 6,613,688 B1 | 9/2003 | Brown et al. |
| 6,625,801 B1 | 9/2003 | Pierrat et al. |
| 6,631,688 B1 | 9/2003 | Brown et al. |
| 6,651,226 B2 | 11/2003 | Houge et al. |
| 6,660,569 B1 | 12/2003 | Barthelmess et al. |
| 6,665,856 B1 | 12/2003 | Pierrat et al. |
| 6,671,570 B2 | 12/2003 | Schulze |
| 6,691,297 B1 | 2/2004 | Misaka et al. |
| 6,704,920 B2 | 3/2004 | Brill et al. |
| 6,708,129 B1 | 3/2004 | Pasadyn et al. |
| 6,708,318 B2 | 3/2004 | Satoh et al. |
| 6,742,165 B2 | 5/2004 | Lev et al. |
| 6,751,785 B1 | 6/2004 | Oh |
| 6,781,570 B1 | 8/2004 | Arrigo et al. |
| 6,795,952 B1 | 9/2004 | Stine et al. |
| 6,866,571 B1 | 3/2005 | Held |
| 6,866,974 B2 | 3/2005 | Kim et al. |
| 6,873,720 B2 | 3/2005 | Cai et al. |
| 6,893,800 B2 | 5/2005 | Jessen et al. |
| 6,904,581 B1 | 6/2005 | Oh |
| 7,124,386 B2 | 10/2006 | Smith et al. |
| 7,152,215 B2 | 12/2006 | Smith et al. |
| 7,174,520 B2 | 2/2007 | White et al. |
| 7,243,316 B2 | 7/2007 | White et al. |
| 7,325,206 B2 | 1/2008 | White et al. |
| 7,353,475 B2 | 4/2008 | White et al. |
| 7,356,783 B2 | 4/2008 | Smith et al. |
| 7,360,179 B2 | 4/2008 | Smith et al. |
| 7,363,099 B2 | 4/2008 | Smith et al. |
| 7,363,598 B2 | 4/2008 | Smith et al. |
| 7,367,008 B2 | 4/2008 | White et al. |
| 7,380,220 B2 | 5/2008 | Smith et al. |
| 7,383,521 B2 | 6/2008 | Smith et al. |
| 7,393,755 B2 | 7/2008 | Smith et al. |
| 2001/0031506 A1 | 10/2001 | Plat et al. |
| 2001/0052107 A1 | 12/2001 | Anderson et al. |
| 2002/0037655 A1 | 3/2002 | Hasunuma et al. |
| 2002/0045110 A1 | 4/2002 | Ohnuma |
| 2002/0051567 A1 | 5/2002 | Ganz et al. |
| 2002/0083401 A1* | 6/2002 | Breiner et al. .............. 716/4 |
| 2002/0106837 A1 | 8/2002 | Cleeves et al. |
| 2002/0157076 A1 | 10/2002 | Asakawa |
| 2002/0162082 A1 | 10/2002 | Cwynar et al. |
| 2003/0045100 A1 | 3/2003 | Saka et al. |
| 2003/0045115 A1* | 3/2003 | Fang .................... 438/710 |
| 2003/0084416 A1 | 5/2003 | Dai et al. |
| 2003/0107134 A1 | 6/2003 | Lee |
| 2003/0199150 A1 | 10/2003 | Permana et al. |
| 2003/0226757 A1 | 12/2003 | Smith et al. |
| 2003/0228714 A1 | 12/2003 | Smith et al. |
| 2003/0229410 A1 | 12/2003 | Smith et al. |
| 2003/0229412 A1 | 12/2003 | White et al. |
| 2003/0229479 A1 | 12/2003 | Smith et al. |
| 2003/0229868 A1 | 12/2003 | White et al. |
| 2003/0229875 A1 | 12/2003 | Smith et al. |
| 2003/0229880 A1 | 12/2003 | White et al. |
| 2003/0229881 A1 | 12/2003 | White et al. |
| 2003/0237064 A1 | 12/2003 | White et al. |
| 2004/0044984 A1 | 3/2004 | Keogan et al. |
| 2004/0058255 A1 | 3/2004 | Jessen et al. |
| 2004/0076896 A1 | 4/2004 | Kim et al. |
| 2004/0107410 A1 | 6/2004 | Misaka et al. |
| 2005/0037522 A1 | 2/2005 | Smith et al. |
| 2005/0051809 A1 | 3/2005 | Smith et al. |
| 2005/0132306 A1 | 6/2005 | Smith et al. |
| 2005/0196964 A1 | 9/2005 | Smith et al. |
| 2005/0235246 A1 | 10/2005 | Smith et al. |
| 2005/0235248 A1 | 10/2005 | Smith et al. |
| 2005/0238524 A1 | 10/2005 | Smith et al. |
| 2005/0289500 A1 | 12/2005 | Misaka et al. |
| 2007/0101305 A1 | 5/2007 | Smith et al. |
| 2007/0157139 A1 | 7/2007 | White et al. |
| 2007/0256039 A1 | 11/2007 | White |
| 2008/0160646 A1 | 7/2008 | White et al. |
| 2008/0162103 A1 | 7/2008 | White et al. |
| 2008/0163139 A1 | 7/2008 | Scheffer et al. |
| 2008/0163141 A1 | 7/2008 | Scheffer et al. |
| 2008/0163142 A1 | 7/2008 | White et al. |
| 2008/0163148 A1 | 7/2008 | Scheffer et al. |
| 2008/0163150 A1 | 7/2008 | White et al. |
| 2008/0216027 A1 | 9/2008 | White et al. |
| 2009/0031261 A1 | 1/2009 | Smith et al. |
| 2009/0031271 A1 | 1/2009 | White et al. |
| 2009/0199139 A1 | 8/2009 | White et al. |

FOREIGN PATENT DOCUMENTS

WO    WO 03079240    9/2003

OTHER PUBLICATIONS

Boning, D., "Pattern dependent modeling for cmp optimization and control", MRS Spring meeting, Proc. symposium P: Chemical mechanical poilshing: San Francisco, CA, Apr. 1999.*

Kim, Y., et al., "CHAMPS (CHemical-Mechanical Planarization Simulator)", International conference on Simulation of semiconductor processes and devices, Seattle, WA, Sep. 6-8, 2000., pp. 1-4.*

Park, T, et al., "Electrical Characterization of copper chemical mechanical polishing", Sematech, Austin, TX, Feb. 1999. pp. 1-8.*

Mehrotra, V., et al., Modeling the effects of manufacturing varaition on high-speed microprocessor interconnect perfromance, Annual ACM IEEE design automation conference, Los Angeles, CA, 2000. pp. 168-171.*

Stine, B. et al., "The physical and electrical effects of metal-fill patterning practices for oxide chemical-mechanical polishing processes", IEEE Mar. 1998, pp. 665-679.*

Stine, B et al., "A simulation methodology for assessing the impact of spatial/pattern dependent interconnect parameter variation on circuit performance", 1997, International electron cevices metting, Washington, DC., Dec. 1997, pp. 133-136.*

Stine, B. et al., "A closed-form analytic model for ILD thickness variation in CMP processes", Proc. CMP-MIC, Santa Calra, CA, Feb. 1997.*

Baker "Using Calibre in a Design for Manufacturing Environment" Deep Submicron Technical Publication, Mentor Graphics, Sep. 2001.

Boning, D. et al. "Statistical Metrology of Interlevel Dielectric Thickness Variation" Proceedings of the SPIE Symposium on Microelectronic Manufacturing, Oct. 1994, vol. 2334, pp. 316-327.

Boning, D. et al. "A General Semiconductor Process Modeling Framework" IEEE Transactions on Semiconductor Manufacturing, Nov. 1992, vol. 5, No. 4, pp. 266-280.

Chen, Y. et al. "Monte-Carlo Algorithms for Layout Density Control" Asia and South Pacific Design Automation Conference, Jan. 2002, pp. 523-528.

Chen, Y. et al. "Hierarchical Dummy Fill for Process Uniformity" Asia and South Pacific Design Automation Conference, Jan. 2001, pp. 139-144.

Chen, Y. et al. "Practical Iterated Fill Synthesis for CMP Uniformity" ACMIIEEE Design Automation Conference, Jun. 2000, pp. 671-674.

Conrad, et al. "Model Considerations, Calibration Issues, and Metrology Methods for Resist-Bias Models" in Metrology, Inspection, and Process Control for Microlithography XIII, B. Singh, ed., Proc. SPIE 3667, 1999, pp. 940-955.

Davis, J.C. et al. "Automatic Synthesis of Equipment Recipes from Specified Wafer-State Transitions" IEEE Transactions on Semiconductor Manufacturing, Nov. 1998, vol. 11, No. 4, pp. 527-536.

Hosack, H.H. et al. "Recent Advances in Process Synthesis for Semiconductor Devices" IEEE Transactions on Electron Devices, Mar. 1998, vol. 45, No. 3, pp. 626-633.

Kahng, A.B. et al. "New and Exact Filling Algorithms for Layout Density Control" UCLA Department of Computer SCience, Los Angeles, CA, 1999.

Kahng, A.B. et al. "Filling and Slotting: Analysis and Algorithms" International Symposium on Physical Design, Monterey, CA, 1998, pp. 95-102.

Kahng, A.B. et al. "New Multilevel and Hierarchical Algorithms for Layout Density Control" UCLA Department of Computer SCience, Los Angeles, CA, 1999.

Kahng, A.B. et al. "Filling Algorithms and Analyses for Layout Density Control" IEEE Transactions on Computer-Aided Design of Integrated Circuits and Systems, Apr. 1999, vol. 18, No. 4, pp. 445-462.

Lee, B. et al. "Using Smart Dummy Fill and Selective Reverse Etchback for Pattern Density Equalization" Proceedings CMP-MIC, Santa Clara, CA, Mar. 2000, pp. 255-258.

Lee et al. "Analyzing the Effects of Floating Dummy-Fills: From Feature Scale Analysis to Full-Chip RC Extraction" Proc. of IEDM 2001 et al., Dec. 2001.

Lee, K.-H. "Analyzing the Effects of Floating Dummy-Fills: From Feature Scale Analysis to Full-Chip RC Extraction" 2001, Samsung Electronics Co., Ltd., Korea.

Mehrotra, V. et al. "Technology Scaling Impact of Variation on Clock Skew and Interconnect Delay" International Interconnect Technology Conference (IITC), San Francisco, CA, Jun. 2001.

Mehrotra, V. et al. "Modeling the Effects of Manufacturing Variation on High-Speed Microprocessor Interconnect Performance" Annual ACM-IEEE Design Automation Conference, Los Angeles, CA, 2000, pp. 168-171.

McGhee, J. et al. "The MMST Computer-Integrated Manufacturing System Framework" IEEE Transactions of Semiconductor Manufacturing, May 1994, vol. 7, No. 2, pp. 107-116.

Moyne, W.P. "Enhancing MEMS Design Using Statistical Process Information" Massachusetts Institute of Technology, Department of Electrical Engineering and Computer Science, Apr. 7, 2000.

Ohta, et al. "A New SP (simultaneous polishing) Model for Copper CMP Processes" International Conference on Simualtion of Semiconductor Processes and Devices (SISPAD '02), Piscathaway, NJ, Sep. 4-6, 2002, pp. 257-260.

Ouma, D. et al. "An Integrated Characterization and Modeling Methodology for CMP Dielectric Planarization" International Interconnect Technology Conference, San Francisco, CA, Jun. 1998.

Ouma, D. et al. "An Integrated Characterization and Modeling Methodology for CMP Dielectric Planarization" Proceedings of Interconnect Technology Conference, Feb. 1998, pp. 67-69.

Park, T.H. et al. "Pattern Dependent Modeling of Electroplated Copper Profiles" International Interconnect Technology Conference (IITC), Jun. 2001.

Park, T. et al. "Pattern and Process Dependencies in Copper Damascene Chemical Mechanical Polishing Processes" VLSI Multilevel Interconnect Conference (VMIC), Santa Clara, CA, Jun. 1998.

Park, J.-K. et al. "An Exhaustive Method for Characterizing the Interconnect Capacitance Considered the Floating Dummy-Fills by Employing an Efficient Field Solving Algorithm" International Conference on Simulation ofSemiconductor Processes and Devices, 2000 pp. 98-101.

Peters, L. "Removing Barriers to Low-k Dielectric Adoption" Semiconductor International, May 1, 2002.

Sakurai, T. "Closed-Form Expressions for Interconnection Delay, Coupling, and Crosstalk in VLSI's" IEEE Transactions on Electron Devices, Jan. 1993, vol. 40, No. 1.

Saxena, S. et al. "A Methodology for the Top-down Synthesis of Semiconductor Process Flows" Proc. 3rd IEEEfSEMI International Symposium on Semiconductor Manufacturing, 1995, pp. 36-40.

Stine, B.E. "A General Methodology for Assessing and Characterizing Variation in Semiconductor Manufacturing" Thesis, Massachusetts Institute of Technology, Sep. 1997.

Stine, B.E. et al. "On the Impact of Dishing in Metal CMP Processes on Circuit Performance" International Workshop on Statistical Metrology Technical Papers, 1998, pp. 64-67.

Tian et al. "Model-Based Dummy Feature Placement for Oxide Chemical-Mechanical Polishing Manufacturability" Proceedings of the 37th Design Automation Conference, 2000, pp. 667-670.

Tuinhout, H.P. et al. "Characterization of Systematic MOSFET Current Factor Mismatch Caused by Metal CMP Dummy Structures" IEEE Transactions on Semiconductor Manufacturing, Nov. 2001, vol. 14, No. 4, pp. 302-312.

Tugbawa, T. et al. "A Mathematical Model of Pattern Dependencies in Cu CMP Processes" CMP Symposium, Electrochemical Society Meeting, Honolulu, HA, Oct. 1999.

Tugbawa, T. et al. "Integrated Chip-Scale Simulation of Pattern Dependencies in Copper Electroplating and Copper Chemical Mechanical Polishing Processes" International Interconnect Technology Conference, San Francisco, CA, Jun. 2002.

Tugbawa, T. et al. "Framework for Modeling of Pattern Dependencies in Multi-Step Cu CMP Processes" SEMICON West 2000, Jul. 11, 2000.

Tugbawa, T. et al. "Modeling of Pattern Dependencies for Multi-Level Copper Chemical-Mechanical Polishing Processes" Material Research Society Spring Meeting, San Francisco, CA Apr. 2001.

Zaman, M.H. et al. "Automatic Generation of Thin Film Process Flows—Part I: Basic Algorithms" IEEE Transactions on Semiconductor Manufacturing, Feb. 1999, vol. 12, No. 1, pp. 116-128.

Zaman, M.H. et al. "Automatic Generation of Thin Film Process Flows—Part II: Recipe Generation, Flow Evaluation, and System Framework" IEEE Transactions on Semiconductor Manufacturing, Feb. 1999, vol. 12, No. 1, pp. 129-138.

MIT Statistical Metrology Publications List, located at http://www-mtl.mit.edufMetrologyfPAPERSf, 1994-2003.

Singer. P. "Progress in Copper: A Look Ahead" Semiconductor International. May 1, 2002.

Smith, T.H. "Device Independent Process Control of Delectric Chemical Mechanical Polishing" Thesis, Massachusetts Institute of Technology, Sep. 1997.

Smith, T.H. "A CMP Model Combining Density and Time Dependencies" Proc. CMP-MIC, Santa Clara, CA, Feb. 1999.
International Search Report dated Nov. 24, 2004 for PCT Appl. No. PCT/US03/17655.
Supplemental European Search Report dated Apr. 26, 2007 for Appl. No. 03741876.1.
Office Action dated Jun. 17, 2004 for U.S. Appl. No. 10/200,660.
Office Action dated Feb. 11, 2005 for U.S. Appl. No. 10/200,660.
Advisory Action dated Aug. 1, 2005 for U.S. Appl. No. 10/200,660.
Office Action dated Jun. 16, 2006 for U.S. Appl. No. 10/200,660.
Notice of Allowance dated Jan. 18, 2007 for U.S. Appl. No. 10/200,660.
Notice of Allowance dated Nov. 13, 2007 for U.S. Appl. No. 10/200,660.
Office Action dated Jun. 28, 2004 for U.S. Appl. No. 10/321,298.
Office Action dated Dec. 15, 2004 for U.S. Appl. No. 10/321,298.
Office Action dated Jul. 12, 2005 for U.S. Appl. No. 10/321,298.
Notice of Allowance dated Jan. 19, 2006 for U.S. Appl. No. 10/321,298.
Notice of Allowance dated May 15, 2006 for U.S. Appl. No. 10/321,298.
Notice of Allowance dated Oct. 18, 2006 for U.S. Appl. No. 10/321,298.
Notice of Allowance dated May 7, 2007 for U.S. Appl. No. 10/321,298.
Notice of Allowance dated Oct. 2, 2007 for U.S. Appl. No. 10/321,298.
Office Action dated Jul. 14, 2004 for U.S. Appl. No. 10/321,777.
Office Action dated Jun. 2, 2005 for U.S. Appl. No. 10/321,777.
Office Action dated Mar. 1, 2006 for U.S. Appl. No. 10/321,777.
Office Action dated Dec. 4, 2006 for U.S. Appl. No. 10/321,777.
Notice of Allowance dated Jan. 18, 2005 for U.S. Appl. No. 10/321,777.
Notice of Allowance dated Apr. 10, 2007 for U.S. Appl. No. 10/321,777.
Notice of Allowance dated Aug. 24, 2007 for U.S. Appl. No. 10/321,777.
Office Action dated Aug. 25, 2005 for U.S. Appl. No. 10/321,290.
Office Action dated Mar. 21, 2006 for U.S. Appl. No. 10/321,290.
Notice of Allowance dated Oct. 25, 2006 for U.S. Appl. No. 10/321,290.
Notice of Allowance dated Jul. 3, 2007 for U.S. Appl. No. 10/321,290.
Notice of Allowance dated Sep. 5, 2007 for U.S. Appl. No. 10/321,290.
Notice of Allowance dated Jun. 15, 2007 for U.S. Appl. No. 11/005,651.
Notice of Allowance dated Dec. 14, 2007 for U.S. Appl. No. 11/005,651.
Ohtsuka et al., "A Novel Multiple Focus Position Control Method by Conjugated Twin-Shifter Phase Shift Lithography", International Electron Devices Meeting, Dec. 8-11, 1991, pp. 59-62.
Sugihara et al., "Novel Annular Illumination Using Controlled Phase and Transparency", 1994 Symposium on VLSI Technology, Jun. 7-9, 1994, pp. 95-96.
Office Action dated Oct. 13, 2010 for U.S. Appl. No. 12/021,298.
Office Action dated Dec. 3, 2009 for U.S. Appl. No. 12/021,298.
Final Office Action dated May 10, 2010 for U.S. Appl. No. 12/021,298.

* cited by examiner

Symmetric

Asymmetric in one direction

Asymmetric in two directions

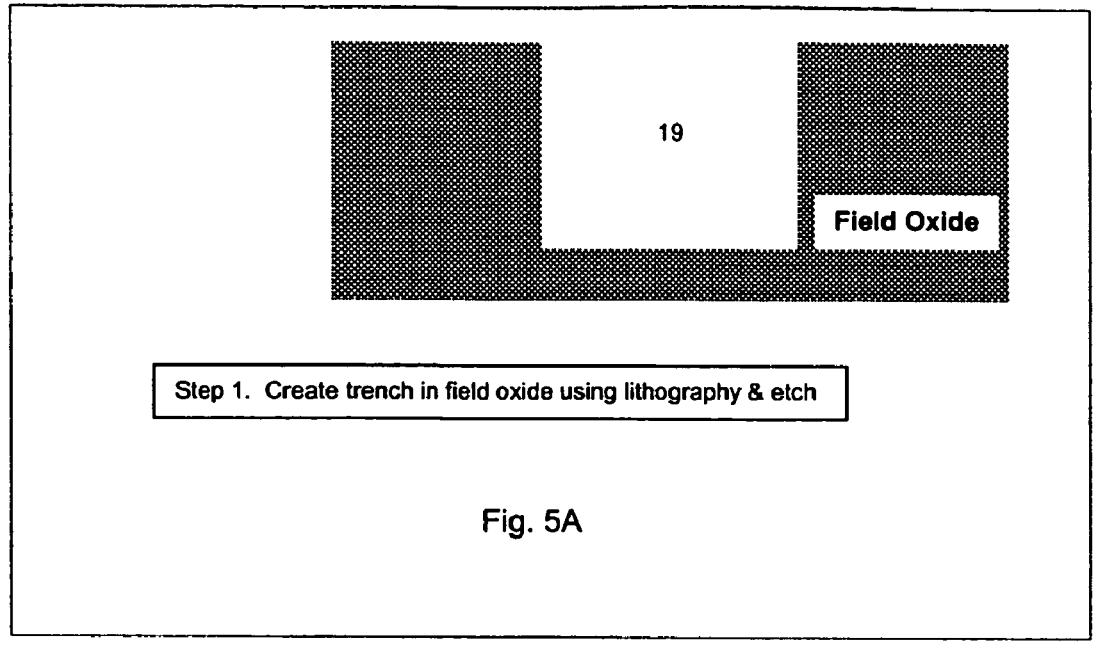
Fig. 5A
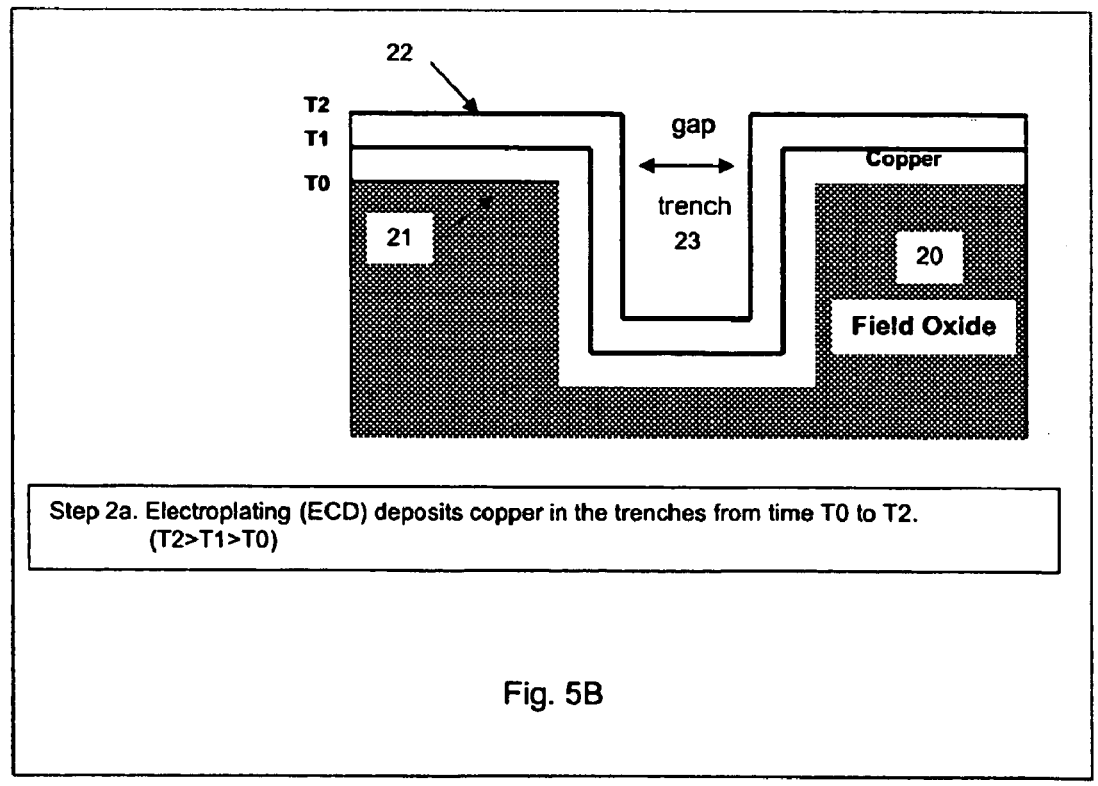
Fig. 5B
Fig. 5

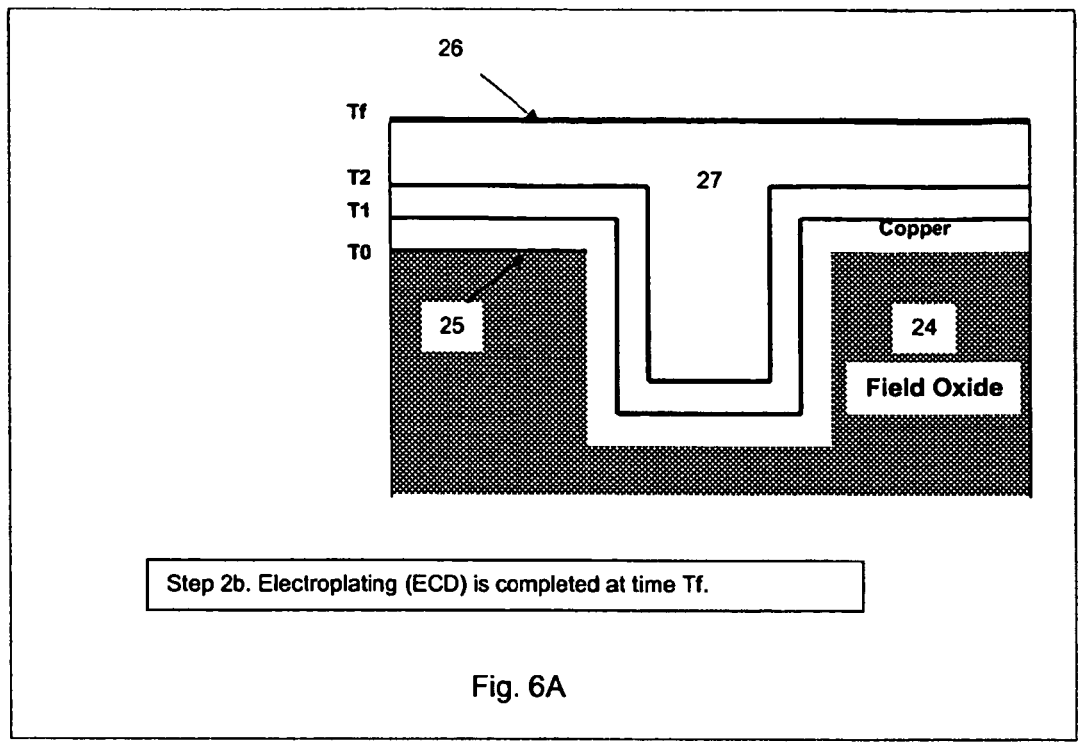
Fig. 6A
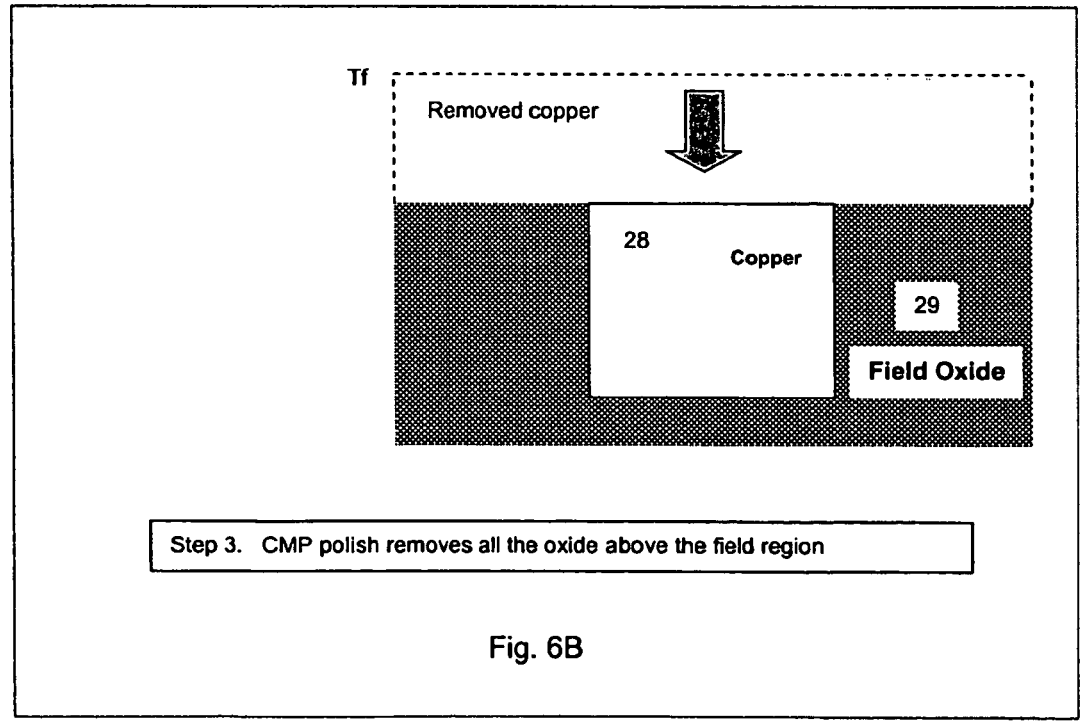
Fig. 6B
Fig. 6

| LW/LS | 0.75 | 1.00 | 1.25 | 1.50 | 1.75 | 2.00 | 2.25 | 2.50 | 2.75 | 3.00 | 3.25 | 3.50 | 3.75 | 4.00 | 4.25 | 4.50 | 4.75 | 5.00 |
|---|---|---|---|---|---|---|---|---|---|---|---|---|---|---|---|---|---|---|
| 0.25 | 0.00 | 0.00 | 0.00 | 0.00 | 0.00 | 0.00 | 0.00 | 0.00 | 0.00 | 0.00 | 0.25 | 0.25 | 0.25 | 0.25 | 0.25 | 0.25 | 0.25 | 0.50 |
| 0.50 | 0.00 | 0.00 | 0.00 | 0.00 | 0.00 | 0.00 | 0.00 | 0.25 | 0.25 | 0.25 | 0.25 | 0.25 | 0.25 | 0.50 | 0.50 | 0.50 | 0.50 | 0.50 |
| 0.75 | 0.00 | 0.00 | 0.00 | 0.00 | 0.00 | 0.00 | 0.25 | 0.25 | 0.25 | 0.25 | 0.25 | 0.50 | 0.50 | 0.50 | 0.50 | 0.75 | 0.75 | 0.75 |
| 1.00 | 0.00 | 0.00 | 0.00 | 0.00 | 0.00 | 0.25 | 0.25 | 0.25 | 0.25 | 0.50 | 0.50 | 0.50 | 0.50 | 0.75 | 0.75 | 0.75 | 1.00 | 1.00 |
| 1.25 | 0.00 | 0.00 | 0.00 | 0.00 | 0.00 | 0.25 | 0.25 | 0.25 | 0.25 | 0.50 | 0.50 | 0.50 | 0.75 | 0.75 | 1.00 | 1.00 | 1.00 | 1.25 |
| 1.50 | 0.00 | 0.00 | 0.00 | 0.00 | 0.25 | 0.25 | 0.25 | 0.25 | 0.50 | 0.50 | 0.50 | 0.75 | 0.75 | 1.00 | 1.00 | 1.25 | 1.25 | 1.25 |
| 1.75 | 0.00 | 0.00 | 0.00 | 0.00 | 0.25 | 0.25 | 0.25 | 0.50 | 0.50 | 0.50 | 0.75 | 0.75 | 1.00 | 1.00 | 1.25 | 1.25 | 1.50 | 1.50 |
| 2.00 | 0.00 | 0.00 | 0.00 | 0.25 | 0.25 | 0.25 | 0.25 | 0.50 | 0.50 | 0.75 | 0.75 | 1.00 | 1.00 | 1.00 | 1.25 | 1.25 | 1.50 | 1.75 |
| 2.25 | 0.00 | 0.00 | 0.00 | 0.25 | 0.25 | 0.25 | 0.50 | 0.50 | 0.50 | 0.75 | 0.75 | 1.00 | 1.00 | 1.25 | 1.25 | 1.50 | 1.75 | 1.75 |
| 2.50 | 0.00 | 0.00 | 0.00 | 0.25 | 0.25 | 0.25 | 0.50 | 0.50 | 0.75 | 0.75 | 1.00 | 1.00 | 1.25 | 1.25 | 1.50 | 1.50 | 1.75 | 2.00 |
| 2.75 | 0.00 | 0.00 | 0.00 | 0.25 | 0.25 | 0.25 | 0.50 | 0.50 | 0.75 | 0.75 | 1.00 | 1.00 | 1.25 | 1.50 | 1.50 | 1.75 | 1.75 | 2.00 |
| 3.00 | 0.00 | 0.00 | 0.00 | 0.25 | 0.25 | 0.50 | 0.50 | 0.50 | 0.75 | 1.00 | 1.00 | 1.25 | 1.25 | 1.50 | 1.50 | 1.75 | 2.00 | 2.00 |
| 3.25 | 0.00 | 0.00 | 0.25 | 0.25 | 0.25 | 0.50 | 0.50 | 0.75 | 0.75 | 1.00 | 1.00 | 1.25 | 1.25 | 1.50 | 1.75 | 1.75 | 2.00 | 2.25 |
| 3.50 | 0.00 | 0.00 | 0.25 | 0.25 | 0.25 | 0.50 | 0.50 | 0.75 | 0.75 | 1.00 | 1.00 | 1.25 | 1.50 | 1.50 | 1.75 | 2.00 | 2.00 | 2.25 |
| 3.75 | 0.00 | 0.00 | 0.25 | 0.25 | 0.25 | 0.50 | 0.50 | 0.75 | 0.75 | 1.00 | 1.25 | 1.25 | 1.50 | 1.75 | 1.75 | 2.00 | 2.25 | 2.25 |
| 4.00 | 0.00 | 0.00 | 0.25 | 0.25 | 0.50 | 0.50 | 0.50 | 0.75 | 1.00 | 1.00 | 1.25 | 1.50 | 1.50 | 1.75 | 2.00 | 2.00 | 2.25 | 2.50 |
| 4.25 | 0.00 | 0.00 | 0.25 | 0.25 | 0.50 | 0.50 | 0.75 | 0.75 | 1.00 | 1.00 | 1.25 | 1.50 | 1.50 | 1.75 | 2.00 | 2.25 | 2.25 | 2.50 |
| 4.50 | 0.00 | 0.00 | 0.25 | 0.25 | 0.50 | 0.50 | 0.75 | 0.75 | 1.00 | 1.25 | 1.25 | 1.50 | 1.75 | 1.75 | 2.00 | 2.25 | 2.50 | 2.50 |
| 4.75 | 0.00 | 0.00 | 0.25 | 0.25 | 0.50 | 0.50 | 0.75 | 0.75 | 1.00 | 1.25 | 1.25 | 1.50 | 1.75 | 1.75 | 2.00 | 2.25 | 2.50 | 2.75 |
| 5.00 | 0.00 | 0.00 | 0.25 | 0.25 | 0.50 | 0.50 | 0.75 | 1.00 | 1.00 | 1.25 | 1.50 | 1.50 | 1.75 | 2.00 | 2.00 | 2.25 | 2.50 | 2.75 |

Note: Cannot add dummy fill for linespace less than (min_LW + 2*min_LS).

- LW range: 0.25 to 5.00 um
- LS range: 0.75 to 5.00 um
- LW/LS increment: 0.25 um

Fig. 17

| Fill Size Rule | Use | Reason |
|---|---|---|
| Large LW/Small LS | Metal dummy fill | • Large increase in pattern density<br>• Trade off: increased coupling capacitance |
| Small LW/Small LS | Oxide dummy fill | • ECD<br>• Trade-off: increased resistance |
| Small LW/Large LS | Metal or oxide fill (CMP) | • Smaller variation in R & C<br>• Trade-off: less uniform film thickness |
| Large LW/Large LS | Metal fill | • Lower coupling capacitance than small LS but less crosstalk noise<br>• Trade-off: less uniform film thickness |

Fig. 20A

| Fill Pattern Rule | Use | Reason |
|---|---|---|
| Symmetric | Oxide dummy fill | Maintain current flow (lowest resistance) |
| Asymmetric | Metal dummy fill | • Reduce coupling capacitance to neighboring signal lines<br>• Trade-off (vs. symmetric): harder to implement |
| Asymmetric (both directions) | Metal dummy fill | • Larger reduction in coupling capacitance<br>• Trade-off: hard to implement hierarchically |

Fig. 20B

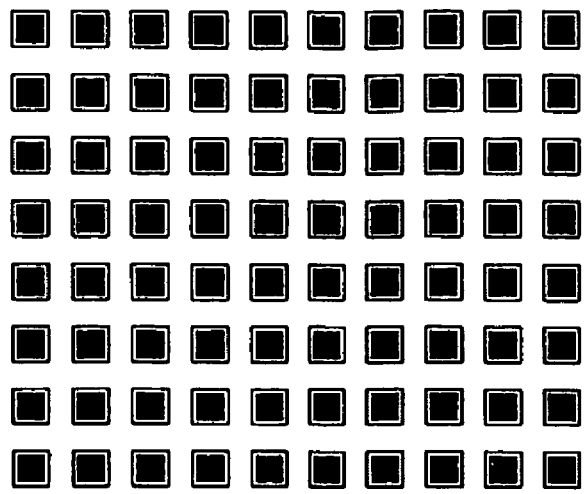
Fig. 21A
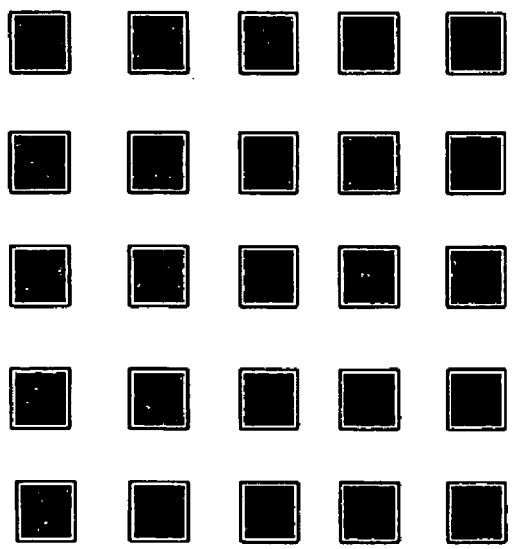
Fig. 21B
Fig. 21

Each 4 x 4 cell contains:
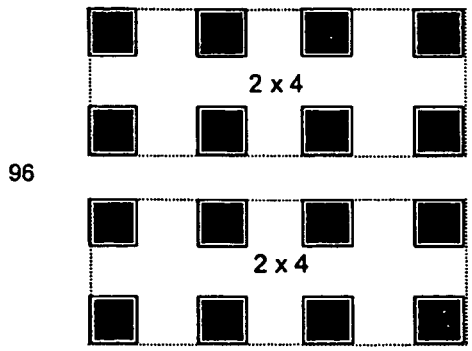
96      = Two (2 x 4) cells
Each 2 x 4 cell contains:
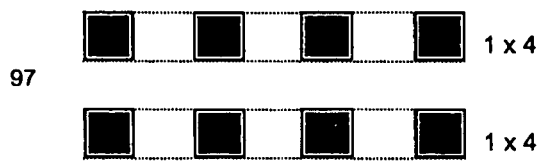
97      = Two (1 x 4) cells
Each 1 x 4 cell contains:
98      = Two (1 x 2) cells
Each 1 x 2 cell contains:
99      = Two dummy fill areas
+
_____
*Total:*    =  8 cells or objects required for 4x4 cell
Fig. 23

12036 A computer aided design (CAD) process is used to translate a circuit design to a design layout that represents various levels of an IC.

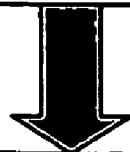

12037 Electronic layout design files are used to finalize a design or "tape-out" a design before creating lithography masks

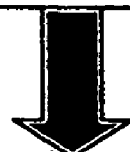

12038 Lithography masks are created

12039 Lithography masks are used with a lithography tool to print circuit patterns onto a wafer covered with photosensitive film.

Fig. 42

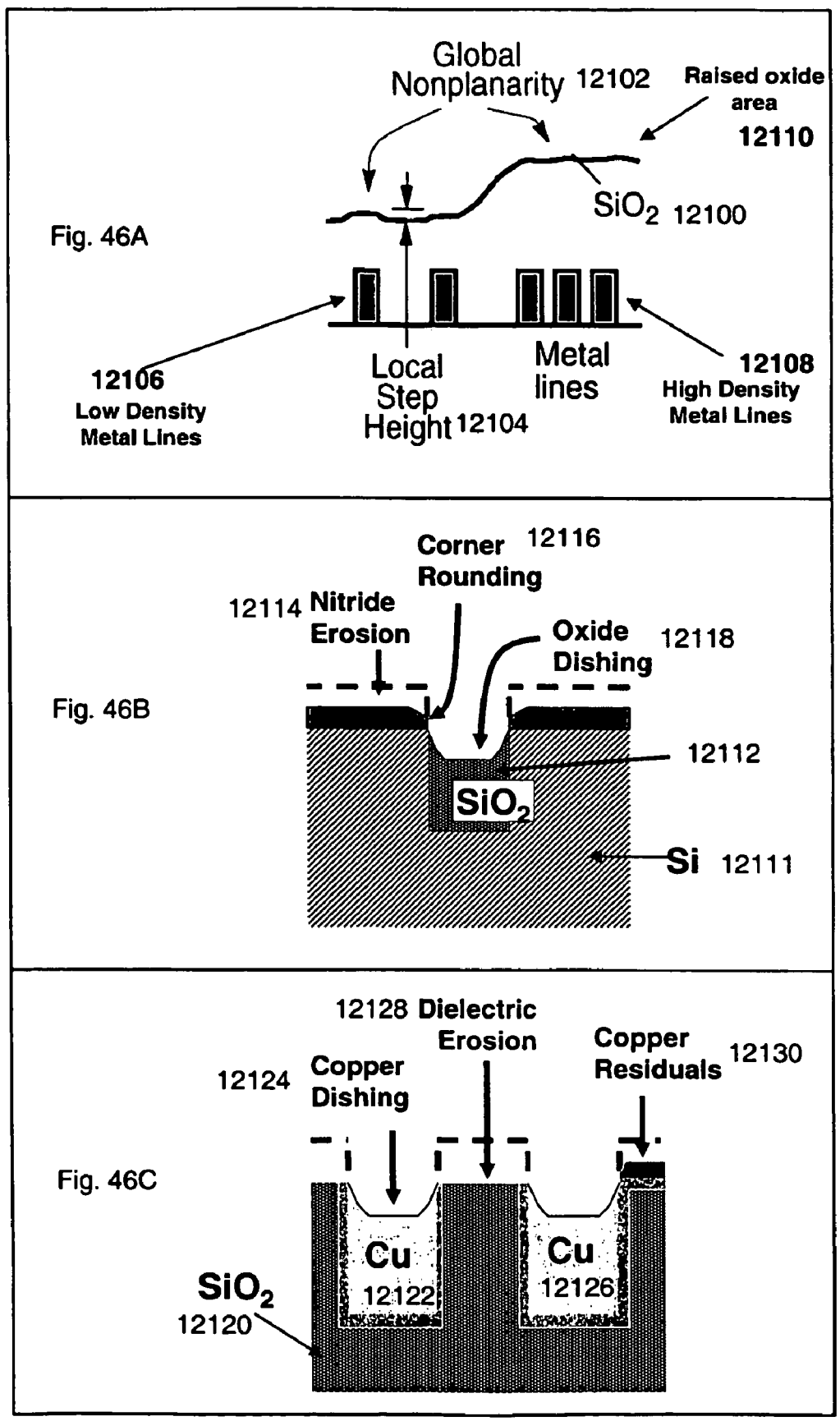

| 12540 | Prediction of Full-Chip Topography |

Continued from 12574, Fig. 61C

CMP topography predicted:
Full-chip prediction of physical parameters such as film thickness, erosion, dishing, array and step heights.
12575

12576
Electrical parameters and characteristics are extracted (Optional):
Electrical characteristics of resulting interconnect layer, such as sheet resistance, capacitance, drive current are predicted. Electrical parameters are used to verify electrical impact of the printed widths, in order to verify changes made to correct for lithography masks.

12577
Incoming wafer topography and layout parameters are loaded into ILD model (e.g. using oxide or low-k materials) which may take into account pattern dependencies.

Δh   Predicted film thickness variation
12580   (Δh) across full-chip

12578
Wafer topography stored in database or file system to be used in prediction at next interconnect level

Fig. 61D

| | |
|---|---|
| 13050 | METAL 2 |
| 13051 | VIA 1 |
| 13052 | METAL 1 |
| 13054 | ILD |
| 13056 | SILICON WAFER |

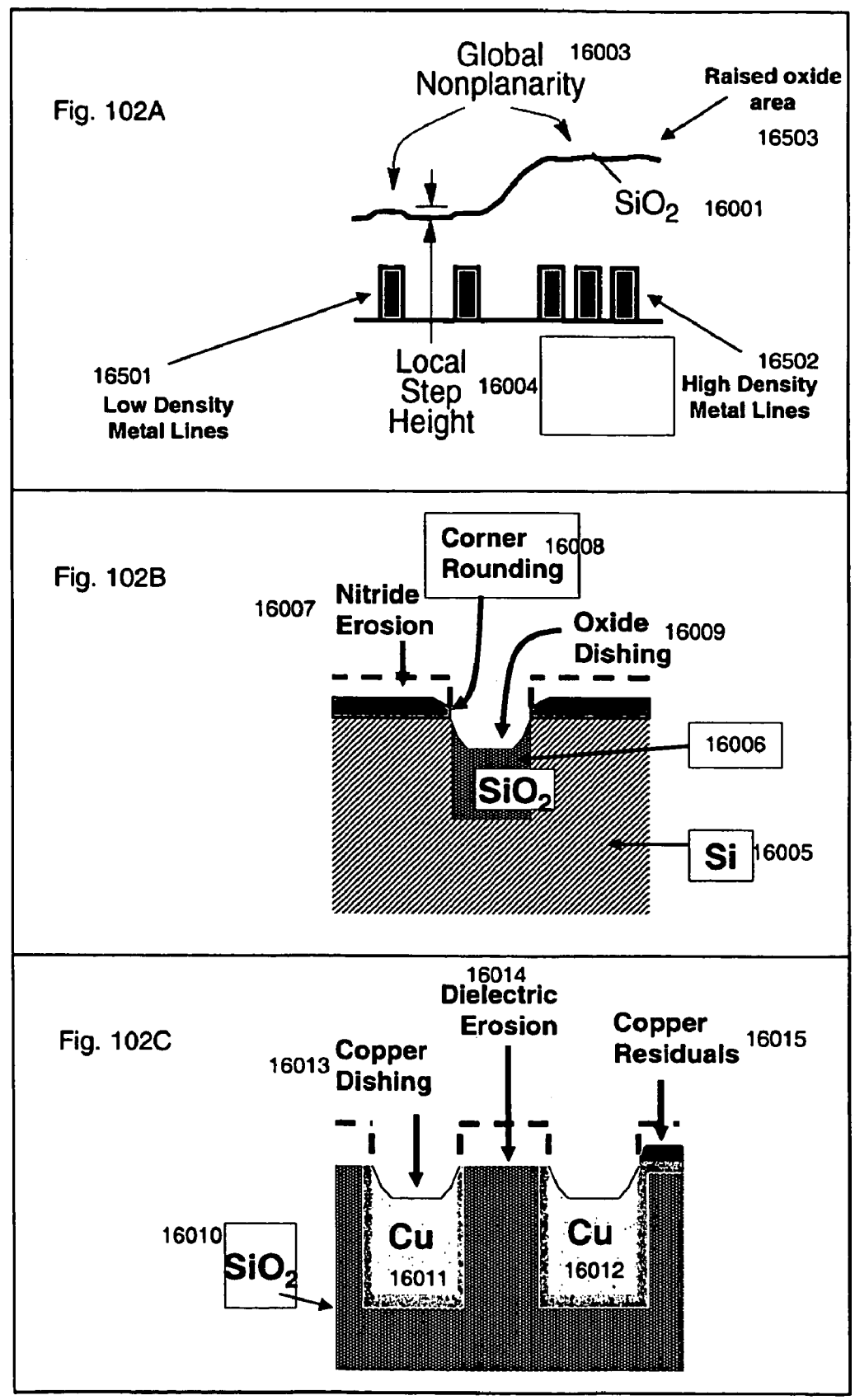

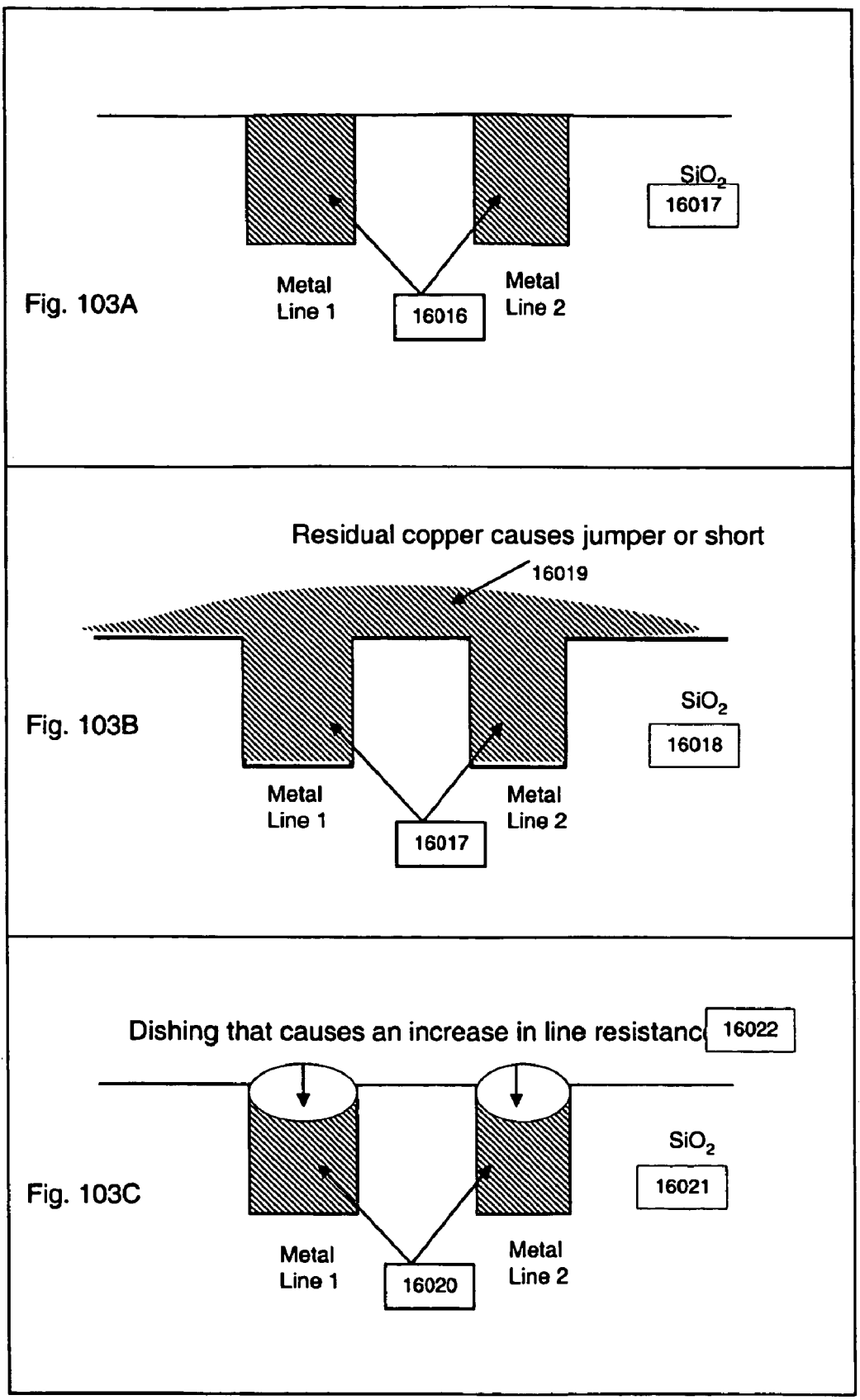

CHARACTERIZATION AND REDUCTION OF VARIATION FOR INTEGRATED CIRCUITS

CROSS-REFERNCE TO RELATED APPLICATIONS

This application is a divisional of Ser. No. 11/005,651 filed Dec. 6, 2004, now U.S. Pat. No. 7,383,521, which is a continuation of Patent Cooperation Treaty application serial number PCT/US03/17655, filed Jun. 4, 2003, which is a continuation-in-part of U.S. patent application Ser. No. 10/165,214, filed Jun. 7, 2002 now U.S. Pat. No. 7,393,755, a continuation-in-part of Ser. No. 10/164,844, filed Jun. 7, 2002 now U.S. Pat. No. 7,124,386, a continuation-in-part of Ser. No. 10/164,847, filed Jun. 7, 2002 now U.S. Pat. No. 7,152,215, a continuation-in-part of Ser. No. 10/164,842, filed Jun. 7, 2002now abandoned, a continuation-in-part of Ser. No. 10/200,660, filed Jul. 22, 2002 now U.S. Pat. No. 7,363,099, a continuation-in-part of Ser. No. 10/321,283, filed Dec. 17, 2002 now U.S. Pat. No. 7,174,520, a continuation-in-part of Ser. No. 10/321,298, filed Dec. 17, 2002 now U.S. Pat. No. 7,367,008, a continuation-in-part of Ser. No. 10/321,281, filed Dec. 17, 2002 now U.S. Pat. No. 7,243,316, a continuation-in-part of Ser. No. 10/321,777, filed Dec. 17, 2002 now U.S. Pat. No. 7,353,475, and a continuation-in-part of Ser. No. 10/321,290, filed Dec. 17, 2002 now U.S. Pat. No. 7,325,206, all of which are incorporated by reference here in their entireties.

BACKGROUND

This description relates to characterization and reduction of variation for integrated circuits. In fabricating integrated circuits, interconnect film thickness uniformity, dishing and erosion are dependent on variation in layout patterns (e.g. material density, linewidth and linespace). Surface non-uniformity often leads to subsequent manufacturability and process integration issues. These pattern dependencies may also affect device performance by introducing variation in capacitance and resistance depending on the location of a given structure on the device.

Film thickness variation in chemical mechanical polishing (CMP) processes can be separated into various components: lot-to-lot, wafer-to-wafer, wafer-level, and die-level. Oxide thickness variation due to CMP is mainly due to differences in layout patterns on the chip. Often, the most significant component is the pattern dependent or die-level component. The oxide is generally polished until all areas on the chip have been planarized. However, differences in the underlying metal pattern result in variation in the post CMP oxide thickness, even though a locally planar layer of oxide is achieved with CMP.

For oxide polishing, the major source of variation is caused by within die pattern density. Pattern density is defined as the ratio of raised oxide area divided by the total area of the region. The region may be taken as a square with the length of the sides equal to some length, the planarization length. The planarization length is usually determined by process factors such as the type of polishing pad, CMP tool, slurry chemistry, etc. The effective pattern density may be computed for each location on the die by filtering the designed layout densities, often by using various two-dimensional filters of densities around the given location.

For metal polishing in a damascene CMP process, other physical layout effects such as the linewidth and linespace may also be required. Two effects known as dishing and erosion result from metal damascene CMP. Dishing is measured as the difference in metal thickness at the edge of a line and its center. Erosion is defined as the difference in oxide thickness above a metal line, typically within an array of lines, to an adjacent unpatterned region. FIG. 2A shows the desired result of CMP in a damascene process where the copper features, 1 and 2, in the oxide field, 4, meet the desired wafer surface, 3. FIG. 2B shows the effects of the layout pattern on metal thickness variation in a damascene CMP process where the desired wafer surface, 5, does not match the actual wafer surface, 6. FIG. 2B shows the effects of Cu CMP dishing, 7, in a wide line as well as the effects of erosion, 8, in an array of fine pitch lines. These figures illustrate that other physical layout parameters, in addition to pattern density, are required to predict the variation in a damascene CMP process.

Dummy fill structures can be added to improve process uniformity. Adding metal dummy fill increases the pattern density since density is defined as the amount of metal divided by the total area within a given region. Conversely, adding oxide dummy removes sections of the copper line and decreases the pattern density. The addition of fill can also alter other parameters such as linewidth and linespace. If dummy metal is inserted between two parallel lines, the linespace changes for both of those lines. Similarly, if oxide dummy is inserted within a wire, its effective linewidth is changed. By modifying the existing layout through the addition of dummy fill, physical parameters such as pattern density, linewidth, and linespace are changed. Since metal or oxide film thickness non-uniformity resulting from CMP is dependent on these physical parameters, the addition or removal of metal alters the physical characteristics of the designed layout. Therefore, the addition of metal or oxide fill based on process models can reduce the film thickness non-uniformity.

Dummy fill is a method of improving film thickness uniformity in integrated circuits through the addition or removal of existing structures. The following two figures illustrate two types of dummy fill, metal and oxide. FIG. 2 illustrates the use of metal dummy fill. FIG. 2C shows a series of metal lines, 10, in an oxide layer, 9, with a large oxide field region in the middle, 11, that is available for dummy fill. One goal of dummy fill is to achieve uniform pattern density everywhere so that deposition and polishing process result in a planar film thickness. As such, this area would be selected as available for dummy fill. This region is particularly attractive in that it is of sufficient distance from electrically conducting lines and may minimize the impact of dummy fill on capacitance. In FIG. 2D, metal dummy fill, 14, has been placed in the oxide field area, 13, to raise the density of this region, while the metal dummy fill remains electrically isolated from the conducting regions, 12, around it.

FIG. 3 illustrates the addition of oxide dummy fill in a metal field. In FIG. 3A, metal field region, 15, has a large area, 16, available for oxide dummy fill. In FIG. 3B, oxide dummy fill (also referred to as metal slotting), 18, is added to the metal area, 17, raising the density of raised area of the region and subsequently improving the polishing uniformity (reducing the film thickness variation) of this region. The term "dummy fill area" is used to refer to the area where dummy fill is added and the term "dummy fill structures" is used to refer to the new objects that are embedded within that area.

Dummy fill may be placed using a particular placement pattern to reduce the impact of its presence within either a conducting or insulating structure. FIG. 4 shows three different dummy fill patterns. The first panel, FIG. 4A shows symmetric fill structures that are commonly used when oxide fill is placed in metal. The symmetric pattern promotes the flow of current through the metal region. The second and third panels, FIG. 4B and FIG. 4C, show asymmetric patterns that are commonly used when metal fill (i.e. a conducting material) is placed in an insulating material (e.g. oxide). The asymmetric nature retards the capacitive coupling between adjacent signal lines more than a symmetric pattern, resulting in reduced cross-talk noise. Designers desire that the addition of dummy fill not alter the desired electrical performance. However, the addition of dummy structures may unintentionally affect the electrical properties and degrade chip performance. Important factors must be considered for effective dummy fill. These factors include process effects, electrical effects, and placement impact.

The electrical performance of a circuit can be determined by the electrical characteristics of its interconnect, and the interconnect is often the limiting factor in high performance designs. These electrical parameters include the interconnect resistance and capacitance. Circuit performance metrics such as signal delay, clock skew, and crosstalk noise are functions of the interconnect resistance and capacitance. The interconnect resistance is a function of the wire resistivity, metal thickness, interconnect length, and linewidth. The interconnect capacitance is a function of the metal thickness, interconnect length, linewidth, linespace, and dielectric constant of the insulator (oxide) between the wires. Note that the geometry of the interconnect structures impact their electrical properties. Therefore, any variation in the geometry, such as the insertion of dummy fill or slots, may also affect the electrical performance metrics.

The addition of dummy fill can result in unwanted electrical effects. Adding dummy features alters the effective pattern density and linespace. Removing features (oxide fill) alters the effective pattern density and linewidth. The impact of fill depends on the designed interconnect structure neighboring the fill (for metal dummy) or the designed interconnect structure itself (for oxide dummy). Adding metal fill modifies the coupling capacitance (C) between neighboring interconnects. Adding oxide dummy modifies the coupling capacitance (C) and interconnect resistance (R). The relative impact depends on the dimensions of the interconnect structures. The level of variations in R and C determine how the circuit is affected.

Design rules can be constructed such that an acceptable level of variation tolerance is set for the interconnect RC variation. Alternatively, design rules can be set to allow a certain tolerance level for the circuit performance metrics such as signal delay, clock skew, or crosstalk noise. These performance metrics are normally functions of the interconnect RC. The total interconnect capacitance is heavily dependent on neighboring structures. These structures can be described as a canonical set where an object or class of objects is uniquely identified or standardized within a set of features (such as linewidth, linespace or density) related to process variation. Therefore, a dummy fill strategy should account for these electrical effects in addition to the process uniformity specifications relative to these features.

A short flow damascene process using ECD and CMP is shown in FIGS. 5 & 6. FIG. 5A illustrates step 1, where trenches, 19, are created in oxide for the interconnect structures using lithography and etching. FIG. 5B shows the early stage of step 2 where electroplating is used to fill the trench, 23, in field oxide, 20, from time T0, 21, to T2, 22. FIG. 6A shows the end at time Tf, 26, of step 2 where electroplating fills the trench, 27, in the field oxide, 24. FIG. 6B illustrates how CMP is used to remove the copper such that the trench, 28, is planar with the field oxide, 29.

Once the copper is deposited, it must be polished until all of the copper above the field regions is cleared. CMP is the leading method of copper removal and planarization in semiconductor manufacturing processes. Differences in the structures and their surroundings result in variable polish rates across the chip. To guarantee that there are no shorts between interconnects, over-polishing is done until all the copper is cleared above the field oxide. This results in metal thickness variation (see FIG. 4). Another application of dummy fill is to modify the interconnect structures and surrounding areas to reduce the variation. This can be done by adding metal dummy fill between the interconnect regions or removing metal from the existing interconnect. As such, the layout can be altered from its original design by adding additional features (metal dummy fill) or removing sections of existing features (slotting with oxide dummy fill). This improves process uniformity but can adversely affect the electrical performance of the chip. Therefore, the goal is to fill the layout in a way that reduces the process variation while preserving the original intended functions of the circuit.

In fabricating integrated circuits, interconnect features are dependent on variation in layout patterns (e.g. material density, linewidth and linespace). Surface non-uniformity often leads to subsequent manufacturability and process integration issues. These pattern dependencies may also affect device performance by introducing variation in capacitance and resistance depending on the location of a given structure on the device.

Lithography mask creation and printing assume that projection is done on a film, within a predetermined depth of focus range. However pattern dependencies between the process by which the ICs are fabricated and the pattern that is being created often cause processed films to have significant variation in thickness across a surface, resulting in variation in feature dimensions (e.g. line widths) of integrated circuits (ICs) that are patterned using the mask. As successive non-conformal layers are deposited and polished, the variation becomes worse. Because interconnect lines and connections on higher layers carry power to portions of the chip, the variations can increase the sheet resistance and thus affect the power effectiveness of the chip.

The characterization of feature thickness and width variation due to pattern dependencies in the deposition, etch, plating and polishing processes, may be used to generate a full three-dimensional model of circuit features for each of multiple levels in a device. This model may be helpful in predicting the electrical performance of interconnect levels. The thickness and width variation of interconnect features has large impact on timing, propagation delay and power performance of the manufactured circuit.

One way to reduce the propagation delay is to use intermediate buffers (also known as repeaters) in longer interconnect wires. However it is often difficult to estimate the number and size of buffers needed, so designers are often overly conservative in their use of buffers which increases power consumption.

One way to reduce the variations in fabricated chips is to make physical measurements on manufactured wafers containing initial designs of devices and use these measurements to adjust the mask design. Other methods to reduce variation include optical proximity correction (OPC) where subwavelength distortions due to patterned features are identified and corrected.

One way to characterize variation in fabricated chips is through metrology. Metrology involves the measurement of silicon wafers, for example, in three different modes of operation: in-line operation in which wafer measurements are performed between process steps, in-situ operation in which the wafer is measured during processing, and off-line operation in which the wafer is removed from the process line for measurement. Metrology is an important operation in the introduction of new materials, processes, and structures associated with reduction of integrated circuit feature sizes. Metrology is also important for improving yield in mature fabrication lines. Through better characterization of variation due to process tools and processes, metrology can be used to reduce time-to-market and cost-of-manufacturing.

Measurements are often performed during the processing of an integrated circuit to gauge whether a process or process flow will result in the intended integrated circuit. The term metrology refers to the tools that make physical measurements on test and production wafers as well as the strategies for determining where on the wafer or die those measurements are to be taken. Measurement strategies may include measuring a particular group of sites on a die or across the wafer in a particular pattern or on particular structure within the die. Performing the measurements between process steps allows for easier isolation of a problem to a particular step and feature versus measuring the final circuit and then trying to diagnose which of 20 or 30 process steps caused the problem.

In determining which sites or locations to measure within a particular chip or die and which die to measure from among the multiple dies across the wafer, several factors come into play. Making too many measurements delays subsequent processing of the wafer, thus directly affecting manufacturing throughput and process yield. Making too many measurements may also produce too large a volume of raw data for a process engineer or diagnostic system to analyze in real-time.

As shown in FIG. 101A, test structures or devices 16025 are sometimes created on the wafer outside the circuitry of the chip, normally in scribe or kerf lines 16023, and the metrology is focused on those test structures or devices. The isolated test structure 16025 may not resemble the features 16029 in the IC design 16024 that entail a problematic variation.

If pattern dependencies, such as density, linewidth, and linespace cause variation in electrical performance, a feature and its surrounding features may need to be measured. Interactions between vertical layers may also need to be considered. These considerations may grow in importance as different types of circuitry are consolidated densely onto a single chip, for example, in a mixed mode system-on-a-chip (SOC) design 16024 in which analog, logic, I/O, and RAM components are designed into one chip.

The fabrication of an integrated circuit device typically involves a cycle of design and manufacturing until the fabricated device resembles, both physically and electrically, that which has been designed. Much of the complexity is due to the constraints that not all designed circuits can be manufactured and not all manufactured circuits perform as designed or simulated.

As such, a cyclic process is initiated whereby circuits are designed, layer-by-layer using electronic design automation (EDA) software, expensive masks are built for printing the circuit on the wafer via lithography and a series of costly manufacturing steps are run to fabricate the final device. The device is measured throughout fabrication and circuit performance is finally characterized. This information is used to grade the device and often several cycles are needed to modify the design and process settings until the device reaches acceptable performance or achieves the design specifications. Each design-manufacturing cycle requires costly manpower and materials as well as impacting time-to-market for each new device.

The fabrication part of the cycle normally requires experimental design and recipe generation for each step in the process flow. Often a design of experiments is used to select a number of process settings that will be used to characterize a particular tool for a particular IC device. Typically these experiments and subsequent process optimization tasks are done after a device has been taped-out and all the prior fabrication steps have been performed. Thus, a number of wafers are processed at specific equipment settings, measured for physical and electrical characterization and a process setting is chosen that best fits the desired IC criteria. This is repeated for each step in the flow. At some point, the process variation often compounds from one process step to another until it is determined that there are no process settings that can achieve the objective and a chip cannot be manufactured reliably. This is an expensive and time-consuming process to determine the manufacturability of a given design.

Manufacturability is not purely an afterthought. The experience and knowledge of the process engineers are often captured in design rules to prevent such occurrences before a new IC design is taped-out and manufactured; however, new devices still normally require repeated design and manufacturing cycles. The reason for this is that the design rules are often based on manufacturing experience gained from prior devices and technology generations and the experience may not be synthesized, taking into consideration the sequential impact of individual process steps that constitute the complete process flow. Much time and resources are spent developing linear and nonlinear optimization methods that characterize the impact of variation on one or more process steps. However, these approaches do not adequately address problems associated with generating the initial design rules and assessing the manufacturability of an IC in the design stage.

The increased cost and complexity of developing a new semiconductor product necessitate that the timeframe for new process introduction to achieve reasonable quality must decrease. Advances in circuit design (e.g. ASIC) and factory architecture and control have had significant impact toward cost effective and timely production of new integrated circuit (IC) structures; however IC process design remains the pacing item in shorting cycle times and achieving lower non-recurring engineering costs.

Process synthesis is top-down hierarchical approach to process design where device performance and design requirements are used to determine overall process flow and individual process recipes. The approaches vary from the use of known and understood device structures and process flows to custom or new device architectures where the process flow and recipes are derived from device design parameters and advanced process models.

As shown in FIG. 129, levels of abstractions provide a top-down hierarchy where the system 16602 can be designed in an ordered fashion without addressing the details at lower levels (16604-16606). However the designer requires that the specifications at higher levels are consistent with those at lower levels. A goal of synthesis and simulation tools is to not only translate specifications but also manage constraints and conflicts to achieve a global solution for a process flow. In this context, a process flow may be defined as three polishing steps; bulk polish, endpoint and barrier removal. Process flow may also include all the etch, litho, deposition, plating and polish steps in the creation of an IC. In this approach, synthesis is used translate the specifications from a higher-level abstraction to a structure at the next lower level that meets those specifications.

SUMMARY

In general, in one aspect, the invention features a method comprising, based on electrical impact analysis and a pattern dependent model of a fabrication process flow of one or more steps, generating a strategy for sizing and placement of buffers or repeaters in interconnect wires, and using the pattern dependent model and the electrical impact analysis to evaluate the expected results of the buffers or repeaters to be placed, the use of the model and the electrical impact analysis being embedded as part of the generation of the buffer or repeater placement strategy.

In general, in another aspect, the invention features a method comprising, based on electrical impact analysis and a pattern dependent model of a fabrication process flow of one or more steps, determining the number of buffers or repeaters in interconnect wires, and using the pattern dependent model and the electrical impact analysis to evaluate the expected results of the buffers or repeaters to be placed, the use of the model and the electrical impact analysis being embedded as part of the generation of the buffer or repeater placement strategy.

In general, in another aspect, the invention features a method comprising, based on electrical impact analysis and a pattern dependent model of a fabrication process flow of one or more steps, predicting or simulating propagation delays for single or multiple interconnect levels. In implementations of the invention, the model and the electrical impact analysis are embedded as part of the generation of strategies to reduce propagation delays. The model and the electrical impact analysis may be part of the design verification process.

In general, in another aspect, the invention features a method comprising, based on electrical impact analysis and a pattern dependent model of a fabrication process flow of one or more steps, predicting or simulating power consumption for single or multiple interconnect levels.

Implementations of the invention may include one or more of the following features. The model and the electrical impact analysis are embedded as part of the generation of strategies to reduce power consumption. The model and the electrical impact analysis are used as part of a design verification process. The model and the electrical impact analysis are used as part of a power and timing analysis process. The model and the electrical impact analysis are used with power, signal integrity, and timing analysis tools. The model and the electrical impact analysis are used with a design rule checker (DRC) or layout verification schematic (LVS) tools. The model and the electrical impact analysis are used with resistance and capacitance extraction tools. The process flow includes CMP. The process flow includes plasma etch, lithography, or deposition process steps.

In general, in another aspect, the invention features a method comprising based on electrical impact analysis and a pattern dependent model of a fabrication process flow of one or more steps, predicting the feature width and thickness for a single level of interconnect geometries. In some implementations of the invention, the feature dimension variations are associated with at least one of printed feature widths, etch trench width, etch trench depth, etched sidewall angle, dishing, erosion, or total copper loss.

In general, in another aspect, the invention features a method comprising based on electrical impact analysis and a pattern dependent model of a fabrication process flow of one or more steps, generating a strategy for placement of dummy fill in the process, and using the pattern dependent model and the electrical impact analysis to evaluate the expected impact of the placed dummy fill on buffer sizing and placement, the use of the model and the electrical impact analysis being embedded as part of the generation of the buffer sizing and placement strategy.

In general, in another aspect, the invention features a method comprising using a pattern-dependent model to predict variations that will occur in an integrated circuit as a result of processing up to a predetermined interconnect level, and sizing and placing buffers within interconnect feature to accommodate the variations. In implementations of the invention, at least one of the predicting and the adjusting may be provided as a service in a network. The network may comprise an intranet, an extranet, or an internet, and the predicting or adjusting may be provided in response to user requests.

In general, in another aspect, the invention features a method comprising based on electrical impact analysis and a pattern dependent model of a fabrication process flow of one or more steps, determining the placement of integrated circuit components.

In general, in another aspect, the invention features a method comprising based on electrical impact analysis and a pattern dependent model of a fabrication process flow of one or more steps, determining the routing of integrated circuit wires.

Implementations of the invention may include one or more of the following features. The results are used as feedback to the place and route process. Based on electrical impact analysis and a pattern dependent model of a fabrication process flow of one or more steps, using the pattern dependent model and the electrical impact analysis to compare results. The results are displayed in the form of full or partial chip images. The results are displayed in the form of statistical histograms. The images contain thickness, total copper loss, sheet resistance, dishing and erosion information. The histograms contain thickness, total copper loss, sheet resistance, dishing, and erosion information. The comparison is between two or more different designs. The comparison is between two or more process recipe or tool settings for the same design. The comparison is between two different process steps for the same design. The results are shown through a web browser or communicated across an internet, intranet and extranet network connection. The results are used to select a design for fabrication.

In general, in another aspect, the invention features a method comprising using a pattern dependent model to determine manufacturing recipe and equipment settings for a process used to fabricate an integrated circuit (IC), the manufacturing recipe and equipment settings reducing process-induced variation in wafer state parameters or electrical performance.

Implementations of the invention may include one or more of the following features. The wafer state parameters comprise at least one of film thickness across the full fabricated IC. Test wafers are used to characterize pattern dependencies in at least a portion of the integrated circuit fabrication process and the pattern dependencies are used in the model. The portion of the fabrication process comprises electroplating. The portion of the fabrication process comprises oxide deposition. The portion of the fabrication process comprises chemical mechanical polishing (CMP). The portion of the fabrication process comprises plasma etch. The portion of the fabrication process comprises a lithography process. The model maps pattern dependent features to the process induced variation in wafer state parameters. The wafer state parameters include at least one of film thickness, array height, step height, sheet resistance, capacitance, crosstalk noise, and coupling capacitance. The pattern dependent features include at least one of linespace, linewidth, and effective density. The model is used to generate full-chip predictions of variation in wafer state and electrical parameters. A cost-function is used to measure results of the predictions. The cost function is also used to compare one set of recipe or equipment settings to another. Optimization methods are used to select recipe and equipment settings that minimize variation in wafer-state or electrical parameters. The optimization methods include at least one of simplex, conjugate gradient, simulated annealing, dynamic programming, approximate dynamic programming, linear programming, and approximate linear programming. Quadratic cost functions are used to facilitate convergence of the optimization methods. The process includes a single process step. The process comprises more than one process step or a process flow. One or more sets of the manufacturing recipe and equipment settings are provided to a user through a graphical user interface. At least one manufacturing recipe is communicated directly to a process tool or a fabrication automation system. At least one manufacturing recipe is communicated directly to a memory device attached to a wafer carrier or prescribed to a particular wafer lot. The pattern dependent model is used to predict or simulate electrical performance or electrical parameters as a result of a single process step. The pattern dependent model is used to predict or simulate electrical performance or electrical parameters as a result of more than one process steps or a process flow. Actual product wafers are used to develop the model, the model mapping pattern dependent features to at least one of process-induced variation in wafer state parameters or variation in electrical parameters. The pattern dependent features include at least one of linespace, linewidth, and effective density. The wafer state parameters include at least one of film thickness, array height, step height. The electrical parameters include at least one of sheet resistance, capacitance, crosstalk noise, and coupling capacitance. Manufacturability of the IC device is certified before mask tape-out and manufacturing. A final electrical performance of the IC is simulated before mask tape-out and manufacturing. A process flow is determined, among several candidates, for an IC design. Recipe parameters are varied to characterize pattern dependencies in an IC manufacturing process. The recipe is processed at points of a life cycle of the process to characterize process drift. The process drift comprises CMP pad wear or build up on the walls of a plasma reactor. A graphical user interface to permit a user to access results. The method is used for process synthesis and implemented on a web server. The method is used for process optimization and implemented on a web server. Custom web applications are generated for the web server with respect to different users. Post-manufacture faults are identified spatially across a die for one process step or multiple process steps in a flow. Through a web server, manufacturability predictions are received for the IC using a particular process or tool. A web server is used to provide automatically chosen recipe or equipment settings directly to a process tool or flow of process tools or steps. An optimization s provided to a user from a web server in response to a single click. An optimization is provided to a user from a web server in response to a single click. Process drift and shifts over a number of process hours or a number of wafers processed are characterized. Maintenance and repair of process tools is scheduled. Consumable sets are selected. The consumable sets include polishing pads, polishing slurries, or gas composition.

In general, in another aspect, the invention features a method comprising, based on electrical impact analysis and a pattern dependent model of a fabrication process flow of one or more steps, generating a strategy for comparing consumable sets or equipment, and using the pattern dependent model and the electrical impact analysis to evaluate the expected results of integrated circuit designs processed using a selected one of the consumable sets or equipment. In some implementations of the invention, the consumable sets comprise slurries, pads, or gases and the equipment comprises CMP, ECD, plasma etch, lithography or deposition equipment.

In general, in another aspect, the invention features a method comprising, based on electrical impact analysis and a pattern dependent model of a fabrication process flow of one or more steps, generating a strategy for analysis or diagnosis of equipment or consumable set results, and using the pattern dependent model and the electrical impact analysis to evaluate the expected results of an integrated circuit design processed using a selected one of the consumable sets or equipment. In some implementations of the invention, the consumables comprise at least one of slurries, pads, or gasses. The method of claim in which the equipment comprises CMP, ECD, plasma etch, lithography or deposition equipment.

In general, in another aspect, the invention features a method comprising based on electrical impact analysis and a pattern dependent model of a fabrication process flow of one or more steps, generating a prediction of isolation trench geometries.

Implementations of the invention may include one or more of the following features. The process flow includes CMP. The process flow includes plasma etch. Unique aspects related to pattern dependencies of a tool for diagnostics or control are characterized. A database or library of results for analysis are built. Aggregate statistics regarding tool or consumable behavior are compiled. Tool or design benchmarks are established. Data is provided across a network. Trench rounding at an interface of an active device region and an isolation trench region is predicted. A threshold voltage at the interface of the active device region and isolation trench region is predicted. A leakage current at an interface of an active device region and an isolation trench region is predicted. Polysilicon stringers at an interface of an active device region and an isolation trench region are predicted. Process steps or flows in the creation of shallow trench isolation structures are defined. A particular shallow trench isolation design is selected. A design or process characteristics are selected to influence trench corner rounding.

In general, in another aspect, the invention features a method comprising, based on an electrical impact analysis and a pattern dependent model of a trench isolation fabrication process flow of one or more steps, generating a strategy for placement of dummy fill oxide regions in the process, and using the pattern dependent model and the electrical impact analysis to evaluate the expected results of the dummy fill to be placed, the use of the model and the electrical impact analysis being embedded as part of the generation of the dummy fill placement strategy.

Other advantages and features of the invention will become apparent from the following description and from the claims.

BRIEF DESCRIPTION OF THE DRAWINGS

FIG. 5A illustrates the creation of a trench in oxide for electroplating (ECD) fill FIG. 5B illustrates the initial stages of copper deposition into the trench using ECD FIG. 6A illustrates the final stages of copper deposition into the trench FIG. 6B illustrates the use of CMP to polish the copper overburden

FIG. 20A provides an example of dummy fill sizing rules

FIG. 20B provides an example of dummy fill pattern generation rules

FIG. 21A illustrates a symmetric dummy fill pattern

FIG. 21B illustrates how another symmetric dummy fill pattern can have the same effective density but use different fill object sizes.

FIG. 23 illustrates how a 4×4 cell can be represented by 8 objects.

FIG. 42 describes the process for using IC designs and patterns to create lithography masks.

FIG. 46A illustrates film thickness variation that results from oxide chemical mechanical polishing (CMP).

FIG. 46B illustrates erosion, dishing and corner rounding effects associated with a CMP step used in a process of forming of shallow trench isolation (STI).

FIG. 46C illustrates copper dishing, dielectric erosion and residual copper effects associated with a copper CMP step used in damascene processes.

FIG. 61D illustrates a continuation of the steps in prediction of chip topography

FIG. 81A illustrates patterns in metal level 1 and metal level 2.

FIG. 81B illustrates metal level 2 superimposed on metal level 1.

FIG. 82 illustrates varying array structures in metal level 1.

FIG. 83 illustrates a large array of vias in via level 1.

FIG. 84A illustrates patterns in metal level 1 and via level 1.

FIG. 84B illustrates via level 1 pattern superimposed on metal level 1 pattern.

FIG. 85A illustrates three areas of slotting structures in metal level 1.

FIG. 85B illustrates slotting patterns for three areas in metal level 1.

FIG. 85C illustrates a via pattern in the via level 1 superimposed on metal level 1 slotting structures.

Figure 85A:
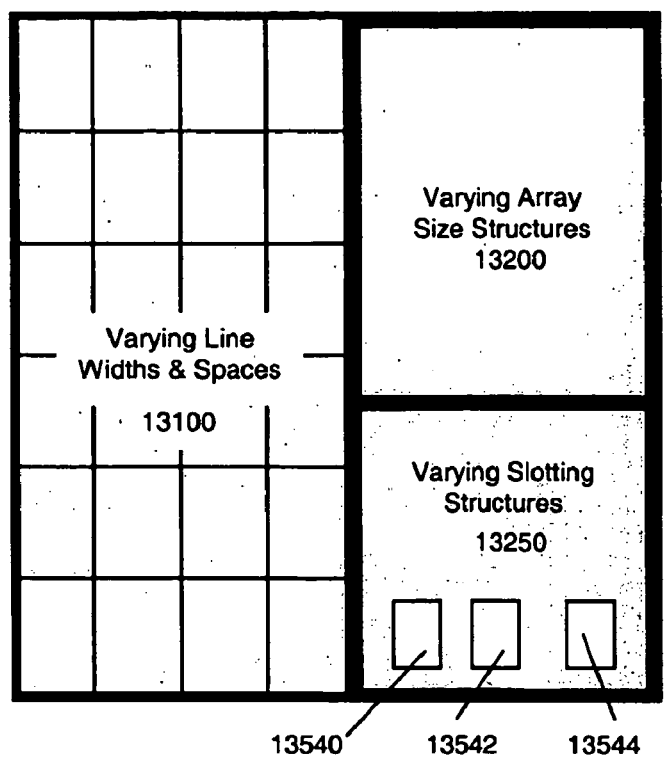
Figure 85B:
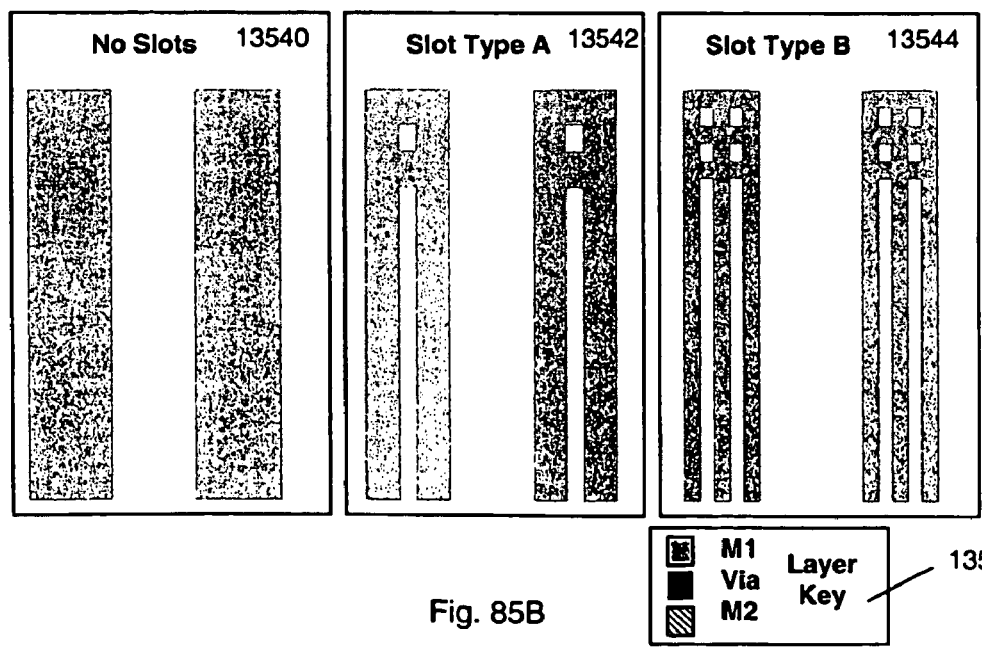
Figure 85C:
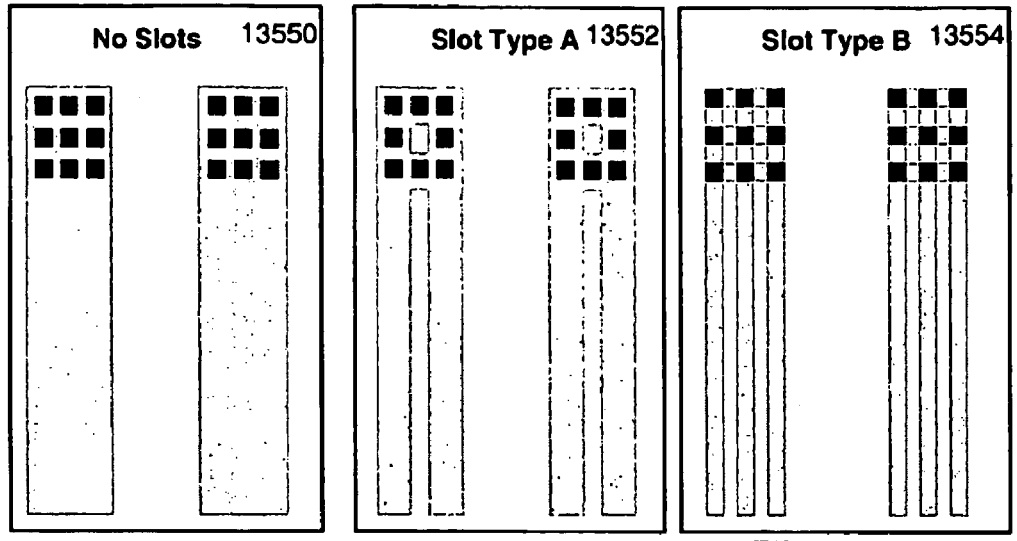
Figure 85D:
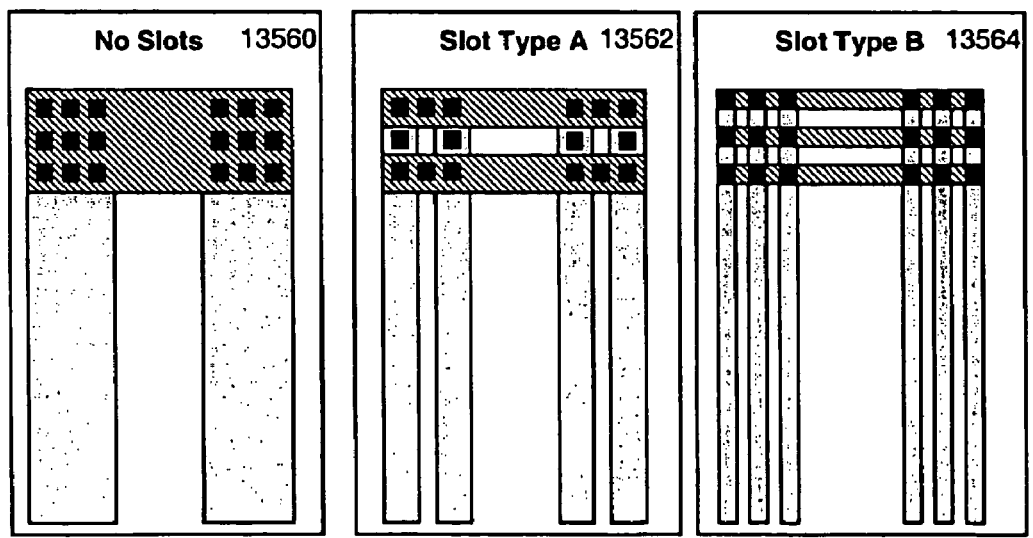

FIG. 85D illustrates a metal level 2 pattern superimposed on via level 1 and metal level 1 patterns.

Figure 86A:
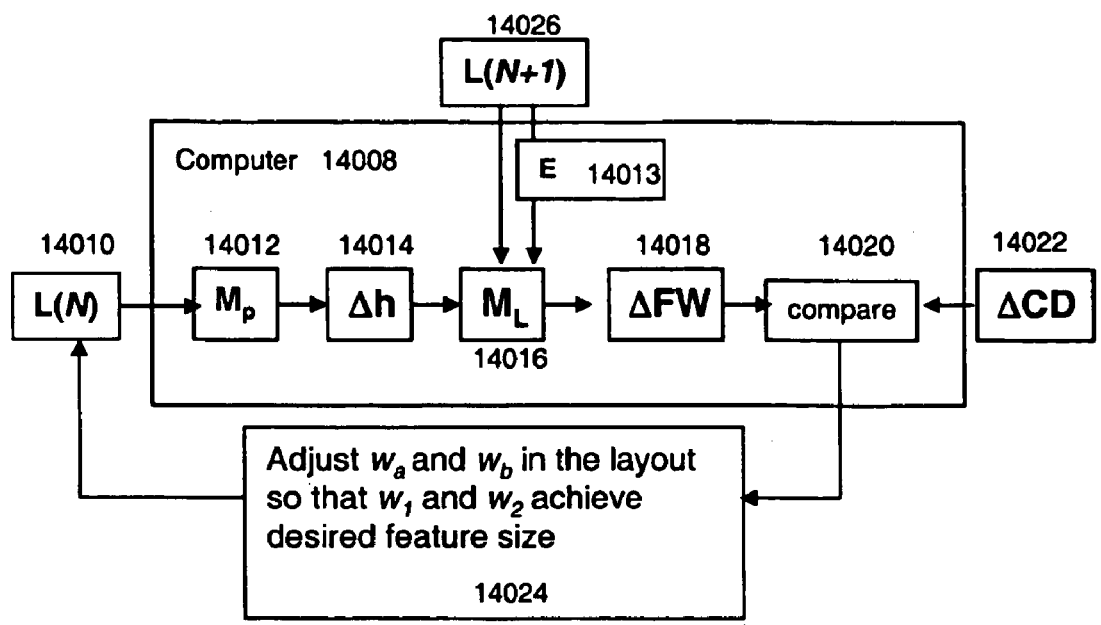

FIG. 86A illustrates an application of a method to address surface topography.

Figure 86B:
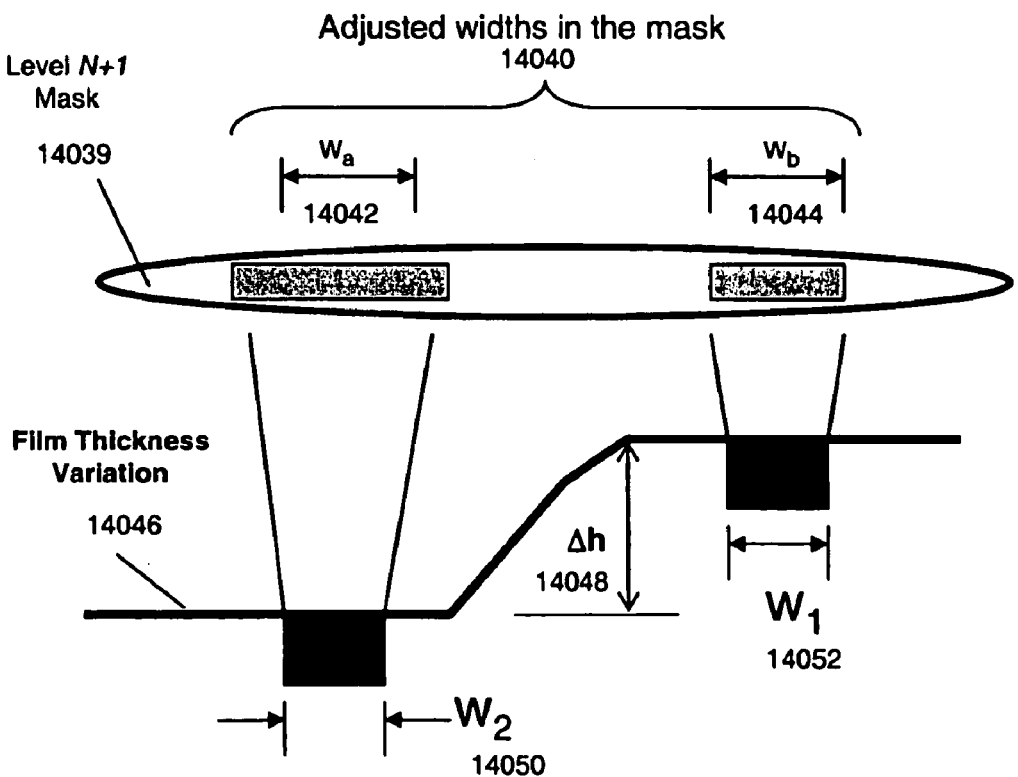

FIG. 86B depicts an impact of a method when surface topography occurs.

Figure 87A:
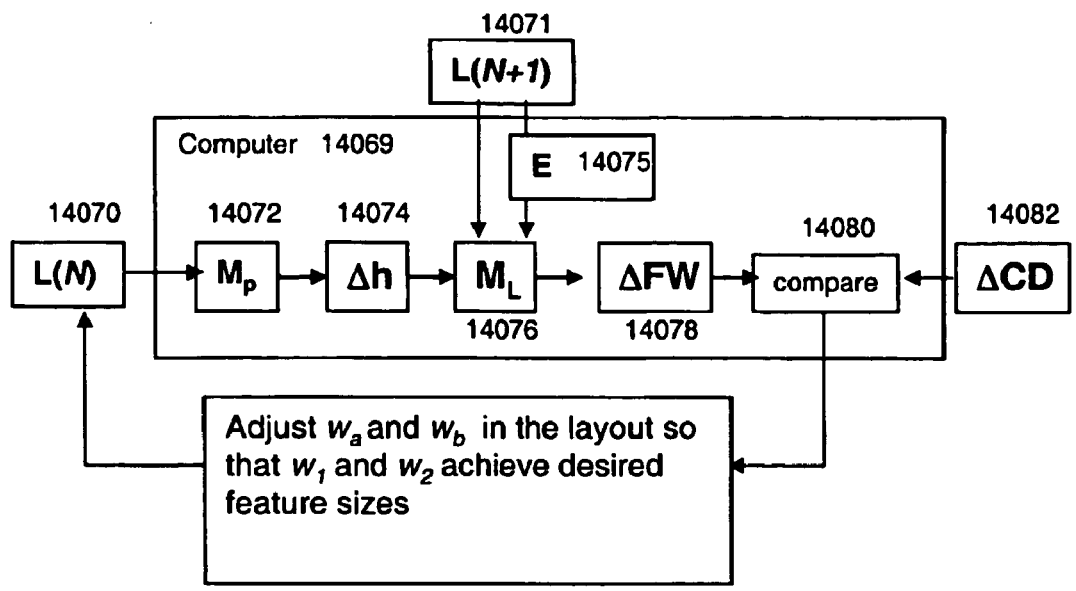

FIG. 87A illustrates an application of a method to address feature density.

Figure 87B:
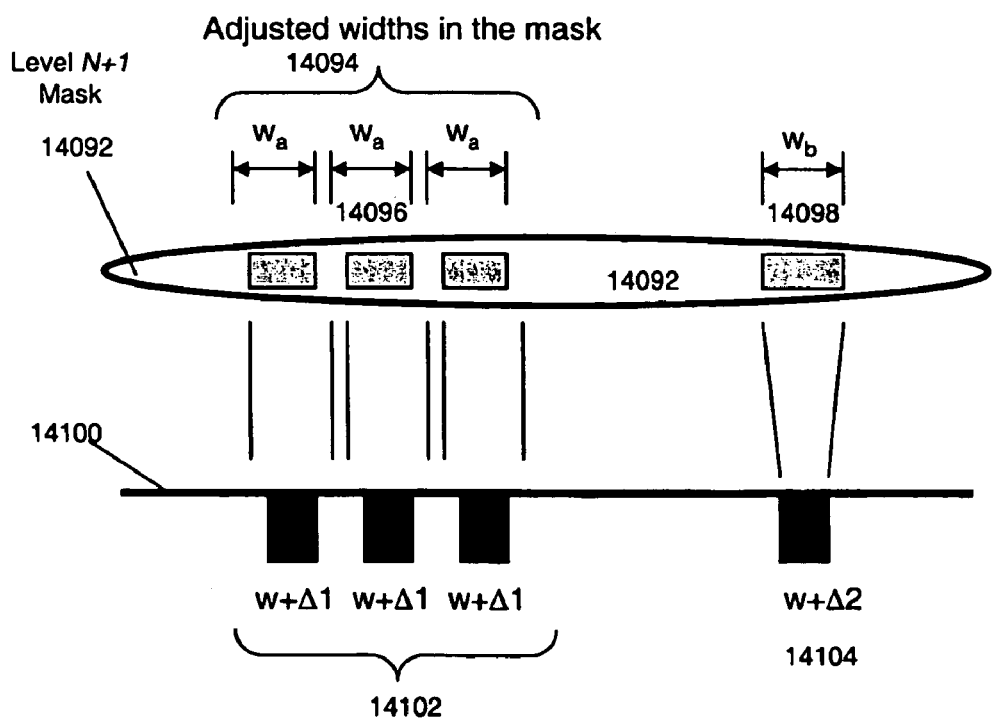

FIG. 87B depicts an impact of a method when feature density occurs.

Figure 88:
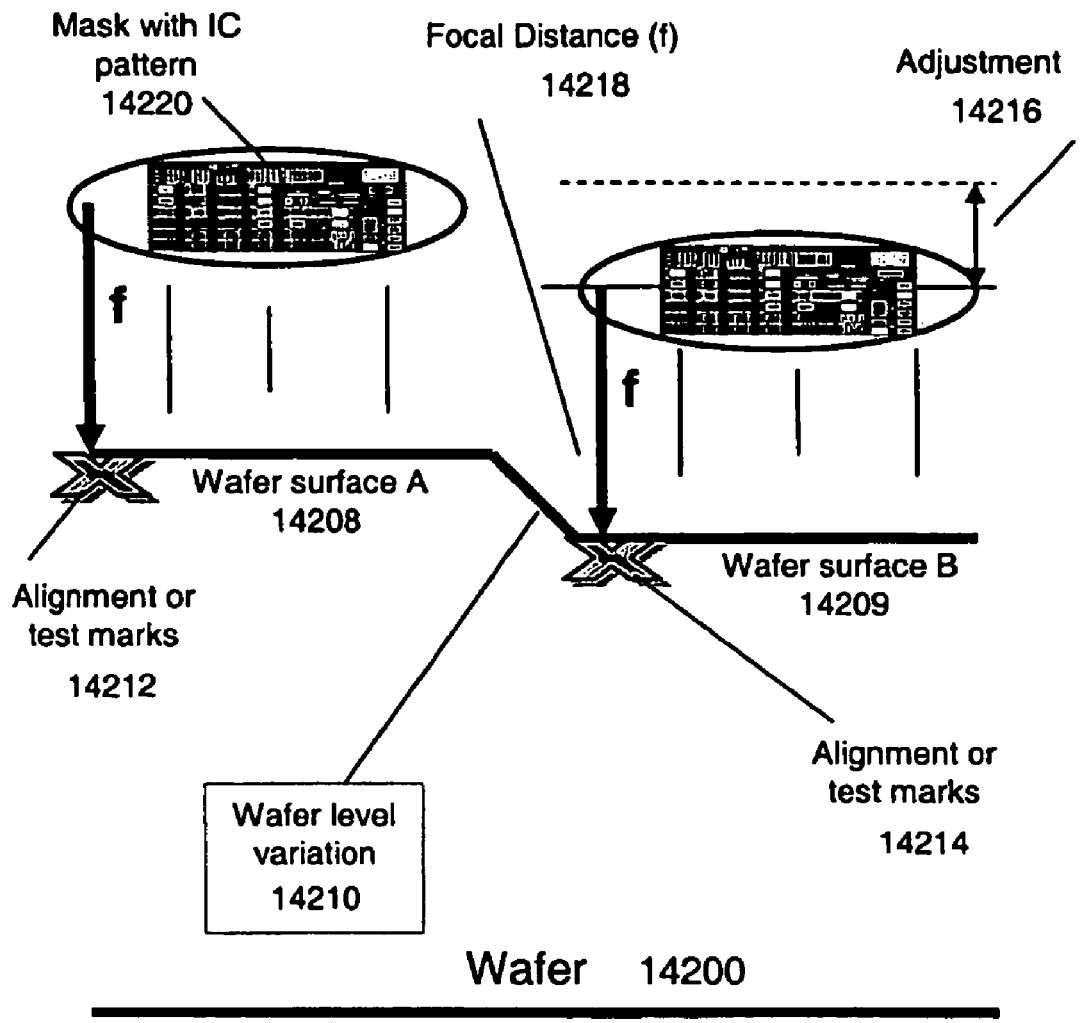

FIG. 88 illustrates an application of a stepper mechanism to address wafer-level surface variation.

Figure 89:
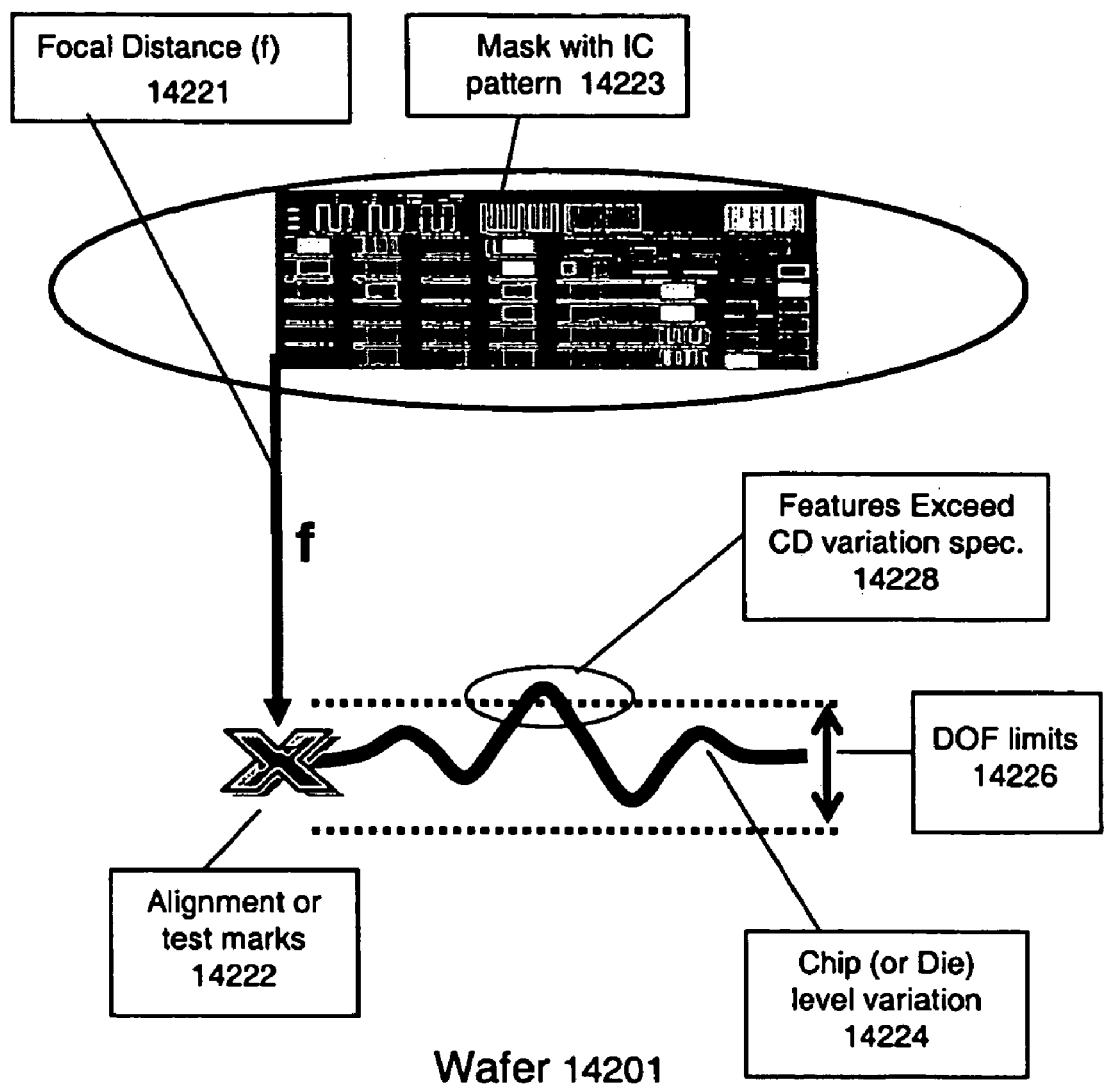
Figure 90:
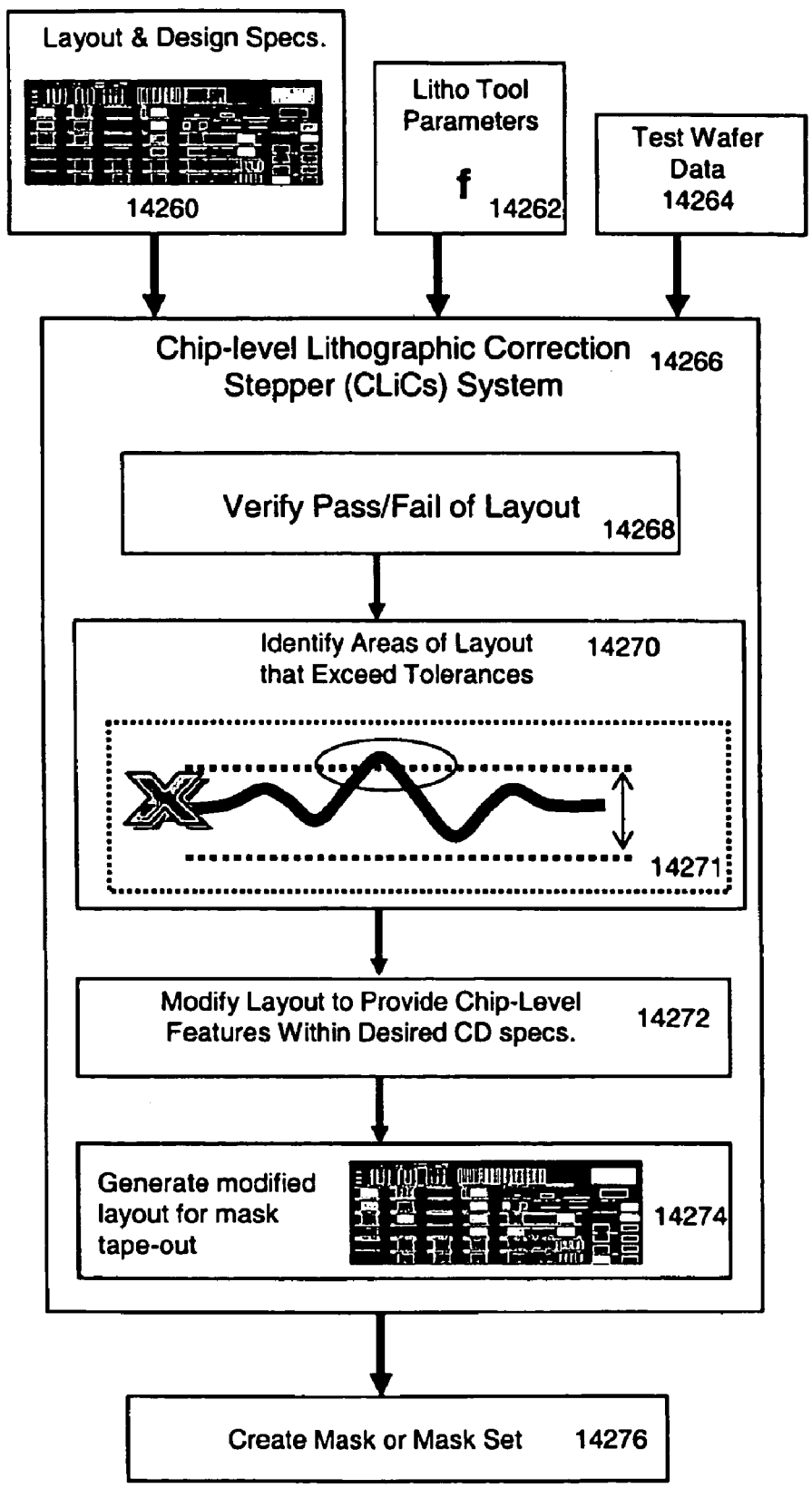

FIG. 89 illustrates a stepper mechanism with a proper focal distance to an alignment key and including imaged areas within the chip that are outside of the depth of focus FIG. 90 illustrates an application of a method to a chip-level stepper mechanism.

Figure 91:
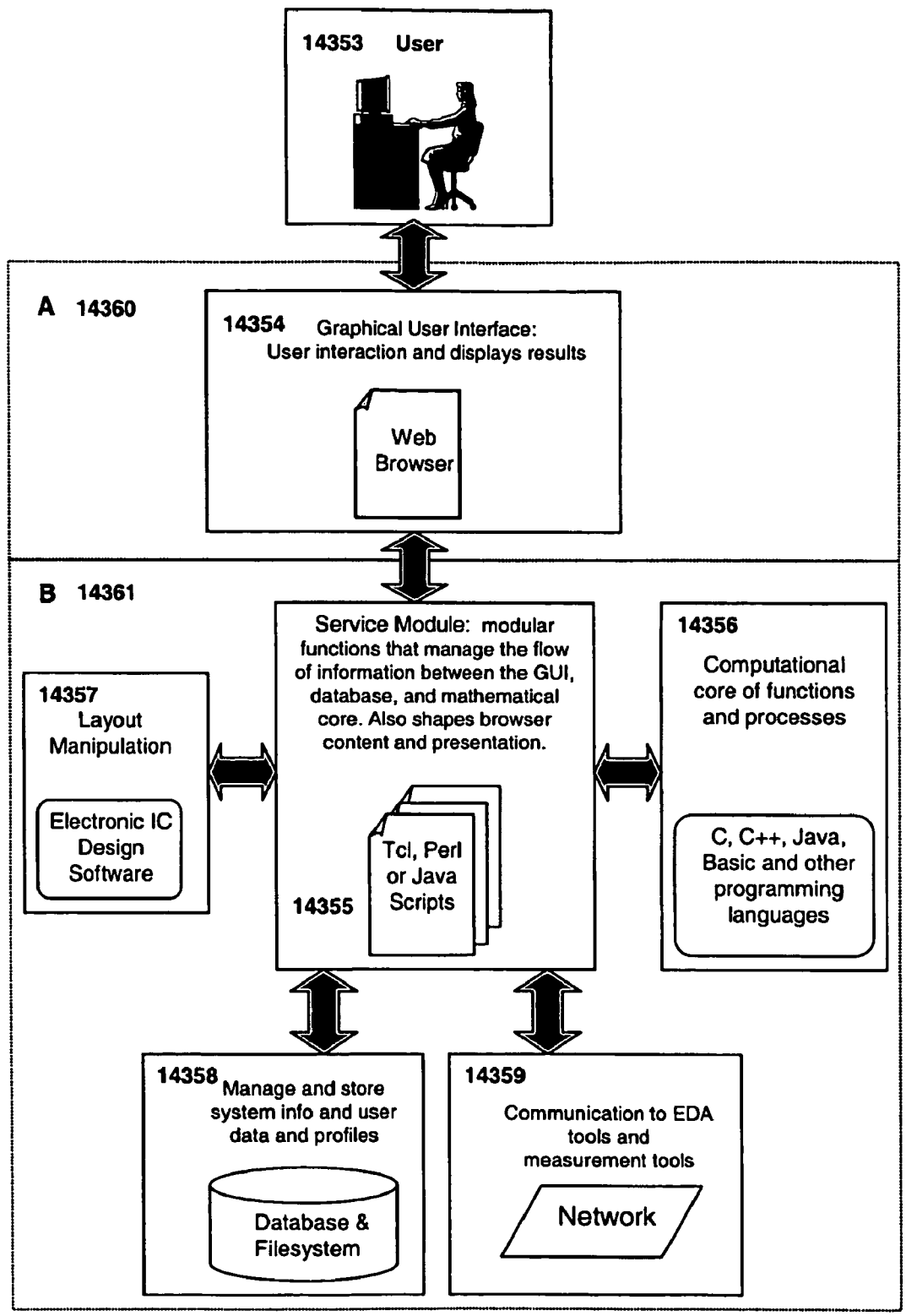

FIG. 91 illustrates an implementation of a method using computer hardware, software and networking equipment.

Figure 92A:
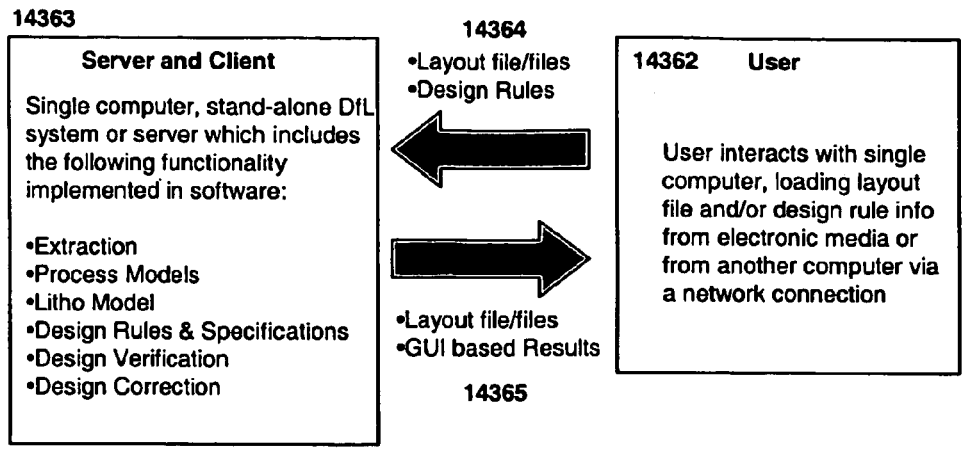

FIG. 92A illustrates an implementation of a method where client and server reside or are bundled with other software on a single computer.

Figure 92B:
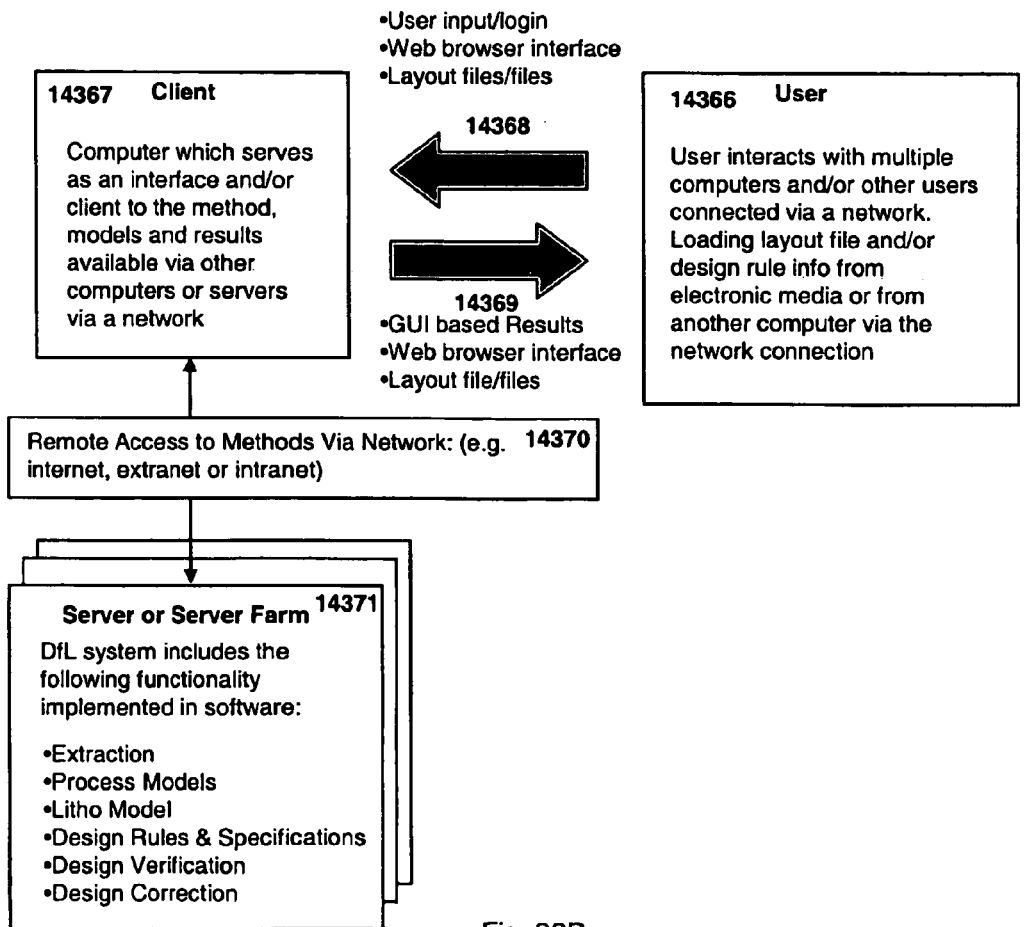

FIG. 92B illustrates an implementation of a method where the client and server communicate via a network.

Figure 92C:
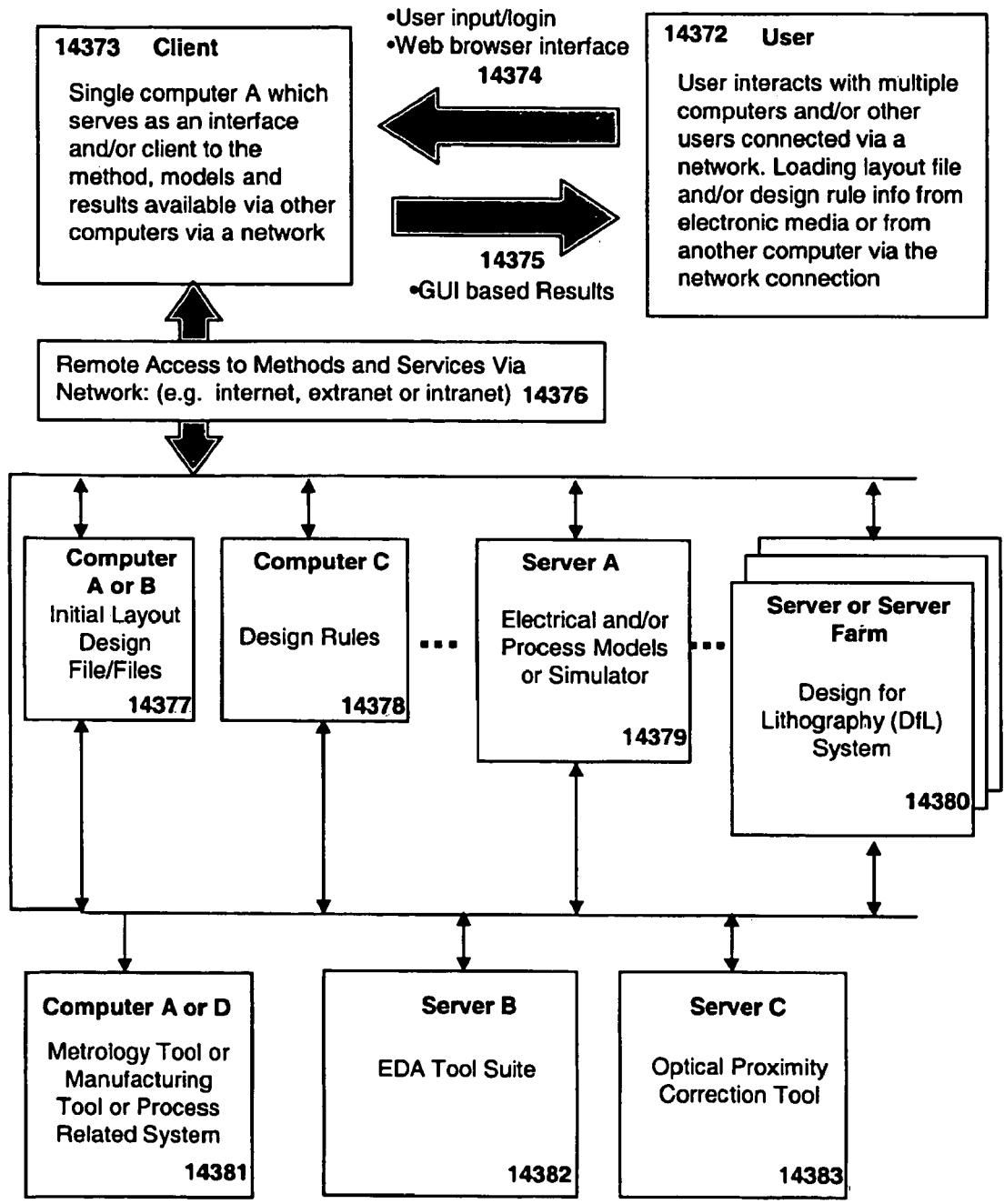

FIG. 92C illustrates an implementation of the method where the client communicates with a server and web services via a network.

Figure 93:
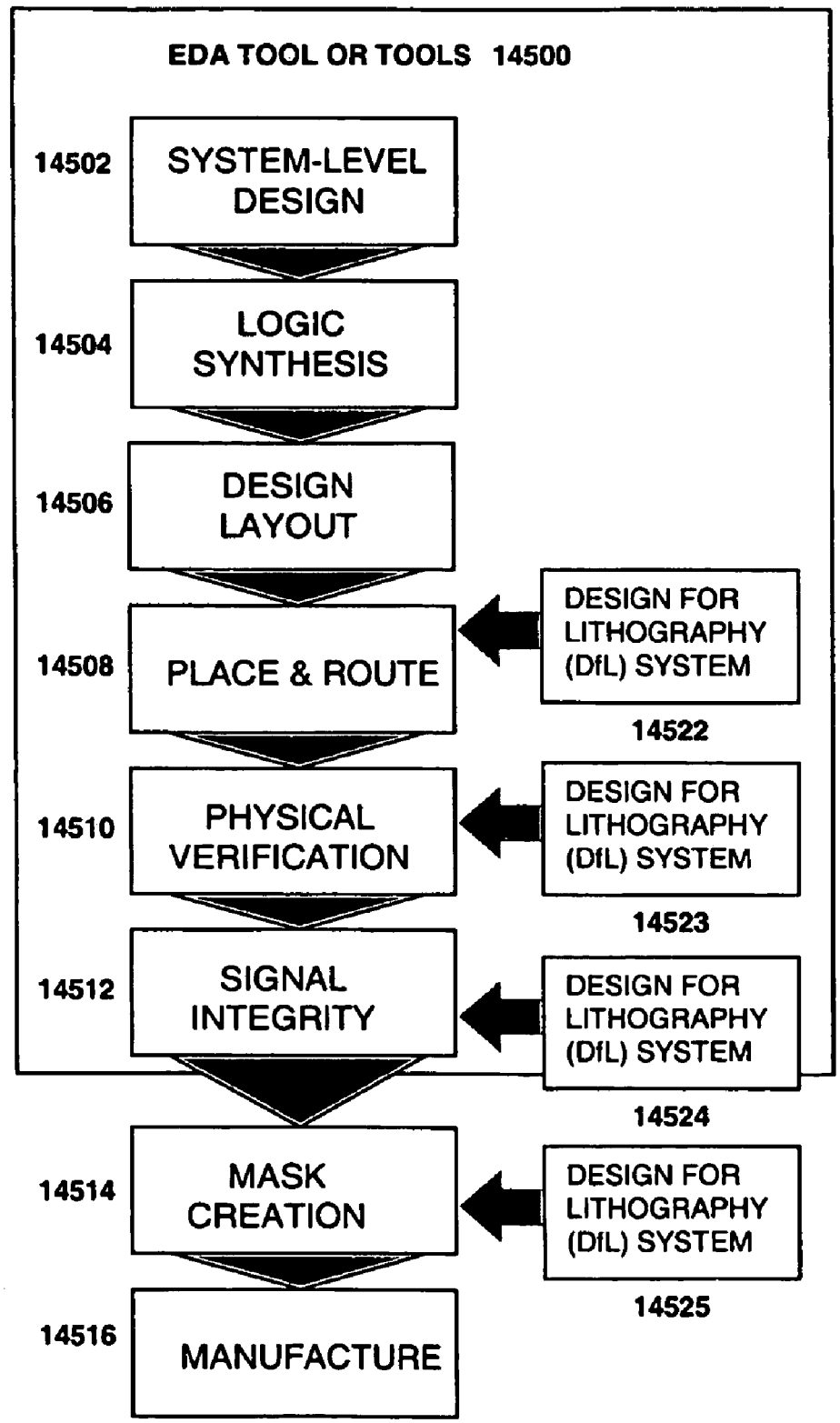

FIG. 93 illustrates an implementation of a method within an electronic design automation (EDA tool).

Figure 94A:
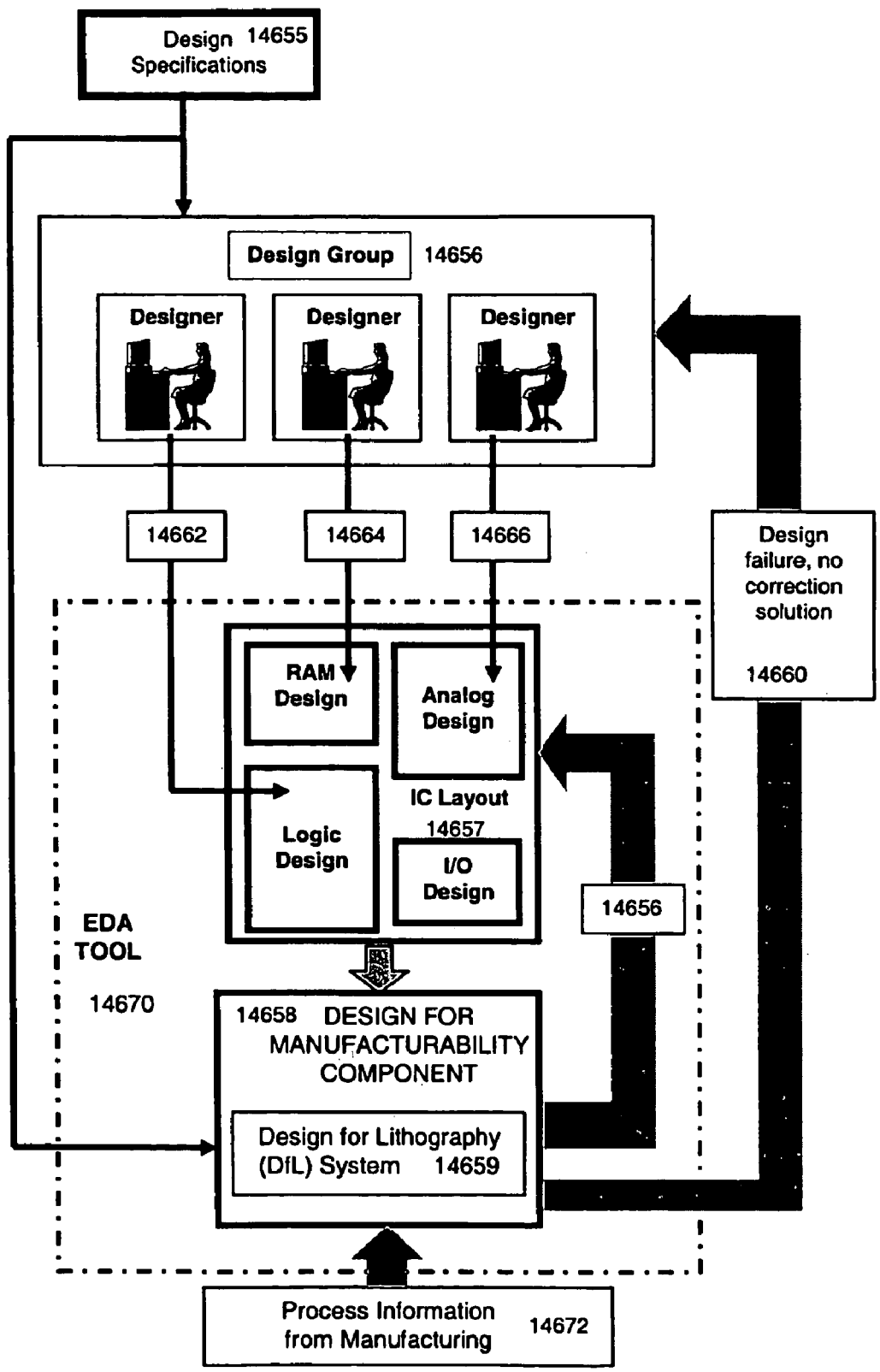

FIG. 94A illustrates a use of the implementation within an EDA tool.

Figure 94B:
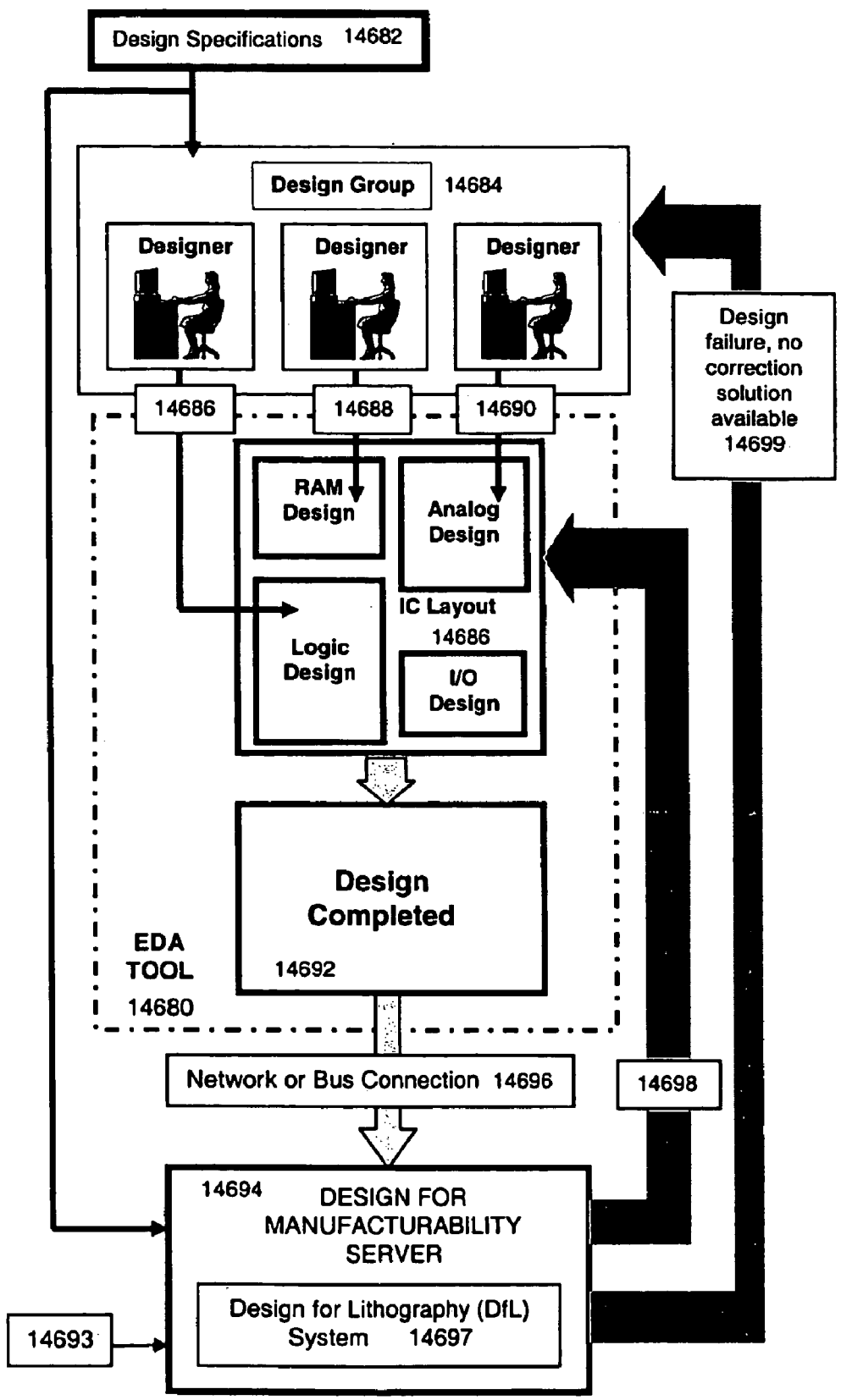

FIG. 94B illustrates a use of the implementation communicating with an EDA tool via a network.

Figure 95:
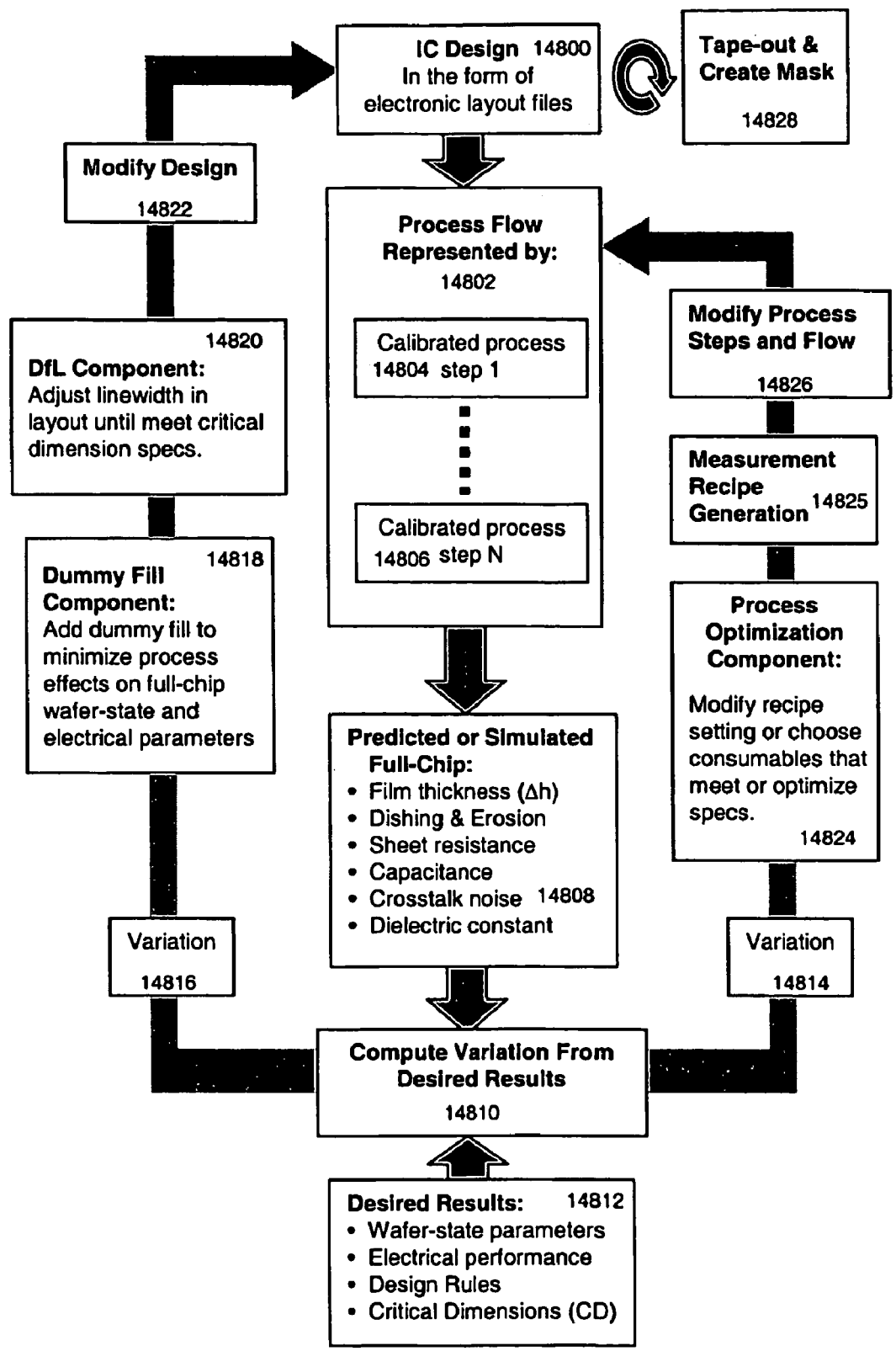

FIG. 95 illustrates use of the method within a design for manufacturing system.

Figure 96:
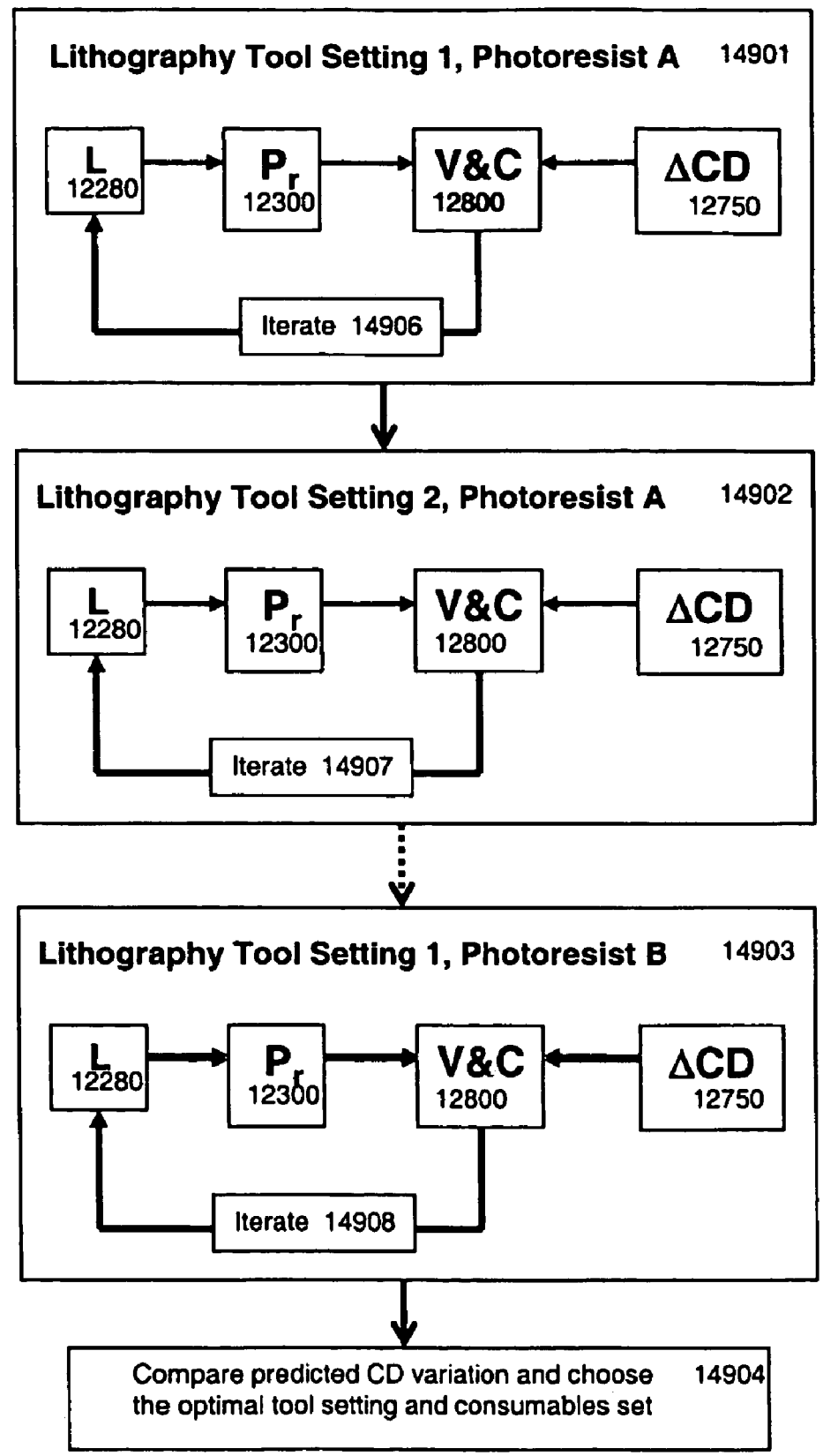

FIG. 96 illustrates use of the method within a design for manufacturing system for choosing lithography related tool settings, recipes or consumable sets.

Figure 97:
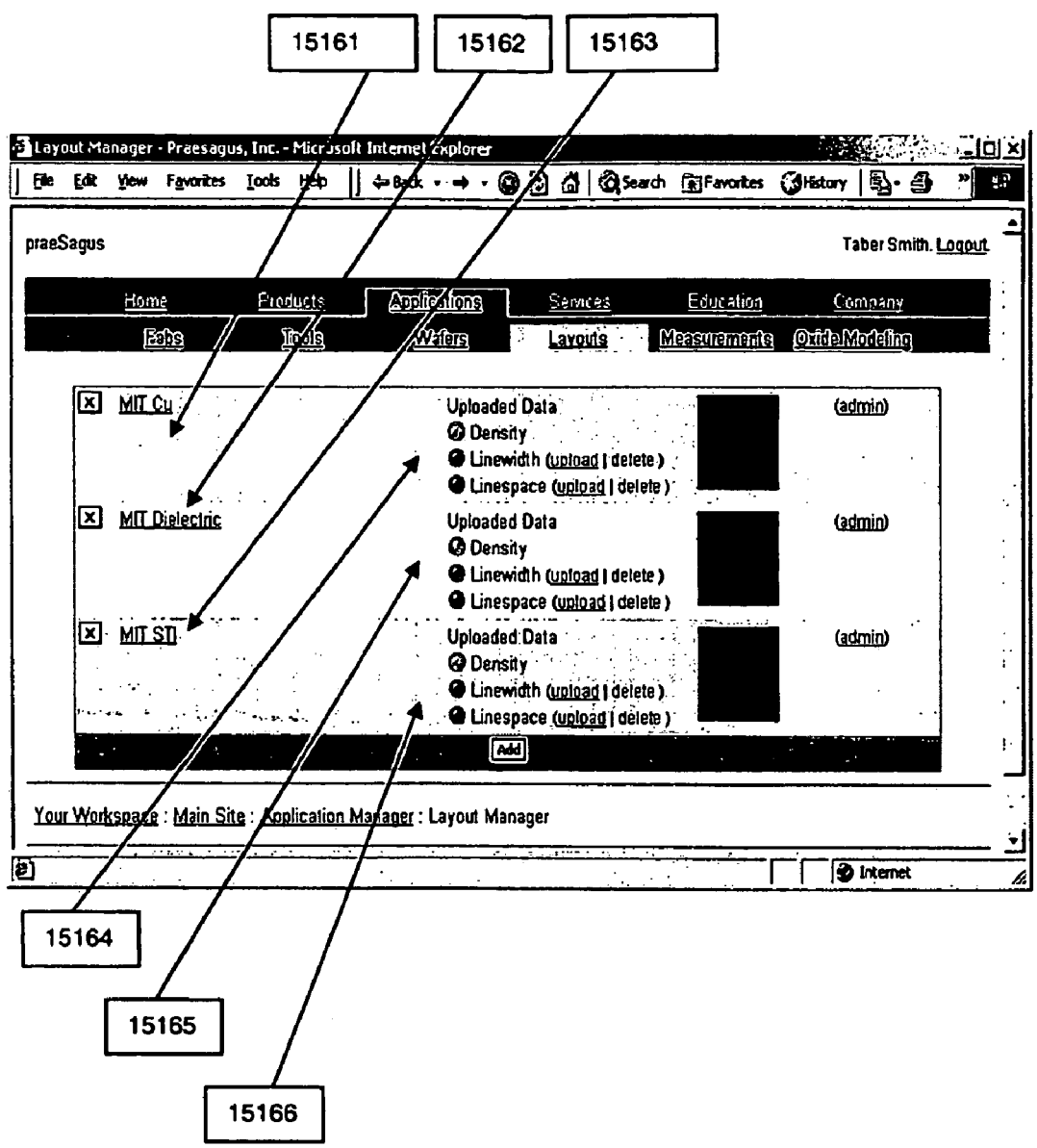

FIG. 97 illustrates a GUI for managing layout extractions from multiple designs.

Figure 98A:
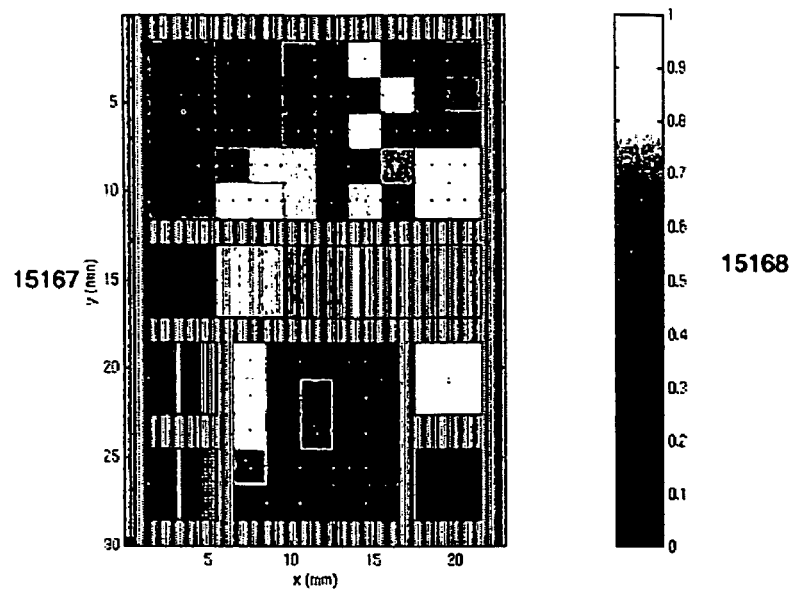

FIG. 98A illustrates results from a feature width extraction from a chip layout.

Figure 98B:
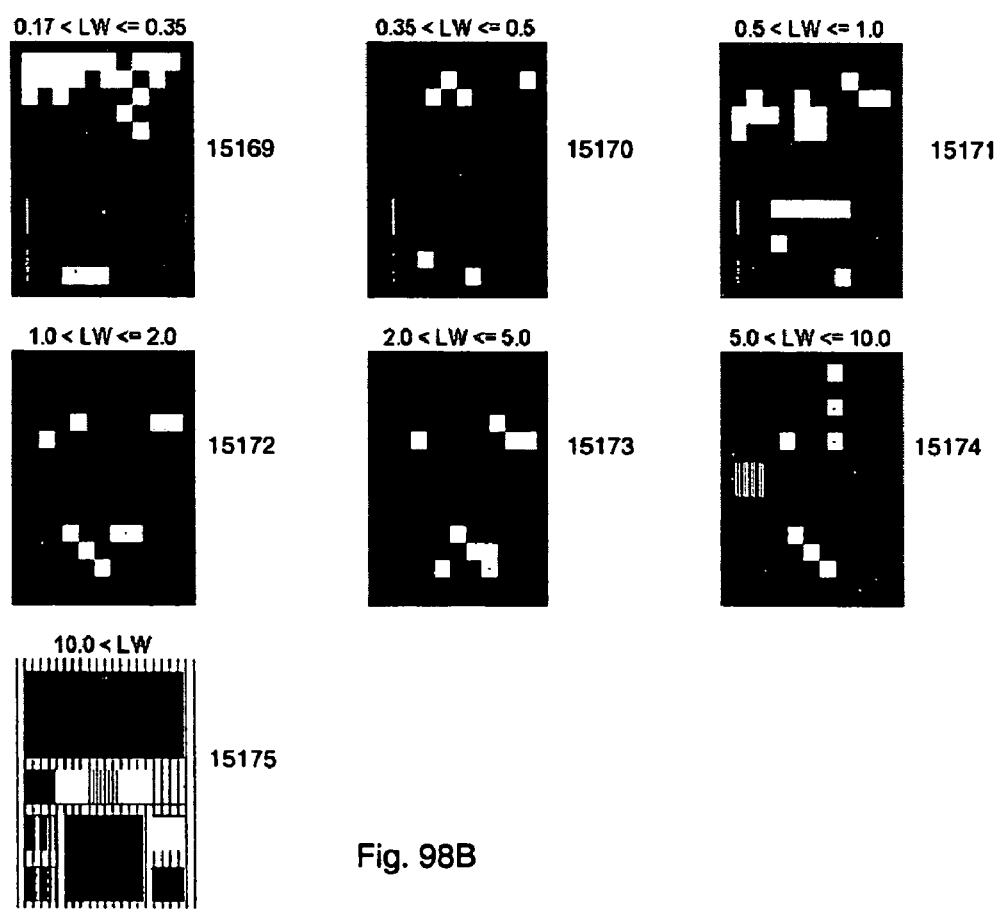

FIG. 98B illustrates results from extraction binning based upon feature width.

Figure 99A:
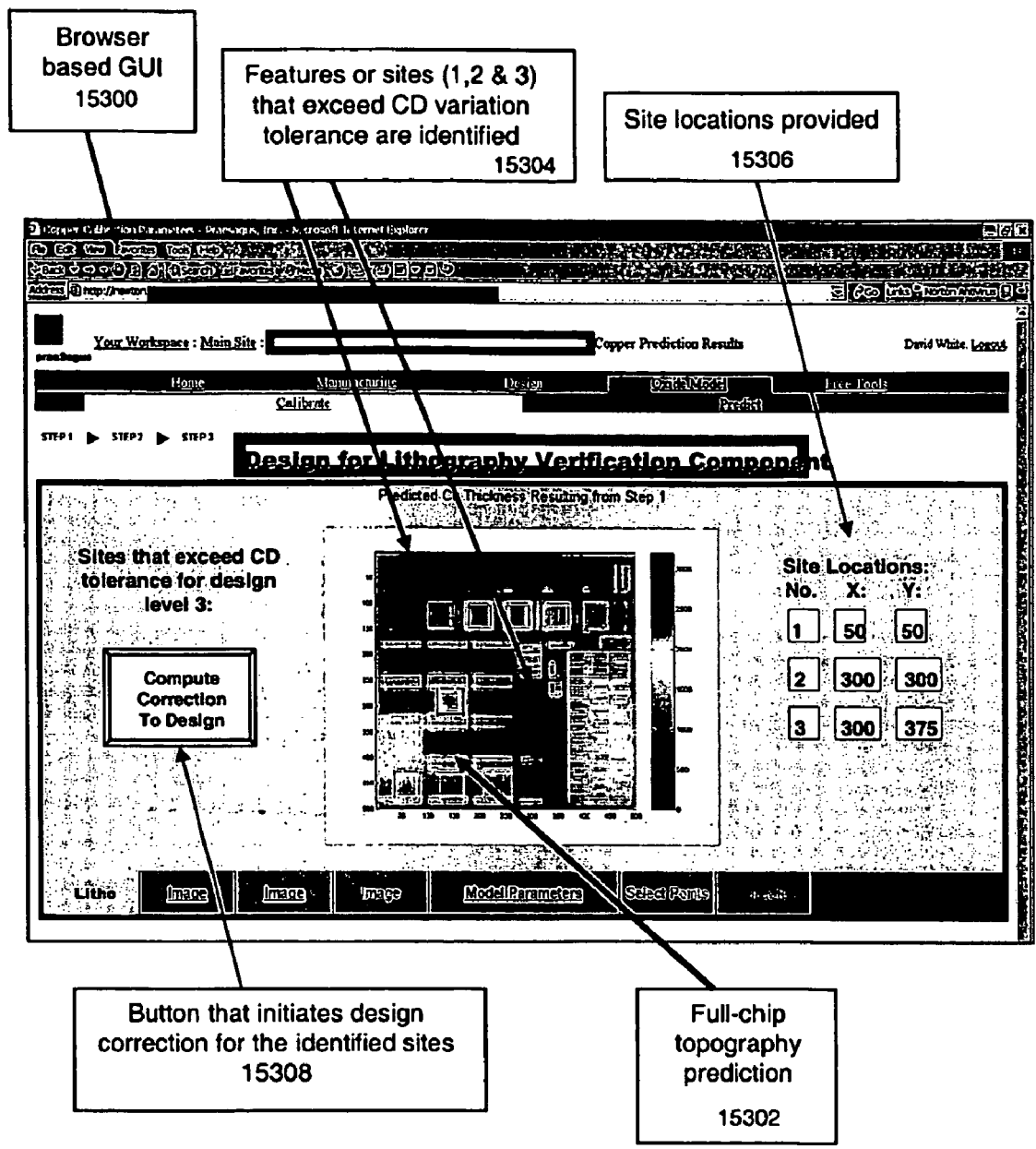

FIG. 99A illustrates a GUI for a design for lithography system embedded within a design for manufacturing system.

Figure 99B:
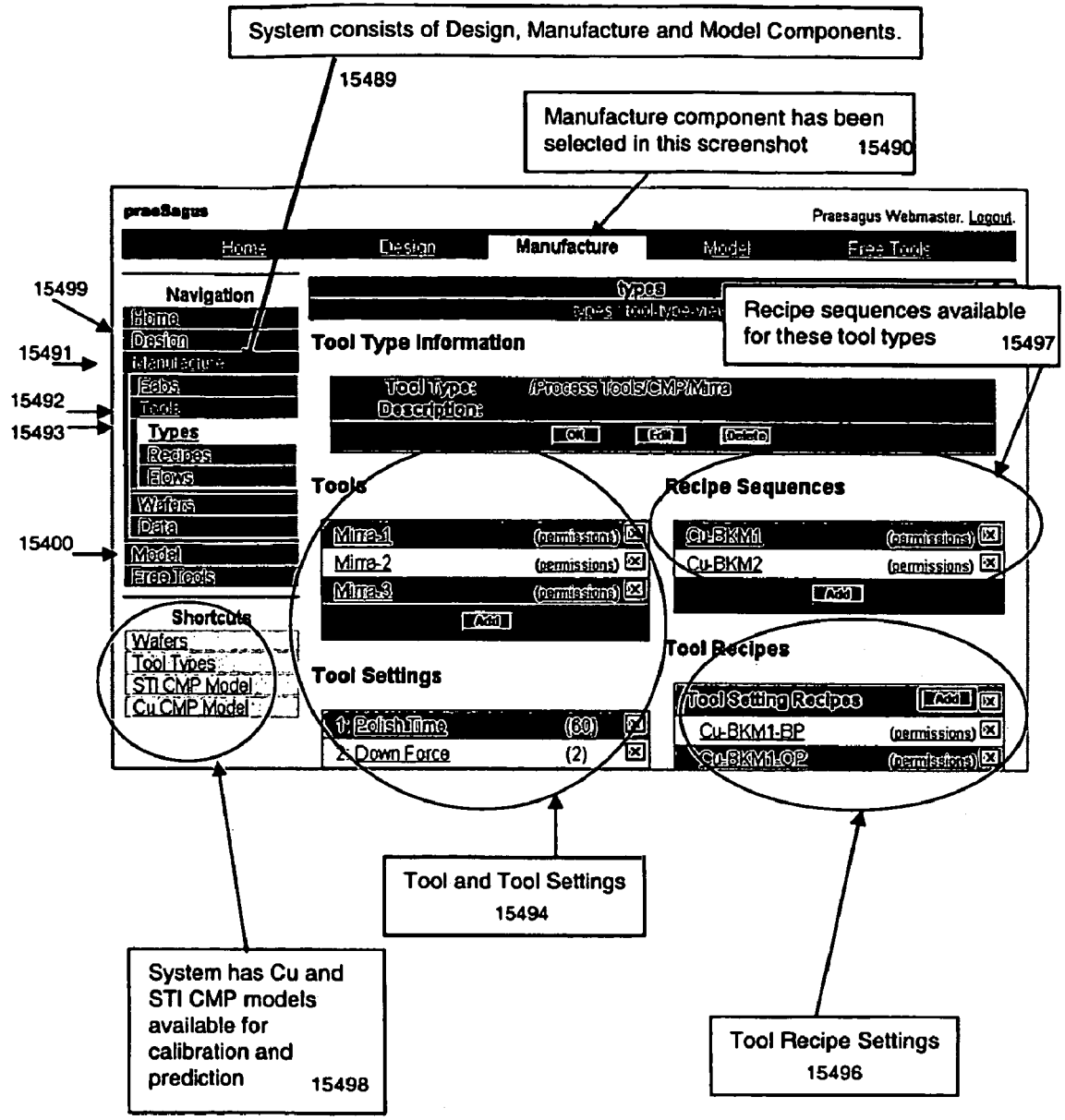

FIG. 99B illustrates a GUI for managing tools and tool recipes within a design for lithography or design for manufacturing system.

Figure 100A:
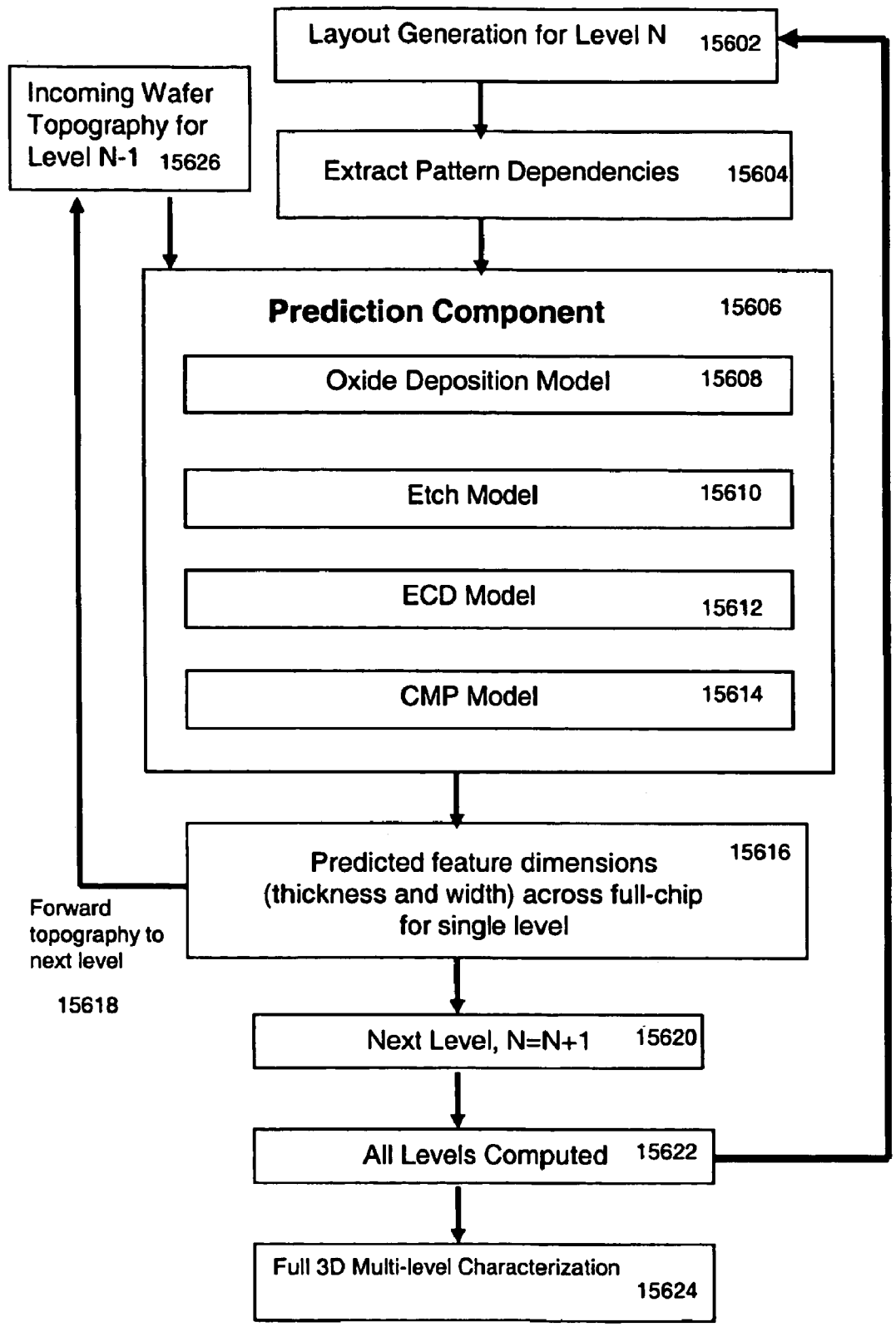

FIG. 100A describes how method may be used to generate three-dimensional feature geometries.

Figure 100B:
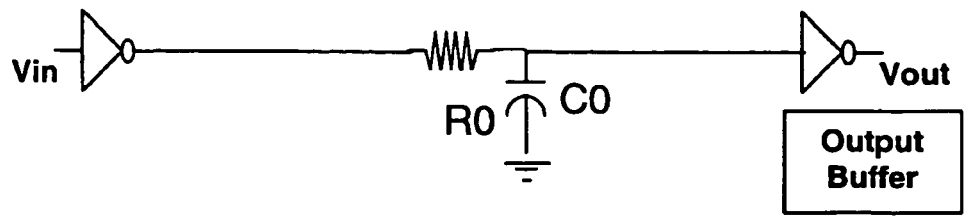

FIG. 100B illustrates a circuit with a single driver at the input and output with a 10 mm wire.

Figure 100C:
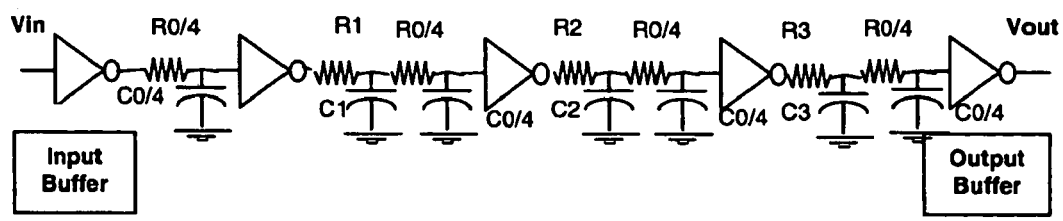

FIG. 100C illustrates a circuit with conservative buffer use.

Figure 100D:
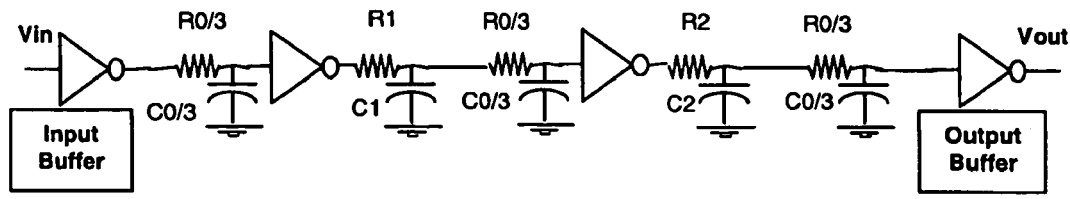

FIG. 100D illustrates a circuit with less conservative buffer use.

Figure 101A:
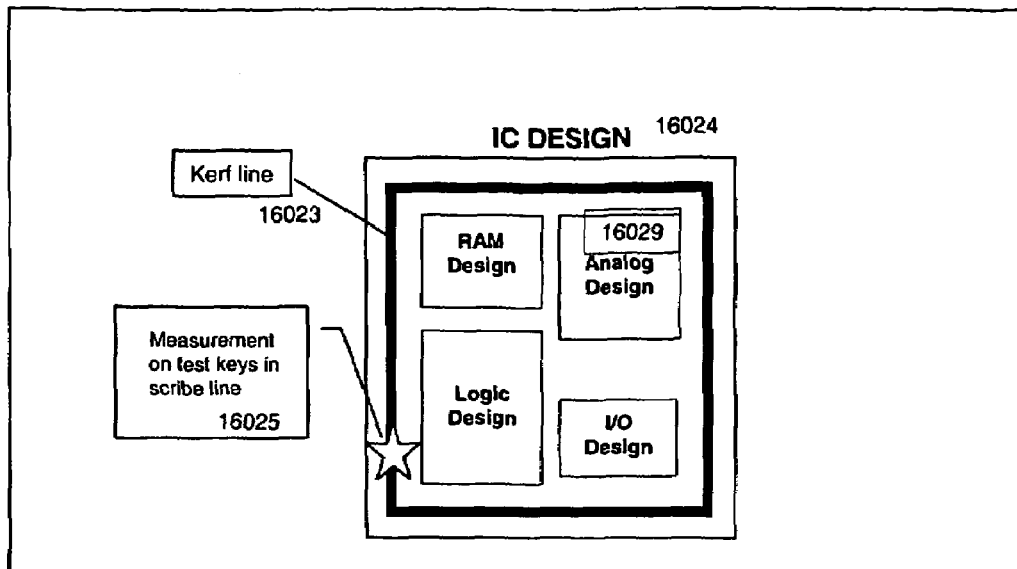

FIG. 101A illustrates where measurements are commonly taken without specific knowledge of problem areas across the chip. The problem is that the test key may not resemble problematic structures in the chip.

Figure 101B:
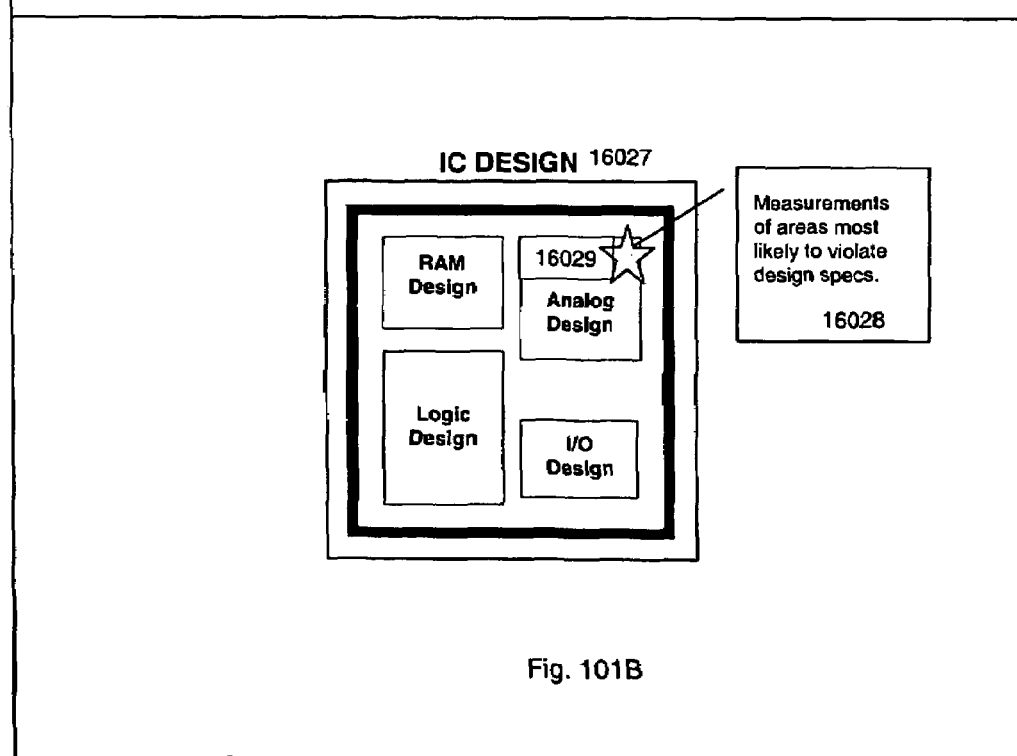

FIG. 101B illustrates a goal of dynamic measurement plan generation where specific structures that are likely problematic areas are identified for measurement.

FIG. 102A illustrates film thickness variation that results from oxide CMP.

FIG. 102B illustrates erosion, dishing and corner rounding effects associated with the CMP step used in the process formation of shallow trench isolation (STI).

FIG. 102C illustrates copper dishing, dielectric erosion and residual copper effects associated with the copper CMP step used in damascene processes.

Figure 102D:
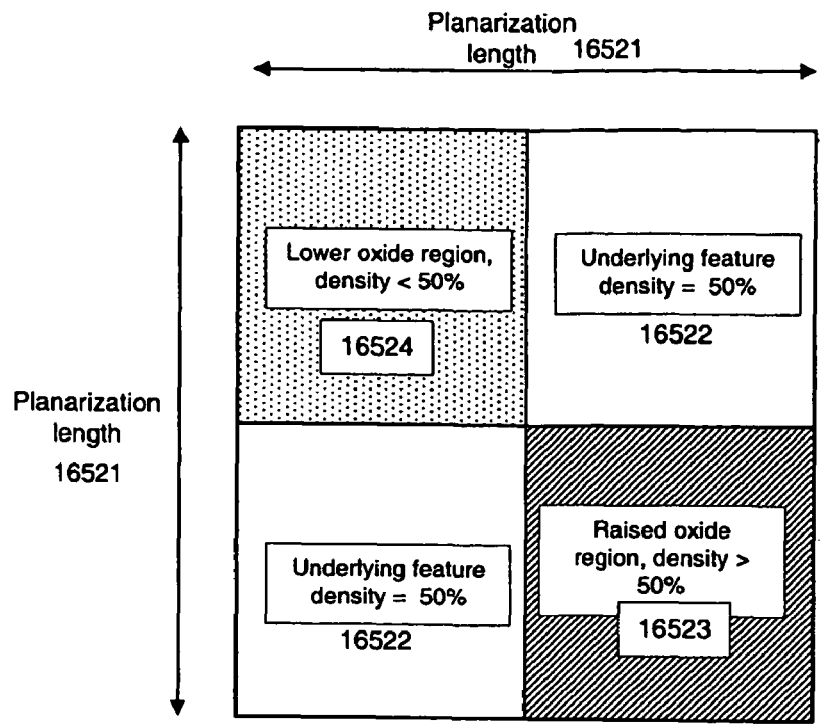

FIG. 102D illustrates top-down view of different density features within a square defined by the planarization length.

Figure 102E:
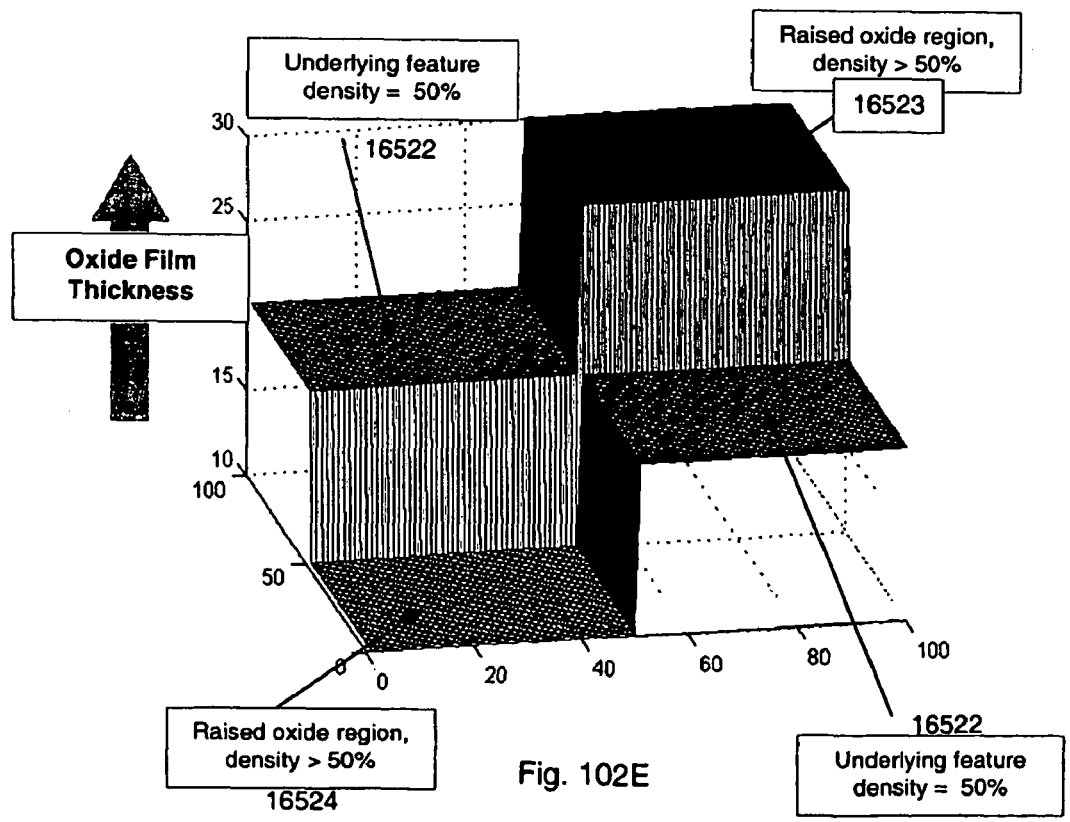

FIG. 102E illustrates the variation in oxide thickness for the features within the planarization length.

FIG. 103A illustrates the ideal result of copper CMP in a damascene process.

FIG. 103B illustrates the formation of residual copper above two metal lines, forming a jumper or short between the two electrical structures.

FIG. 103C illustrates the dishing of copper material into two metal lines, resulting in an unwanted increase in the resistance of the metal line.

Figure 104:
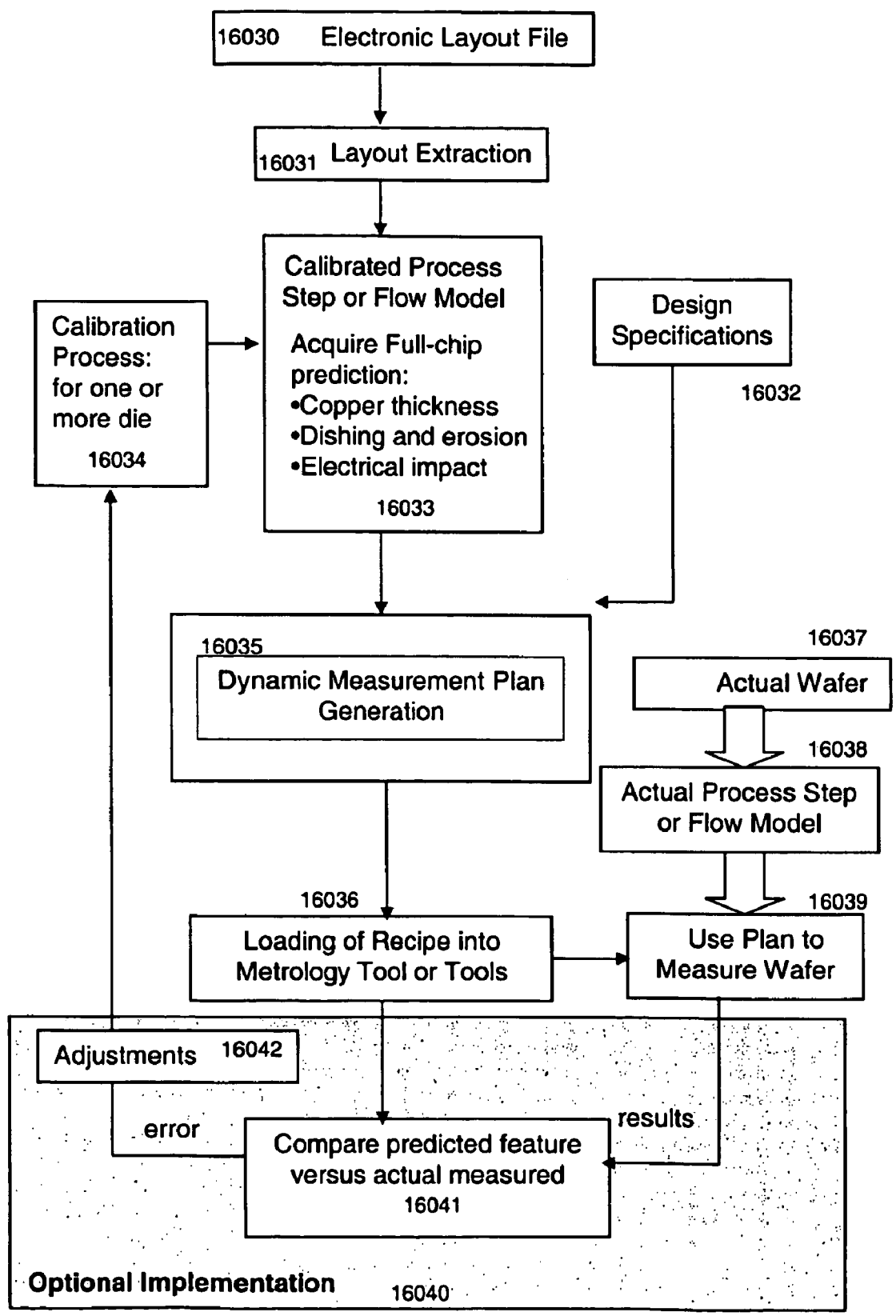

FIG. 104 provides a high-level flow diagram of the method

Figure 105A:
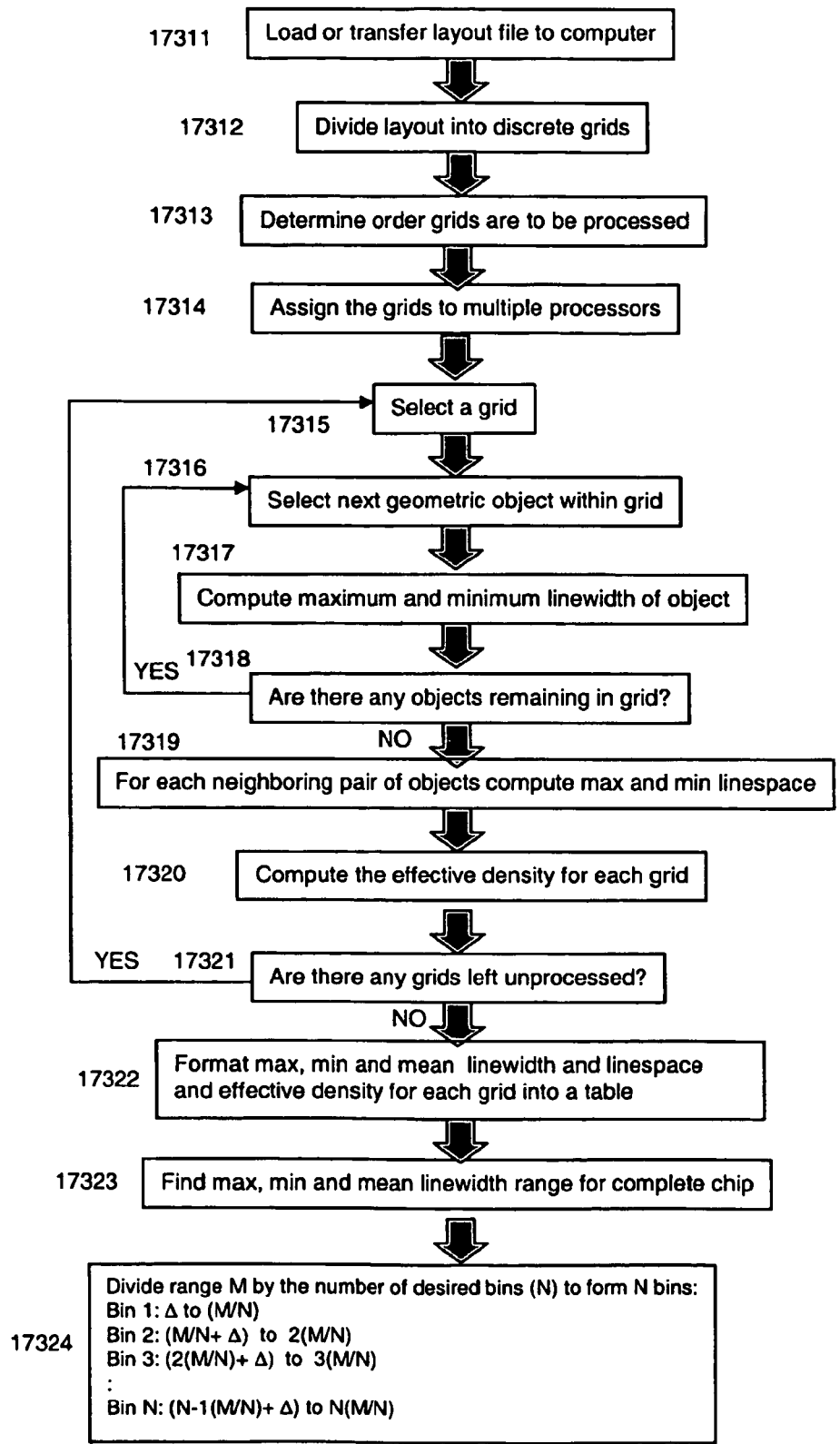

FIG. 105A illustrates the steps involved in layout extraction.

Figure 105B:
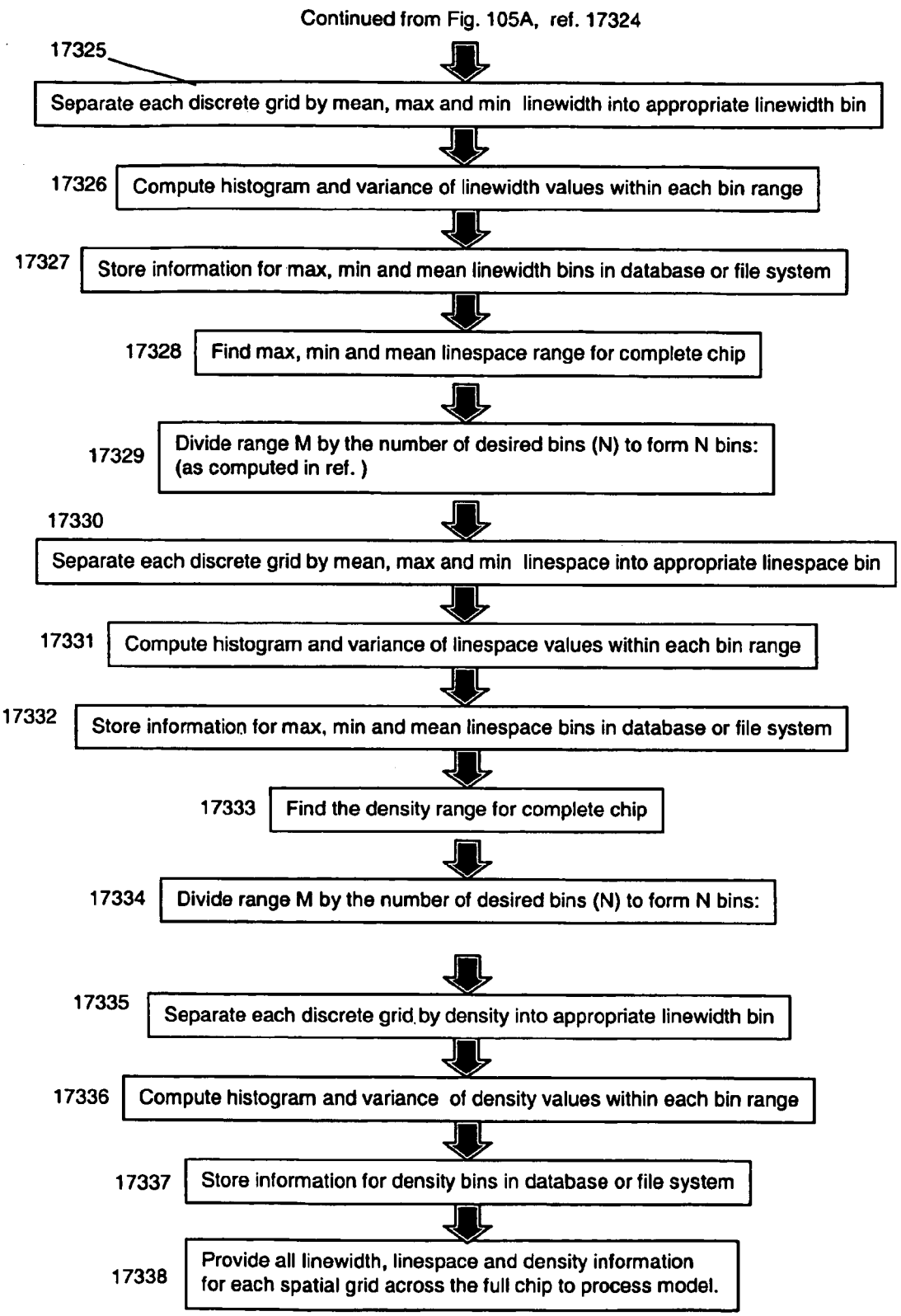

FIG. 105B illustrates a continuation of the steps involved in layout extraction.

Figure 106:
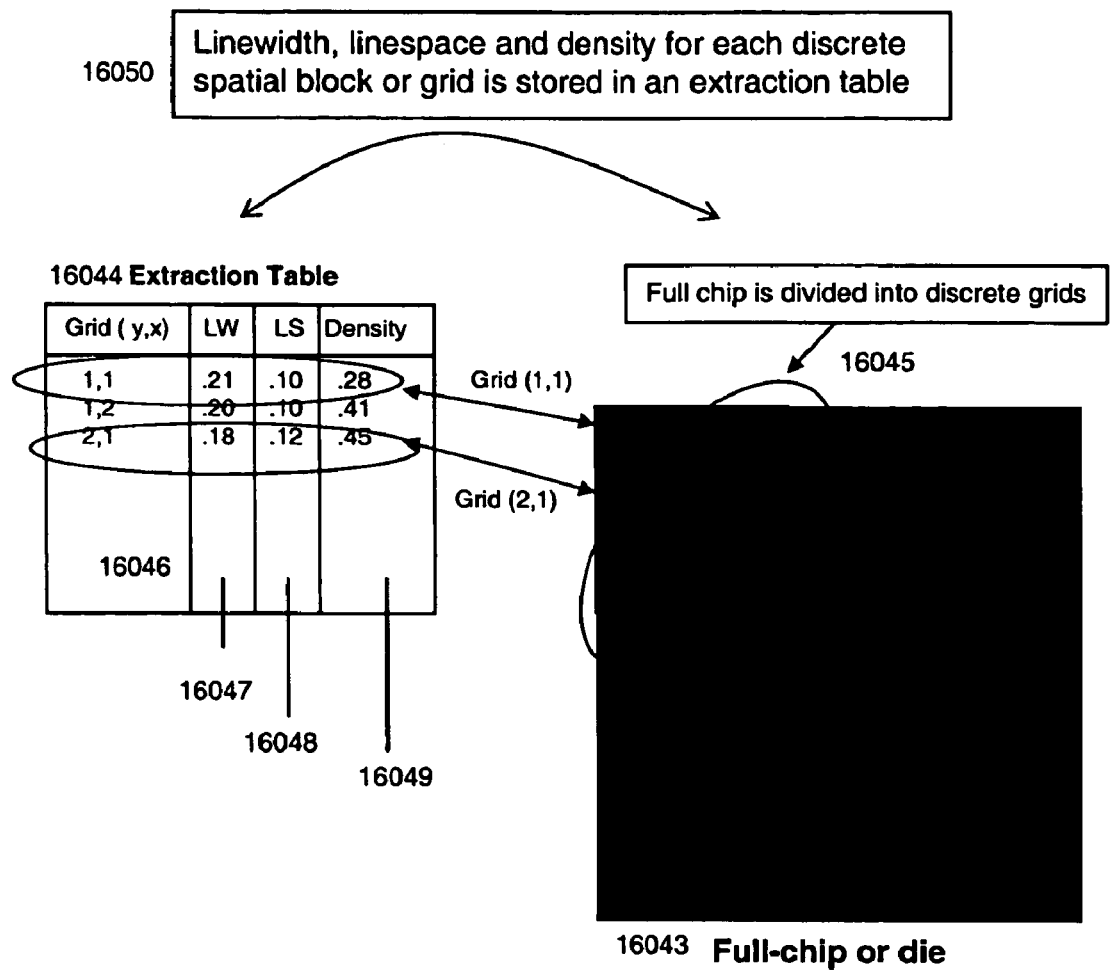

FIG. 106 illustrates the relationship between spatial regions across the chip and the creation of a layout extraction table.

Figure 107A:
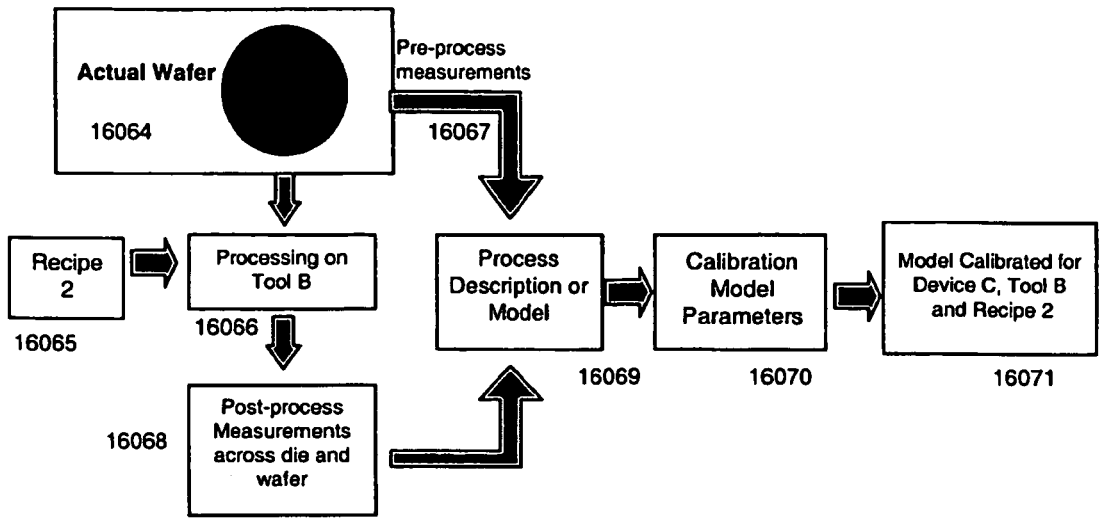

FIG. 107A illustrates the use of product wafers in calibrating a tool for a particular recipe.

Figure 107B:
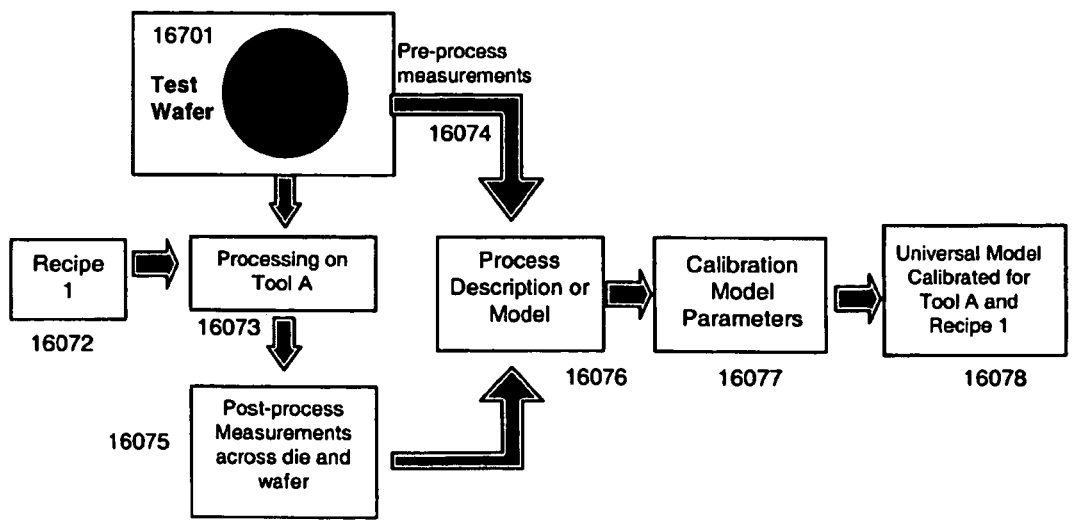

FIG. 107B illustrates the use of test wafers in calibrating a tool for a particular recipe.

Figure 108A:
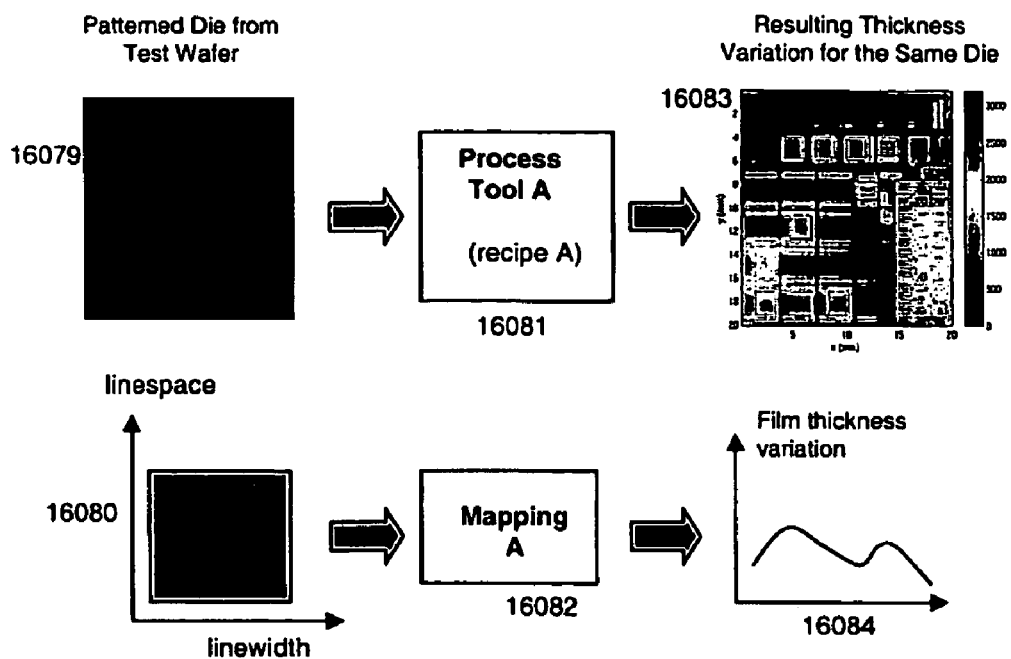

FIG. 108A illustrates how a calibration is used to map layout features to film thickness variation.

Figure 108B:
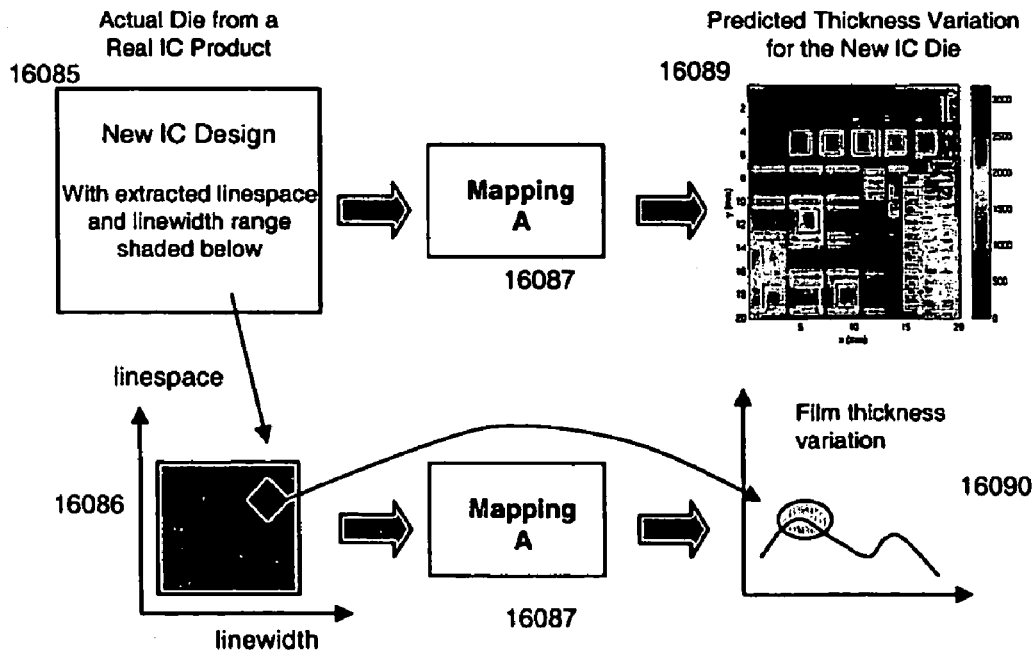

FIG. 108B illustrates the use of the calibration mapping to predict film thickness variation for a new IC design.

Figure 108C:
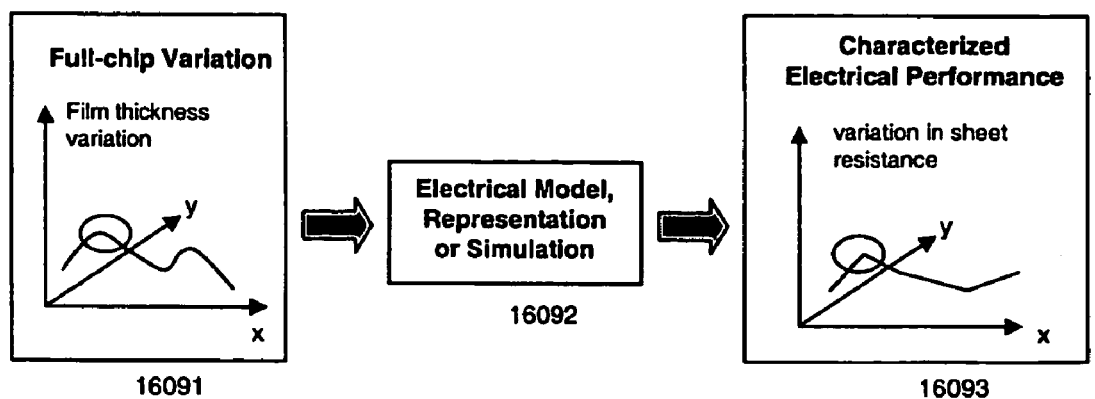

FIG. 108C illustrates how wafer-state parameters, such as film thickness variation, can be used to predict electrical parameters.

Figure 109:
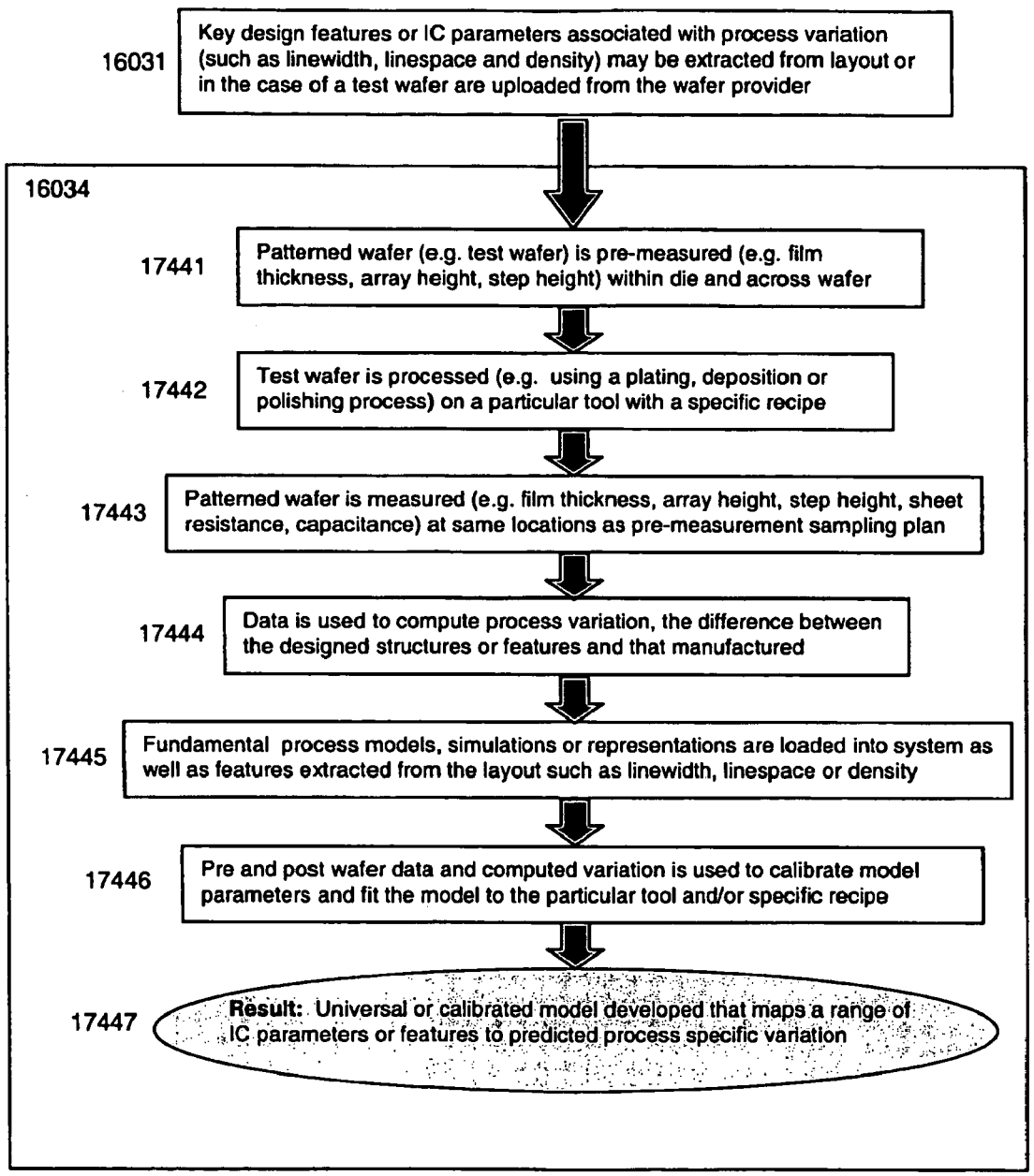

FIG. 109 describes the flow of steps used to calibrate a process step and generate a model.

Figure 110:
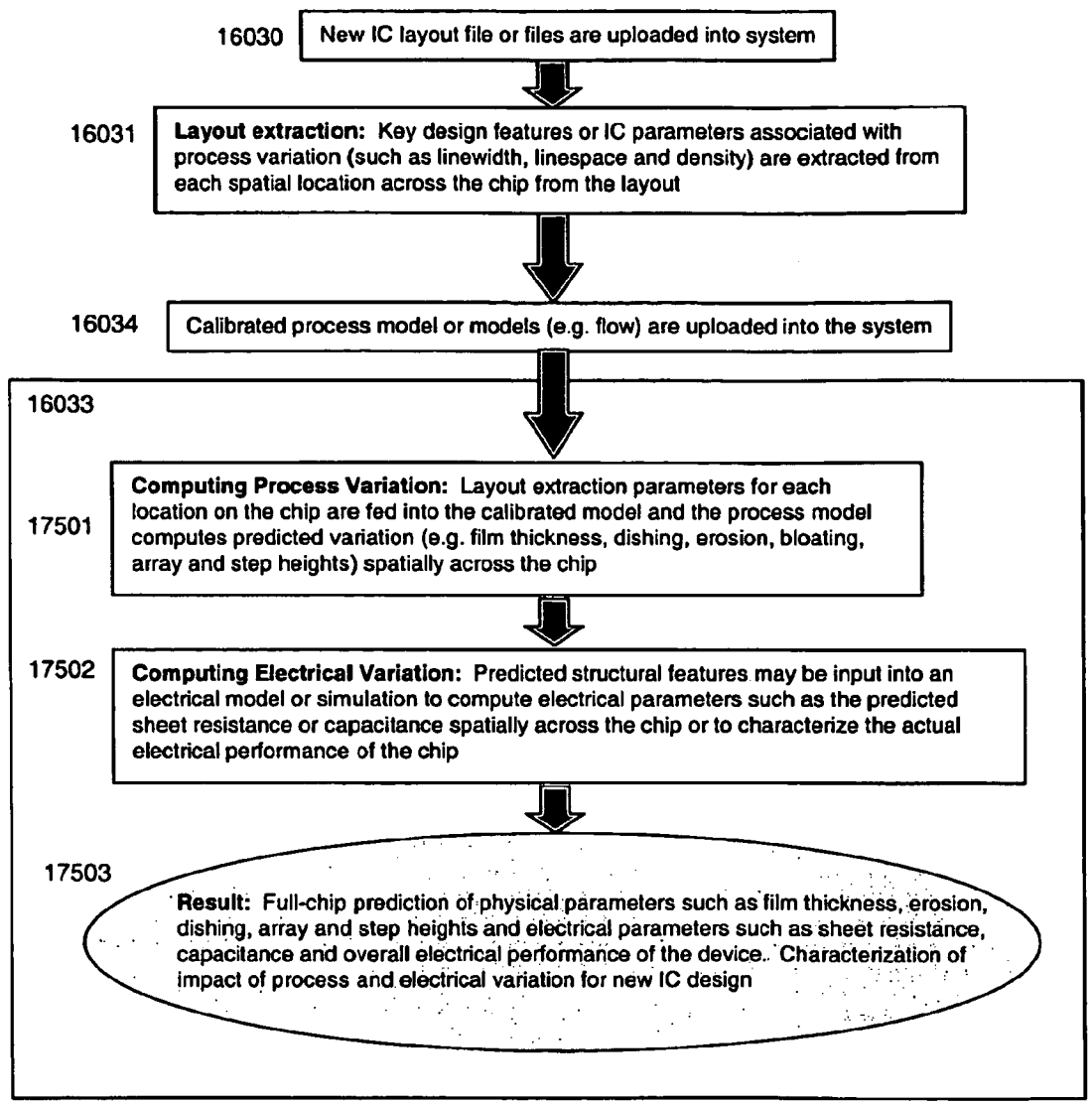

FIG. 110 describes the flow steps involved in using calibration models to predict the impact of process variation and subsequent variation in electrical parameters and performance.

Figure 111A:
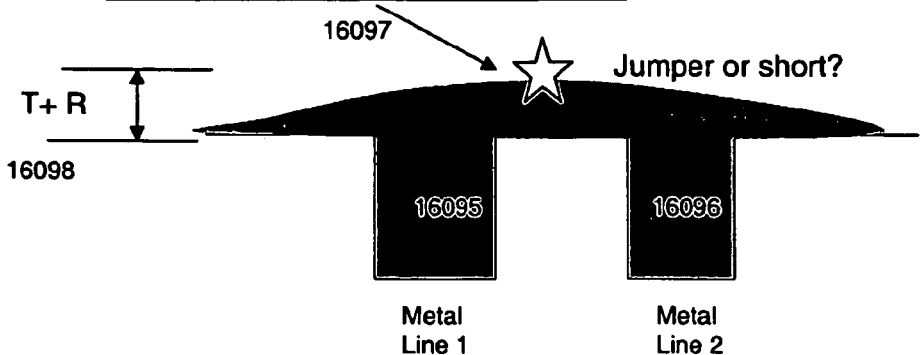

FIG. 111A illustrates how model based predictions are used in the method.

Figure 111B:
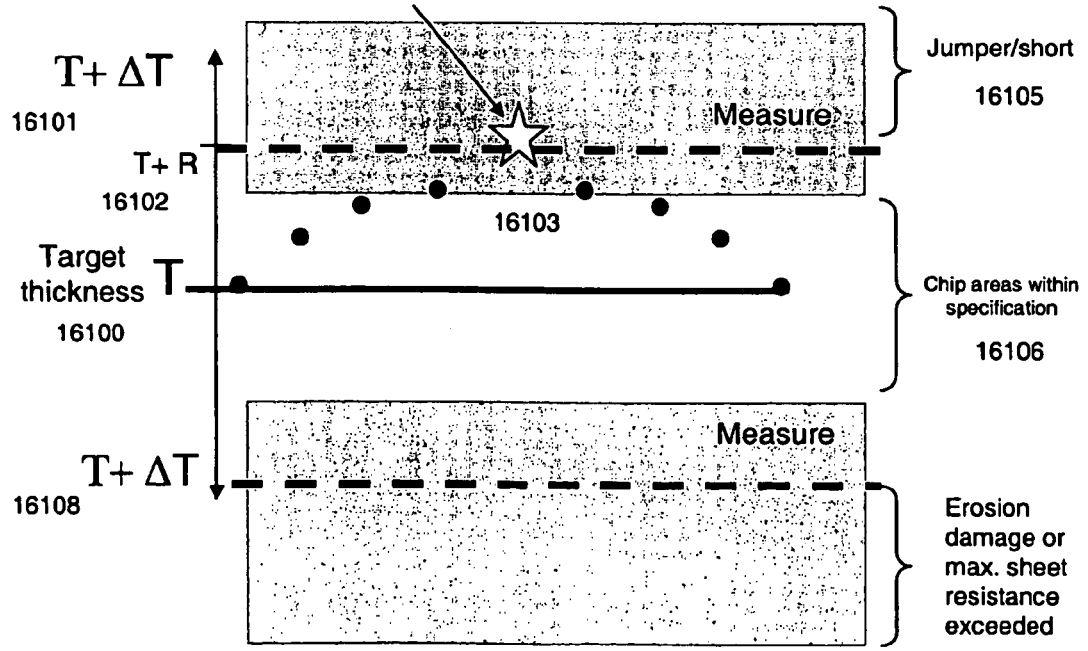

FIG. 111B describes how the method uses predictions and design specifications to select measurement locations across the chip.

Figure 111C:
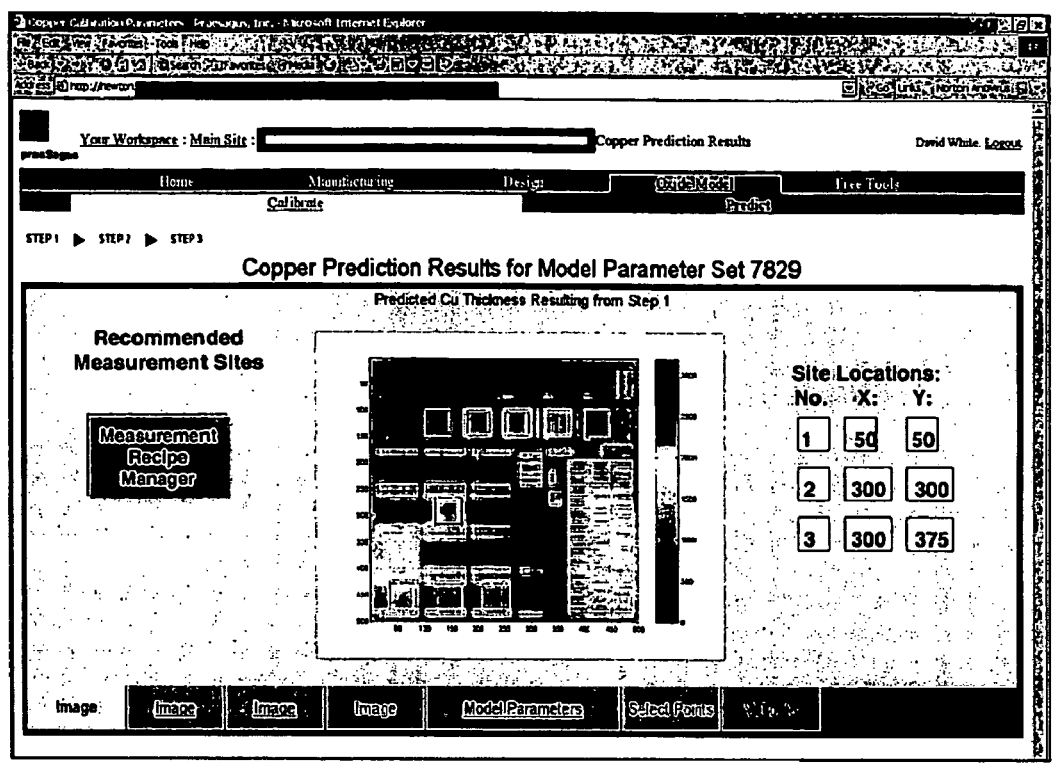

FIG. 111C shows a display screen of a measurement plan.

Figure 112:
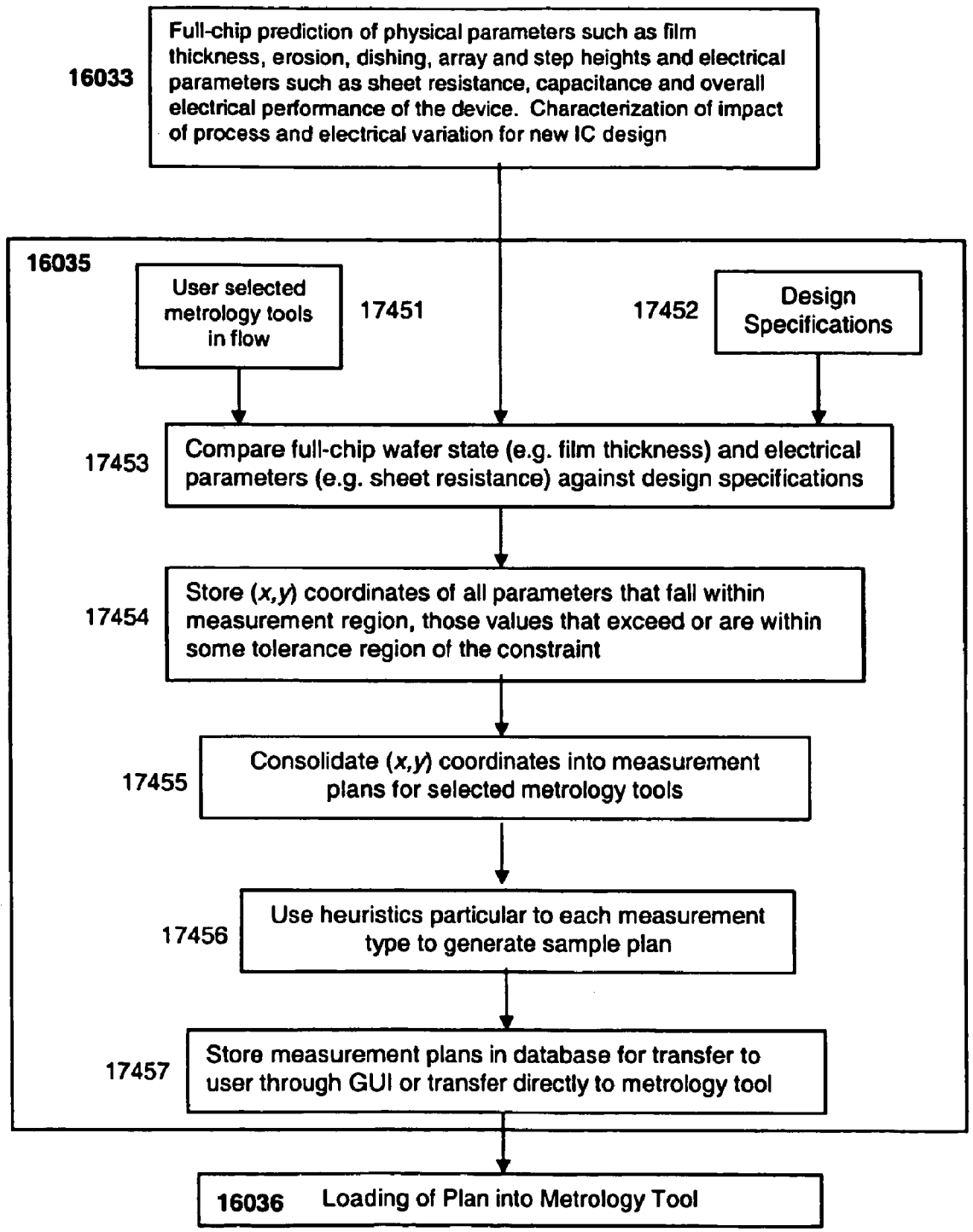

FIG. 112 provides detailed steps of how the method generates full-chip measurement plans.

Figure 113A:
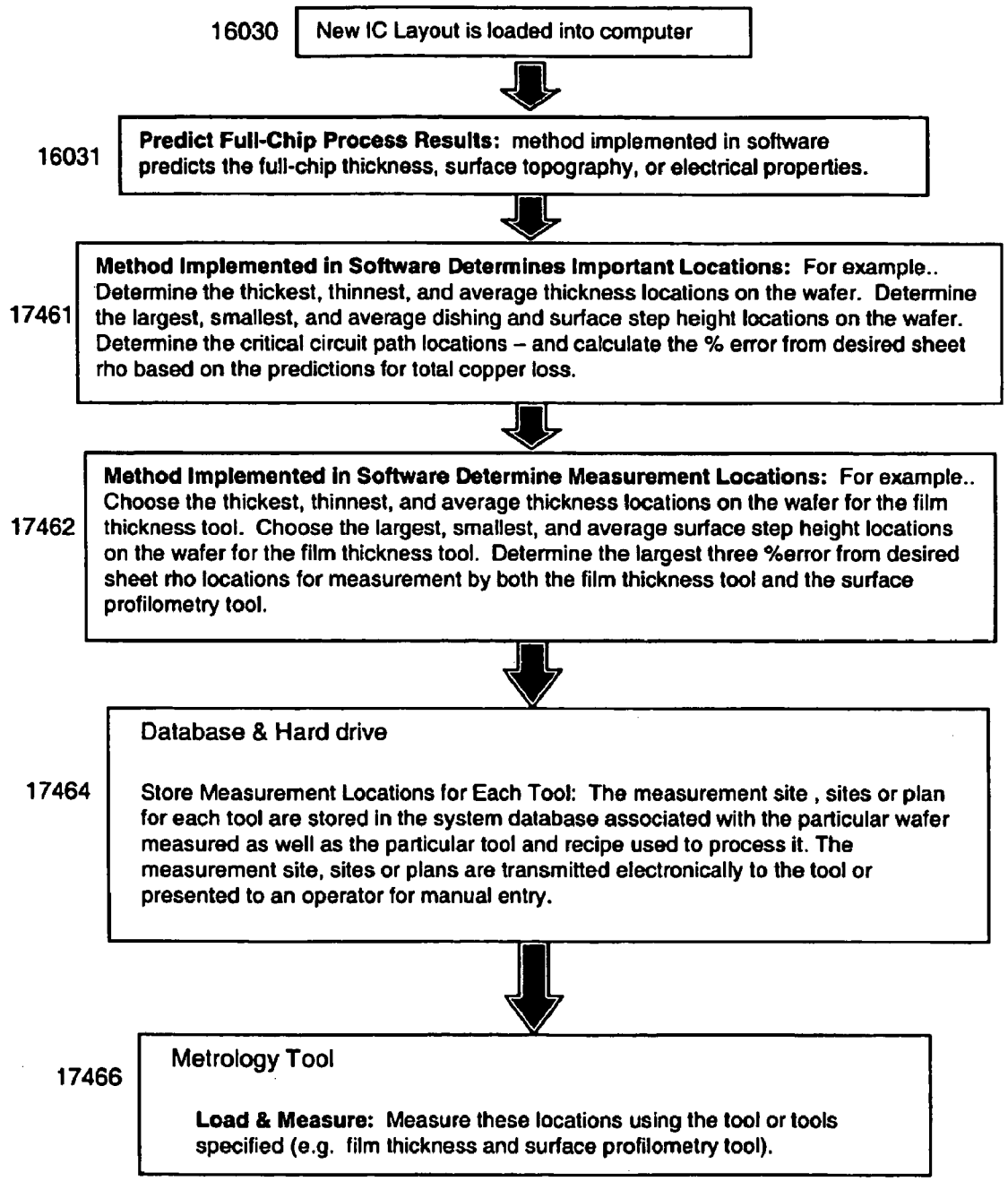
Figure 113B:
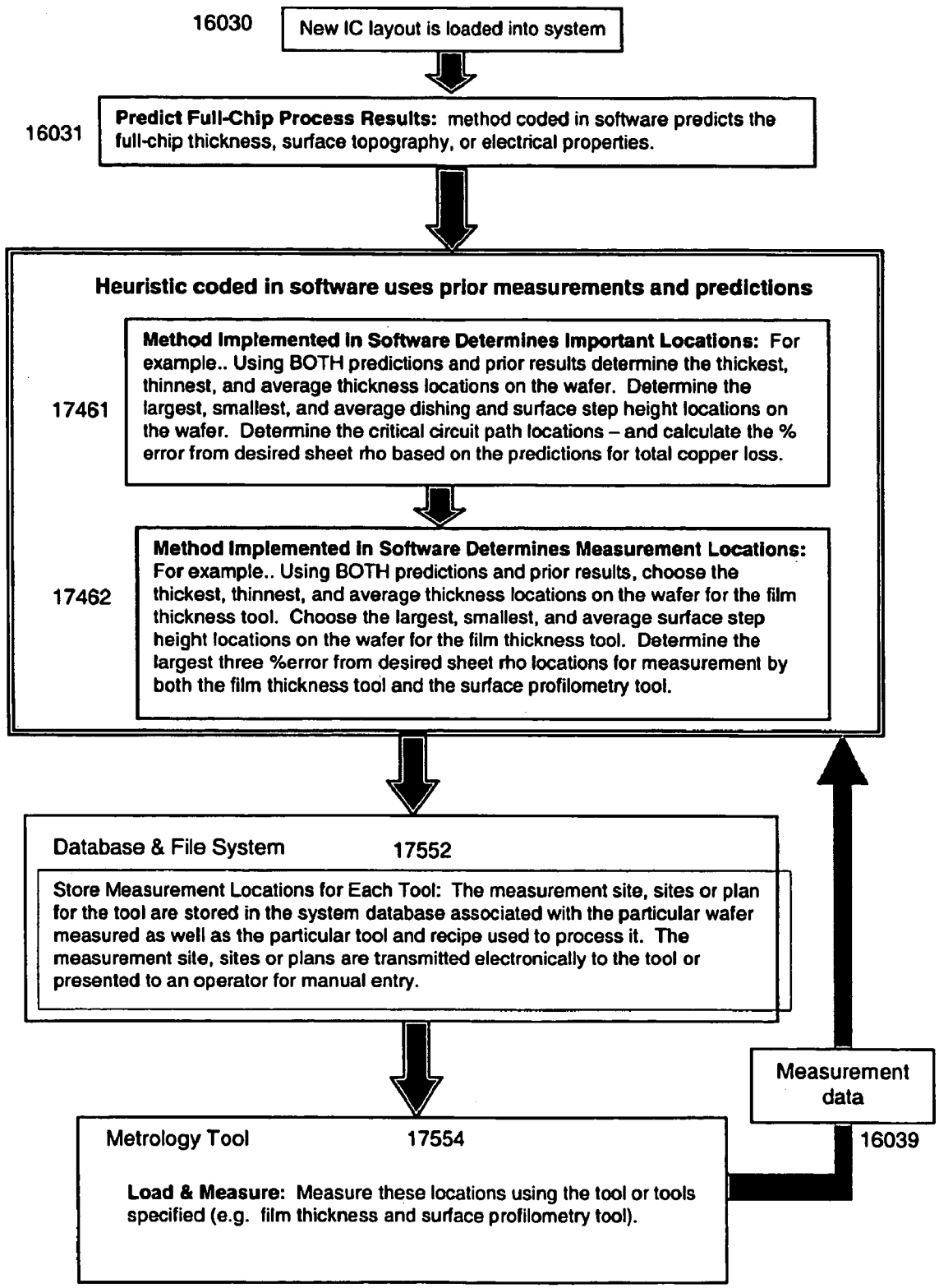

FIGS. 113A and 113B provides a table of heuristics for how specific measurement plans may be generated.

Figure 114A:
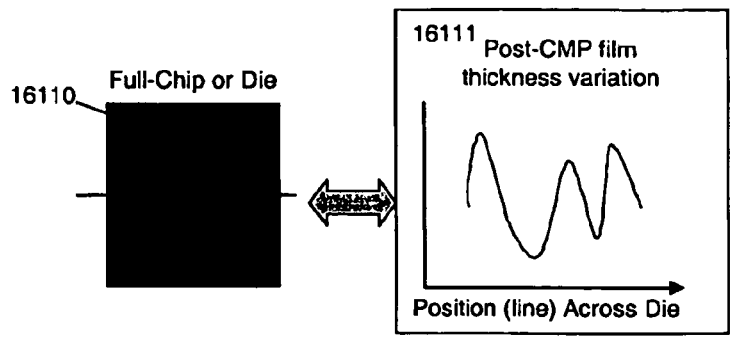

FIG. 114A illustrates the method used to characterize full-chip or within-die variation, a linear plot of film thickness variation is shown.

Figure 114B:
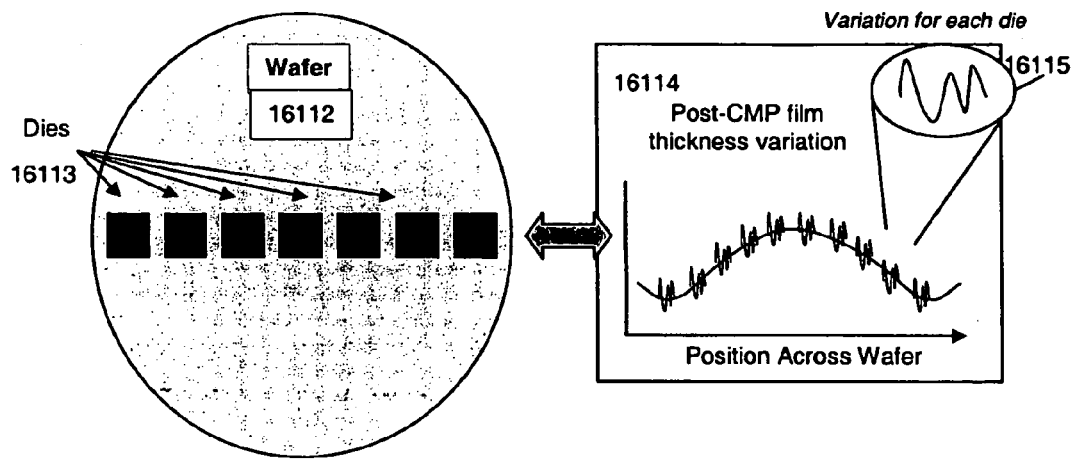

FIG. 114B illustrates the method used to characterize wafer level variation by selecting and characterizing multiple die across the wafer. The linear plot of within die variation is shown relative to a linear plot of wafer level variation.

Figure 114C:
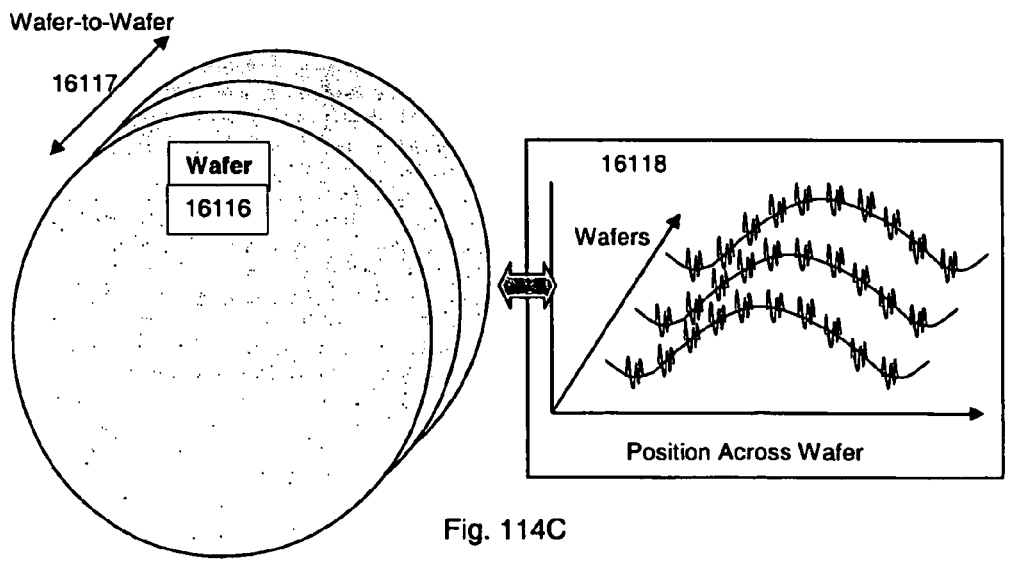

FIG. 114C illustrates the method used to characterize wafer to wafer variation by selecting and characterizing multiple die across the wafer and performing this for multiple wafers at different times in the process life cycle.

Figure 115A:
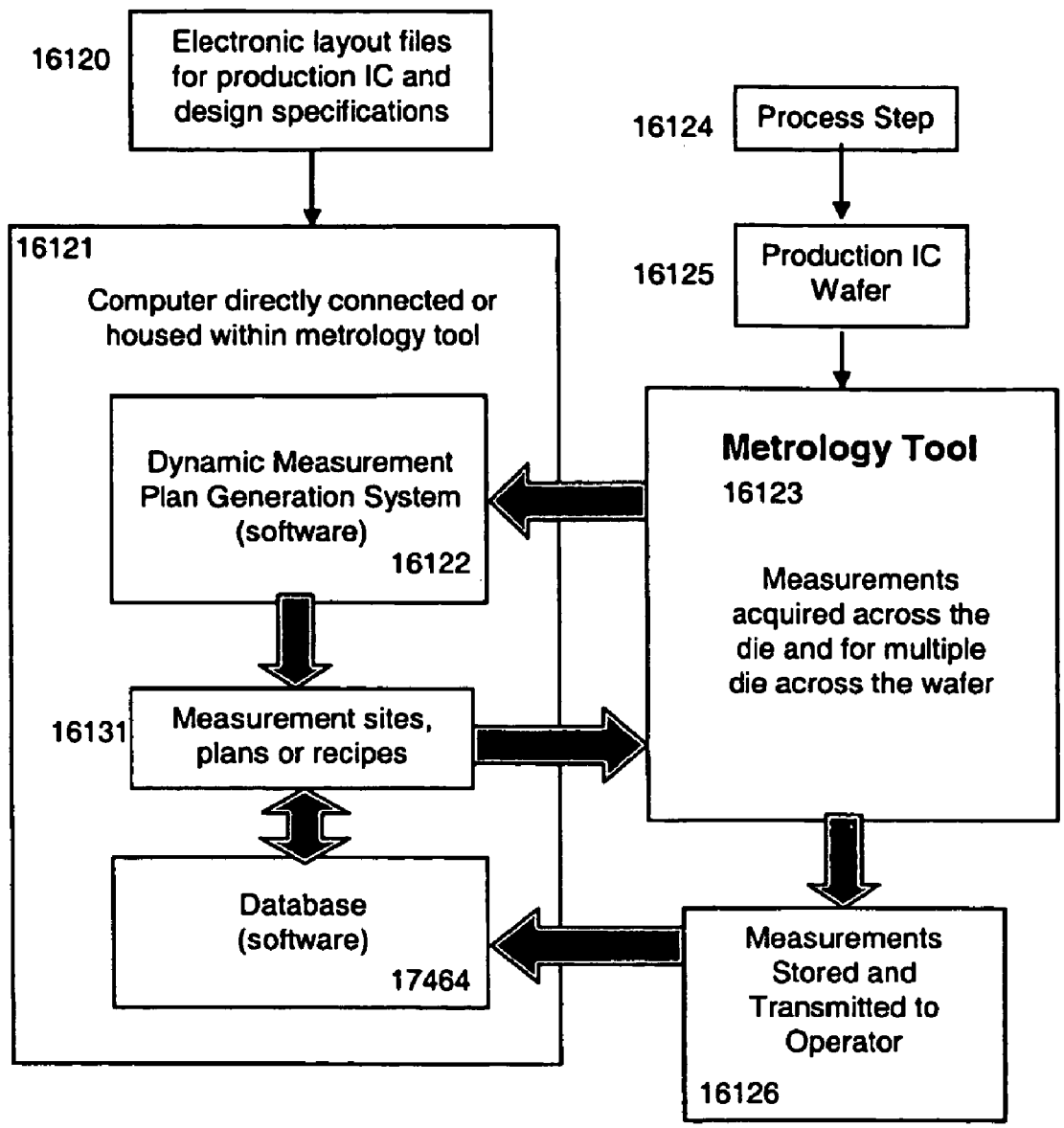

FIG. 115A shows application of the method for use with a metrology tool

Figure 115B:
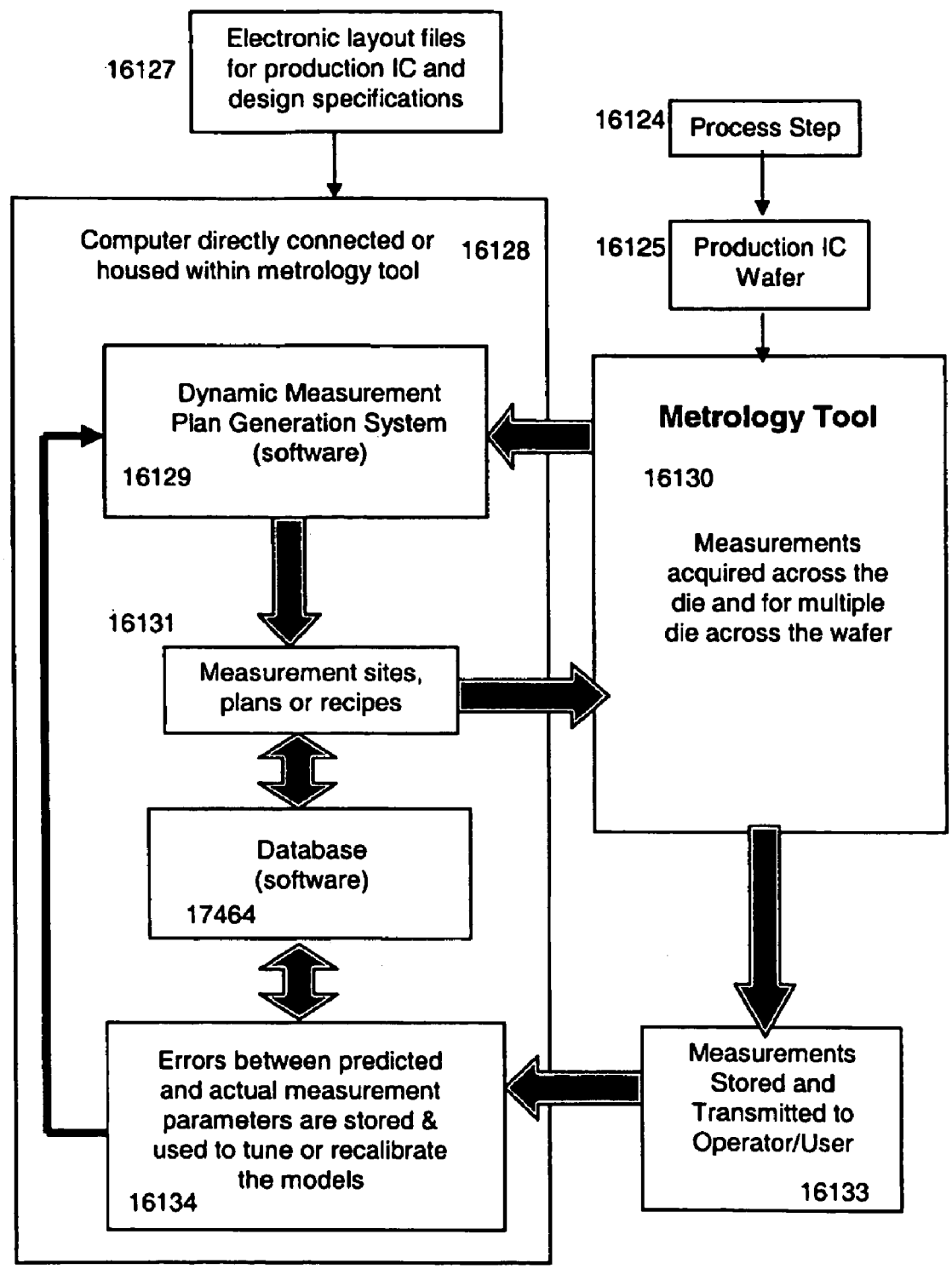

FIG. 115B shows application of the method for use with a metrology tool using feedback from measurement tool to tune or recalibrate process models.

Figure 115C:
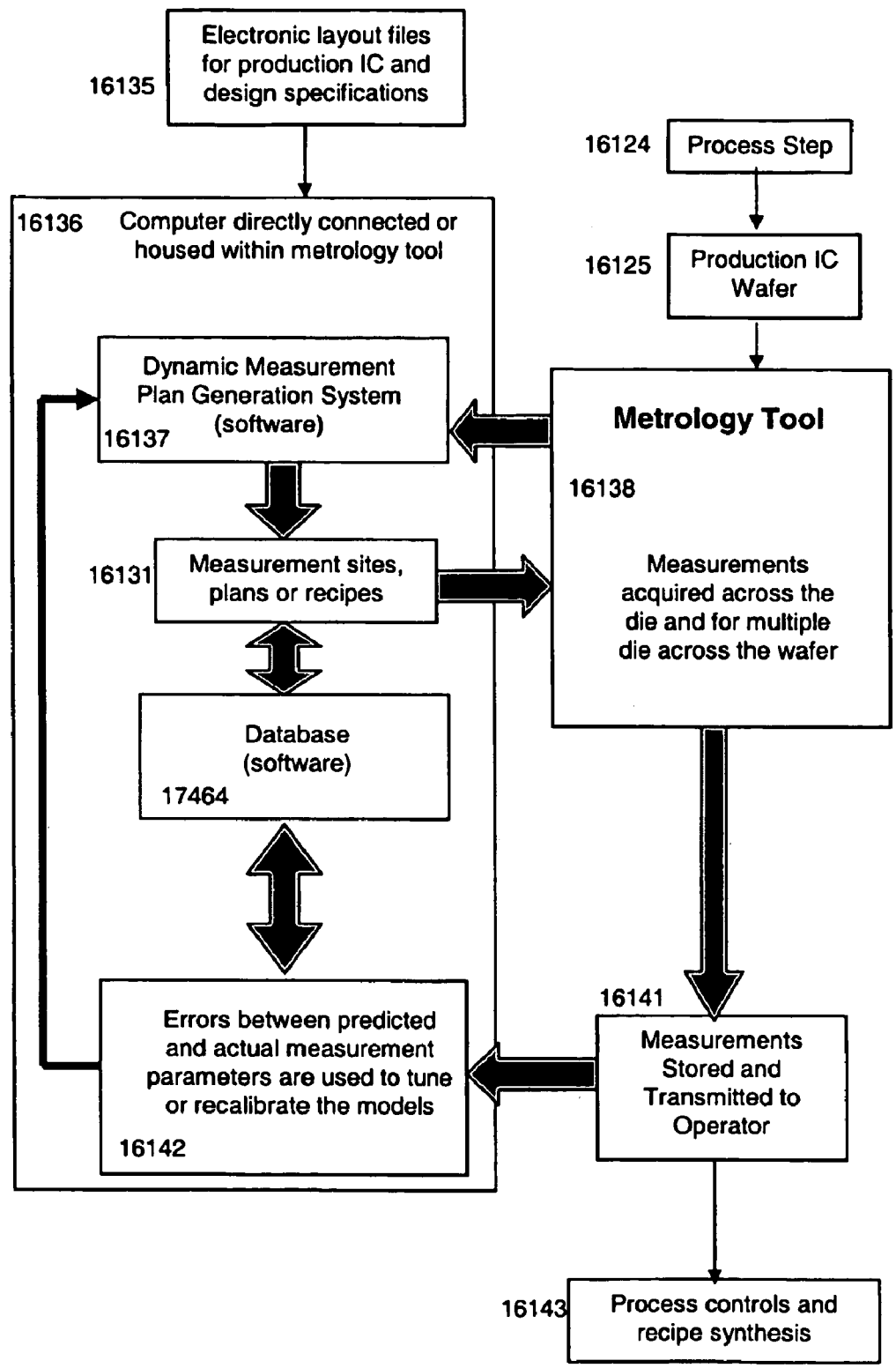

FIG. 115C shows application of the method for use with a metrology tool using feedback from measurement tool to tune or recalibrate process models.

Figure 115D:
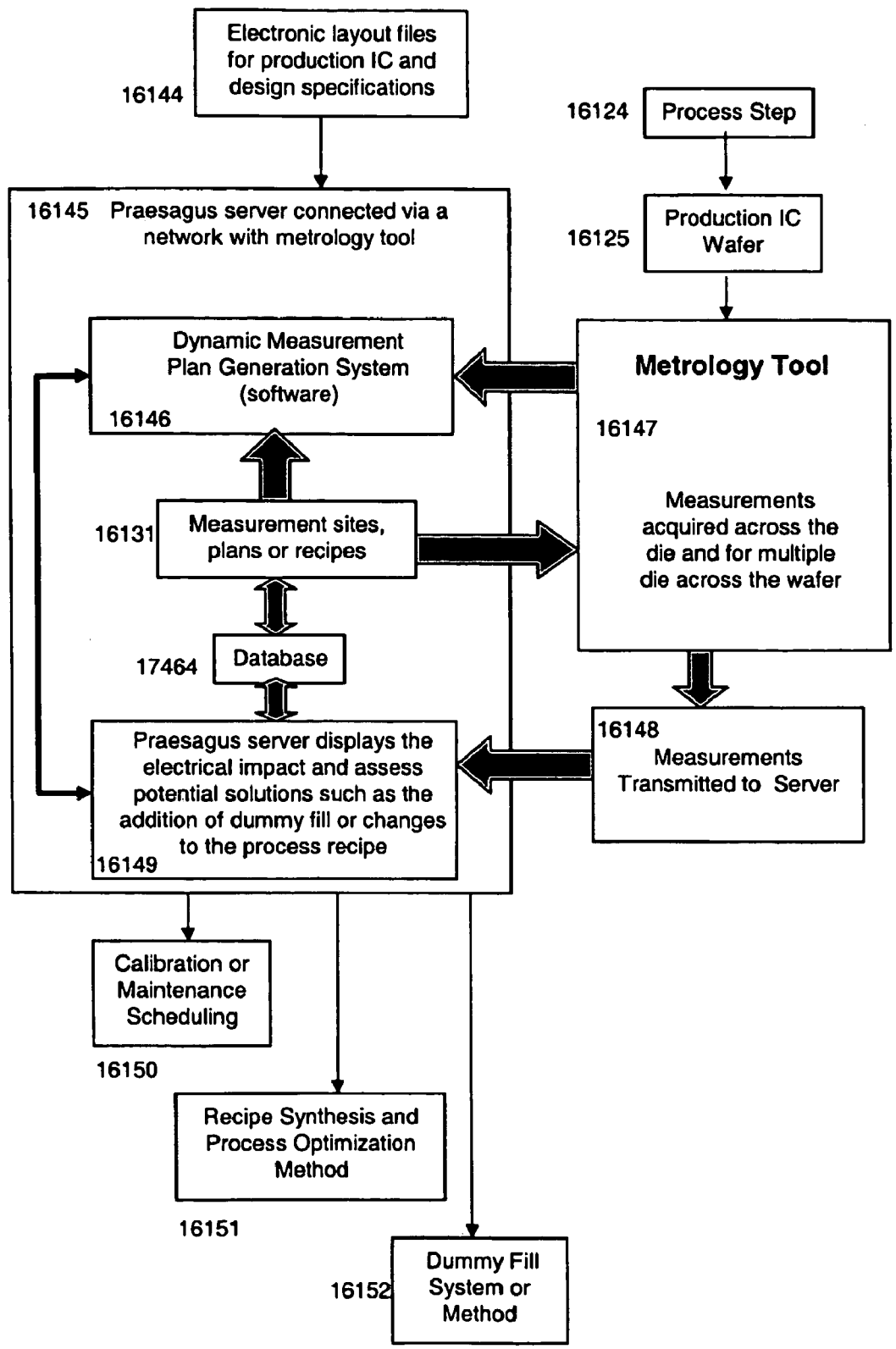

FIG. 115D shows application of the method for use with metrology tool providing feedback to a process control or process optimization or recipe synthesis system as well as providing feedback to a dummy fill tool.

Figure 116:
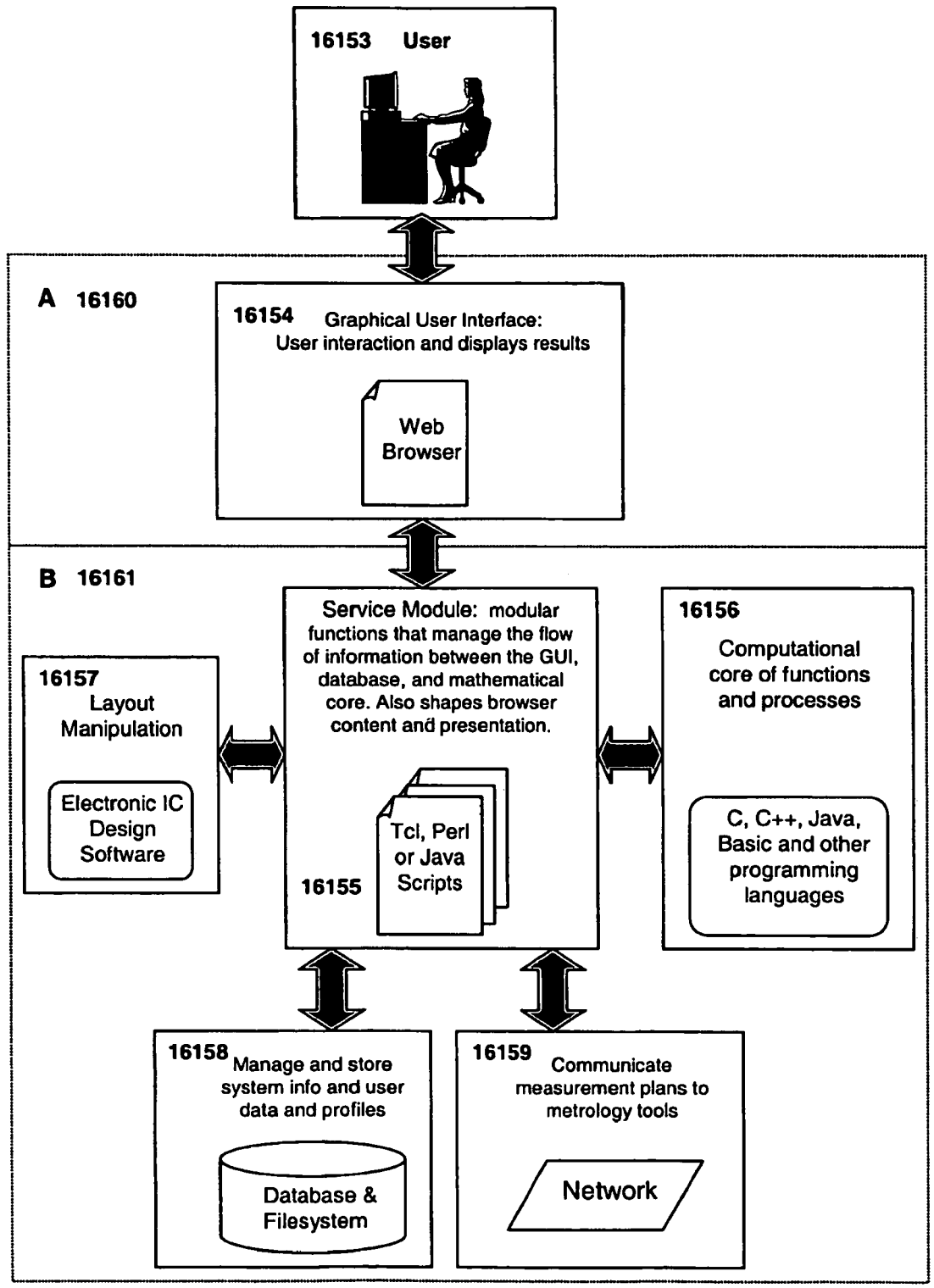

FIG. 116 describes a computer architecture for implementing the method

Figure 117A:
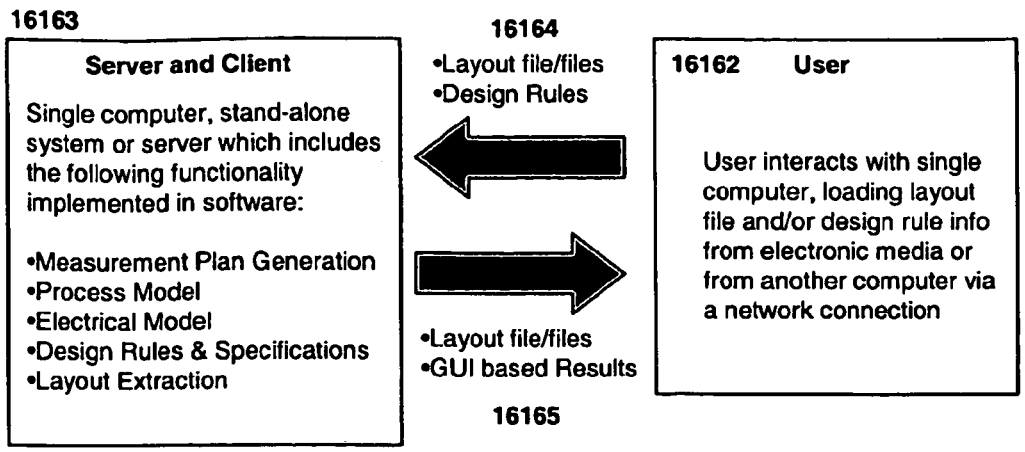

FIG. 117A describes stand-alone operation of the method

Figure 117B:
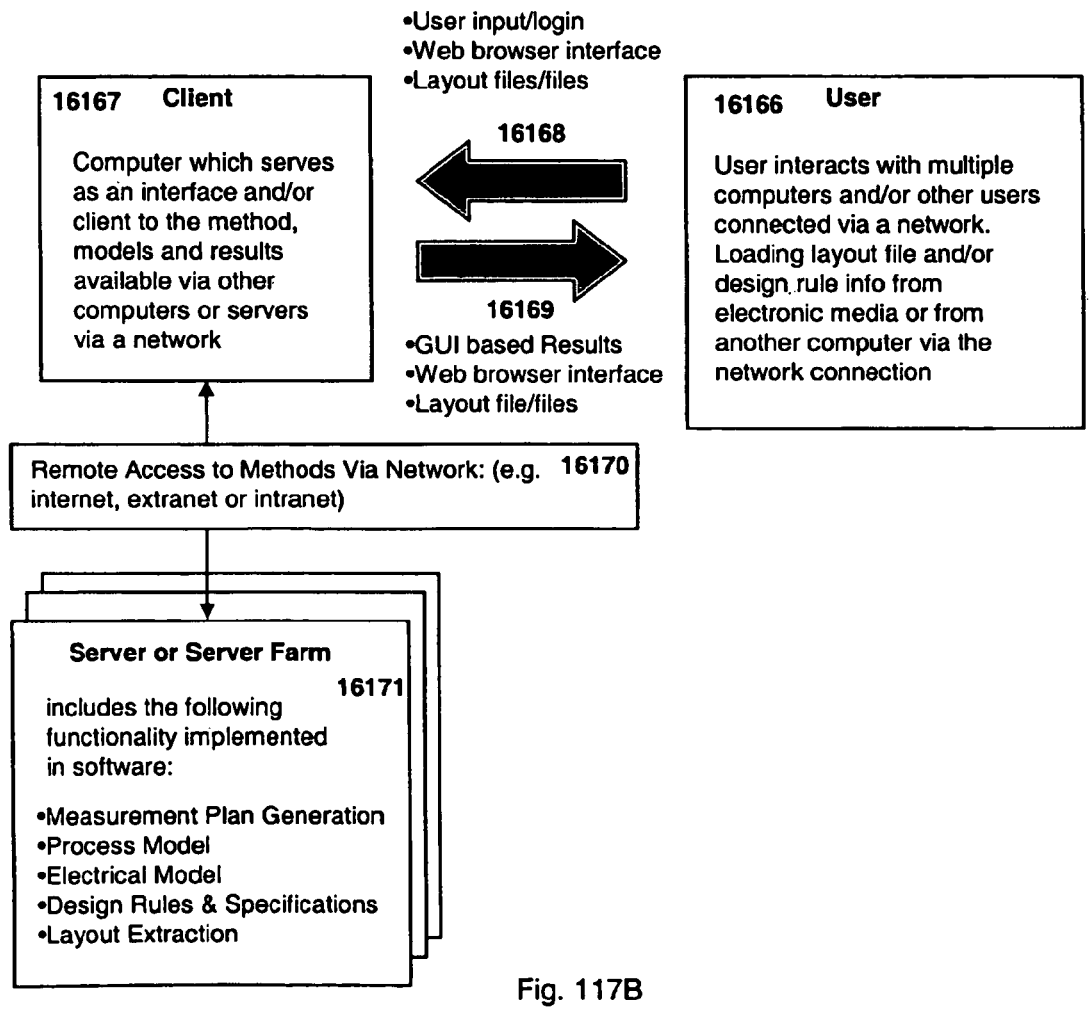

FIG. 117B describes client-server operation of the method

Figure 117C:
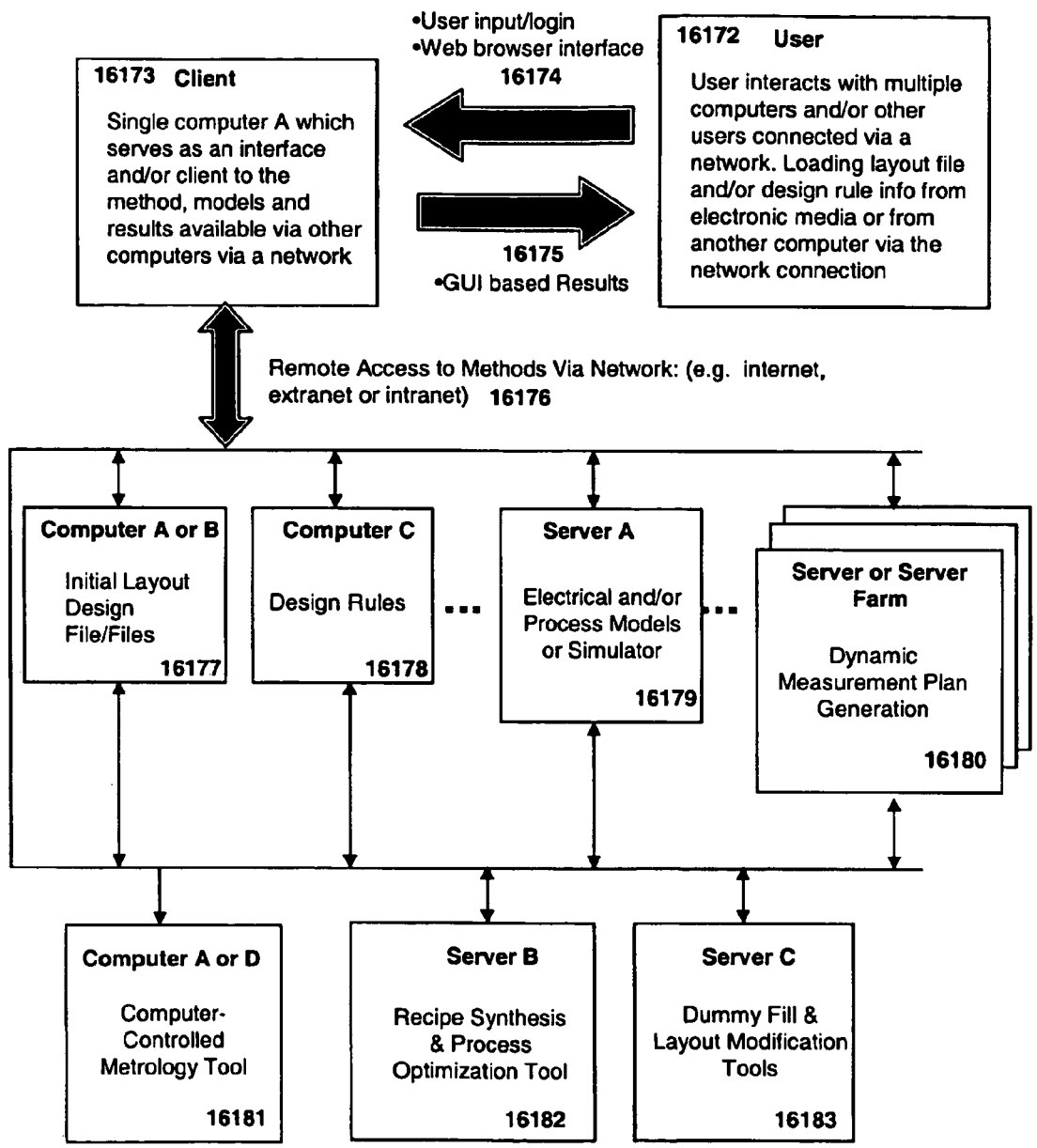

FIG. 117C describes network operation of the method

Figure 118:
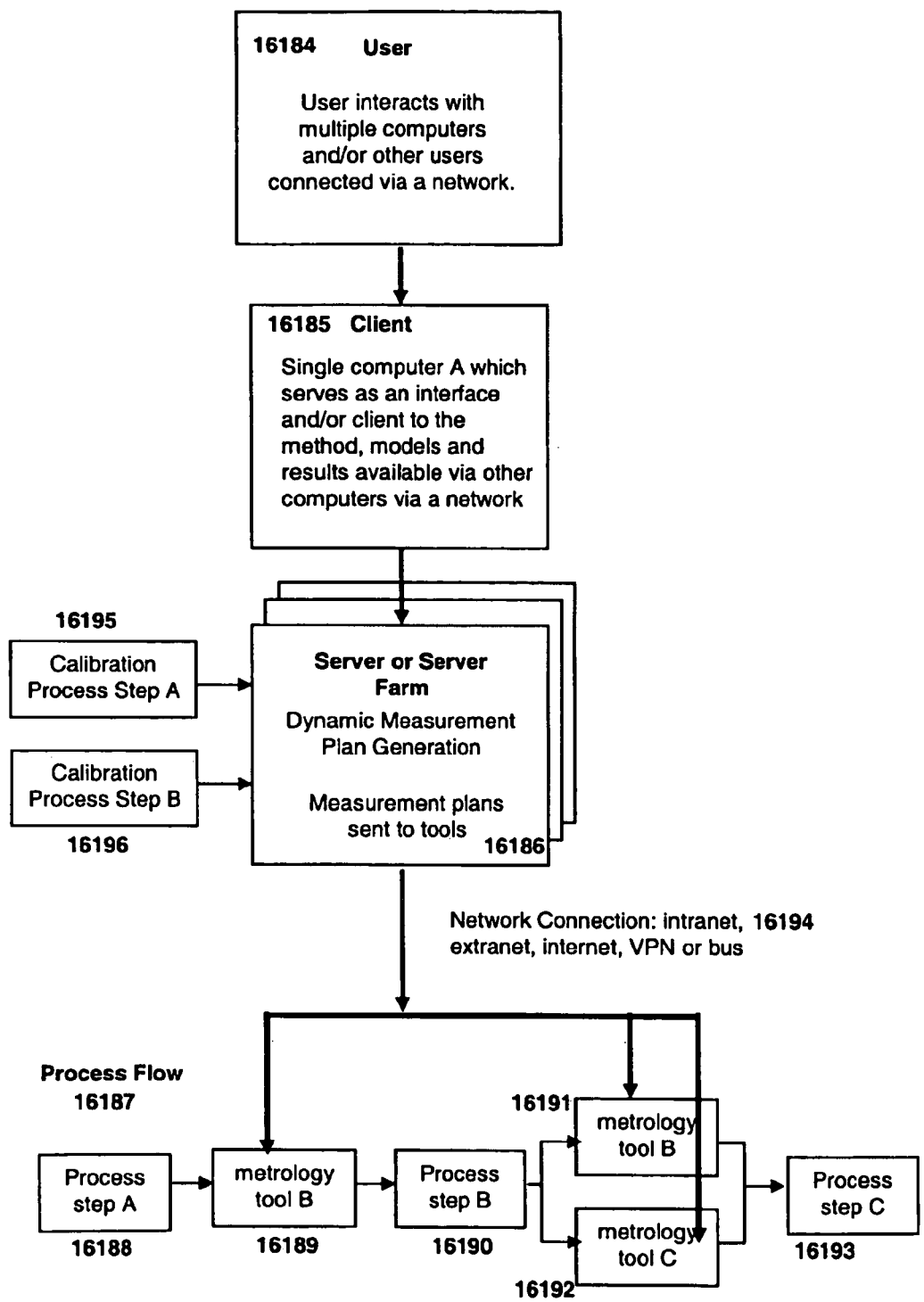

FIG. 118 describes operation of the method with multiple metrology tools in a process flow.

Figure 119:
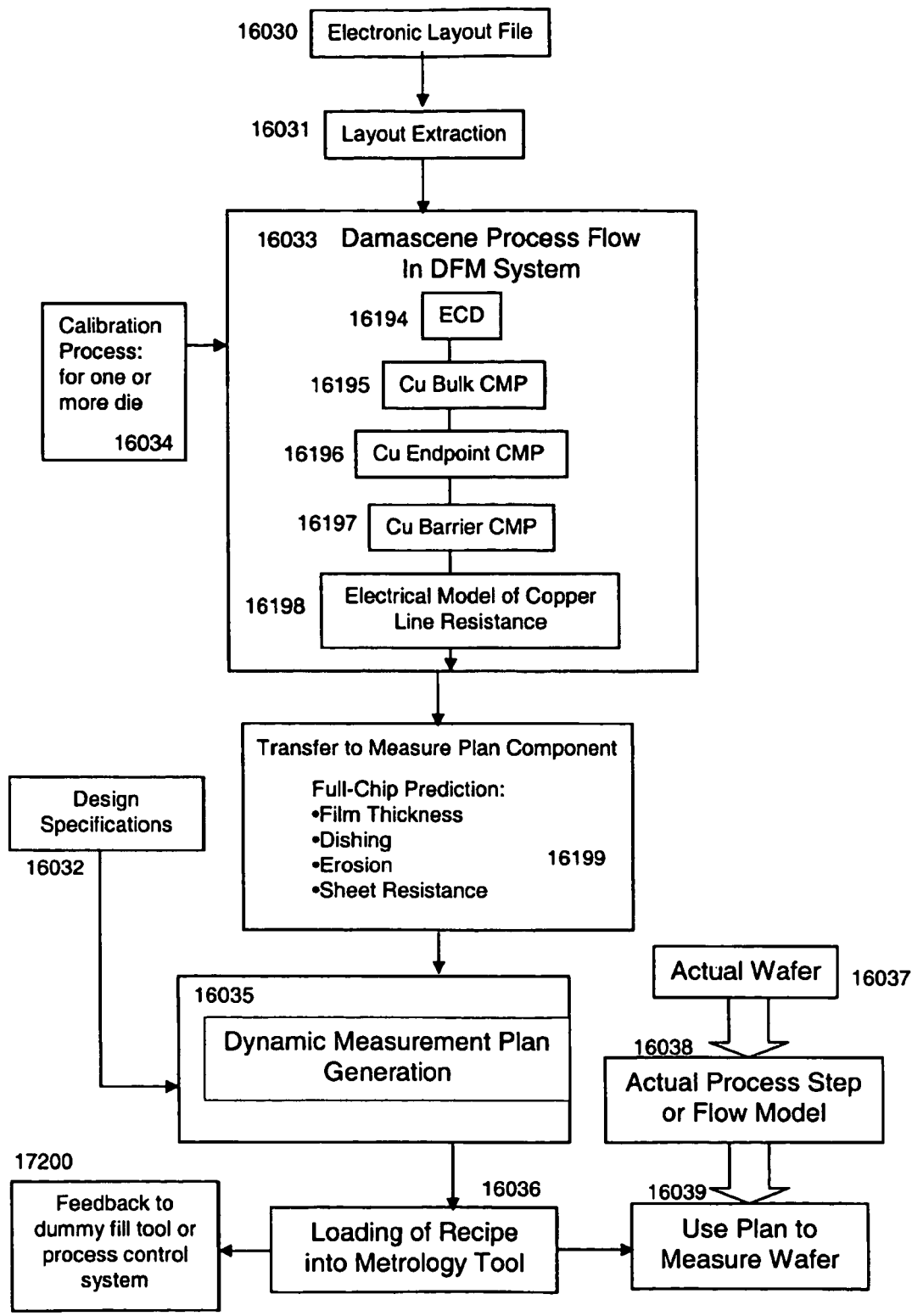

FIG. 119 describes the operation of the method with a damascene process flow

Figure 120:
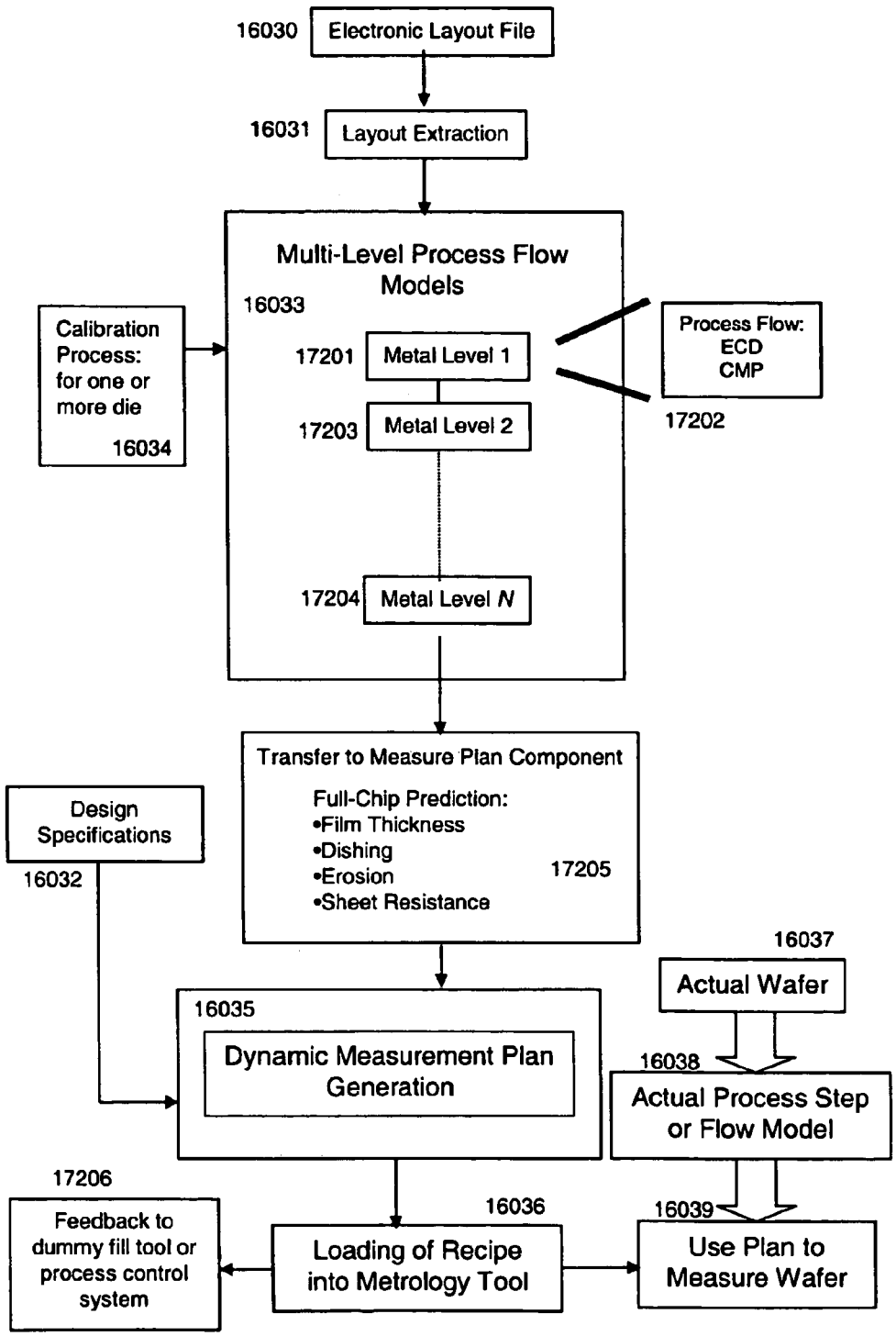

FIG. 120 describes the operation of the method for multi-level process flow

Figure 121:
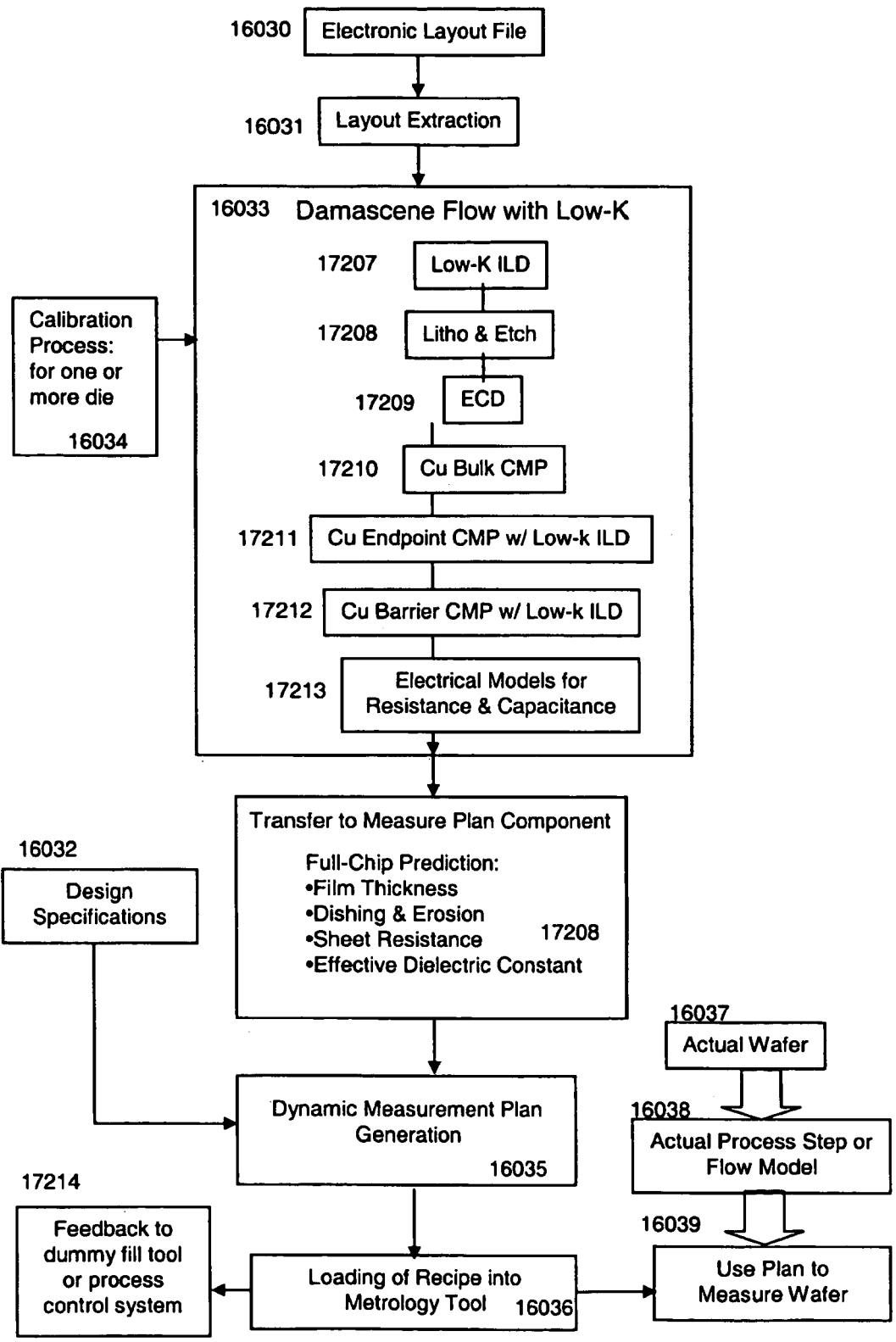
Figure 122A:
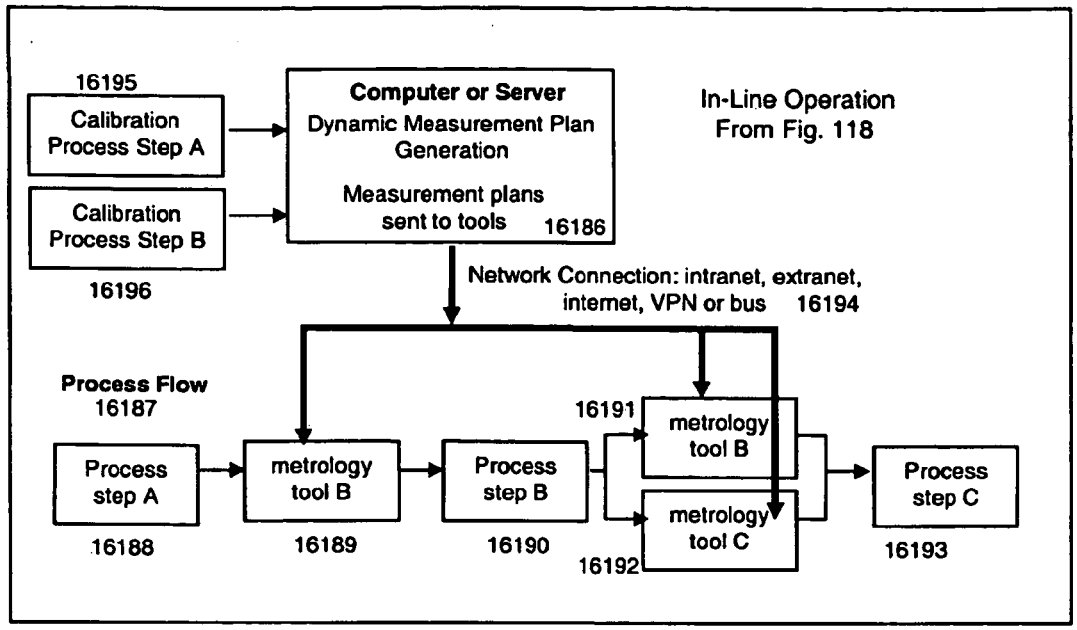
Figure 122B:
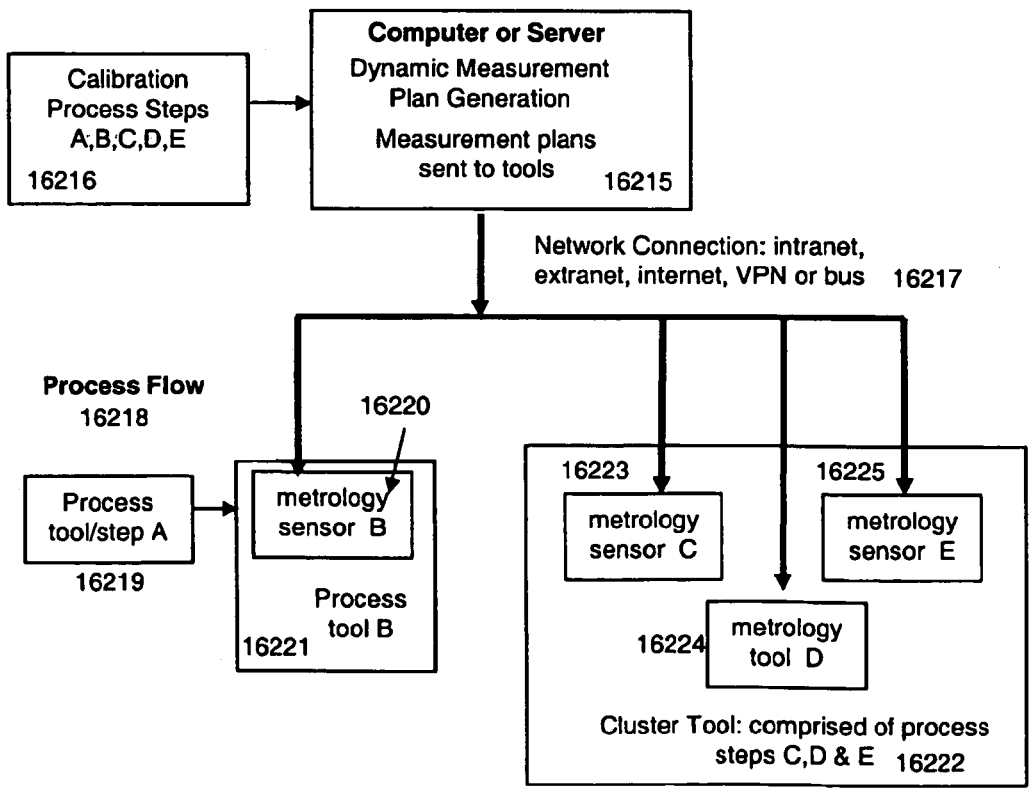
Figure 123A:
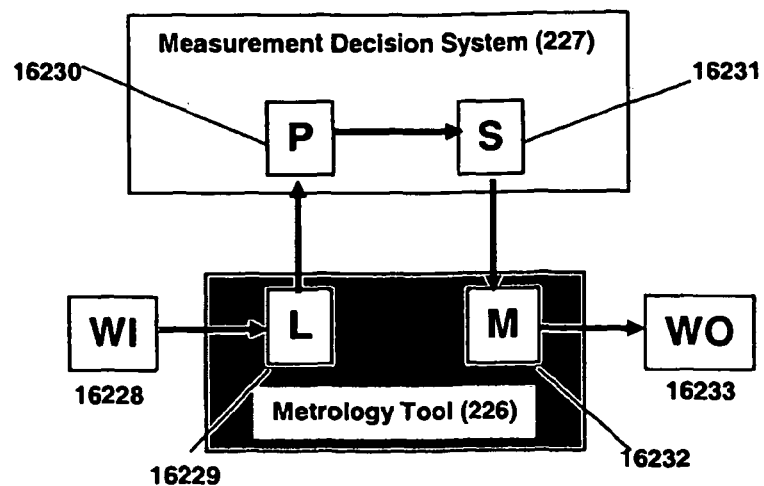
Figure 123B:
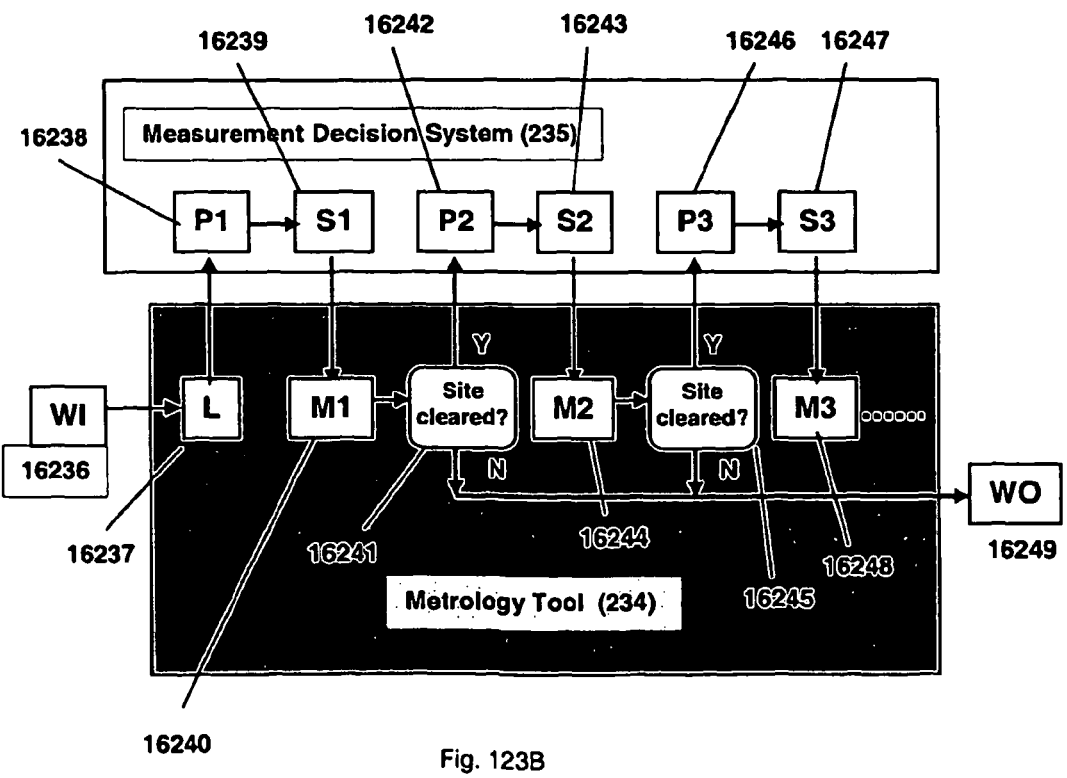
Figure 124A:
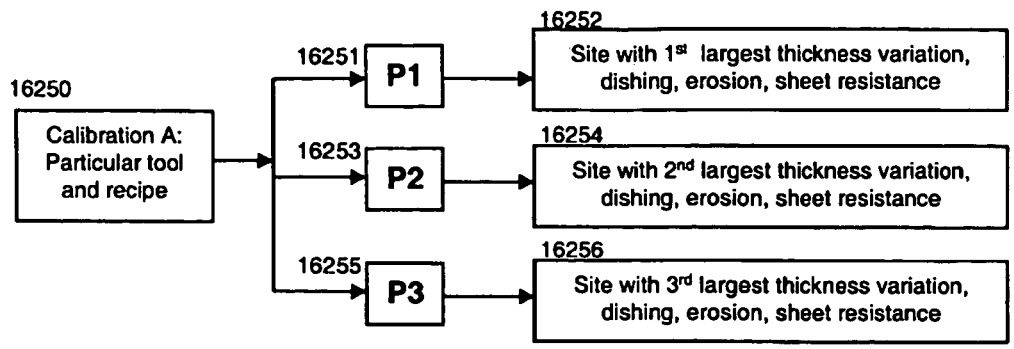
Figure 124B:
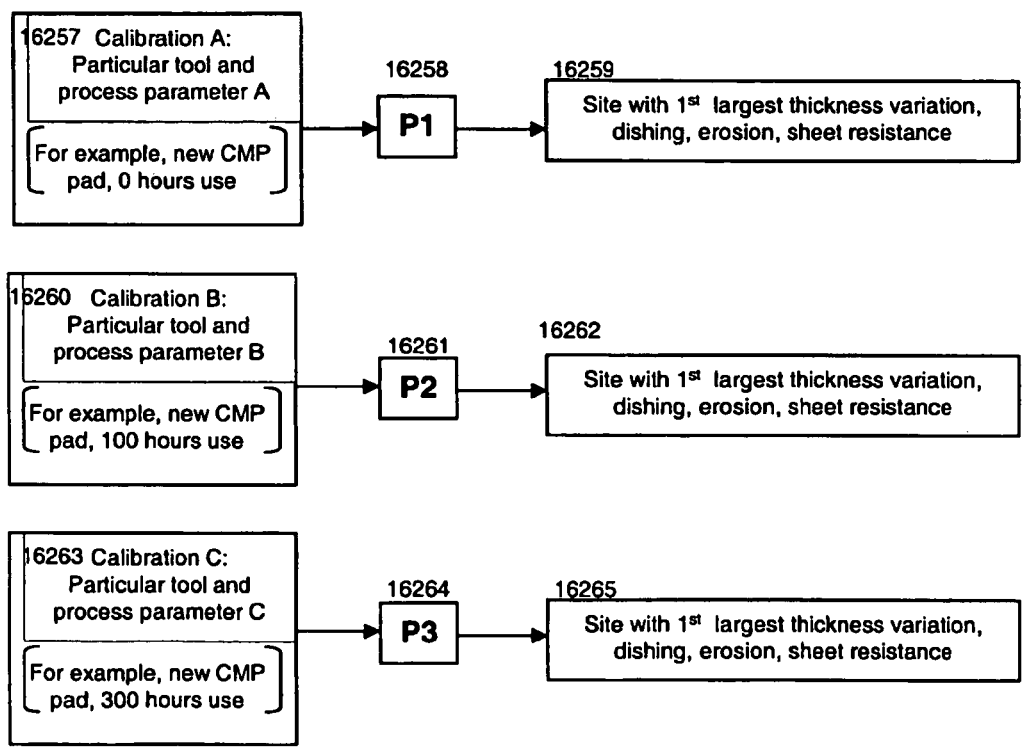
Figure 125:
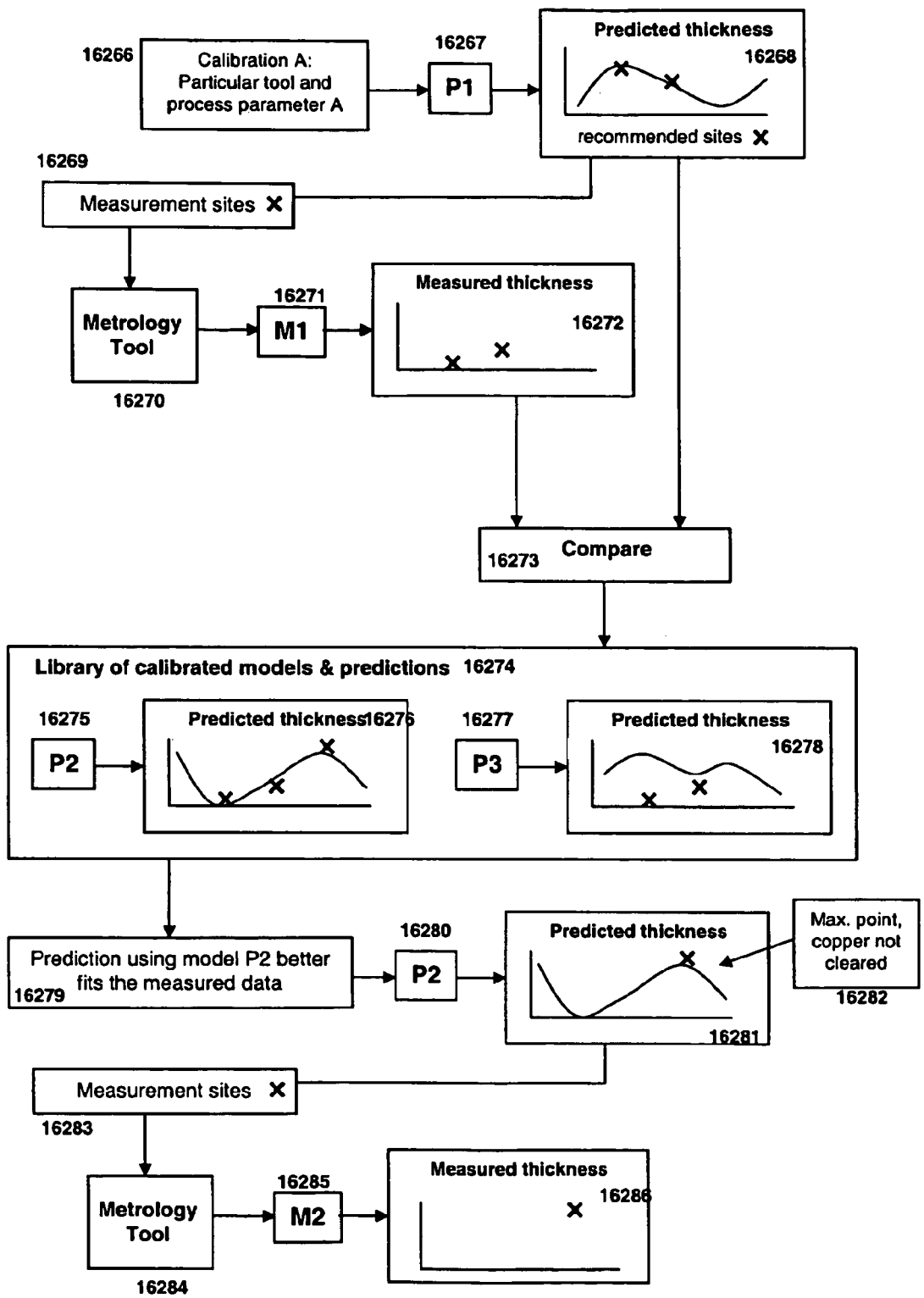
Figure 126A:
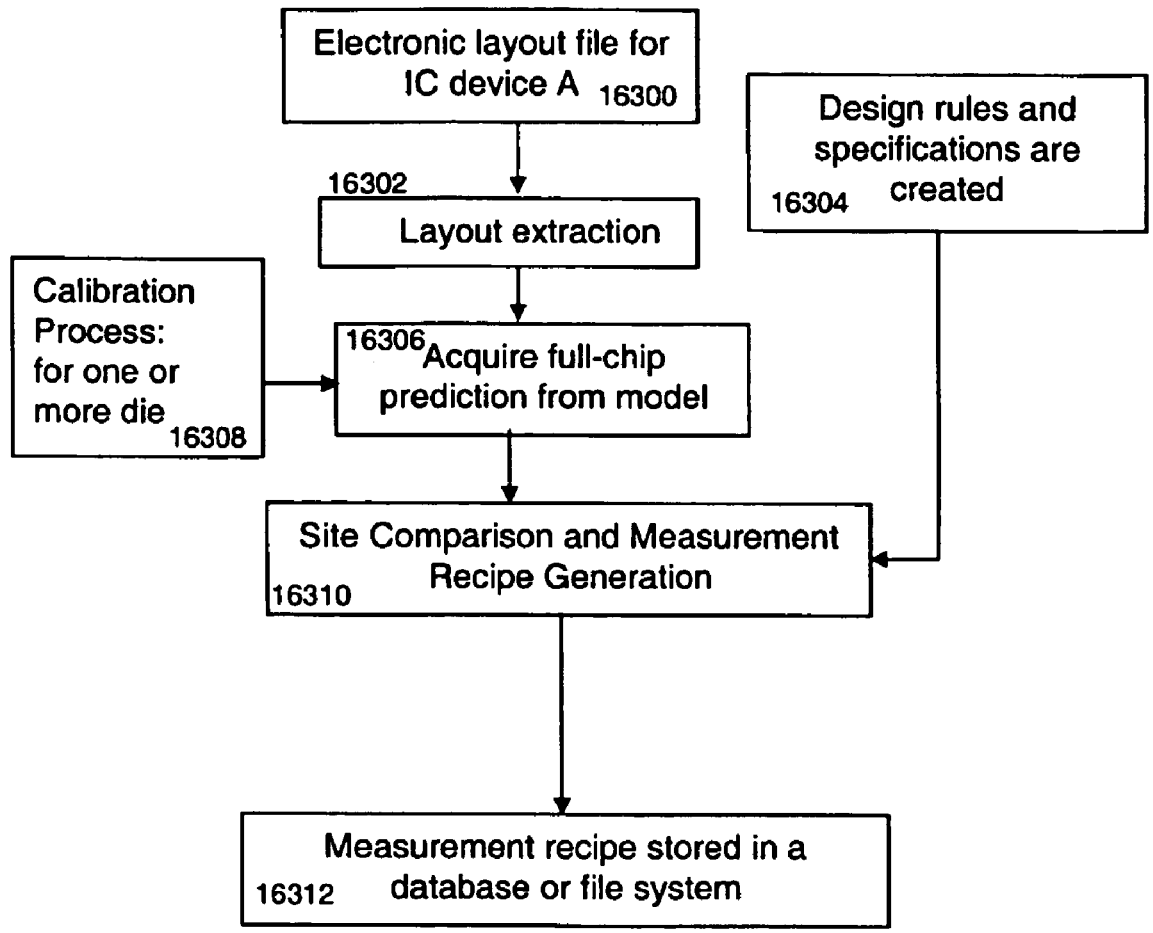
Figure 126B:
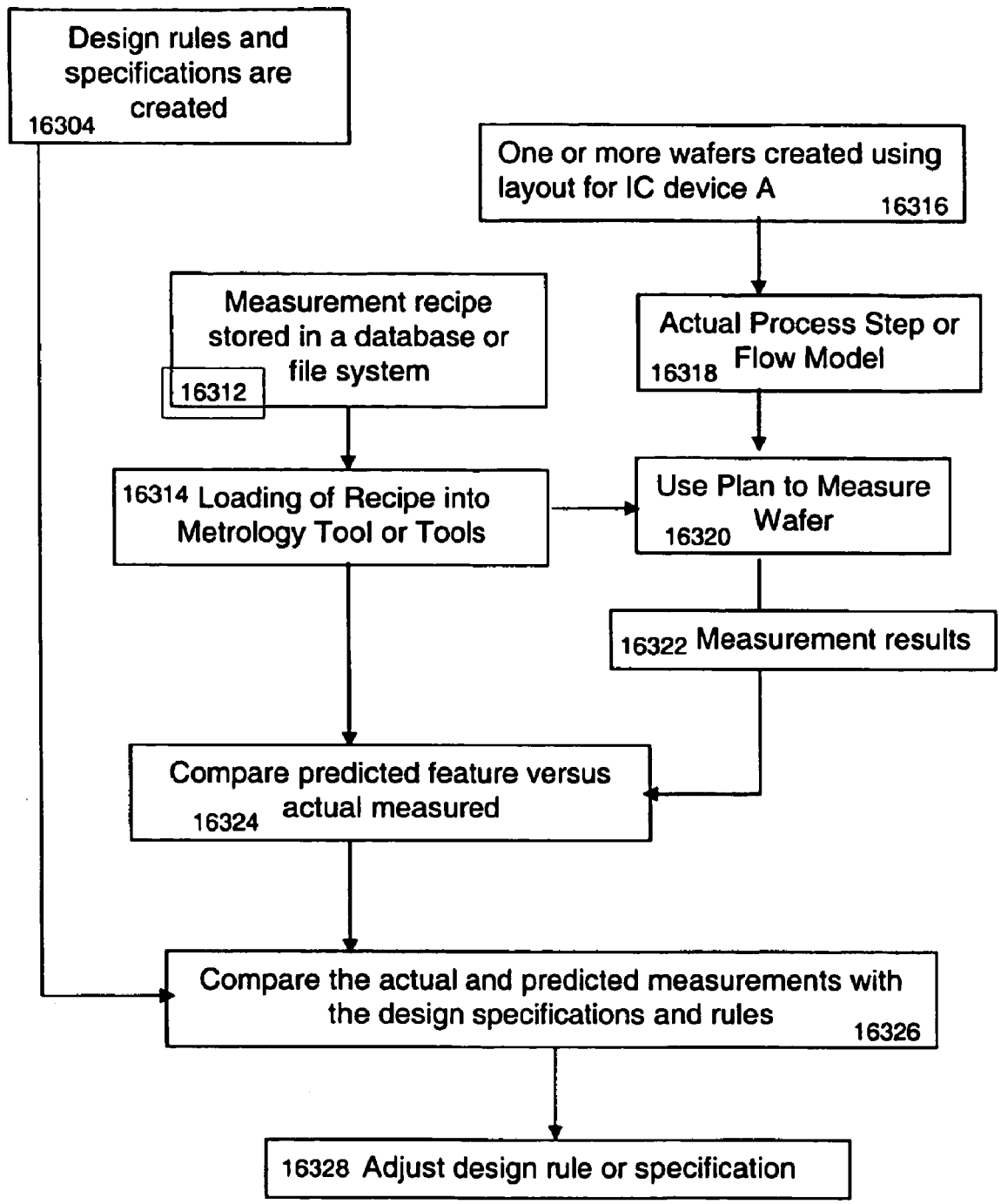
Figure 127:
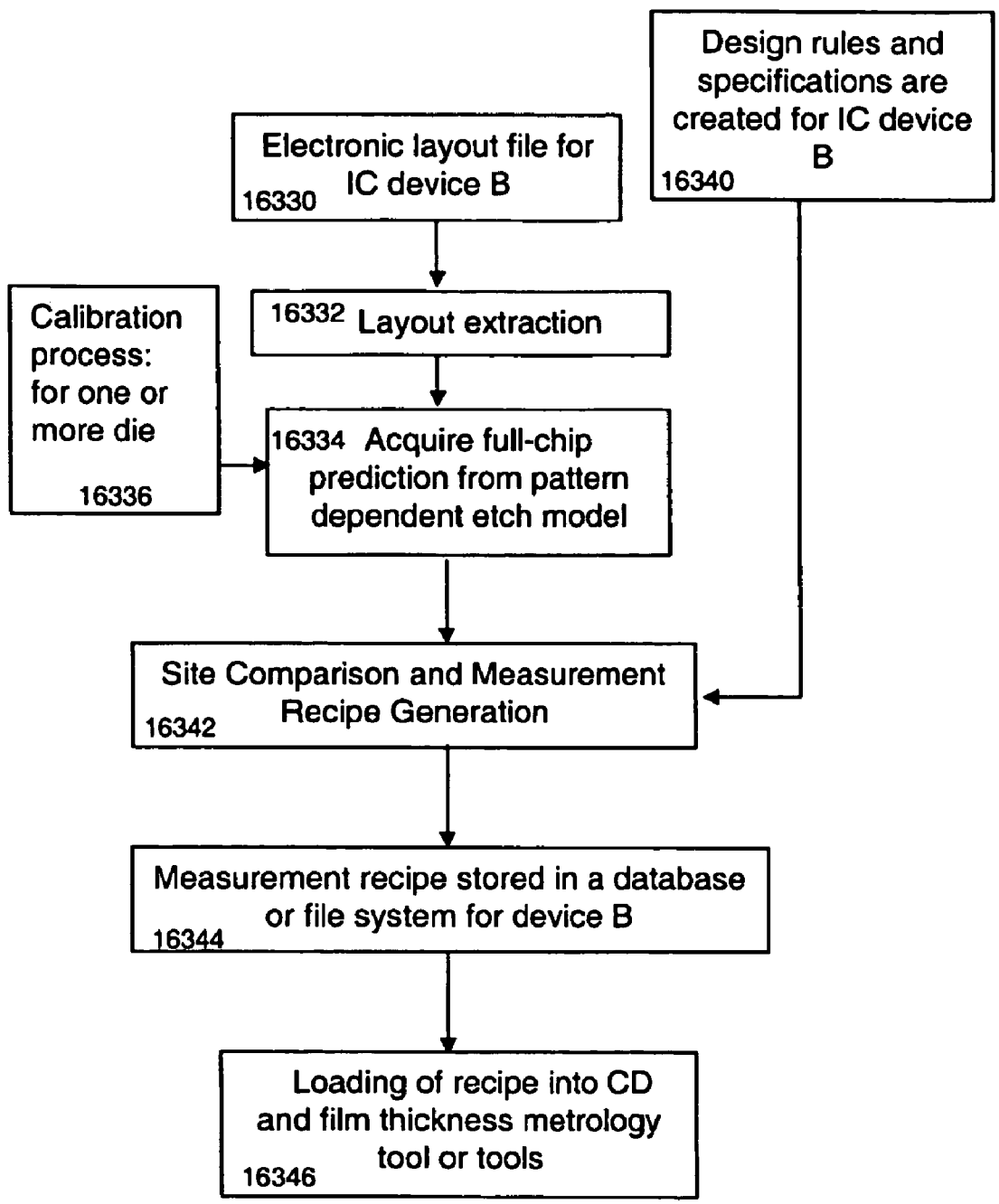
Figure 128A:
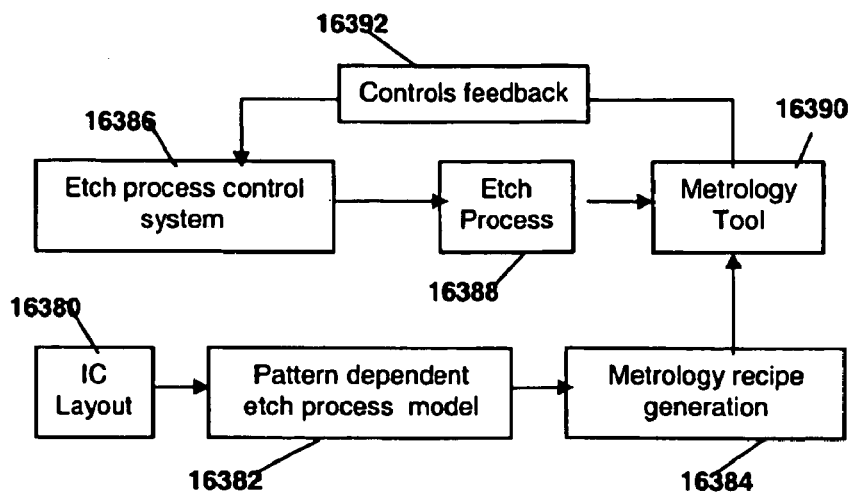
Figure 128B:
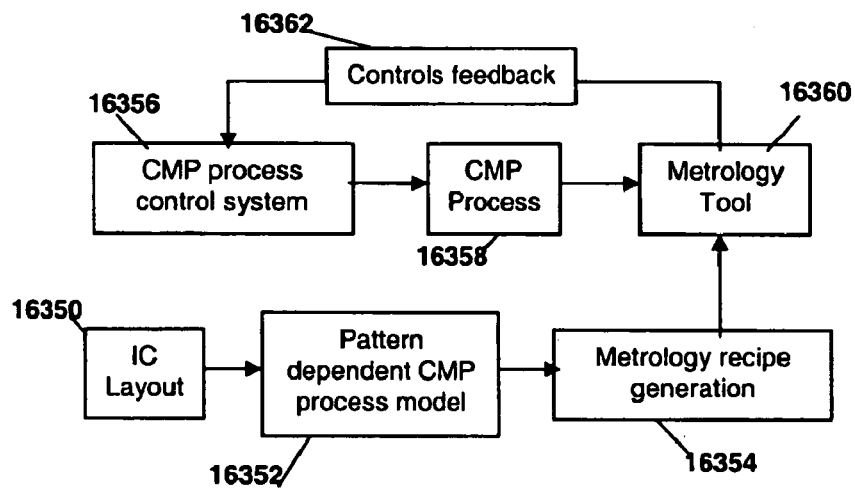
Figure 128C:
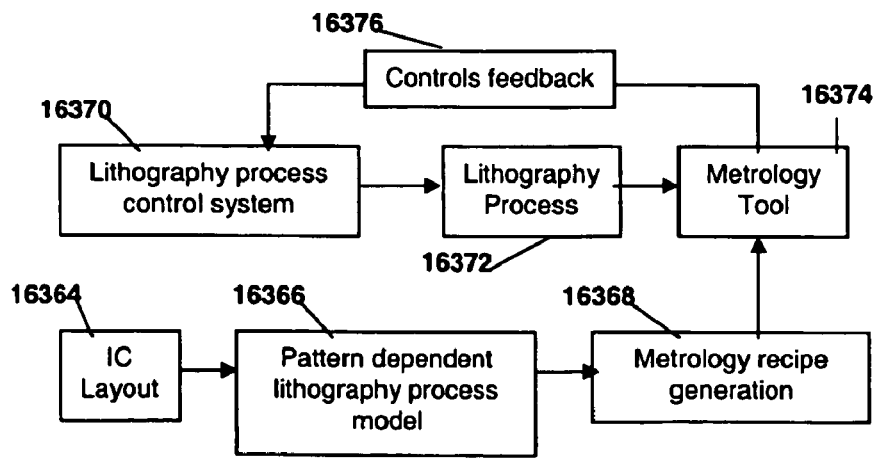
Figure 129:
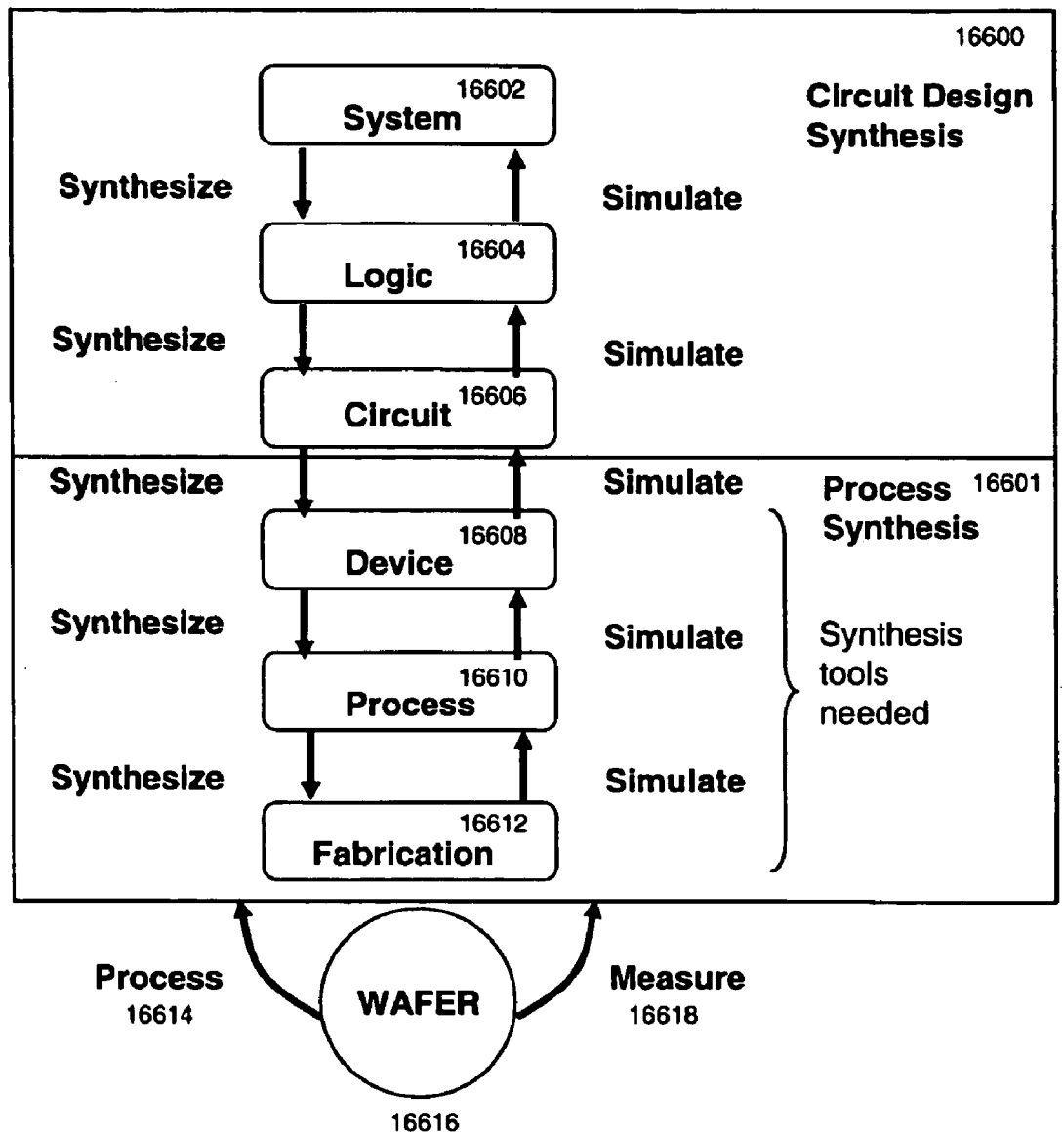
Figure 130:
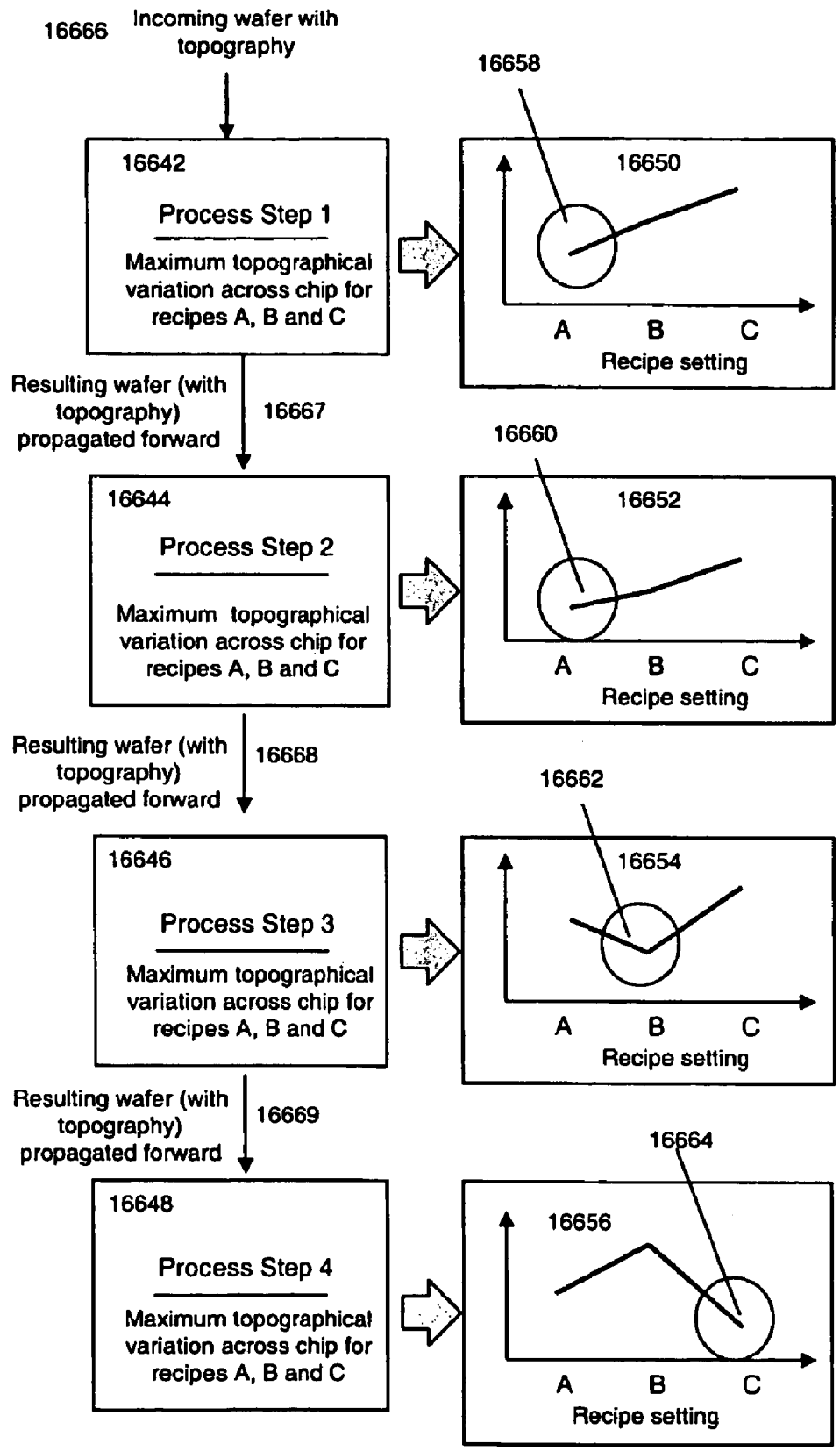
Figure 131:
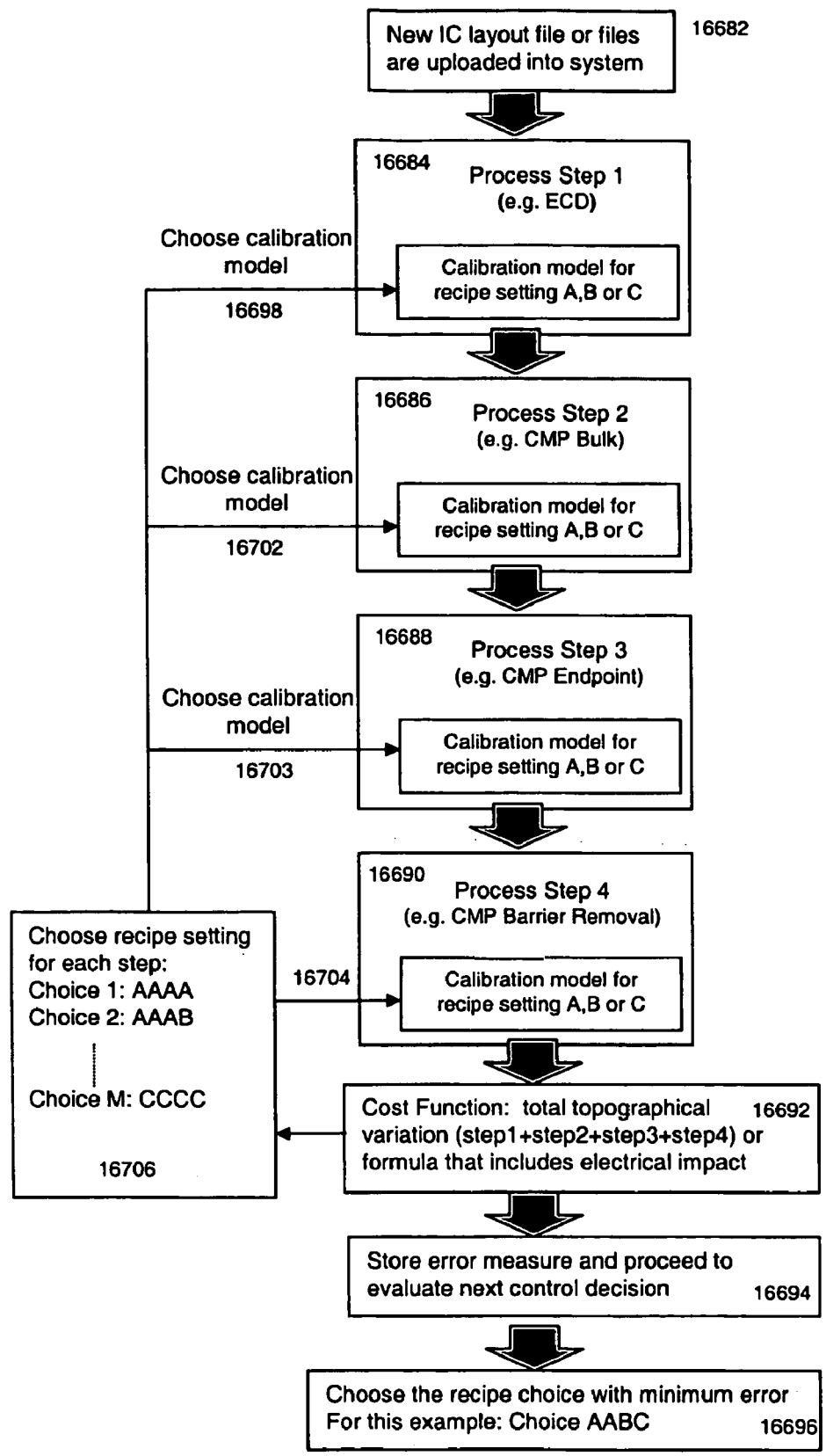
Figure 132:
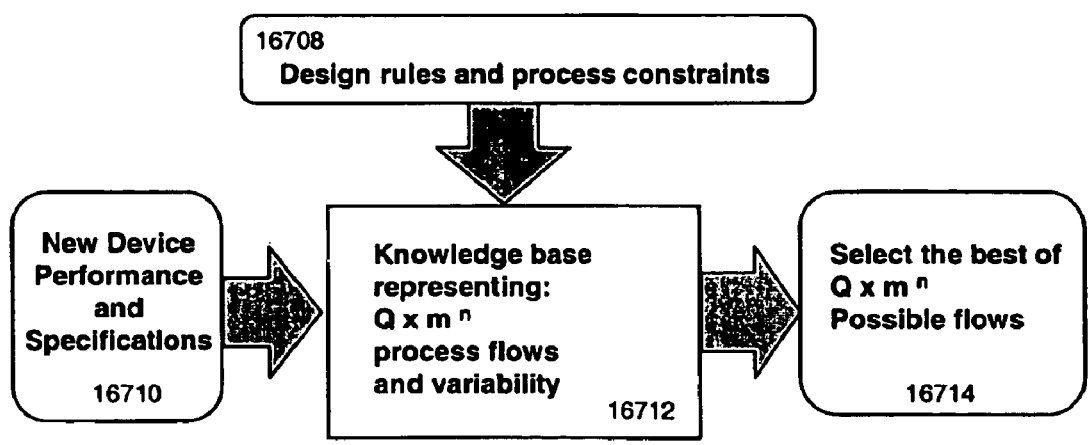
Figure 133:
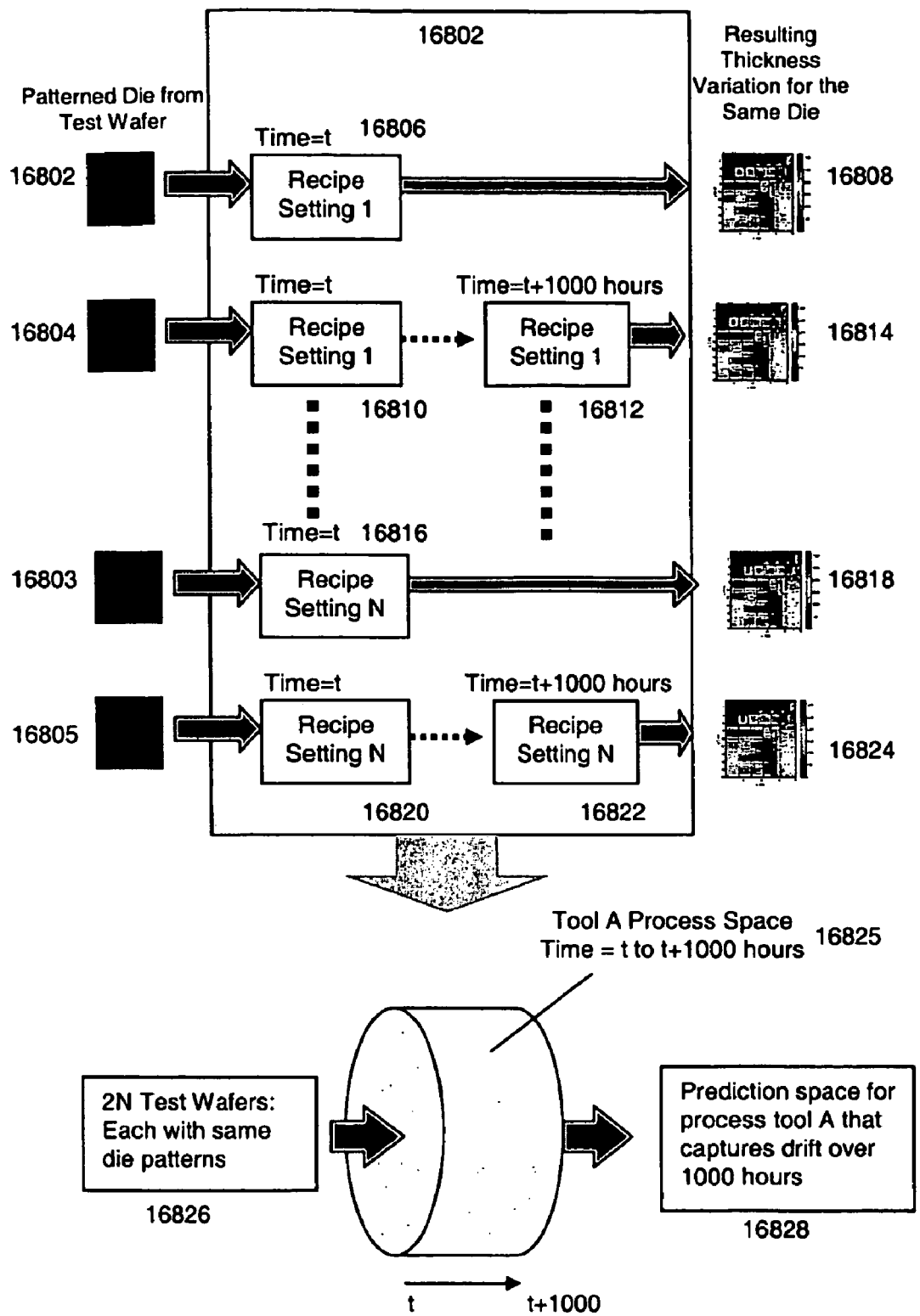
Figure 134:
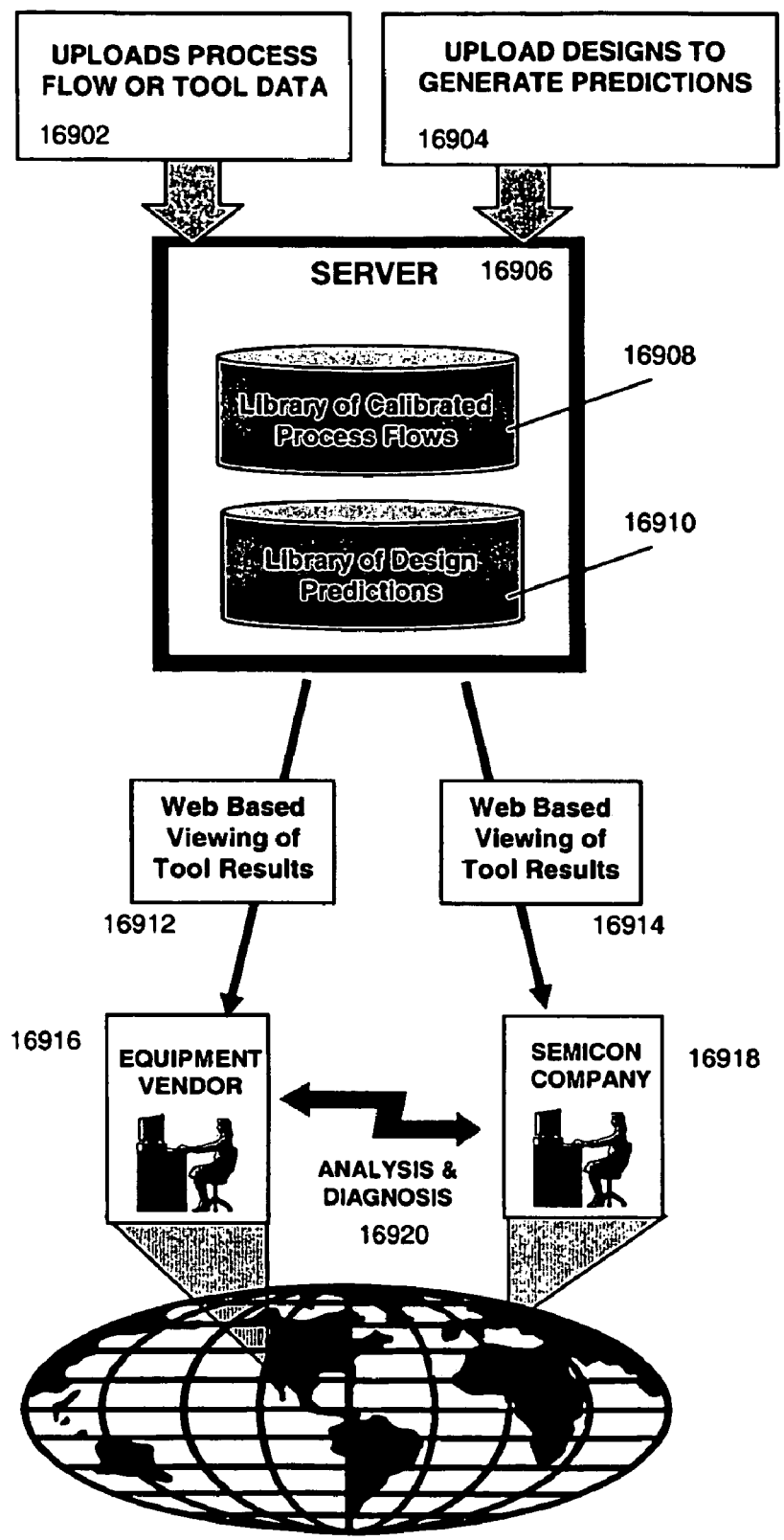

FIG. 121 describes the operation of the method with a damascene process flow that includes the introduction of low-k materials FIG. 122A describes the operation of the method with in-line metrology tools FIG. 122B describes the operation of the method with in-situ metrology tools FIG. 123A describes the operation of the method when the measurement recipe is loaded a priori to measurement of the wafer FIG. 123B describes the operation of the method when the measurement recipe or site locations are adjusted iteratively as measurement are taken FIG. 124A describes the operation of the iterative or dynamic measurement method using multiple process models that predict parameters according to some priority or heuristic FIG. 124B describes the operation of the iterative or dynamic measurement method using multiple process models that represent different stages of a process FIG. 125 describes the operation of the method when actual measurements are used to select a process model from a library to generate measurement recipes FIG. 126A describes the operation of the method to generate a measurement recipe for adapting design rules FIG. 126B describes the operation of the method to utilize a measurement recipe and subsequent measurement data for adapting design rules or specifications FIG. 127 describes the operation of the method with plasma etch processes to generate measurement recipes for CD and film thickness metrology tools FIG. 128A describes the operation of the method to provide feedback for adapting plasma etch recipes or control settings FIG. 128B describes the operation of the method to provide feedback for adapting CMP recipes or control settings FIG. 128C describes the operation of the method to provide feedback for adapting lithography recipes or control settings FIG. 129 describes process synthesis FIG. 130 provides an example of process synthesis FIG. 131 illustrates an application of the method to synthesis FIG. 132 illustrates the computational requirements associated with synthesis FIG. 133 illustrates an application of the method to incorporate process drift and shifts into model based prediction FIG. 134 illustrates an application of the method to facilitate interaction between equipment and consumable providers and semiconductor design and fabrication users.

Figure 135:
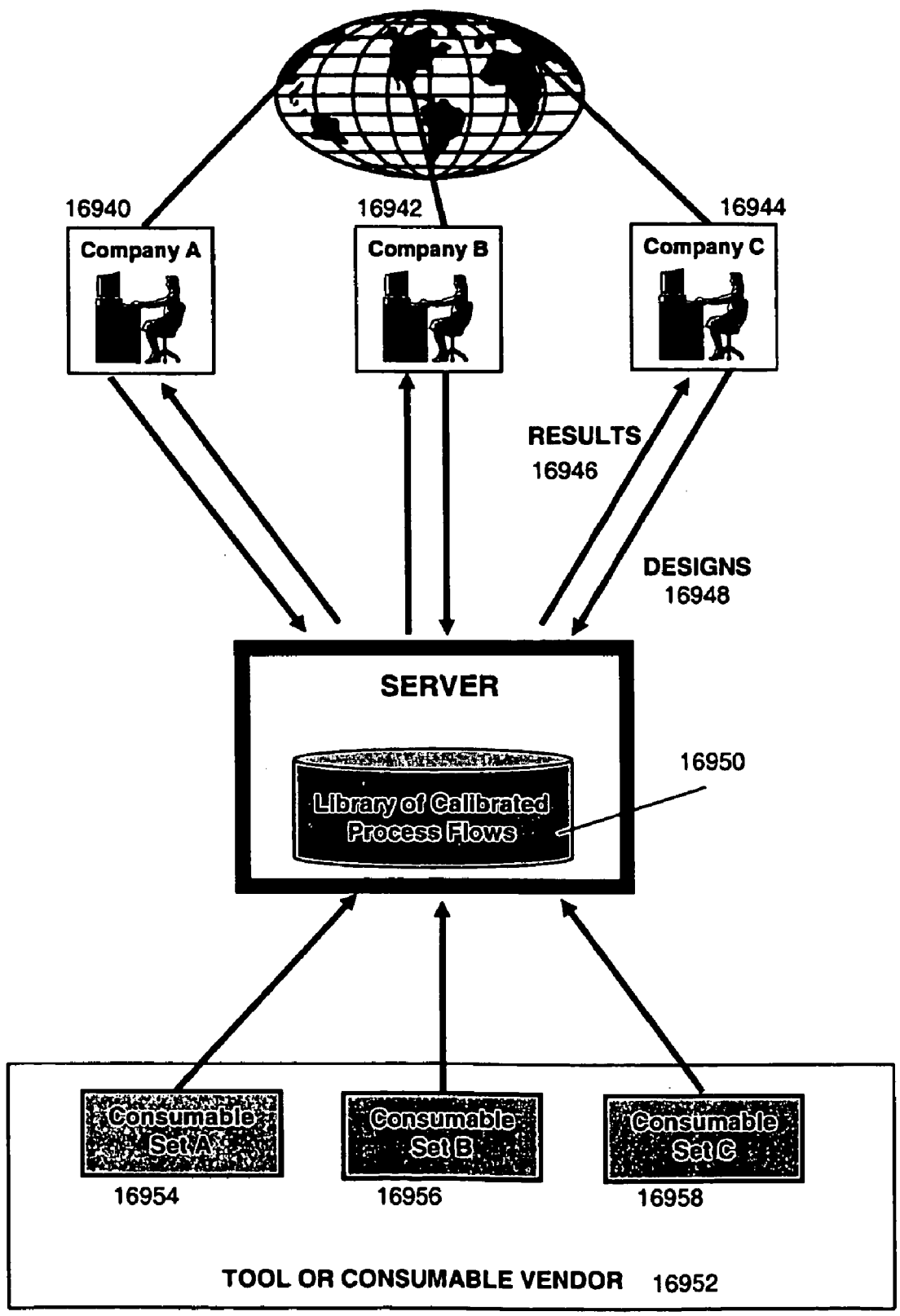
Figure 136A:
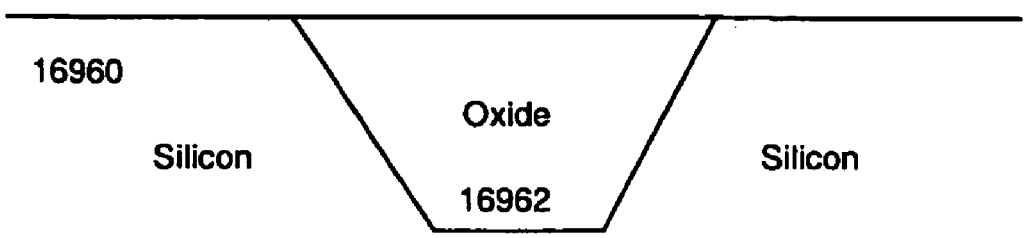
Figure 136B:
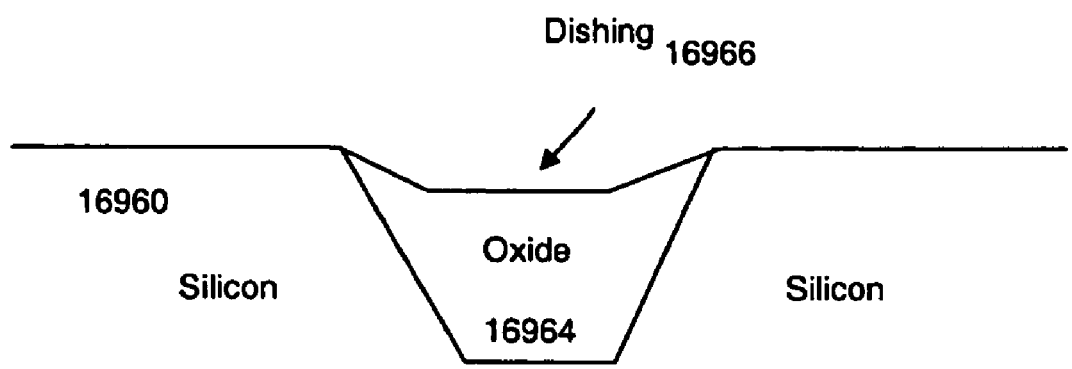
Figure 137:
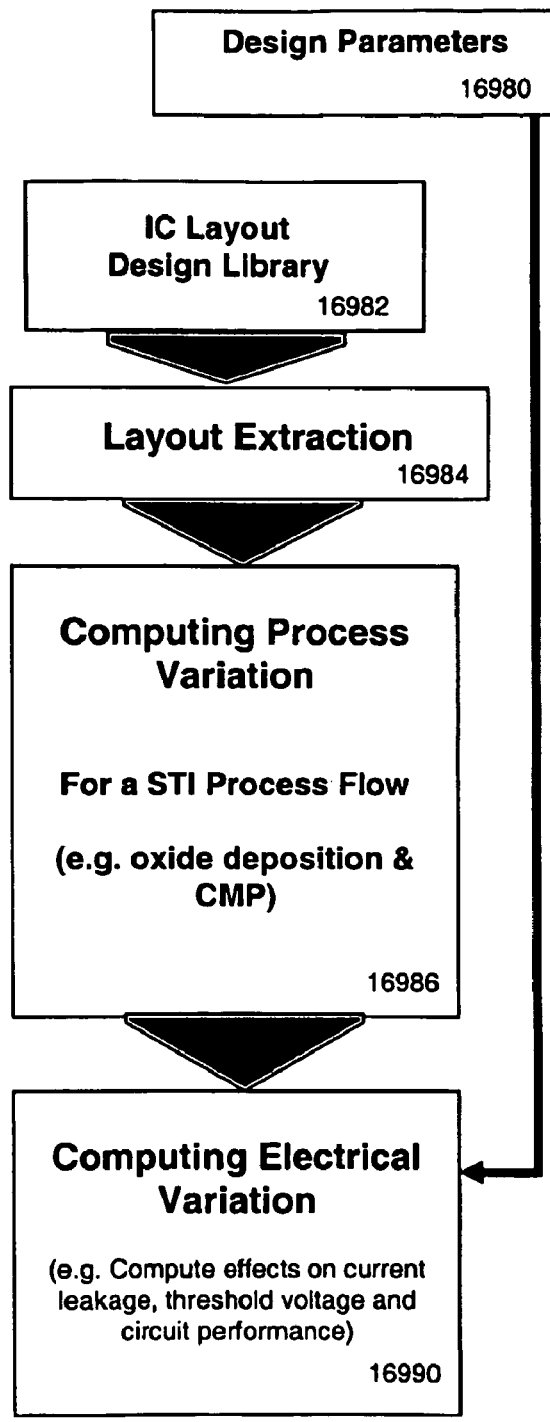

FIG. 135 illustrates an application of the method to compare equipment or consumable products FIG. 136A illustrates a desirable shallow trench isolation result FIG. 136B illustrates dishing of isolation trenches resulting from polishing FIG. 137 describes an application of the method to STI process flows

DETAILED DESCRIPTION

Figure 1A:
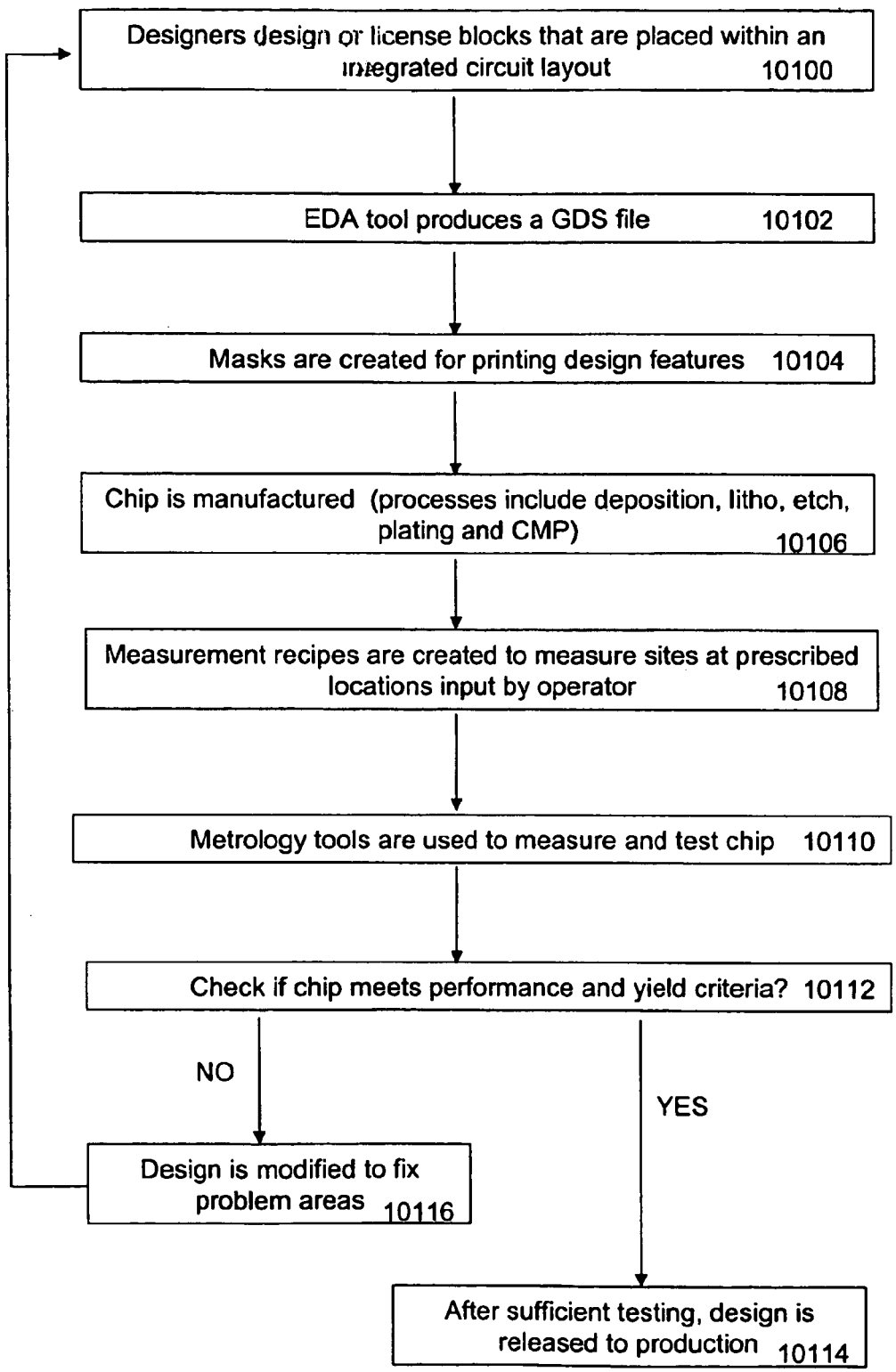
FIG. 1A illustrates a general design and development flow used to develop an integrated circuit device.

As shown in FIG. 1A, an integrated circuit is designed using electronic design automation or (EDA) tools that allow the designer to design individual sections of the device or place pre-existing design blocks, 10100. A computer based tool is used to place the components and route the wiring that connect signal and power lines between the components, often spanning multiple levels of interconnect and vias. When the physical representation of the chip is designed, an EDA tool is used to produce an electronic file in a format that describes the device, layer by layer, 10102. This file is used to tape-out and create a photolithographic mask used to print the circuit features during the manufacturing process, 10104.

A process flow, which may include deposition, lithography, etch, electroplating and chemical mechanical polishing (CMP) steps, is created where the tool settings for each step and the consumables (e.g. gasses, polishing pads, slurries) are selected. This flow is used to manufacture a chip that resembles (to some tolerance) the physical and electrical characteristics designed and simulated in software, 10106. Measurement recipes are created to measure site locations across the manufactured device, 10108. A metrology tool uses the recipe, which species how and at what location it should measure the device, 10110. If the chips or devices meet the specified performance and yield criteria, then after sufficient testing the design and flow are used for production of the chip, 10114. If the chips or devices do not meet the specified performance and yield criteria, then the design is modified to correct the problematic areas, 10116. Causes of problems that impact performance and yield include variation in the width or thickness of manufactured circuit geometries such as interconnect lines and vias, dummy fill and slotting size and placement and trenches formed by shallow trench isolation processes.

Figure 1B:
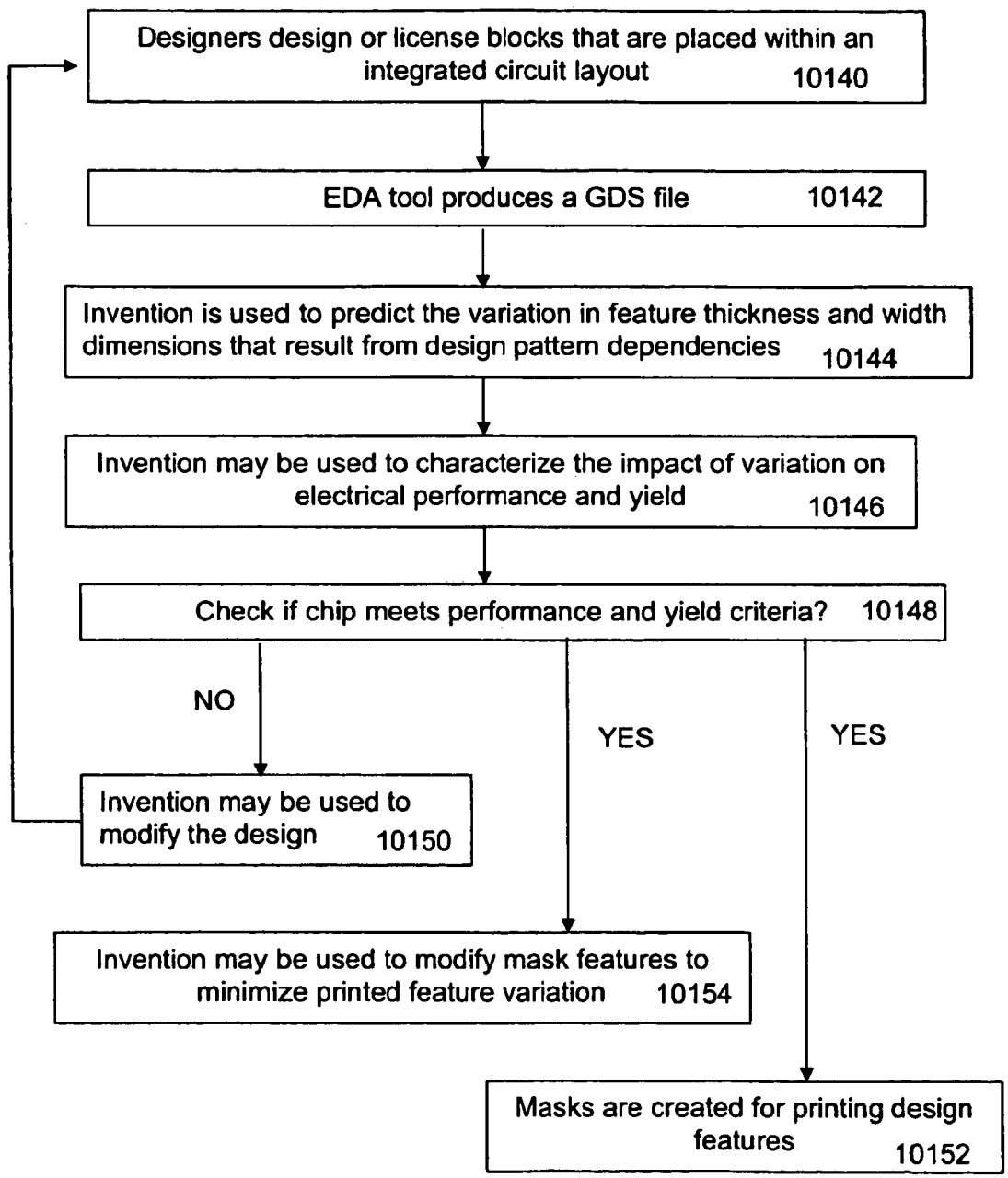
FIG. 1B illustrates a method in which the invention may be used to improve a design flow.

A design flow that uses pattern dependencies to improve the design process is illustrated in FIG. 1B. In fabricating integrated circuits, interconnect film thickness uniformity, dishing and erosion are dependent on variation in layout patterns (e.g. material density, linewidth and linespace). Surface non-uniformity often leads to subsequent manufacturability and process integration issues. These pattern dependencies may also affect device performance by introducing variation in capacitance and resistance depending on the location of a given structure on the device.

In this use, the designers design circuit geometries using a computer based tool, 10140, which may be generated as an electronic file in GDSII format 10142, or may interact directly with the system, 10144. The system may be used to predict the variation in feature thickness and width that result from the interaction of design pattern geometries and steps in the fabrication process, 10144. The method may use models that map design pattern geometries to the feature thicknesses and widths for the full-chip or for selected portions of the chip that result from each process step or multiple steps in a process flow. The method may be used to characterize the impact of variation on electrical performance for example timing, clock and power characteristics, as well as other parameteric and functional yield issues, 10146. The method may also be used to predict the impact of such variation on yield as well.

A check is done to see if the predicted chip characteristics meet performance and yield criteria, 10148. If the criteria are met, the design may undergo further analysis and testing or be released to a mask shop to create photolithographic masks. If the criteria are not met (it is below some acceptance threshold), the method may be used to modify the design, 10150, for example the method may size and place dummy fill or slotting structures to improve uniformity. If the criteria are not met (it is below some acceptance threshold), the method may also be used to adapt geometries on the mask, such that the printed circuit features meet acceptance criteria, 10154.

Figure 1C:
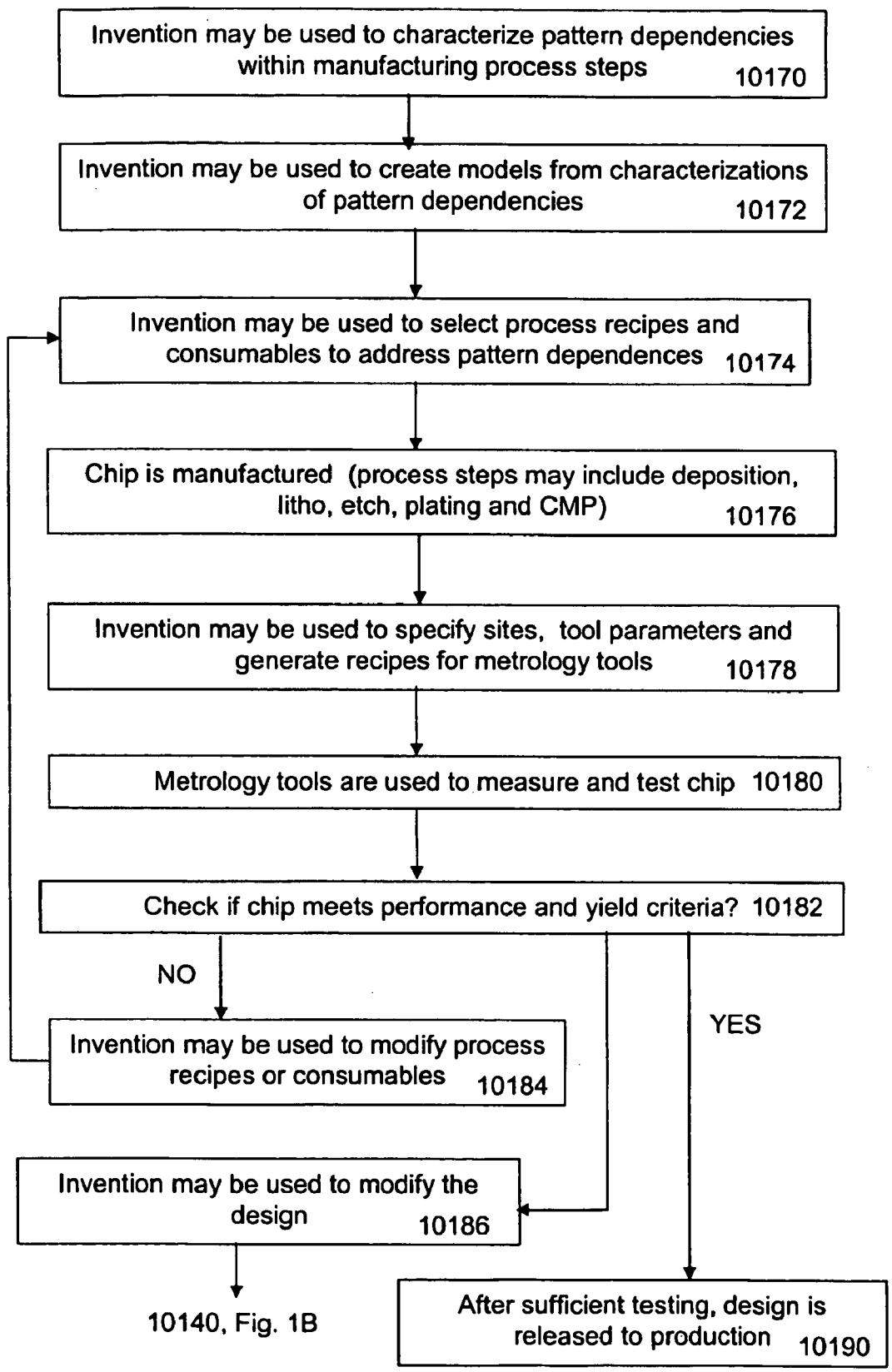
FIG. 1C illustrates a method in which the invention may be used to improve a manufacturing flow.
Figure 2A:
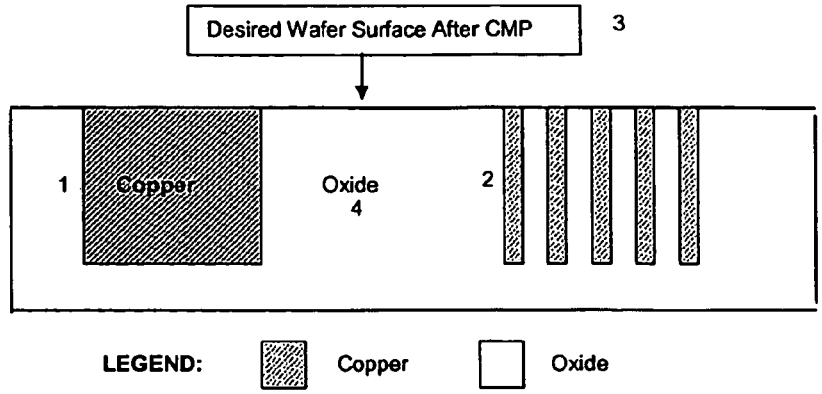
FIG. 2A illustrates the ideal wafer surface profile resulting from CMP used in a copper damascene process.
Figure 2B:
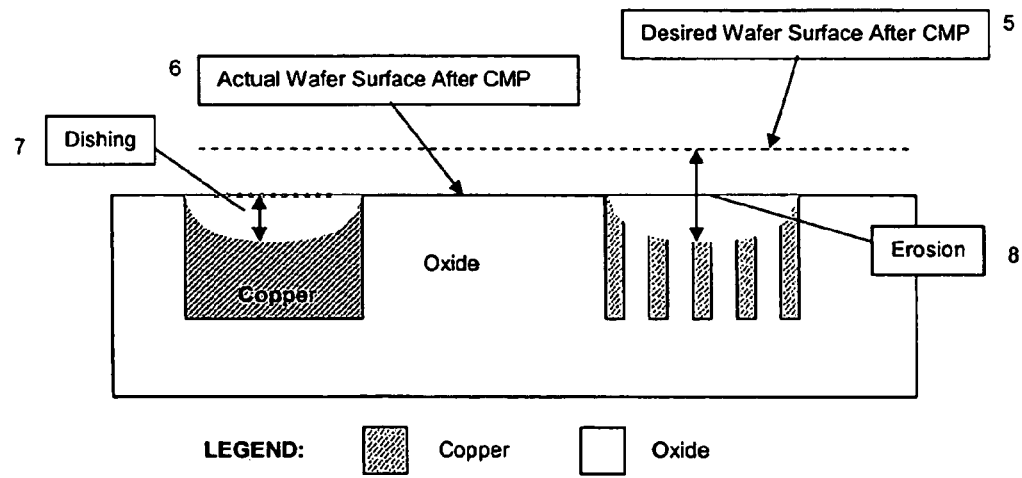
FIG. 2B illustrates a more realistic case where dishing occurs in metal lines and erosion occurs in surrounding oxide regions.
Figure 2C:
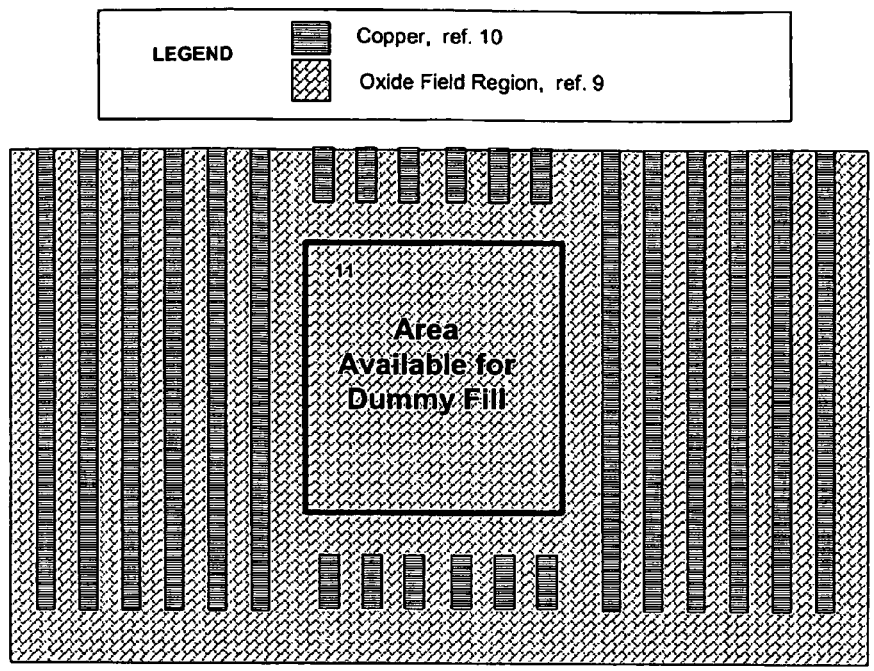
FIG. 2C illustrates an oxide field region containing copper lines and a large open oxide field area in the middle.
Figure 2D:
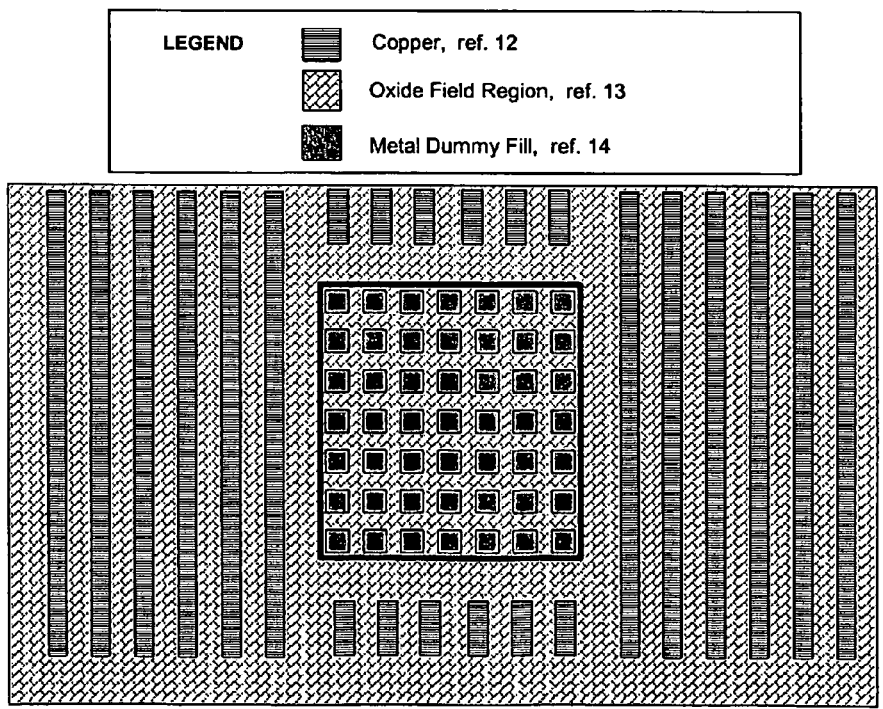
FIG. 2D illustrates the addition of metal dummy fill to raise the effective density of metal and promote better film thickness uniformity after CMP.
Figure 3A:
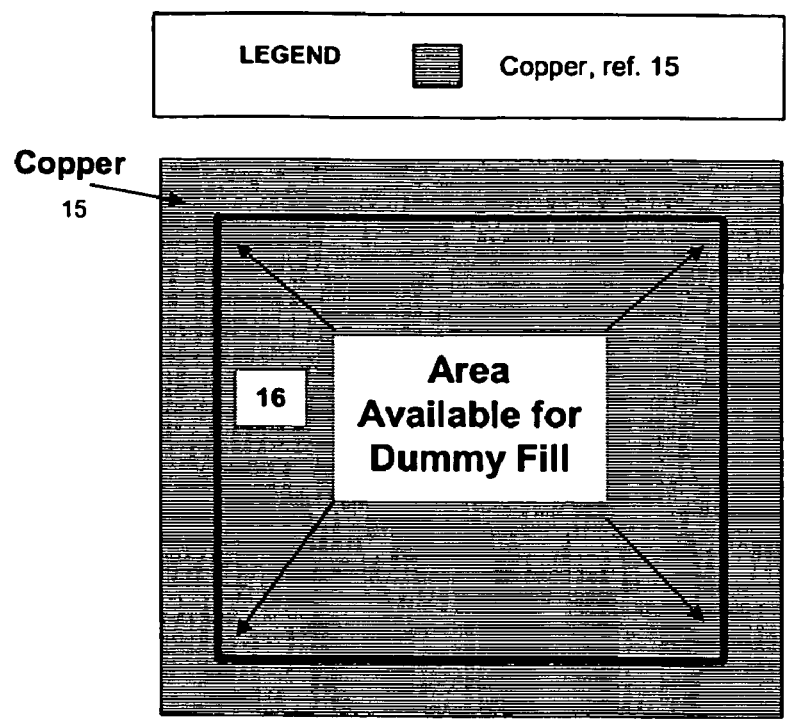
FIG. 3A illustrates a large metal field region.
Figure 3B:
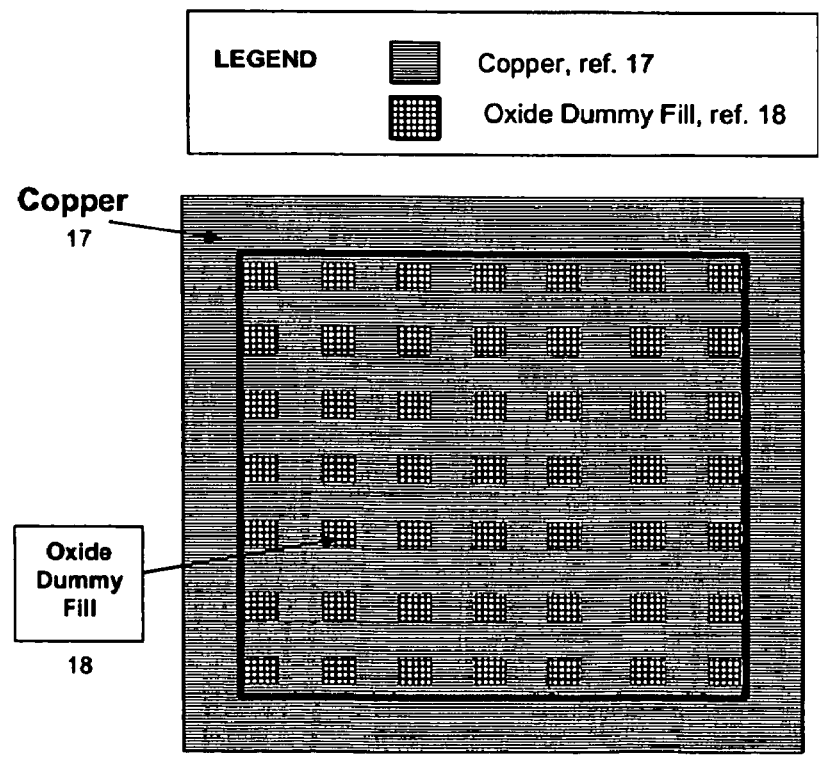
FIG. 3B illustrates the addition of oxide dummy fill to the metal region.

An illustration of how the method may be used with the process flow to manufacture the designed circuit is shown in FIG. 1C. The method may be used to characterize pattern dependencies between designed and manufactured circuit geometries for a process step in a flow. The method may also be used to create models that map design pattern geometries to the feature thicknesses and widths for the full-chip or for selected portions of the chip that result from each process step or multiple steps in a process flow, 10172. Similarly, the method may also develop models using test or characterization wafers specially designed to characterize the effects of manufacturing on a range of circuit geometries (for example varied pattern densities, line widths, line thicknesses, line spaces, line and trench sidewall angle and aspect ratio).

The method may also be used to select process recipes and tool settings as well as select consumables (for example slurries and polishing pads) for each step, 10174. A process flow, which may include deposition, lithography, etch, electroplating and chemical mechanical polishing (CMP) steps, is created where the tool settings for each step and the consumables (e.g. gasses, polishing pads, slurries) are selected. This flow is used to manufacture a chip that resembles (to some tolerance) the physical and electrical characteristics designed and simulated in software, 10176. The method may be used to generate measurement recipes that select site locations to be measured across the manufactured device and across the wafer as well as generating measurement tool parameters (e.g. profilometry parameters), 10178. A metrology tool uses the recipe to physically measure the chip or a numbers of chips or die across the wafer, 10180.

If the chips or devices meet the specified performance and yield criteria, manufacture of the chip continues, 10190. If the chips or devices do not meet the specified performance and yield criteria, then the method may be used to modify process recipes or consumables to correct the problematic areas, 10184. If the chips or devices do not meet the specified performance and yield criteria, then the method may be used to modify (e.g. using dummy fill or slotting) the design to correct the problematic areas, 10186. When design modifications occur this flow may loop back to modification of the layout, 10140 on FIG. 1B. When process modifications occur this flow may loop back to the selection of process recipes and consumable sets, 10174.

As FIGS. 1A, 1B and 1C illustrate, the method may be used to characterize pattern dependent variation and prescribe methods to correct and measure variation in thickness and width of circuit geometries and features, as well as full 3D characterization of interconnect features for a single or multiple interconnect levels. The method may be used with a single process step, such as chemical mechanical polishing (CMP), or a full process flow of multiple steps such as copper damascene process. The individual physics of each process type and particular tool types and settings may have different pattern dependencies and thus have varying impact on width and thickness variation at the die, wafer and lot level.

We describe a method of adding dummy fill to reduce process variations caused by dependencies in the electrochemical deposition and subsequent chemical mechanical polishing of interconnect features used in semiconductor devices. The variation in wafer quality (e.g. film thickness variation and surface topography variation such as dishing and erosion) and electrical parameters (resistance, capacitance, and noise) are modeled and simulated using semiphysical process models that may be calibrated to a particular process and tool for each step in a sequence of one or more steps within a process flow. Dummy fill structures are placed in the layout to improve thickness and surface topography uniformity of the manufactured wafer while maintaining the electrical parameters at the intended or designed values. The added structures are placed in such a way as to: modify the design layout parameters such as effective pattern density, maximum and minimum widths and spaces between structures; improve the structural properties of the underlying dielectric insulator (e.g. low-k); and minimize or limit the impact on electrical performance.

To provide a more computationally efficient method of data storage, this technique may also use a library of cells for placement of the dummy fill structures. Since the fill patterns may be repeated throughout the chip, the use of cells reduces the need to store redundant information about the dummy structures each time a region needs to be filled. Different size cells can be chosen from the library to fill a given area. A method that uses hierarchy of cells may also be used.

A dummy fill system is described that minimizes the impact of process variation and subsequent electrical impact by embedding both a manufacturing process model or simulation and an electrical performance model or simulation inside the dummy fill method. The preferred method forms a feedback system that determines the proper sizing and placement of dummy fill to minimize the impact of process variation on electrical performance.

Figure 7:
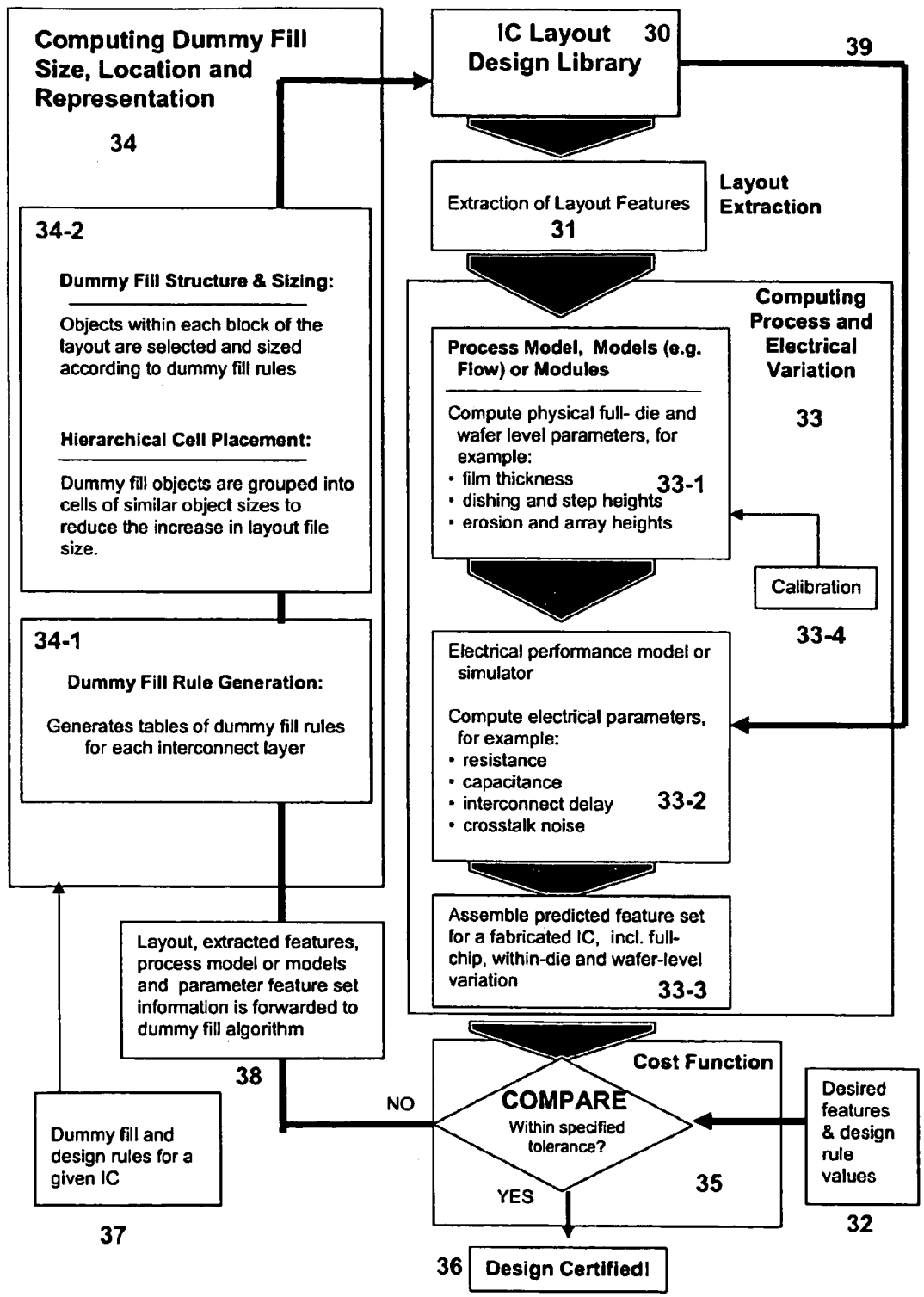
FIG. 7 illustrates the computational flow of the complete dummy fill method

The following paragraphs describe an embodiment of the method, which is depicted in FIG. 7. Sub-blocks (31, 33, 34 & 35) within FIG. 7 will be described in greater detail in sections b. through f. An IC design is commonly represented electronically (e.g. in a GDS format) in a library of files that define structures and their locations at each level of an integrated circuit, 30. These files are typically very large in size, although the features that are relevant to process variation can be described more efficiently. Layout extraction, 31, involves summarizing discrete grids of IC designs in a compact set of such parameters such as linewidth, linespace and density for each grid. The layout features are mapped, 33, to wafer quality, such as film thickness, or electrical parameters, such as sheet resistance or capacitance. This information may be used with a process model (e.g. CMP) or set of process models (e.g. ECD and a multi-step CMP process or a more complex process flow) to predict or simulate the manufacturing results and corresponding variation, 33-1. This variation can be measured physically, such as optical measurement of the film thickness, or surface profiling of wafer surface to measure topography (e.g. dishing or step height and erosion or array height). The variation can also be measured electrically, such as sheet resistance or capacitance, 33-2 and may require the use of the original IC design, 39. The computed parameters from 33-1 and 33-2 are assembled for the full-chip, both within die and for multiple dies across the wafer, 33-3.

Using a combination of both process models and electrical simulations, the performance of a given IC design can be predicted and compared against the desired wafer quality and electrical parameters as well as design rule criteria, 32. In a mathematical sense, one could consider this comparison to be a cost function, 35, based on reduction of process variation while maintaining electrical performance, which drives the overall dummy fill strategy.

If the design does not meet the specified tolerances, then dummy fill (either copper or oxide) may be added to adjust the layout parameters (e.g. density) and reduce the variation. The layout, extracted features, post-process parameters, 38, and design rules, 37, are fed into the sizing and placement algorithm, 34, which determines the size of the dummy fill objects, the pattern of the objects and the location or placement of the structures within the design. There are two primary components of dummy fill sizing and placement: rule generation, 34-1, and the sizing and hierarchical placement, 34-2. Rule generation converts the design rules and constraints to dummy fill guidelines. Each dummy fill object can be placed within the chip design as an independent object but that approach increases the layout file size dramatically. A library of hierarchical cells or meta-objects is created based on structural features, such as linespace and linewidth. These cells can be represented more efficiently in terms of file size and memory requirements, when placed hierarchically within the design file. The system outputs a design file in a graphical computer aided design format (e.g. GDS). The complete system may be ran as each IC component is added to the design, in real-time, or after all the components have been added to the IC design layout. Our method iterates until a dummy fill strategy is determined that meets the desired process specifications and electrical performance. The design is then certified for manufacturing, 36.

Illustrative embodiments of a method for manufacturing are described in the following sections. Section a. describes a use of an embodiment to reduce variation due to electroplated copper deposition (ECD) processing. Section b. describes the extraction of layout parameters related to process variation as a method to transform the large design files into a manageable set of features. Layout extraction is not required but is preferred. Section c. describes the preferred use of process and electrical models to characterize the impact of process variation on electrical performance. Section d. describes the use of cost functions to measure the impact of dummy fill modification (or lack thereof) and how these functions may be used to achieve desired wafer quality and electrical performance criteria. Section e. provides detailed descriptions of the dummy fill rule generation and management, dummy fill sizing and dummy fill placement. Section f. describes, in detail, the hierarchical cell placement algorithm and the memory benefits over non-hierarchical approaches. Section g. describes several applications of the described dummy fill system to damascene process flows, electrochemical deposition (ECD) and electrochemical mechanical deposition (ECMD) and integration of low-k dielectrics into damascene process flows. Section h. describes the construction and computational framework used to implement the dummy fill methods as well as the operation of the dummy fill system and methods by users. Section i. concludes with results of the current implementation of the dummy fill methods as well as screenshots of the user interface.

a. Use of Dummy Fill to Reduce Variation Related to ECD

Electroplated copper deposition (ECD) is used to create the interconnect structures in a copper damascene process. The goal is to completely fill the trench region in a void-free manner while minimizing the variation in the deposited copper thickness and minimizing the surface topography (often referred to as step height).

The time to closure (time it takes to completely fill the trench, described as time $T_f$) depends heavily on the width of the line and the depth of the trench. For large trenches, the deposition of copper on the sidewalls is small relative to the width of the trench. Therefore, these trenches tend to fill from the bottom up, often at the same rate as the deposition in the field region. The trench is thus filled with the same copper thickness as that on the field, leaving a large step, or step height, on the surface of the copper film over the wide damascene trench. In contrast, the deposition of copper on the sidewall of small trenches rapidly reduces the width of the damascene trench. This increases the concentration of the accelerator agent dissolved in solution, which results in a rapid acceleration of the deposition rate on the bottom of the trench. The copper in the trench fills much more rapidly than in the field area until it fills the trench. Resident accelerators in the copper over the small trench causes the accelerated copper deposition to continue the over the trench, resulting in the formation of a copper bump, or negative step height. The combination of these effects with the large variation in trench width across the chip lead to a large variation in copper thickness and step height across the chip.

Dummy fill or dummy slots may be used to minimize the variation in the deposited copper thickness and surface topography. The addition of dummy fill to the surface topography could significantly reduce the variation. This reduction in variation could lead to significantly more uniform polishing, thus reducing the need for dummy fill and dummy slotting to reduce CMP variation.

Figure 8A:
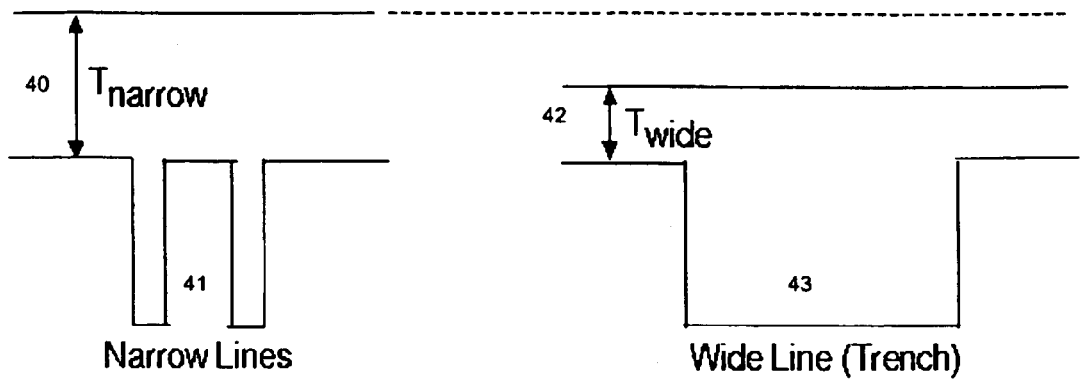
FIG. 8A illustrates the variation in ECD deposition thickness as a result of pattern dependencies, such wide and narrow lines.
Figure 8B:
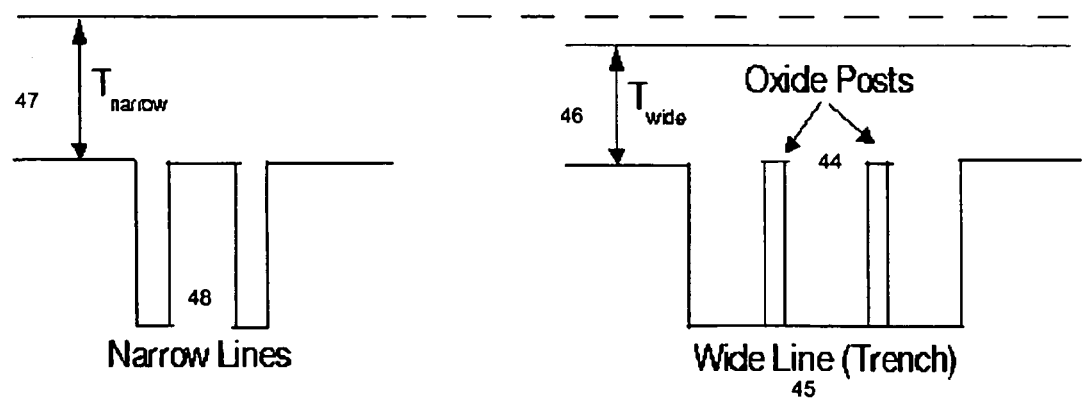
FIG. 8B illustrates the use of oxide dummy posts to achieve uniform ECD film thickness.

For example, filling trenches with dummy oxide structures, or slots, can reduce the thickness and step height variation resulting from electroplated copper deposition. FIG. 8 illustrates a use of oxide dummy fill for ECD. FIG. 8A shows the difference between the deposited copper thickness, 40, over narrow linewidths, 41, and the deposited copper thickness, 42, over a wide linewidth or trench, 43. FIG. 8B illustrates how the addition of oxide dummy posts, 44, in the trench, 45, results in a deposited thickness, 46, equal to the thickness, 47, over the narrow linewidths, 48. The oxide dummy posts act to reduce the effective linewidth of the trench. The addition of oxide dummy fill is equivalent to the removal of metal, which is also referred to as slotting. This figure illustrates a use of dummy oxide slots within wide trenches so that the deposition of the wide trenches behave more like small trenches, thus reducing the difference in deposited copper thickness and step height. If the oxide slots are small compared with the trench width, there is a small change in the electrical properties of the wide interconnects. By embedding electrical simulations into the method, the affect of these slots is calculated. These calculations are used to determine the width and density of the slots placed in the lines. In addition, the electrical calculations are used to limit the amount of slotting based on limits on electrical performance loss specified by the designer. The proper addition of oxide dummy structures reduces the step height variation before CMP, which should result in a more uniform CMP process.

b. Layout Parameter Extraction

A layout is a set of electronic files that store the spatial locations of structures and geometries that comprise each layer of an integrated circuit. It is known that process variation, that negatively impacts the planarity of processed films, is related to the variation in spatial densities and linewidths of a given design. To characterize this relationship, our preferred method uses layout extraction, where linewidth and density features are extracted spatially across a chip from the geometric descriptions in layout files. The extracted information may then be used to determine areas of the chip that exceed design rule criteria regarding designed linewidth and density.

The layout parameters used to compute dummy fill includes the effective pattern density and linewidth. Although the dummy fill method works with extracted densities and linewidths, some embodiments utilize the extracted linespace, as well as linewidth and density.

Figure 9A:
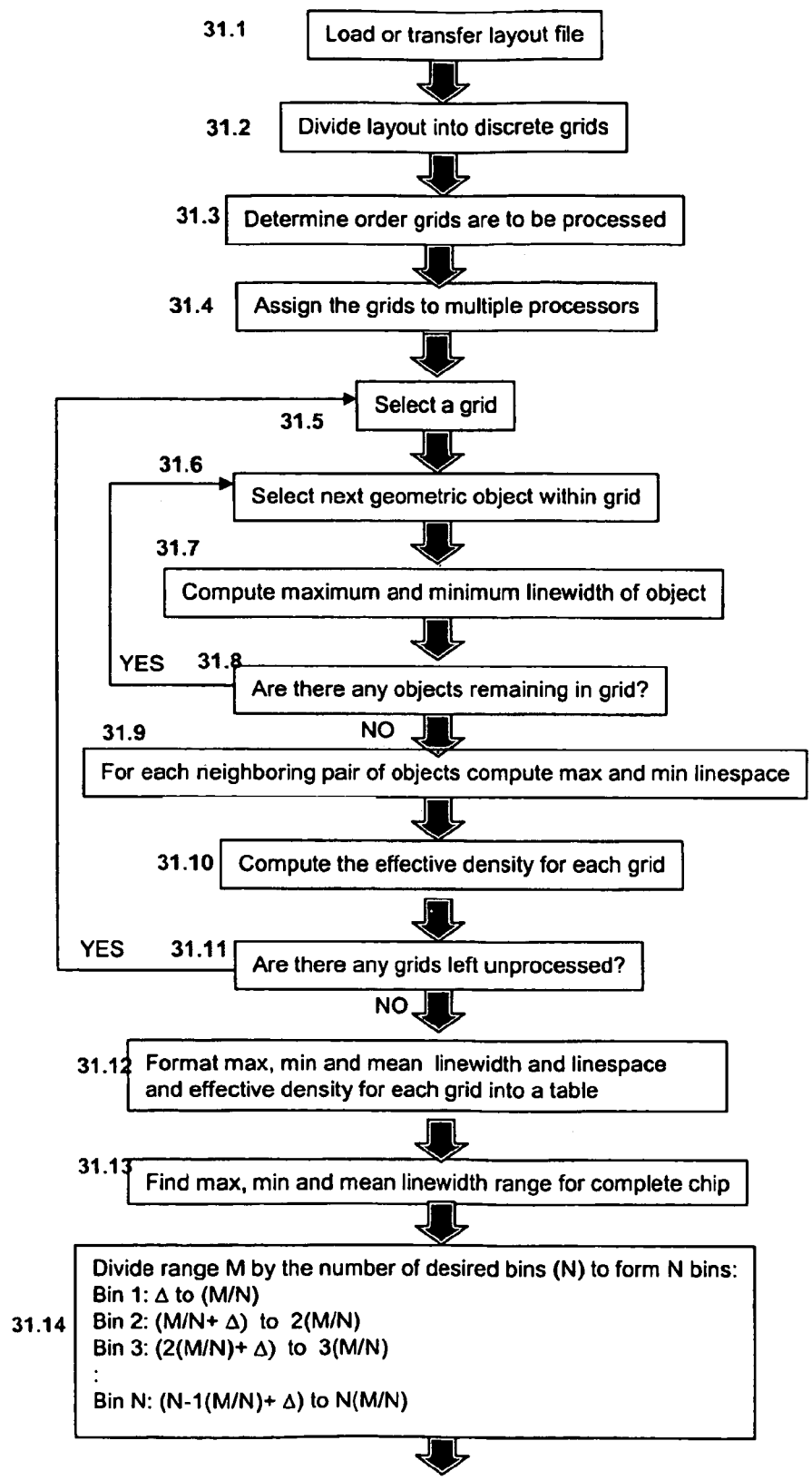
FIG. 9A illustrates the steps involved in layout extraction.
Figure 9B:
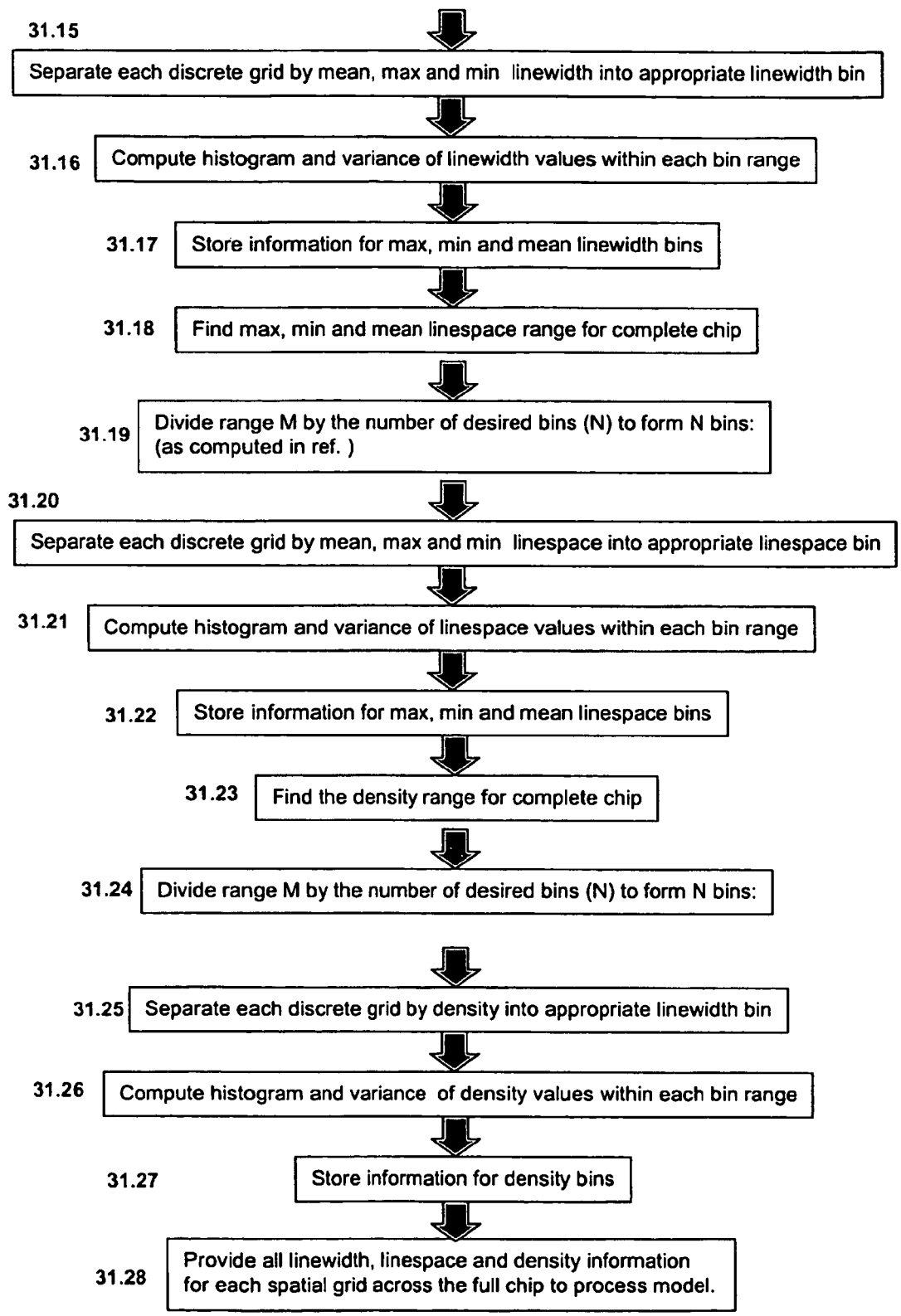
FIG. 9B illustrates a continuation of the steps involved in layout extraction.

The flowchart in FIG. 9 provides a detailed flow of the layout extraction component shown in 30 of FIG. 7. In FIG. 9, the layout file is transferred or uploaded to the dummy fill system, 31-1. The layout is divided into discrete grids, small enough so that aggregate computations of mean, maximum and minimum features are used to represent the structures in the grid and still allow accurate dummy placement, 31-2. Typical grid size in current implementations is 40 µm×40 µm. The grids are ordered or queued for processing, 31-3. One good embodiment is to use multiple processors to compute the grids in parallel, 31-4. A grid is selected, 31-5 and within that grid each object, 31-6 has the linewidth of the object computed, 31-7. This process is repeated for every object within that grid, 31-8. For each set of neighboring objects the maximum, minimum and mean linespace is computed, 31-9. The effective density for the entire grid is then computed, 31-10. This process is repeated for all the remaining grids, 31-11. Once all the grids are processed, the extracted features are re-assembled from the different processors, 31-12. A table is then created and the maximum, minimum and mean linewidth, linespace and density are placed in it as well as the maximum, minimum and mean linewidth for the whole chip, 31-13. The minimum and maximum linewidth is used to compute a range.

The linewidth range (M) is divided by the number of desired bins (N), 31-14, to determine the relative size of each of the N bins. For example the first bin would be the minimum linewidth or small nonzero value $\Delta$ to the linewidth (M/N) and continue until the $N^{th}$ bin which will span the linewidth from min $LW_{BinN}=(N-1)\cdot(M/N)$ to max $LW_{BinN}=(N)\cdot(M/N)$, which is also the maximum linewidth. There are three sets of bins, a set of bins for each of maximum, minimum and mean linewidth. Each grid is separated into the appropriate bins according to its max, min and mean linewidth, 31-15. A histogram is also created for each bin showing the distribution of values within that bin, 31-16. This information is stored in the database and fed into process models, in particular ECD models, as well as the dummy fill rules generation, 31-17.

The maximum, minimum and mean linespace ranges are computed for the full chip, 31-18. The linespace range (M) is divided by the number of desired bins (N), 31-19, to determine the relative size of each of the N bins. For example the first bin would be the minimum linespace or small nonzero value $\Delta$ to the linespace (M/N) and continue until the $N^{th}$ bin which will span the linespace from min $LW_{BinN}=(N-1)\cdot(M/N)$ to max $LW_{BinN}=(N)\cdot(M/N)$, which is also the maximum linespace. There are three sets of bins, a set of bins for each of maximum, minimum and mean linespace. Each grid is separated into the appropriate bins according to its max, min and mean linespace, 31-20. A histogram is also created for each bin showing the distribution of values within that bin, 31-21. This information is stored in the database and fed into process models, in particular ECD models, as well as the dummy fill rules generation, 31-22.

The density range is computed for the full chip, 31-23. The density range (M) is divided by the number of desired bins (N), 31-24, to determine the relative size of each of the N bins. For example the first bin would be the minimum density or small nonzero value $\Delta$ to the density value (M/N) and continue until the Nth bin which will span the density from min $LW_{BinN}=(N-1)\cdot(M/N)+\Delta$ to max $LW_{BinN}=(N)\cdot(M/N)$, which is also the maximum density. There is one set of bins for density. Each grid is separated into the appropriate bins according to its density, 31-25. A histogram is also created for each bin showing the distribution of values within that bin, 31-26. This information is stored in the database and fed into process models, in particular ECD models, as well as the dummy fill rules generation, 31-27. Finally all the linewidth, linespace and density information are stored either in the database or on the filesystem for later use in process model prediction or dummy rule generation and placement, 31-28.

Dummy fill placement algorithm also requires direct knowledge about the exact coordinates of an existing layout object and its surrounding neighbors. The object dimensions (length and width) must be known as well as the space to nearby objects in each direction. To determine the coordinates of the dummy fill region, four steps are required. In the first step, the coordinates of a selected object are obtained to determine its length and width. In the second step, shown in FIG. 10A, the space from the selected object (object A), 50, to its nearest neighbors is computed in all directions, object B, 51, object C, 52, object D, 53, and object E, 54. If there is more than one object in a given direction, the space and range information must be computed. For example, FIG. 10B shows that there is only one object to the east of the selected object and the space to the object B, 56, from object A, 55, is equal to 50 µm. In FIG. 10C, there are two objects, 58 & 59, to the east of the selected object, 57. In this case, there are two ranges for linespace; the range from object A, 57 to the farther object, 59, has a linespace of 50 µm. The range from object A, 57 to the closer object, 58, has a linespace of 10 um. In FIG. 10D, there are also two objects, 62 & 63. However, in this case there are three ranges, with no objects to the east of object A, 60, between y=15 µm and x=20 µm, and object A has a range to the grid boundary, 61, as well. Depending on the surroundings, one or more space ranges are generated for each object. If there are no objects until the edge of the selected block or grid, 61, the space can be set to the distance between the object edge to the grid boundary or neighboring grids, 61, can be searched until an object is found (or the chip boundary is reached).

The third step uses the linewidth and linespace information to find the dummy fill rule, often from a rule table. Finally, the fourth step computes the coordinates of the dummy fill region based on the dummy fill rule and the coordinates of the selected object and its neighbors.

Figure 11:
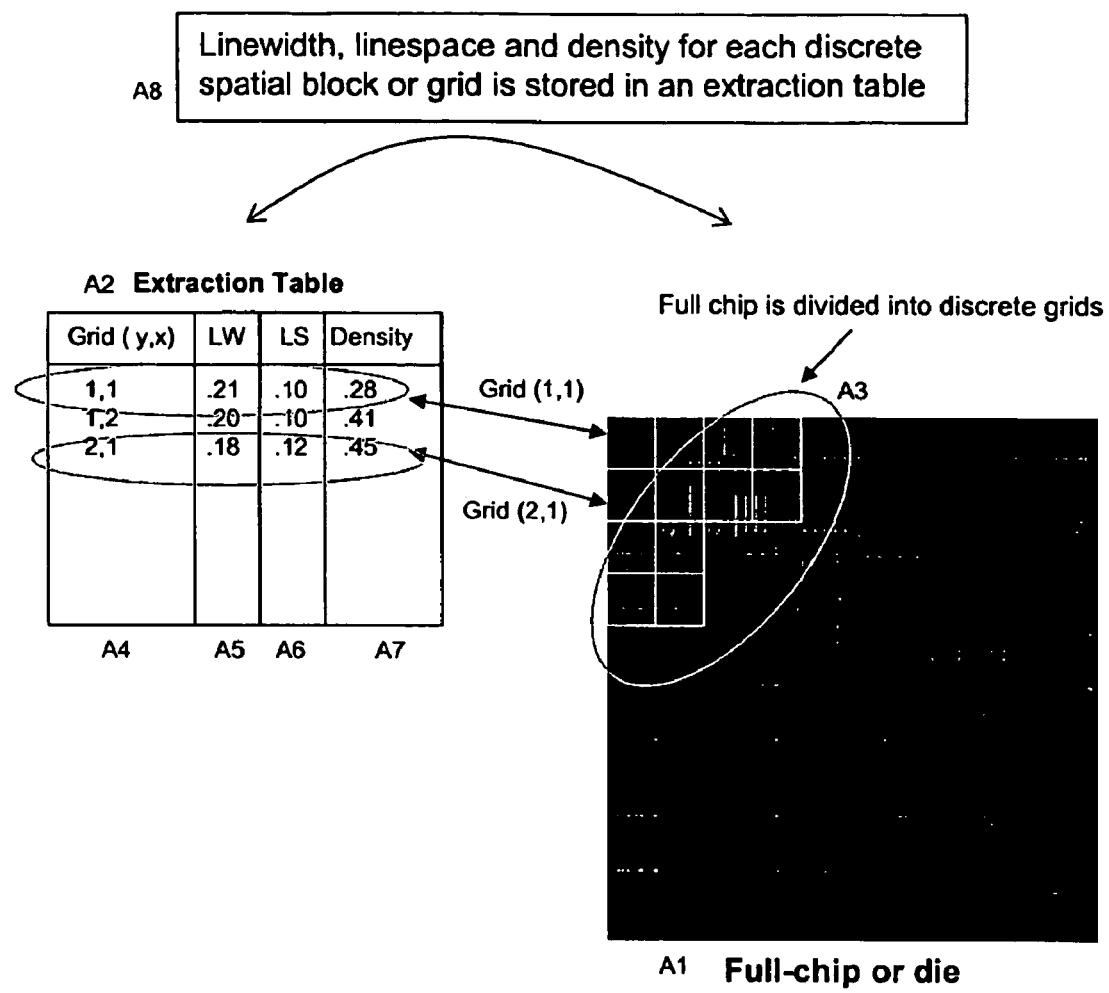
FIG. 11 illustrates the relationship between spatial regions across the chip and the creation of a layout extraction table.

An example of how an extraction table is used to represent the full-chip or die is shown in FIG. 11. The chip or die, A1, is segmented into discrete grids, A3, and the extraction procedure, described in FIG. 9, is used to compute the linewidth, A4, linespace, A5, and density, A6, for each grid element. FIG. 11 illustrates how the linewidth (LW), linespace (LS) and density values placed in an extraction table relate to the grid at (y,x) coordinate (1,1) and the grid at (y,x) coordinate (2,1). In many cases, the max, min and mean of the features within each grid are stored in the table as well.

c. Process and Electrical Models

Figure 12A:
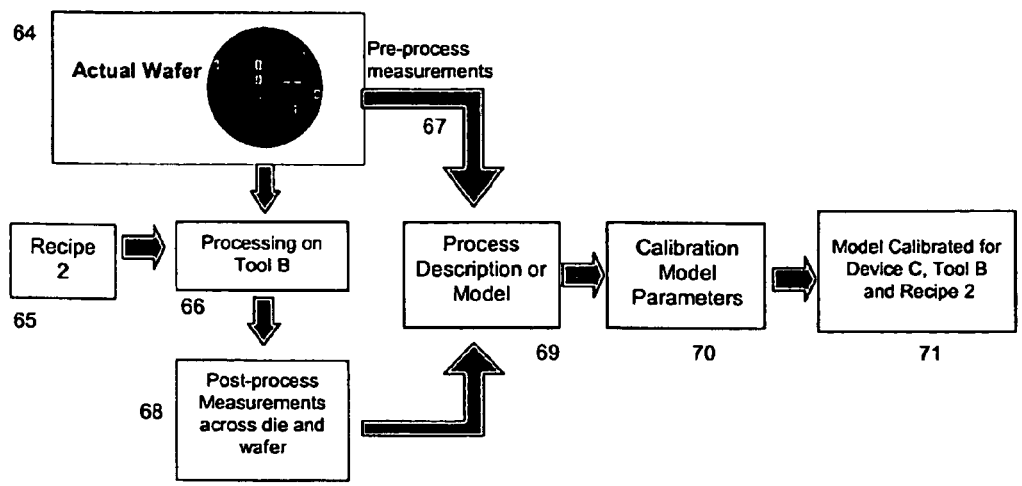
FIG. 12A illustrates the use of product wafers in calibrating a tool for a particular recipe.

The dummy fill method presented herein uses a process model or a series of models (i.e. a flow) to predict the manufactured variation in physical and electrical parameters from an IC design. By characterizing the process variation relative to IC structures, dummy fill can be added to minimize the variation of physical and electrical parameters from the desired values. This method is not dependent upon any particular type of model or simulation. However it is generally accepted that each process tool has unique characteristics and thus a model needs to be calibrated to a particular recipe and tool. Thus, it is often common practice to process a given IC design to determine the impact of processing on physical and electrical parameters and to develop or calibrate process models specific to a particular tool or recipe, as shown in FIG. 12A. In FIG. 12A, the actual product wafer, 64, is processed using a recipe, 65, on a particular tool, 66. The pre-process wafer measurements, 67, and post-process wafer measurements, 68, are used to fit model parameters, 69. One good embodiment is a semi-empirical model that characterizes pattern dependencies in the given process. The calibration model parameters or fitting parameters, 70, may be extracted using any number of computational methods such as regression, nonlinear optimization or learning algorithms (e.g. neural networks). The result is a model that is calibrated to this particular tool for a given recipe, 71.

Figure 12B:
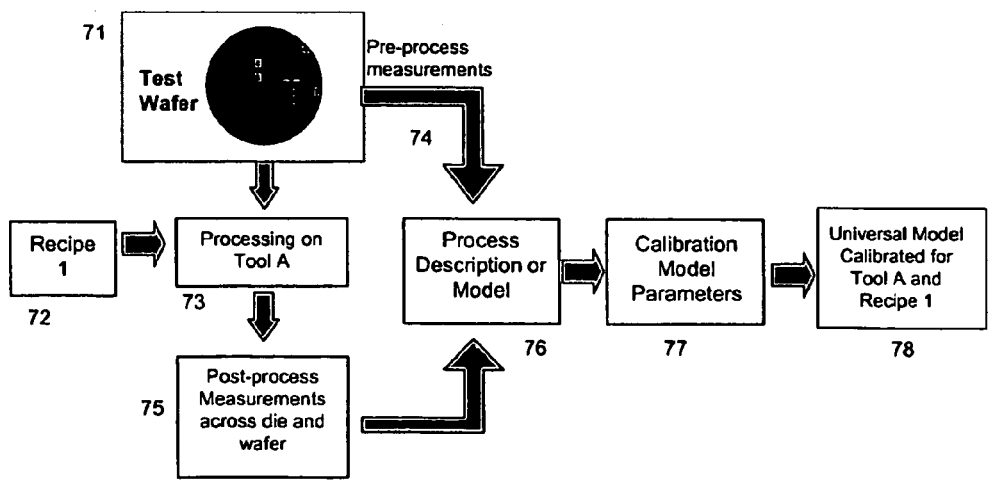
FIG. 12B illustrates the use of test wafers in calibrating a tool for a particular recipe.

It has been shown that certain IC characteristics such as feature density, linewidth and linespace are directly related to variation in topography for plating, deposition and CMP processes. It has also been shown that test wafers that vary these features throughout some range across the die can be used to build a mapping from design parameters (e.g. linewidth, linespace, density) to manufacturing variation (e.g. film thickness, dishing and erosion) for a given tool and recipe. Test wafers are an attractive alternative for assessing process impact in that they are generally less expensive to manufacture and one test wafer design can be used to characterize any number of processes or recipes for a wide range of IC designs. As shown in FIG. 12B, a test wafer can be also be used to generate a calibrated process model or multiple process models or a process flow. The calibration model parameters may be computed using the same method in FIG. 12A, as such the details will not be repeated here. One difference is that the pre-process measurement, 74, may be conducted by the test wafer manufacturer and retrieved in an electronic form, such as via the internet, email, disc or CD or paper form. The other difference is that the resulting calibration, 78, normally spans a much larger range of linespace, linewidth and density features and thus is more applicable to a broad range of devices.

Figure 13A:
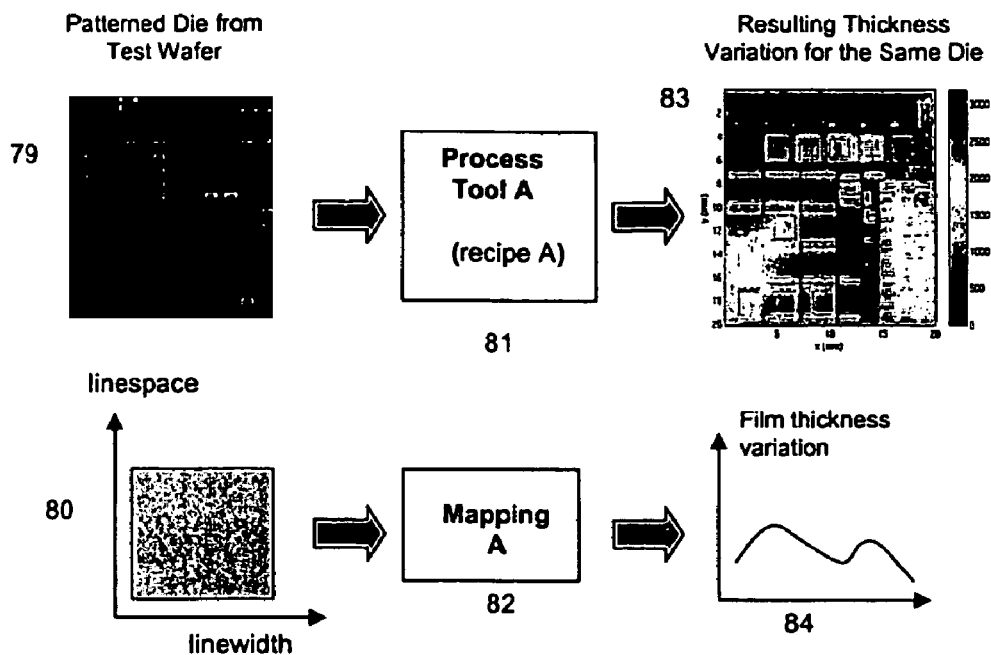
FIG. 13A illustrates how a calibration is used to map layout features to film thickness variation.
Figure 13B:
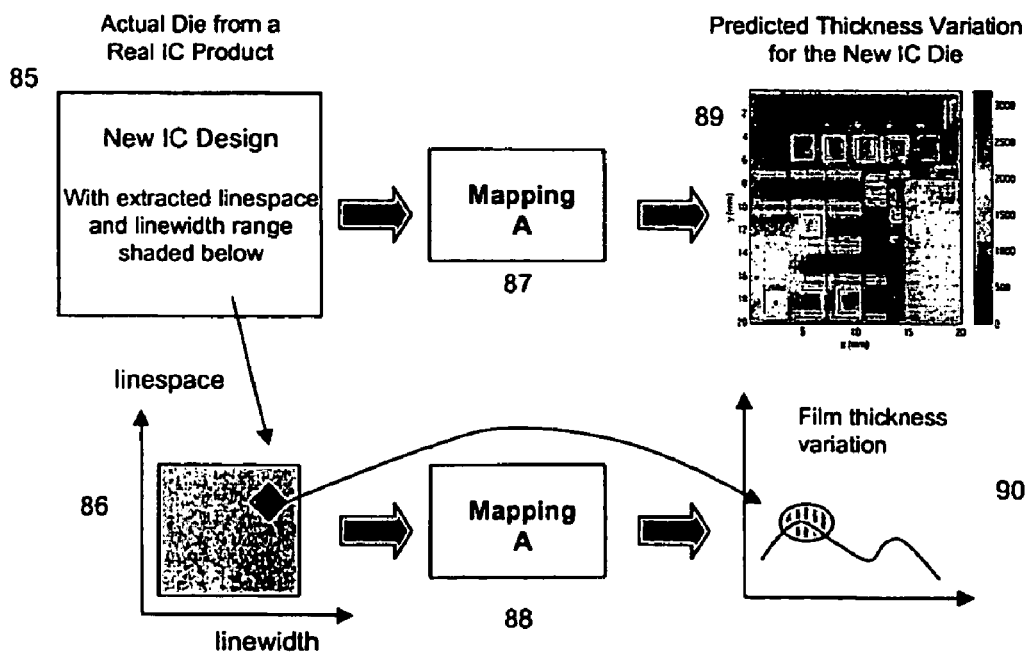
FIG. 13B illustrates the use of the calibration mapping to predict film thickness variation for a new IC design.

More details regarding the use of test wafers in calibrating a process are provided in FIG. 13A. A test wafer die is shown, 79, is patterned with a range of linewidth and linespace values, 80. The test wafer is processed (e.g. CMP, ECD or deposition) on a tool using a given recipe, 81, and the resulting variation is measured across the chip, 83, using a metrology tool (e.g. film thickness, 84). This mapping may be considered a model that maps a wide range of linewidth and linespace values to a particular film thickness variation for this tool and recipe. These mapping are useful for predicting process variation for new IC designs without having to actually tape-out masks and process the design, as shown in FIG. 13B. Linewidth and linespace features (whose range fall within the range, 86, spanned by the test die & wafer) are extracted, 85, from a new IC layout. The extracted linewidth and linespace features for spatial locations across the chip, 86, are input into the mapping, 87 & 88, and an accurate prediction of film thickness variation across the chip, 89 & 90, can be acquired for a given tool and a given recipe without actually developing expensive lithography masks and processing the new IC design.

Figure 13C:
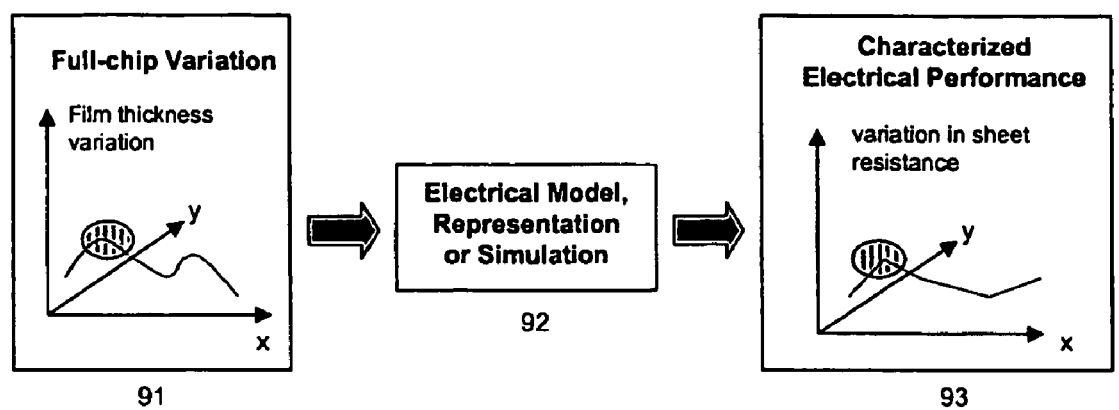
FIG. 13C illustrates how wafer-state parameters, such as film thickness variation, can be used to predict electrical parameters.

As shown in FIG. 13C, the predicted process variation, 91, can be fed into electrical models or simulations, 92, to assess the impact of processing on the electrical performance of the chip, 93. The layout for this design may be modified (e.g. through the addition of dummy fill or modification of the design), new layout parameters extracted and evaluation of process variation repeated. This may be repeated until a particular layout yields a desired level of process variation.

The following paragraphs and figure descriptions provide a detailed flow of an example of the use of process and electrical models to characterize variation, as implemented for dummy fill.

Figure 14:
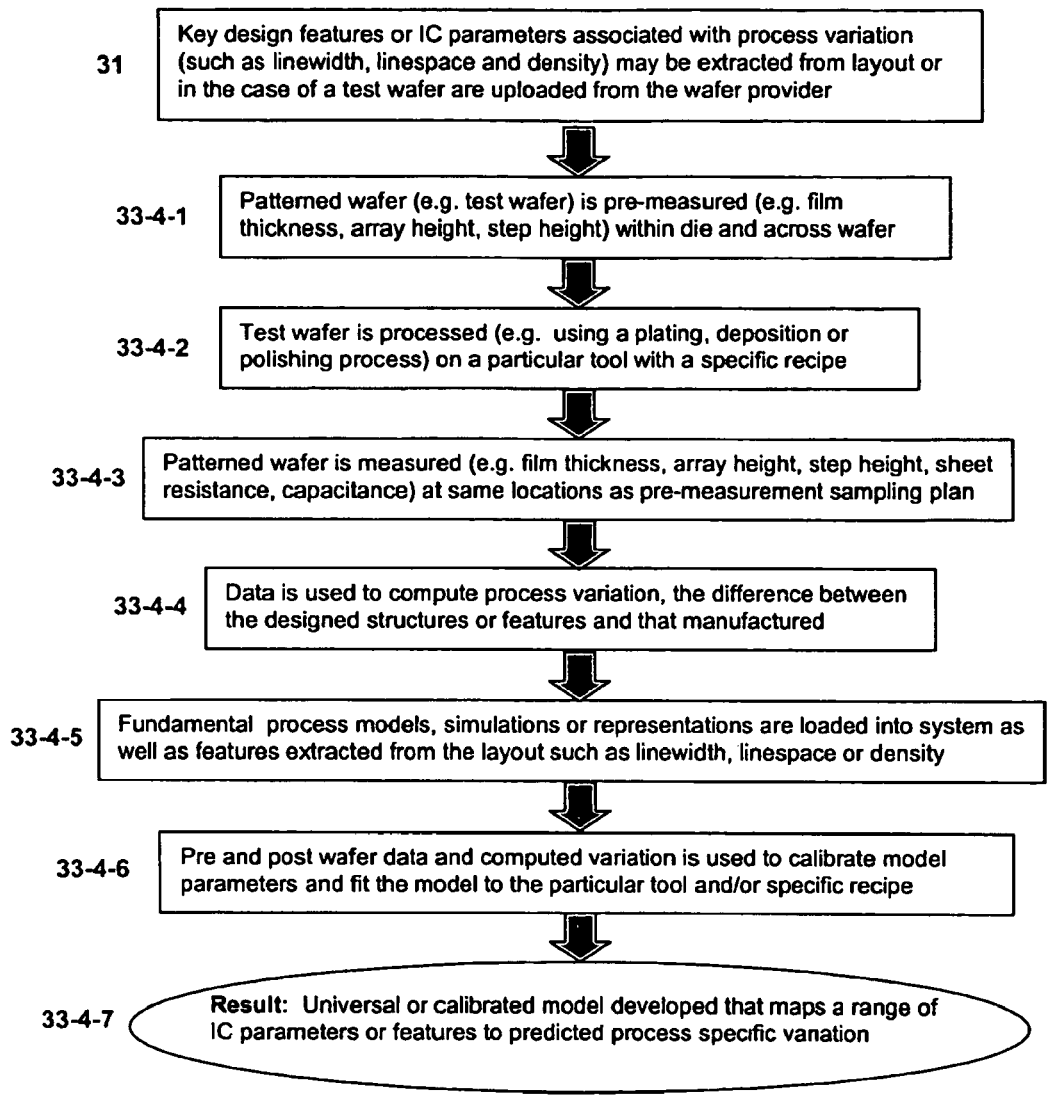
FIG. 14 describes the flow of steps used to calibrate a process step and generate a model.

FIG. 14 describes the steps involved in calibrating a process model to a particular tool or recipe. As described in FIG. 7, 1, layout extraction parameters are computed or in the case of test wafers uploaded from the wafer provider. The second step, 33-4-1 pre-measures the wafer using metrology equipment. These measurements may include film thickness and profilometry scans to acquire array and step heights. The third step 33-4-2 processes the test wafer for the particular process or process flow that is to be characterized. Such processes or flows may include plating, deposition and/or polishing steps. The preferred method is to calibrate on individual processes and also calibrate on sections of the flow as a way to best capture any coupling of variation between subsequent process steps in a flow. It is also recommended to calibrate the model for different recipe parameters such as time. The processed wafers are measured, 34-3-3 at the same locations as the pre-measurements; such measurements may include film thickness, profilometry or electrical, and the variation for the given process may be characterized, 33-4-4. Process models or representations are uploaded in 33-4-5 and the pre and post measurements as well as computed variation may be used to calibrate or fit the model or representation to a particular tool and/or recipe or recipes. These models may be formulated and uploaded by the user or selected from a library of models on the dummy fill computer system. The pre and post measurements and computed process variation is used to fit the model or simulation parameters for the given tool and recipe, 33-4-6. The result, 33-4-7, is a process model calibrated to a particular tool and recipe or recipes. The result may also include a series of calibrated process models that can be used to simulate a process flow.

Figure 15:
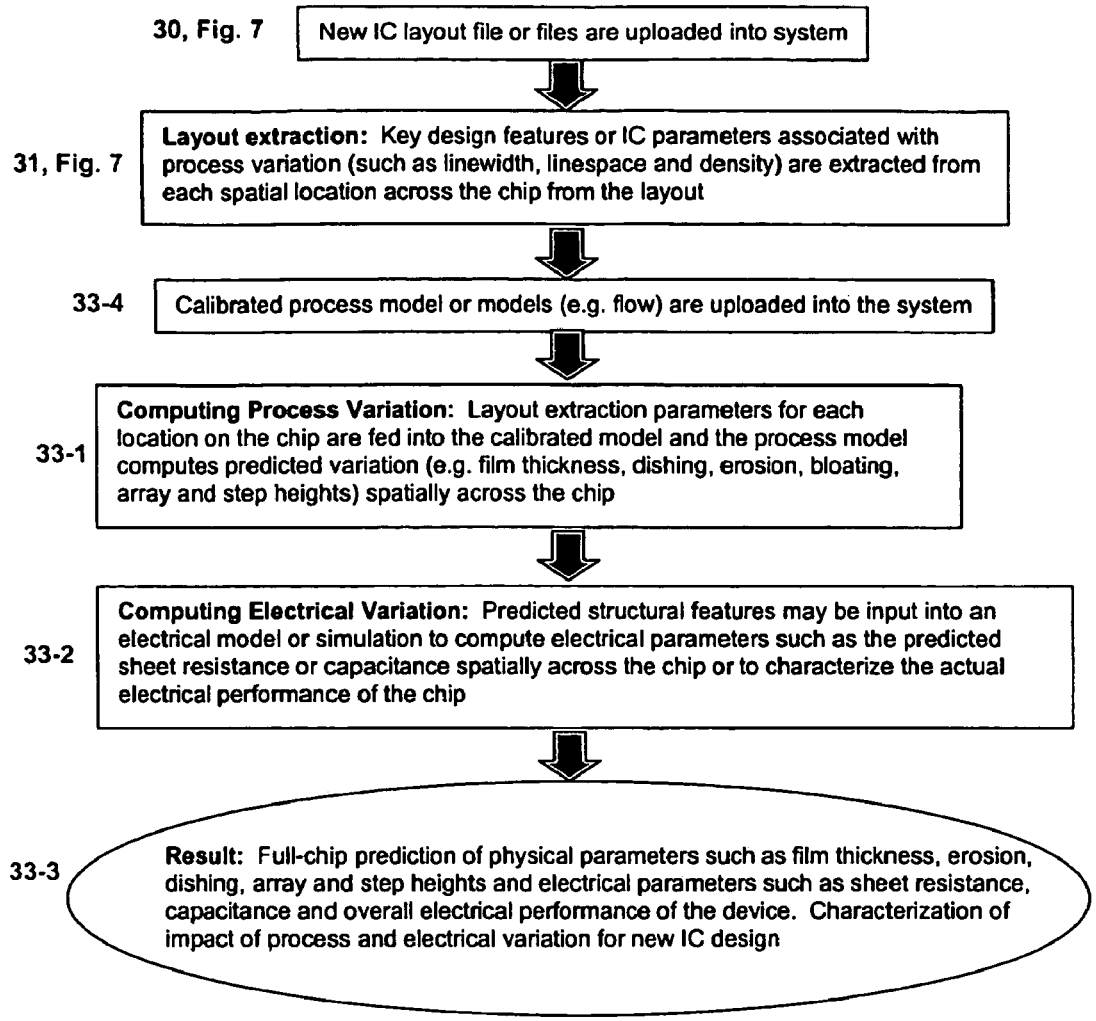
FIG. 15 describes the flow of steps used to generate a prediction using a calibrated model.

FIG. 15 describes the steps involved in using calibration models to predict the impact of process variation and subsequent variation in electrical parameters and performance. A new layout or set of layout files as well as desired IC features, geometries and design rule information are loaded into the system, 30. The second step performs layout extraction, 31, to extract a description or set of features relevant to process variation for a number of locations across the chip. One common approach is to discretize the layout into a number of grids and a structure density is computed for each grid element. However, our approach computes the effective linewidth and linespace for each grid element as well. The calibrated process models are uploaded or assembled to simulate processing, 33-4. The extracted layout parameters for each spatial location are fed into the model and the resulting process parameters are computed, such as film thickness, dishing, erosion, array and step heights, 33-1. The difference between the target and predicted IC parameters are used to compute the process variation. The predicted process parameters may also be fed into electrical models or simulations to characterize the electrical performance of the IC which when compared with the desired performance allows for the electrical variation to be computed, 33-2. Some of the electrical parameters that may be computed include variation in sheet resistance, resistance, capacitance, interconnect RC delay, voltage drop, drive current loss, dielectric constant or crosstalk noise.

Since this dummy fill algorithm is particularly suited for dummy fill adjustments to interconnect layers, interconnect metrics (R, C, L variation) are used as general metrics for all areas of the chip, as shown in the following table. Other critical areas may require simulating the circuit performance effects of adding dummy fill. For example, a metric for the signal delay variation may be imposed in addition to a percentage RC variation to ensure that timing constraints of the critical paths meet the circuit specifications. Similarly, clock skew and crosstalk noise simulations may be used to determine whether or not the circuit will function properly. This way, RC (or RLC) criteria can be used as a first pass estimate of where to add the dummy fill. Then the dummy fill placement can be fine tuned in the next iteration by selectively performing circuit simulations for specific signals or certain areas of the chip.

TABLE 1

Electrical performance metrics for dummy fill adjustment

| Performance Metric | Metric Type | Application |
|---|---|---|
| Resistance (R) | Interconnect | ECD, oxide dummy fill |
| Capacitance (C) | Interconnect | ECD, oxide dummy fill, metal dummy fill |
| Inductance (L) | Interconnect | High frequencies (ECD, oxide & metal fill) |
| Signal Delay | Circuit | Routing, Buses, Critical Paths |
| Skew | Circuit | Clocks |
| Crosstalk Noise | Circuit | Low swing/noise sensitive circuits |

The result of models and simulations described in this section is a full-chip prediction of process and electrical parameters and performance for a new IC design, as well as prediction of how these parameters may improve as dummy fill is added, 33-3.

d. Dummy Fill Algorithm Cost Function

A cost function, 35, is used to measure how well an initial IC design or a given dummy fill scheme achieves the desired film thickness and electrical parameters.

While film thickness variation is a universal concern, electrical performance metrics may vary between technology generations and design groups. As described in section c., interconnect metrics (R, C, L variation) can be used as general metrics for performance in all areas of the chip. Other critical areas may require simulating the circuit performance effects of adding dummy fill. For example, a metric for the signal delay variation may be imposed in addition to a percentage RC variation to ensure that timing constraints of the critical paths meet the circuit specifications. Similarly, clock skew and crosstalk noise simulations may be used to determine whether or not the circuit will function properly. Similarly, voltage drop and drive current loss may also be used to determine the whether or not the circuit will function properly. Similarly, dielectric constant or effective dielectric constant may be used in conjunction with low-k materials to determine effects on capacitance. This way, RC (or RLC) criteria can be used as a first pass estimate of where to add the dummy fill. Then the dummy fill placement can be fine tuned in the next iteration by selectively performing circuit simulations for specific signals or certain areas of the chip.

The predicted or simulated electrical and film thickness parameters are verified against desired target parameters. This characterization of how well a particular dummy fill placement meets the desired film thickness and electrical performance specifications is normally performed using some form of cost function. A cost function can be as simple as a check to see if a particular film thickness non-uniformity threshold is exceeded or it could be as complex as a quadratic function of non-uniformity and undesirable electrical effects that are to be minimized in a feedback type system. In that a good dummy fill method uses process and electrical impact, a useful embodiment is a cost function and it minimizes the following parameters:

Thickness Non-uniformity=function of (LW, LS, density)
Electrical Performance=RC||Delay||Skew||Noise
Delay=function of (R, C, L, $R_{tr}$, $C_L$)
Skew=function of (R, C, L, $R_{tr}$, $C_L$)
Noise=function of (R, $C_{coupling}/C_{total}$, L, $R_{tr}$, $T_r$, l)
Where:
    R=interconnect resistance
    C=interconnect capacitance
    L=inductance
    $R_{tr}$=driver resistance
    $T_r$=signal rise time
    $C_L$=load capacitance
    $C_{coupling}$=intra-layer coupling capacitance
    $C_{total}$=total capacitance (coupling+overlap+fringe)
    l=interconnect length The cost is a quadratic error function U based on a weighted sum of process (film thickness) non-uniformity and electrical performance variation, where the electrical performance is taken as one or more of the following metrics: RC, delay, skew, noise.

$$\text{Error}_T = (T_{target} - T_{actual})$$

$$\text{Error}_{EP} = (EP_{target} - EP_{actual})$$

$$U = (\text{Error}_T^T \cdot K_1 \cdot \text{Error}_T) + (\text{Error}_{EP}^T \cdot K_2 \cdot \text{Error}_{EP})$$

where:
$T_{target}$=vector of desired film thickness measurements
$T_{actual}$=vector of actual or predicted film thickness measurements
$EP_{target}$=vector of desired electrical performance metrics
$EP_{actual}$=vector of actual or predicted electrical performance metrics
$\text{Error}_T$=column vector of film thickness errors
$\text{Error}_{EP}$=column vector of electrical performance metrics
U=quadratic error, a scalar value, to be minimized
$K_1$=Diagonal matrix with weights for 1 through q total film thickness measurements along the diagonal elements.

$$k_1 = \begin{bmatrix} w_{T1} & 0 & 0 \\ 0 & \ddots & 0 \\ 0 & 0 & w_{Tq} \end{bmatrix}$$

$K_2$=Diagonal matrix with weights for 1 through p total electrical performance metrics along the diagonal elements.

$$k_2 = \begin{bmatrix} w_{EP1} & 0 & 0 \\ 0 & \ddots & 0 \\ 0 & 0 & w_{EPp} \end{bmatrix}$$

The cost may encompass each signal line or a section of the chip this way and the film thickness vectors and weighting matrices can be easily modified to provide the correct quadratic error to be minimized over the entire chip. (One way is to concatenate them into a large vector of film thickness and another as a large vector of electrical parameters; adjusting the weighting parameters appropriately). Another way is to have separate error functions U for different areas of the chip that are weighted using a planarization length kernel function.

There is normally some tuning of the weighting parameters based upon those elements where the need to be minimized is greatest. This tuning may be automated or the user may be prompted for a weighting scheme.

e. Dummy Fill Sizing and Placement

Figure 16:
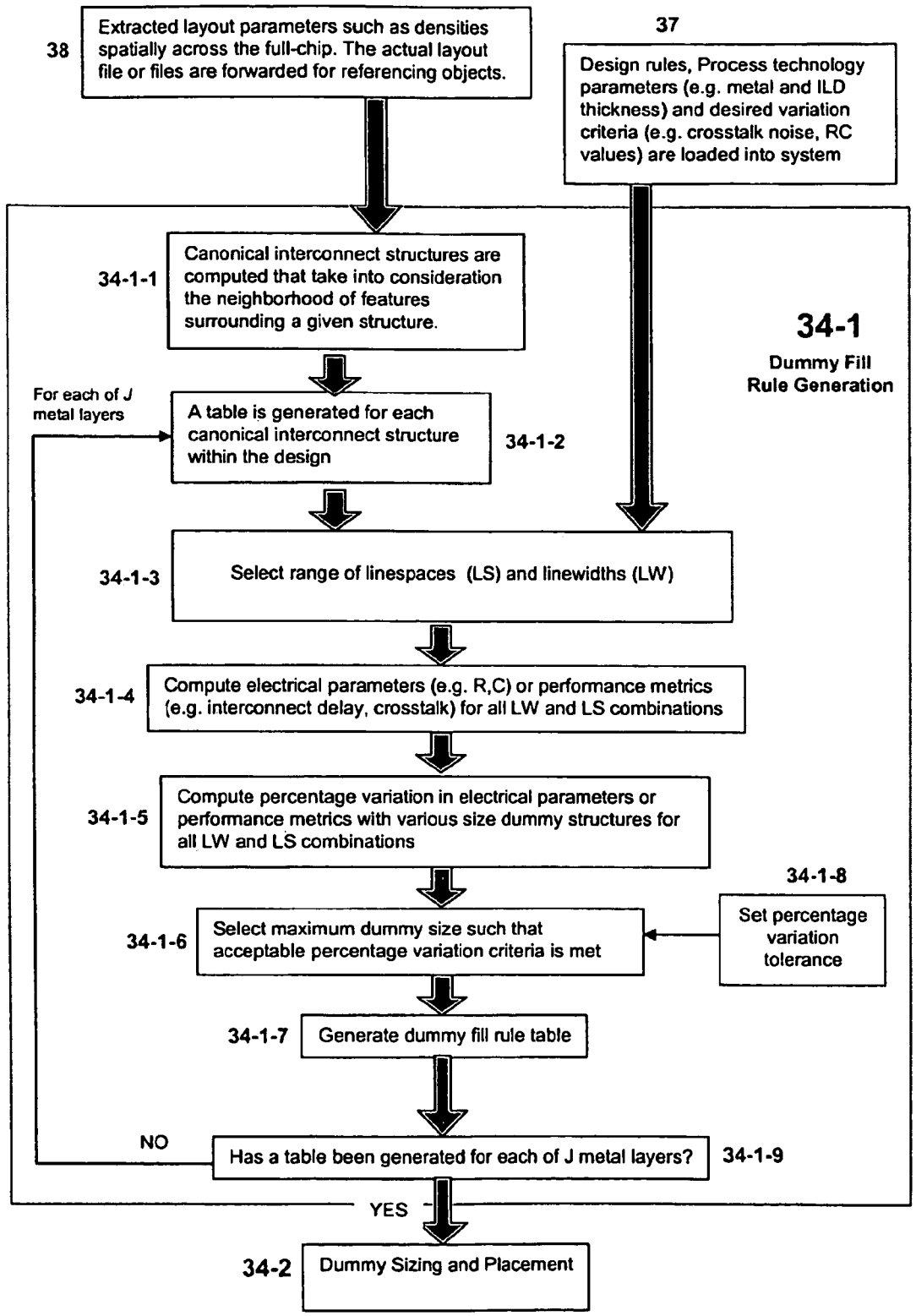
FIG. 16 describes the flow of steps used to generate dummy fill rules and tables FIG. 17 provides a sample dummy rule table, showing maximum dummy fill linewidth as a function of interconnect linewidth and linespace.

Although all the components in FIG. 7, have an impact on where dummy fill is placed, the actual decisions regarding the sizing and placement of dummy fill within the layout are performed in the component labeled as 34. Information about the process technology to be used is provided first, along with acceptable design variation criteria, to generate a set of metal and oxide dummy fill rules. A detailed flow diagram of the steps in formulating the dummy fill rules, 34-1 is provided in FIG. 16. The process technology information may include the nominal values of the metal thickness T, inter-layer dielectric (ILD) thickness H above and below the metal layer of interest, the dielectric constant $\in$, and conductivity $\rho$ of the metal layer. The design criteria may include the acceptable percentage of tolerance in the interconnect RC delay and/or crosstalk noise. These parameters, 38, and the layout and extracted layout parameters, 37, are input into the dummy fill rule generation component, 34-1.

Canonical interconnect structures, 34-1-1, are computed where an object or class of objects is uniquely identified or standardized within a set of features such as capacitance, linewidth, linespace or density. A table is generated for each canonical interconnect structure found in the design, 34-1-2. In the following loop (34-1-2 to 34-1-9), dummy fill rules are then generated for the combinations of linewidth and linespace specified within a given range. This table is repeated for each of J total metal layers within the design. If the technology changes, a new rule table is generated with the modified technology and design parameters.

Dummy fill rule generation begins with selection of the range of linespaces and linewidths that span all the objects in a given layer, 34-1-3. The electrical parameters (e.g. resistance (R) and capacitance (C)) and/or performance metrics (e.g. interconnect delay, voltage drop, drive current loss, dielectric constant or crosstalk noise) for all the linewidth and linespace combinations are computed, 34-1-4. The percent variation in electrical parameters is then computed for a range of dummy fill structures and sizes for all of the linewidth and linespace combinations, 34-1-5. The maximum dummy size is selected, 34-1-6, that meets the percent variation tolerance levels, 34-1-8. Based upon all these computations the dummy rule table is generated for each metal layer in the design, 34-1-7. The flow continues until all metal layers are computed, 34-1-9.

A sample dummy rule table is provided in FIG. 17. Maximum dummy fill linewidth (or available width of fill region) as a function of interconnect linewidth and linespace is shown. Dummy fill rules are based on interconnect linewidth, width of available fill region and electrical criteria (e.g. maximum capacitance variation of 5% with the addition of fill). This sample rule table is for metal dummy fill. A new table must be generated for each metal layer and changes as a function of the technology parameters and performance metric/criteria.

Figure 18:
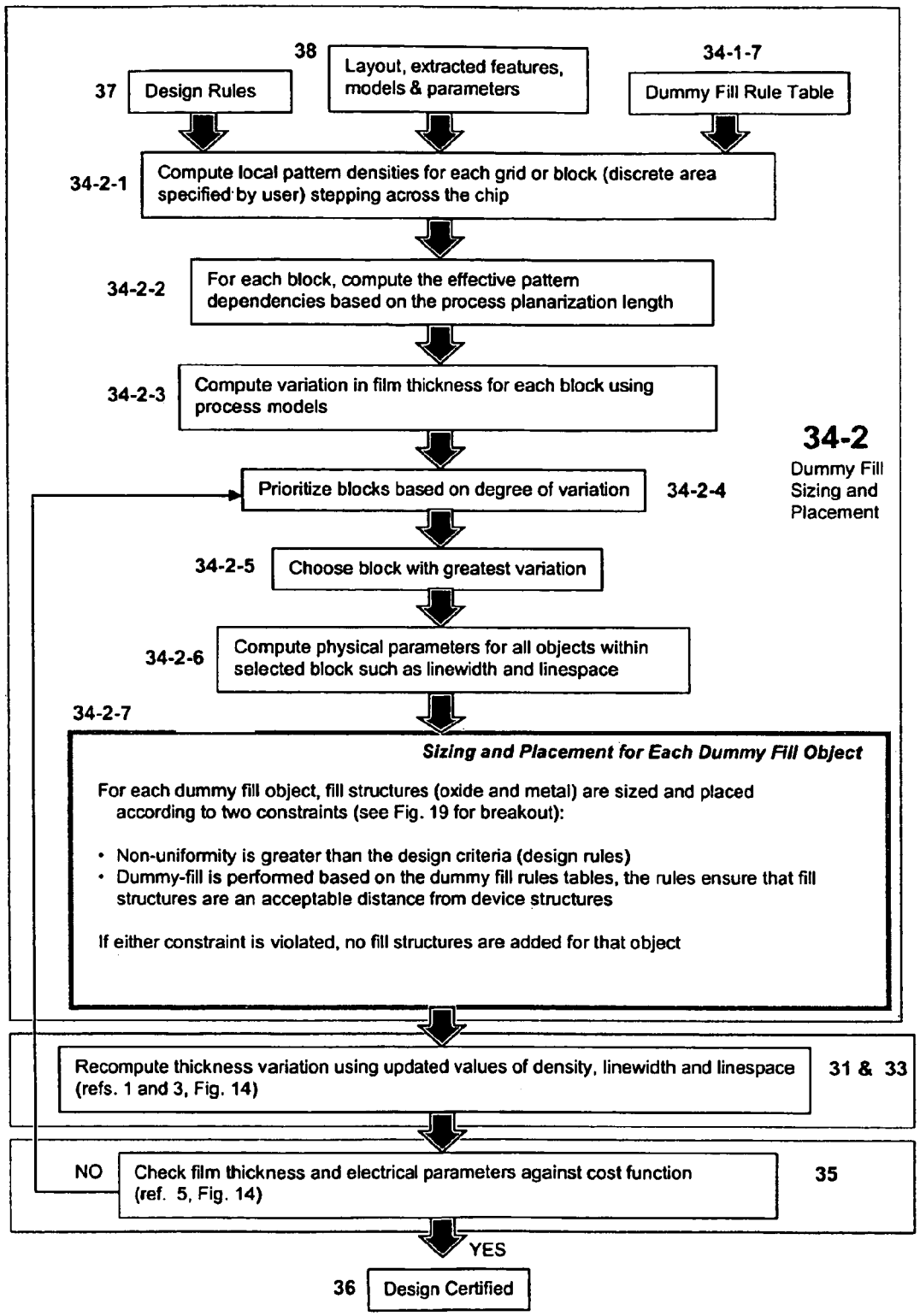
FIG. 18 describes the flow of steps used in sizing and placing dummy fill

The detailed flow diagram for the dummy fill sizing and placement algorithm operations, 34-2, is described in FIG. 18. The metal and oxide dummy fill algorithm then takes the fill rules, 34-1-7, design rules, 37, along with the layout file, extracted pattern densities, and the CMP process variation models, 38. The local pattern densities are extracted, 34-2-1, with the aid of computer-aided design (CAD) tools or function libraries that obtain information about the features within the layout. Object coordinates are obtained and the area of each object within the layout is computed. The pattern density is then computed for a small square window, typically of side length 40 μm to 100 μm. The effective pattern density is computed inside the dummy fill algorithm for each of the grids, also referred to here as a block, using an elliptical window set to the planarization length L, associated with a given process, 34-2-2. For each block, the predicted film thickness variation is computed, 34-2-3. Adaptations of this algorithm may also include the variation in electrical parameters as well. The block fill priority is assigned, 34-2-4, based on the predicted film thickness non-uniformity by the process model, which is a function of the effective pattern density, and in a damascene CMP process, also the linewidths and linespaces of the patterned structures.

In performing the dummy fill, a block is selected one at a time based on its priority, determined by the non-uniformity in film thickness within that block, 34-2-5. Other physical layout parameters such as the linewidths and linespaces are computed for all objects within the selected block, 34-2-6. This algorithm allows for some flexibility regarding the use of a single dummy object size and pattern or selection among various sizes and shapes depending upon dummy fill rules.

Once dummy fill has been placed in a given block, layout extraction is performed to update density, linewidth and linespace parameters, 31, which are used to compute process and electrical parameter variation is recomputed, 33. The cost function, 35, is used to verify that the dummy fill solution meets the desired criteria. If so, the next block is processed, 34-2-4, until all blocks are filled. The dummy fill algorithm operates on each level of interconnect generating dummy fill modifications in two layers, one for metal and the other for oxide, and continues for each level of interconnect. If the constraints are met for all the blocks, the design is certified, 36.

Figure 19:
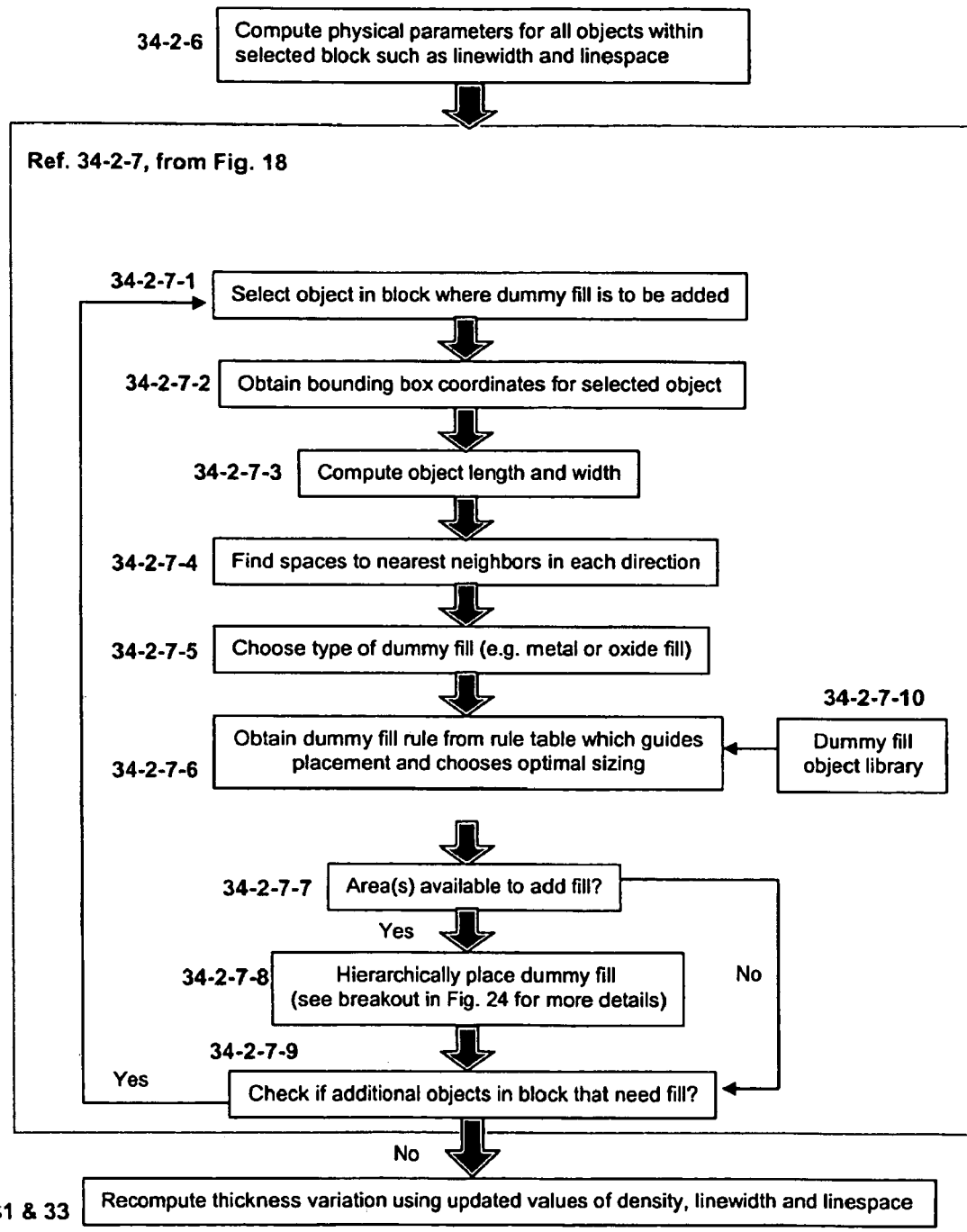
FIG. 19 describes the detailed flow of steps used in placing dummy fill objects within a block.

The dummy fill placement and sizing algorithm shown as 34-2-8 in FIG. 18 is described in detail, in FIG. 19. An object is selected in the block where dummy fill is to be added, 34-2-7-1. A CAD tool is used to obtain the bounding box coordinates for the selected object, 34-2-7-2. The object length and width is calculated, 34-2-7-3 and the distances to nearest neighbors in every direction are computed, 34-2-7-4. The type of dummy fill, for example metal or oxide, is computed for each object, 34-2-7-5.

For each object in the block, dummy structures are added, 34-2-7-6, where possible, in accordance with two constraints:
(1) Non-uniformity is greater than the design criteria
(2) Dummy fill is performed based on the dummy fill rules tables.

The dummy fill rules may also determine which dummy fill size and patterns are best for a particular object with regard to neighboring structures. FIG. 20 provides two tables with sample dummy fill rules to determine fill size and pattern. The first table, FIG. 20A, provides an example of a dummy rule table used to adjust dummy fill size. LW refers to linewidth, LS refers to linespace, R refers to resistance and C to capacitance. The second table, FIG. 20B, provides an example of a dummy rule table used to adjust dummy fill patterns A number of dummy fill object sizes and patterns may be assembled in a dummy fill library, 34-2-7-10, which can be modified as new IC technologies are designed. The user may also choose to override the algorithm selection of size and patterns and include the chosen parameters within the technology design rule submitted at the beginning of the algorithm.

The dummy fill rules check for available area near the selected object, keeping an acceptable distance from the object based on the metal dummy fill rule. The oxide dummy structures are added based on similar electrical rules. If either of these constraints is violated, no fill structures are added for that object, 34-2-7-7. If there are no violations then the dummy fill may be placed hierarchically as a more efficient method to adapt the layout, 34-2-7-8. If layout file size is not a concern, then each dummy fill object can be added directly to the layout, each with it's own coordinates. There is a check, 34-2-7-9, to see if there are any additional objects within the block and if so, this process continues. If there are any additional objects within the block, the next object is selected, 34-2-7-1, and the process continues until all objects within the block are processed.

FIG. 21 illustrates how two different dummy fill patterns, FIG. 21A and FIG. 21B, can have different fill object sizes but have similar density, thus illustrating how size provides another degree of freedom in dummy fill adjustment. As such, the dummy fill system may prompt the user to either select fill type (grounded or floating), size and shape of fill patterns from a library or alternatively, the sizing algorithm, automatically chooses the fill structure based upon dummy fill rules.

f. Hierarchical Dummy Fill Cells and Cell Placement

For process uniformity (e.g. CMP and ECD) as well as electrical effects (e.g. minimizing capacitive coupling across interconnect), dummy fill regions typically contain several small objects. The disadvantage of placing several dummy fill objects on a chip is that the file size can increase significantly. In our approach, instead of placing several small dummy fill objects across the chip, cells are of various sizes are created. This method requires the extra overhead of generating a cell library. However, once a cell library is generated, the only increase in file size resulting from the addition of dummy fill is in cell placement. Additionally, the overhead in generating the cell library can be reduced by creating the cells hierarchically. Although not required, this method is highly preferred for computational and storage efficiency. This method is performed during the placement of cells within the layout, 34-2.

Figure 22A:
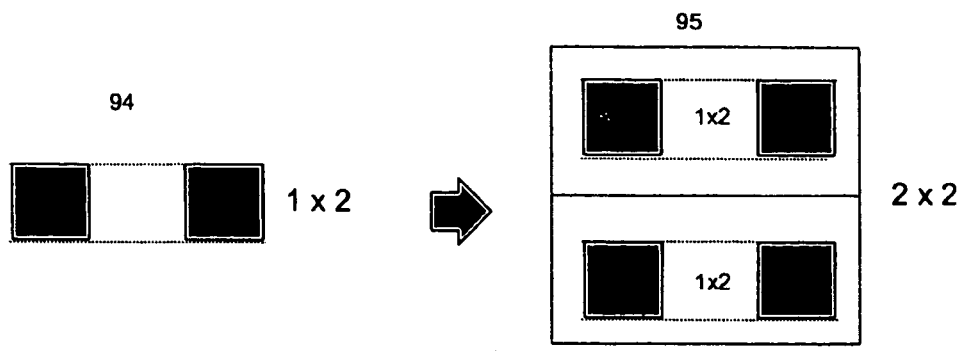
FIG. 22A illustrates how a 1×2 cell can be used to generate a 2×4 cell.
Figure 22B:
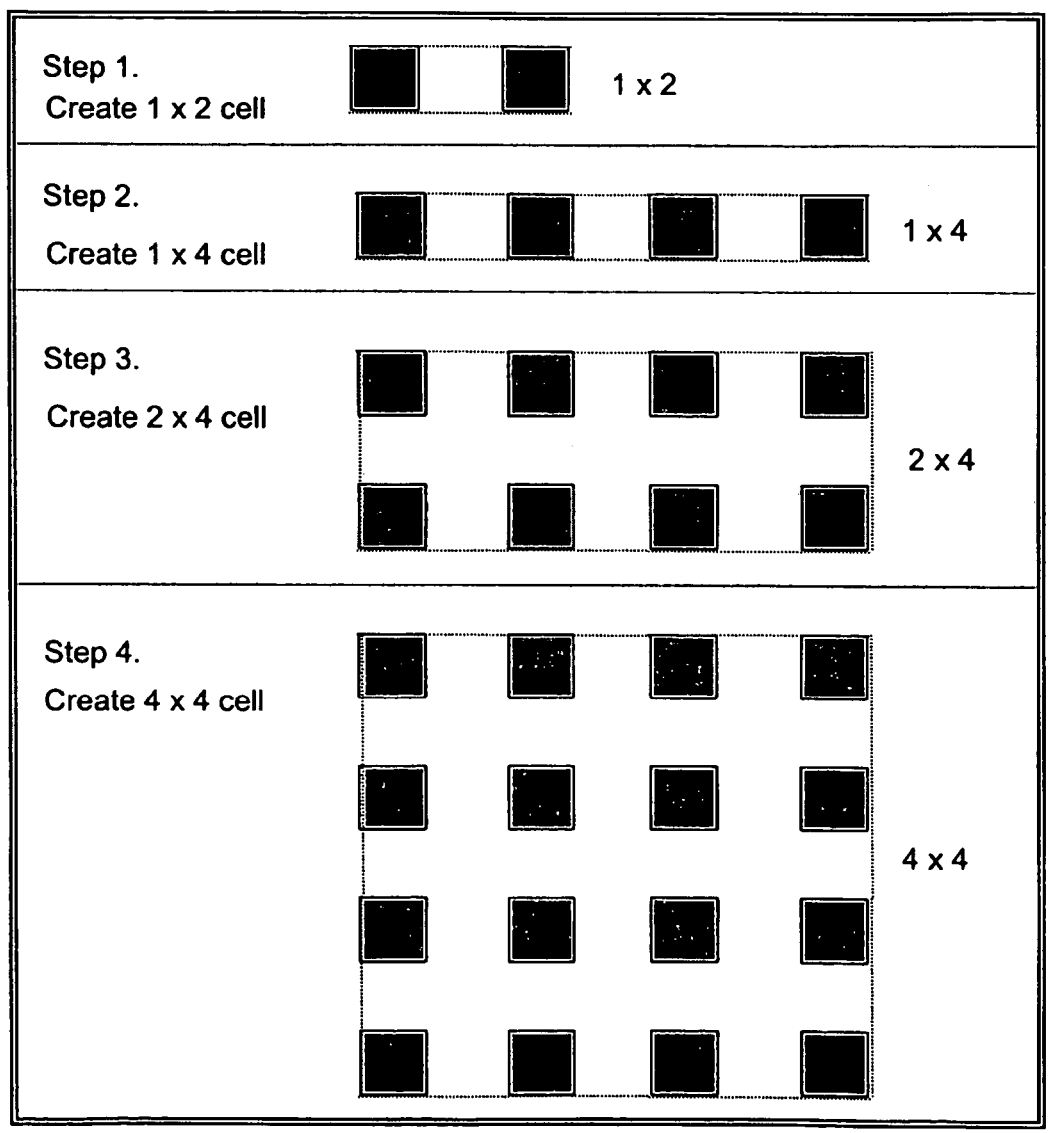
FIG. 22B illustrates how a 1×2 cell can be used to generate a 4×4 cell.

FIG. 22A shows a cell that contains two dummy fill objects of size 1 μm×1 μm separated by a space of 1 μm, 94. Since this cell has one row and two columns, it is referred to as a cell of size 1×2. To create a cell of size 2×2, another 1×2 cell is placed on top of the existing 1×2 cell to create a new cell, 95. Similarly, a cell of size 4×4 can be formed by the following steps (shown in FIG. 22B):

Step 1. Create a cell of size 1×2, 96

Step 2. Place another cell of size 1×2 to the right of the original to create a 1×4 cell Step 3. Place another cell of size 1×4 on top of the existing 1×4 cell (2×4 cell created)

Step 4. Place another cell of size 2×4 on top of existing 2×4 cell (4×4 cell created)

The cells are created hierarchically, so that starting with the top level cell (4×4 cell in this case) and descending though each level of the hierarchy results in smaller cells. This occurs until the final cell is reached, which contains the actual dummy fill structures. The advantage of this approach is that the file size used to store the dummy fill information is significantly reduced, especially in large empty areas where dummy fill is added. Rather than storing the coordinates of each dummy fill structure, only the cell size and cell coordinates need to be stored.

The hierarchical method results in a large reduction in file size, as well as a much faster time to read the file in a layout editor. For comparison, let one unit represent the amount of memory it takes to store the coordinates of a single dummy fill object or cell. The amount of memory required is about the same as for a single object since they both require the same amount of information:

For a single dummy fill object: bounding box coordinates $(x_1, y_1; x_2, y_2)$

For a cell: lower left coordinates $(x_1, y_1;$ cell size m×n)

If the cells are placed hierarchically, a 4×4 cell will require 8 units of information, as illustrated in FIG. 23. In this example, each 4×4 cell consists of two 2×4 cells, 96, each 2×4 cell consists of two 1×4 cells, 97, each 1×4 cell consists of two 1×2 cells, 98 and each 1×2 cell consists of two individual cells, 99. The total cells or objects required for the 4×4 cell is computed to be 8 units of information. For a non-hierarchical approach, the 16 individual cells would require 16 objects to describe the four bounding box coordinates for each individual cell.

In general, the amount of savings by using the hierarchical approach increases as the cell size (i.e. the area available for dummy fill) grows. The amount of storage required for an n×n cell without using the hierarchical approach is $n^2 \cdot 4$, where there are four coordinates used to specify each fill object. With the hierarchical method used in this dummy fill system, the amount of storage required is linear with n. In general, the amount of storage required for an m×n cell is always linear with n (or m), and is equal to 4 (the amount needed to represent a single cell) if m and n are powers of 2.

Figure 24:
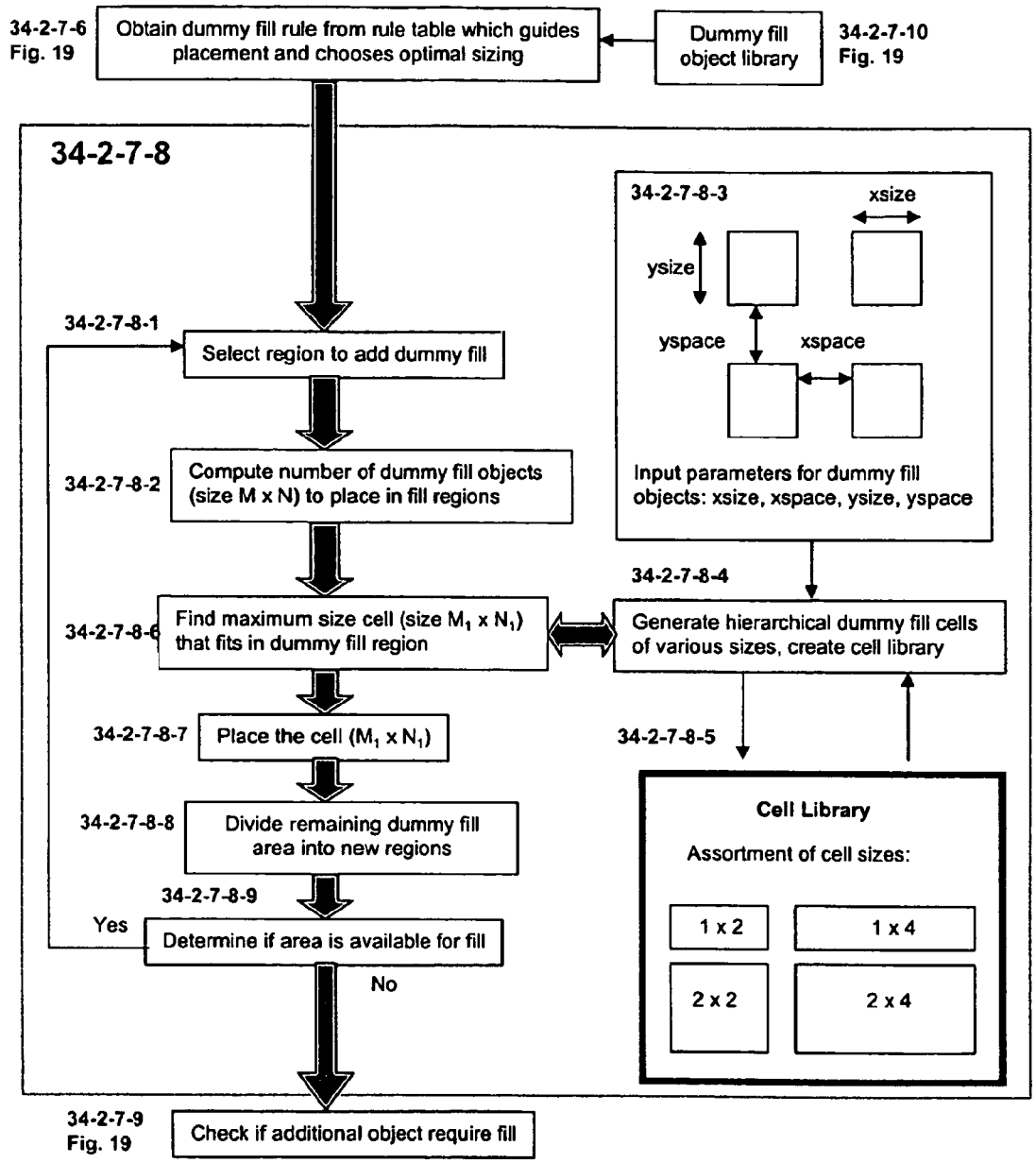
FIG. 24 describes the flow of steps used to create a cell hierarchy

A flow diagram describing step-by-step details of the aggregation and placement of hierarchical dummy fill cells is provided in FIG. 24. The dummy fill rule table, 44-2-7-6 and fill object library, 34-2-7-10, are input into the placement algorithm. Each dummy fill region is selected, 34-2-7-8-1, and a computation is performed to determine the number of dummy fill objects of a given size that can be placed within the fill region, 34-2-7-8-2. The input parameters, 34-2-7-8-3, that define dummy fill parameters are used to generate, 34-2-7-8-4, a dummy fill cell library, 34-2-7-8-5, of various size cells that is made available to the cell placement algorithm, 34-2-7-8-6, that selects the largest size cell that fills the selected region and places it, 34-2-7-8-7. The remaining dummy fill area is divided into new regions, 34-2-7-8-8, and the algorithm determines if there is area still available for fill, 34-2-7-8-9. If yes, then a new region is selected, 34-2-7-8-1, and the cell placement process repeated. If no, then dummy fill cell placement is complete and a check is done if additional objects require fill, 34-2-7-9, FIG. 19.

g. Applications

The dummy fill methods described in this process are most applicable to polishing and electrochemical deposition processes where maintaining a certain level of film thickness uniformity is critical.

Dummy fill insertion may be used in conjunction with damascene process flows to improve film thickness uniformity for bulk copper fill using electrochemical deposition (ECD) and chemical mechanical polishing (CMP) where the two processes are used together during the creation of one or more interconnect levels. Pattern dependent models of ECD and CMP may be used to characterize multi-level effects between adjacent interconnect levels. This application to damascene process flows may be used over a network (internet, extranet or intranet) or as a web service to provide any of the following functionality:

layout extraction,
pattern dependent model calibration and prediction,
dummy fill sizing and placement into IC designs,
film thickness uniformity optimization and
electrical impact minimization with the intent to improve film thickness uniformity or electrical performance for either a ECD or CMP process or a process flow that includes both.

In the application to damascene process flows, ECD and CMP process steps are calibrated using the methods illustrated in FIG. 14. A new IC layout is extracted using the steps and flow shown in FIG. 9 and described in section b. Calibration occurs as described in FIG. 14 for each process. The calibrated models are assembled as a process flow and used to predict the step-by-step and final film thickness uniformity using the steps described in FIG. 15 and in section c. The results are examined in comparison with desired film thickness and electrical properties using either a table-lookup and threshold check or using a cost function, as described in section d. The dummy fill algorithm is applied using the steps shown in FIG. 16 through FIG. 24 and described in sections e. and f. This approach could be used to add dummy fill for each level, separately, to minimize film thickness non-uniformity or variation in electrical parameters such as resistance, sheet resistance, voltage drop, drive current loss, dielectric constant or capacitance. This approach could also be used with multi-level models, that include interaction between layers, to generate a single dummy fill strategy for multiple interconnect levels.

For 130 nm, 100 nm and 65 nm technology nodes, dummy fill methods may also be applied to new processes to better enable process integration and improve film thickness uniformity. Most conventional bulk copper fill is done using electrochemical deposition where various chemical schemes that use additives, such as accelerators, leveler or suppressors, are used to improve planarity of metal film. Equipment makers are also looking to mechanical approaches to improve uniformity. NuTool has proposed such an approach that rotates the wafer and uses a pad to introduce the electroplating solution. An advantage of this contact plating technology is that the plated Cu film may be both locally and globally planarized. Another advantage is that this approach results in a thinner overburden of Cu that reduces the amount of CMP required in the next process step.

Dummy fill materials may be used in conjunction with an electrochemical mechanical deposition (ECMD) process to improve film thickness uniformity across the full-chip. Dummy fill methods may be used with ECMD processes, including that described in, by calibrating a full-chip ECMD model, using the flow described in FIG. 14, and inserting the model into the process flow, 33-1, to acquire full-chip predictions, FIG. 15. Improvements in film thickness uniformity, dishing and erosion could be achieved using the dummy fill methodology with an ECMD model developed by NuTool, internally or by some other third party.

This application may utilize network (internet, extranet or intranet) based applications and web services to provide any of the following functionality:
  layout extraction,
  pattern dependent model calibration and prediction,
  dummy fill sizing and placement into IC designs,
  film thickness uniformity optimization and
  electrical performance optimization
with the intent to improve film thickness uniformity for ECMD processes.

There are several challenges for introducing low-k dielectrics into a damascene process flow. It not only difficult to create a quality low-k film but also to maintain the dielectric constant after all the integration steps such as etch stop layers and barrier caps on copper and CMP stop layers. Many low-k yield problems are related to copper CMP where the softness of the low-k films results in CMP damage, dishing and erosion and subsequent electrical defects.

Dummy fill materials may be inserted in low-k films to adapt structural properties of these films with the intent of achieving a desired effective dielectric constant and reducing capacitance spatially across the full-chip when integrated into an interconnect process flow. Pattern dependencies may be characterized relative to changes in the effective dielectric constant (including the use of wafer-state models and electrical parameters). Test wafers may be used to develop full-chip models to predict variation in effective dielectric constant as a function of film thickness uniformity, dishing or erosion. Characterizations of pattern dependencies may be used to automatically add dummy fill directly into low-k films to minimize the variation in effective dielectric constant when low-k materials are used in interconnect levels. This application may utilize network (internet, extranet or intranet) based applications or access and use web services to provide or integrate any of the following functionality:
  layout extraction,
  pattern dependent model calibration and prediction,
  dummy fill sizing and placement into IC designs,
  film thickness uniformity optimization and
  electrical performance optimization
with the intent to improve the structural properties of low-k films and the development and integration of process steps using low-k dielectric films.

Figure 25:
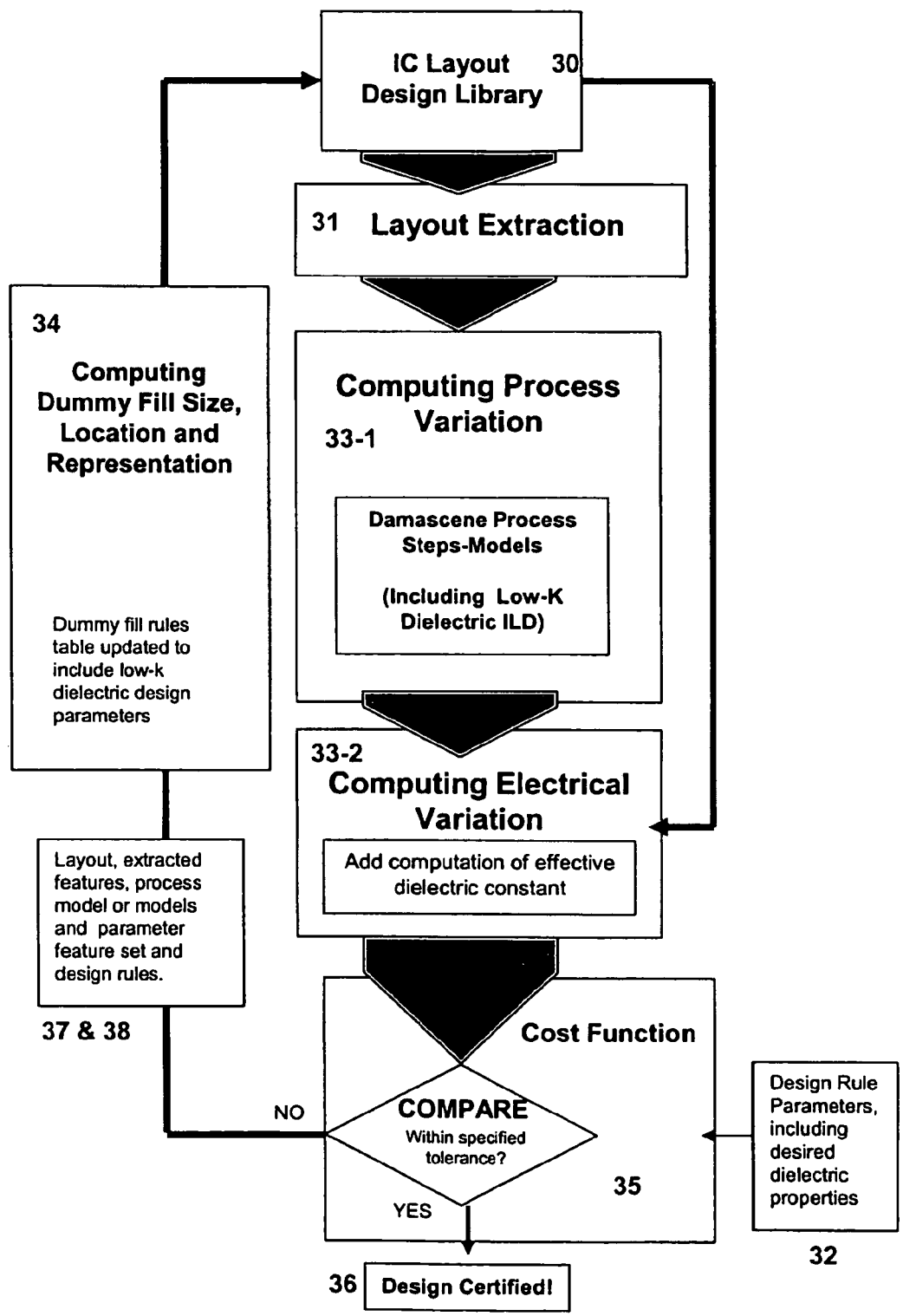
FIG. 25 describes modifications to the dummy fill method described in FIG. 7 to use dummy fill methods with low-k dielectric films.

This application may be used in conjunction with the dummy fill method to alter the physical, structural and electrical properties of low-k dielectric films to facilitate planarization using CMP, as performed in damascene processes and as illustrated in FIG. 25. The steps for introducing low-k films into a process flow are very similar to the general method described in FIG. 7. This application would require the calibration, 34, of models for ECD or ECMD and CMP for use with low-k dielectric films, as outlined in FIG. 14. This application also requires adapting the electrical models, 33-2, to include computation of the variation in the effective dielectric constant across the chip. The desired effective dielectric constant data along with other design rule parameters, 32, could be input into the cost function to direct dummy fill strategies that optimize the electrical properties of the low-k film, while improving film thickness uniformity at the conclusion of the damascene process.

h. Construction and Operation

The components that comprise the method are constructed in software (e.g. Java, Tcl, Basic, SQL) and modularized such that the method may or may not use all the components in the placement of dummy fill. For example, the dummy fill library may consist of only one type of dummy fill object and the automated dummy fill algorithm may not require an electrical model or simulation to optimally place dummy fill with regard to reducing process variation. The following descriptions will attempt to provide the general computational framework for the dummy fill methods.

Figure 26:
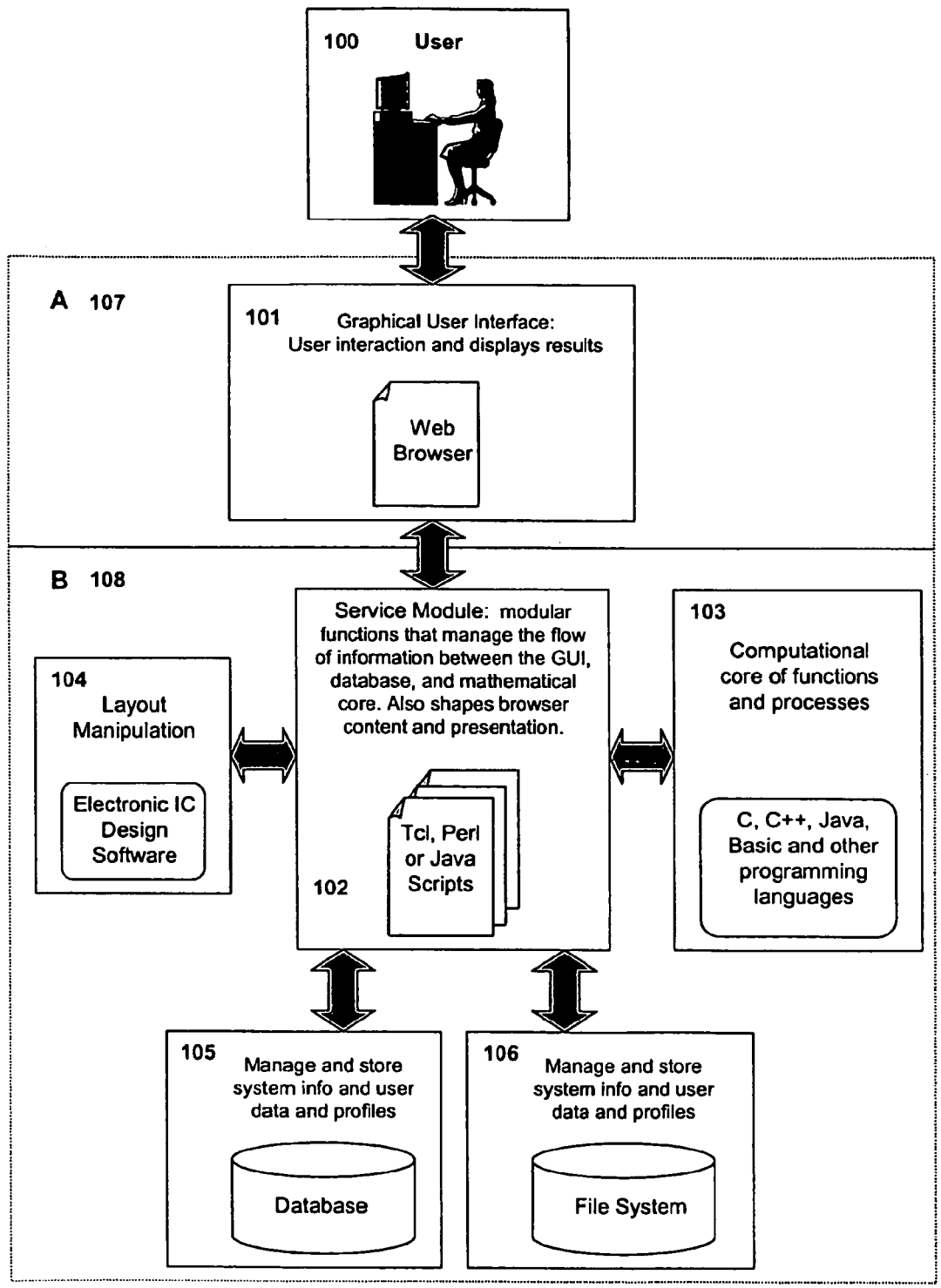
FIG. 26 illustrates the computation architecture used to implement the dummy fill methods, also referred to as the dummy fill system.

FIG. 26 provides the preferred software architecture used to construct the dummy fill method and is described in the following paragraphs. The user, 100, communicates to the system through a graphical user interface (GUI) 101, such as a web browser. The GUI, 101, allows the user to choose and upload electronic layout design files into the dummy fill system.

In general the GUI, as defined and used throughout this section, allows the user to choose, upload or transfer from another form of electronic media, the desired design rules and electrical performance for the particular device described by the design files. The user may also use the interface to select process and electrical models from a server or transfer or load models from another electronic media source or computer. The user may also use the interface to select dummy fill shapes, sizes and patterns from a dummy fill object library residing on the server or transfer or load models from another electronic media source or computer. The user may also use the interface to review the results of dummy fill adjustments to the layout and/or view the resulting full-chip layout spatial densities, predicted process film thickness and/or electrical parameters. These results may be in the form of:

- histograms and other statistical plots,
- full-chip images of wafer-state or electrical parameters at some point in time,
- movies of full-chip film thickness, dishing, erosion progression during a process step or flow,
- movies of full-chip electrical parameter variation such as sheet resistance and capacitance,
- and tables of values.

The GUI 101 communicates with a series of software components, services or functions 102 (referred to here as the service module) that manage the flow of information throughout the system to the database, 105, file system, 105, and computational core processes, 103, as well. The services, 102, are modular in nature and serve to initiate the computational core processes, 103, that execute portions of the algorithm and to assemble and format the content for display in the GUI. Useful embodiments of these components are as Java or Tcl scripts which enable easier interaction with the database using embedded SQL code and with the GUI using HTML, XML or dynamic HTML interpretation. These components also allow the ability to initiate mathematical processes that perform the computation necessary to determine the correct placement of dummy fill within the layout.

The service model, 102, communicates with the computational core of processes and functions, 103, that execute the dummy fill algorithms and heavy computational processes such as the process and electrical models and simulations. This core does also does the effective pattern density computation. This communication may include instructions, data, model parameters, prediction results in tabular, image or movie forms and pointers to files in the file system.

The service module, 102, also communicates with electronic IC design software, 104, to manipulate layout information such as the location and coordinates of design objects and determine where to place the dummy fill cells.

The database, 105, communicates with the service module, 102, via SQL commands to manage system data such as dummy fill library objects, user profiles that specify permissions and preferred content and presentation, user data which may include layout extraction data, prior layout design files, model parameters for particular tools and processes and full-chip prediction results such as surface topology, resistance and capacitance. Examples of databases that may be used include Oracle, Informix, Access, SQL Server and FoxPro.

The file system, 106, communicates with all the components 101, 102, 103, 104 and 105 to retrieve and store information saved as files.

If the functionality shown in boxes A, 107, and B, 108, resides on one computer then the system is configured as stand-alone. If A and B reside on different computers and communicate across a network, the system is normally considered a client-server configuration.

Figure 27A:
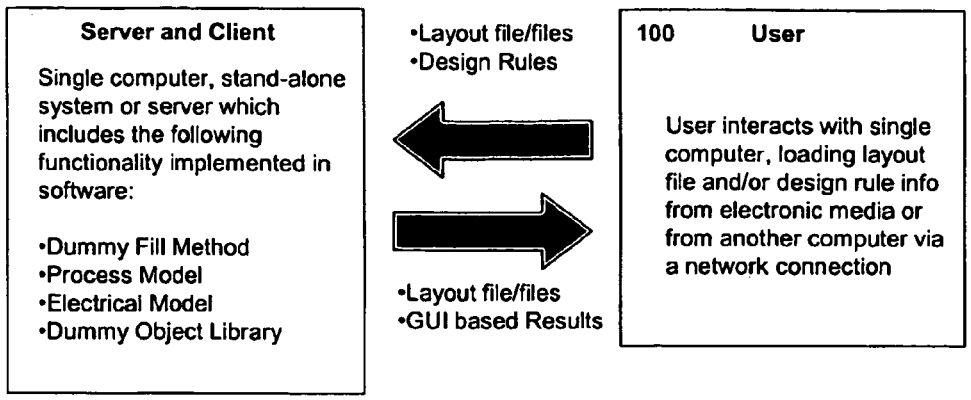
FIG. 27A illustrates a stand-alone implementation where the dummy fill system resides on one computer.

The intent in this section is to not describe all possible instantiations of the dummy fill method but provide a few preferred operational frameworks. There are three basic computational frameworks described in this section that constitute preferred methods of operation and delivery of the functionality based upon a user's needs. The first framework presented is a stand-alone configuration, shown in FIG. 27A, where all the components (101-106 of FIG. 13) reside in 109 and are accessed from a single computer. The second framework is a client-server configuration, shown in FIG. 27B, where the GUI (101 of FIG. 37) resides on a client computer which accesses, via a network, 111, the other components (102-106) residing on a server or multiple servers, a server farm, 110. The communication could be done via internet, intranet or extranet networks, 111, and the server may serve one or more clients or users.

Figure 28:
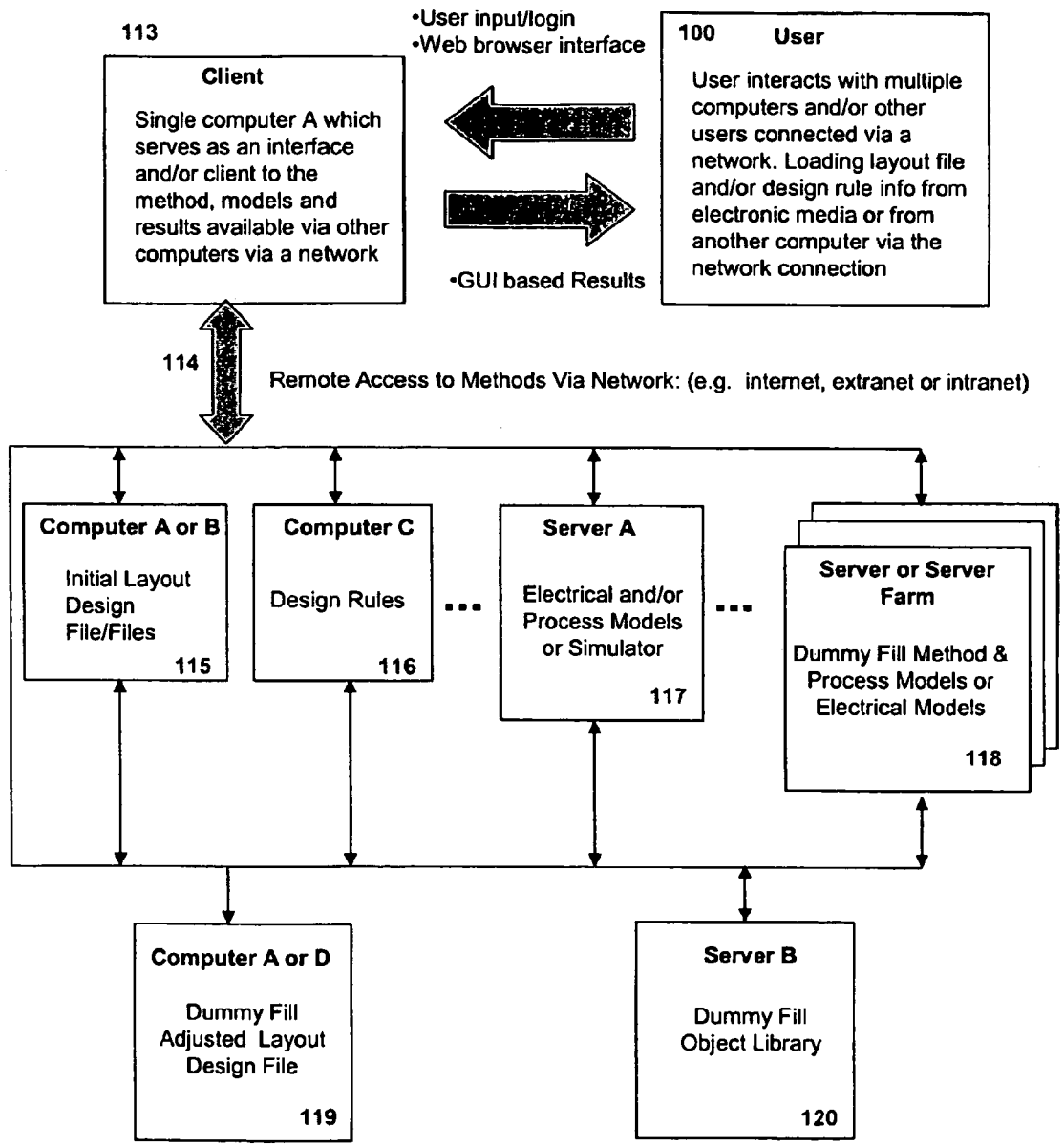
FIG. 28 illustrates the extension of the client-server implementation to include external components across a network.

The third framework, FIG. 28, is an extension of the client-server model that includes communication via a network, 114, with additional computers that may contain one of more components (115-120) of the system. For example, a design house may utilize the dummy fill method via the server, 118, but remotely utilize a separate computer which houses process models or model parameters, 117, that are provided by a foundry where manufacturing may be outsourced. This framework also includes the use of third-party electrical models and simulations, 117, linked to the dummy fill method residing on a server or server farm, ref, 118, via a network connection, 114.

Figure 27B:
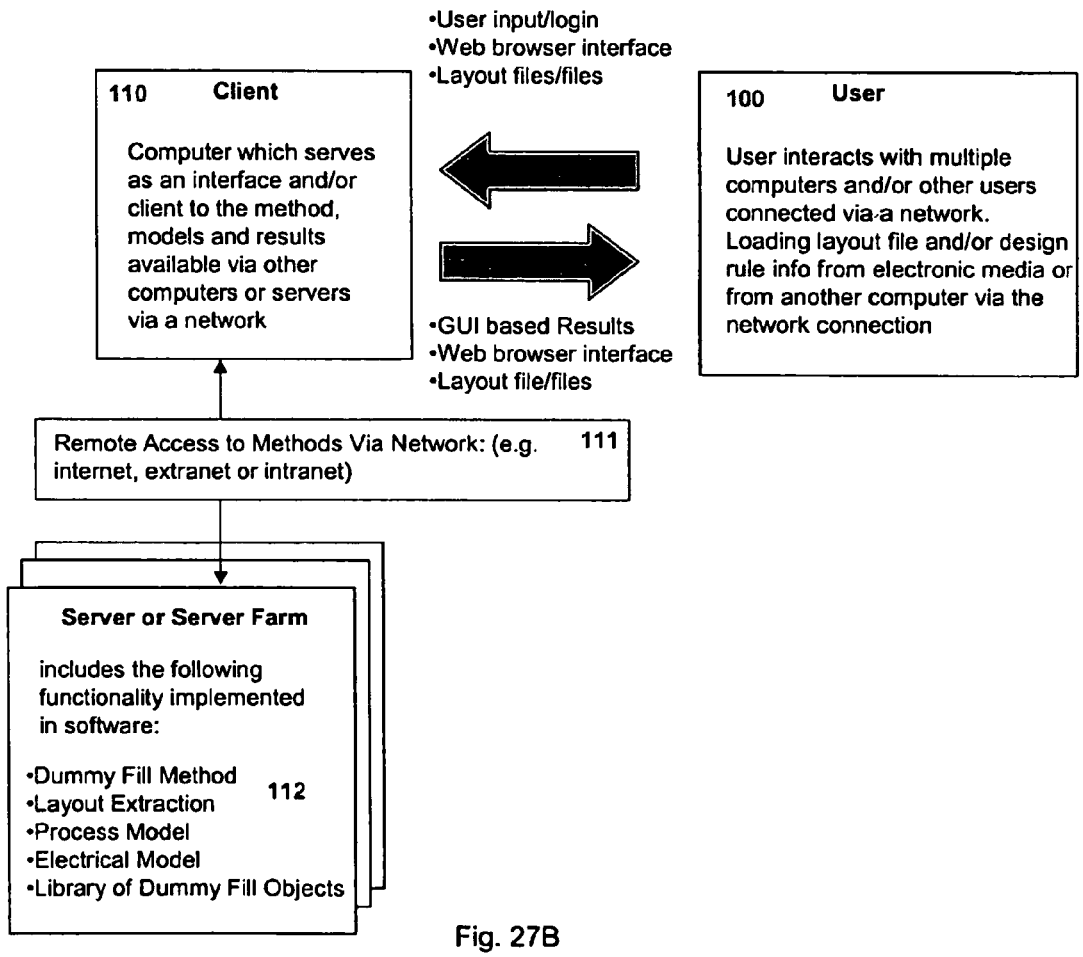
FIG. 27B illustrates a client-server implementation of the dummy fill system.

To scale the dummy fill methods to serve a large client base located throughout the world, dummy fill services may be delivered via the web using the client-server framework described in FIGS. 27B and 28. In this operational framework, the dummy fill methods and functionality are developed as web services that are accessible through any web browser, located anywhere in the world that has internet access.

Figure 29:
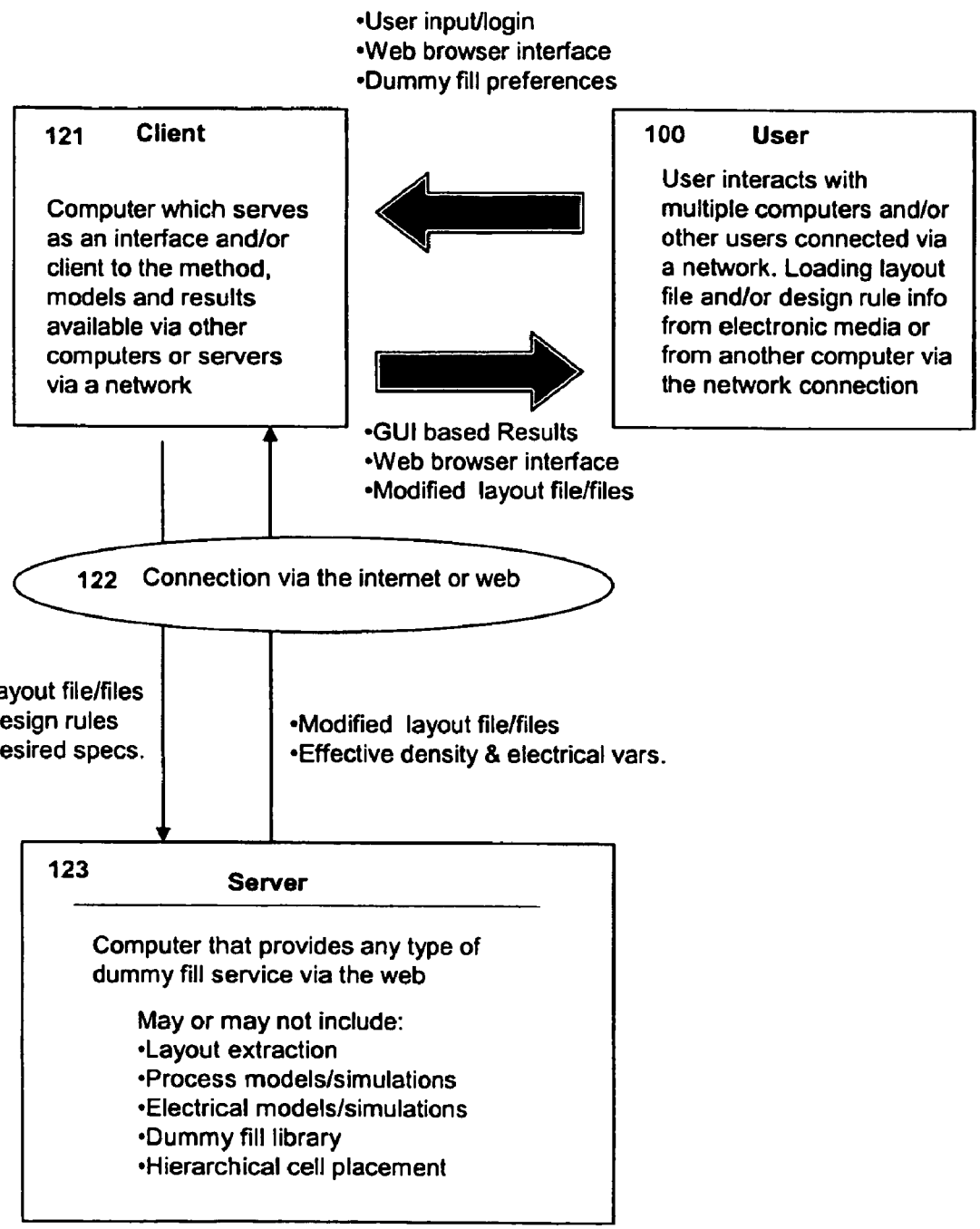
FIG. 29 illustrates a general client-server dummy fill framework that uses the internet, extranet or intranet.

The general architecture, shown in FIG. 29, may be used with any dummy fill approach where dummy fill services are provided via the web. In this framework the user, 100, through a client computer, 121, accesses a server computer or server farm, 123, which performs the dummy fill operation over a network (e.g. intranet, extranet or internet), 122. Using the web or a network connection, 122, the client, 121, uploads or transfers the layout file or files to the server, 123, and may also transfer design rule and other preferences to be used by the dummy fill system on the server. The dummy fill system, 123, processes the layout information, places dummy fill objects and returns the layout file to the user, 100, via the web or network connection, 122.

A useful embodiment of this framework is to provide the dummy fill functionality in the form of web services. A web service is an object that exists as a function, content or a process that may interact with a web-browser, database or other services. The web service architecture is preferred in that it enables each dummy fill function and the content that is returned to the user to be modularly created and assembled and tailored to the user's needs and it allows the method to be more easily scaled to a larger user base. Another benefit is that web services provided by third-parties may be automatically accessed and integrated into the dummy fill web application. Another benefit of this embodiment is that development of software-based services via the web allows the dummy fill algorithms to be scaled and supported efficiently for world wide use.

The preferred form of these web services is as Java, Tcl or SQL based software programs that communicate with a SQL enabled database and a core of mathematical programs to manipulate the layout information and determine the proper dummy fill functions. These services specify or publish what input parameters are required, which are optional and what parameters and data are provided in return. The system integrates these services according to the user's permissions and the functionality required.

Figure 30:
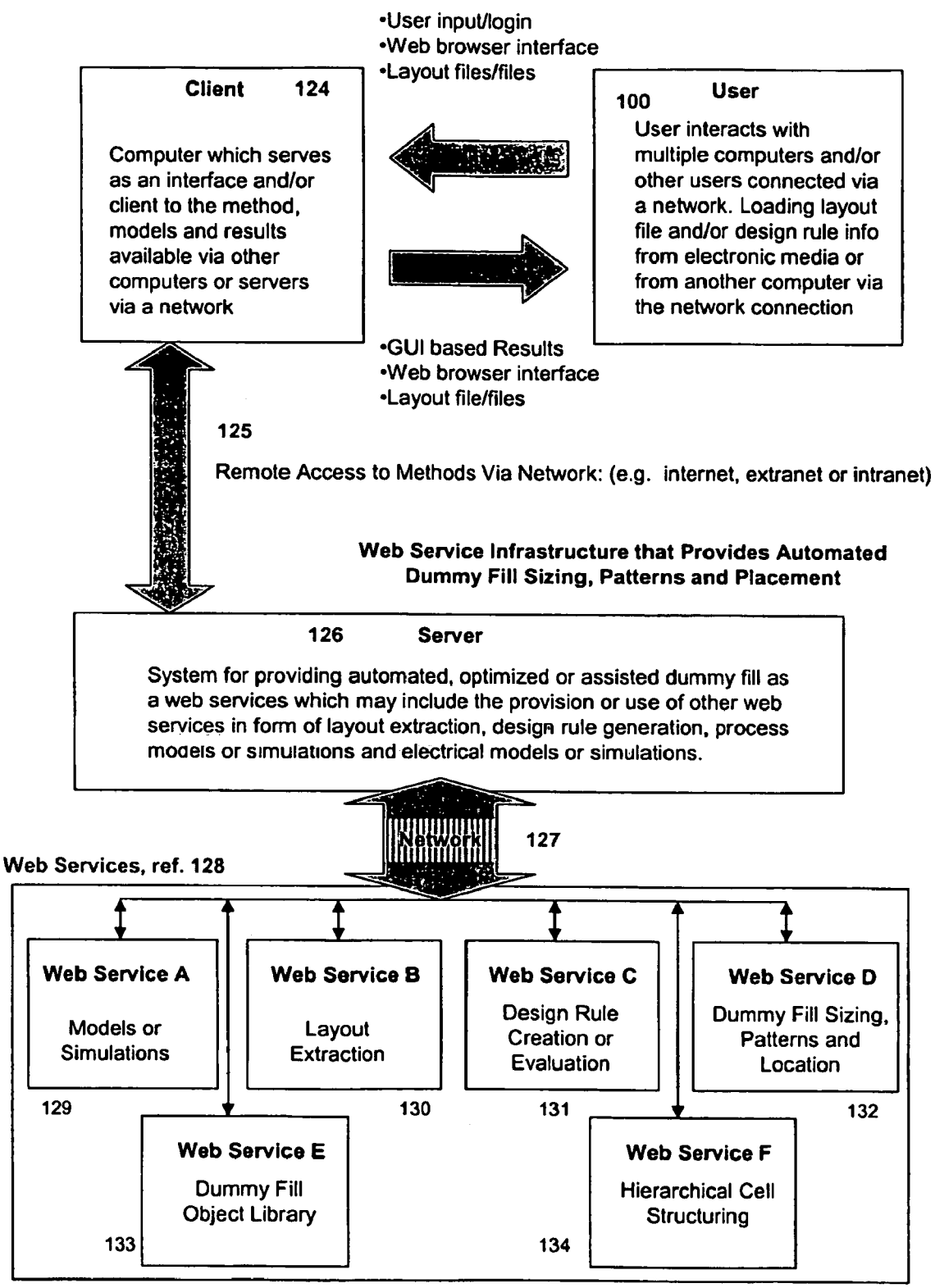
FIG. 30 illustrates the preferred computational framework for the dummy fill system using a client-server framework with web services.

A useful embodiment for dummy fill system is shown in FIG. 30. The user, 100, working through a web browser based GUI on a local client, 124, communicates to the server, 126, via a network (e.g. internet, intranet, extranet), 125. Functionality provided by the dummy fill methods exists as modular and configurable web services, 128. The dummy fill web services, 128, may reside in the service module, shown in 102 of FIG. 26, and may be built on a web application platform provided by a third-party, such as those provided by IBM, Microsoft, ARSDigita or BEA. The server, 127, will likely include web services to manage user, 100, and the user's company profiles and permissions to tailor the content and functionality available to the particular user logged in. Some of the web services may be assembled from elsewhere across a network and may be published services by third-parties, that are assembled by a central web server or server farm, 127. Some of the components that may exist as web services are process models and simulations, electrical models and simulations (129), layout extraction (130), hierarchical cell placement (134), dummy fill sizing and placement (132), dummy fill object libraries (133) and design rule creation, modification or publication (131). The server, 126, allows the user, 100, to build their own web based dummy fill application tailored to a particular problem or use, through the use of a wizard that prompts the user with questions and then assembles the proper services from 128. Such uses of these services, 128, may also be provided over trial-periods at a discount or no-cost fee.

Figure 31:
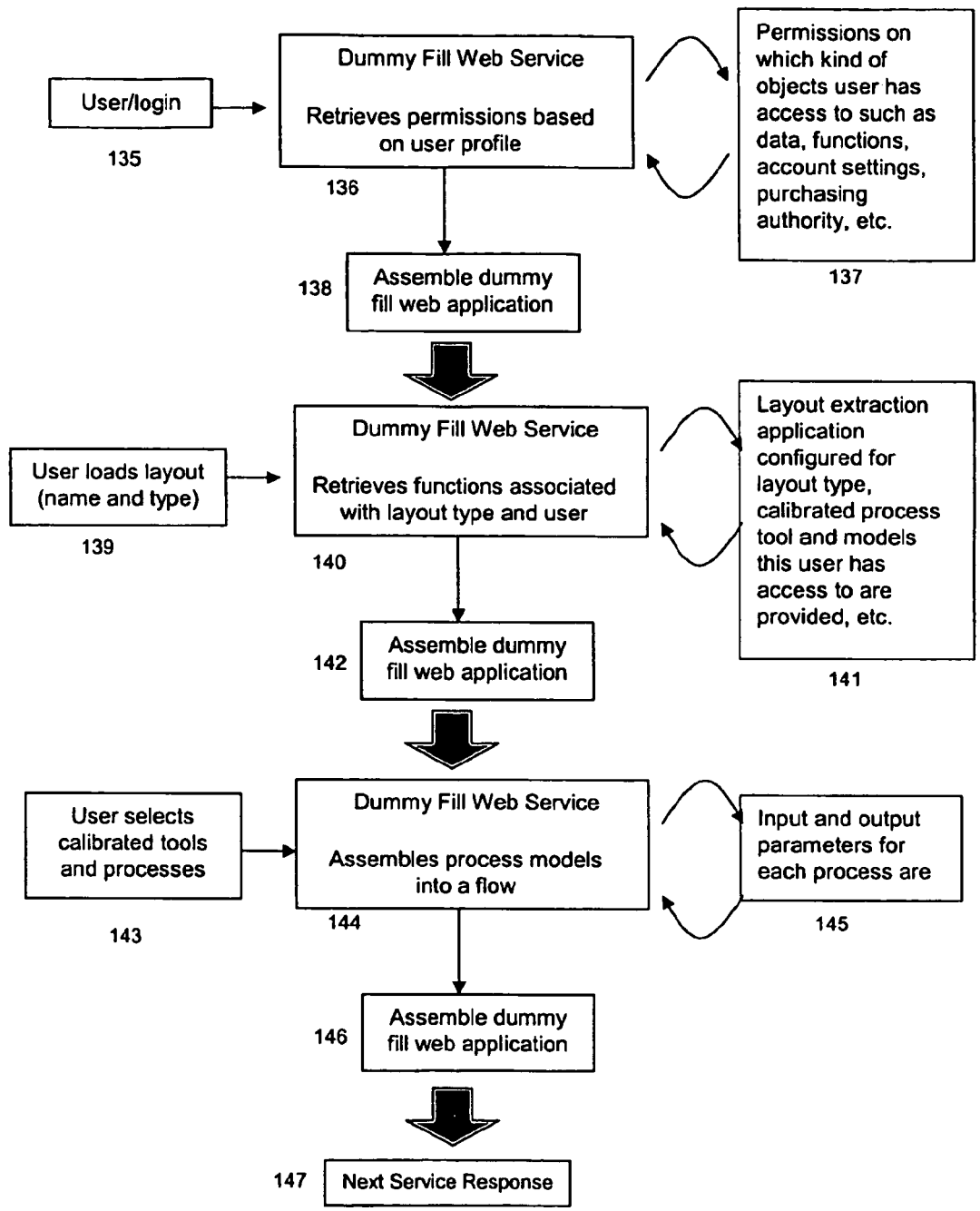
FIG. 31 illustrates how web services may be used to dynamically build a dummy fill web applications tailored to a particular user.

A meta-service or complete web-based application can be assembled from a number of smaller services (or functions) according to the user's needs. This is why it is often beneficial to create very modular web services that promote flexibility in the type of dummy fill application that is assembled. FIG. 31 illustrates how the service module in 102, may be used to tailor, configure and assemble a web-based dummy fill web application. A user from a particular company logs in, 135, and a service script, 136, checks to see what permissions, 137, this user has with regard to objects within the system such as: layout, tool and measurement data, dummy fill functions, purchasing authority. These permissions are used to initiate creation of the dummy fill web application, 138. The service module continually acts on input from the user, as they use the system. If that same user loads a particular layout, 139, the service script, 140, retrieves all the functions and objects associated with that type of layout as well as the calibrated process tool and models and recipes this user may have access to, 141. The service script assembles links to these permitted objects into the dummy fill web application, 142. The same user may select one or more of those process tools and recipes to create a process flow, 143. The service script, 144, then retrieves the correct calibrated models and assembles those models into a process flow, 145. The process flow then becomes part of the dummy fill web application, 146. This interaction continues as the user submits requests to the server and a service responds, 147.

Figure 32:
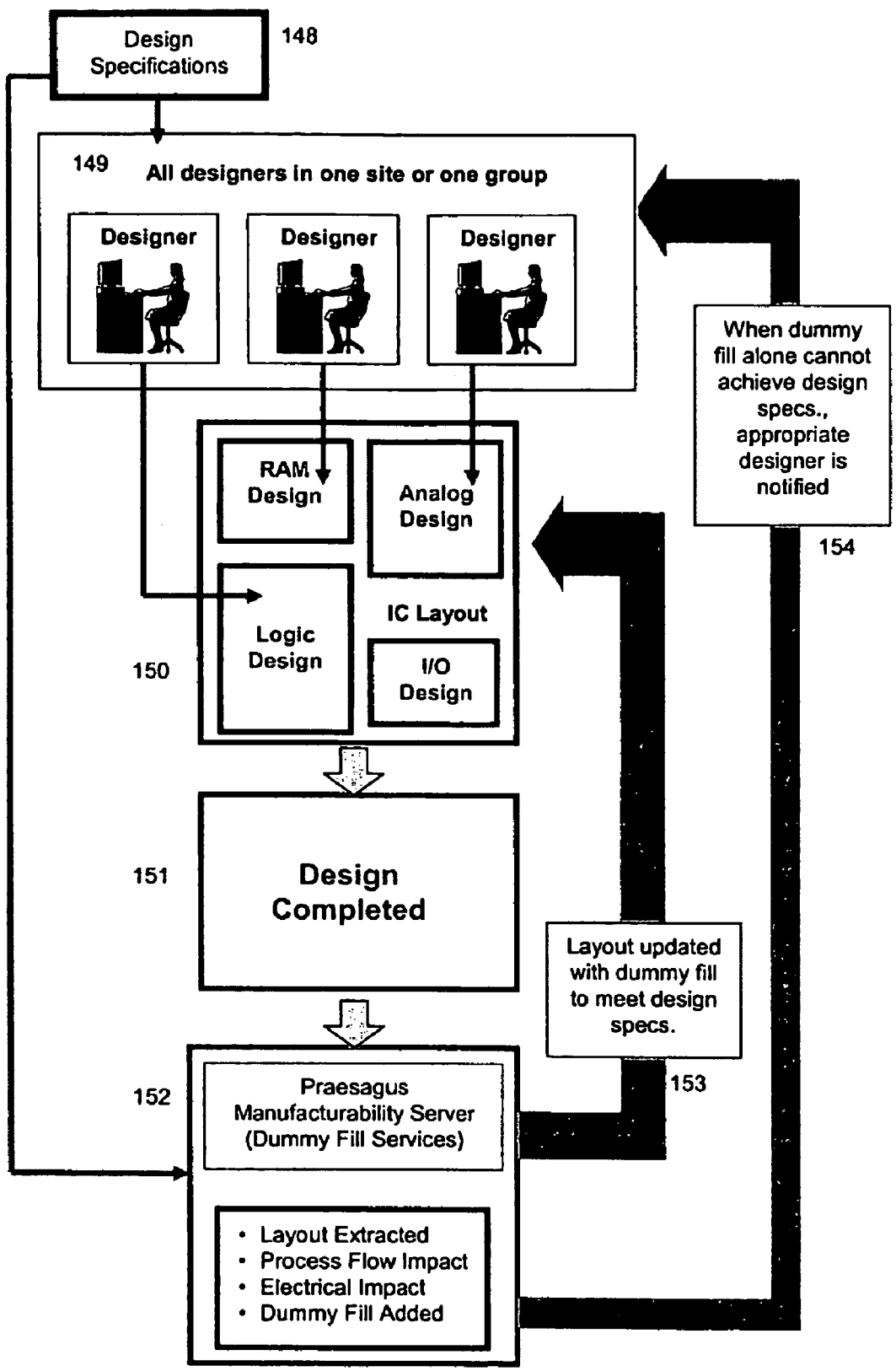
FIG. 32 illustrates series operation of the dummy fill system where all of the IC components are added to a particular layout before it is submitted to the dummy fill system.

The dummy fill methods and system may be used by designers in a series fashion, as after all components are placed in the layout. In this operation or use, shown in FIG. 32, design specifications and rules, 148, are submitted to designers, 149. The designers design and place their components, 150, resulting in a completed layout, 151. The completed IC design, 151, is uploaded to the server, 152, and the dummy fill methods & system modifies the IC layout to the design specifications returning it to the design group, 153. If there are no dummy fill strategies that can meet design specifications, the designers are notified, 154. This configuration could be used by a fab or foundry to provide dummy fill services and/or certify the manufacturability of layouts submitted by design houses.

Figure 33:
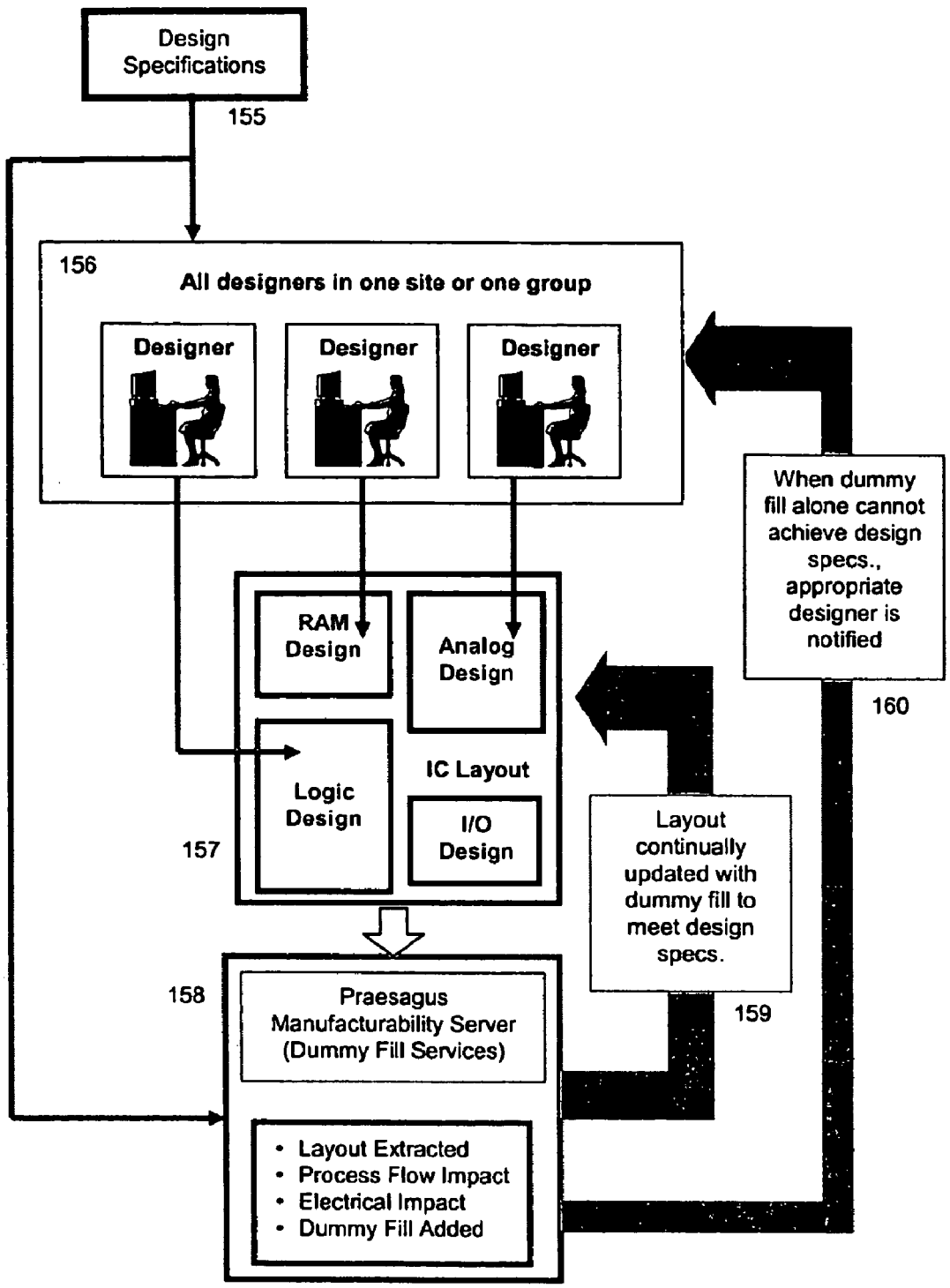
FIG. 33 illustrates real-time use of the dummy fill system to analyze and place dummy fill as components are added to the layout.

The dummy fill methods and system may be used by designers in an iterative fashion, as each component is placed in the layout (this mode is also referred to as real-time). In FIG. 33, the design specifications, 155, are provided to the design group, 156. As the designers design and place each IC component, 157, the layout is uploaded to the server, 158, which operates on the layout as the designers place components, in real-time. To process the complete layout, even when only a few components have been placed, any non-placed component is assumed to meet the design specifications. As the dummy fill method modifies the layout it is certified to the design specifications and returned to the design team or electronically updates a central layout used by all designers in the group, 159. If the dummy fill method cannot determine a dummy fill strategy that meets the design criteria the design group is so noted.

The internet may allow for collaborative design among design groups in different companies, located across the world. The challenge is to ensure that all designers can meet the design specifications. In the case where design specifications are agreed to by all design groups, the system operates similar to FIG. 33—assuming non-placed components meet the design specifications and adding dummy fill appropriately if these components violate specs when placed. In the case where components designed under different design rules (such as licensed IP or designs) may be chosen, the dummy fill system can determine whether a dummy fill scheme exists to allow the pre-designed component to be integrated within a new design specification.

i. Results

Figure 34:
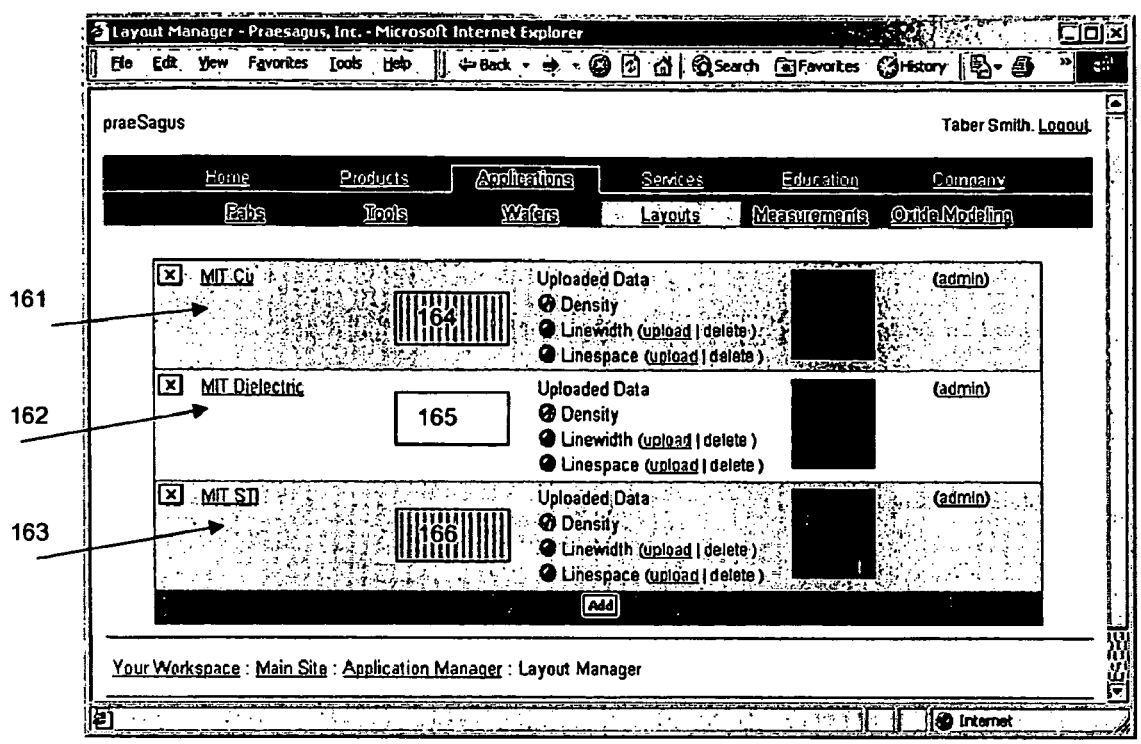
FIG. 34 provides a screenshot of the dummy fill system layout manager GUI, which manages a users layouts and layout extraction.

The dummy fill system described in this application has been implemented and the figures and test in this section describe some of our results. The graphical user interface (GUI) for the Layout Manager component, shown in FIG. 34, allows the user to upload a layout through a web browser and web services are automatically configured to add dummy fill for the appropriate processes and according to user defined design rules (also input through a similar GUI). The three designs, 161, 162 & 163, were processed using the layout extraction algorithm to compute effective density. Options are provided to the use to use our layout extraction methods to compute linewidth and linespace or to upload this information from another source, 164, 165 & 166.

Figure 35A:
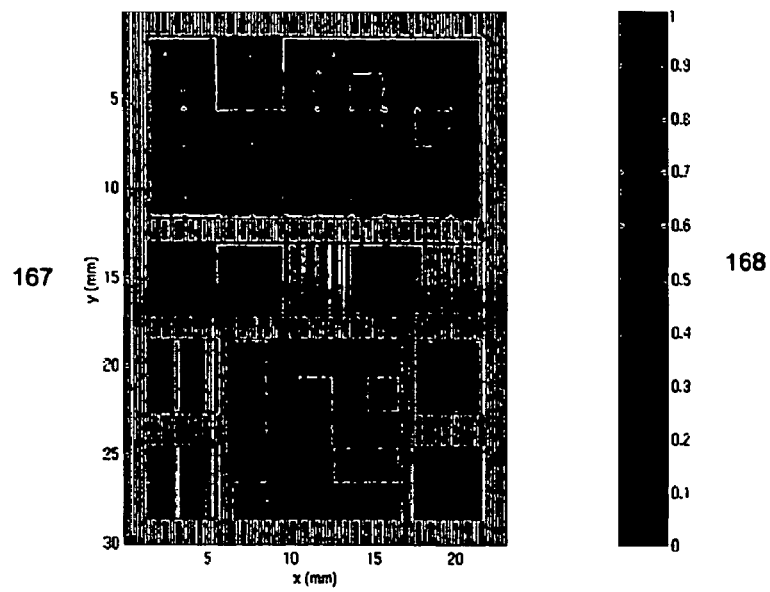
FIG. 35A provides the result of a density extraction using the dummy fill system.
Figure 35B:
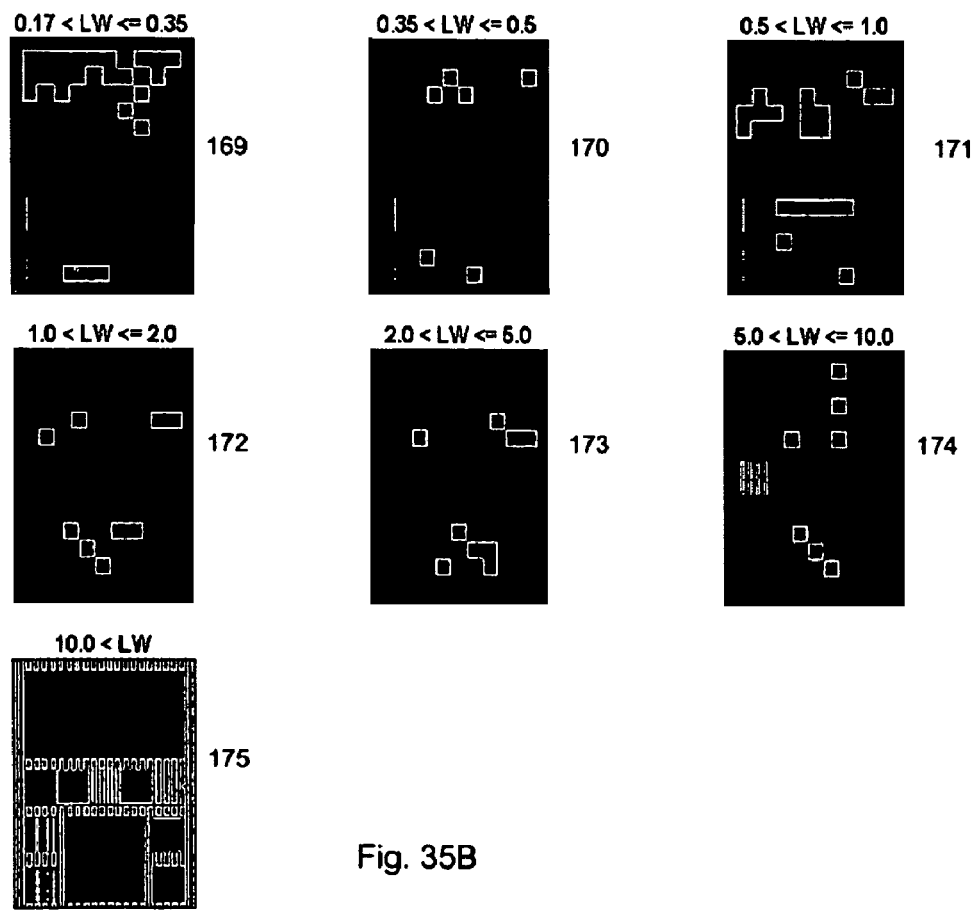
FIG. 35B provides the result of a linewidth extraction using the dummy fill system.

The results of a layout extraction using the system are shown in the images in FIG. 35. The spatial linewidths across the full-chip are shown according to which linewidth bin they fall into. This information is input into the models to predict process and electrical variation.

Figure 36A:
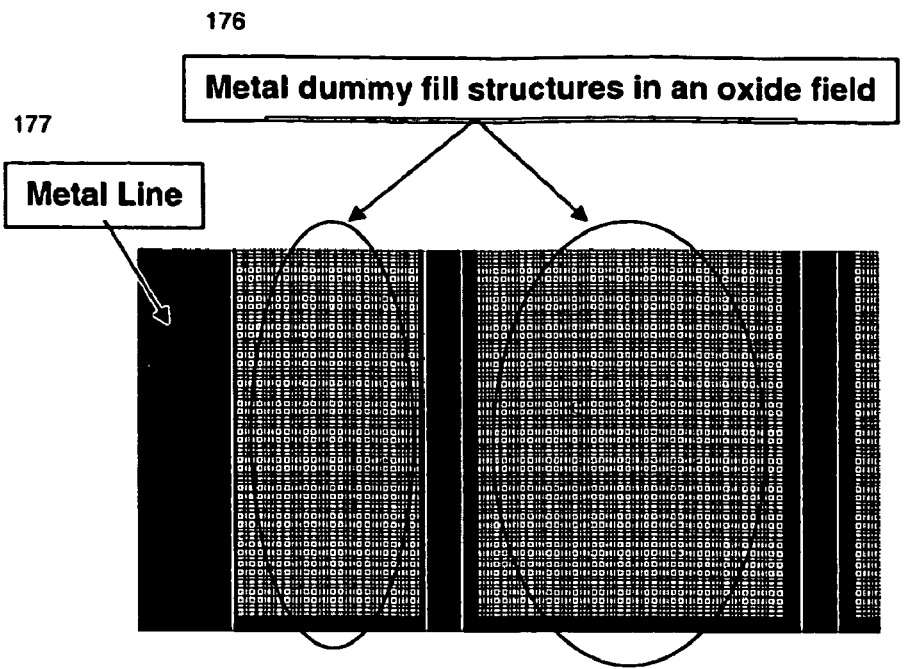
FIG. 36A provides the results of the dummy fill system for metal dummy fill.
Figure 36B:
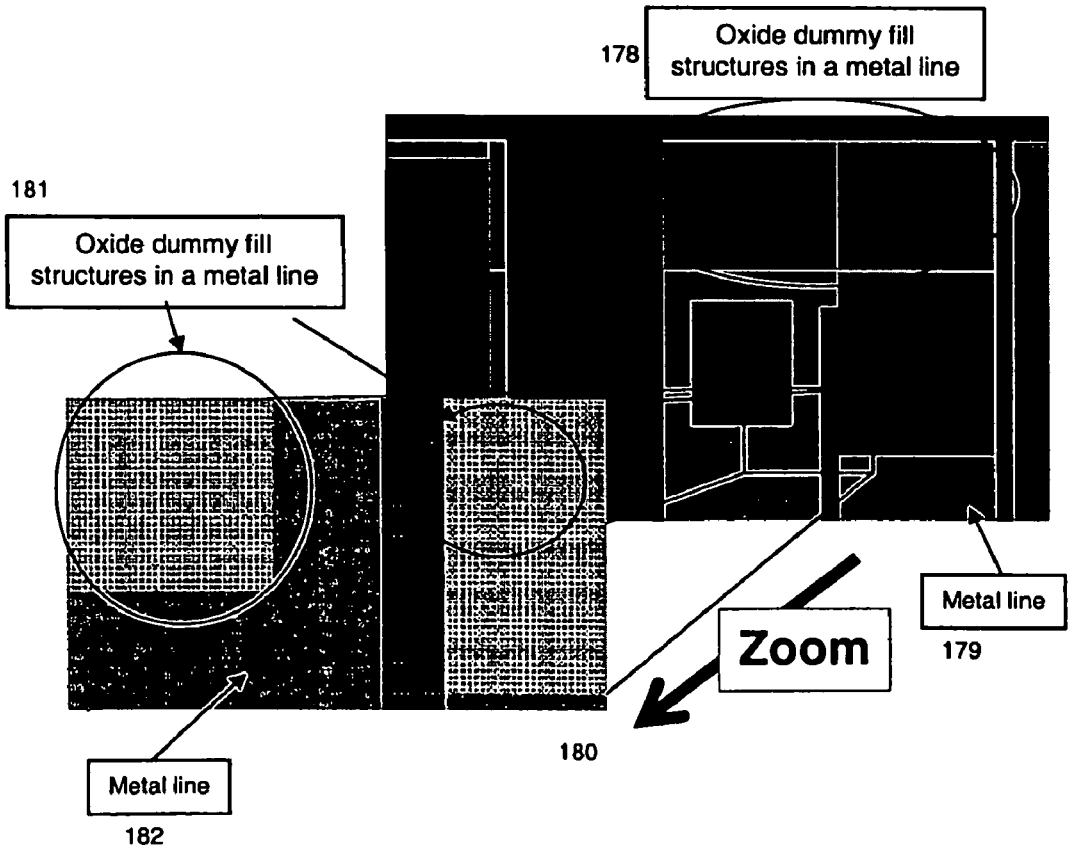
FIG. 36B provides the results of the dummy fill system for oxide dummy fill.
Figure 37:
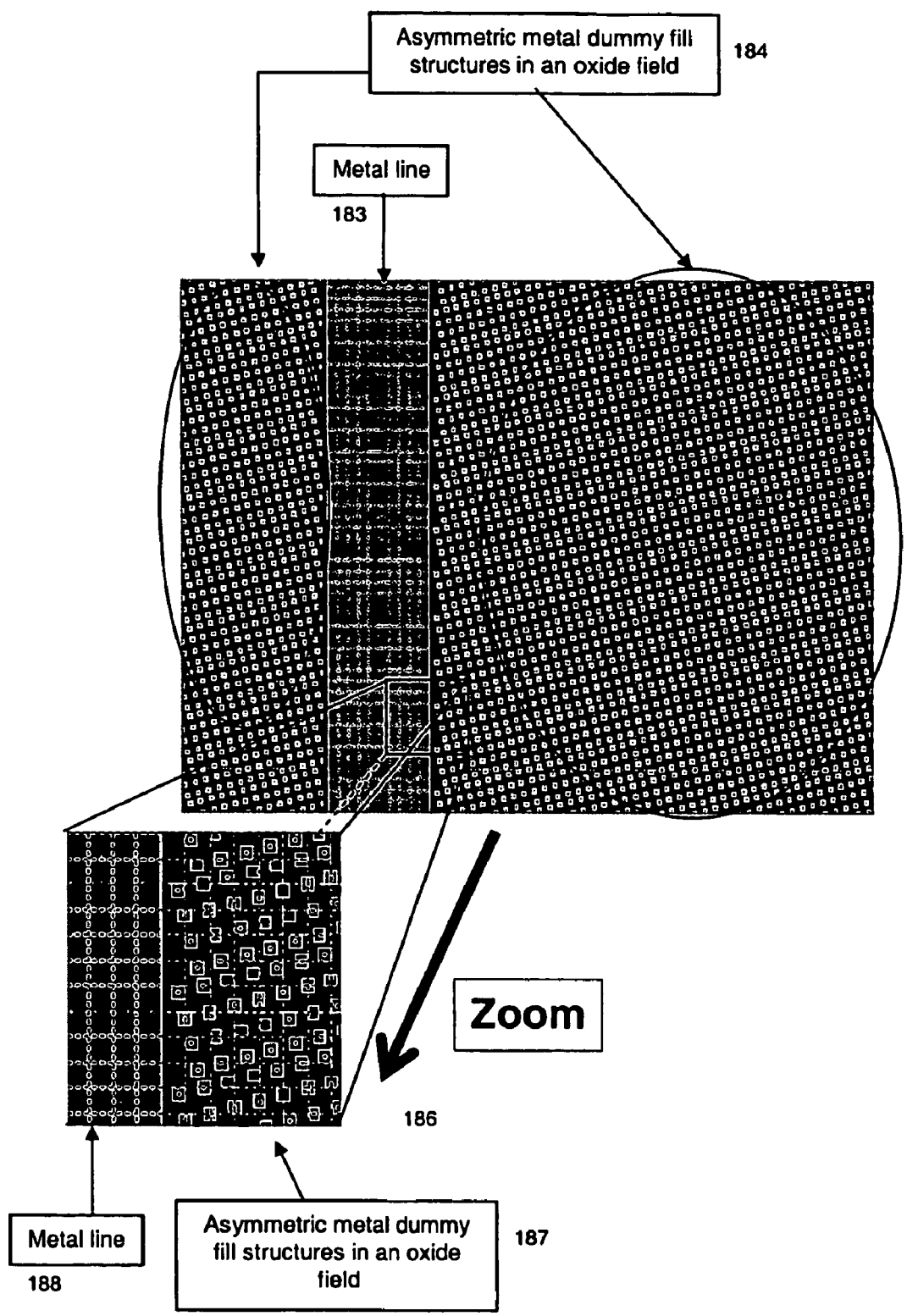
FIG. 37 provides the results of the dummy fill system used to place metal dummy fill with a size and pattern selected by the system to minimize electrical impact.

Results of the dummy fill methods and system are provided in FIGS. 36 and 37. In FIG. 36A, a metal line, 177, is shown adjacent to an oxide field where metal dummy fill has been added, 176, using CMP film thickness, dishing and erosion computation, 31, and resistance and capacitance electrical models, 32, and is within acceptable RC variation tolerances. In FIG. 36B, oxide dummy fill, 178, has been added to a metal line, 179. A zoomed in insert is also shown, 180, where the actual oxide dummy fill structures can be observed, 181. The oxide dummy fill has been added using CMP film thickness, dishing and erosion computation, 31, and resistance and capacitance electrical models, 32, and is within acceptable RC variation tolerances. The dummy fill system also uses dynamic line buffering and dynamic slotting percentages in the placement of dummy fill in these results. FIG. 37 shows how the dummy fill method and system can be used to adjust the dummy fill pattern to minimize electrical impact. In FIG. 37, metal dummy fill, 184, is placed in an oxide field region adjacent to a metal line, 183. To meet the electrical requirements for this design, an asymmetric metal fill pattern is chosen from the fill library and sized and placed to minimize the impact of resistance in the oxide field region where it is added. An insert, 186, is shown where the asymmetric metal dummy fill pattern, 187, can more easily be seen.

Figure 38:
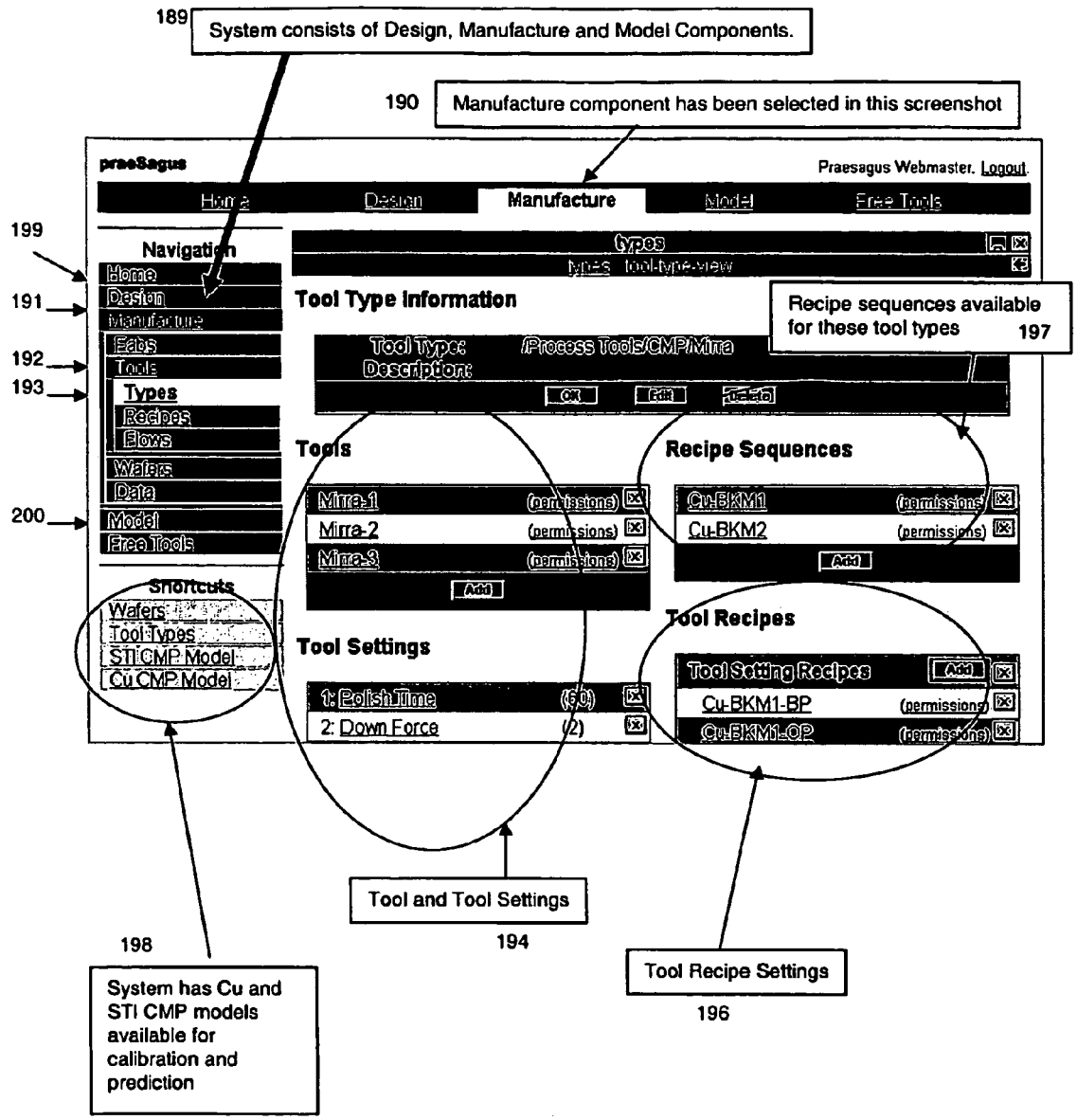
FIG. 38 provides a screenshot of tool type information available under the manufacturing component of the dummy fill system.

The GUI for using dummy fill services is shown in FIG. 38 and a useful embodiment is to use a web browser as the GUI. The benefit being that almost every computer is now equipped with a web browser and there is a great deal of standardization across the two major browsers from Netscape and Microsoft. The dummy fill services and functions are grouped within the GUI into three primary components; design (199), manufacture (191) and model (200). The screenshot in FIG. 38 shows in the header, 190, and in the navigation bar, 191, that the manufacture component has been selected by the user. Within the manufacture component are subcomponents; fabs, tools, wafers and measurement data and in this screenshot, tools, 192, have been selected. There are three subcomponents under tools; types, recipes and flows. In this screenshot the user has selected types, 193. The types of tools and tool settings available to this user are shown, 194. The available recipes for this tool type, 196, and available recipe sequences, 197, for these tool types are shown. The system configured in this screenshot has two process models available to the user, 198, for calibration and prediction of copper and STI CMP. The design component, 199, uses a layouts manager to allow the user to upload and manage layouts and layout extractions. One goal of the dummy fill GUI design is to allow the user to manage all the data and results associated with dummy fill services provided.

Figure 39:
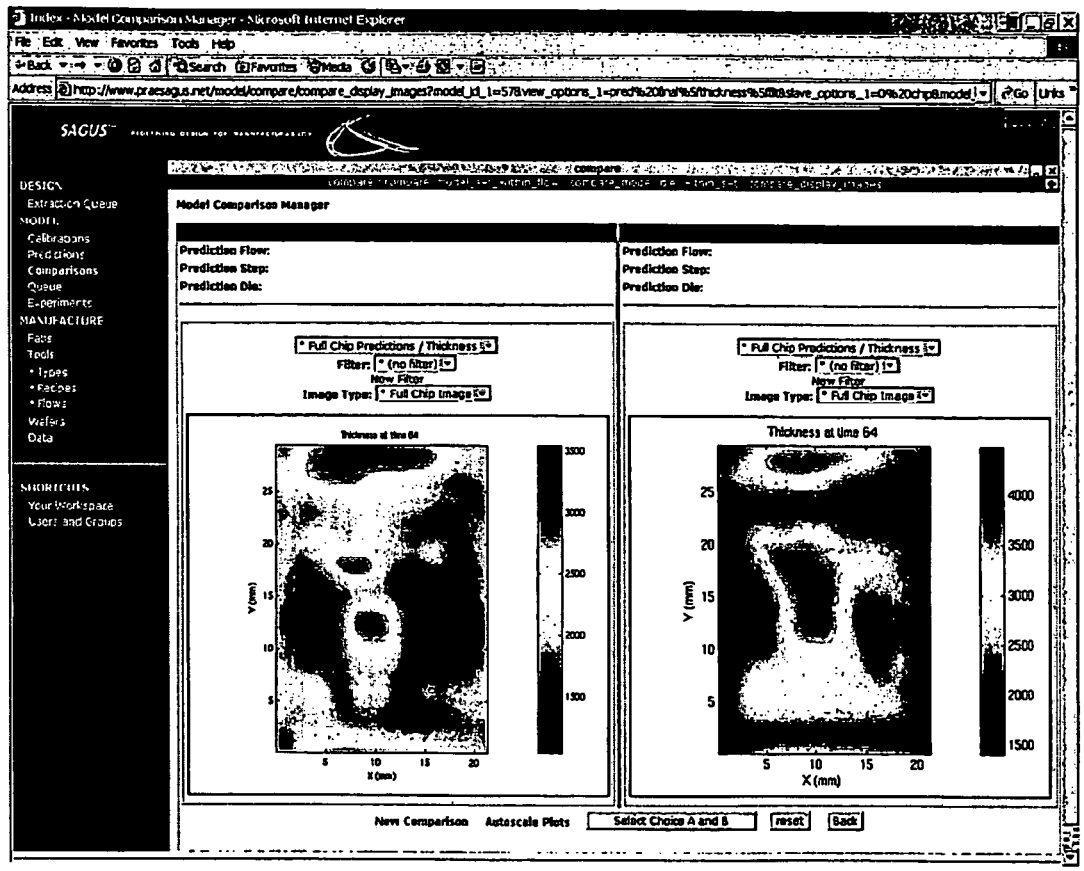
FIG. 39 provides a screenshot of a comparison tool GUI showing full-chip images
Figure 40:
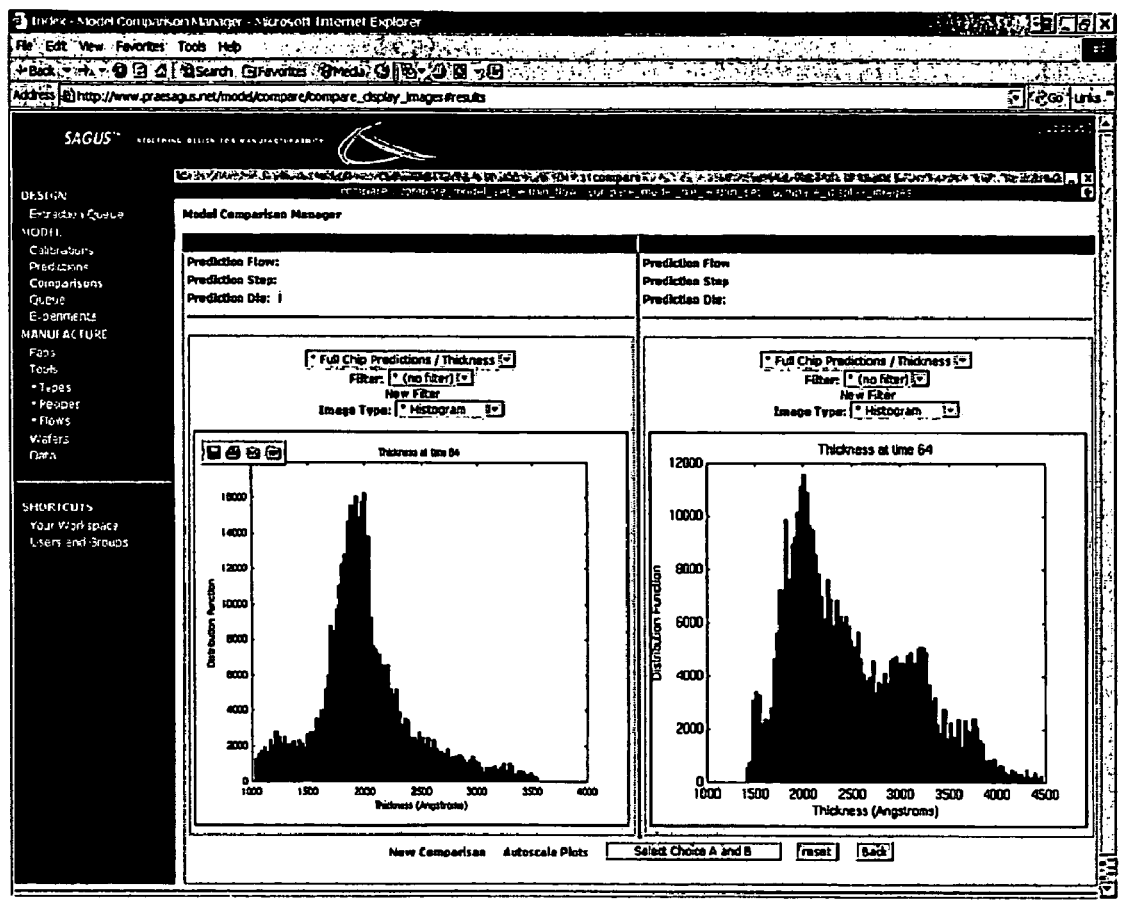
FIG. 40 provides a screenshot of a comparison tool GUI showing full-chip statistical histogram

A comparison tool implemented in software is shown in FIG. 39 and FIG. 40. This tool allows the user to select and compare two or more full or partial chip images of thickness, sheet resistance, total copper loss, step height, dishing and erosion.

The GUI for the comparison tool is shown in FIG. 39 and a useful embodiment is to use a web browser as the GUI. In this screen capture, the user has selected a full-chip image of the thickness across the chip. The benefit being that almost every computer is now equipped with a web browser and there is a great deal of standardization across the two major browsers from Netscape and Microsoft.

The GUI for the comparison tool is shown in FIG. 40 and in this screen capture, the user has selected a statistical histogram of thickness across the chip. A useful embodiment is to use a web browser as the GUI. The benefit being that almost every computer is now equipped with a web browser and there is a great deal of standardization across the two major browsers from Netscape and Microsoft.

In what follows, we describe approaches that are useful to identify and correct, in advance of lithographic mask creation, areas of an integrated circuit (IC) that are likely to be problematic due to variations in film thickness, surface topography uniformity, and electrical impact that arise in the manufacture of an integrated circuit. The identifications or corrections may be based on predicted or modeled physical and electrical properties of a manufactured IC, arising from dependencies between predefined circuit layout patterns and the characteristics of the processes used in the manufacture of the integrated circuit.

These approaches are applicable to (a) high-density plasma (HDP) and chemical-mechanical polishing (CMP) processes used in the formation of shallow trench isolation (STI) structures; (b) lithographic, high-density plasma (HDP), electroplated copper deposition (ECD), and chemical mechanical polishing (CMP) processes used in the formation of single- and multi-level interconnect structures for integrated circuit (IC) devices; (c) processes and flows used to create oxide and low-k dielectric layers; (d) plasma-etch processes and the measurement of critical feature dimensions; (e) lithographic process flows that may include pre and post photo resist deposition and removal steps and a subsequent plasma etch step used to physically etch the patterned features into the wafer; (f) photoresist deposition and photoresist material selection, (g) any step or steps in damascene process flows; and (h) computation of corrections to mask dimensions to achieve desired critical IC dimensions.

In fabricating integrated circuits, the degree of interconnect film uniformity (in terms of both thickness and surface topography) is dependent on characteristics of circuit layout patterns (e.g. material density, line widths, line spaces, and other feature dimensions). Surface and thickness non-uniformities often lead to subsequent manufacturability and process integration issues. Pattern dependencies often cause processed films to have significant variation. The variation becomes worse as subsequent non-conformal layers are deposited and polished.

An integrated circuit (IC) typically includes multiple levels of materials that have been deposited, planarized, and selectively etched to reproduce circuitry defined by a computer-generated design. Lithography is a frequently repeated process step during the manufacture of ICs in which a pattern that defines the dimensions of the circuitry is transferred to a silicon wafer. The patterns are subsequently used with the etch process to physically etch the features into the wafer surface or other thin films deposited on the wafer surface. The terms feature dimensions or feature size refer to dimensions of the geometries within the circuit. Examples include: the width of a line, the spacing between structures (e.g. the spacing between two lines in an array of lines or a buffer distance between working circuitry and dummy fill structures), the critical dimension (CD) of a circuit (i.e. the smallest dimension of any geometry in the circuit), widths of arrays of lines or other repeating structures, as well as the metrics (e.g. minimum, maximum, and average) on individual geometries or on groups of geometries (e.g. an array of lines). Feature dimensions may also include vertical and other dimensions, including sidewall angle, feature height (e.g. trench depth). Lithography equipment includes mechanisms (e.g. steppers) used to project images of patterns onto wafers and pattern transfer tools (e.g., masks and reticles) used to transfer circuitry patterns onto wafers coated with a photosensitive film. Etch equipment includes mechanisms to selectively remove materials (e.g. oxide) from a wafer surface or thin films on the wafer surface patterned with lithography equipment.

Figure 41:
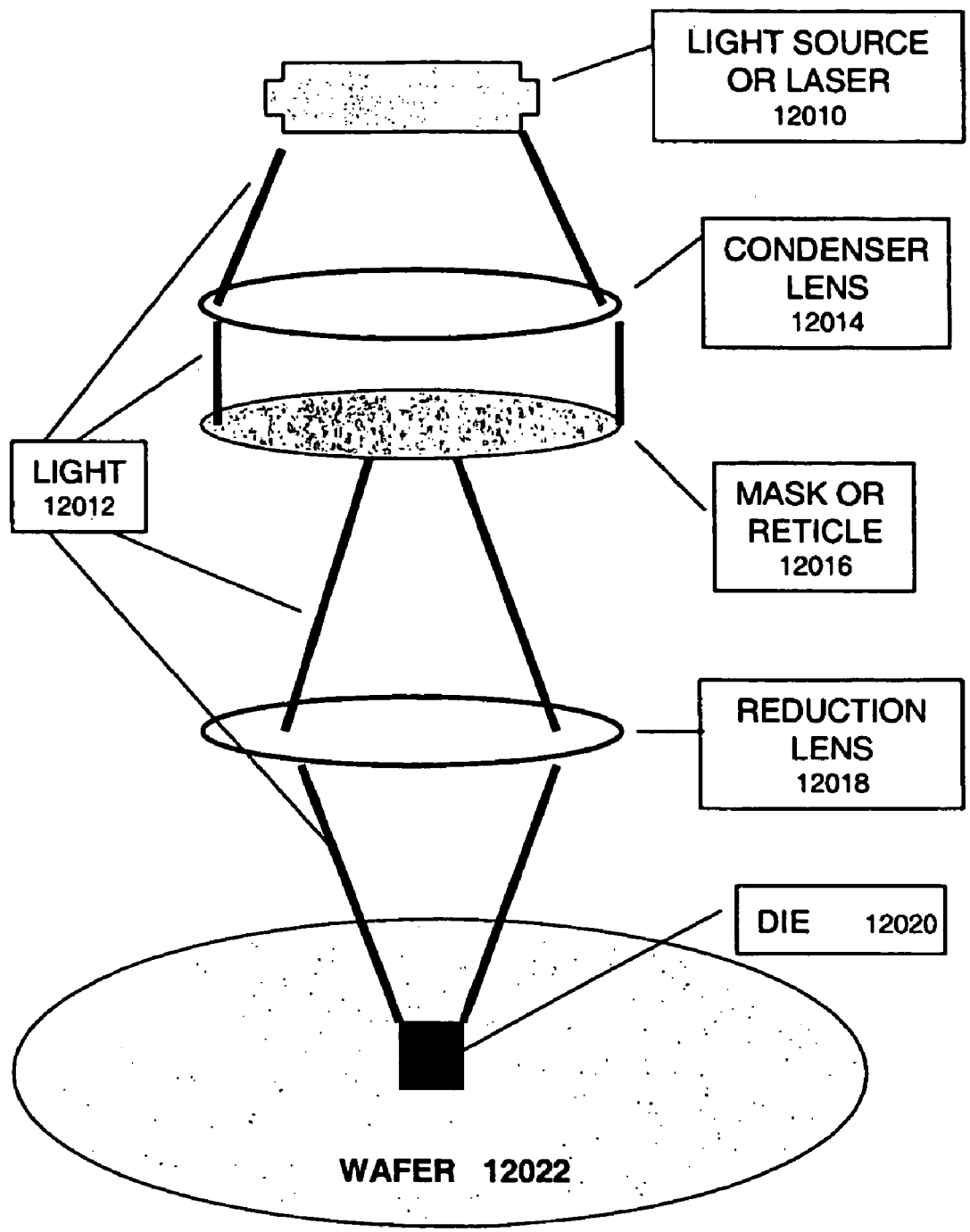
FIG. 41 illustrates how lithography works.

A basic projection lithography process is illustrated in FIG. 41. A light source (e.g., a lamp or laser) 12010 is used to project light 12012 through a condenser lens 12014, which directs light through a mask or reticle 12016 that contains a pattern that represents the printed circuit features. The light 12012 then passes through a reduction lens, which focuses the image onto a wafer 12022. The minimum feature size that can be imaged can be defined using the Rayleigh equations as:

$$M_{fs} = k_1 \frac{\lambda}{NA}$$

where $\lambda$ is the exposing wavelength and NA is the numerical aperture of the optics. The parameter $k_1$, normally between 0.65 and 0.4 for deep ultraviolet (DUV) imaging systems, is a process and system dependent variable that includes effects such as resist, process improvements, light source, and reticle characteristics.

FIG. 42 describes the process of how a lithography mask may be created from an IC design. A computer-aided-design (CAD) system 12036 is used to translate a functional circuit design to an electronic layout design file that represents a physical device, layer-by-layer. The result is a design layout that describes each level of the device from the lowest level, for example a transistor level, up to higher levels, for example interconnect layers that transmit signals among transistors and supply power to the components on the chip. The electronic design files are used during so-called tape-out to generate specifications for making a mask 12037. The masks are then manufactured 12038 and used with the lithography tool to transfer circuit features to a wafer 12039.

Many projection systems use step-and-repeat mechanisms that expose only a sub-area of the wafer or a die, also referred to as the optical field, and then repeat the process until the entire wafer is imaged. The stepper may be controlled to accommodate wafer-level variation that occurs across the wafer as a result of, for example, warp or bow. This is normally used to accommodate variability that occurs from die to die, but not variability that occurs within each die. To ensure that the printed circuit is within a depth-of-focus associated with the optics, the stepper may adjust the focal length of the optics based on measurements of test keys or alignment marks, which are formed on a surface of the wafer, to accommodate variation in the thickness of the photosensitive film or photoresist. Underlying film thickness variation in materials below the photoresist often causes the variation.

Figure 43:
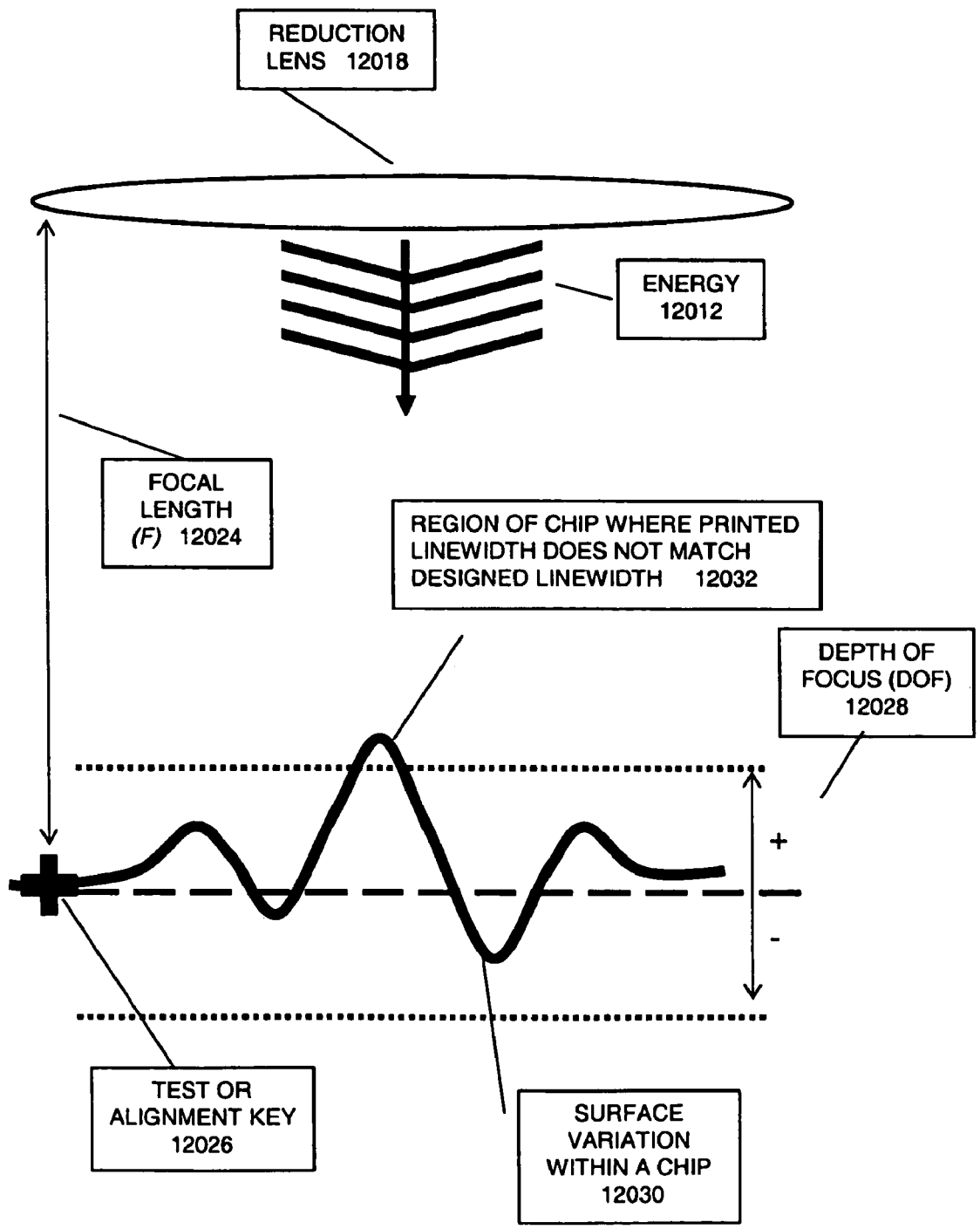
FIG. 43 illustrates a case in which the focal distance to an alignment key is proper; but chip-level variation is outside the depth of focus limits.

FIG. 43 illustrates that while the stepper can account for die-to-die variation, it may not adequately address within-die variation caused by IC pattern dependencies. The reduction lens 12018 of FIG. 41 is shown above the die surface 12030 in FIG. 43. The projection system adjusts so that the focal length 12024 matches the measured distance to a test key or alignment mark 12026. The depth of focus 12028 determines what features along the optical axis can be reproduced with the desired resolution $M_{fs}$. Using the Rayleigh equations, depth of focus $D_f$ 12028 can be expressed as:

$$D_f = \pm k_2 \frac{\lambda}{(NA)^2}$$

where $\lambda$ is the exposing wavelength and NA is the numerical aperture of the optics. The parameter $k_2$ (normally around one for deep ultraviolet or DUV imaging systems) is a scaling factor based upon process related characteristics. During deposition of copper material via ECD or through the CMP of oxide or copper, for example, process related pattern dependencies often cause within-die variation 12030 across the chip. If the chip-level variation exceeds the depth of focus, then the printed features 12032 may not accurately represent the critical dimensions of the IC design as patterned on the mask and the errors, as imaged on the wafer, may negatively impact the performance of the device. As explained below, it is possible to adapt the mask design so that the printed IC dimensions better match the designed dimensions.

The next few paragraphs describe the cause and result of process-related IC pattern dependencies.

The lithography process is repeated throughout the manufacture of a semiconductor device as each subsequent layer is created. One area where the techniques described here may be particularly helpful is during a damascene process in which metal lines, that connect device components (called interconnect), are created. Multiple layers of connections are used to transmit signals and power among device components.

Figure 44:
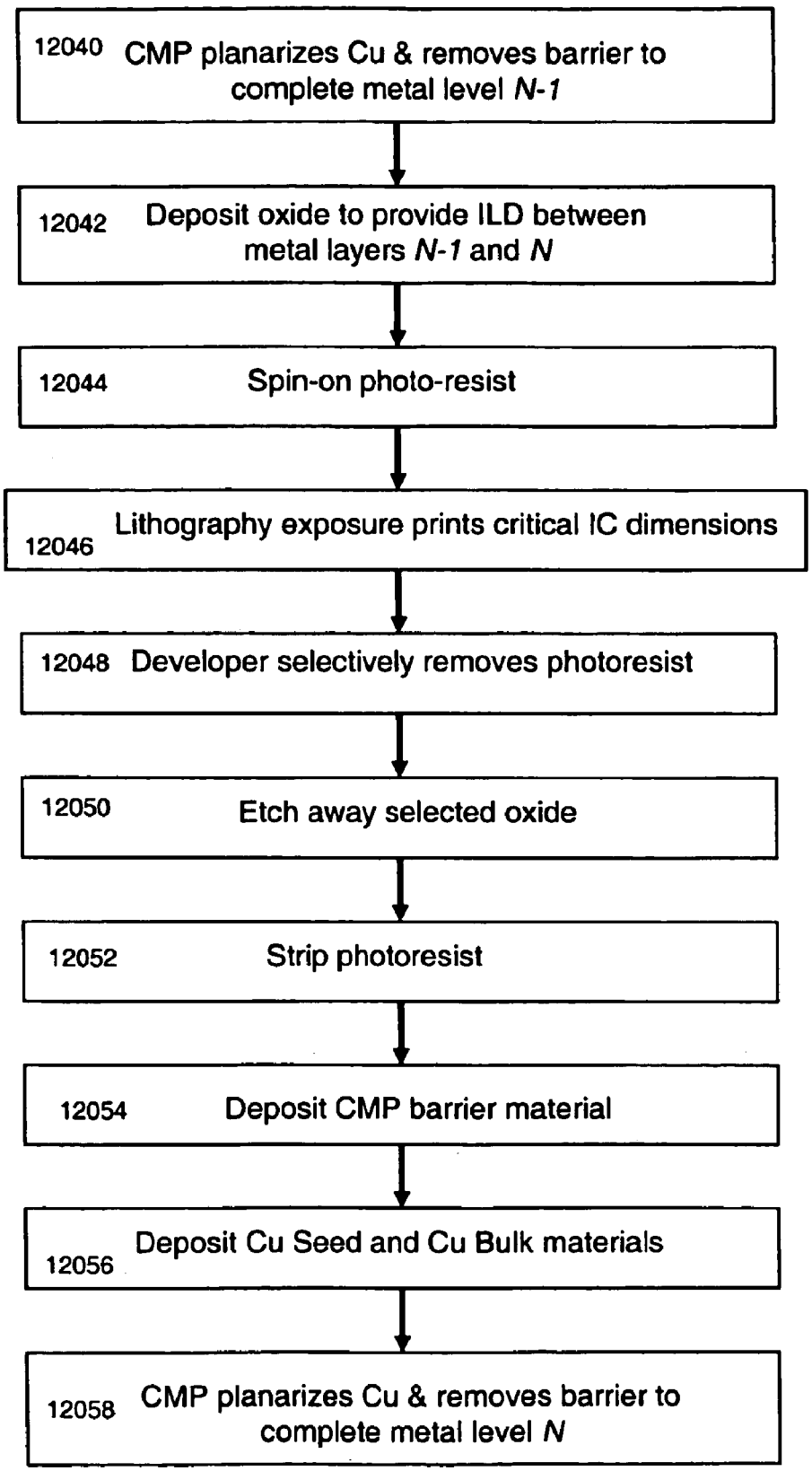
FIG. 44 shows where lithography fits within a damascene process.

The damascene process flow for a given interconnect layer is described in FIG. 44. The flow begins with a post-CMP planarized surface 12040 of the prior interconnect level (level N−1). A dielectric material (e.g. oxide or low-k material) is deposited 42 to electrically isolate the previous and current interconnect layers N−1 and N. (The dielectric forms what is called an inter-level dielectric or ILD layer. Although pattern dependencies due to underlying features may require a CMP planarization step on the ILD, that step is optional and is not shown in this flow example.) A photosensitive film (e.g. photoresist) is deposited on the ILD wafer surface 12044. A lithography system images the wafer 46 to define circuit features for the current interconnect layer using a process similar to that illustrated in FIG. 41. A developer is used to selectively remove photoresist 12048. Plasma etch is used to remove selective oxide areas 12050 and the remaining photoresist is subsequently removed 12052. A barrier material is then deposited 12054 and subsequently ECD is used to deposit metal, for example copper 12056. CMP is used to polish away selective copper areas and remove the barrier material 58. This completes the formation of metal interconnects for level N. Often pattern-related non-uniformity is transferred from underlying levels to overlying interconnect levels resulting in variations in the ILD and photoresist thickness that is imaged during lithography.

Figure 45:
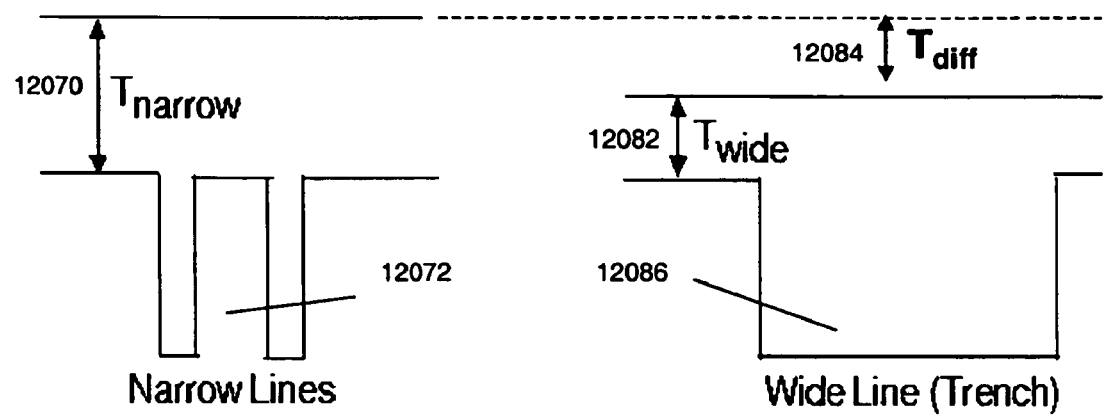
FIG. 45 illustrates pattern dependencies for electroplated copper deposition (ECD).

As described in FIG. 45, electroplated copper deposition (ECD) is a process step in a copper damascene flow that is used to deposit copper material within the interconnect structures. The goal is to completely fill an etched trench region in a void-free manner while minimizing a variation in the deposited copper thickness and minimizing a variation in surface topography. There exist pattern-dependencies in ECD that result in plated surface variation. FIG. 45 shows, for example, the difference in post-plated thickness $T_{diff}$84 commonly observed between the deposited copper thickness $T_{narrow}$ 12070 that occurs over narrow line widths 12072 and the deposited copper thickness $T_{wide}$ 12082 that occurs over a wide line width or trench 12086.

Film thickness variation in chemical mechanical polishing (CMP) processes can be separated into various components: lot-to-lot, wafer-to-wafer, wafer-level, and die-level. Often, the most significant component is the pattern dependent die-level component. Die-level film thickness variation is often due to differences in layout patterns on the chip. For example, in the CMP process, differences in the underlying metal pattern result in large long-range variation in the post CMP film thickness, even though a locally planar surface topography is achieved. This variation occurs in copper, oxide, and shallow trench isolation (STI) CMP and is described in following figures.

For oxide polishing, the major source of variation is caused by within-die pattern density variation 12102, shown as two groups of metal lines in FIG. 46A. The metal lines 12106 on the left side of FIG. 46A have a lower density in the direction of the plane of the integrated circuit than do the metal lines 12108 on the right side of the figure. Pattern density, in this case, is defined as the ratio of raised oxide area 12110 divided by the total area of the region. The region may be taken as a square with the length of the sides equal to some length, for example, the planarization length. The planarization length is usually determined by process factors such as the type of polishing pad, CMP tool, slurry chemistry, etc.

Figure 47A:
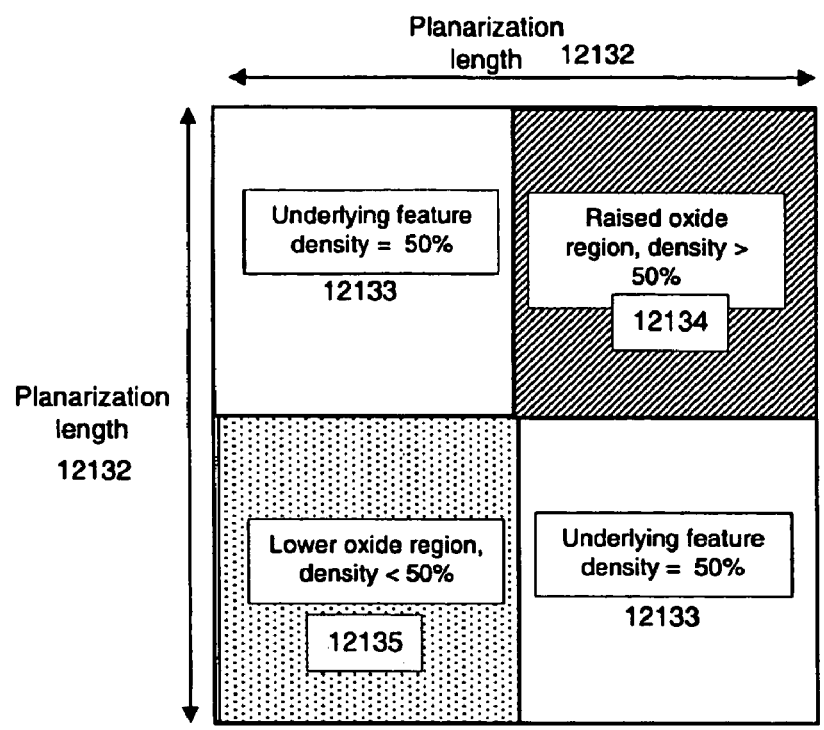
FIG. 47A illustrates a top-down view of different density features within a square region.
Figure 47B:
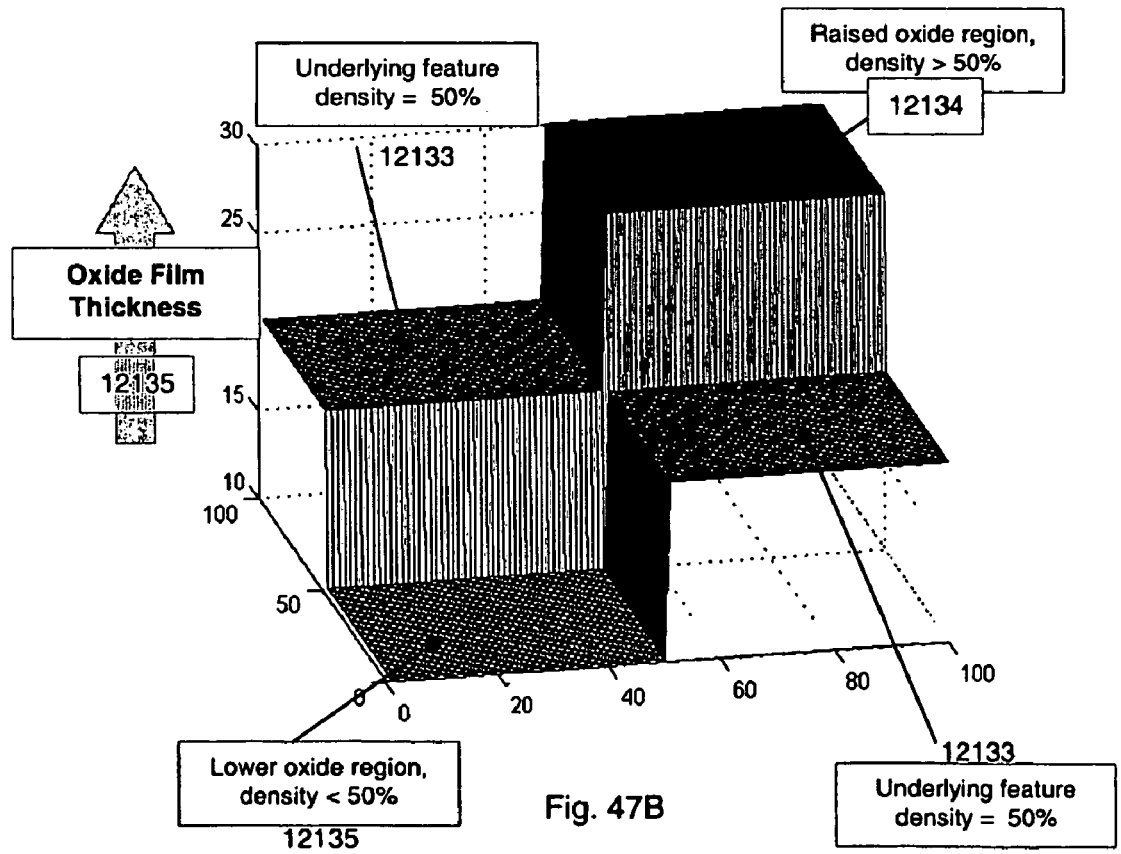
FIG. 47B illustrates the variation in oxide thickness for features within a region.

FIG. 47A illustrates an example of how the underlying feature density affects the film thickness variation. FIG. 47B plots the film thickness variation corresponding to each density type. For a given square area defined by planarization length 12132, the higher underlying feature density leads to larger film thickness variation 12134. The lower underlying feature density leads to a reduced film thickness 12135. Designers often try to maintain density tightly around 50% 12133 to promote planarity. The effective pattern density may be computed for each location on the die by filtering the designed layout densities, often by using various two-dimensional filters of densities around the given location. FIG. 46A illustrates how the underlying features 12106 and 12108 cause variation in local surface topography (step height) 12104 and global non-planarity 12102.

In creating shallow trench isolation (STI) structures (examples are shown in FIG. 46B), $SiO_2$ 112 is deposited in a trench etched in silicon 12111 and planarized using CMP to electrically isolate devices. As with oxide inter-level dielectric (ILD) polishing, the underlying pattern of isolated trenches results in unwanted variation in the deposited $SiO_2$. Problematic areas often are created as a result of CMP such as nitride erosion 12114 (where the nitride barrier is removed and possibly exposes the underlying Si to contaminants and damage), corner rounding 12116 and oxide dishing 12118. The corner rounding has the effect of potentially widening the trench and where the exposure of Si 12110 destroys the device. The oxide dishing results in topography variation that impacts subsequent lithography. In STI polishing, pattern density is an important feature with regard to topographical variation and other CMP effects.

FIG. 46C illustrates the effects of polishing metal features (e.g., copper lines 12122 and 12126) entrenched in a dielectric (e.g., $SiO_2$) 12120, during a damascene CMP process. For metal polishing, computation of pattern density is important to characterizing full-chip pattern dependencies; however determining other physical layout effects, such as the line width and line space, may also be required. Two unwanted effects known as dishing and erosion result from metal damascene CMP. Dishing 12124 is measured as the difference in metal thickness at the edge of a line and its center. Erosion 12128 is defined as the difference in oxide thickness above a metal line, typically within an array of lines, to the oxide thickness in an adjacent unpatterned region. Another unwanted effect is residual copper 12130 that is has not been removed from dielectric field (or up areas) of the chip and remains on the wafer after polishing is complete. It is common for process engineers to set polish times such that all residual copper is removed. For those patterned areas where copper is cleared first, dishing and erosion continue to occur, thereby increasing the non-uniformity of the wafer surface. Another example that illustrates a relationship between density and uniformity is shown in FIG. 47.

Each of the described CMP processes contribute to surface level non-uniformity and thus may negatively impact lithography. While the techniques described here are applicable to any process related pattern dependencies, ECD and CMP are two processes that cause specific concern regarding non-uniformity. Although these processes will be used to illustrate the methods, the methods are applicable to pattern dependencies related to any process.

Figure 48:
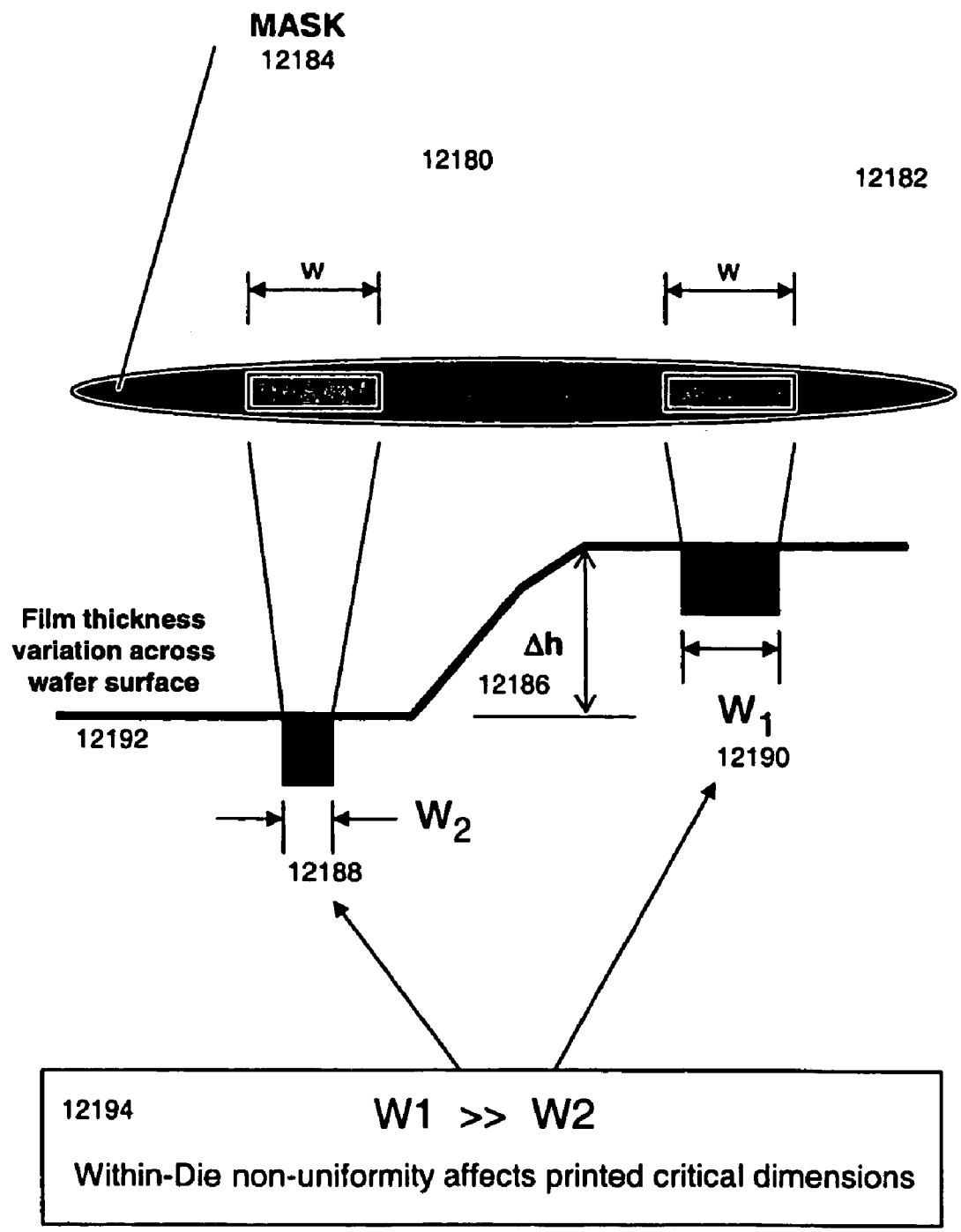
FIG. 48 illustrates how surface topography may affect printed feature dimensions.

The impact of process related pattern dependency on lithography is illustrated in FIG. 48. For the sake of clarity, the mask 12184 and wafer 12192 are shown and the related optics are not shown. As a matter of terminology used throughout, feature width (FW) is taken to be the smallest dimension of any given object. This term encompasses various types of layout objects, such as lines, rectangles, polygons, etc. Also, the critical dimension (CD) is understood to be the smallest dimension of any feature on the layout, i.e. the smallest FW.

A mask 12184 is shown with two features with the same feature width, (w), 12180 and 12182 to be printed onto a wafer surface 12192. When lithography is performed, the within-die non-uniformity 12192 due to process-related pattern dependencies (as illustrated in FIGS. 45, 46, and 47) may result in a film thickness difference ($\Delta h$) 12186 across the chip between the two printed line widths $w_2$ 12188 and $w_1$ 12190. In this case 12194, the printed line width $w_1$ 12190 is much larger than $w_2$ 12188. Although both line widths 12180 and 12182 have been designed and created on the mask with the same dimensions, surface level non-uniformity may result in significantly different dimensions in the printed features 12188 and 12190, which subsequently affects the performance of the manufactured IC.

Figure 49:
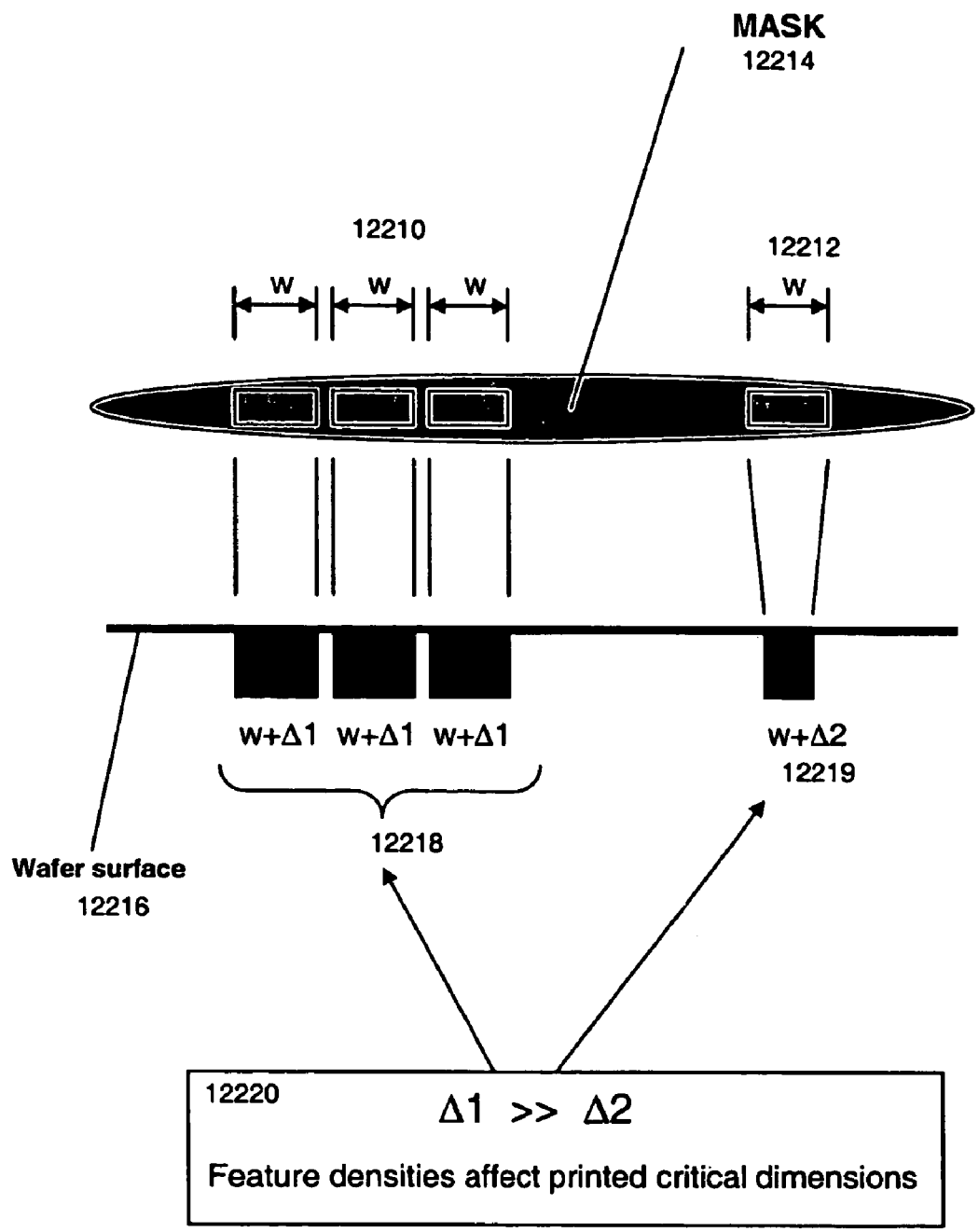
FIG. 49 illustrates how feature density may affect printed feature dimensions.

Process related pattern-dependencies may also occur within the lithography process itself where the density of features often affect how well the printed features reproduce those designed. In FIG. 49, a mask 12214 is shown with two sets of features: one with higher density 12210 and one with lower density 12212. As features on the chip are placed closer to each other (i.e. feature density increases), the diffraction patterns associated with them change often resulting in a feature dimension that varies from that designed. Even with a perfectly planar wafer surface across the chip 12216, the printed feature dimensions (e.g. line widths) ($w+\Delta 1$) 12218 and ($w+\Delta 2$) 12219 may vary 12220 from the dimensions designed and patterned on the mask.

Topographical variation may occur over all components within a chip and thus a full-chip characterization or prediction may be useful. In some cases, it is useful to focus on critical components or circuit areas call sub-networks or subnets. Within this context, full-chip prediction is meant to include any focus on topographical variation within a critical sub-net.

IC pattern dependent relationships can be used to verify whether feature dimensions produced by lithography match the dimensions as they were designed, and, if not, to modify the design layout and masks to yield the designed features. Lithography models may be combined with etch models to predict the physical feature dimensions created within the wafer. Electrical extraction and simulator components may also be used to assess the electrical impact of variations in features (e.g. width, height, depth, sidewall angle) across the chip and fine-tune the specified tolerances for the chip.

Figure 50A:
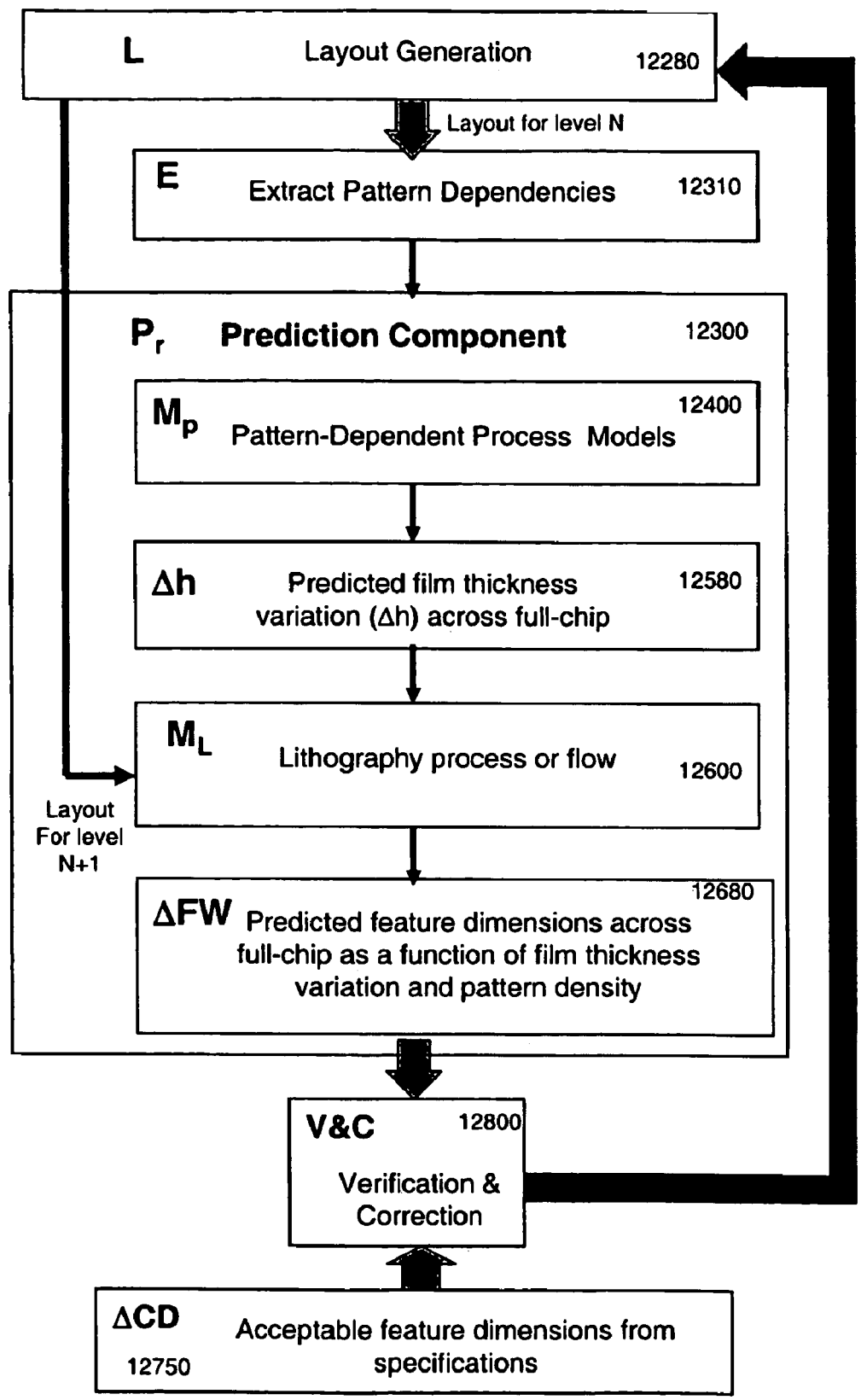
FIG. 50A provides a high-level flow diagram of a method.

The following paragraphs describe an embodiment of the method, which is depicted in FIG. 50A. Sub-blocks (12310, 12400, 12600 and 12800) within FIG. 50A will be described in greater detail below.

An IC design is commonly represented electronically, e.g., in a Graphical Data Stream (GDS) format, in a library of files that define structures and their locations at each level of an integrated circuit 12280. These files are typically large, although the features that are relevant to process variation may be described more efficiently. A process of layout extraction 12310 involves summarizing discrete grids (sub-portions) of IC designs in a compact set of parameters such as feature width, feature space, and density for each grid. Layout extraction is not required but may be helpful where computation resources are constrained. A description of how to perform layout extraction is described in section a below.

In the prediction component ($P_r$) 12300, the layout features 12280 of the design are mapped 12310 to parameters of wafer topography ($\Delta h$) 580, such as film thickness, dishing, erosion, and total copper loss. This information may be used by a process model (e.g., a CMP model) or a set of process models $M_p$ (e.g., ECD and a multi-step CMP process or a more complex process flow) 14400 to predict or simulate the manufacturing results and corresponding variation that will occur when the design represented by the layout features is manufactured on the modeled process. The variation of the resulting fabricated device can be measured physically, such as by optical measurement of the film thickness or surface profiling of the wafer surface to determine actual topography (e.g. dishing or step height and erosion or array height). The chip-level surface topography and associated electrical parameters 12580, relevant for comparison to the desired specifications 12750, are computed for the full-chip, both within die and for multiple dies across the wafer.

The predicted chip-level topography 12580 is input into a lithography modeling $M_L$ step 12600 that maps the variation in wafer surface height 12580 to the variation in printed feature dimensions 12680 for the particular lithography tool. This mapping may use the tool specifications and equations for minimum feature size ($M_{fs}$) and depth of focus ($D_f$) to compute the feature dimension variation with respect to surface topography (as shown in FIG. 88) and an optical proximity correction tool (e.g., existing commercial versions) to compute the feature dimension variation with regard to feature density (as shown in FIG. 89). Another approach is to utilize test wafers and a calibration process described in FIGS. 76A and 76B and section f. to capture pattern dependencies with regard to surface topography and feature density. The result of these approaches is the predicted variation in feature dimensions and line widths across the full-chip 12680 for one or multiple dies across a wafer that has been processed using lithography process or flow 680.

One option is to use models in which the lithography process flow 12600 is defined to include not only the lithography process step but may also include pre and post photoresist deposition and subsequent plasma etch. This may be useful if the actual physical feature dimensions are desired, as an alternative to the patterned feature dimensions that lithography models alone provide. It is recommended to use a pattern dependent etch model that provides additional feature dimensions such as sidewall angle and trench profiles. This step concludes the prediction component $P_r$ 12300.

The predicted feature dimension variation 12680 and the desired feature dimension specification and tolerances 12750 are input into a verification and correction component 800 which identifies any features that will exceed or approach the tolerances. This component also may be used to correct the dimensions of the identified features within the design layout and in subsequent mask creation so as to achieve the designed (or desired) feature dimensions across the chip. Once these modifications are made to the IC design, dummy fill may be reinserted or adjusted and a new layout generated.

Dummy fill is a method of improving film thickness uniformity in integrated circuits through the addition of the structures or the removal of existing structures. Adding metal dummy fill increases the pattern density since density is defined as the amount of metal divided by the total area within a given region. Conversely, adding oxide dummy (also called slotting) removes sections of the copper line and decreases the pattern density. The addition of fill can also alter other parameters such as line width and line space. If dummy metal is inserted between two parallel lines, the line space changes for both of those lines. Similarly, if oxide dummy is inserted within a wire, its effective line width is changed. By modifying the existing layout through the addition of dummy fill, physical parameters such as pattern density, line width, and line space are changed.

The new layout is then input into the prediction component to ensure that the new design meets not only the lithography related feature dimension requirements but also the design and electrical rules and specifications as well. This will likely be an iterative process until the criteria are met across all concerns.

Figure 50B:
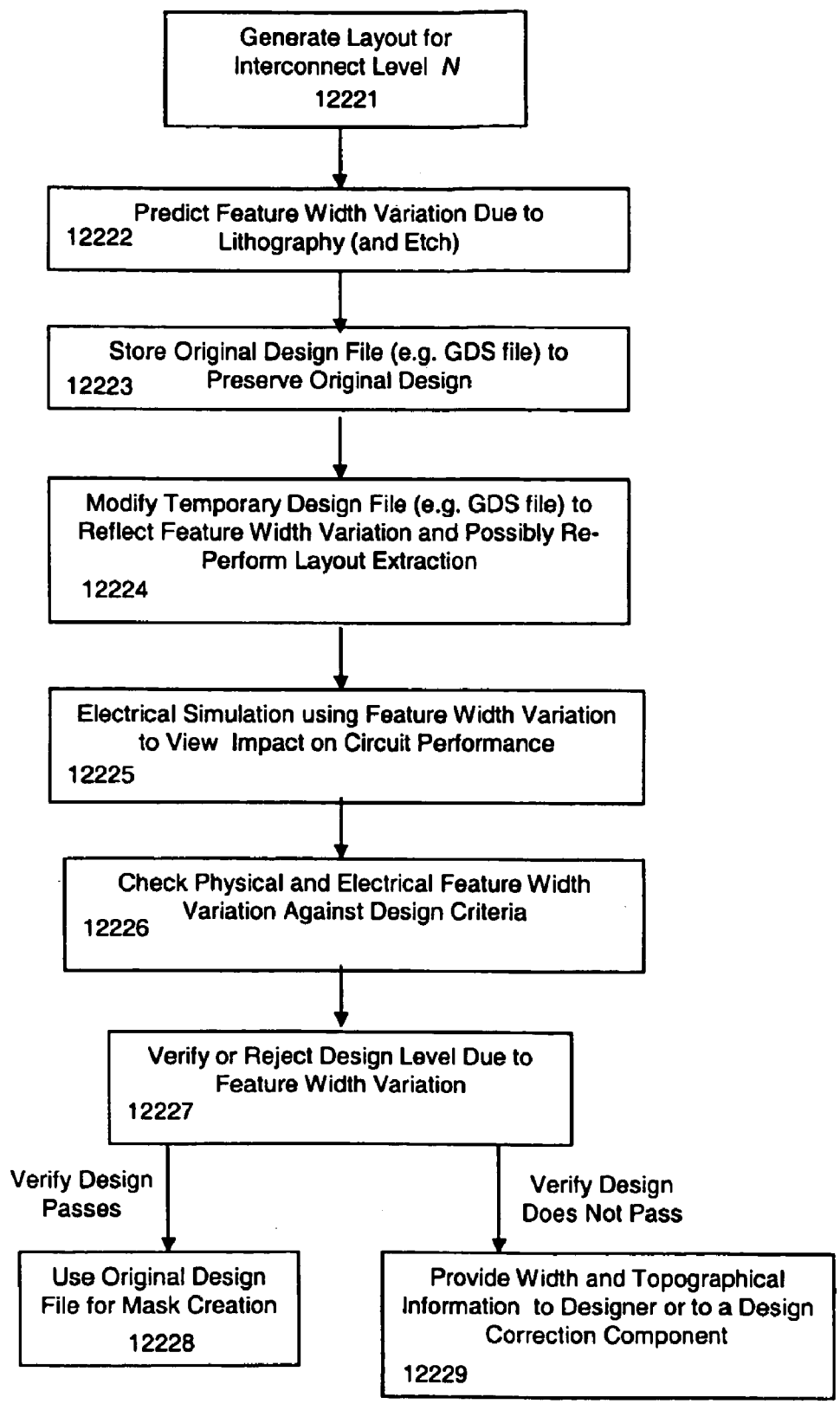
FIG. 50B provides a high-level flow diagram of a method for design verification
Figure 50C:
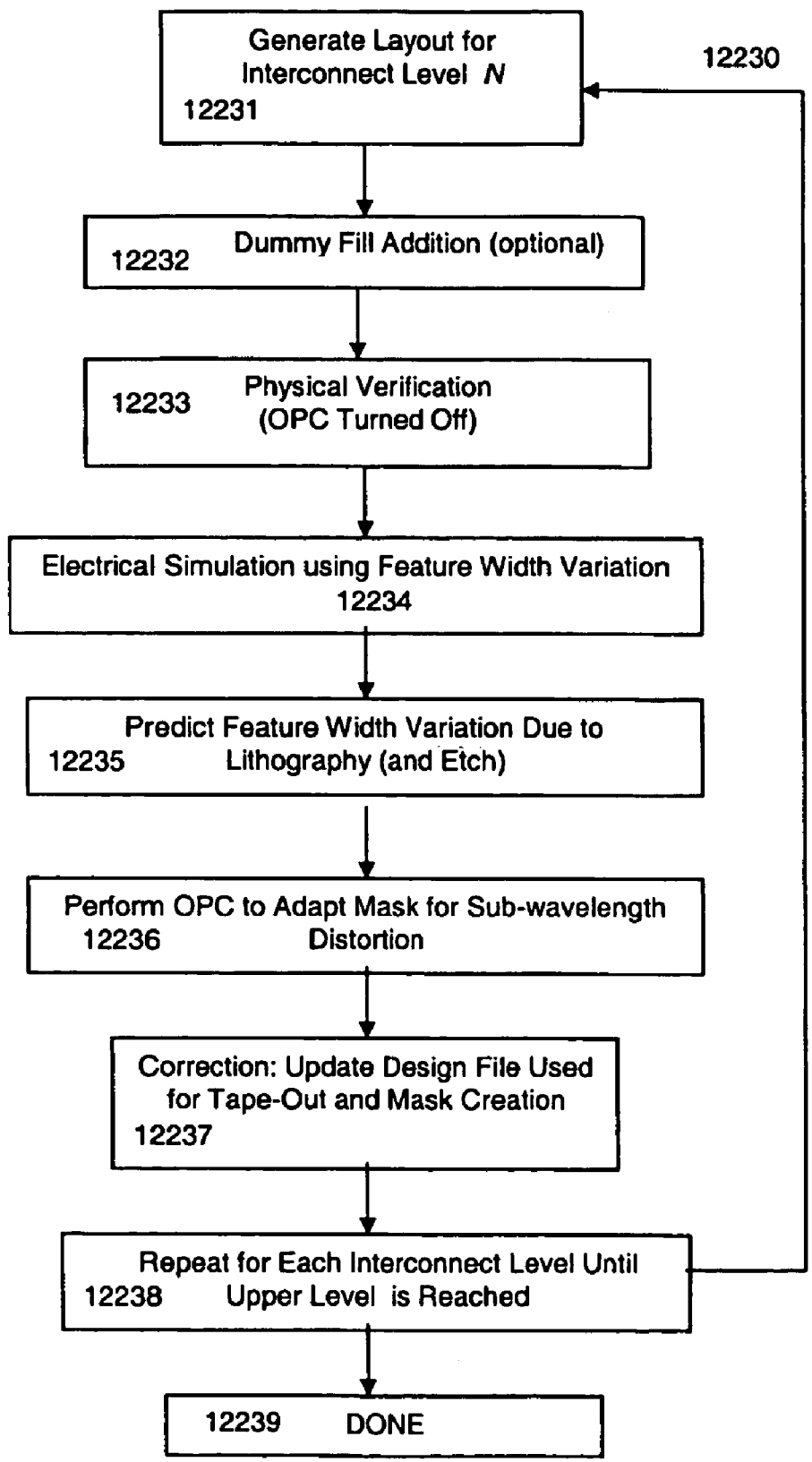
FIG. 50C provides a high-level flow diagram of a method for mask correction

FIG. 50A describes the basic flow for design verification and for mask correction. FIGS. 50B and 50C provide more detailed flows for design verification and mask correction, respectively. The motivation behind design verification is to predict feature width and topographical variations and to use electrical simulations to verify that a given design meets the desired criteria. As such, it is important to modify the design file to reflect the feature dimensions that will result for each interconnect level. As shown in FIG. 10B, the first step is to generate the layout for an interconnect level (e.g. level N). The full-chip design, a critical sub-portion of the circuit design or an extraction from the layout is used to predict feature width variation 12222 due to the lithography (and optionally, plasma etch as well) process. This is similar to the prediction component 300 shown in FIG. 10A. The original design file is stored 12223 for future use because if the design passes verification, the original design will be used to create the masks. A temporary design file is modified 12224 to reflect the feature width variation that will result from the lithography (and optionally, the plasma etch) process. The electrical impact of feature width variation can be evaluated 12225 by performing full-chip or critical circuit network simulation using resistance-capacitance (RC) extraction and other electrical simulation tools. This allows for examination of issues, related to interconnect feature width variation such as coupling capacitance, noise and timing. The physical characteristics (e.g. total copper loss, dishing and erosion) and electrical characteristics (e.g. sheet rho variation, timing closure, signal integrity, power grid and overall performance) are checked 12226 against specifications for the device. The verification step weighs the results and either passes or rejects this design level. If the design passes, the original design file is used for mask creation 12228. If the design is rejected or fails to pass, both the feature width and topographical variation results are provided to the designer or may be input into a design or mask correction component 12229, such as the mask correction approach described here. Approaches for both design verification and mask correction components are described in Section e.

A mask correction technique is shown in FIG. 50C and may be integrated with an electronic design automation (EDA) tool (as shown in FIGS. 94 and 95) or used separately (FIG. 96). The first step is generate the layout for an interconnect level (e.g. level N) 12231. The layout is normally generated using an EDA tool that places circuit components and routes wiring for interconnect levels. Often dummy fill is added 12232 to promote uniformity. The dummy fill may be performed at this stage or performed during the prediction step in 12235 when the topographical variation due to pattern dependencies is computed. The next step 12233 is physical verification in which the design is checked to make sure that it meets all the design rules and parameters that are specified by manufacturing (e.g., a foundry). Physical verification is often part of the normal EDA tool flow that includes steps 12231, 12232, 12233 and electrical simulation 12234. Normally optical proximity correction (OPC) is done, as part of physical verification, to adapt features to compensate for sub-wavelength distortions. However it is recommended that this component be made inactive in any design flow and that OPC methods be used in step 12235 instead. If both are used, then the design is adapted for mask creation before the topographical effects on lithography can be properly evaluated. The next recommended step is electrical simulation, which is used to verify that the feature widths, as designed, meet the electrical specifications 12234. The full-chip design, a sub-network of the circuit or an extraction from the design layout is then input into the feature width prediction component that characterizes the impact of pattern dependencies on the lithography process (and optionally, the etch process as well) 12235. This is similar to the prediction component 12300 shown in FIG. 50A. Optical proximity correction (OPC) 12236 may be performed within the prediction step, as shown in 12640 FIG. 62A, or separately, as shown in 12236, using an existing commercial tool. The next step is correction 12237 where the design file is modified so that the mask features compensate for width variation. It is recommended that any modifications to the design files 12237 by these components (12235 and 12236) be coordinated. These steps may be repeated 12230 for each interconnect level until the highest interconnect level is reached. When modifications to design files, to be used for mask tape-out for each interconnect level, are complete, the electronic files are sent out for creating the masks. It is important to maintain separate design files though. The design files that have been modified to compensate for the width variation are only useful for mask creation. The masks if properly modified will result in feature dimensions that closely resemble those designed in the original design files. As such, any further simulation or analysis should use the original design files, whose dimensions will be accurately represented in the manufactured circuit.

Figure 51:
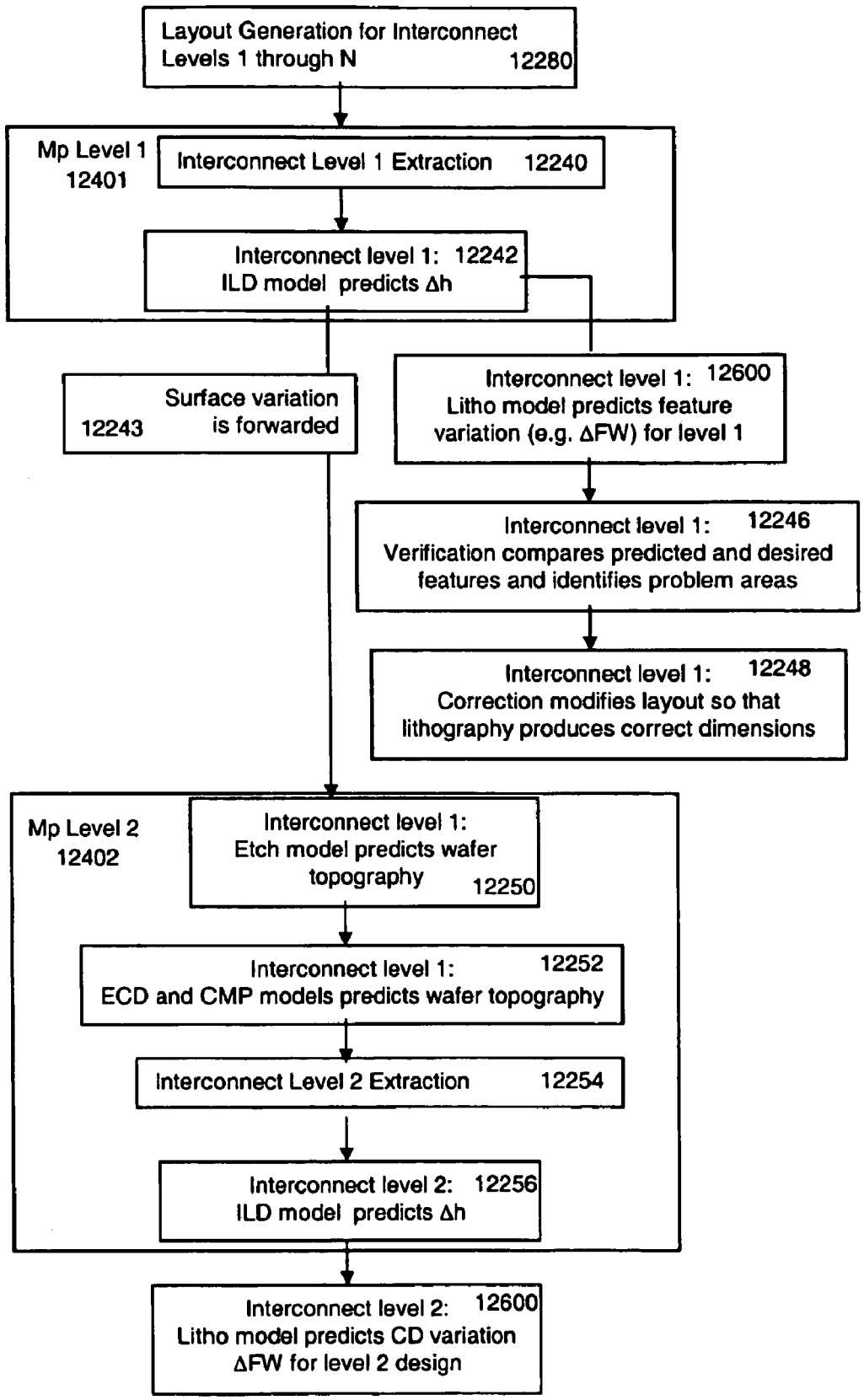
FIG. 51 describes an application in which designs are modified to meet desired printed or etched feature dimensions.
Figure 52:
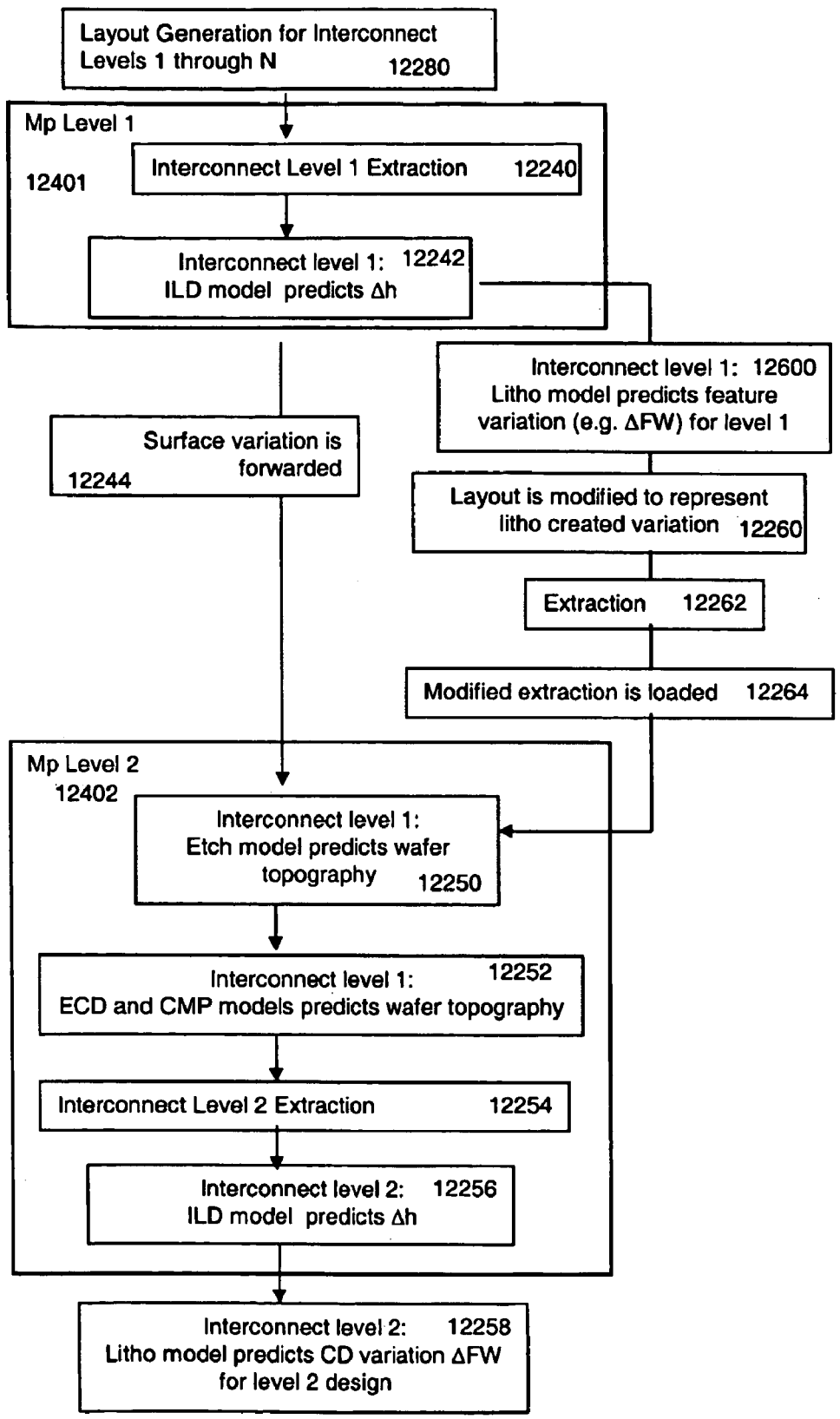
FIG. 52 describes an application in which designs are not modified to meet desired printed or etched feature dimensions.

Two examples of how the techniques may be applied to damascene process flows are provided in FIGS. 51 and 52, which will be referred to as modes A and B respectively. The damascene process flow is a good example because non-uniformity may propagate from level 1 to level 2 and so on until the final level N is reached, and the following figures illustrate the iterative nature of the approach. To simplify the process flow descriptions, pre and post wafer treatments that do not significantly affect wafer topography are ignored. Also, to simplify the example to a generic damascene flow, the term interconnect level is used as a global reference to include both metal and via levels; any additional oxide deposition or etch steps to form vias are not shown. The damascene flows illustrated can be easily extended to dual-damascene and other damascene process flows. Also, the process flows shown in FIGS. 51 and 52 are for the case where plasma etch is not included in the lithography process module 12600 and is computed separately. If the option to predict etched or physically created feature dimensions is used, the etch model 12250 is used within a lithography process flow component 12600 before comparison 12246 or modification 12260.

The difference between the two approaches is that in mode A, the design is modified before mask creation and tape-out to produce the desired dimensions and thus the original design and extraction reflect the actual printed circuit dimensions (if one uses the corrections to the mask to produce the originally designed features). The layout extraction for the original design still reflects the processed feature dimensions or may be close enough to assume the designed widths are used in subsequent ECD process steps.

In mode B, the design is modified to reflect the impact of width variation due to lithography. The variation in feature dimensions at each level needs to be reflected in subsequent steps that have pattern dependencies. As such, the design file is adapted, another layout extraction may be performed and the variation is propagated to the next interconnect level to examine multi-layer effects.

Mode A is oriented toward mask correction to yield minimal feature size variation. Mode B is useful for characterizing lithography process impact, for a given design, within the flow. This is also useful in determining measurement plans for feature dimension variation impact—perhaps for existing production device flows where the masks have already been made and being used in production. As such, the full-chip feature dimension variation has to be taken into consideration for subsequent process impact and the design appropriately modified to generate a new layout extraction for downstream process prediction. Also if the full physical and electrical impact of lithography variation is to be examined the changes to feature dimensions should be modified before simulation (perhaps using RC extractor or EDA tool) as well. That allows for the electrical impact of lithography variation to be characterized as well.

FIG. 51 describes mode A in which the design is modified to yield minimal feature dimension variation after each lithography prediction. Please note that further details on each step will be provided in subsequent sections and these descriptions are to indicate the flow and operation of the components in FIG. 50.

The sample application begins with interconnect level 1, the layout is generated 12280 for levels 1 through the final level N, the process model component 12401 is used to extract layout parameters 12240, and the ILD process model 12242 is used to predict the full-chip dielectric thickness, also referred to as $\Delta h$ in FIG. 50. The lithography model component 600 is used to predict the feature dimension variation $\Delta FW$. One option is to import feature width variation to electrical simulation tools to characterize the electrical impact and transfer the electrical characterization of feature width variation to the verification component 12246 as well.

The verification component 12246 compares the prediction and specifications and identifies problematic areas. The correction component 12248 modifies the design so that the lithography process yields the desired feature dimension levels. Since the printed features now match (or are sufficiently close within some acceptable threshold) the original layout extraction parameters 12240, a new layout extraction is probably not required unless the feature specifications have been set too broad. This is a way in which the techniques may be used to modify design rules to be less conservative, once lithography variation has been minimized.

To generate the lithography prediction for interconnect level 2, the underlying topography for all the process steps between the two lithography steps should be addressed. To compute the incoming wafer topography $\Delta h$ for level 2, the prediction component $M_p$ Level 2 12402 must use the predicted ILD topography from 12242, the etch model prediction 12250, the ECD model predicted wafer topography, and the CMP model predicted topography 12252 from interconnect level 1 and the subsequent ILD topography 12256 from interconnect level 2. The pattern that is imaged during interconnect level 2 lithography is the level 2 design, which is extracted 12254 and input into the lithography model. Finally, the feed-forward propagation through the model flow yields the incoming topographical variation 12256 that is input into the lithography model along with the level 2 extraction parameters 12254 for predicting the interconnect level 2 feature variation 12600.

One option for the use outlined in FIG. 51 is to transfer feature width variation computed in 12600 and 12250 and the topographical variation computed in 12252 into electrical simulations to characterize the electrical performance for interconnect level 1 and this may be repeated for each interconnect level.

FIG. 52 describes mode B. The mode B approach may be used to determine the impact of chip and wafer level pattern dependencies on the lithography process for multiple interconnect levels or the entire chip. In this approach, the printed or etched feature dimensions that result from a lithography process flow may not be the same as the desired feature dimensions and as such any pattern dependencies in subsequent process steps would be based on the printed or etched dimensions. Given that circuit dimensions may be significantly different, it is recommended that the design or extraction be updated to the predicted variation. When the design is updated to reflect the variation, another extraction may need to be performed and forwarded to subsequent model prediction steps. Further details on each step will be provided in subsequent sections and this description is to indicate the flow and operation of the components in FIG. 50. The key difference in the steps described in FIG. 51 and FIG. 52 is that in FIG. 52 the lithography model prediction of feature dimension variation 600 is used to modify the layout 12260 so that it accurately represents the full-chip printed feature width that will actually be printed on the wafer surface. The existing extraction may be modified or a new extraction 12262 may be run and fed into the subsequent etch process step 12250. In the option where etch models are used within lithography process flow in 12600, the resulting variation in features are used to update the layout and a new extraction is ran and fed into the subsequent ECD step 12252. The verification, mode B, operation may be used with existing process flows to determine measurement and sampling plans to measure problematic areas where feature dimension variation is a concern.

An option for the method in FIG. 50 is to add an electrical extraction or simulation component to predict the resistance, capacitance and overall electrical impact of the feature dimension variation that results from lithography, a lithography process flow including etch. One may also use this method for full interconnect level electrical characterization by combining predicted feature width and topographical variation that occurs subsequent ECD or CMP steps and providing this information to electrical extraction or simulation tools.

To evaluate electrical impact in FIG. 51, the feature width variation computed in 12600 and the topographical variation computed in subsequent process steps 12252 may be imported into electrical simulations to characterize the electrical performance for interconnect level 1 and this may be repeated for each interconnect level.

To evaluate electrical impact in FIG. 52, the feature width variation computed in 12600 may be examined and transferred to the verification component in 12246 and 12250 and the topographical variation computed in 12252 may be imported into electrical simulations to characterize the electrical performance for interconnect level 1 and this may be repeated for each interconnect level.

In the final verification pass for a given IC design a combination of both process models and electrical simulations may be used to gauge the performance of a given IC design and compare the prediction against the desired wafer quality and electrical parameters as well as design rule criteria 12800.

Illustrative embodiments are described in the following sections: Section a. describes the layout generation process. Section b. describes the extraction of layout parameters related to process variation as a method to transform the large design files into a manageable set of features. Layout extraction is not required but is useful. Section c. describes a desirable use of process and electrical models to characterize the impact of pattern dependencies and process variation on chip-level topography. Section d. describes the mapping of wafer topography and designed (or desired) circuit features to predicted feature dimension variation that results from a lithography process flow. Section e. describes the verification process of comparing predicted and desired feature dimension values across the full-chip and a correction process for modifying design features and generating new GDS design files for mask tape-out and creation. Section f. describes the creation and use of test wafers to characterize pattern dependencies associated with lithography process flows. Section g. describes applications using the procedures described in sections b. through f. Section h. describes the construction and computational framework used to implement the methods and the applications described in Section g., as well as the operation of the system and methods by users.

a. Layout Generation

Depending on how the techniques is used (for example, as shown in 50B or 50C), the lithography prediction may be used within an EDA design flow, as shown in FIG. 95, or in series with an EDA design flow, as shown in FIG. 96.

Figure 69A:
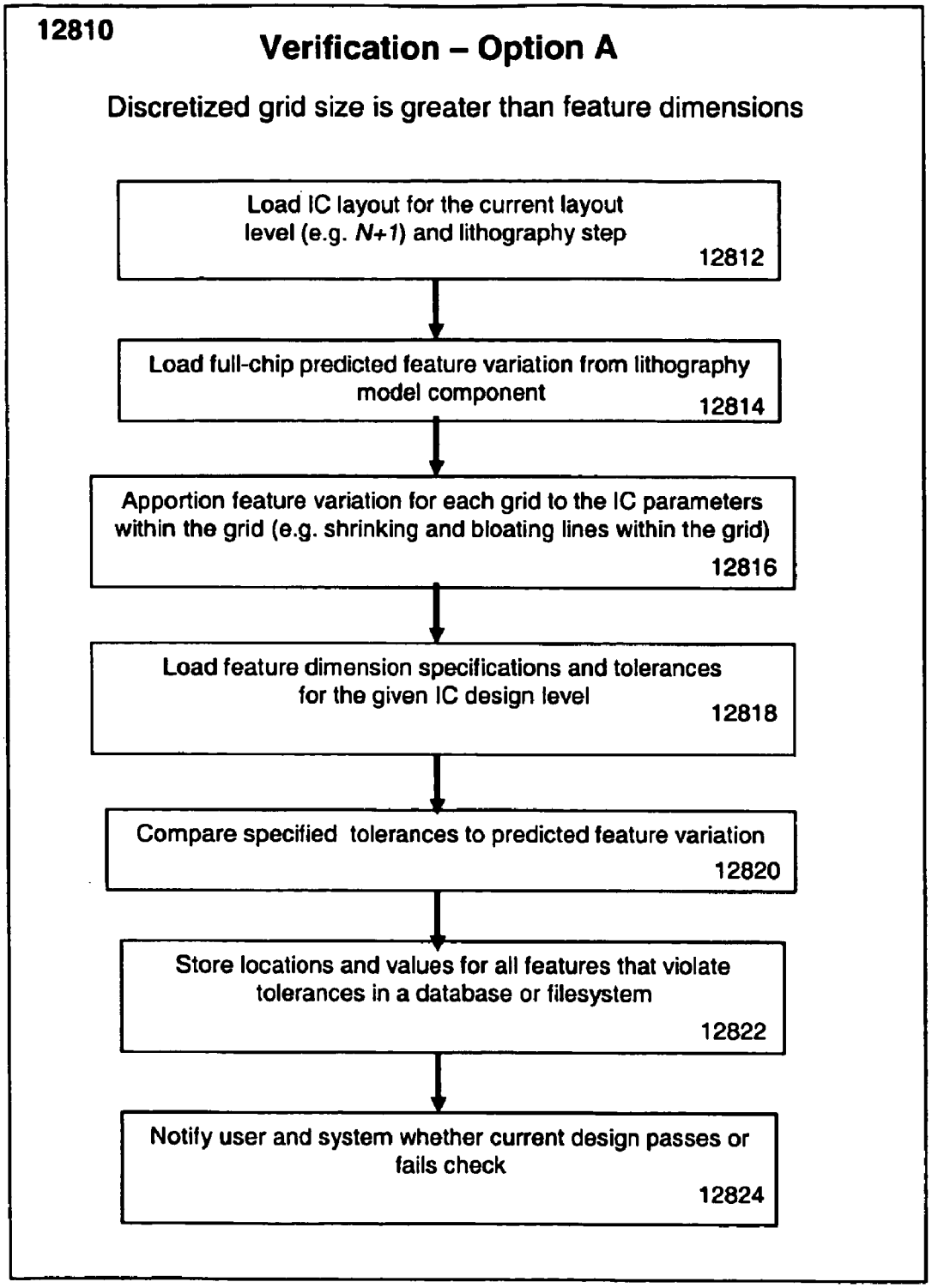
FIG. 69A illustrates steps in verification option A.

In both FIG. 51 and FIG. 52, the lithography modeling may come before or after the layout extraction component. Generally, layout design files are sent through an OPC correction step resulting in the creation of a post OPC layout design file. The OPC correction may either be rule based or model based, but in either case the layout design file is modified from its original form in order that the lines actually printed on the wafer surface after passing through the optics of the lithography process most closely represent what was originally intended. In FIG. 69C, verification is performed at the designed feature resolution and no abstraction of the features, using layout extraction, is needed. As such, this is a case where lithography variation is characterized and perhaps corrected at the feature dimension resolution.

The layout extraction component must be performed on a pre OPC design file and account for any possible errors that the OPC correction may fail to account for, or, if the layout extraction is performed on the post OPC design file, it must remove the effects of the OPC correction in order that it most closely represents what will actually be printed on the wafer surface.

If one is to utilize the lithography model component for OPC and rely on its ability to change the GDS design file such that you get what is designed into the GDS file, then modifications based on topography variations due to CMP may also be moved up above the lithography modeling/OPC block.

In other words, if the techniques are integrated within an EDA tool, any modification of feature widths are to be made before OPC, so that the OPC tool could insert and adjust changes to the GDS file (in it normal operating fashion). Alternatively, the topographical variations (Δh) could just be forwarded into the OPC tool and it could adjust for both the surface variations and the optical proximity. All of these are options, depending on how the techniques are to be used and whether it is used with an EDA tool and OPC component or not.

Figure 53A:
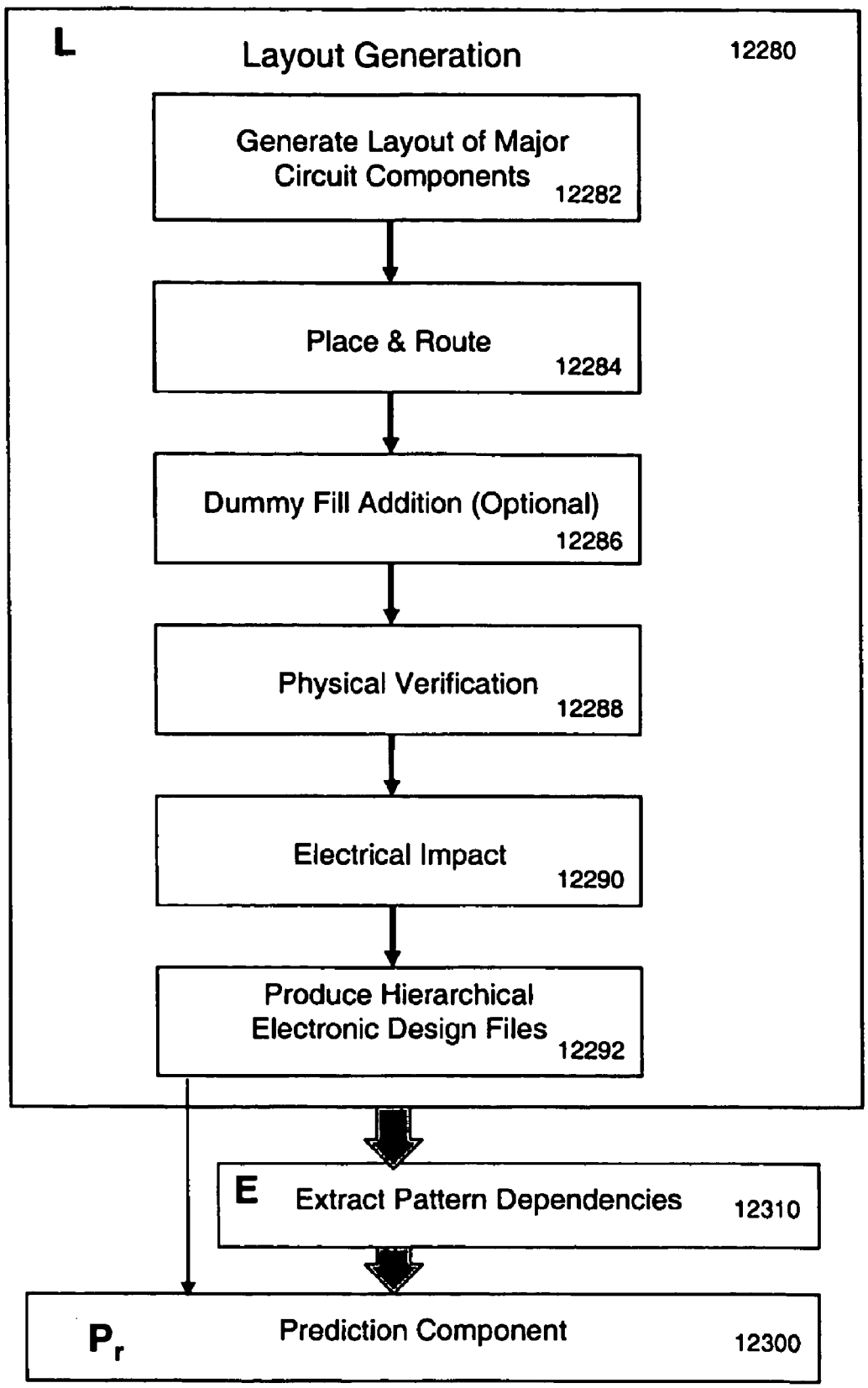
FIG. 53A describes steps commonly used for layout generation.
Figure 53B:
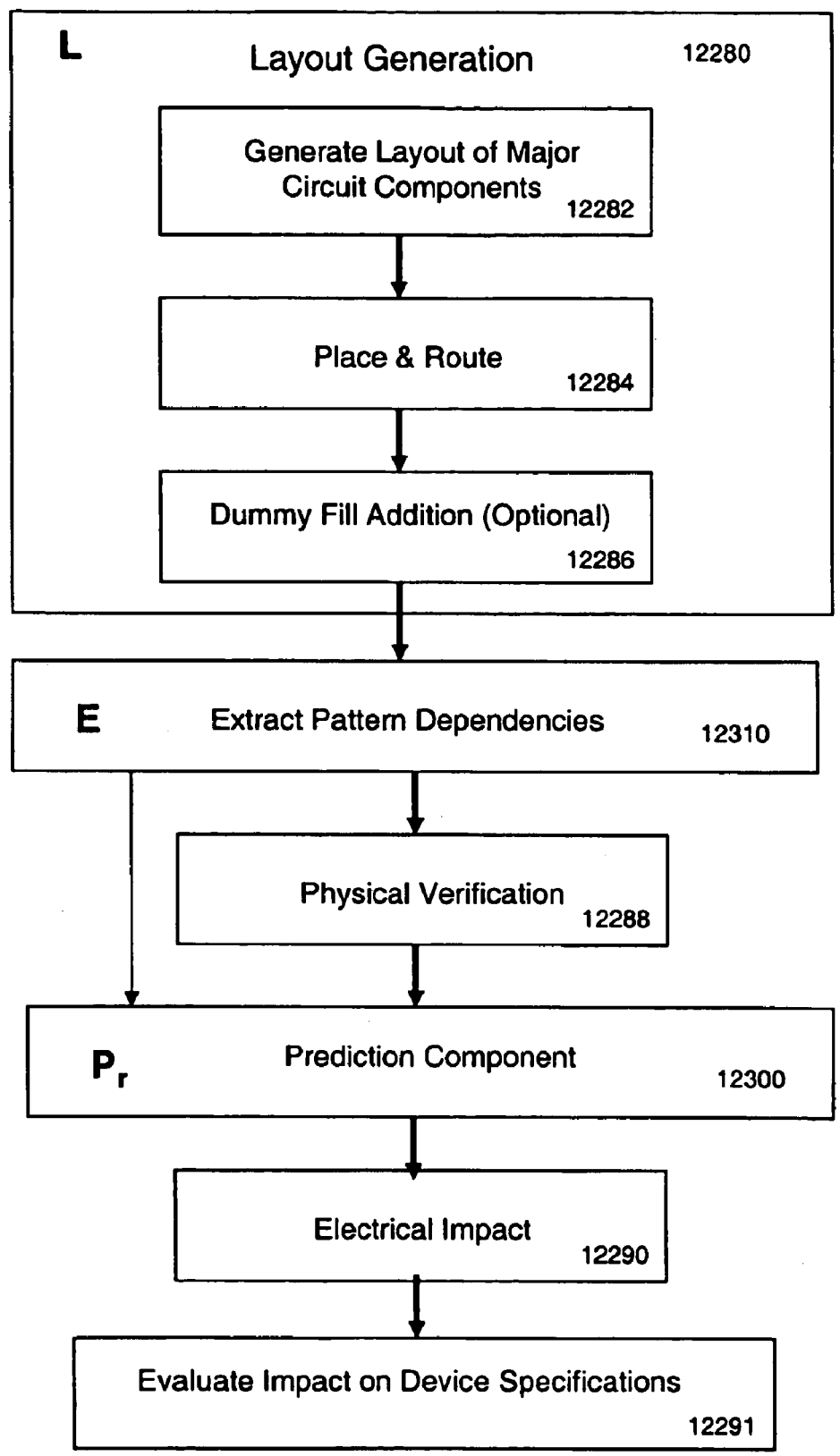
FIG. 53B describes steps commonly used for layout generation when design verification is inserted into the design flow.

Two such ways of generating process layouts (or electronic design files) are described in FIG. 53A and FIG. 53B. FIG. 53A describes a method of correcting masks for a layout generated in a design flow, typically performed using an EDA tool. Layout generation 12280 describes the process that converts a functional circuit design to a layout. An IC design is commonly represented electronically in a layout design file (e.g., in a Graphical Data Stream or GDS format) in a library of files that define structures and their locations at each level of an integrated circuit. The process begins with a layout of where major components (blocks of circuitry) are located on the physical die 12282. Place and route 21284 is then done to determine precisely where every cell or block is positioned and how all components are connected. Dummy fill addition 12286 may be performed to modify the density of materials in a given layer, while minimizing the electrical impact. Dummy fill may also be performed later after topographical variation is characterized as part of the prediction component 12300. The next step 12288 is physical verification in which the design is checked to make sure that it meets all the design rules and parameters that are specified by manufacturing (e.g., a foundry).

A common option, during or after the physical verification step in a design flow, is to pass the design through optical proximity correction (OPC) to adapt the design file used to create masks with regard to feature density. Within the methods described here, the step may be performed in the lithography modeling component 12600 so that manufacturing variation may be taken into account along with feature density.

Often electrical extraction and simulation are performed 12290 to verify that the chip, as verified in the prior step and with dummy fill added, meets electrical performance requirements. Within the context of the methods described here, electrical impact also includes full-chip prediction of sheet resistance, total copper loss, capacitance, drive current and timing closure parameters.

The design modifications are generated in a layout design file format and assembled into a library. To achieve a smaller electronic file size, a hierarchical method may be used to compress the size of the design files. Once layout generation is completed, the design may be input into the layout extraction component 12310. The layout extraction, the actual full-chip design at the feature resolution or some portion of the circuit such as a critical network is fed into the prediction component 12300.

The layout generation process described in FIG. 53B the generation and verification of a design. The components are the same as described in FIG. 53A and the prior paragraphs in this section. However the order is different so that the physical and electrical impact of feature width variation may be inserted into the design process directly. The process in FIG. 53B is similar to that of FIG. 53A in that it begins with a layout of where major components (blocks of circuitry) are located on the physical die 12282. Place and route 12284 is then done to determine precisely where every cell or block is positioned and how all components are connected. Dummy fill addition 12286 may be performed to modify the density of materials in a given layer, while minimizing the electrical impact. Dummy fill may also be performed later after topographical variation is characterized as part of the prediction component 12300. The next step 12288 is physical verification in which the design is checked to make sure that it meets all the design rules and parameters that are specified by manufacturing (e.g., a foundry).

In this mode, the techniques described here work with the physical verification component and may, as shown later in FIG. 94 and FIG. 95, be directly embedded or integrated within a physical verification component within an EDA tool. In some cases where the computational burden is a constraint, a layout extraction may be performed (described in more detail in Section b.) 12310. In other cases, the actual design file or some portion of the circuit (e.g. a critical sub-network) may be directly imported into the physical verification 12288 and prediction components 12300.

The prediction component examines and characterizes feature width variation 12300 and updates a design file, which reflects the variation in manufactured circuit if the masks use the original layout produced in 12280. The electrical impact of this variation on circuit performance may be evaluated by using electrical extractions and simulations that are performed 12290 to verify that the chip meets electrical performance requirements. Within the context of the methods described here, electrical impact also includes full-chip prediction of sheet resistance, total copper loss, capacitance, drive current and timing closure parameters. The overall impact of feature width variation on physical and electrical characteristics for the interconnect level are evaluated against desired device specifications.

In later figures and descriptions, layout generation will indicated with a 'L' and may include any and all of the cases discussed in this section but is not limited to the two cases described in FIG. 53A and FIG. 53B.

b. Layout Parameter Extraction

As described in section a., a layout is a set of electronic files that store the spatial locations of structures and geometries that comprise each layer of an integrated circuit. It is known that variation during manufacturing, which negatively impacts the chip-level planarity of processed films, is related to the variation in spatial densities and the spatial distribution of features within a given design. This relationship may be characterized using layout extraction, in which characteristics of the feature layout (e.g. width and spaces of lines and pattern density) are extracted spatially across a chip from the geometric descriptions in layout files. The extracted information may then be used to determine areas of the chip that exceed design rule criteria, such as limits on feature dimensions and distances to neighboring structures.

The layout parameter most often used to compute dummy fill is the effective pattern density. Although the dummy fill method works with extracted densities, it is useful to include the extracted feature widths and spaces. Since lithography impact must take into consideration all features, whether electrically active or dummy structures, it is recommended to use designs with dummy fill added and the associated layout parameters for purposes of layout extraction.

Figure 54A:
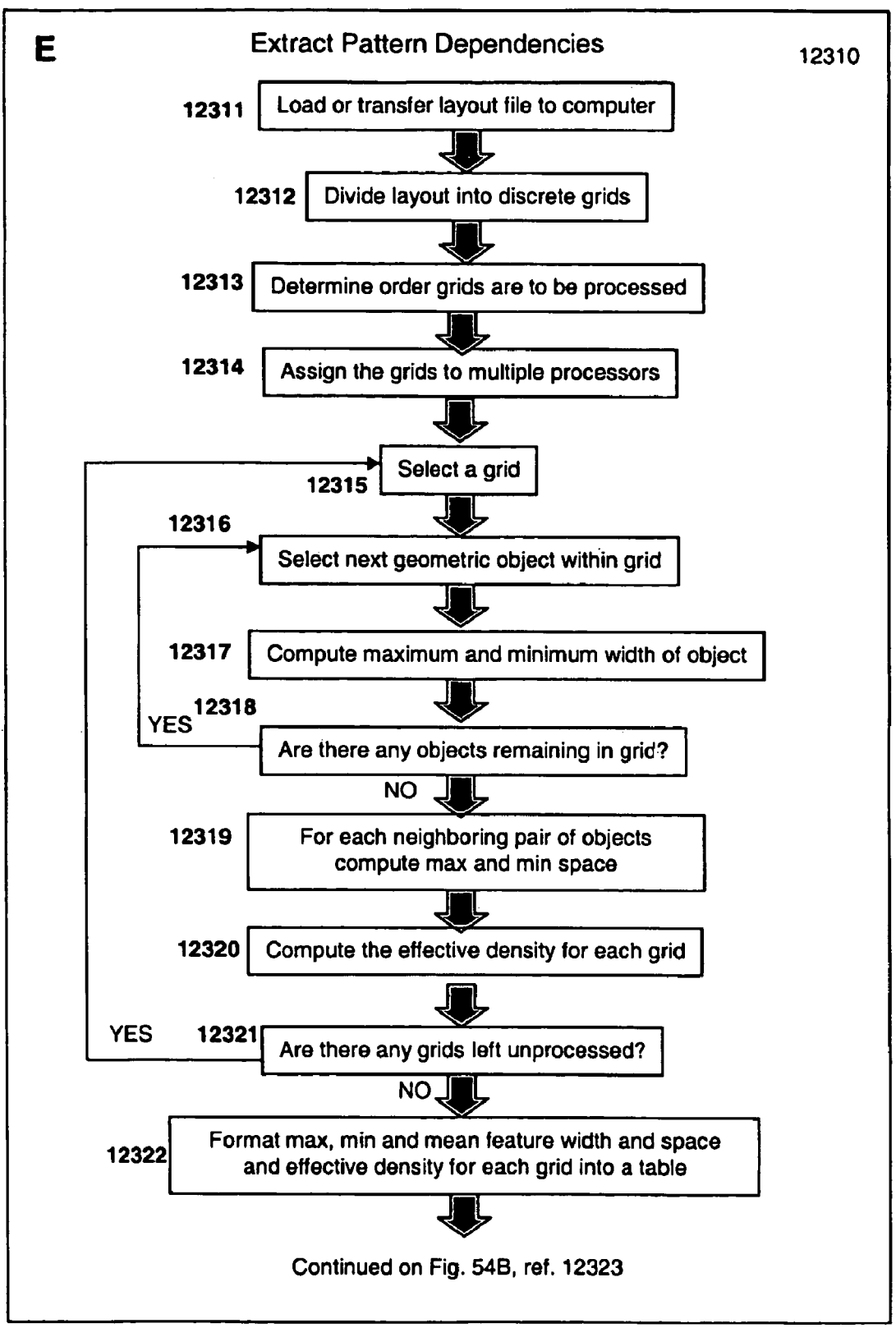
FIG. 54A illustrates the steps involved in layout extraction.
Figure 54B:
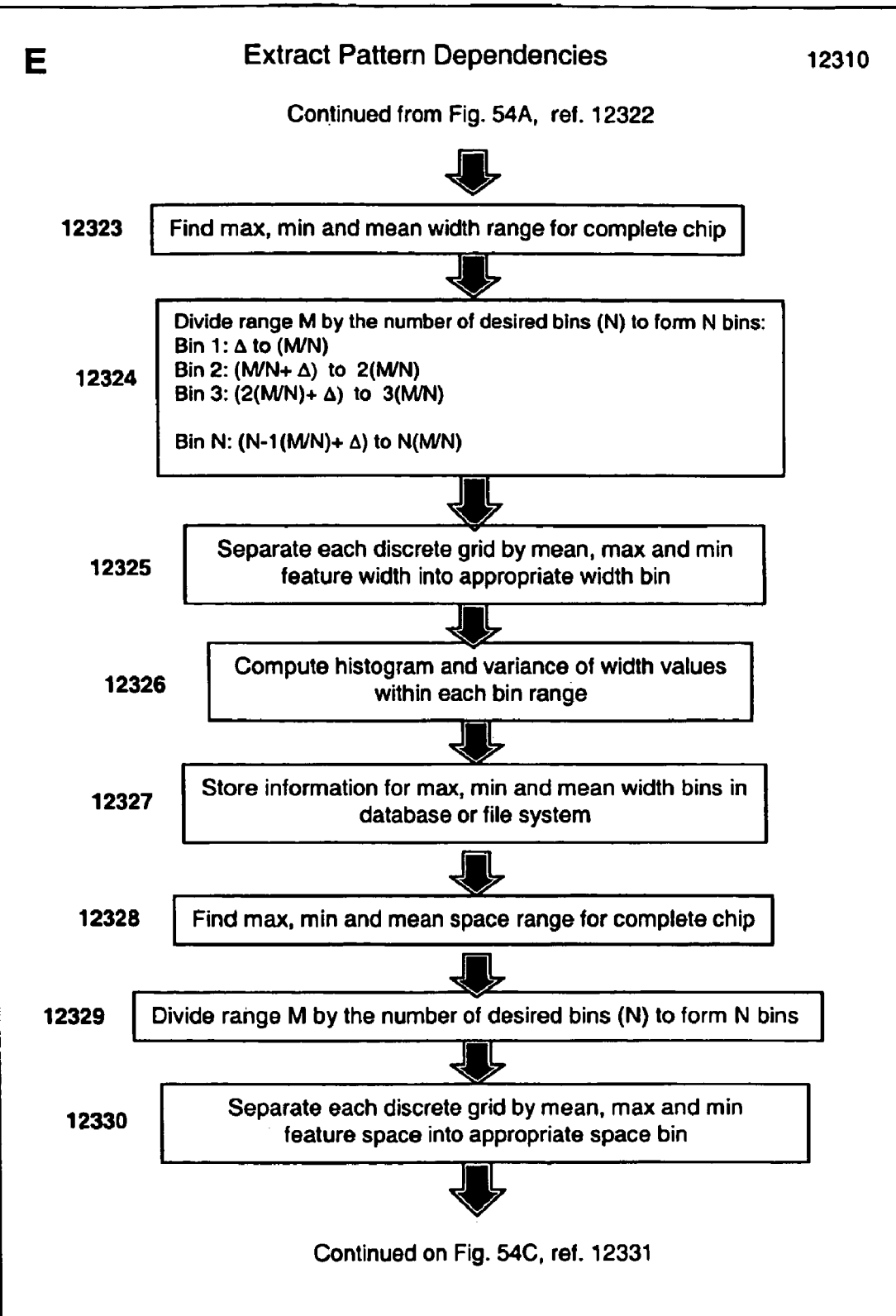
FIG. 54B illustrates a continuation of the steps involved in layout extraction.
Figure 54C:
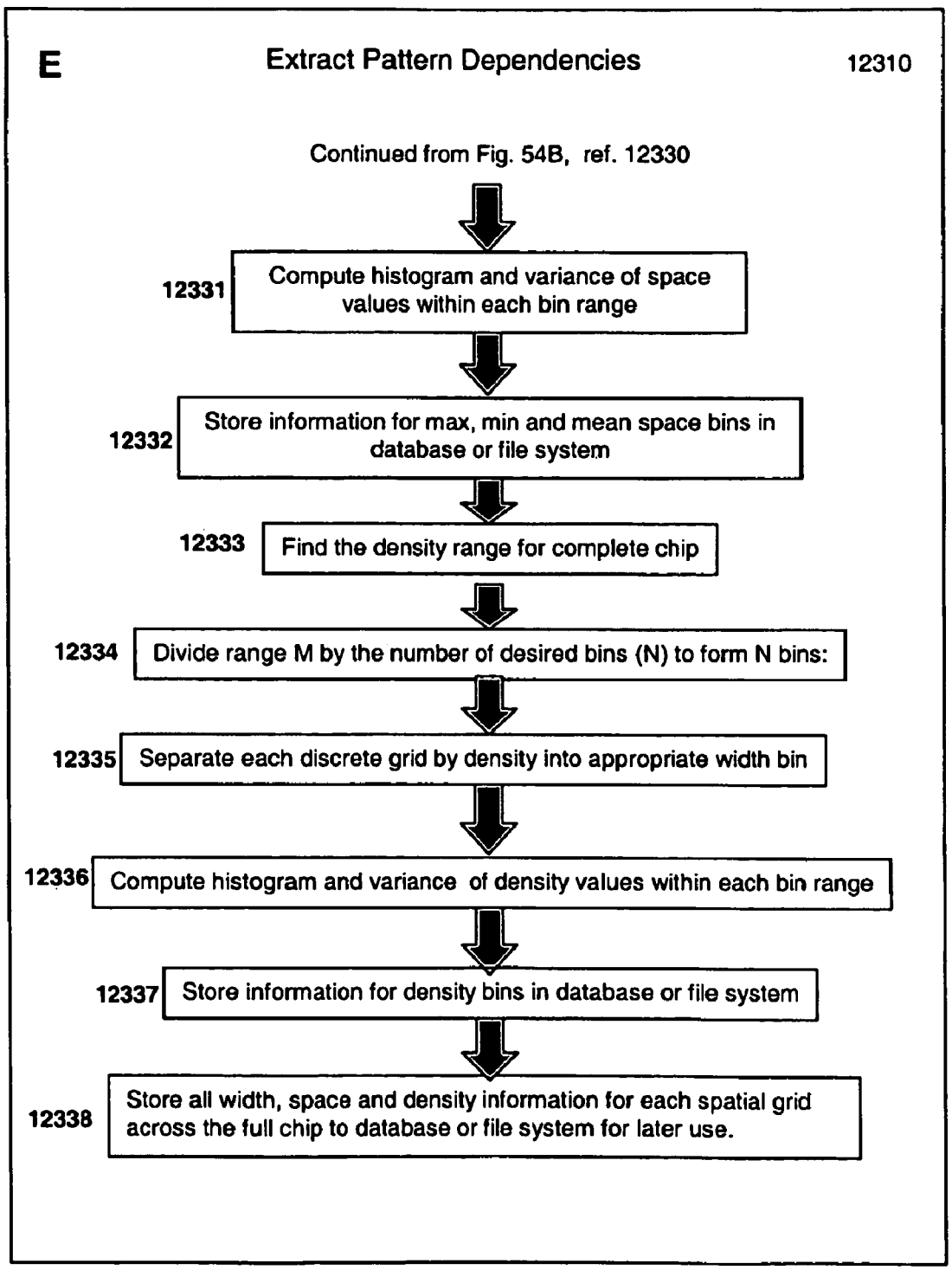
FIG. 54C illustrates a continuation of the steps involved in layout extraction.

The flowchart in FIGS. 54A, 54B and 54C provides a detailed flow of the layout extraction component 12310 of FIG. 50. The layout file is transferred or uploaded to the computer where the extraction algorithm is running 12311. The layout is divided into discrete grids, small enough so that aggregate computations of mean, maximum, and minimum features can be used to represent the structures in the grid and still allow accurate feature representation 12312. The tradeoff is between higher and lower grid resolution is the increased extraction, calibration, and prediction compute times versus a more faithful representation of the layout and more accurate predictions. It is recommended to use a grid size that is less than feature dimensions; however section e. and FIG. 69A presents a method for using larger grid sizes such as 40 μm×40 μm for verification and correction. The grids are ordered or queued for processing 12313. One desirable approach is to use multiple processors to compute the grids in parallel 12314. A grid is selected 12315 and within that grid the width of each object 12316 is computed 12317. This process is repeated for every object within that grid 12318. For each set of neighboring objects (e.g. adjacent objects or objects within some defined distance of an object in being processed) the maximum, minimum, and mean space is computed 12319. The effective density for the entire grid is then computed 12320. This process is repeated for all the remaining grids 12321. Once all the grids are processed, the extracted features such as width, space, and density are reassembled from the parallel processors 12322.

A table is then created and the maximum, minimum, and mean width, space, and density for each grid are placed in it as well as the maximum, minimum, and mean width for the whole chip 12323. The minimum and maximum widths for the whole chip are used to compute a range.

Bins are useful for computing statistical and probabilistic distributions for layout parameters within the range specified by the bin. The width range (M) for the chip is divided by a number of desired bins (N) 12324 to determine the relative size of each of the N bins. For example, the first bin would span from the minimum width or small nonzero value Δ to the width (M/N). Successive bins would be defined similarly up to the $N^{th}$ bin, which will span the width from min $FW_{BinN}$=(N−1)·(M/N) to max $FW_{BinN}$=(N)·(M/N), which is also the maximum feature width. The limits for each of these bins may also be set manually by the user. There are three sets of bins, a set of bins for each of maximum, minimum, and mean width. Each grid is placed in the appropriate bins according to its max, min, and mean width 12325. A histogram is also created for each bin showing the distribution of values within that bin 12326. This information is stored in the database and fed into process models 12327.

The maximum, minimum, and mean feature space ranges are computed for the full chip 12328. The space range (M) is divided by the number of desired bins (N) 12329 to determine the relative size of each of the N bins. For example, the first bin would span from the minimum space or small nonzero value Δ to the space (M/N) and successive bins would be defined similarly up to the $N^{th}$ bin, which will span the space from min $FS_{BinN}$=(N−1)·(M/N) to max $FS_{BinN}$=(N)·(M/N), which is also the maximum space. The limits for these bins may also be set manually by the user. There are three sets of bins, a set of bins for each of maximum, minimum, and mean feature space for the full chip. Each grid is separated into the appropriate bins according to its max, min, and mean space 12330. A histogram is also created for each bin showing the distribution of values within that bin 12331. This information is stored in the database and fed into process models.

The density range is computed for the full chip 12333. The density range (M) is divided by the number of desired bins (N) 12334 to determine the relative size of each of the N bins. For example the first bin would range from the minimum density or small nonzero value Δ to the density value (M/N) and other bins would be defined similarly up to the $N^{th}$ bin which will span the density from min $FD_{BinN}$=(N−1)·(M/N)+Δ to max $FD_{BinN}$=(N)·(M/N), which is also the maximum density. The limits for these bins may also be set manually by the user. There is one set of bins for density. Each grid is assigned to the appropriate bins according to its density 12335. A histogram is also created for each bin showing the distribution of values within that bin 12336. This information is stored in the database and fed into process models 12337. Finally all the width, space, and density information 12338 are stored either in the database or on the file system for later use in process model prediction 12400, 12600, and 12800.

Figure 55:
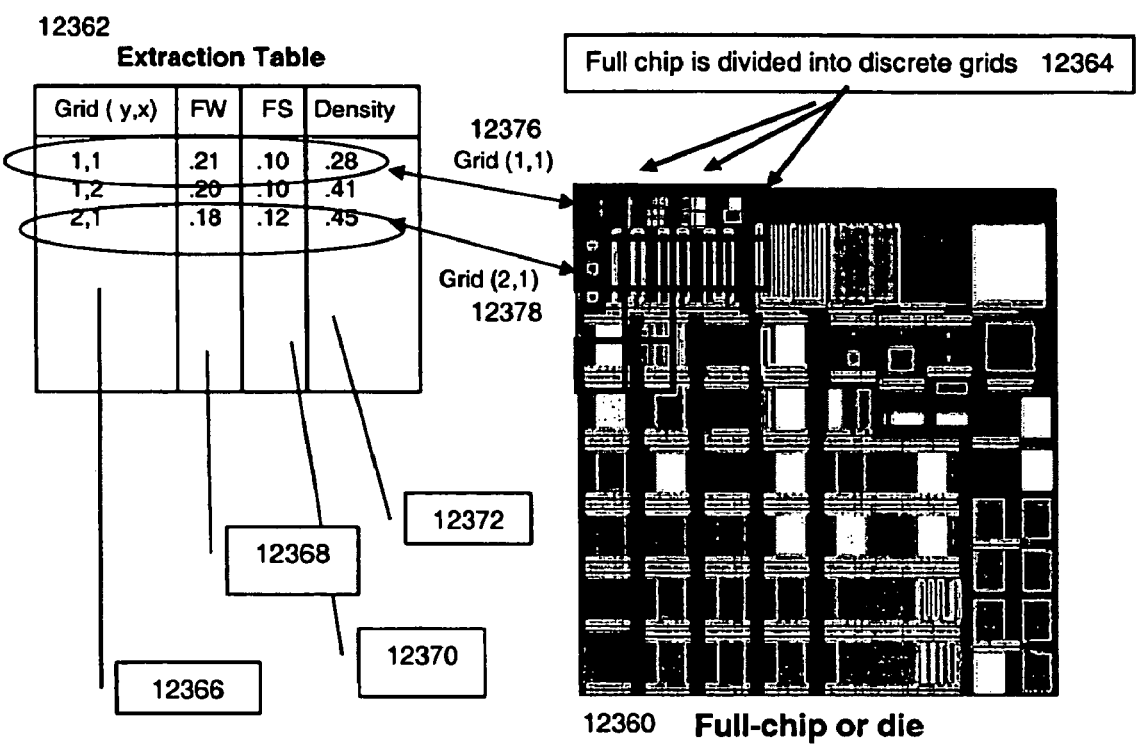
FIG. 55 illustrates the relationship between spatial regions across the chip and the creation of a layout extraction table.

FIG. 55 provides an illustration of how an extraction table 12362 (for all the grids across the full-chip or die) is generated using the process described in FIGS. 54A, 54B and 54C. The chip or die 12360 is segmented into discrete grids 12364 and the extraction procedure, described in FIG. 53, is used to compute the width 12368 space 12370, and density 12372 for each grid element 12364. For each discrete grid on the die 12364 there exists a feature in the extraction table for the grid coordinates 12366 with the relevant pattern dependent characteristics, for example density, feature width (FW), and feature space (FS). The figure also shows an example of two grids with (x, y) coordinates (1,1) 12376 and (2,1) 12378 and how they may appear in the extraction table. FIG. 53 indicates how these characteristics, feature width (FW) 12368, feature space (FS) 12370, and density 12372 values, may be placed in an extraction table 12362. In many cases, the max, min, and mean of the features within each grid are stored in the table as well.

c. Pattern-Dependent Process Models

A process model or a series of models (e.g., a model of a flow) can be used to predict the manufactured variation in physical and electrical parameters of an actual IC device from an IC design. By characterizing the process variation relative to IC structures using the model, variations in topography across the chip may be predicted and used to estimate printed feature size variation during lithography or physical feature dimensions that result from use of lithography and etch processing.

Figure 56:
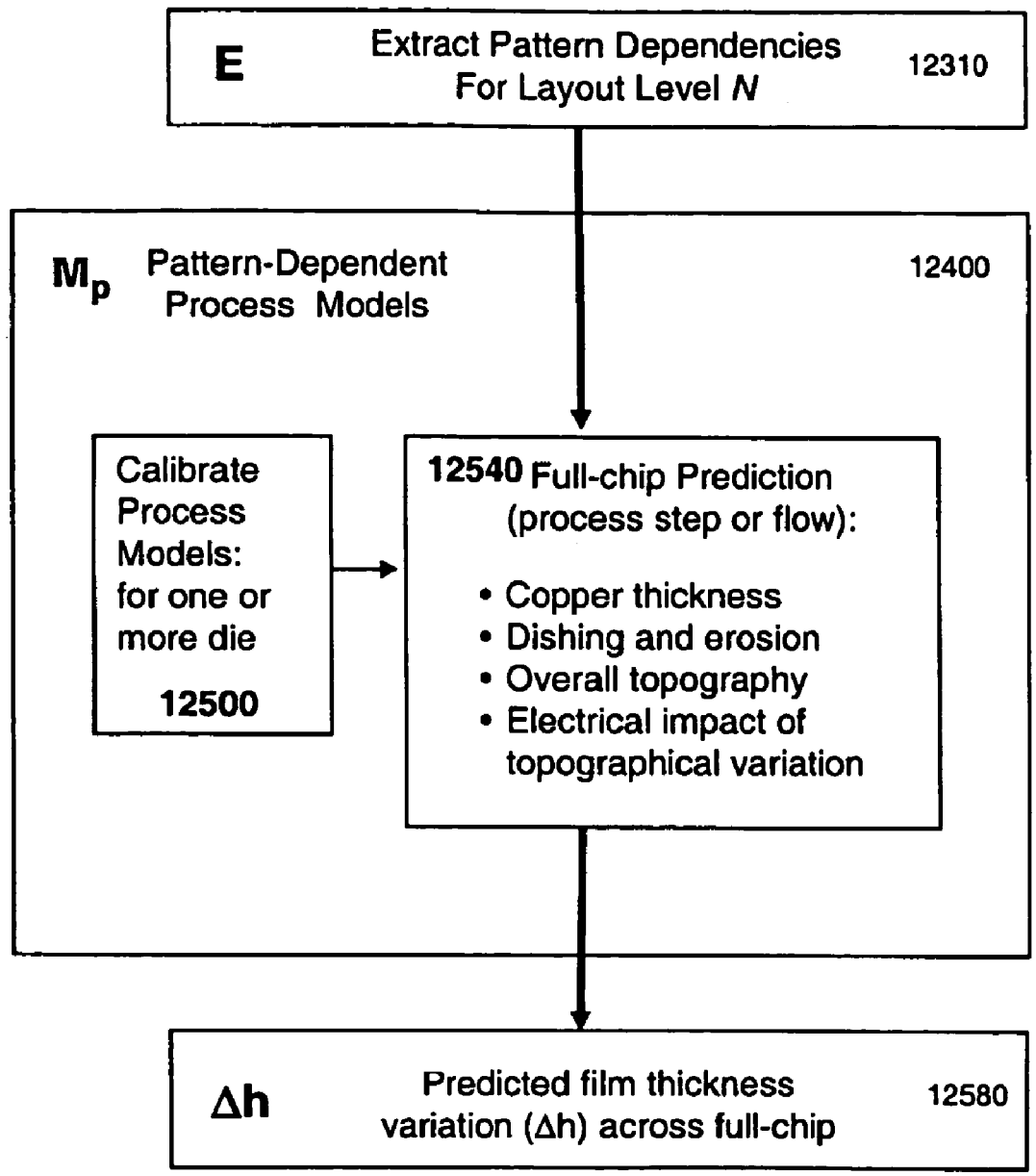
FIG. 56 describes a process model component.

As described in FIG. 56, pattern-dependent process models and model flows 12540 are used to map extracted IC patterns and characteristics 12310 to chip-level topographic variation across the chip 12580. Each process tool generally has unique characteristics and thus a model typically needs to be calibrated to a particular recipe and tool 12500. As such, the pattern-dependent model component 12400 includes the calibration step 12500 and the feed-forward prediction step 12540. Full-chip or partial chip predictions may include copper thickness, dishing, erosion or electrical impact of topographical variation. The following paragraphs describe the calibration step 12500.

Figure 57A:
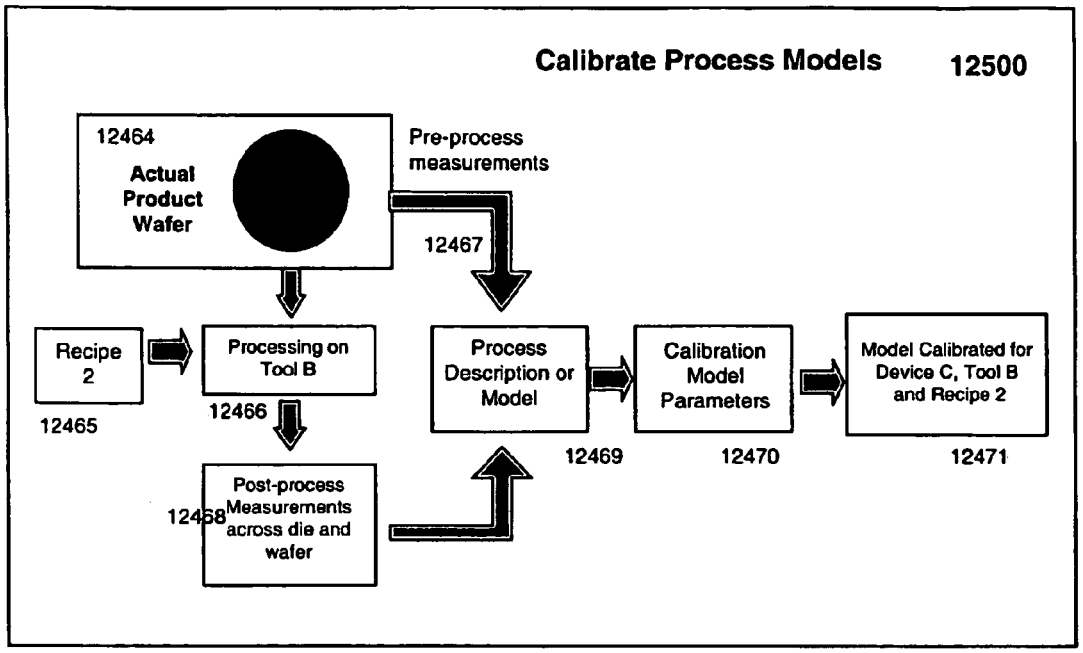
FIG. 57A illustrates the use of product wafers in calibrating a tool for a particular recipe.

It is common practice to physically process integrated circuits in accordance with a given IC design to determine the impact of processing on physical and electrical parameters and to develop or calibrate process models specific to a particular tool or recipe, as shown in FIG. 57A. In the calibration process 12500 shown in FIG. 57A, the actual product wafer 12464 is processed using a recipe 12465 on a particular tool 12466. Pre-process wafer measurements 12467 and post-process wafer measurements 12468 are used to fit model parameters 12469. A semi-empirical model is used to characterize pattern dependencies in the given process. The calibration model parameters or fitting parameters 12470 may be extracted using any number of computational methods such as regression, nonlinear optimization or learning algorithms (e.g. neural networks). The result is a model that is calibrated to the particular tool for a given recipe 12471. In other words, it is a model that, for the particular tool and recipe, is useful in predicting the characteristics of finished ICs that are processed according to a particular chip design.

Figure 57B:
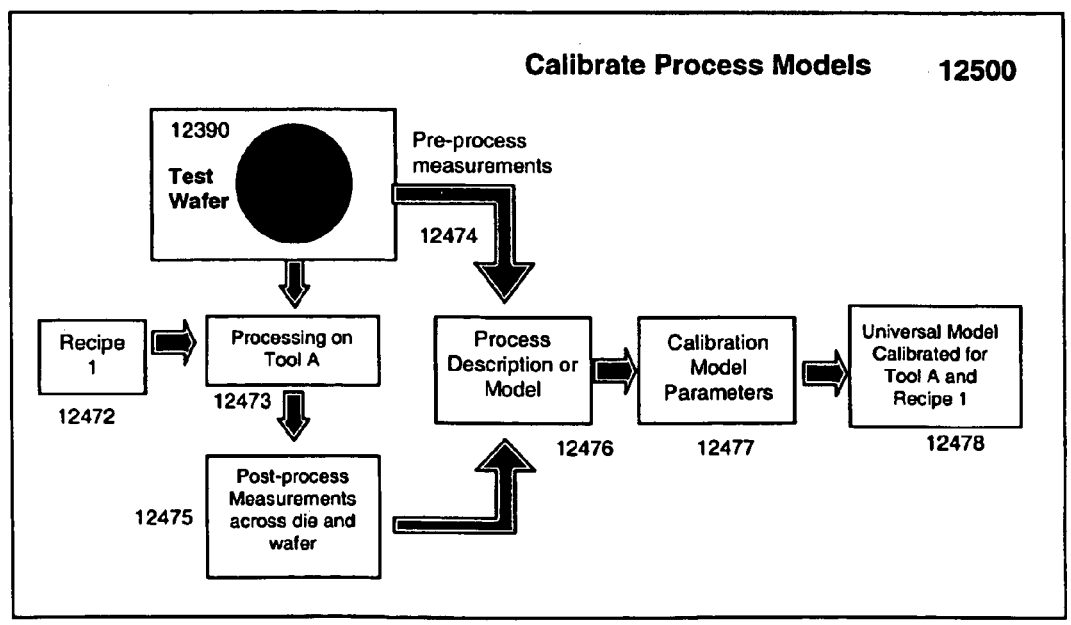
FIG. 57B illustrates the use of test wafers in calibrating a tool for a particular recipe.

Certain IC characteristics, such as feature density, width, and spacing are directly related to variation in topography for plating, deposition, and CMP processes. Test wafers that vary these features throughout some range across the die can be used to build a mapping from design parameters (e.g. width, space, density) to manufacturing variation (e.g. film thickness, total copper loss, dishing and erosion) for a given tool and recipe. Test wafers are an attractive alternative for assessing process impact than actual designed wafers because they are generally less expensive to manufacture and one test wafer design can be used to characterize any number of processes or recipes for a wide range of IC designs. As shown in FIG. 57B, a test wafer 12390 can be also be used to generate a calibrated process model or multiple process models or a process flow. The calibration model parameters may be computed similarly to the method shown in FIG. 57A. One difference is that the pre-process measurement, 12474, may be conducted by the test wafer manufacturer and retrieved in an electronic form, such as via the internet, email, disc or CD, or in paper form. Another difference is that the resulting calibration 12478 normally spans a much larger range of feature width, spacing, and density, and thus is more applicable to a broad range of devices that could be fabricated on the tool using the recipe. Since a test wafer is normally designed to span a large design space, the calibration process described in FIG. 57B is recommended.

Figure 58:
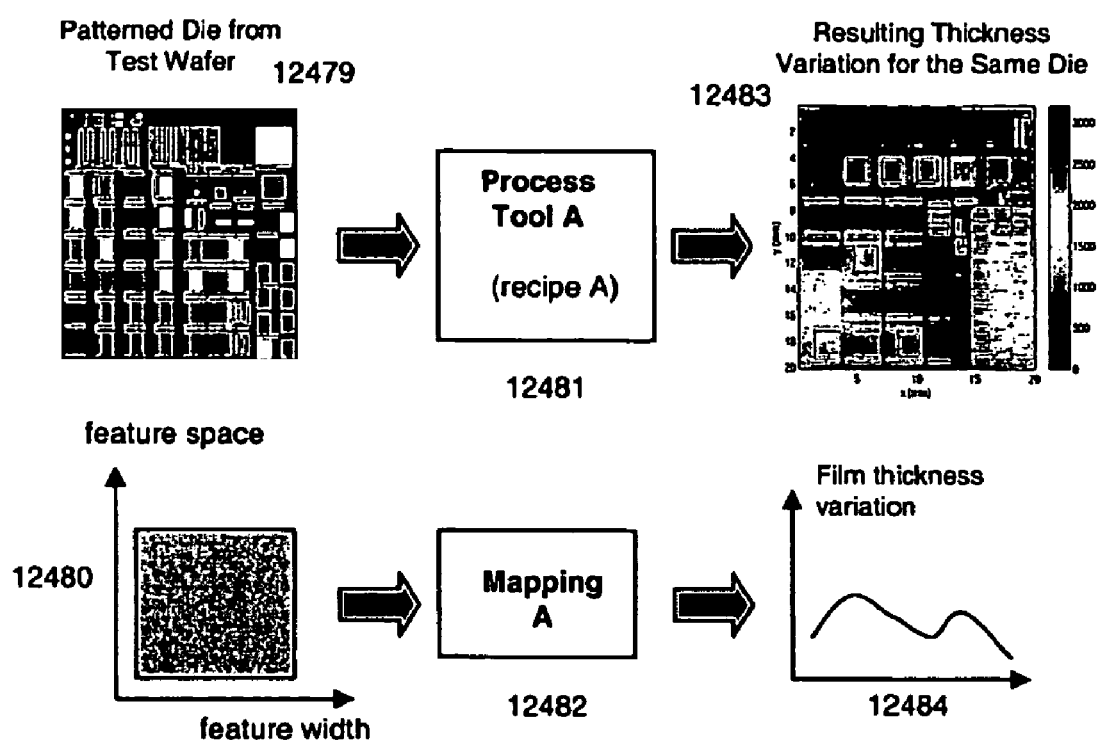
FIG. 58 illustrates how a calibration is used to map layout features to film thickness variation.

More details regarding the use of test wafers in calibrating a process are provided in FIG. 58. A test wafer die 12479 is patterned with a range of line width and line space values 480. The test wafer is processed (e.g., by CMP, ECD, or deposition) on a particular tool using a given recipe 12481 and the resulting variation in a parameter is measured across the chip 12483 using a metrology tool (e.g. film thickness, 12484). This mapping 12482, dictated by the calibration model parameters, may be considered a model that maps a wide range of line width and line space values to a particular film thickness variation for this tool and recipe.

Figure 59A:
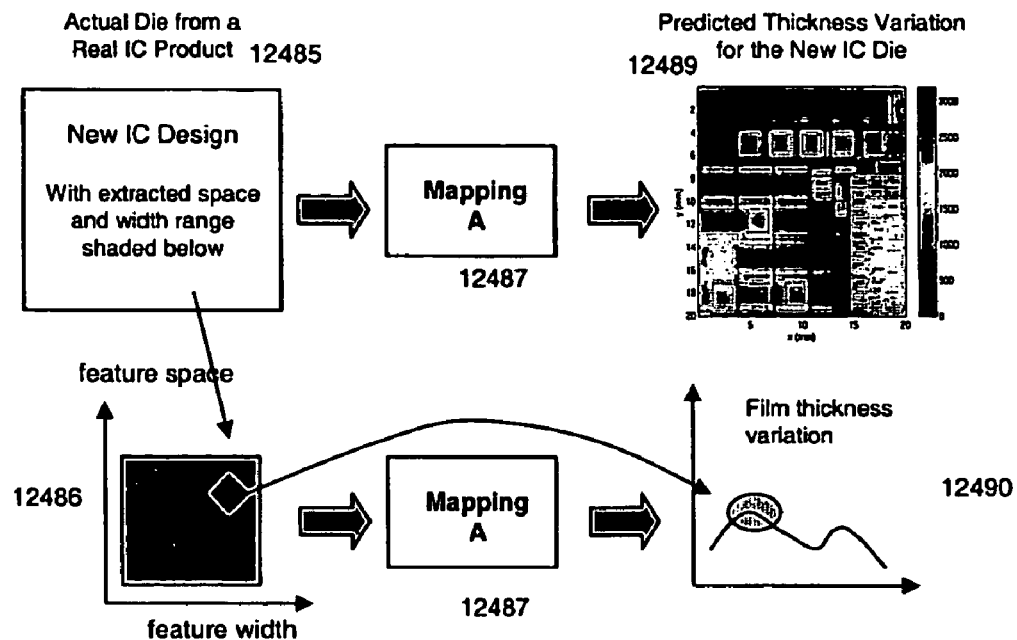
FIG. 59A illustrates the use of a calibration mapping to predict film thickness variation for an IC design.

These mappings are useful for predicting process variation for new IC designs, as shown in FIG. 59A. Feature widths and spaces that fall within the range 12486 spanned by the test die and wafer are extracted 12485 from a new IC layout. The extracted feature widths and spaces for spatial locations across the chip 12486 are input into the mapping 12487 and an accurate prediction of film thickness variation across the chip 12489 and 12490 can be acquired for a given tool and a given recipe before processing of the new IC design.

Figure 59B:
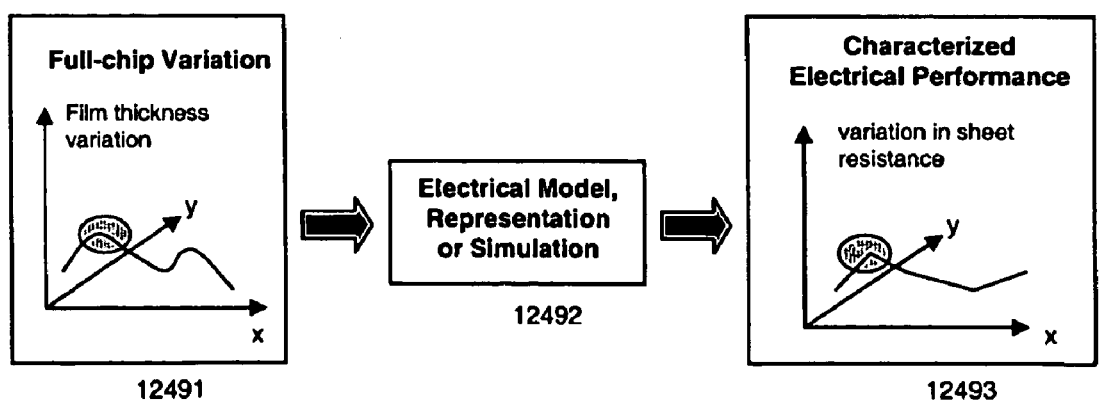
FIG. 59B illustrates how wafer-state parameters, such as film thickness variation, can be used to predict electrical parameters.

As shown in FIG. 59B, the predicted process variation 12491 (which may include variation due to lithography) can be fed into electrical models or simulations 12492 to assess the impact of processing on the electrical performance of the chip 12493. Some of the electrical parameters that may be computed using the models include variation in sheet resistance, line resistance, capacitance, interconnect RC delay, voltage drop, drive current loss, dielectric constant, signal integrity, IR drop or cross-talk noise. These predictions can be used to determine the impact of feature dimension variation on electrical performance for the full-chip or critical networks (also called critical nets).

The following paragraphs and figure descriptions provide a detailed flow of the use of process and electrical models to characterize variation, as implemented for lithography.

Figure 60:
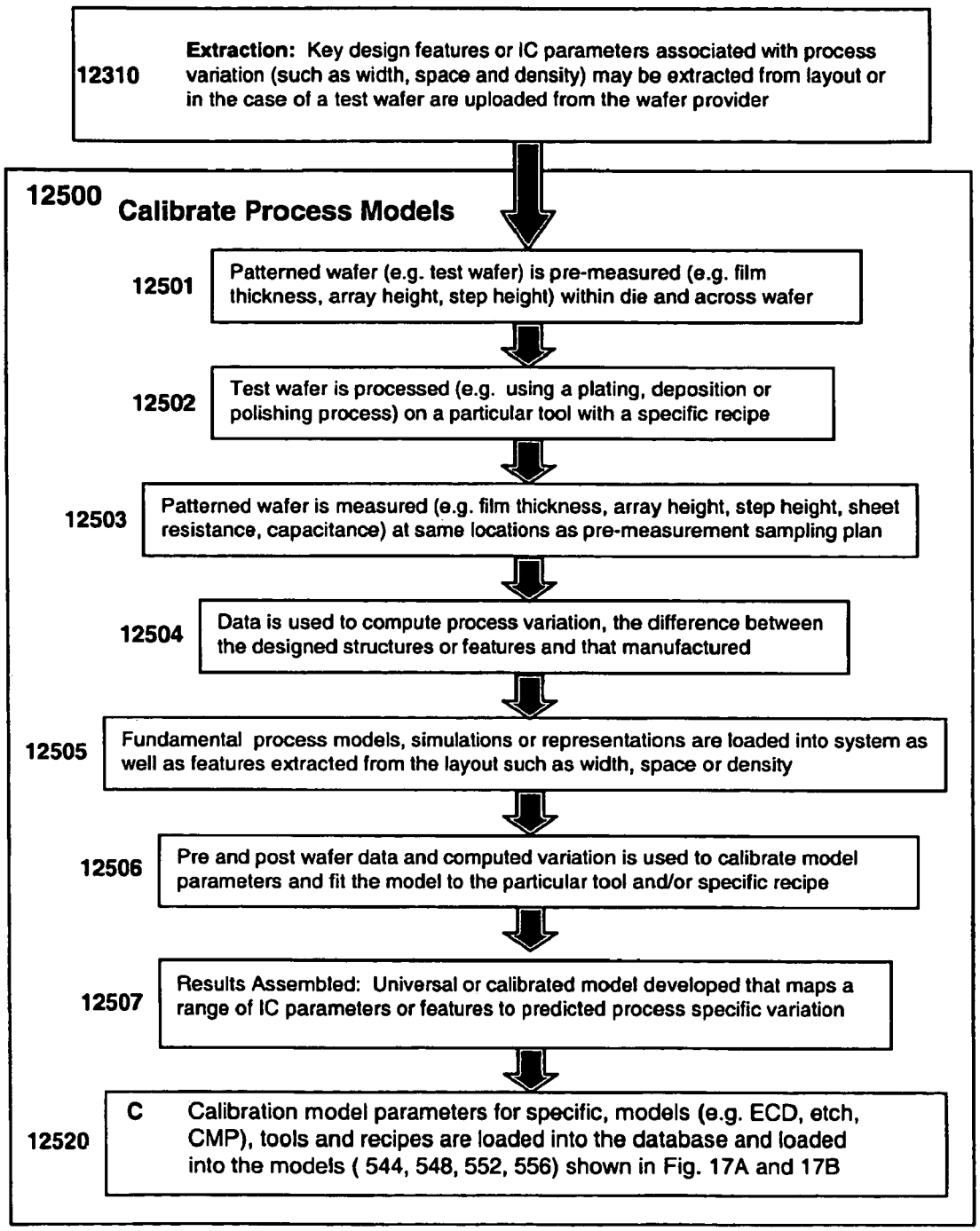
FIG. 60 illustrates steps in a calibration process.

FIG. 60 describes the steps involved in calibrating a process model to a particular tool or recipe. Layout extraction 12310 parameters are computed, or in the case of test wafers, uploaded from the wafer provider. The second step 12501 pre-measures the wafer using metrology equipment. These measurements may include film thickness and profilometry scans to acquire array and step heights. The test wafer is processed 12502 using the particular process or process flow that is to be characterized. Such processes or flows may include plating, deposition, and/or polishing steps. It is particularly useful to calibrate on individual processes and also to calibrate on sections of the flow as a way to capture any coupling of variation between subsequent process steps in a flow. It is also recommended to calibrate the model for different recipe parameters such as time. The processed wafers are measured 12503 at the same locations as the pre-measurements; such measurements may include film thickness, profilometry, or electrical characteristics; and the variation for the given process may be characterized 12504. Process models or representations are uploaded in 12505 and the pre and post measurements as well as computed variation may be used to calibrate or fit the model or representation to a particular tool and/or recipe or recipes. These models may be formulated and uploaded by a user or selected from a library of models on a modeling computer system. The pre- and post-processing measurements and computed process variation are used to fit the model or simulation parameters for the given tool and recipe 12506. The result 12507 is a process model calibrated to a particular tool and recipe or recipes. The result may also include a series of calibrated process models that can be used to simulate a process flow. The calibration model parameters for specific models (e.g. ECD, etch, and CMP), tools, recipes and flows are loaded into the database and into the models during feed-forward prediction 12520.

Figure 61A:
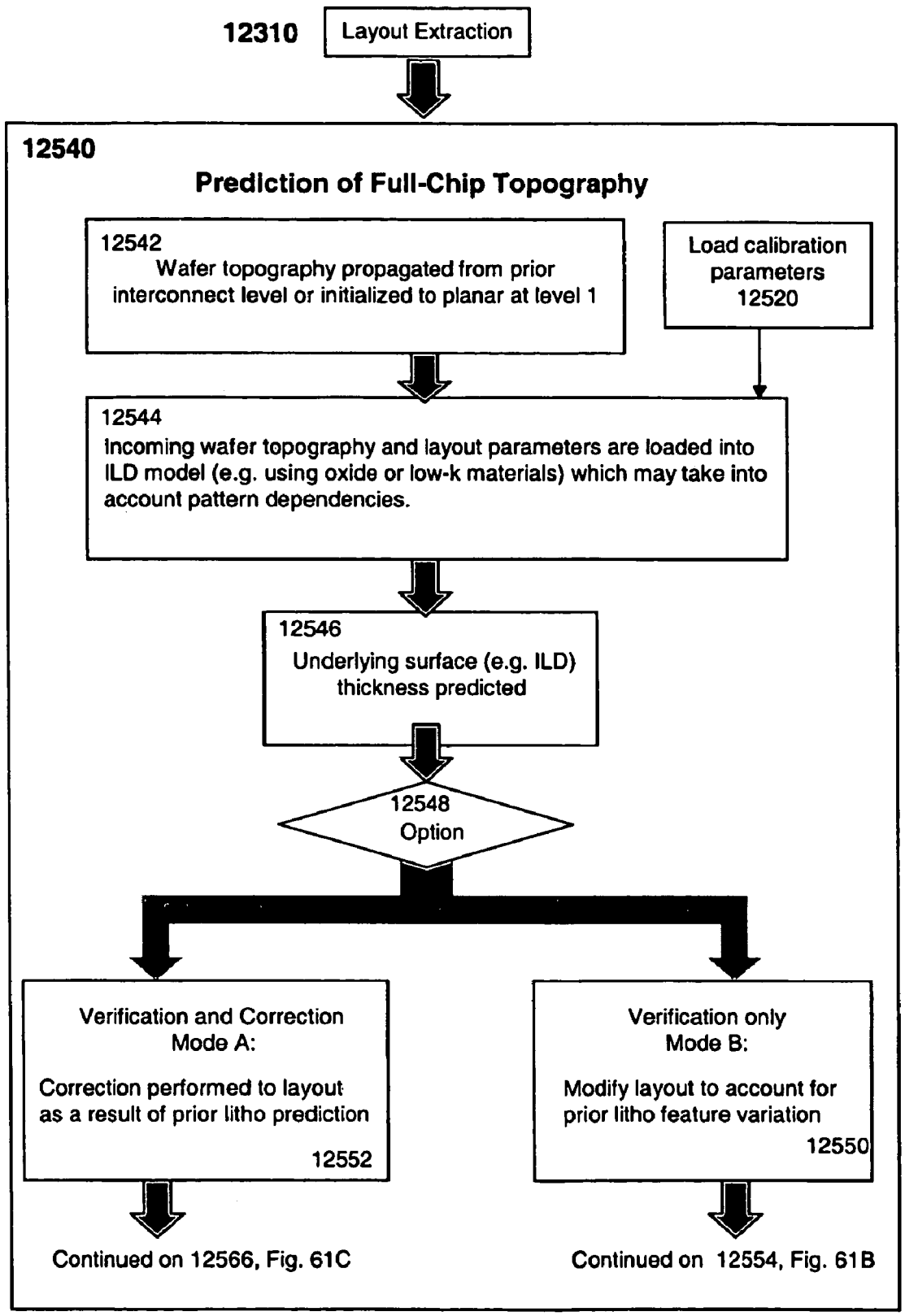
FIG. 61A illustrates steps in a prediction of full-chip topography.

The steps that constitute the feed-forward prediction component 12540 are described in FIG. 61A. A damascene process flow for predicting pre-lithography wafer topography is used to illustrate how a prediction may work but any process flow or single process step may be substituted. To simplify the process flow descriptions, pre- and post-processing wafer treatments that do not significantly affect wafer topography are ignored. Also to simplify the example to a generic damascene flow, the term interconnect level is used as a global reference to include both metal and via levels. Any additional oxide deposition or etch steps to form vias are not shown. The damascene flows illustrated can be easily extended to dual-damascene and other damascene process flows.

The extraction 12310 is loaded into the prediction component 12540. The prediction component then retrieves the incoming wafer topography 12542. For interconnect levels greater than 1, this is the last process step from the prior interconnect level. For the first interconnect level, either the incoming wafer topography can be predicted using pattern dependent modeling of component creation or initialized to planar.

Both the incoming topography and extracted parameters are loaded into an ILD process model to predict the resulting wafer surface 12544. ILD deposition models may include the use of oxide ($SiO_2$) or low-k material. It is recommended to include pattern-dependencies to acquire full-chip prediction, particularly when oxide CMP is inserted to planarize the ILD layer. As such, pattern-dependent oxide deposition and oxide CMP models may be used and may require the loading of model calibration parameters 520. The use of the prediction component in this manner may also facilitate the introduction of low-k materials into a damascene process flow. The result of this step is a prediction of the final ILD thickness 12546.

Depending on whether the prediction is part of mode A (FIG. 51) or mode B (FIG. 52) the flow has an option 12548. In mode A 12552, any feature dimension variation outside of the specification for level 1 has been used to modify the design such that the printed feature dimension for level 1 matches that of the design. So for mode A, the ILD thickness 12546 can be fed directly into the etch model 12566 on FIG. 61C.

In mode B 12550, the feature size variation that results from the lithography step needs to be used to update the layout extraction to the proper feature variation that downstream processes will receive. In this mode, the incoming wafer topography and layout parameters are loaded into the lithography model 12554. It is recommended to include pattern-dependencies in the lithography model to acquire full-chip prediction and as such, model calibration parameters may be required and loaded 12520. The feature size variation 12556 is predicted and used to adjust layout features, shrink or bloat features, to accurately represent the result of lithography 12558. The layout is generated 12560 and used to generate a new extraction 12562 that more accurately represents the effects of litho-based feature dimension variation. The new extraction 12564 is fed forward to the etch process step 12566. For an N-level interconnect process flow prediction in model B, this step will be repeated for each lithography step so that the full impact of feature dimension variation may be observed at level N.

The ILD thickness from the prior step 12566 and the layout parameters are loaded into an etch model. It is recommended to include pattern-dependencies in the etch model to acquire full-chip prediction and as such, model calibration parameters may be required and loaded 12520. The etch model predicts final wafer topography 12568, which, along with the layout parameters, is loaded into an ECD model 12570. It is recommended to include pattern-dependencies in the ECD model 12570 to acquire full-chip prediction and as such, model calibration parameters may be required and loaded 12520. The result of this step is a full-chip prediction of wafer topography after plating 12572. Some processes may also use an electrical chemical mechanical deposition (ECMD) step instead and the use of pattern dependent models is recommended.

The incoming wafer topography resulting from ECD and extraction parameters are loaded into the CMP process model or models 12574. CMP in a damascene process may be performed over a number of process steps. A typical example is when a bulk CMP step is used to remove most of the copper, a touchdown or endpoint polish is then done to slowly clear all the copper from the field areas without significant dishing and erosion of features and finally a barrier polish is performed to remove the barrier material. It is recommended to include pattern-dependencies in the CMP model to acquire full-chip prediction and as such, model calibration parameters may be required and loaded 12520. The final wafer topography that results from the CMP step or flow is generated 12575. Some of the wafer topography characteristics may include thickness, surface profile, dishing and erosion.

An optional step may be to include electrical extraction or performance analysis for the current, completed interconnects level 12576. Electrical characteristics that may be predicted from the full-chip CMP prediction include sheet resistance, capacitance, drive current, and, when multiple interconnect levels are considered, timing closure analysis. This step may be useful when verification is done to analyze the impact of lithography-based feature dimension variation on IC performance. Often feature dimension tolerances or specifications may not provide the level of resolution necessary to properly gauge the impact of feature dimension variation and this might be one way to gain a better characterization.

While the CMP step is the last physical process step in the prior interconnect level (e.g. level 1), the ILD deposition for the current interconnect level (e.g. level 2) needs to be predicted to acquire the wafer surface topography used in lithography prediction for the current interconnect level (e.g. level 2). Wafer topography and extracted parameters are loaded into the ILD process model to predict the resulting wafer surface or thickness 580. ILD deposition models may include the use of oxide ($SiO_2$) or low-k material. It is recommended to include pattern-dependencies to acquire full-chip prediction, particularly when oxide CMP is inserted to planarize the ILD layer. As such, pattern-dependent oxide deposition and oxide CMP models may be used and may require the loading of model calibration parameters 12520. The use of the prediction component in this manner may also facilitate the introduction of low-k materials into a damascene process flow. The result of this step is a prediction of the wafer surface before photoresist is added and lithography is performed 12580. The wafer surface topography is saved in a database or filesystem for use in prediction in subsequent interconnect levels 12578. Although it is not necessary to feed wafer topography forward between interconnect levels, it is recommended, particularly in cases where an oxide CMP step is not performed after ILD deposition.

Although photoresist deposition is not explicitly shown in this flow, in cases where pattern dependencies affect planarity of photoresist, then pattern-dependent photoresist models may be incorporated between ILD deposition and lithography models (or incorporated directly into the lithography models using test-wafers and lumping the photoresist and lithography effects into one model).

d. Prediction of Feature Dimension Variation Using Lithography Models

The lithography modeling and prediction component could be considered part of the process modeling component. However the process modeling component 12400 inputs pre-process wafer topography and predicts post-process wafer topography at each step in the flow. Where as the lithography component inputs incoming wafer topography, along with the design or pattern to be imaged, and predicts feature dimension variation. As such they are treated as separate components (section c. and section d.) in this description.

Figure 62A:
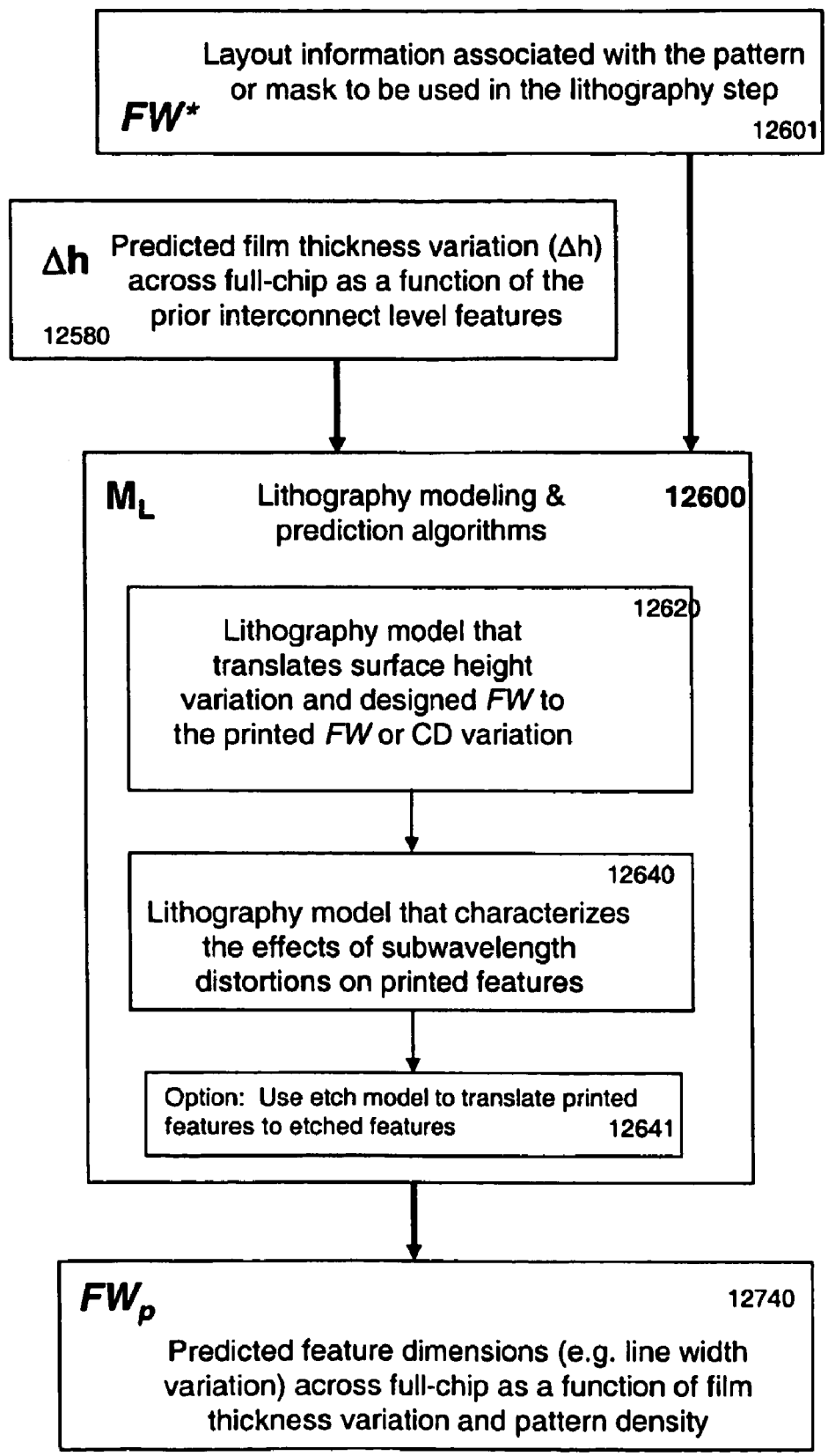
FIG. 62A illustrates an overview of a prediction of feature dimensions (e.g. line widths) resulting from lithography process steps or flows.

As illustrated in FIG. 62A, the predicted wafer topography variation ($\Delta h$) across the chip 12580 (e.g., the topography resulting from processing levels 1 through N) and the current layout information 12601, design or extraction, (e.g., the design from level N+1) are input into lithography modeling component 12600 which is used to map the predicted wafer topography and desired (or designed) feature width (FW*) to the lithography printed feature dimension (for example, feature width ($FW_p$)) variation across the chip 12740. The lithography process flow 12600 may also characterize pattern dependencies 12640 in lithography due to sub-wavelength distortions using data from test wafers or optical mathematical relationships. This mapping may be computed within the system or the results from optical proximity correction (OPC) may be computed, loaded into the system and used. The result is that predicted variation in printed feature dimension would address width variation due to topography and distortion, shown respectively in FIGS. 48 and 49.

Figure 62B:
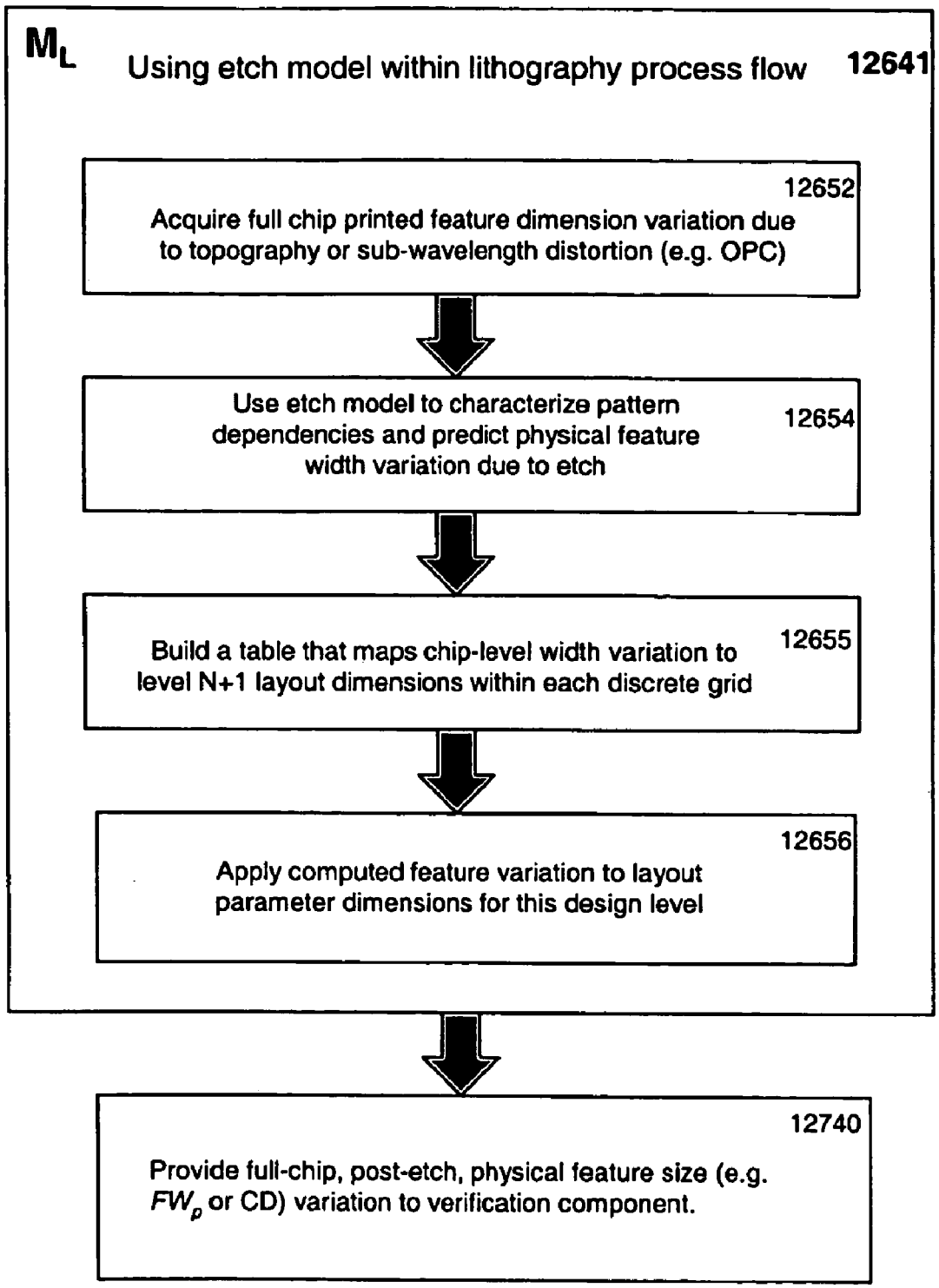
FIG. 62B illustrates a mapping provided by a etch prediction component

To capture pattern dependent width variation due to etch processing or to map topographical variation to etched features, an etch model may be used 12641 to map printed features to the physically etched features. As shown in FIG. 62B, component 12641 acquires 12651 the printed feature variation that results from topographical 12620 and distortion 12640. An etch model is used to characterize pattern dependencies and map full-chip printed feature variation to physical or etched feature variation. The etch model prediction may also include etch characteristics such as trench depth, sidewall angle and trench width. A table is constructed that maps 12655 printed variation from each discrete grid from layout extraction to physical feature variation. The variation may also be applied 12656 to the layout features within each grid to adjust the full-chip design to the printed and physical variation, depending on whether the prediction resolution needs to be at the grid or discrete feature level. (When 12600 is used in conjunction with verification component 12810, the grid level feature variation is applied to the discrete layout features and step 12656 may be skipped). By using components 12620, 12640 and 12641 within the lithography flow model 12600, the primary contributors to feature width variation may be characterized and predicted 12740. The optional etch component 12641 may be used with either of the two approaches described in the following paragraphs.

Figure 63:
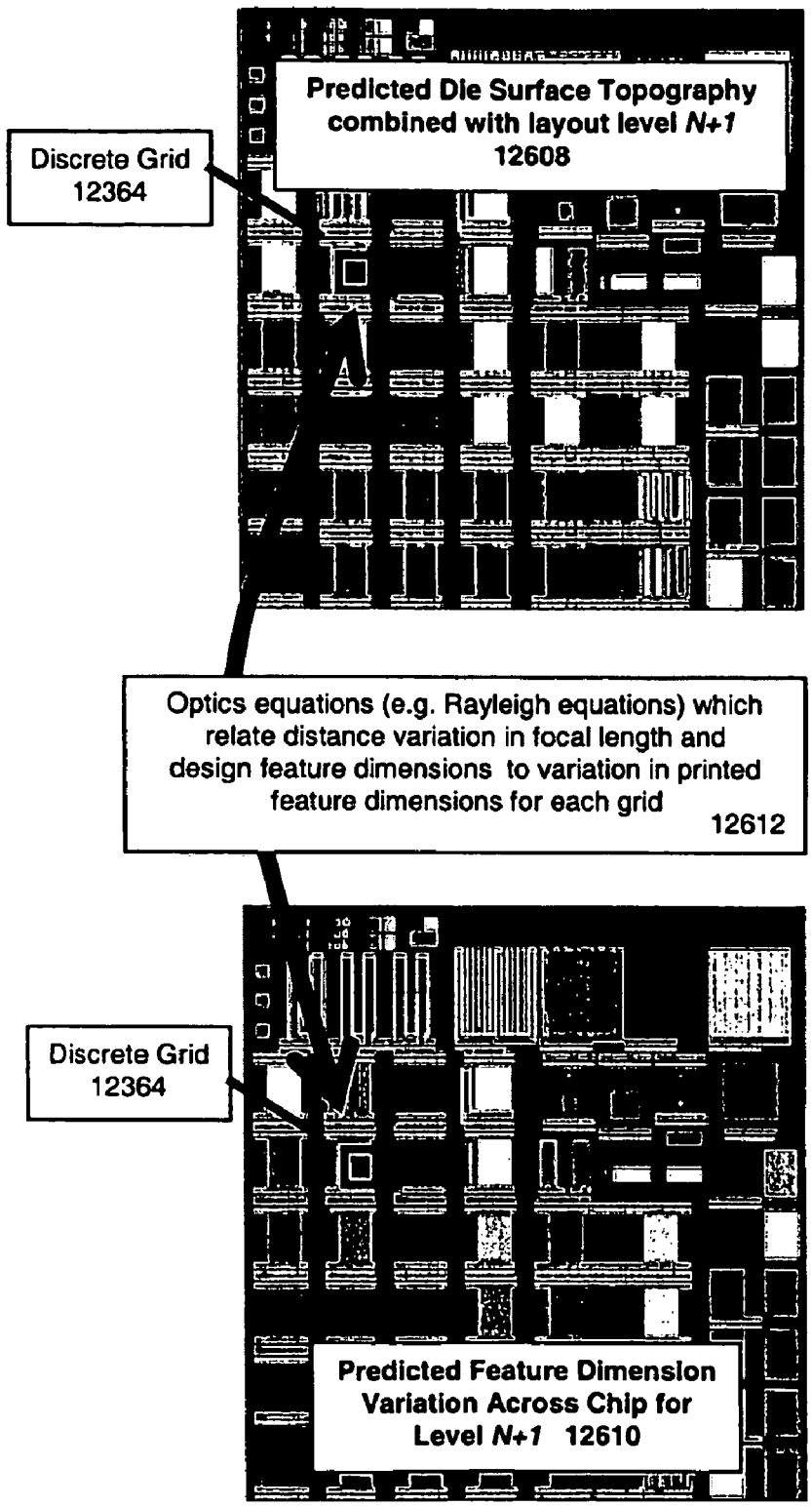
FIG. 63 illustrates a mapping provided by a lithography prediction component

A graphical illustration that depicts the current layout information projected onto the predicted surface topography for a die 12608 is shown in FIG. 63. The die is discretized to the level chosen in step 12312 of layout extraction, which controls the resolution of the thickness and feature dimension variation prediction. The lithography modeling component 12600 maps 12612 the designed width and die surface height at that grid location to corresponding feature variation (for example, in FW or CD) at the same grid location 12364. The mapping does this for all grid locations across the die, resulting in a full die map of feature dimension variation.

Two ways for computing feature dimension variation from chip topography are described. The first approach, shown in FIGS. 64 and 65, uses conventional optical proximity correction type tools to determine the effects of feature density and optical interference during the actual imaging. The second approach, shown in FIGS. 66 and 67, uses test wafers and calibration methods to characterize both topographical and pattern interference effects due to sub-wavelength distortion.

Figure 64:
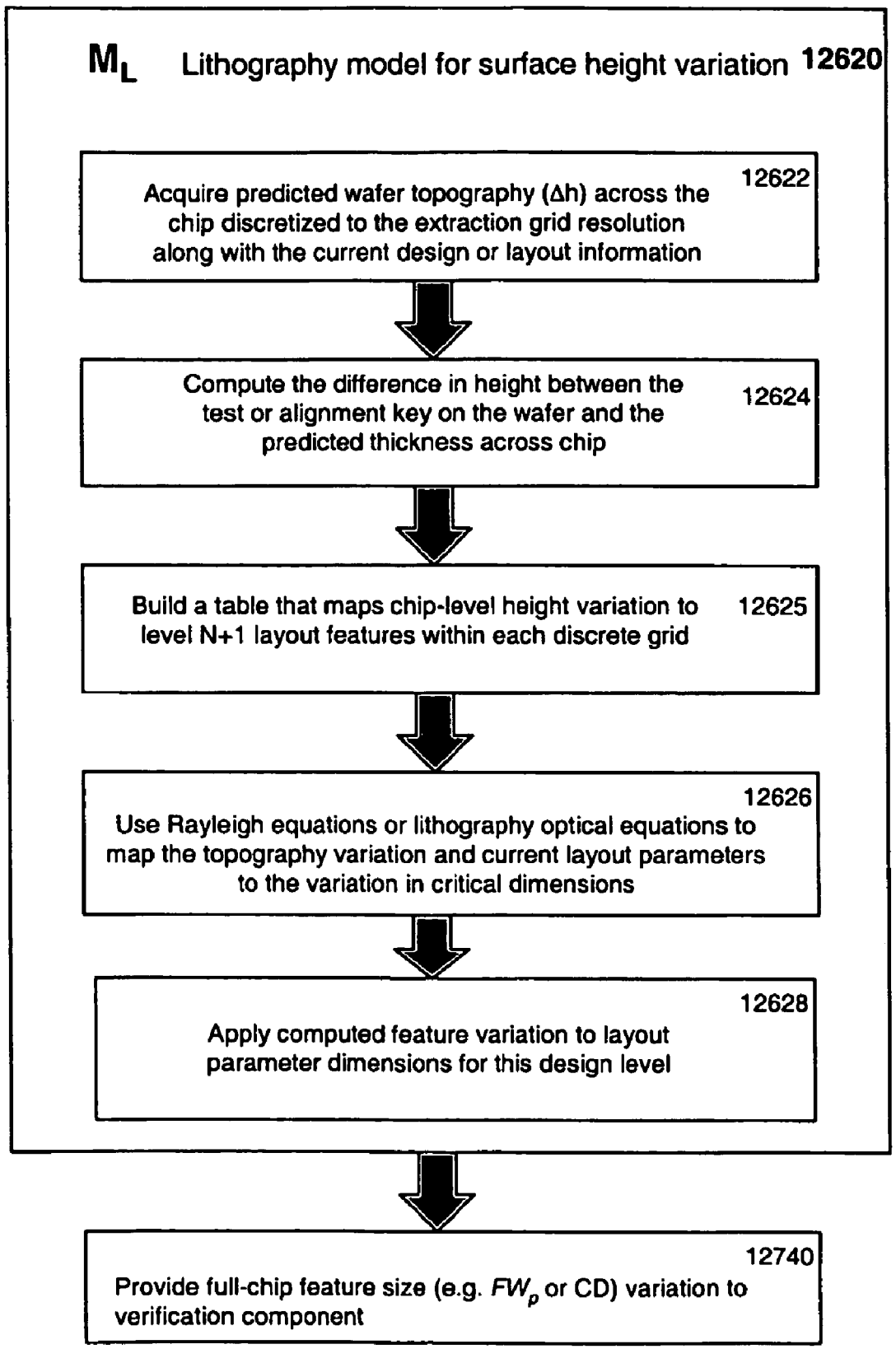
FIG. 64 illustrates steps in generating a feature dimension variation prediction with regard to variation in chip topography

FIG. 64 describes the steps for mapping chip surface height or topography variation and current design features to variation in the lithography printed or imaged feature dimensions of those features 12620. The predicted full-chip topography ($\Delta h$), consisting of each discrete element across the die, is loaded 12622 into the component 12620 along with the current design or extraction 12601. The difference between chip topography and a common reference, for example a test or alignment key near the edge of the die, is computed 12624. Since the imaging system focal length may be adjusted to an alignment or test key, this would allow for rapid computation of features within and outside the depth-of-focus. A table is assembled that maps chip-level height variation to layout features (e.g., metal level N+1) within each discrete grid. There are a number of optical mathematical expressions for relating focal distance to feature resolution that may be used to map 12626 chip surface topography and design features. Similarly, there are tools for mapping layout extraction parameters to the associated feature dimension variation for each feature, grid, or an aggregate metric (e.g. maximum or mean) for the entire die. A common relationship may be derived from the well-known Rayleigh equations for optics, using $k_1$ and $k_2$ constants appropriately derived or provided for a particular lithography tool. The variation in feature dimension can be applied to the layout features within the grid resolution of the chip surface prediction to generate a full-chip prediction of printed feature dimension (e.g. FW or CD) 12628. The full-chip prediction of printed feature dimensions (e.g. line widths) is provided 12740 to the verification component 12800.

Figure 65:
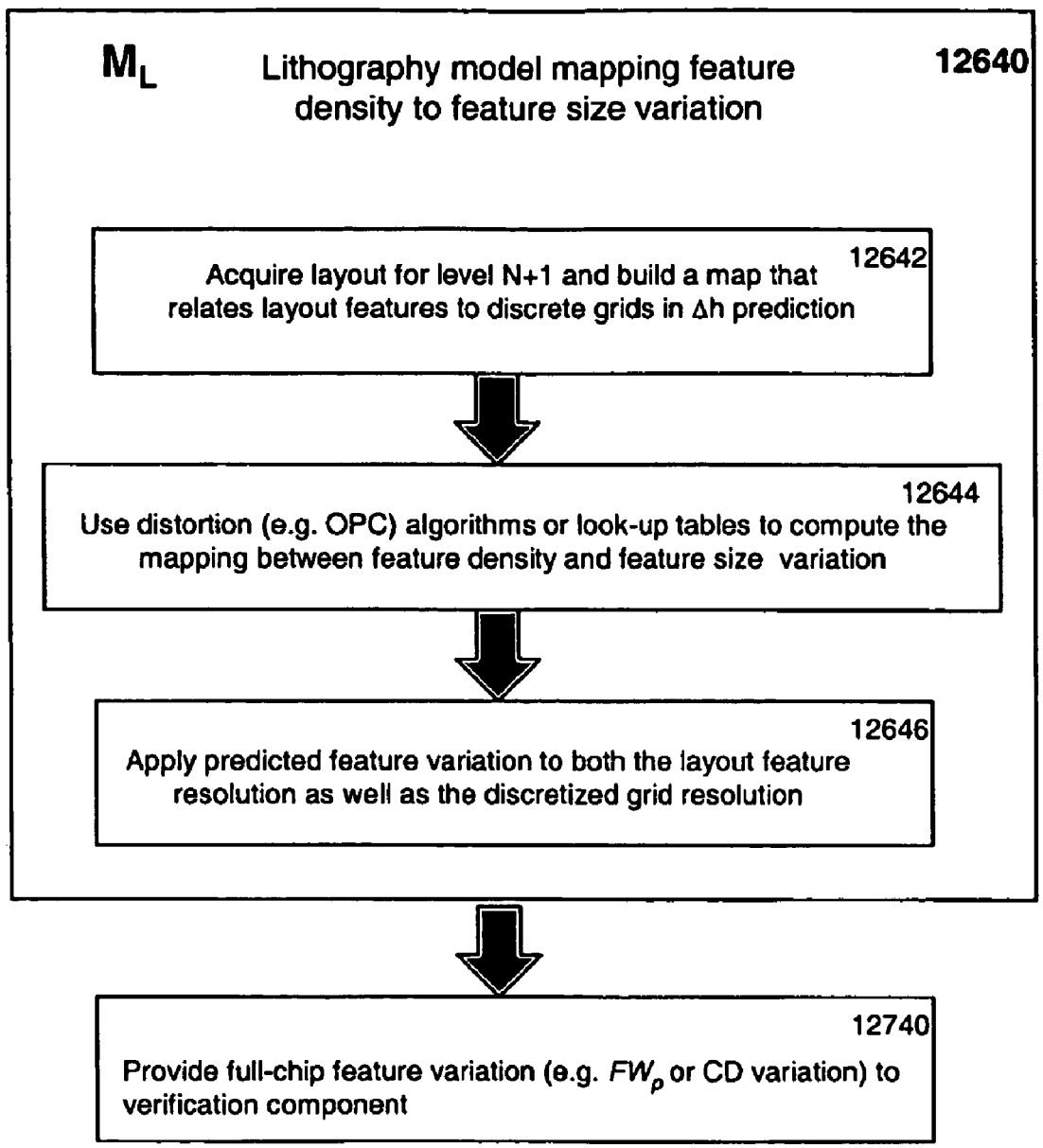
FIG. 65 illustrates steps in generating a feature dimension variation prediction with regard to variation in chip feature density

FIG. 65 describes the steps for mapping pattern feature densities to variation in lithography printed or imaged feature dimensions 12640. The layout for the current design level is loaded and a table is assembled that maps layout features to discrete grids in chip surface topography prediction $\Delta h$. Conventional optical proximity algorithms, many of which are commercially available in EDA tools, are used to map feature density to feature dimension variation 12644. The computed feature dimension variation is at the layout feature resolution that is provided at both the layout resolution and extraction resolution 12646. The resulting computation of feature dimension or feature width variation is then provided 12740 to the verification component 12800.

Figure 66A:
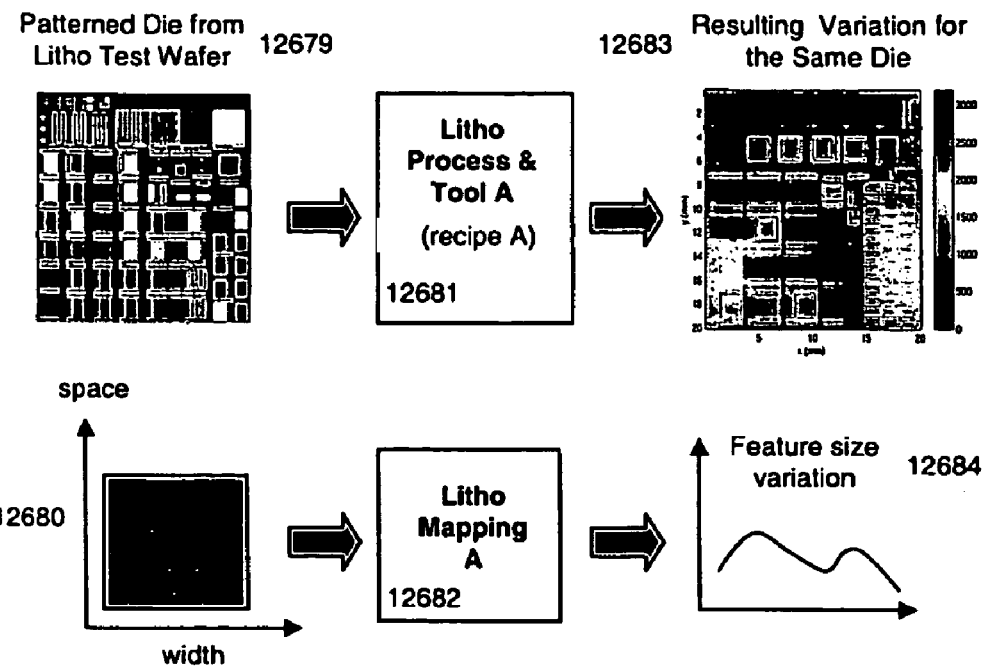
FIG. 66A illustrates the use of test wafers to calibrate a lithography model to a particular tool and recipe.
Figure 66B:
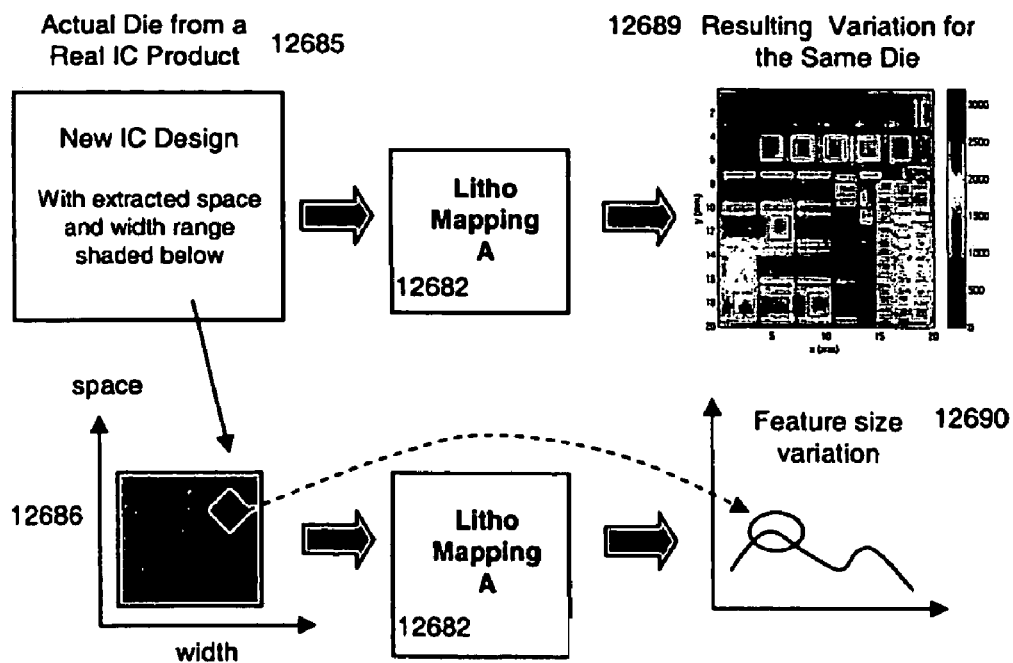
FIG. 66B illustrates the use of calibrated lithography models to predict feature dimension variation.
Figure 67:
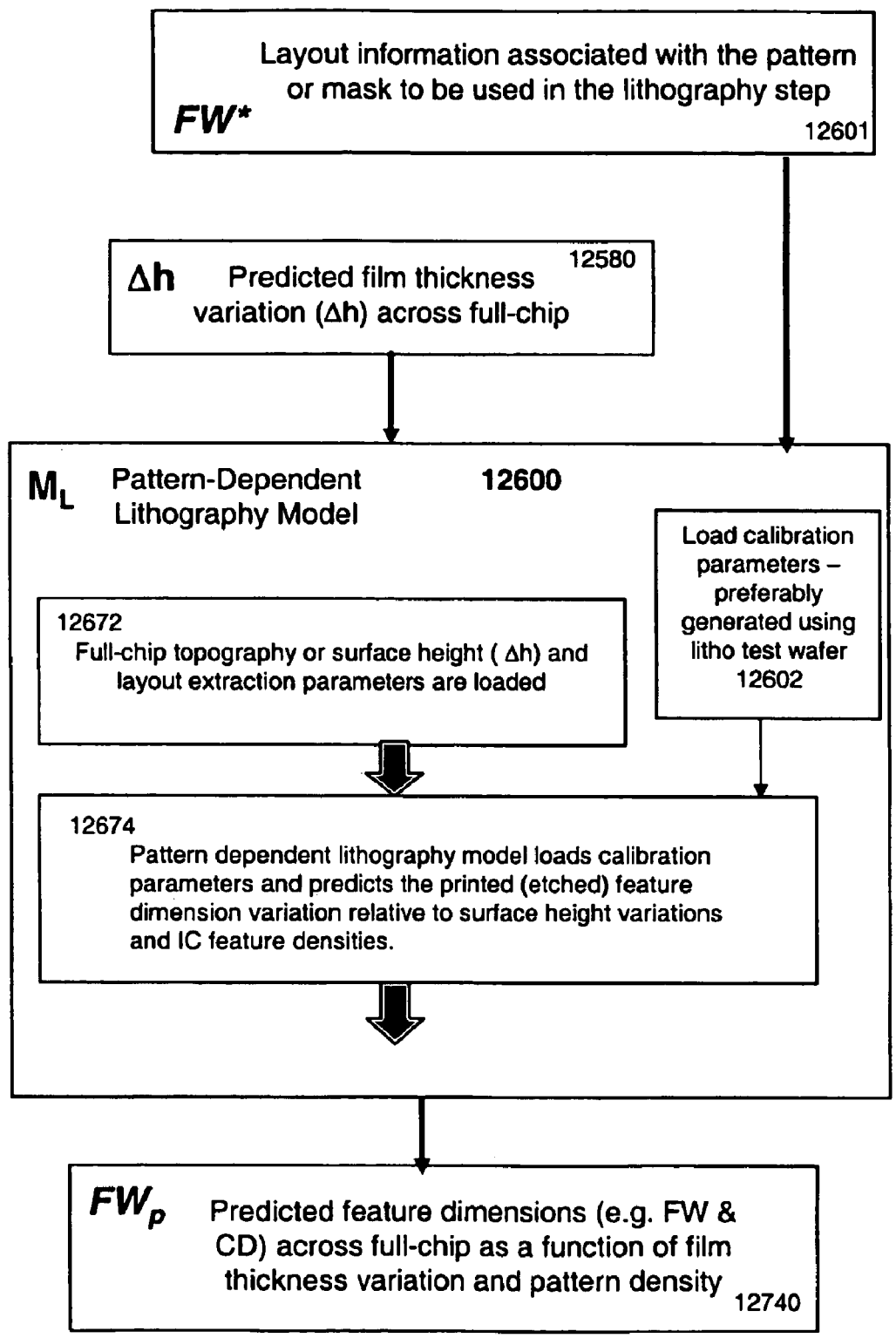
FIG. 67 illustrates steps in using calibrated lithography models to predict feature dimension variation.

The second approach to implementing the lithography modeling and prediction component 12600 is illustrated in FIGS. 66 and 67. The second approach uses methods described in section c. to generate a calibrated lithography model for relating surface height, designed CD, and feature width FW, and pattern interference effects to feature dimension variation (e.g. CD and FW). The model is calibrated using the steps described in section c. and illustrated in the flow diagram of FIG. 60.

The use of test wafers for calibrating a lithography model for a particular tool and settings are illustrated in FIG. 66A. A lithography test wafer die 12679 is patterned with a range of width and space values 12680 (density can be computed given both FW and FS) that may include one or more levels of structures. The structures on these levels may be chosen to represent multi-layer effects of variations in line widths and lines, and via chains and other structures, to capture pattern dependencies associated with design levels of interest (e.g. interconnect levels). Further details and examples of test wafer structures that may be used are provided in section f. The test wafer is processed on a lithography tool using a given recipe 12681 and then a subsequent etch process is performed to remove material according to critical dimensions printed during lithography. The resulting variation in feature dimensions (e.g. CD or FW) is measured across the chip 121683 using a metrology tool 12684 (e.g., an SEM, a physical surface profiling tool, or an optical feature profiling tool). The measured parameters are used to calibrate a lithography model that provides the mapping 12682 between the two spaces 12680 and 12684. This mapping, dictated by the calibration model parameters, may be considered a model that maps a wide range of feature and surface topography values 12680 to a particular feature size variation 12684 for this tool and recipe.

These mappings or calibrated models may be used for predicting feature size variation for new IC designs, as shown in FIG. 66B. The width, space (and density) of features that fall within the range 12686 spanned by the test die are extracted 12685 from a new IC layout. The extracted features 12685 for spatial locations across the chip 12486 are input into the mapping 12682 and an accurate prediction of feature size variation across the chip 12689 and 12690 can be acquired for a given tool and a given recipe before processing of the new IC design.

The predicted process variation may also be fed into electrical models or simulations to assess the impact of processing on the electrical performance of the chip, similarly to what is shown in FIG. 59B. Some of the electrical parameters that may be computed using the models include variation in sheet resistance, resistance, capacitance, interconnect RC delay, voltage drop, drive current loss, dielectric constant, timing closure, signal integrity, IR drop or cross-talk noise. These predictions can be used to determine the impact of feature size variation on electrical performance.

FIG. 67 describes the steps for computing predicted feature dimension variation using pattern-dependent lithography models. This approach may also use lithography test wafers, examples of which are provided in section f., to calibrate the model to, for example, a particular lithography tool, features, or a stack of levels below the current design level, and photoresist type. The predicted (or in some cases, measured) chip level surface height variation $\Delta h$ from the prior process step or steps (e.g. ILD deposition, oxide CMP, or photoresist spin-on) is loaded 12580. The layout information associated with the current design level, which may consist of layouts, extractions, or a combination of them, is also loaded from file system or database 12601. The calibration model parameters are loaded into the model for prediction 12602. A pattern-dependent lithography model is used to predict feature size variation for the given design layout 674 and provides 12740 it to the verification component 12800.

e. Verification and Correction of Lithographic Feature Dimension Variation

The predicted feature dimensions are then compared to the design specifications to verify that none of the printed (or etched) features would exceed the specifications and tolerances for the design. Those sites or features that do exceed the tolerances are identified and their coordinates stored. As described in FIG. 50, the feature width variations may also be used to modify a design file, which can be fed into an electrical simulation to examine the electrical impact on performance. The feature width variation may also be combined with topographical variation for full interconnect level electrical characterization as well. Within the context of the methods described here, electrical impact also includes full-chip prediction of sheet resistance, total copper loss, capacitance, drive current and timing closure parameters. In the verification mode, modification to the design file of the feature width variation is primarily for simulation purposes and to simply reflect the variation induced by manufacturing. Such design files would not be used for mask creation. To correct for the predicted feature width variation, the following mask correction approach may be performed.

The user may also choose to have the system correct the designed features used in making the masks so that the actual printed dimensions would equal the desired or designed values. The corrected design is then used during tape-out to construct masks such that the actual lithography printed dimensions and features yield those originally designed and desired. The following paragraphs and figures describe the verification and correction components.

Figure 68:
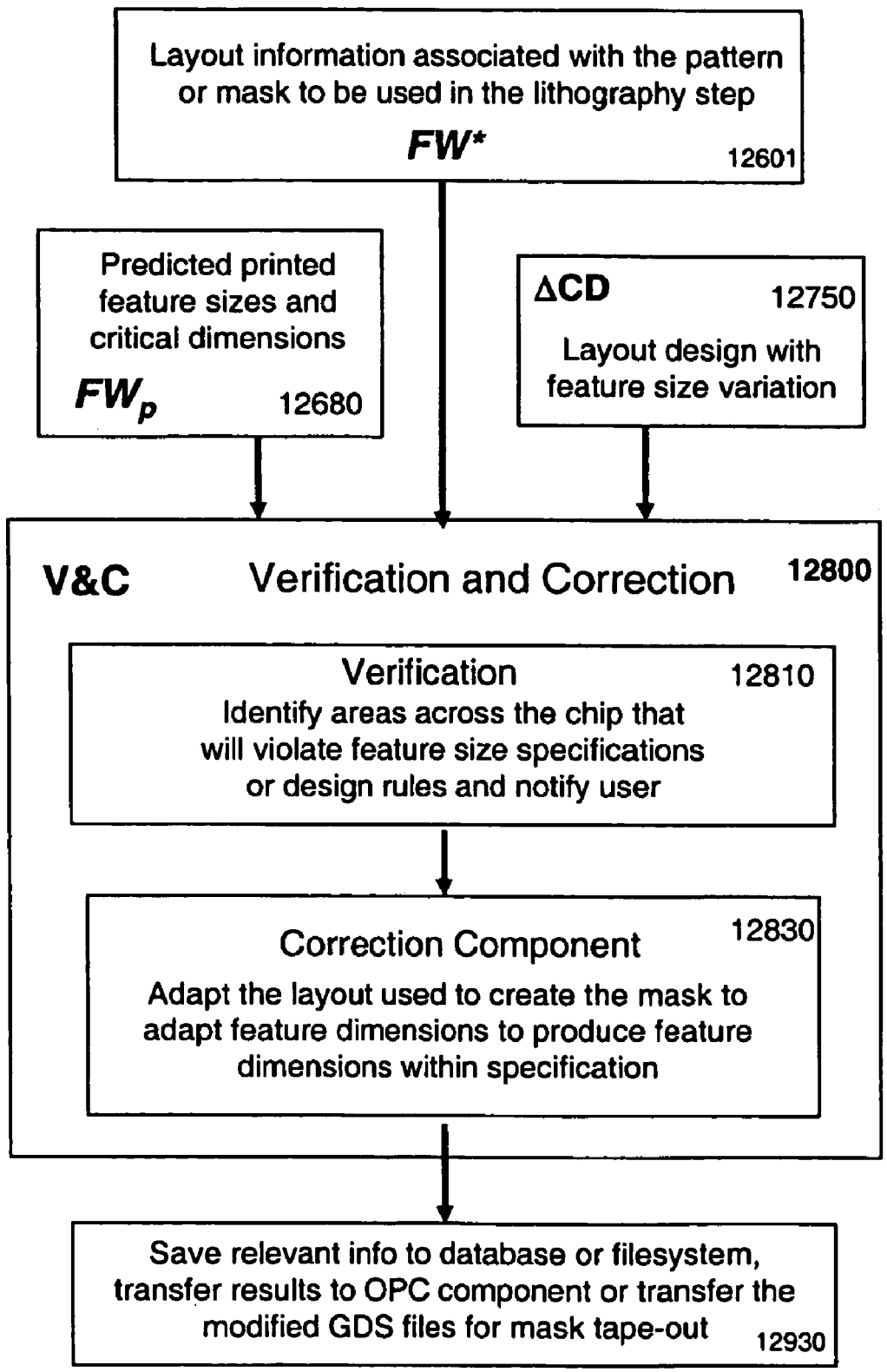
FIG. 68 illustrates an overview of a verification and correction component.

A flow diagram of how the verification and correction component fits into the overall concept is shown in FIG. 68. Layout information, which may include design and extraction data 12601, predicted critical dimensions, and feature sizes 12680, are loaded into the verification and correction component 12800. The critical dimension and feature size specifications are also loaded 12750 and, optionally, electrical specifications may be loaded for comparison with simulated electrical performance of the printed circuit dimensions. Verification performs a comparison between predicted and specified dimensions and identifies those features that exceed design tolerances (e.g., feature size variation or electrical performance). The verification component may be used alone or in conjunction with the correction component 12830 to modify the layout (e.g., GDS file) to produce the desired printed circuit dimensions. Depending on whether either or both verification and correction components are used, the results may be saved to a file system or database for further viewing and analysis by the user 12930. When correction 12830 is used, the resulting layout may be further tested for sub-wavelength optical distortion and optical proximity correction or directly sent in the form of a GDS file to the mask tape-out process, the first step of mask creation 12930.

The verification component may be implemented in three ways depending upon how the user has specified the grid resolution of layout extraction 12312, which also defines the resolution of the topography prediction. As described in section a., a finer grid resolution during extraction generally provides a more accurate representation of the minimum feature sizes on the chip. However there is a significant increase in the computational time and resources necessary to shrink grid size to finer features. It is left to the user to determine the correct tradeoff; however the following paragraphs provide two approaches to verification that address grid resolution larger (shown in FIG. 69A) than the feature dimensions and smaller (shown in FIG. 69B) than the feature dimensions. It is unlikely that one could choose a single grid resolution that would accommodate all IC features. However in the case that hierarchical grid resolution is tailored to underlying feature size, a method is also shown in FIG. 69C for verification when the grid resolution matches the feature resolution or it is computationally necessary to use the grid resolution.

In all cases, feature width variation may be imported into electrical simulation or extraction tools to characterize the electrical impact as well as the physical impact. It may also be beneficial to verify the electrical performance of a complete interconnect level and as such, one may combine topographical variation from subsequent ECD or CMP steps and import both variation calculations into electrical extraction tools. Such electrical characterization could be performed at the full-chip level or for some critical sub-portion of the circuit.

Figure 69B:
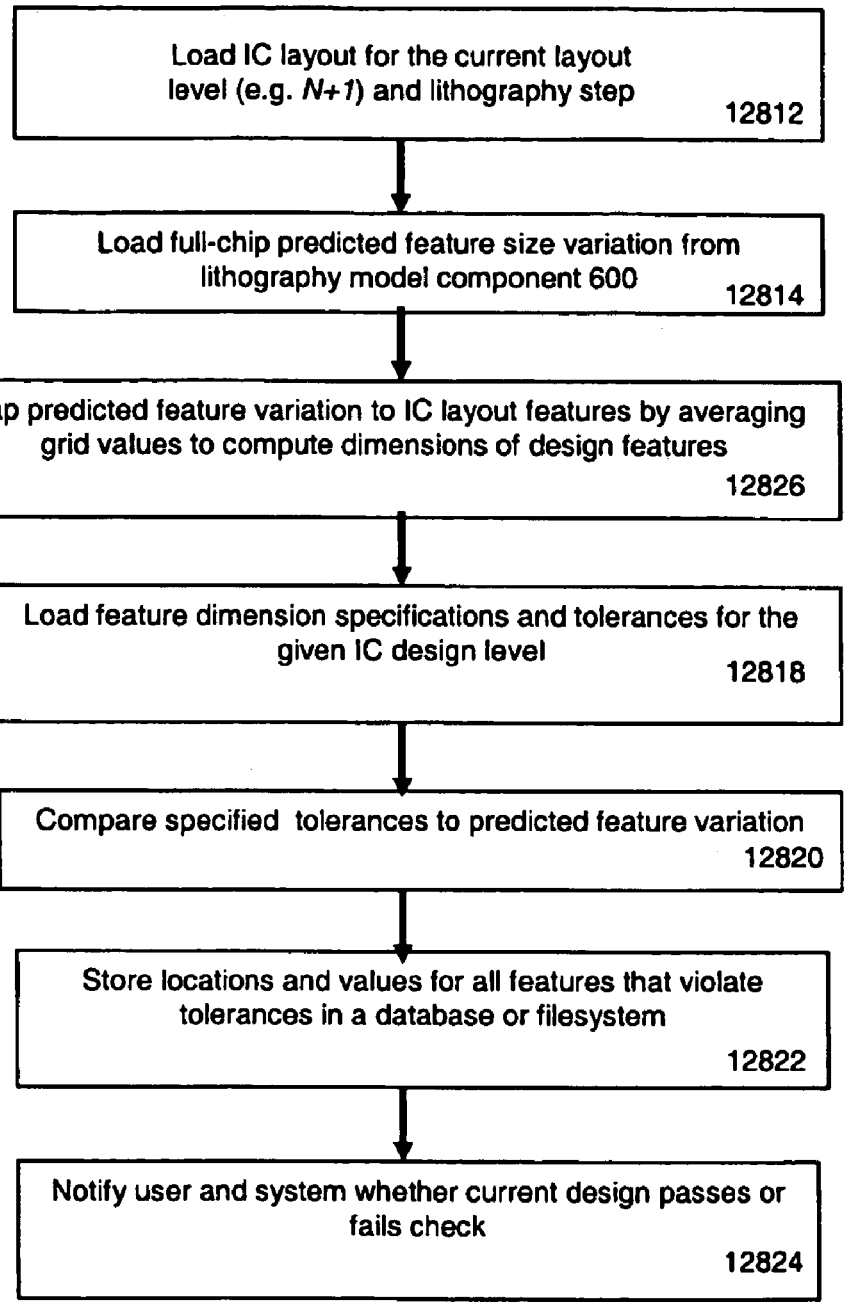
FIG. 69B illustrates steps in verification option B.
Figure 69C:
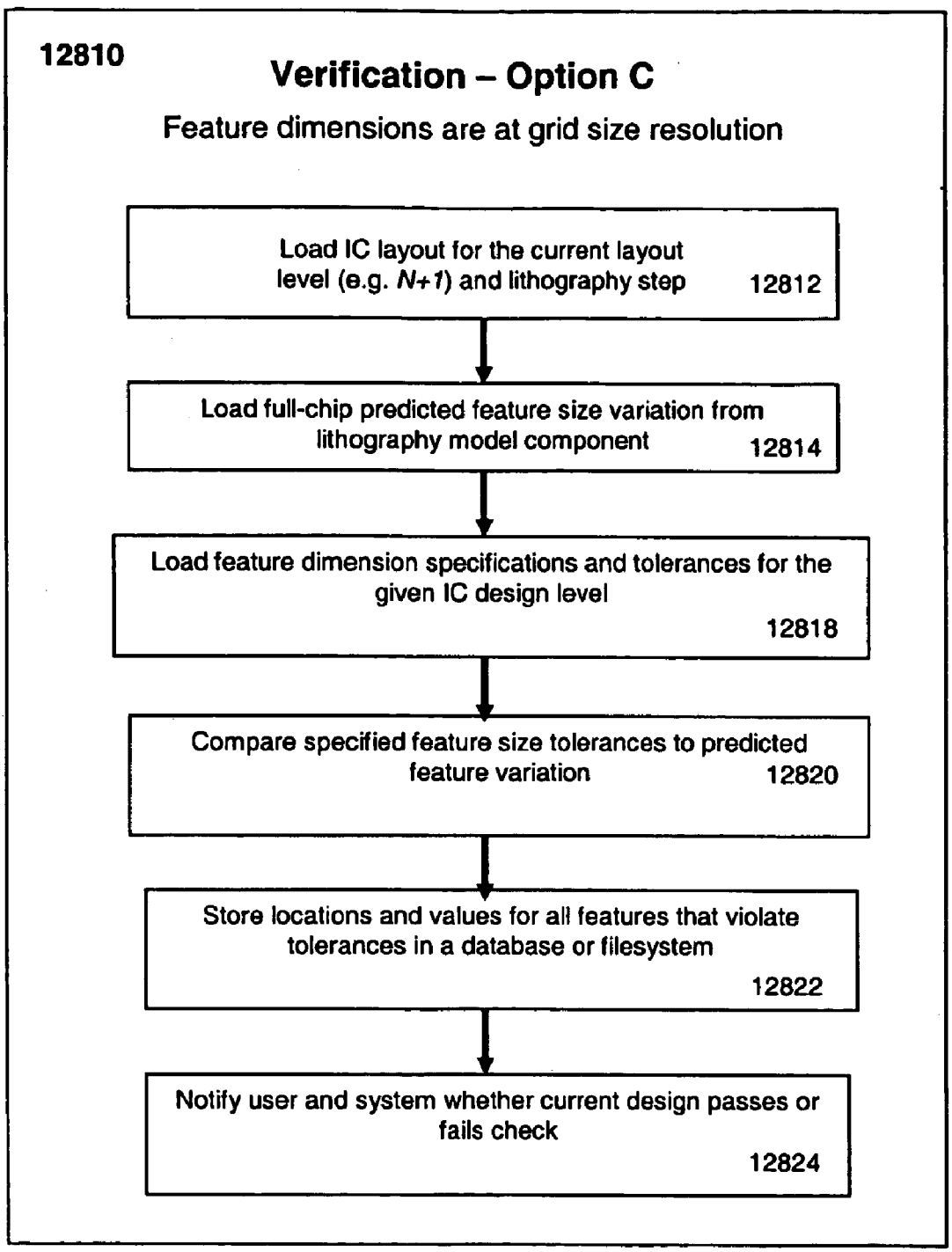
FIG. 69C illustrates steps in verification option C.
Figure 69D:
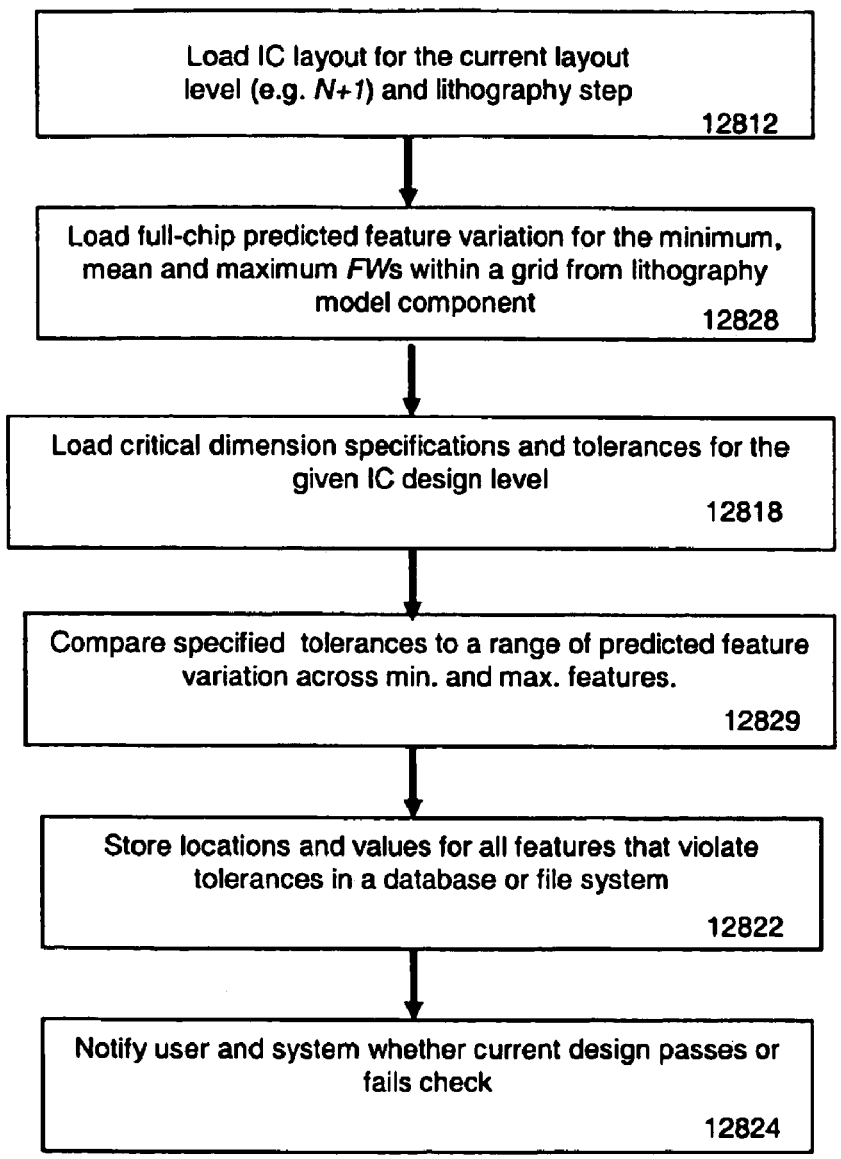
FIG. 69D illustrates steps in verification option D.

Another approach is described in FIG. 69D that uses a statistical description of each grid (e.g. maximum, minimum, and mean feature size, or density) to determine if any features on the chip will violate tolerances. While computationally much faster, this approach may provide less accuracy than the approaches in FIGS. 69A, 69B and 69C in terms of modifying the individual features within the discrete grids. In this approach, a general heuristic is used to change features relative the distribution for that grid (e.g., shrink the minimum features within a grid by 10%).

Verification for discrete grid sizes greater than the minimum IC dimensions is described in FIG. 69A. In the first step, the design layout for the current layout level (e.g., interconnect level N+1) and the lithography step are loaded 12812. The full-chip predicted feature dimension variation 12680 from lithography is also loaded 12814. The predicted variation for each grid is apportioned to the features within the grid according to the (possibly probabilistic) distribution of feature dimensions within the grid 12816. For interconnect levels, much of this apportionment may be the shrinking and bloating of lines. This step 816 is done to provide a common basis for comparison between the layout feature and predicted dimensions. The design specifications and tolerances for the chip or given IC level are loaded into the system 12818. A comparison is made between the mapped variation from step 12816 and the specifications 12820 and those values that exceed the given tolerance are stored 12822. The user is then notified whether the current design has any areas that exceed the tolerance and, if not, the design is certified as passing the verification check.

Verification for discrete grid sizes less than the minimum IC dimensions is described for Option A in FIG. 69B. The only difference between FIGS. 69A and 69B is the third step 12826 where, in FIG. 69B, the values for discrete grids are averaged over a feature dimension to compute a predicted value at the same resolution as the layout. This is done to provide a common basis for comparison between the layout feature and predicted dimensions.

Verification for discrete grid sizes that are equal to the minimum IC dimensions is described for Option C in FIG. 69C. The only difference between FIG. 69C and FIGS. 69A and 69B is the removal of any need to transform the predicted values to the same resolution as the layout and as such, there is no need for any step 12816 or step 12826. Additionally this approach can be used with a general heuristic that checks for violations at the extraction resolution, computes corrections (in 12830 of FIG. 70) and applies them to all features within the grid (e.g., shrink all widths within the grid by 10%).

Another option, Option D, which is described in FIG. 69D, is computationally simpler than the other described methods but may provide a less accurate assessment of feature dimensions. Rather than transform the grid resolution to the layout resolution, the minimum, maximum, and mean widths or feature sizes are used to generate a distribution of predicted feature variation for each grid 12828. The feature size design specifications and tolerances are compared 12829 with the distribution of feature dimension variation computed in 12828 and the corrections (in 12830 of FIG. 70) are applied using a heuristic (e.g., bloat the minimum line widths by 10%). Otherwise, the steps for Options C and D are very similar.

Figure 70:
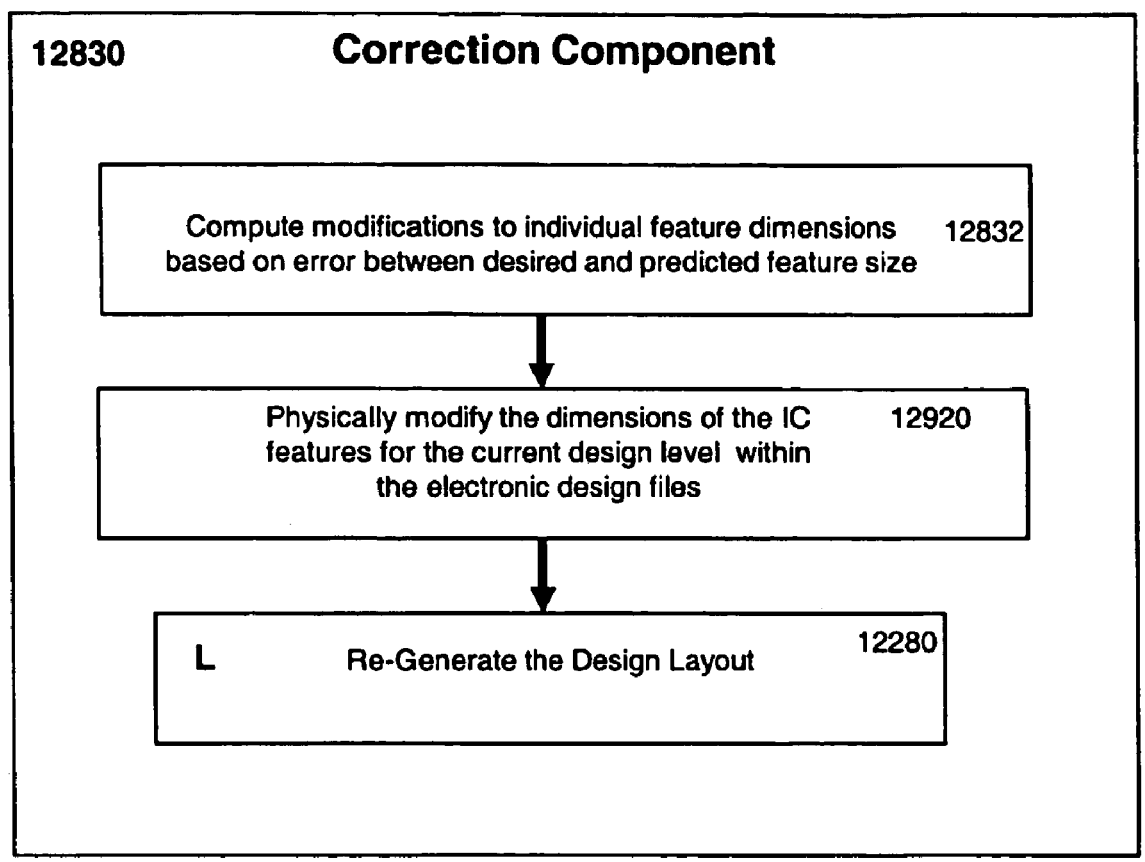
FIG. 70 illustrates an overview of a correction component.

Verification results may be provided to the correction component 12830, as illustrated in FIG. 70. In this component, modifications are computed for individual feature dimensions that exceed the design tolerances 12832 and are used to physically modify feature dimensions in the electronic design layout to produce the desired printed or etched feature dimensions 12920. In certain cases, dummy fill or other geometries may need to be repositioned. The design layout is then regenerated 12280 and if dummy fill is modified significantly, a new extraction performed.

Figure 71:
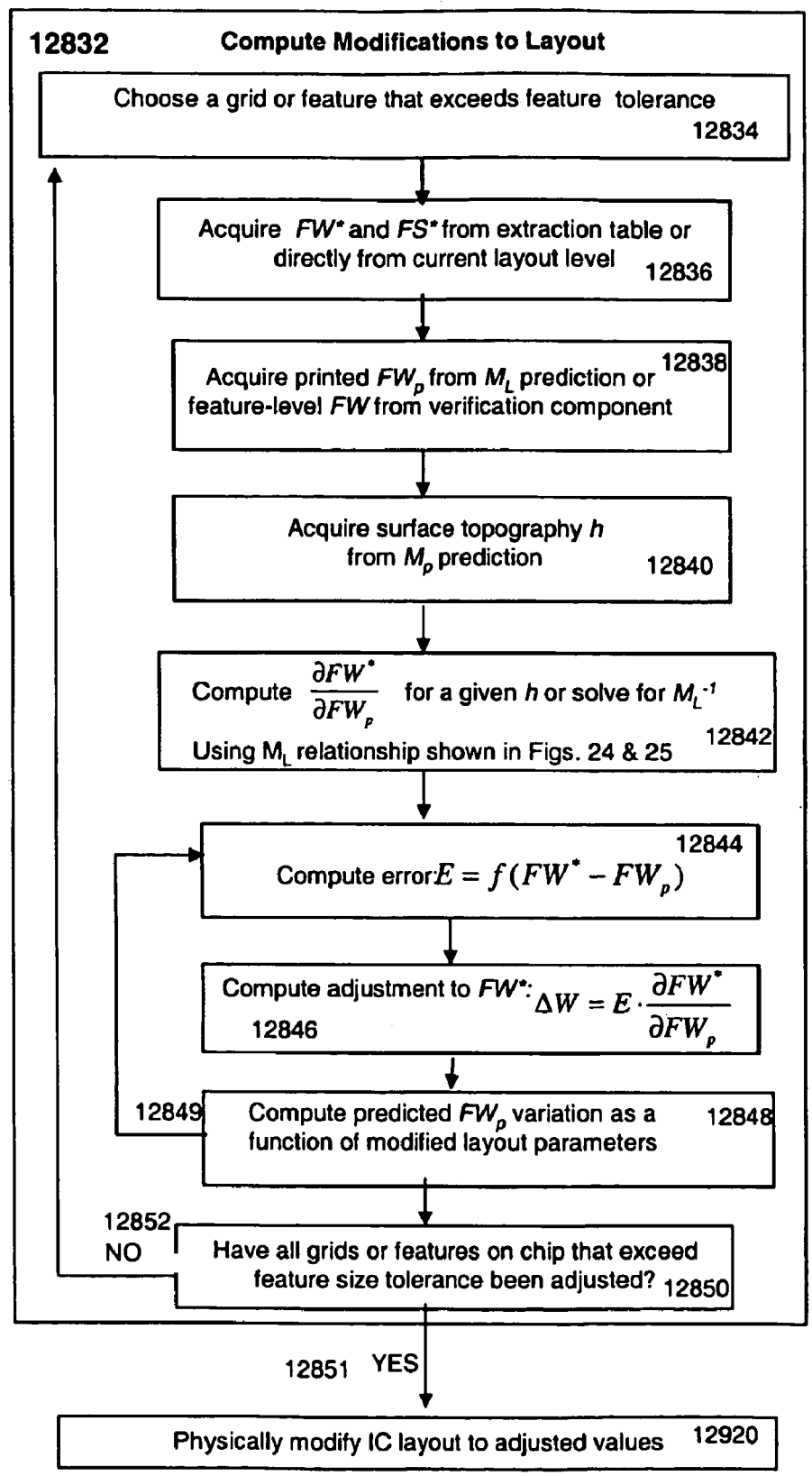
FIG. 71 illustrates steps to compute modifications to a layout.
Figure 72:
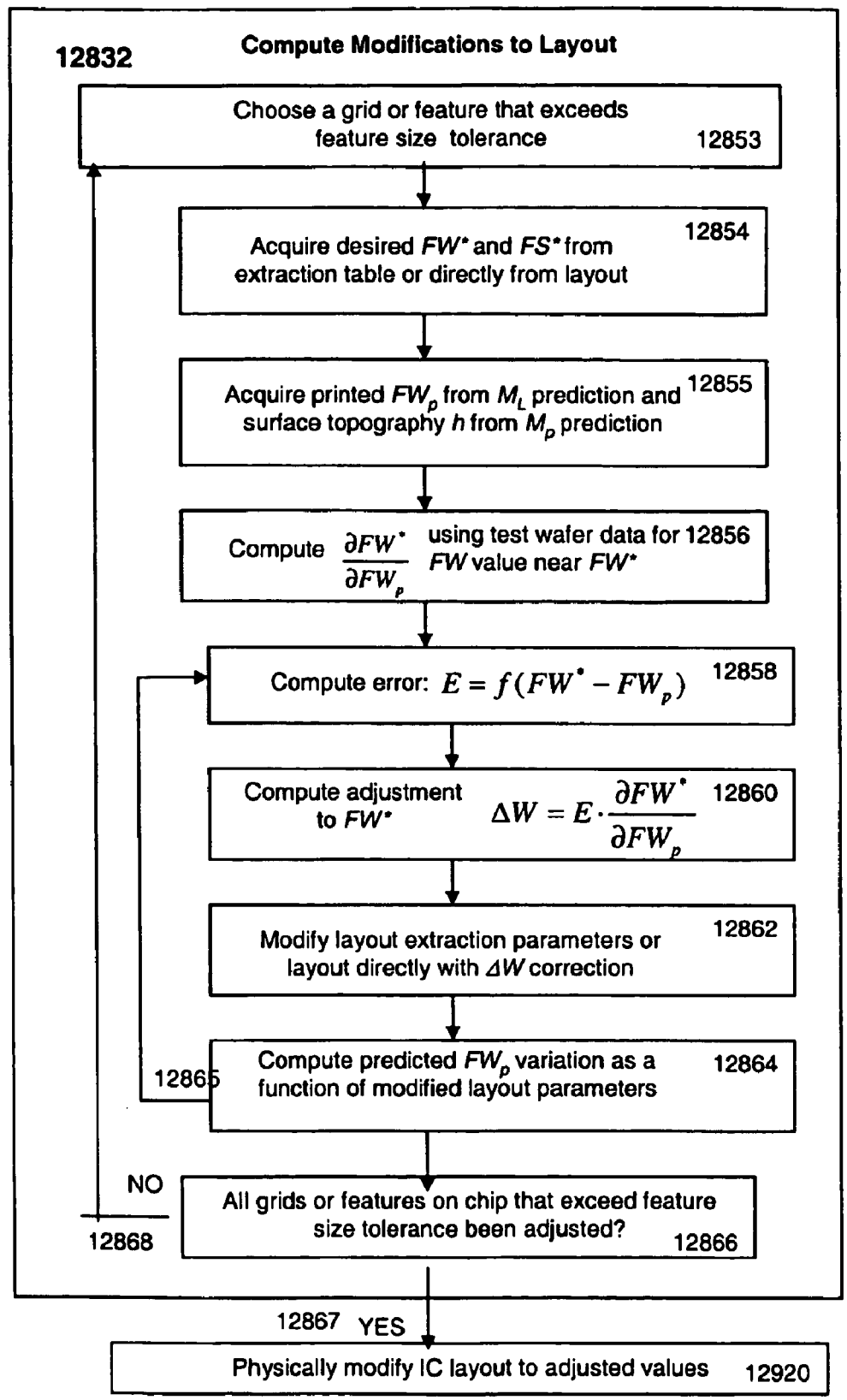
FIG. 72 illustrates the steps to compute modifications to a layout using test wafer data.

Two approaches for computing modifications to the layout are described in FIGS. 71 and 72. In the following descriptions, feature dimensions related to feature width (FW), feature space (FS) and critical dimension (CD) are used as an example of how a feature dimension is adjusted or computed but another feature dimension may be considered as well. The first approach, shown in FIG. 71, uses the inverse, pseudo-inverse, or partial derivatives of the $M_L$ component 12600 to map errors in printed feature width $FW_p$ to the desired width FW* in the layout. This approach begins with the first grid location or feature that exceeds tolerance 12834. The desired FW*, FS* or other critical dimensions 12601 may be acquired from the extraction table or directly from the current layout level 12836. Either the predicted lithography-based printed dimensions $FW_p$ from the $M_L$ prediction, or the feature-level predicted variation computed in steps 12816 or 12826 is acquired 12838 from the verification component. The surface topography h is also acquired from the $M_p$ prediction 12840 for use in the mapping of the desired and printed line width spaces. The computations described in FIG. 73B are used to compute the partial derivative or gradient $$\frac{\partial FW^*}{\partial FW_p}$$

for the given topography h.
Another approach is to invert the $M_L$ transformation 12600 described in FIGS. 62, 64 and 65, to yield:

$$FW^* = f(FW_p)|_h$$

where f is the explicit or approximate inverse of $M_L$. The $M_L$ transformation 12600 may be optical equations (e.g. derived from Rayleigh relationships) applied to a particular lithography tool or a pattern-dependent model developed using a lithography test wafer. The error between the desired and printed dimension is computed 12844 as: $E = f(FW^* - FW_p)$. An adjustment to the feature is computed as:

$$\Delta W = E \cdot \frac{\partial FW^*}{\partial FW_p}$$

where ΔW is the adjustment to a feature width or dimension 846 and may be done using the procedure illustrated in 33B. In an interconnect level, ΔW may be a shrinking or bloating of an array of lines. The predicted $FW_p$ variation is recomputed for the modified width 12848 and the system iterates on steps 12844, 12846 and 12848 until the error is within design tolerance. A check is made to see if all grids or features that exceed tolerance have been adjusted, and if not the process continues 12852. If so 12851, then the layout is physically modified 12920.

Figure 73B:
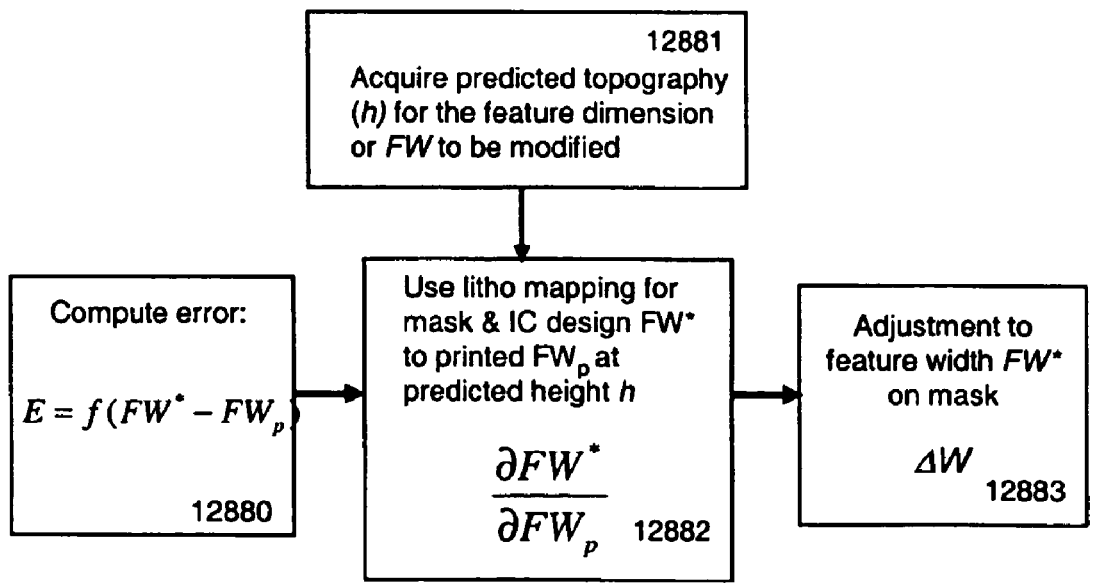
FIG. 73B illustrates a use of errors in predicted versus desired dimensions to modify features in a layout to improve printed feature dimensions.
Figure 74A:
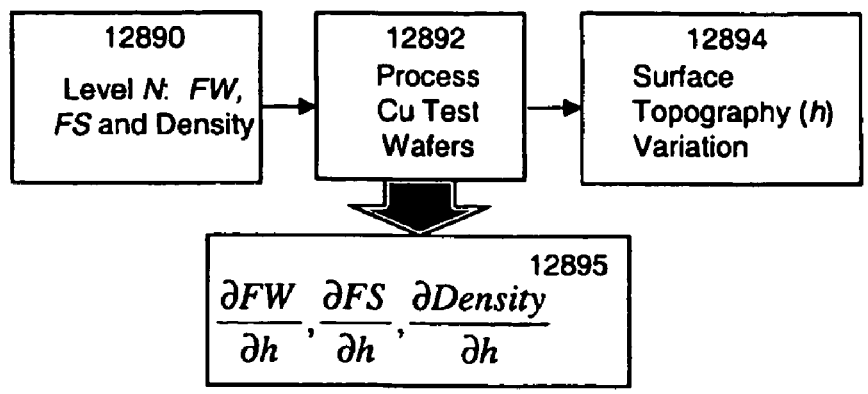
FIG. 74A illustrates a process for computing relationships among feature width, feature space, density or height.
Figure 74B:
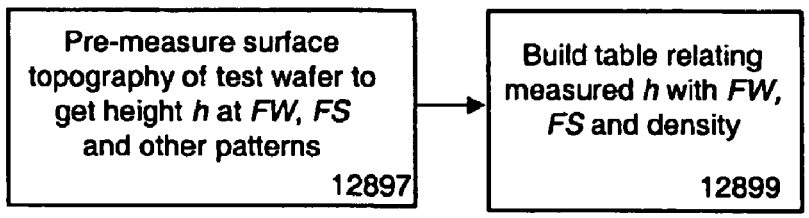
FIG. 74B illustrates how surface topography is related to design parameters, such as feature width, feature space and density before input into a lithography model.
Figure 74C:
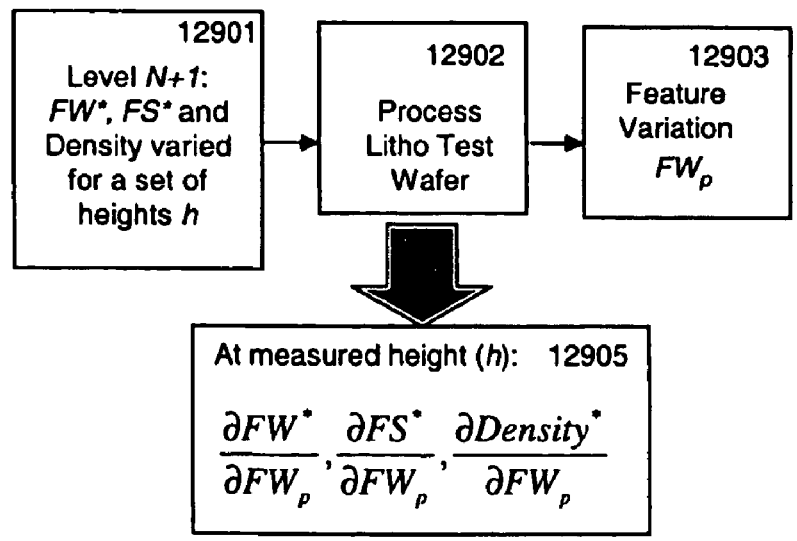
FIG. 74C illustrates how test wafers may be used to compute mathematical relationships between feature width, feature space, and density for a given height or thickness.

The second approach, shown in FIG. 72, uses data obtained using a lithography test wafer to map errors in printed feature width $FW_p$ to the desired feature width FW* in the layout. This approach begins with the first grid location or feature that exceeds tolerance 12853. The desired FW*, FS*, or other feature dimensions 12601 may be acquired from the extraction table or directly from the current layout level 12854. Either the predicted lithography-based printed dimensions $FW_p$ from the $M_L$ prediction or the feature-level predicted variation computed in steps 12816 or 12826 are acquired from the verification component 12855. The surface topography h is also acquired from the $M_p$ prediction 12840 for use in the mapping of the desired and printed line width spaces. The computations, also described in FIGS. 73B and 74C, may be used to compute the partial derivative or gradient $$\frac{\partial FW^*}{\partial FW_p}$$

for the given topography h. Another approach is to invert the $M_L$ transformation 12600 developed using the calibrated model to yield:

$$FW^* = f(FW_p)|_h$$

where f is the explicit or approximate inverse of $M_L$. The error between the desired and printed dimension or line width is computed 12858 as: $E = f(FW^* - FW_p)$. An adjustment to the feature is computed as:

$$\Delta W = E \cdot \frac{\partial FW^*}{\partial FW_p}$$

where ΔW is the adjustment to a feature width or dimension 12860.
In an interconnect level, ΔW may be a shrinking or bloating of an array of lines. The predicted $FW_p$ variation is recomputed for the modified feature width 12862 and the system iterates 12865 on steps 12858, 12860, 12862 and 12864 until the error is within design tolerance. A check is made to see if all grids or features that exceed tolerance have been adjusted, and if not the process continues 12868. If so 12867, then the layout is physically modified 12920.

Figure 73A:
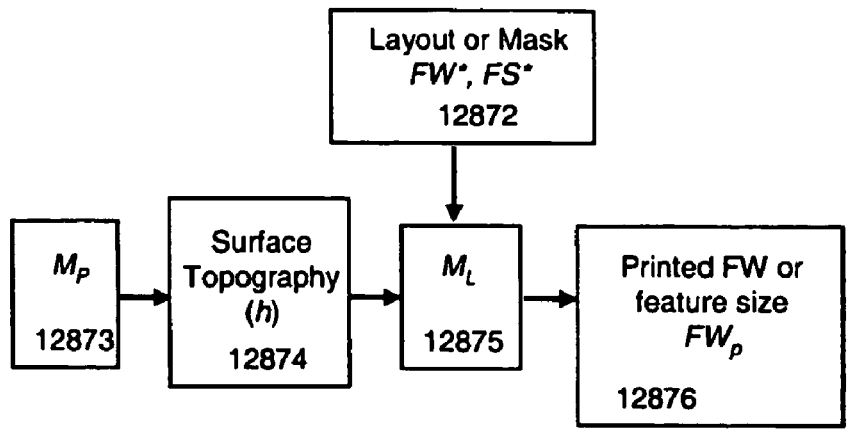
FIG. 73A illustrates a relationship between process model predictions of surface topography and a prediction of feature dimension using a lithography model component.

The feed-forward mapping from desired feature widths or dimensions FW* to printed feature widths or dimensions $LW_p$ is shown in FIG. 73A. The process models 12873 predict chip surface topography h 12874, which is then fed into the lithography model $M_L$ 12875 along with the desired dimensions 12872 from the design FW*, FS*, or CD*. The lithography model 12875 maps the desired width and associated chip topography to the actual printed $FW_p$ that occurs as a result of the lithography process 12876. This mapping can be used to mathematically relate desired circuit dimensions to lithography printed dimensions for a given chip topography.

When such a mapping is not mathematically invertible or may be complex and nonlinear, a partial derivative can be used to provide a linear approximation of the inverse close to the feature dimensions of interest. This mechanism for relating variation in printed dimensions back to the desired dimensions is illustrated in FIG. 73B. The error, which may be some function of the variation between desired and printed dimensions, is computed 12880. The predicted chip topography h is also used 12881. There are several ways to compute the gradient or partial derivative of the desired dimensions with respect to the printed dimensions. One approach may be to use data from a processed and measured lithography test wafer, described in FIG. 74C and described in greater detail in section f. Another approach may be to feed feature width values near the desired FW* into the $M_L$ component and store the resulting printed width variation $FW_p$. From this table of values, the partial derivatives can be computed as the change in FW* with respect to $FW_p$ using procedures found in many calculus and applied mathematics textbooks. Another approach, which may be applicable if $M_L$ includes a series of equations, is to linearize the equations about the line width or feature size of interest. Linearization methods are provided in most major applied mathematics and multi-variable controls textbooks.

Figure 75:
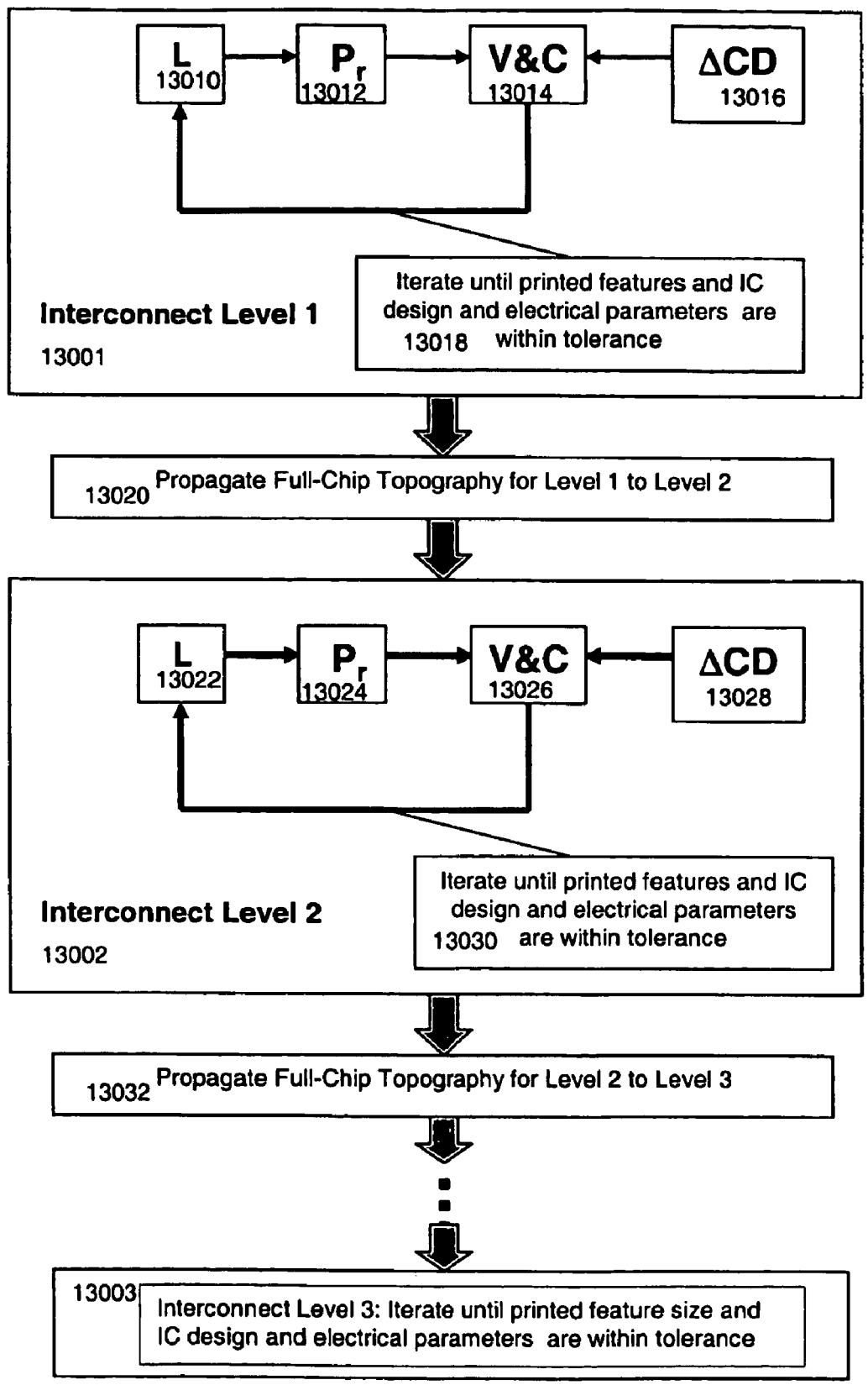
FIG. 75 illustrates how a process may be used iteratively to do multi-layer verification and correction.

The verification and correction components are the final steps in computing the electronic design to be used in mask creation for each design level (e.g., interconnect level). A summary is shown in FIG. 75, illustrating how the components described in sections a. through e. are combined and used in an iterative fashion on each subsequent design level. For the first interconnect level 13001, the layout 13010 is used with a prediction component 13012 to generate chip-level topography which is used along with the feature dimensions at the current design level to verify and correct any variation 13014 to the desired feature size tolerances 13016. This process is repeated 13018 until all printed or etched feature dimensions, design, and electrical parameters (for that level) are within design and feature size tolerances.

The full-chip topography for interconnect level 1 is propagated to level 2 13020. For the second interconnect level 13002, the layout 13022 is used with a prediction component 13024 to generate chip-level topography which is used along with the critical dimensions at the current design level (in this case, level 2) to verify and correct any variation 13026 to the desired feature size tolerances 13028. This process is repeated 13030 until all printed or etched dimensions, design, and electrical parameters are within tolerance. The full-chip topography for interconnect level 2 is then propagated to level 3 13032 and the process continues until the final interconnect level is reached.

f. Creation and Use of Lithography Test Wafers

As described in the calibration procedures in section b., test wafers use a variety of test structures to map the relationship between circuit features and pattern dependencies within one or more process steps. The methods we describe include the creation and use of test wafers to capture pattern dependencies for lithography tools, photoresist materials, and deposition or a subsequent etch. A lithography test wafer may include test structures that characterize feature density and incoming topography (both single and multi-level effects) with regard to the printed critical dimensions. The test wafer simulates the variety of topography that an incoming wafer with a patterned circuit may have and does so by creating a controlled experiment where structures are varied to span a space of potential circuit patterns.

Figures 76A, 76B:
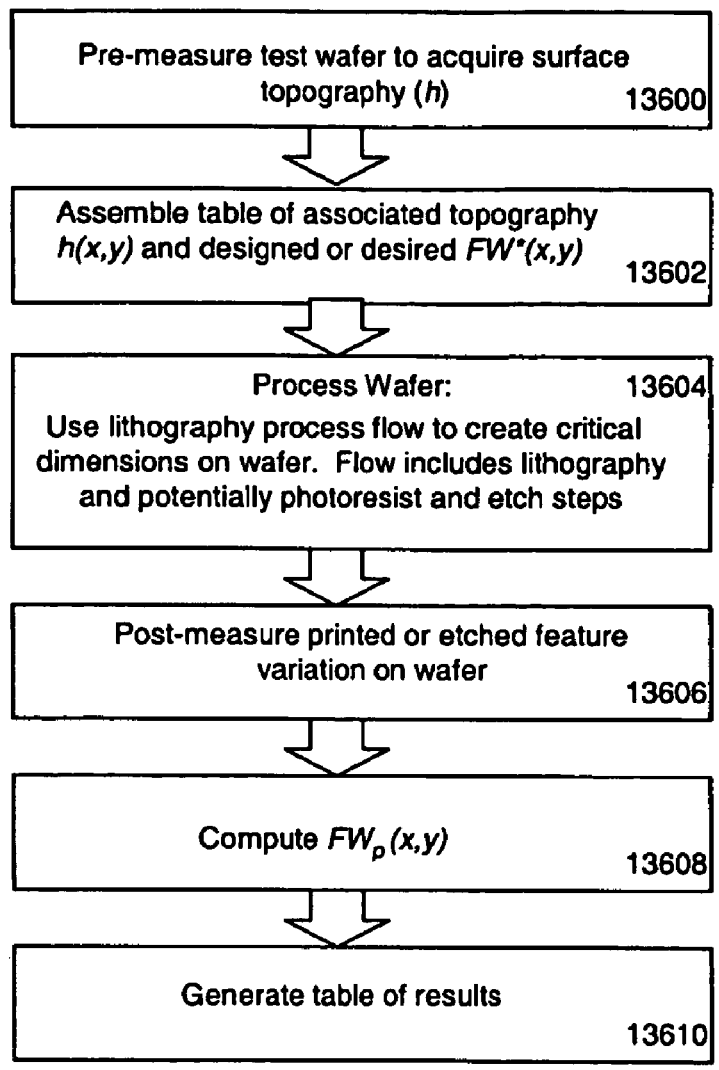
FIG. 76A illustrates steps in using a lithography test wafer.
FIG. 76B shows an example of a table relating test wafer parameters.

FIG. 76A illustrates how a test wafer may be used to characterize pattern dependencies in a lithography process. The pre-processed test wafer topography is measured according to a measurement recipe that includes x and y site locations 13600. The measured data is assembled in a table that relates underlying circuit patterns (e.g. feature widths FW* and feature spaces FS) and the surface topography h (e.g. thickness) 13602 for each x and y site location. The wafer is processed using the actual lithography process flow that is to be used with the final production ICs. The lithography process flow may include multiple steps such as photoresist deposition, lithographic imaging, and a subsequent etch step. After processing the resulting width variation, in the form of printed or etched feature dimensions (e.g., widths $FW_p$ and spaces), are measured 13606 and calculated 13608 at the x and y site locations.

A table of results are generated 13610 that may be used for calibrating a pattern dependent lithography model, correcting design features to yield desired printed or etched dimensions, or evaluating best practices (e.g., tool and process recipes) and consumables (e.g., photoresist materials) for a particular process flow, lithography and etch tool. An example of such a table is shown in FIG. 76B, where the (x, y) site locations are stored in columns 13620 and 13622, the designed or desired line widths for (x, y) in column 1624, the measured surface topography for (x, y) in column 13626, the printed or etched dimensions for (x, y) in column 13628 and the difference between desired and printed (etched) features in column 13630.

"Printed" and "etched" are terms often used interchangeably in this description. The reason is that it is often difficult to measure the printed line width right after lithography imaging, so an etch step is performed so that the features may be easier measured. Also etch may contribute to the overall width variation, as well as variation in the trench depth and sidewall, as a result of pattern dependencies. As stated throughout this description it may be beneficial when predicting total feature width or size variation to consider lithography and etch together (as a flow) to address both printed and etched variation. The improvement of within-die etch uniformity and the availability of certain sensors and measurement approaches may eliminate the need to perform the etch step and provide direct measurements of printed features. This approach and these wafers may be used in both cases.

Figures 77A, 77B:
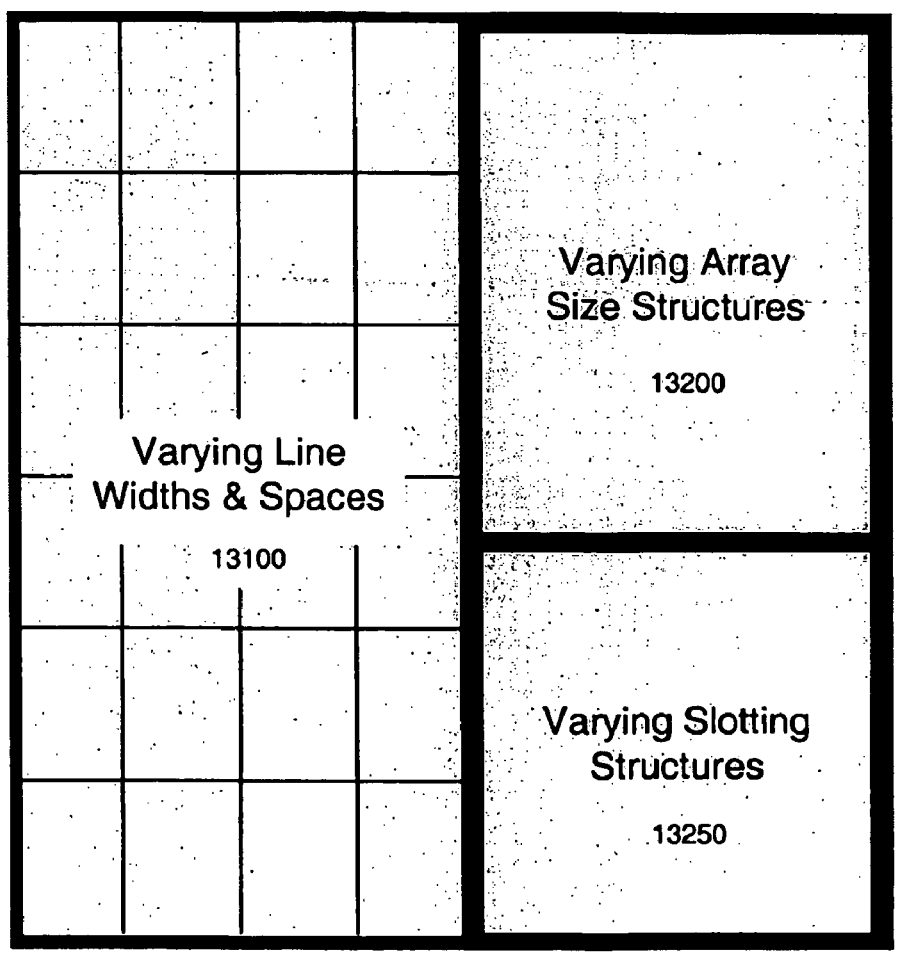
FIG. 77A shows a stack for a lithography test wafer.
FIG. 77B shows metal level 1 of a lithography test wafer.

A test wafer to capture pattern dependencies in lithography processes is shown in the following figures. FIG. 77A shows a multi-level test wafer stack that begins with a silicon wafer 1056, followed by an ILD layer (e.g. oxide or low-k) 13054, a metal 1 layer 13052, a via 1 level 13051, and a metal 2 layer 13050. The test wafer stack is used to relate topographical variation with regard to underlying patterns.

An example of a layout for metal level 1 is illustrated in FIG. 77B. A section of varying line widths and spaces is used in metal level 1 13100 to capture width and space dependencies in interconnect levels. A section of varying array sizes are used in metal level 1 13200 to capture pattern interactions between arrays and vias. A section of varying slotting structures are used in metal level 1 13250 to capture multi-layer pattern interactions between slotting structures, lines, and vias.

Figure 77C:
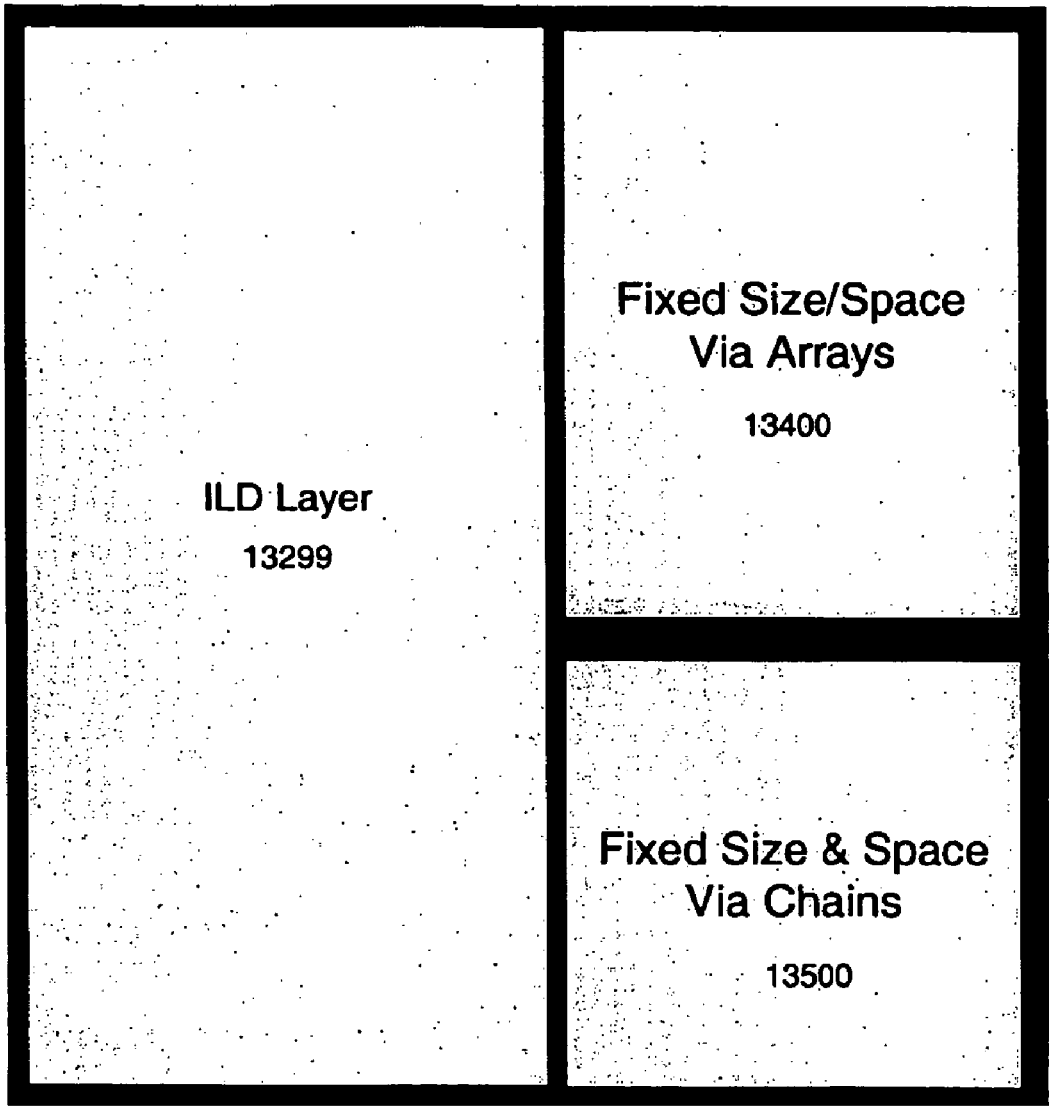
FIG. 77C shows via level 1 of a lithography test wafer.

An example of a layout for via level 1 is illustrated in FIG. 77C. A section of fixed size and space via arrays are used 13400 to capture pattern interactions between via arrays and varying array structures in metal level 1. A section of fixed size and space via chains are used 13500 to capture pattern interactions between via chains and varying slotting structures in metal level 1. The via level area between varying line widths and spaces region is an ILD section with no structures to capture interactions between lines in metal levels 13299.

Figure 77D:
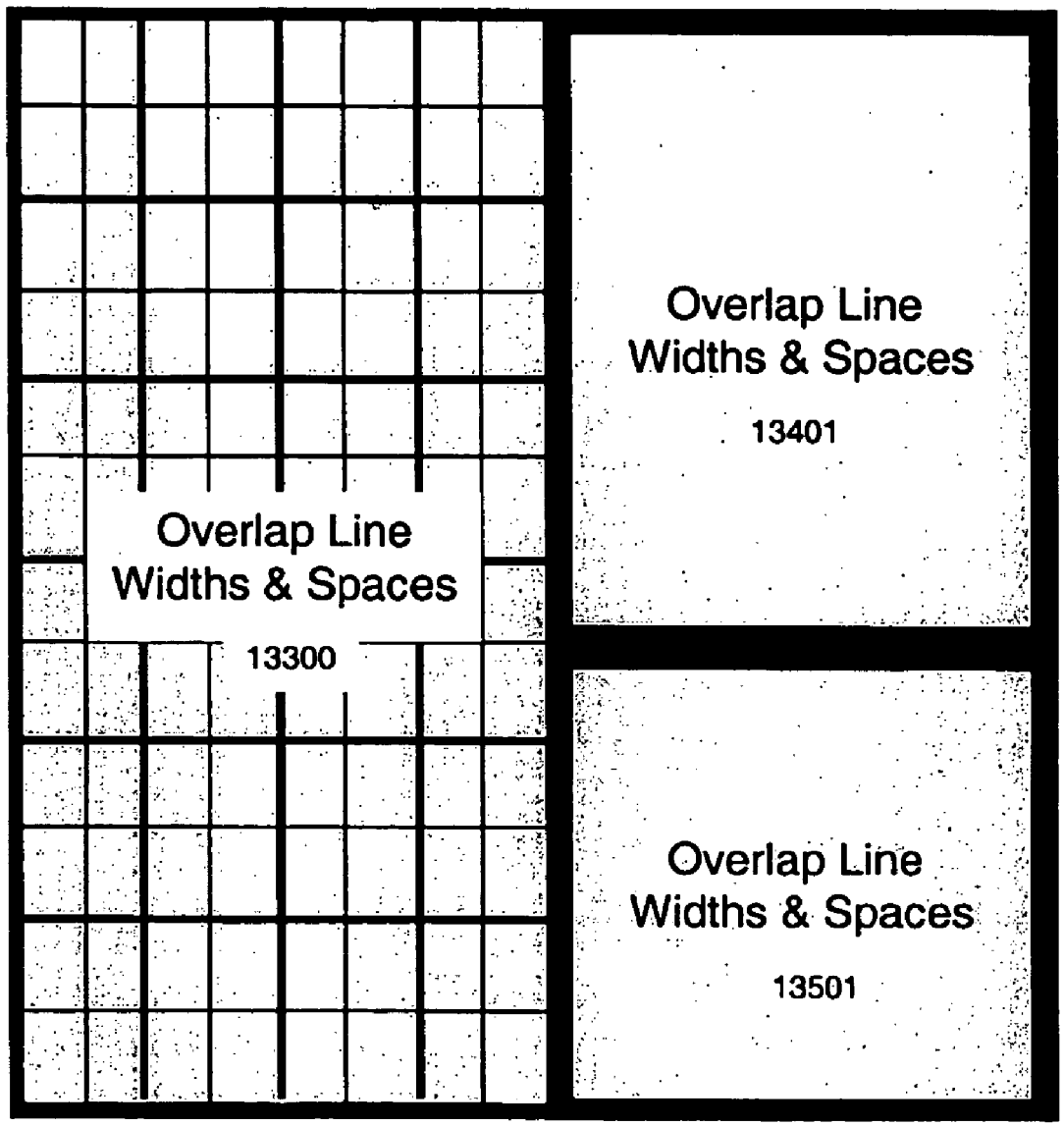
FIG. 77D shows the metal level 2 of a lithography test wafer.

An example of a layout for metal level 2 is illustrated in FIG. 77D. A section of overlap line width and space structures are used in metal level 2 13300 to capture width and space dependencies between interconnect levels. Another section of overlap width and space structures are used in metal level 2 13401 to capture dependencies between via arrays and metal levels. Another section of overlap width and space structures are used in metal level 2 13501 to capture interlayer dependencies among via lines, arrays, and slotting structures.

Figure 78:
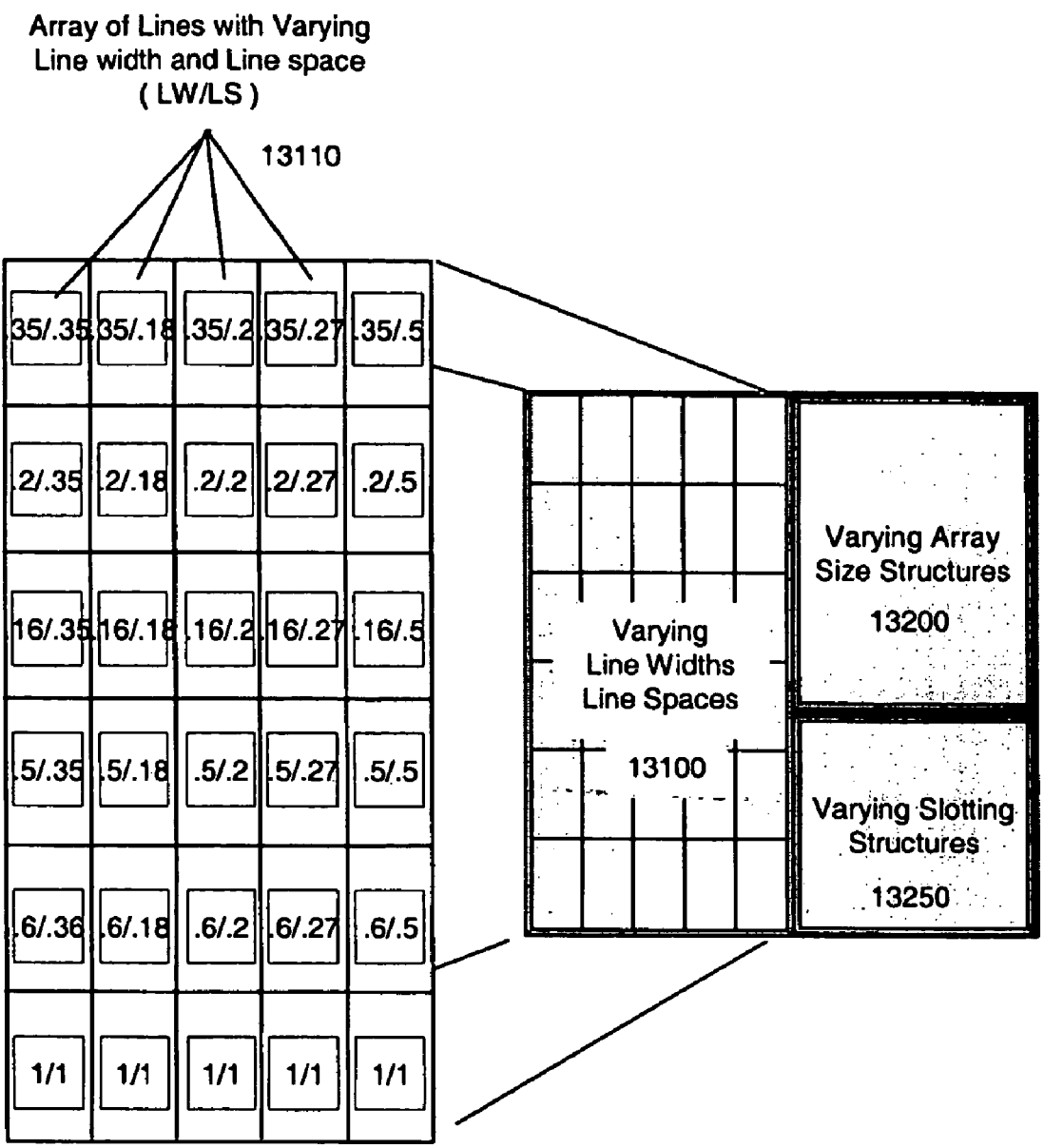
FIG. 78 illustrates a section of varying line widths and line spaces in metal level 1.
Figure 79:
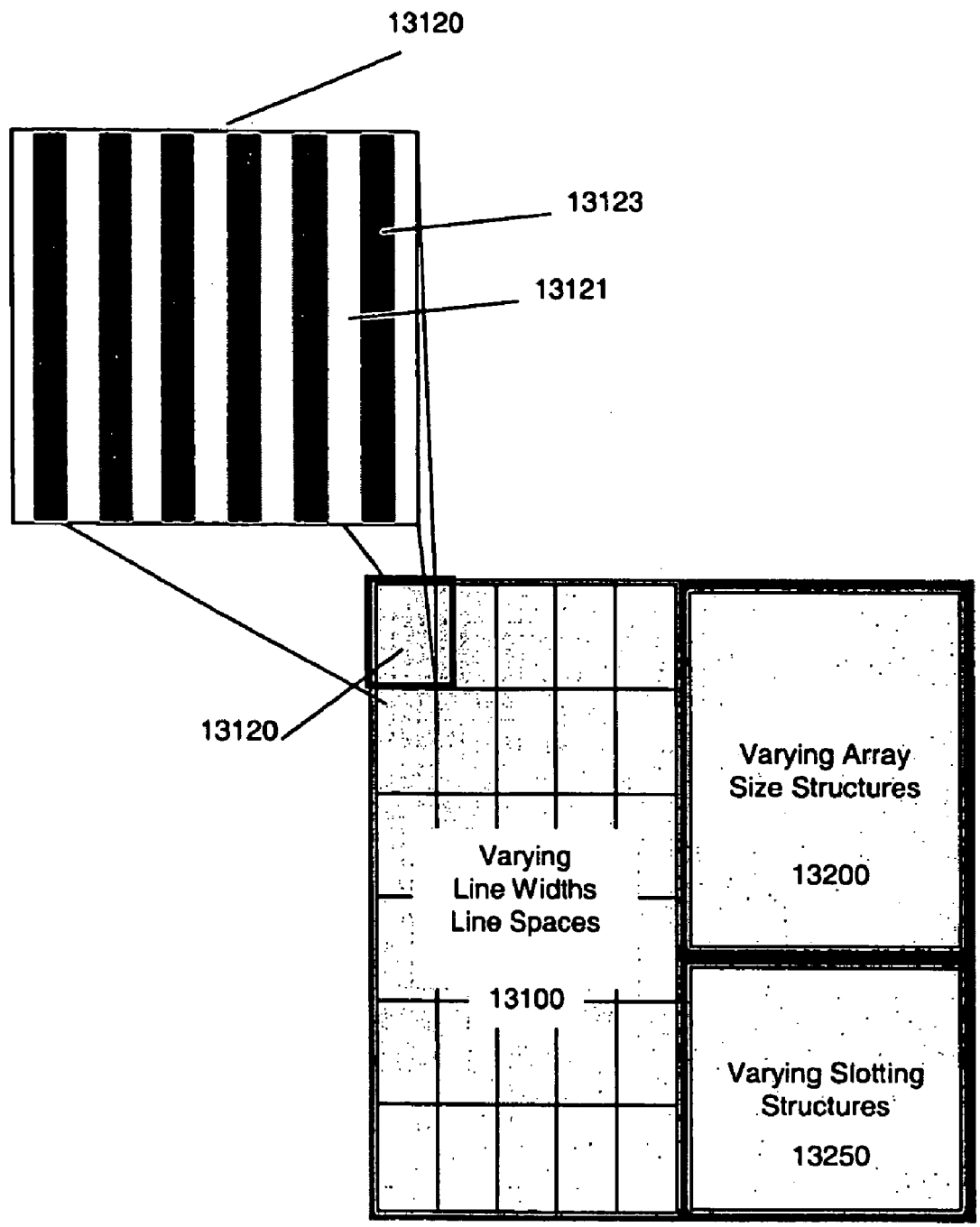
FIG. 79 illustrates a sub-section of fixed line widths and line spaces in metal level 1.

The next few paragraphs and figures will describe the line width and space interaction sections across the metal 1, via 1, and metal 2 layers with structures in areas 13100, 13299 and 13300 respectively. FIG. 78 illustrates varying line widths and spaces 13110 across the larger component 13100 for metal level 1. FIG. 79 illustrates one array structure 13120 (within the 13100 section) with a fixed width of 0.35 micron 13123 and space of 0.35 micron 13121 within each sub-section (such as 13120) in metal level 1.

The via level between section 13100 of metal level 1 and section 13300 of metal level 2 is a solid ILD field (e.g. oxide or low-k material), so there are no structures.

Figure 80:
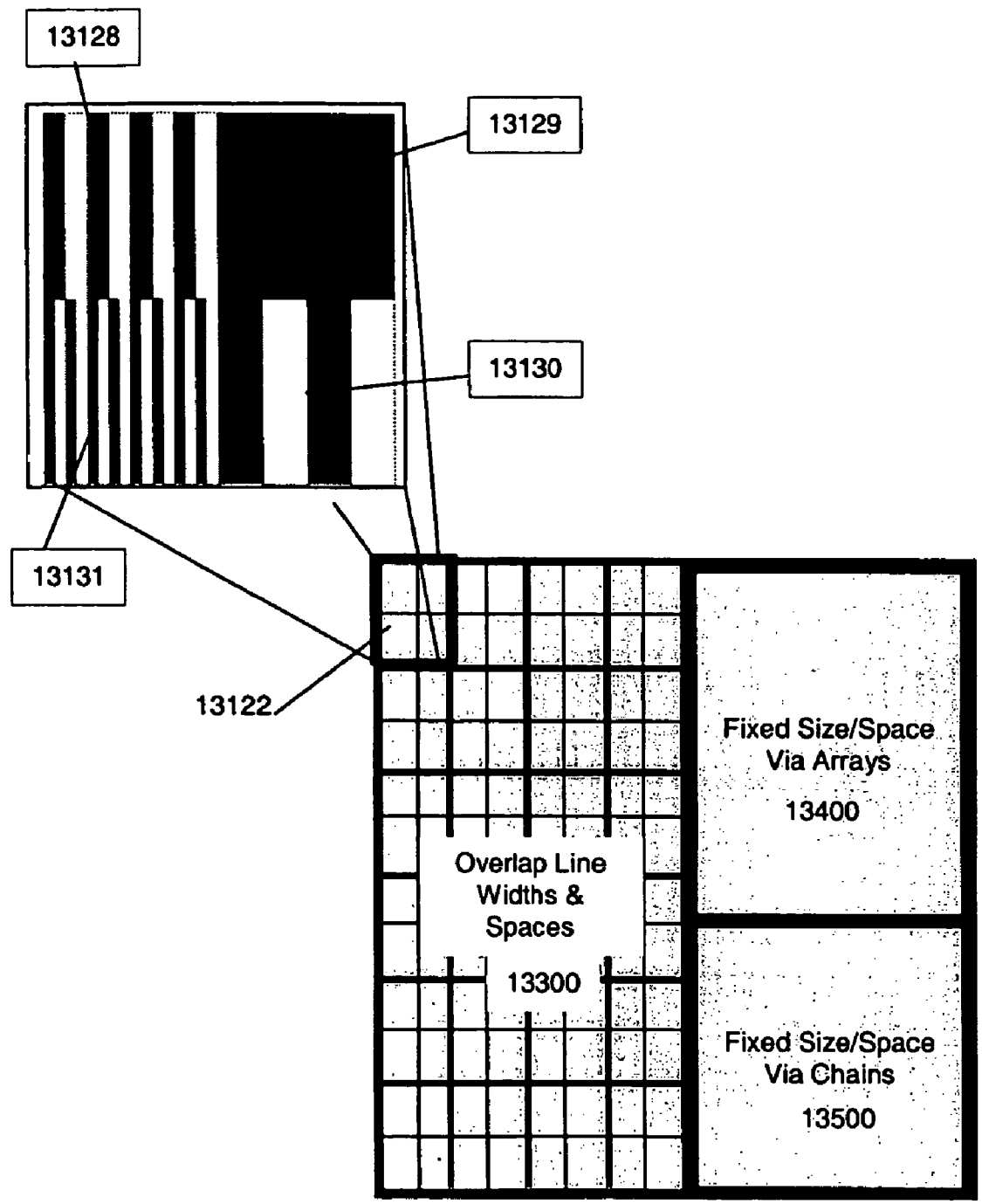
FIG. 80 illustrates a same sub-section with varied line widths and line spaces for metal level 2.

FIG. 80 illustrates the type of structures in metal level 2 in section 13122 of larger area 13300. The goal is to characterize line width and line space interactions between metal levels, so section 13300 has varying widths and spaces that overlap with the fixed width and space in metal level 1 component 13120. This overlap allows for combinations of width and space values to better span the space of all potential width and space combinations used in a production circuit. In this example, there are four overlap structures (13128, 13129, 13130, 13131) within component 13122, which also lies within the larger section 13300. One area has a line width of 0.25 micron and line space of 0.25 micron 13128. Another area has a line width of 2 microns and line space of zero microns 13129. Another area has a line width of 0.13 micron and line space of 0.13 micron 13131. Another area has a line width of 0.50 micron and line space of 0.50 micron 13130.

Figure 81A:
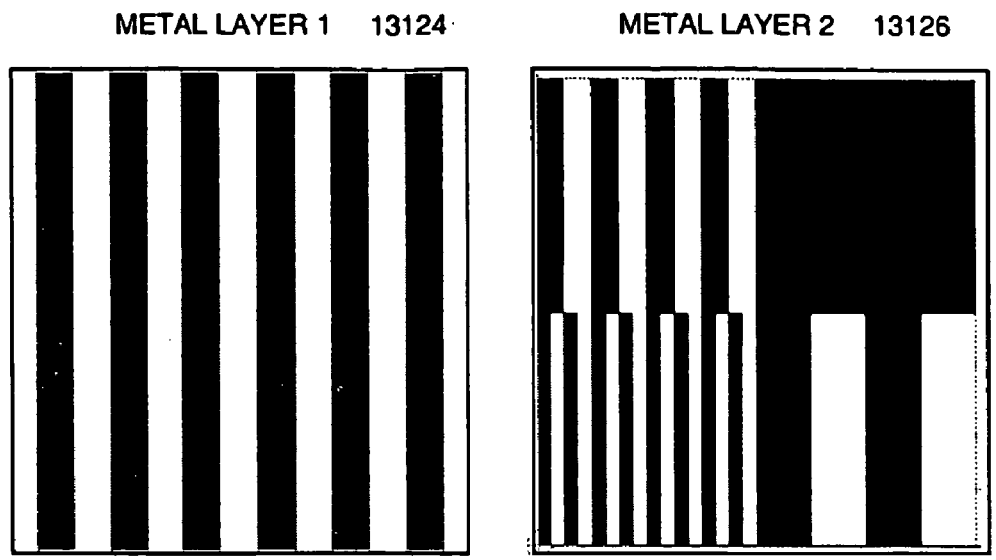
Figure 81B:
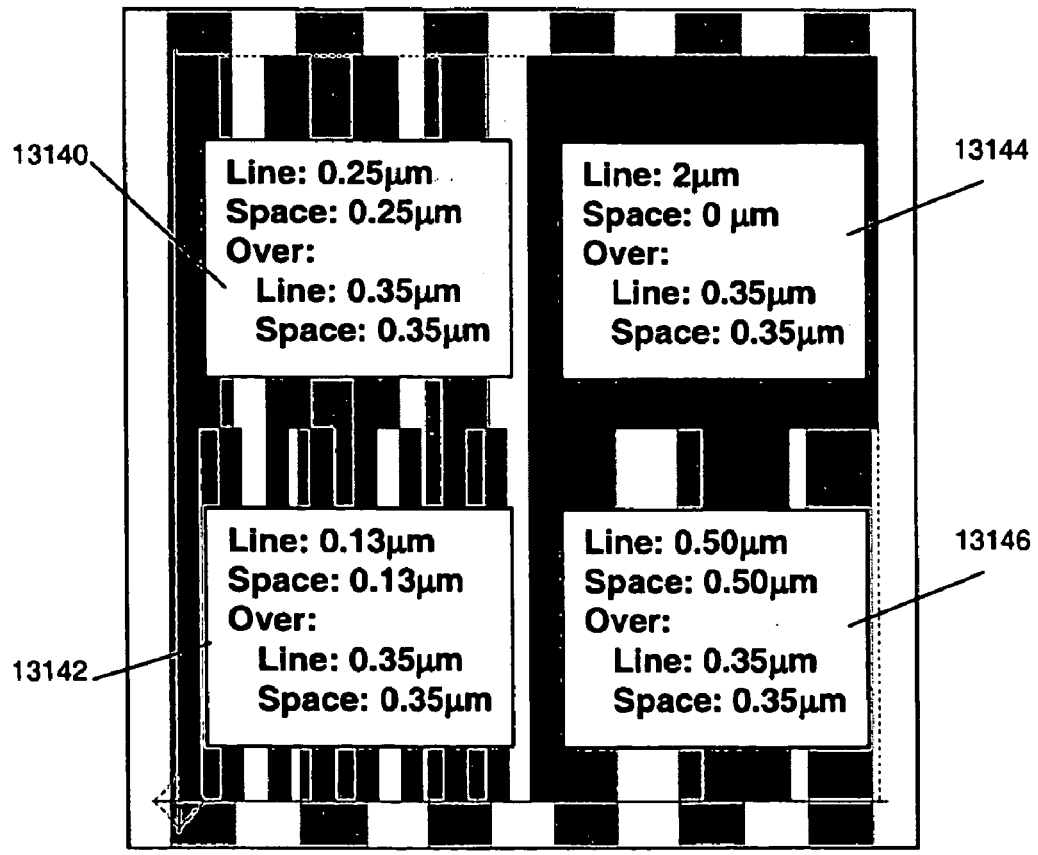

FIGS. 81A and 81B illustrate the overlap of the two metal levels. FIG. 81A shows the structure 13124 with a fixed line width and line space in the metal 1 level. FIG. 81A also shows the structure 13126 with varying line widths and spaces in the metal 2 level. FIG. 81B illustrates how the test wafer characterizes the interaction of the two levels by superimposing metal 2 on the metal 1 component. The overlap structures are indicated in 13140, 13142, 13144, and 13146. The via level 1 for area 13299 is a large ILD section which electrically separates the two metal levels and thus is not shown here.

Figure 82:
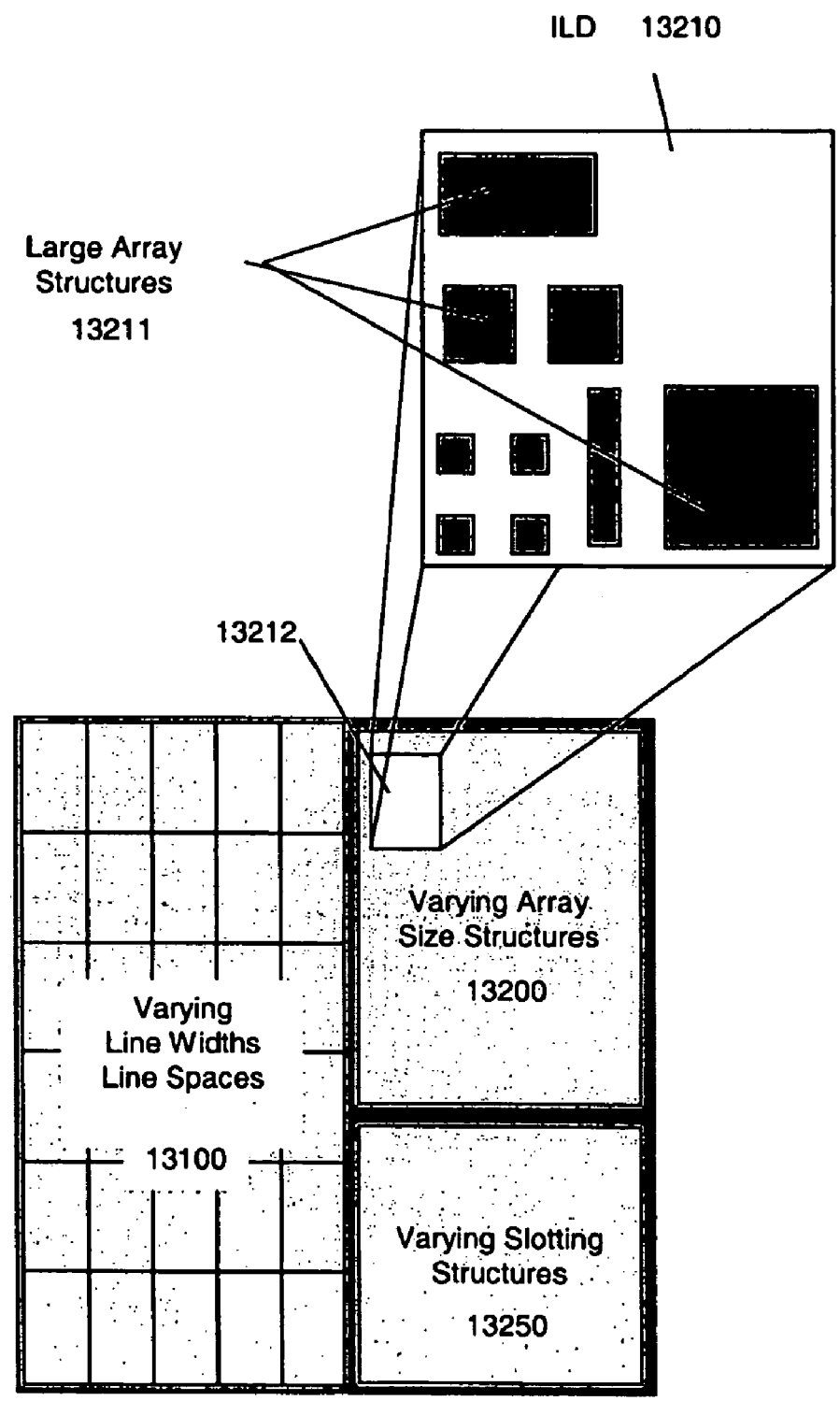
Figure 83:
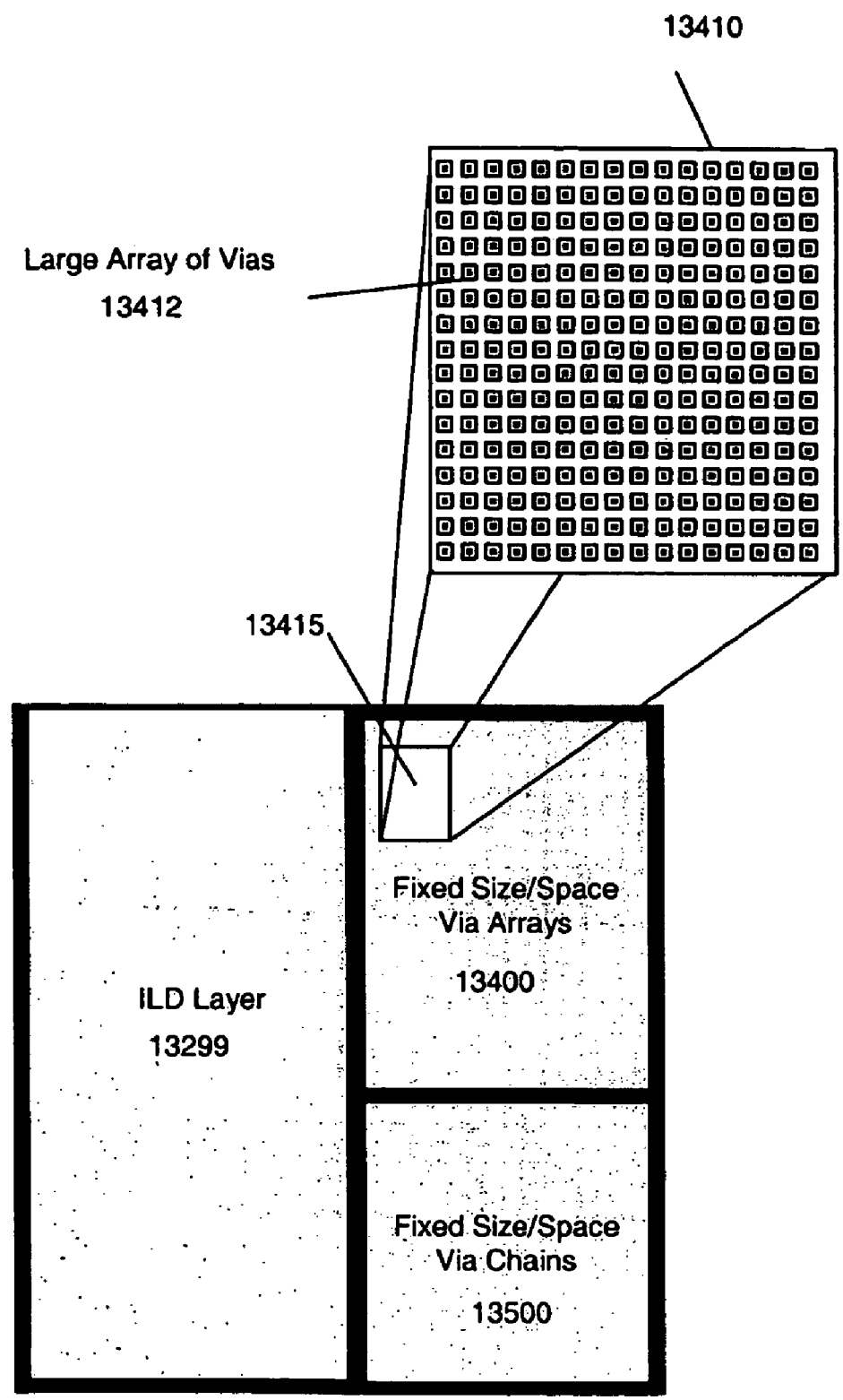

The next set of figures and paragraphs describe the sections of structures that characterize array and via interaction 13200. FIG. 82 illustrates a sample layout of structures in section 13200 of metal level 1. The area defined in 13212 is magnified to show the type of large array structures 13211 within an oxide field 13210. FIG. 83 shows, for the area 13415 in via level 1 above 13212 in metal level 1, the type of large arrays of vias 13412, shown as gray squares in the magnified section 13410.

Figure 84A:
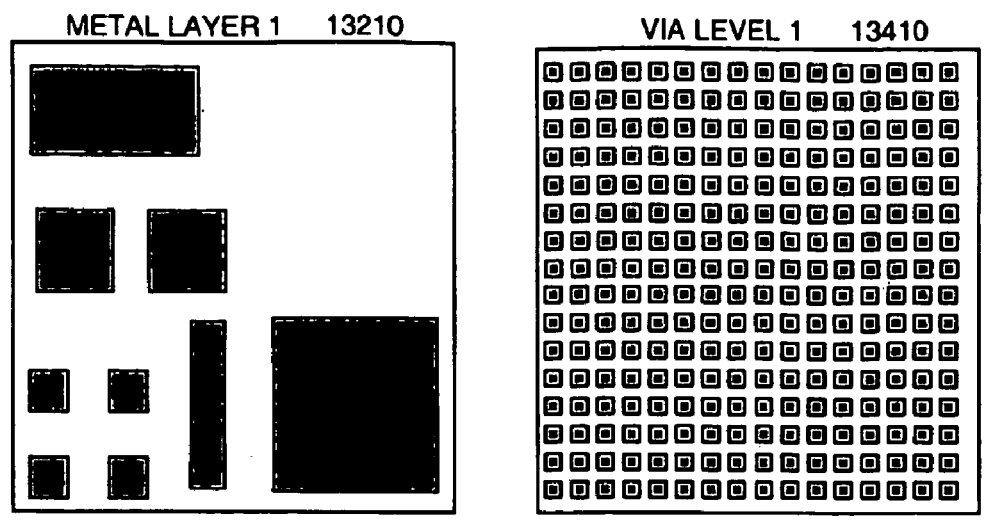
Figure 84B:
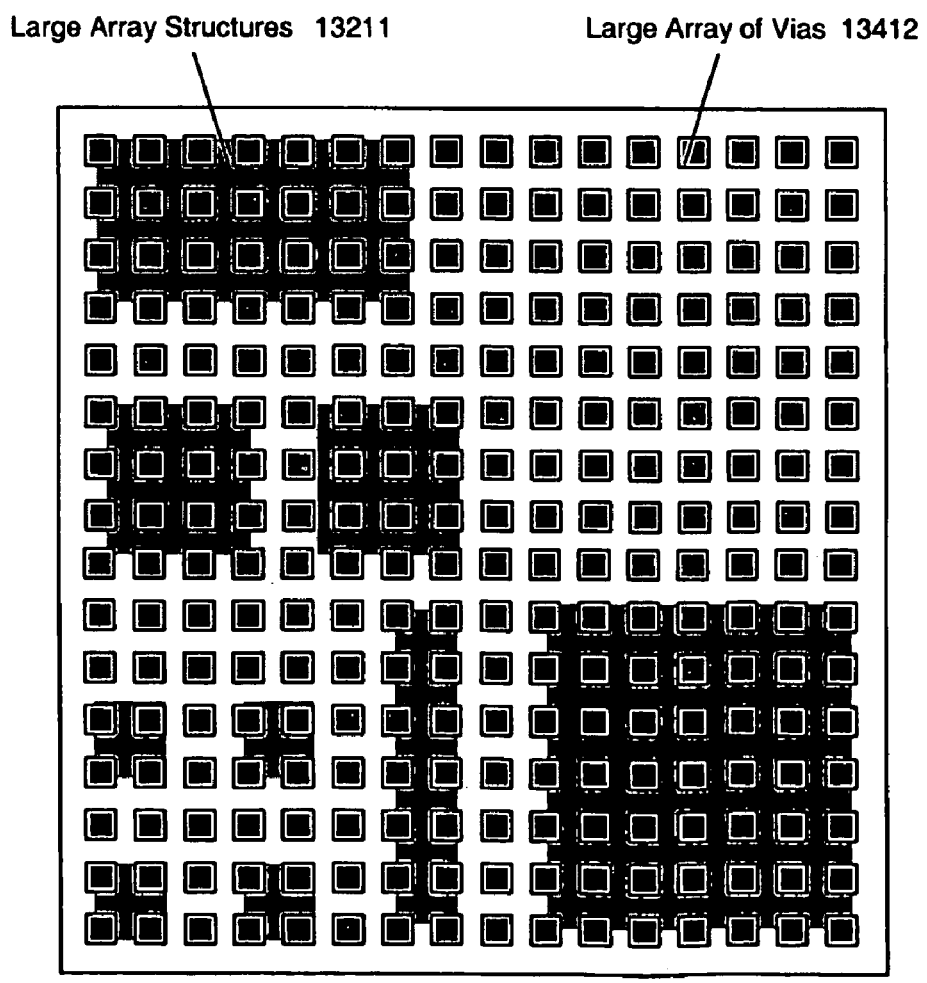

FIGS. 84A and 84B illustrate the overlap of the metal and via levels. FIG. 84A shows the large array structures 13210 in the metal 1 level. FIG. 84A also shows via structures in the via 1 level. FIG. 84B illustrates how the test wafer characterizes the interaction of the two levels by superimposing via level 1 on the metal 1 component. The overlap structures are indicated as 13211 and 13412.

The next set of figures and paragraphs describe the structures that characterize the interaction between slotting structures, via chains, and overlapping metal lines. FIG. 85A shows the slotting structure area 13250 of metal level 1 with three areas 13540, 13542, and 13544 selected for depicting examples in FIG. 85B. In FIG. 85B, an example of lines with no slotting material are shown 13540. Examples of two different slotting types are shown in 13542 and 13544. A legend for the metal 1 (M1), via 1, and metal 2 (M2) levels for this section is provided 13546. FIG. 85C superimposes via chain structures of via level 1 (shown in 13550, 13552 and 13554) over the slotting structures 13540, 13542 and 13544 shown in FIG. 85B. FIG. 85D superimposes the metal 2 overlap lines that connect to metal level 1 through the via structures for the three types 13560, 13562, and 13564 of slotting structures. A legend is provided in 13566. This completes the description of the three areas of structures in this particular layout example.

The lithography test wafer concept illustrated in the prior figures is not limited to these structures and may include any number of structures that can be used to characterize interaction of feature width, feature spacing, dummy fill, or slotting structures between metal levels and other via and metal levels. While it is not necessary to use the actual process flow preceding the lithography process step to be characterized, it is recommended when it is important to capture the types of incoming process dependent pattern dependencies the lithography process will receive. Actual processing in creating the test wafer may also be useful in characterizing the CMP and ECD processes that precede lithography as well.

g. Applications

There is a wide range of applications for the methods described above. Two ways in which chip-level pattern dependencies, topographical variation, and imaged pattern densities respectively, cause variation in lithographic feature dimensions are shown in FIGS. 48 and 49. The following figures and paragraphs describe solutions using the procedures described in sections a. through f.

The next two figures describe solutions for the problems outlined in FIGS. 48 and 49. FIG. 86A describes how the methods may be applied to address the first problem of chip-level topographical variation. FIG. 86B illustrates the surface topography variation from FIG. 8 with the solution described in FIG. 86A. In this application, the level N layout 14010 is loaded into a computer where the methods described above have been implemented in software 14008. The process model prediction component 14012 performs required extractions and predicts the chip-level surface topography 14014. This variation in topography is also shown in FIG. 86B 14046, as well as the height variation at each grid location 14048. The incoming chip-level topography 14014 and the level N+1 layout 14026 are loaded into the lithography model component 14016, which is used to predict the feature size (e.g. line width) variation 14018. Pattern dependencies may also be extracted from level N+1 layout and used as well 14013. The design tolerances 14022 are loaded into the computer 14008 and compared 14020 to the predicted dimensions. The verification and correction component 14024 adjusts the layout and the process iterates until satisfactory printed feature sizes (e.g. line widths) are achieved. The layout is then used to create the mask for layout level N+1. The results of the solution described in FIG. 46A are shown in FIG. 86B where the level N+1 mask 14039 feature dimensions $w_a$ 14042 and $w_b$ 14044 are adjusted 14040 in the layout such that the printed features $w_2$ 14050 and $w_1$ 14052 are the desired width. This solution allows the lithography process to adjust printed features to within-die film thickness variation 14048.

FIG. 87A describes an application to address the second problem of feature density variations that were described in FIG. 49. FIG. 87B illustrates a variation in feature densities, similar to that shown in FIG. 49, with the methods applied in FIG. 87A. In this application, the level N layout 14070 is loaded into a computer where the methods have been implemented in software 14069. The process model prediction component 14072 performs required extractions and predicts the chip-level surface topography that may or may not be used in conjunction with feature density information. Since optical interference due to feature density may vary with depth of focus, topographical information may be useful.

The level N+1 layout 14071 is loaded into an extraction tool 14075, which extracts pattern density information. The extraction may be performed using the procedure described in section b. of an EDA tool or by using an optical proximity correction tool. The feature density extraction and topographical information 14074 are loaded into a lithography model component 14076, which is used to predict the feature size variation 14078. The design tolerances 14082 are loaded into the computer 14069 and compared 14080 to the predicted dimensions. The verification and correction component 14084 adjusts the layout and the process iterates until acceptable printed feature sizes are acquired. The layout is then used to create the mask for layout level N+1. The results of the solution described in FIG. 87A are shown in FIG. 87B where the level N+1 mask 14092 feature dimensions $w_a$ 14096 and $w_b$ 14098 are adjusted 14084 in the layout such that the printed features w+Δ1 14102 and w+Δ2 14104 are the desired width. This solution allows the lithography process to adjust printed features to variation in feature densities, whether the film thickness is planar 14100 or varying 14046 (as shown in FIG. 86).

The method may also provide functionality similar to conventional stepper technology. Whereas stepper technology allows lithographic imaging to adapt to wafer-level non-uniformity (such as bow or warp), the techniques may be used to adjust lithographic imaging to chip-level or within-die variation. A basic illustration of how stepper technology works is illustrated in FIG. 88, which shows a mask with an IC pattern 14220 to be imaged onto the wafer surface at points A 14208 and B 14209 at different heights. Steppers normally print within a defined area or field that may include one or more die. The lithography tool measures the alignment marks 14212 and 14214 for both x and y alignments and tilt. Wafer-level variation 14210 such as warping and bowing is common where the characteristics of wafer surface at point A 14208 may be different than the wafer surface at point B 14209. The tool adapts the mask or reticle 14220 and associated optics to compensate for this variation over longer distances. The focal plane f 14218 may or may not be adjusted to maximize the resolving power. There also exist step and scan tools that expose the die in strips where the pattern is stitched together on each strip. In most of these applications, steppers adjust to wafer topography on length scales of 1 to 50 mm. Within-die or chip-level topography may vary at similar magnitudes as wafer-level; however these length scales are on the order of 0.00008 mm to 25 mm. This situation is illustrated in the case shown in FIG. 89 where the mask or reticle 14223 is adjusted (to wafer surface A 14208 of FIG. 88) to print IC features onto an ILD layer of a wafer 14201. The adjustments are made with regard to x and y alignment marks 14222 and tilt and potentially, focal distance f 14221. However chip-level variation 14224 occurs on a much smaller length scale and certain features that are sufficiently different than the focal length may likely exceed the critical dimension tolerances specified in the design specification 14228.

The methods we have described may be used to complement conventional wafer-level stepper technology and work as a miniature stepper that adjusts to chip-level variation in printed images. The methods may be applied as a chip-level lithography correction stepper (CLiCS) system 14266 that receives the following inputs: layout and design specifications 14260, lithography tool parameters and settings 14262 and test wafer data 14264. The CLiCS system 14266 uses the steps shown in FIGS. 86A and 86B and FIGS. 87A and 87B to perform three basic functions described in 14268, 14270 and 14272. The first function is to verify whether a given layout passes or fails the lithography process step for a given layout design level 14268. The second function is to identify areas of the layout that exceed design tolerances 14270, (similar to the situation depicted in 14271 also shown in FIG. 49). The third function is to modify the layout such that the printed (etched) dimensions and features match the desired values or are within the design tolerances 14272. The result is a modified layout that meets all the design and electrical specifications and yields the desired printed (etched) feature dimensions 14274. The layout is then used to generate the mask set for lithography 14276.

In some cases, there may be a large performance benefit to squeezing parameters well within the design tolerances. This may be accomplished by either reducing the tolerance limits or iterating between the prediction and correction components (as shown in 14024 of 46A or 14084 of 47A) until the error is sufficiently reduced. The cost of continual optimization of design and electrical parameters is that the computational burden will likely increase significantly. As such, this decision is left to the system user.

h. Implementations and Uses

The methods described above may be implemented in software running on a computer or server that communicates with various components via a network or through other electronic media. The methods can be used as a Design for Lithography (DfL) system that verifies whether a particular circuit design will be created or imaged accurately on the wafer or corrects the design where features will not be accurately reproduced. DfL incorporates lithography-related, within-chip pattern dependencies into decisions regarding the design and process development flow.

This section will describe how the software may be implemented and how it may communicate with other design and manufacturing components. This section will also describe how the software may be used with and within lithography tools and electronic design automation (EDA) tools.

The components that comprise the method are constructed in software (e.g. Java, Tcl, Basic, SQL) and modularized such that the method may or may not use all the components in the generation of measurement plans. For example, the method may only use process models to generate film thickness variation, compare this with design specifications and determine those locations that are most likely to violate the specification. The following descriptions describe the general computational framework for the method.

FIG. 51 shows a useful software architecture described in the following paragraphs. The user 14353 communicates with the system through a graphical user interface (GUI) 14354, such as a web browser. The GUI 14354 allows the user to choose and upload electronic layout design files into the system and view areas that require modification or areas of the design that have been modified by the design for lithography system. When the system is housed within an EDA tool the user may be a designer, and the GUI may be part of the EDA tool.

In general the GUI, as defined and used throughout this section, allows the user to choose, upload or transfer from another form of electronic media, electronic layouts, desired design rules, electrical performance, or CD variation for the particular device described by the design files. The user may also use the interface to select process and electrical models from a server or transfer or load models from another electronic media source or computer. The user may also use the interface to review the results of lithography prediction, design faults and modifications to the design. These results may be in the form of, for example:

histograms and other statistical plots,
full-chip images of wafer-state (including feature variation) or electrical parameters at some point in time,
movies of full-chip topography such as film thickness, dishing, erosion progression during a process step or flow,
movies of full-chip electrical parameter variation such as sheet resistance, drive current, timing closure issues and capacitance, and
tables of values.

The GUI 14354 communicates with a series of software components, services or functions 14355 (referred to here as the service module) that manage the flow of information throughout the system to the database and file system 14358 and computational core processes 14356 as well. The services 14355 are modular and serve to initiate the computational core processes 14356 that execute portions of the method and to assemble and format the content for display in the GUI. The modules may be created as scripts (e.g. in Perl, Java, or Tcl) that enable easier interaction with the database using embedded SQL code and with the GUI using HTML, XML or dynamic HTML interpretation. These components also allow the ability to initiate mathematical processes that perform the computation necessary to determine the correct placement of dummy fill within the layout.

The service module 14355 communicates with the computational core of processes and functions 14356 that execute computational steps of chip-level wafer topography, verification and design correction. This core also does the effective pattern density computation and layout extractions. This communication may include instructions, data, model parameters, prediction results in tabular, image or movie forms and pointers to files in the file system.

The service module 14355 also communicates with electronic IC design (EDA) software or layout manipulation software 14357 to manipulate layout information during extraction or to modify the design layout to yield desired feature dimensions.

The database 14358 communicates with the service module 14355 via SQL commands to manage system data such as measurement sites and locations, user profiles that specify permissions and preferred content and presentation, user data which may include layout extraction data, design specifications and rules, model parameters for particular tools and processes, and full-chip prediction results such as surface topology, resistance and capacitance. Examples of databases that may be used include Oracle, Informix, Access, SQL Server, and FoxPro. The file system 14358 communicates with all the components 12280, 12300, 12750 and 12800 to retrieve and store information saved as files, typically too large to efficiently store in the database.

The system may communicate directly with metrology equipment to generate measurement plans and to receive measurements before and after lithography processing. The system may also communicate directly with electronic design (EDA) tools to receive design layouts and to provide modified designs. The system may also communicate directly with electronic design (EDA) tools and foundries to generate test structures and test wafers and to develop and supply process flows and recipes to manufacturing. This communication may be done via a computer network 14359 or computer bus.

If the functionality shown in boxes A 14360 and B 14361 resides on one computer then the system is configured as stand-alone. If A and B reside on different computers and communicate across a network, the system is normally considered a client-server configuration. A network may include electrical and optical communication via an extranet, intranet, internet or VPN. In some cases both A and B will be part of the EDA tool suite and the user, 14353, is a designer.

Here we describe a few useful operational frameworks for applying the system to verify and correct designs to yield desired printed or etched features and dimensions. Other frameworks are also possible. There are three basic computational frameworks described in this section that constitute good methods of operation and delivery of the functionality based upon a user's needs. The first framework presented is a stand-alone configuration, shown in FIG. 92A, where the components 12280, 12300, 12750 and 12800 of FIG. 50 reside in 14363 and data in and out (14364 and 14365) are accessed from a single computer. The second framework is a client-server configuration, shown in FIG. 92B, where the GUI resides on a client computer 14367 also shown as box A in FIG. 91, which accesses, via a network 14370 the other components, shown as box B in FIG. 91, residing on a server or multiple servers, a server farm 14371. The communication could be done via internet, intranet or extranet networks 14370 and the server may serve one or more clients or users.

The third framework, FIG. 92C, is an extension of the client-server model that includes communication via a network 14376 with additional computers that may contain one of more components of the system described in sections b. through f. For example, a design house may utilize the design for lithography tools via the server 14380 but remotely utilize separate computers which house EDA tools 14382 or process models or model parameters 14379 and design specifications 14378 that are provided by the fab or a process development group. This framework also includes the transfer of measurement plan data to control computers on metrology equipment 14381 and the return of actual measurements to the server 14380. This framework also includes the transfer of process related information, such as calibration model parameters, to and from manufacturing or foundry computer systems 14381 to the server. 14380. This framework also includes the transfer of information to optical proximity tools 14383 for feature density analysis and design correction.

The system and methods can be implemented and used as a Design for Lithography (DfL) system that verifies whether a particular circuit design will be created or imaged accurately on the wafer and corrects the design where features will not be accurately reproduced. The DfL system includes components 12280, 12300, 12750 and 12800 of FIG. 50A and provides layout extraction, chip-level topography computation, lithography CD variation computation, design verification, and design modification. As shown in FIG. 93, the DfL system 14522 may be used with or implemented within electronic design automation (EDA) tools 14500 either directly integrated or communicating via bus or network through an application program interface (API). FIG. 93 illustrates where the DfL system 14522 would fit within an EDA tool 14500, for example. Conventional EDA tools may have the following components: system-level design 14502, logic synthesis 14504, design layout 14506, place and route 14508, physical verification 14510, and signal integrity 14512. Each electronic design file is used during the tape-out process to create masks 14514 which are used in manufacturing 14516 the production IC. Most design for manufacturing components interact with the physical verification and place and route components. The DfL system 14522-14525 is not limited to what component it may interact with and may include place and route 14508, physical verification 14510, signal integrity 14512 and eventually mask creation 14514. However, the most likely role is within the physical verification component 14510, which ensures that a design abides by the rules and constraints provided by manufacturing.

Potential uses of the DfL system include assistance in the placement and specification of buffer regions for interconnect vias and lines during place and route. In this use, feature width variation or topographical variation could aid in determining where electrically active features and components should be positioned and how electrical features that allow communication between these components (e.g. vias and lines) may be routed across the device.

Potential uses of the DfL system include assistance in the placement and geometrical dimensions of interconnect vias and lines to improve signal integrity, timing issues and power distribution. In this use, feature width variation or topographical variation could aid in determining what the resulting feature geometries will be after processing and how these electrical features may be modified (e.g., bloated or shrunk by some percentage to compensate for topography effects) geometrically to achieve better circuit performance or better device structural and reliability properties.

Potential uses of the DfL system include assistance in the placement and buffer regions for dummy fill added to a design. In this use, feature width variation or topographical variation could aid in determining where dummy or slotting objects should be positioned, the size of dummy and slotting objects and the buffer distance between dummy and slotting objects and nearby electrically active regions.

These components may be combined to verify or correct for problems in the electrical performance. The following example describes such a method. First, the DfL system could be used to modify features on the circuit layout. Next, the results would be passed to an RC extraction tool. Then, the RC extraction results would be used to re-simulate the circuit performance. The resulting performance could be verified, or alternatively the circuit performance results could be used to make further modifications to the design layout. In addition, several different alternative layout modifications could be made; RC extraction and subsequent simulation run all options, and the best modified layout chosen based on the circuit simulation performance.

FIG. 94A illustrates how a design group (or a design house) may use a DfL system 14659 that resides within, is directly bundled with, or directly communicates with an EDA tool 14670. Most designs begin with specifications 14655 that include tolerances on feature size and resolution as well as electrical IC parameters. The design group 14656 uses these specifications to guide them during the creation of an integrated circuit 14657. During the process, one designer or subgroup may do the logic design 14662. Another designer or subgroup may do the memory design 14664 and yet another may design the analog component 14666. A goal of design for manufacturing is to consider manufacturing constraints at various stages of design that are generated with an EDA tool 14670. EDA tools may contain several design for manufacturing components and the DfL 14659 system may be one of those components, as shown in FIG. 94A. In this use, the DfL system continually verifies and corrects 14656 designs as the components are designed and added by the designers. In this use, DfL system may directly interact with place and route functions, physical verification functions, electrical simulation and extraction functions and optical proximity functions to provide feature width variation data. This process may or may not include iterative addition of dummy fill as well. In cases, where the system cannot find any corrections to the layout that achieves the design specifications, the design group is notified of the design failure 14660. The foundry or manufacturing group provides manufacturing information 14672 regarding the calibration of models to specific process tools and recipes.

In that the DfL system provides a bridge of information flow between the design and manufacturing sides, the DfL system may also reside with the manufacturer or on the internet and communicate with design tools via a network connection. FIG. 94B illustrates a use of the DfL system 14697 outside of or indirectly communicating with one or more EDA tools 14680. The design specifications 14682, which include CD or associated electrical tolerances, are provide to both the design group 14684 and the design for manufacturing components 14694. The designers use the EDA tool suite to create and add components 14686, 14688 and 14690 into the IC layout 14686.

Each design level is completed 14692 and electronically transferred 14696 via media, network or the internet to the design for manufacturing components 14694, which includes the DfL system 14697. This framework includes the use of the DfL component as a web service that communicates via the internet with both the design and manufacturing groups. Each design level is processed using process information 14693, which includes calibration parameters regarding specific tools and recipe settings. Corrections to the design are uploaded to the EDA tool and server 14698. In cases where the system cannot find any corrections to the layout that achieves the design specifications, the design group is notified of the design failure 14699. In the frameworks shown in FIG. 94A and FIG. 94B the DfL system may:

reside within tools in the lithography process flow and communicate via a bus or network connection, reside within an etch tool and communicate via a bus or network connection, reside on a network at a foundry that allows for process, lithography (etch) models to be developed and managed by manufacturing or process development personnel, reside on a server physically located away from both the design and manufacturing groups and communicates via a network, for example, as a web service, or reside at a design house or group but outside of a specific EDA tool and may include network communication with a number of EDA tools from different vendors, or reside at a foundry and may communicate via a network with a number of EDA tools from different vendors.

As shown in FIGS. 95 and 96, the DfL system may be used within a larger design for manufacturing system or server. An example of a design for manufacturing system is shown in FIG. 95. An IC design of one or more levels is loaded 14800 and key pattern dependent parameters may be extracted. Process models or simulations of one or more steps 14802 and that may be calibrated to tools and recipes 14804 and 14806 are used to predict full-chip topography 14808 (such as film thickness, dishing or erosion) or electrical parameters 14808 (such as sheet resistance, capacitance, cross-talk noise, drive current, timing closure values or effective dielectric constant). Desired results such as physical and electrical parameters and critical dimension tolerances, often derived from the design specifications, are loaded into the system 14812. A comparison is performed 14810 and those sites or IC features that exceed the specified tolerances and the associated variation 14814 and 14816 are used to make corrections within the design or manufacturing processes.

The variation may be used as feedback to facilitate changes in the design process through use of a dummy fill component 14818 where the size and placement of dummy fill is determined and the design modified 14822. The selection and placement of dummy fill within an IC design level may include the use of pattern dependencies to improve the physical and structural makeup (e.g. use of low-k materials) and electrical performance of the IC. When the variation is primarily due to lithography or the combination of surface variation and lithography, the DfL system or component 14820 may be used to modify 14822 the IC design 14800.

The variation 14814 may be used to modify process parameters and recipe settings as well 14824. This component uses models calibrated at multiple recipe settings and using various consumables to determine the best known process and consumable set. This component may provide this information to a tool operator or modify tool recipe settings directly 14826. This component may also be used to synthesize multiple process recipe steps within a flow such that design parameters are optimized. The process optimization component may be used in conjunction with the DfL component 14820 to evaluate lithography tool settings and consumables (such as photoresist materials) with regard to yield and feature size variation. This component may also be used to generate measurement recipes 14825 for measurements to be taken during calibration or actual manufacture of the circuit 14825.

Once the design and manufacturing process parameters are synchronized to yield an optimal circuit, the electronic design is used to tape-out and create the masks used for lithography, including the addition of dummy fill structures within the design. The optimal process and measurement recipes may also be transferred to respective tools within the manufacturing flow used to create the production circuit.

The DfL component may also be used to choose an optimal lithography recipe among lithography tool settings and consumables (e.g. photoresist). In this use, multiple recipes for the process steps leading up to and including lithography are evaluated using test wafers described in section g. and the calibration process described in section b. A new IC design can be loaded into the system and the process and lithography models evaluated across the multiple recipe calibrations to arrive at minimal feature size variation from the desired specifications. An illustration is shown in FIG. 96 where the system uses the process described in FIG. 50A to predict first pass feature size variation or to iterate 14906, 14907, 14908 until an optimize printed feature size is reached for each set of calibration parameters associated with a recipe condition 14901, 14902, and 14903. The results are compared and the optimal recipe setting is determined 14904. The calibration parameters for each recipe condition may be generated using the processes and test wafers described above. The design for manufacturing system may also employ optimization methods to interpolate or synthesize among lithography process flow recipe conditions.

Several screenshots of graphical user interfaces (GUIs) for design for manufacturing and design for lithography systems are shown in the following figures. A GUI for the Layout Manager component, shown in FIG. 97, allows the user to upload a layout through a web browser and web services, which are automatically configured to add dummy fill for the appropriate processes and according to user defined design rules (also input through a similar GUI). The three designs, 15161, 15162 & 15163, were processed using the layout extraction algorithm to compute effective density. Options are provided to the user to use our layout extraction methods to compute feature width and space or to upload this information from another source, 15164, 15165 & 15166.

The results of a layout extraction using the system are shown in the images in FIGS. 98A and 98B. FIG. 98A shows a full-chip image 15167 of extracted feature widths (line widths in this case) across the chip according to the scale shown on the right 15168. In FIG. 98B, the spatial line widths across the full-chip are shown 15169, 15170, 15171, 15172, 15173, 15174 and 15175 according to which line width bin they fall into and useful distributions may be formed. This information, as well as line space, local and effective density may be input into the models to predict process and electrical variation.

A graphical user interface (GUI) for a design for lithography component is shown in FIG. 99A, operating within a design for manufacturability server, GUI shown in FIG. 100. A browser 15300 is used as the GUI that communicates with a web server based DfL component residing on a server. The benefit of using a browser is that almost every computer is now equipped with a web browser and there is a great deal of standardization across the two major browsers from Netscape and Microsoft. A full-chip topography image 15302 is shown and those sites (e.g., 1, 2 and 3) that violate feature dimension tolerances are indicated 15304. The site locations are also shown 15306. A button is shown that initiates the correction component that modifies the design to pass design tolerances 15308.

The GUI for the design for manufacturing component is shown in FIG. 99B and a good implementation again uses a web browser as the GUI. The dummy fill services and functions are grouped within the GUI into three primary components; design (15499), manufacture (15491) and model (15400). The screenshot in FIG. 62 shows in the header, 4190, and in the navigation bar, 4191, that the user has selected the manufacturing component. Within the manufacture component are subcomponents: fabs, tools, wafers, and measurement data. In this screenshot, tools, 15492, have been selected. There are three subcomponents under tools: types, recipes and flows. In this screenshot the user has selected types 15493. The types of tools and tool settings available to this user are shown 15494. The available recipes for this tool type 15496 and available recipe sequences 15497 for these tool types are shown. The system configured in this screenshot has two process models available to the user 15498 for calibration and prediction of copper CMP. The design component 15499 uses a layout manager to allow the user to upload and manage layouts and layout extractions. One goal of the design for manufacturability system GUI is to allow the user to manage all the data and results associated with design for lithography services.

Figure 61B:
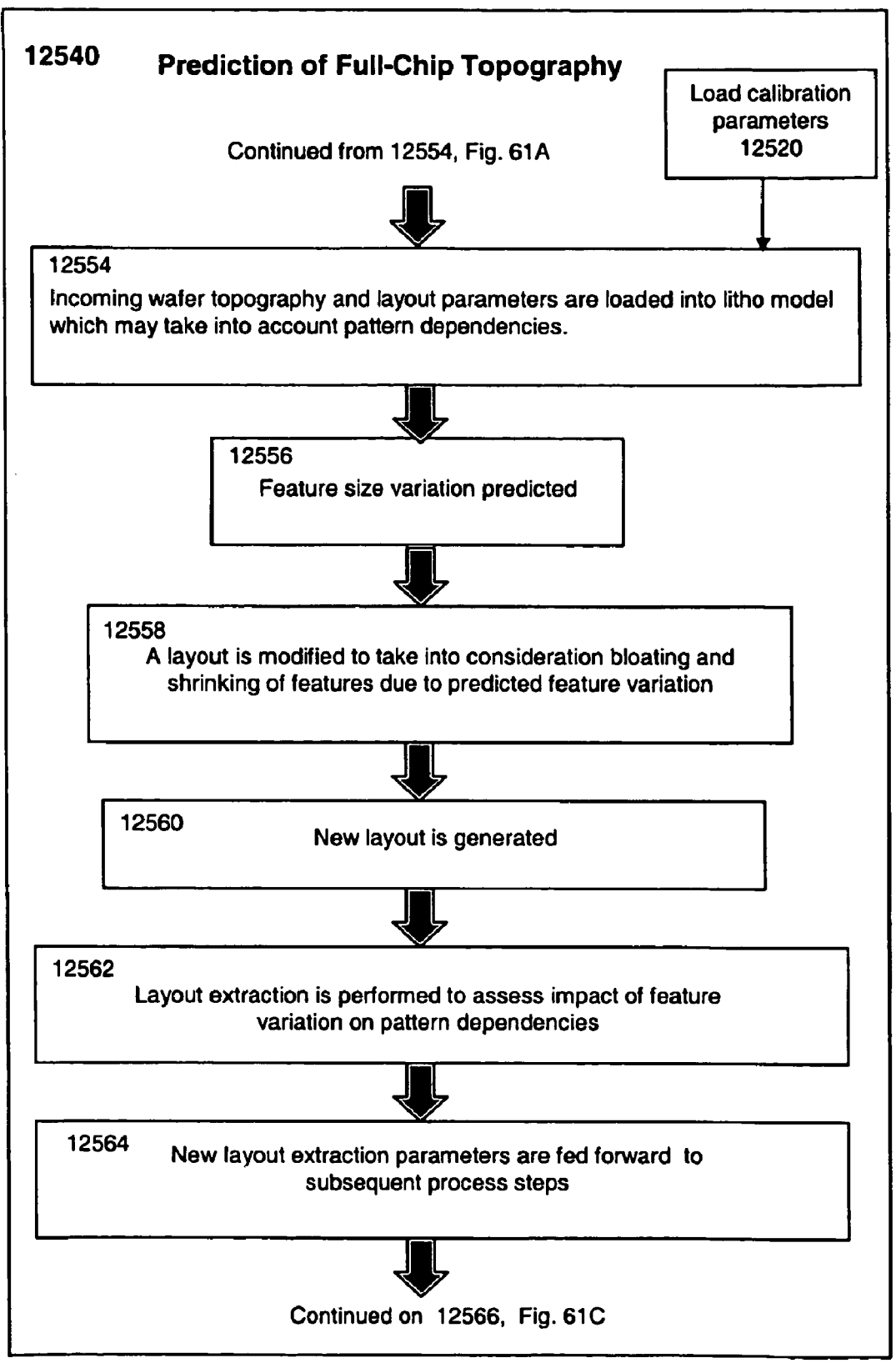
FIG. 61B illustrates a continuation of the steps in prediction of chip topography.
Figure 61C:
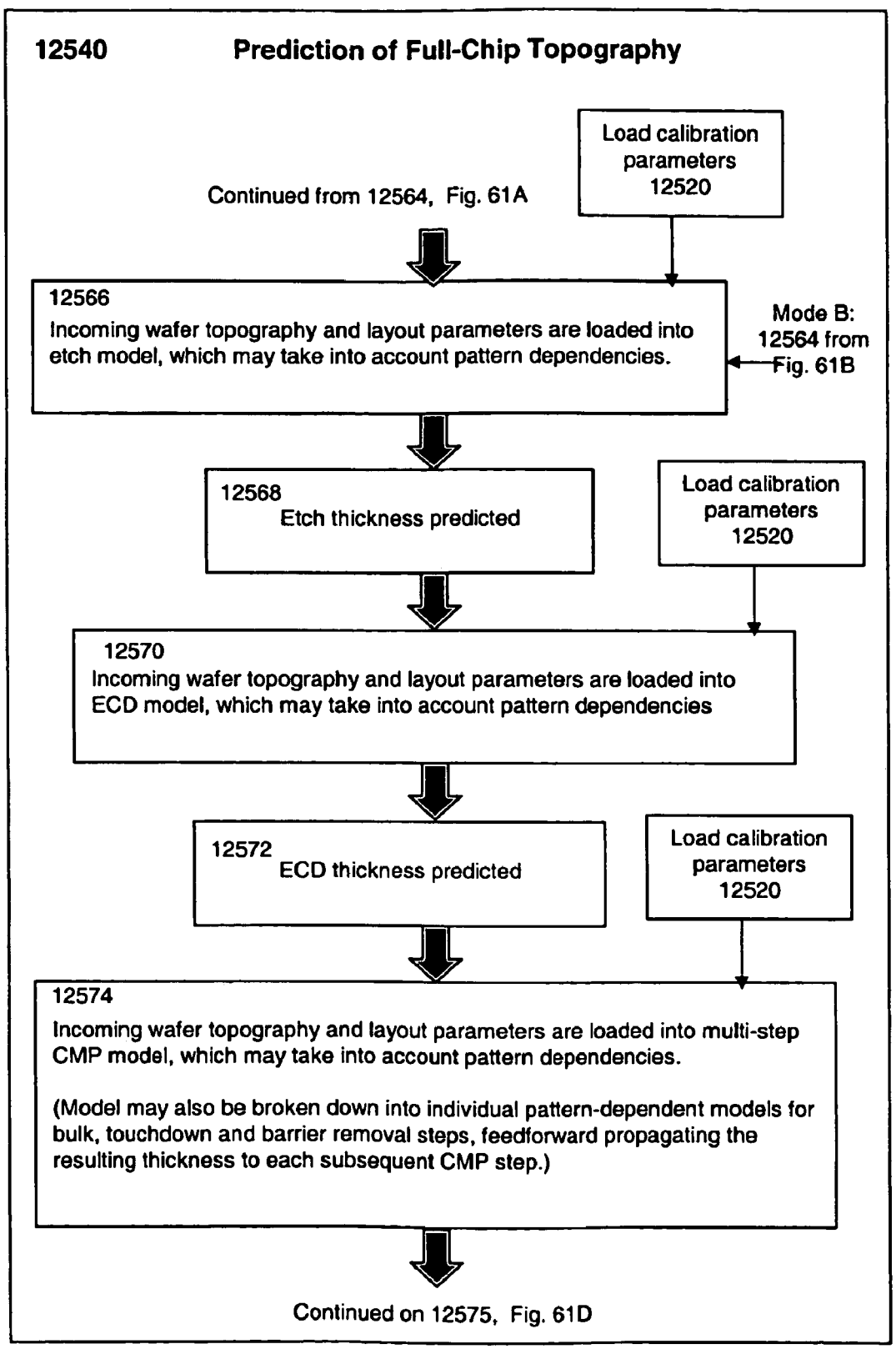
FIG. 61C illustrates a continuation of the steps in prediction of chip topography.

As described in FIG. 61A and FIG. 61B, the characterization of feature thickness and width variation due to pattern dependencies in the deposition, etch, plating and polishing processes, may be used to generate a full three-dimensional model of circuit features for each of multiple levels in a device (e.g. predicting the uncorrected feature thickness and width variation at each level). This model may be helpful in predicting the electrical performance of interconnect levels. The thickness and width variation of interconnect features has large impact on timing and power performance of the manufactured circuit.

Figure 10A:
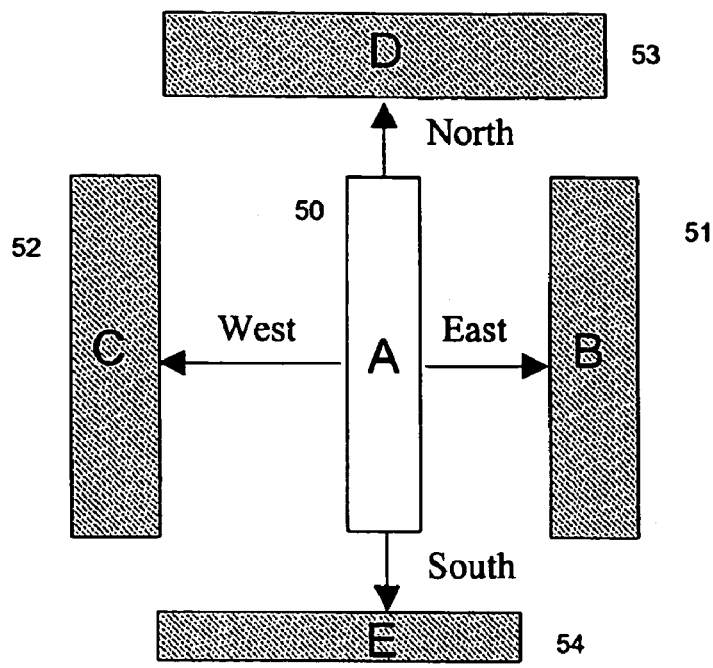
FIG. 10A illustrates the structures neighboring a given object, A.
Figure 10B:
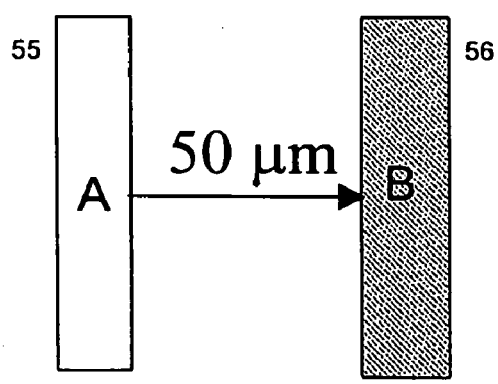
FIG. 10B illustrates the distance between objects A and B.
Figure 10C:
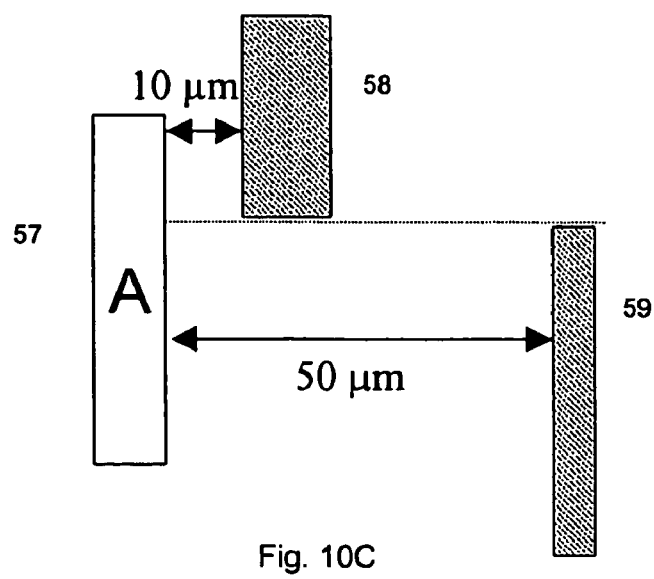
FIG. 10C illustrates the distance between closer and farther neighboring objects.
Figure 10D:
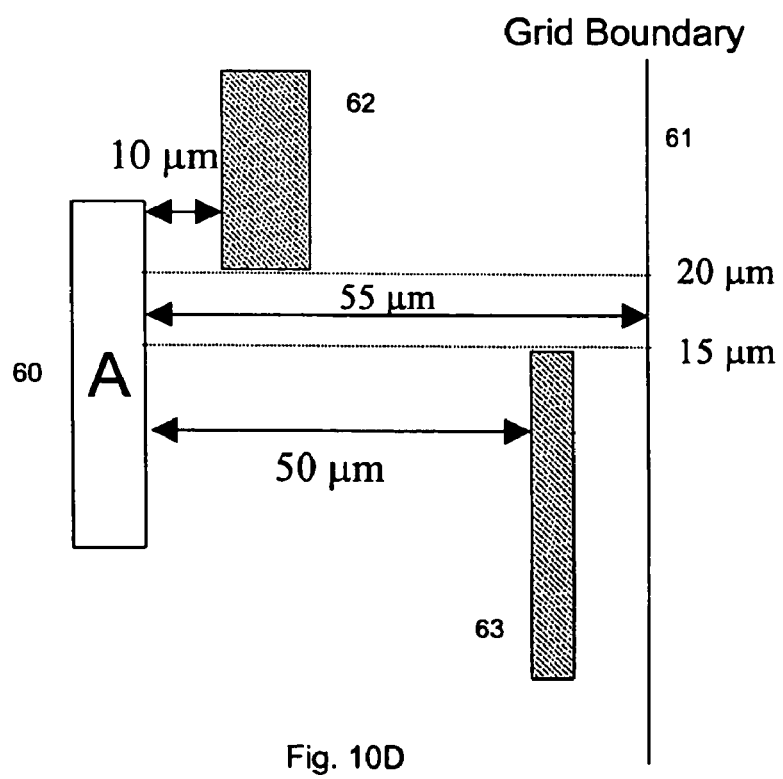
FIG. 10D illustrates how the grid boundary may be considered a neighboring object.

An application of pattern dependent models to full three-dimensional feature thickness and width predictions is illustrated in FIG. 10A. A layout is generated for a single level N 15602 and pattern dependencies are extracted 15604. The extraction is loaded into the system that includes pattern dependent models of oxide deposition 15608, etch 15610, ECD 15612 and CMP 15614 using calibration processes described in FIGS. 12A, 12B, 14 and 60. Feature thickness and width prediction for each step is propagated to subsequent steps until the complete interconnect level is characterized 15616.

To compute three-dimensional feature variation for multiple levels, a check is made whether all levels have been completed 15622. If so, the full three-dimensional characterization is complete 15624. If not, the flow continues to the next level, N=N+1 15620. The final topography generated from the prior level is propagated 15618 and is transferred 15626 to the first step 15608 of the next interconnect level.

Long interconnect wires (eg. buses) in integrated circuits are generally optimized using intermediate buffers (also known as repeaters) to reduce the propagation delay. An optimal buffer insertion strategy involves sizing the buffers (transistor gate width to length ratio) as well as the buffer number. The buffer size and number are a function of the interconnect resistance (R) and capacitance (C), both of which depend on the interconnect geometry. If the interconnect geometry is not modeled properly, the estimate of wire RC will be inaccurate. This can result in an improper buffer insertion technique with the incorrect buffer size and number.

An incorrect buffer insertion method not only affects the propagation delay but also the power consumption of the circuit. FIG. 101B shows a circuit with a single driver at the input and output with a 10 mm wire. This circuit does not contain any intermediate buffers so its propagation delay has not been optimized. The optimal buffer size and number can be computed based on a conservative worst-case estimate of the wire resistance and capacitance (eg. 20% variation for $R_0$ and $C_0$). This might result in an optimal buffer number of 2. However, adding these buffers will require additional wiring to route across the wiring layers down to the buffer and may also further increase the amount of wiring needed to route around the existing metal on the chip. This additional wiring could increase the actual buffer number to 3 assuming the worst-case scenario for interconnect variation.

FIG. 101C shows that the bus is broken down into four equal sections with resistance and capacitance of $R_0/4$ and $C_0/4$ plus the added RC associated with each buffer due to the additional wiring used to route between the buffers (eg. $R_1$, $C_1$). The additional wiring and buffers increase the total resistance and capacitance of the bus line (the interconnect RC and the added device capacitances). Although the speed of the bus is reduced with the added repeaters, the power consumption has increased.

An alternative method is to use a process model (or process models or flow) to characterize pattern dependent feature variation (e.g. as shown in FIG. 15, FIG. 50A or FIG. 100A) and electrical simulations or models to more accurately determine the interconnect RC for one or more features, a portion of the chip or a critical network on the chip. A good process model can eliminate much of the uncertainty in the interconnect geometry that result in an overly conservative use of buffers. For example, the new worst-case estimate on the RC may be only 5% using the system described in FIG. 100A. In this case, for our example, the optimal buffer number may be reduced from 2 to just 1. The addition of the buffer will again add some overhead due to the increased wiring required for routing between the buffers, which will increase the total RC. This may result in the addition of another buffer to compensate for the overhead just as before, bringing the total buffer number to 2 (see FIG. 100D). However, if the overhead is not very large, it may be the case that only a single buffer is required. In either case (with just 1 buffer or 2 buffers), the total load capacitance and resistance can be reduced by using a process model to predict or simulate interconnect geometry. This may result in a significant power savings.

This application may be used by designers and with EDA tools, as shown in FIG. 94A and FIG. 94B, to determine the size, number and placement buffers and reduce power consumption of IC devices. This application may be used by designers over a network (e.g. internet, intranet or extranet) or may be implemented and used as a web service. This application may also be embedded as part of an EDA tool (e.g. place and route). This application may also be used as feedback to guide the route and place step of electronic design.

In what follows, we describe approaches that are useful to identify and characterize areas of a chip that are likely to be problematic due to predicted variation in film thickness, surface topography uniformity, and electrical impact resulting from pattern dependencies during processing of an integrated circuit. The approaches are applicable to the high density plasma (HDP) and chemical-mechanical polishing (CMP) processes used in the formation of shallow trench isolation (STI) structures, as well as the electroplated copper deposition (ECD) and chemical mechanical polishing (CMP) processes used in the formation of single- and multi-level interconnect structures for integrated circuit (IC) devices. The approaches are also applicable to the processes and flows used to create oxide and low-k dielectric layers. The approaches are also applicable to plasma-etch processes and the measurement of critical dimensions. The approaches are also applicable to lithography processes. The approaches are also applicable to any step or steps that constitute damascene process flows. The approaches assemble the locations or coordinates of problematic areas into measurement plans and may also generate measurement recipes for used by metrology tools.

In fabricating integrated circuits, interconnect film thickness and surface topography uniformities are dependent on variation in circuit layout patterns (e.g. material density, linewidth and linespace). Surface non-uniformity often leads to subsequent manufacturability and process integration issues. These pattern dependencies may also affect device performance by introducing variation in capacitance and resistance depending on the location of a given structure on the device.

Film thickness variation in chemical mechanical polishing (CMP) processes can be separated into various components: lot-to-lot, wafer-to-wafer, wafer-level, and die-level. Often, the most significant component is the pattern dependent die-level component. Die-level film thickness variation is often due to differences in layout patterns on the chip. For example, in the CMP process, differences in the underlying metal pattern result in large long-range variation in the post CMP film thicknesses, even though a locally planar surface topography is achieved.

For oxide polishing, the major source of variation is caused by within-die pattern density, shown as two groups of metal lines in FIG. 102A. The metal lines 16501 on the left side of FIG. 102A have a lower density in the directly of the plane of the integrated circuit than do the metal lines 16502 on the right side of the figure. Pattern density, in this case, is the ratio of raised oxide area 16503 divided by the total area of the region. The region may be taken as a square with the length of the sides equal to some length, the planarization length. The planarization length is usually determined by process factors such as the type of polishing pad, CMP tool, slurry chemistry, etc.

FIG. 102D illustrates an example of how the underlying feature density affects the film thickness variation. FIG. 102E plots the film thickness variation corresponding to each density type. For a given square area defined by planarization length 16521, the higher the underlying feature density leads to larger film thickness variation 16523 and the lower the underlying feature density leads to a reduced film thickness 16524. Designers often try to maintain density tightly around 50% 16522 to promote planarity. The effective pattern density may be computed for each location on the die by filtering the designed layout densities, often by using various two-dimensional filters of densities around the given location. FIG. 102A illustrates how the underlying features 16501 and

16502 cause variation in local surface topography (step height) 16004 and global non-planarity 16003.

In creating shallow trench isolation (STI) structures (shown in FIG. 102B), $SiO_2$ 16006 is deposited in a trench etched in silicon 16005 and planarized using CMP to electrically isolate devices. As with oxide inter-level dielectric (ILD) polishing, the underlying pattern of isolated trenches results in unwanted variation. Problematic areas often are created as a result of CMP such as nitride erosion 16007 (where the nitride barrier is removed and possibly exposes the underlying Si to contaminants and damage), corner rounding 16008 (which has the effect of potentially widening the trench and where the exposure of Si destroys the device) and oxide dishing 16009 which results in topography variation which impacts subsequent lithography. In STI polishing, pattern density is an important feature with regard to topographical variation and other CMP effects.

FIG. 102C illustrates the effects of polishing metal features (e.g. copper lines 16011 and 16012) entrenched in a dielectric (e.g. $SiO_2$) 16010, during a damascene CMP process. For metal polishing, computation of pattern density is important to characterizing full-chip pattern dependencies; however other physical layout effects such as the linewidth and linespace may also be required. Two effects known as dishing and erosion result from metal damascene CMP. Dishing 16013 is measured as the difference in metal thickness at the edge of a line and its center. Erosion 16014 is defined as the difference in oxide thickness above a metal line, typically within an array of lines, to an adjacent unpatterned region. In a third effect residual copper 16015 has not been removed from field or up areas of the chip.

FIGS. 103B and 103C illustrate in more detail some of the electrical effects that result from copper CMP performed during the creation of interconnects. A goal of a damascene process is to achieve a globally and locally planar surface of deposited metal 16016 in an oxide or ILD material 16017, as shown in FIG. 103A. When the polish time is not sufficiently long enough, residual copper 16019 may remain on the chip and in the case shown in FIG. 103B, form a jumper or electrical short 16019 across two electrically active structures or lines 16017. When the same structure is polished for too long (as shown in FIG. 103C), copper is removed from the lines 16020 in an effect called dishing. The electrical impact of dishing is to increase the resistance 16022 of the line, which subsequently affects the RC time-constant of this section of the chip.

As illustrated in FIG. 101B, One effective measurement technique is to measure 16028 only those problematic areas 16029 within the active area of an IC design 16027 that are most likely to violate the design specifications or requirements. If those areas are measured to be within design specifications, then it can be assumed that all other areas of the chip are, too. The design specifications or requirements may be wafer-state parameters, such as minimum and maximum film thickness variation, or critical dimensions or electrical parameters such as maximum sheet resistance or maximum variation in sheet resistance across the chip. One approach uses the characterization of pattern dependencies during fabrication to identify such problematic areas by location and determine the appropriate measurement recipe for measuring the variation at that site. The approach may be used to match metrology recipes (i.e. settings on the metrology tool that describe where and how a measurement is to be made) with processes to characterize and minimize variation, thus reducing ramping times for pilot lines and factories. In general, however, this approach is difficult because designers generally do not know where the problem areas are a priori.

The approach may also be used with pre-existing metrology recipes and measurement plans. In some cases, a predefined measurement pattern will be used for in-situ or in-line measurement. As the approach is introduced into the fab environment, it may be used to add likely problematic sites to pre-existing measurement plans that are accepted and qualified within some fab. As such, the approach may be used independently or with existing measurement plans and strategies.

The approach may also be used to generate complete measurement recipes, not just site locations. For example, from a predicted thickness variation across an array structure the approach may specify the scan location, scan start and scan end locations and the number of measurement samples to take along the scan length—all based upon the predicted thickness variation compared with the desired chip specifications. The approach may also be used to coordinate measurement sites and recipes across multiple metrology tools. For example to measure erosion in a copper CMP test wafer, the approach may specify a thickness measurement in a field area adjacent to an array structure and generate the appropriate recipe for a Metapulse optical measurement tool. The approach would also specify a profilometry scan to start at a location at or near the thickness measurement and end at a field location at the other side of the array, as well as the number of samples to be taken along the scan. All of these implementations may be considered as measurement strategies where the measurement site plan or measurement recipes are generated from the predicted chip and wafer level characteristics and transmitted to one or more metrology tools.

By choosing measurement sites and recipes based on pattern-dependent process variation and automatically generating measurement plans for metrology tools, the system may identify, for example, potentially problematic areas across a chip that may result during ECD or HDP and subsequent CMP of interconnect features used in semiconductor devices. As explained earlier, these problematic areas are often due to variation in wafer quality (e.g. film thickness variation and surface topography variation such as dishing and erosion) and electrical parameters (resistance R, capacitance C, and noise). This variation is modeled and simulated using semi-physical process models that may be calibrated to a particular process and tool for each step in a sequence of one or more steps within a process flow. In general, a semi-empirical model, based on some physical understanding of the process, is fit to a particular tool at a particular recipe condition using data measured from actual processed test or production wafers. This fit of a model to better represent a given tool and recipe is often referred to as a calibration.

Engineers must be judicious in how measurement sites are selected to confirm the effectiveness of process steps or sequences. Each measurement may delay subsequent process steps and negatively impact yield. For a new IC design, determining the areas of the chip most likely to be problematic can be difficult. In addition, dummy fill structures may be placed in the layout to improve thickness and surface topography uniformity of the manufactured wafer while maintaining the electrical parameters at the intended or designed values. However, the introduction of dummy fill introduces further complexity by changing the topography of the chip and thus may shift problematic areas from one chip location to another. Using the approach discussed here, the metrology tool can be controlled to confirm that full-chip variation meets the design specifications for the actual manufactured device.

The approach illustrated in FIG. 104 includes sub-blocks 16031, 16033, 16034 and 16035 that will be described in greater detail in later sections. The approach may be used with in-line, in-situ, and off-line measurements. The figures illustrate the approach for use with in-line operation.

An IC design is commonly represented electronically (e.g. in a Graphical Data Stream or GDS format) in a library of files that define structures and their locations at each level of an integrated circuit 16030. These files are typically large, although the features that are relevant to process variation could be described more efficiently. A process of layout extraction 16031 involves summarizing discrete grids of IC designs in a compact set of such parameters such as linewidth, linespace, and density for each grid. A description of how to perform layout extraction is described in section a.

The layout features are mapped 16033 to wafer quality, such as film thickness, or to electrical parameters, such as sheet resistance or capacitance. (A flow description for this component is shown in FIG. 110.) This information may be used with a process model (e.g. a CMP model) or set of process models (e.g. ECD and a multi-step CMP process or a more complex process flow) to predict or simulate the manufacturing results and corresponding variation 17501 that will occur when the design represented by the layout features is manufactured on the modeled process. The resulting device variation can be measured physically, such as by optical measurement of the film thickness, or surface profiling of the wafer surface to measure topography (e.g. dishing or step height and erosion or array height). The variation can also be measured electrically, such as by measuring sheet resistance or capacitance 17502 and may require the use of the original IC design 16039. The computed parameters from 17501 and 17502 relevant to the desired specifications for comparison are acquired for the full-chip, both within die and for multiple dies across the wafer 17503. This information is stored in a database 17552 and used for comparison to the desired chip and wafer specifications.

Using a combination of both process models and electrical simulations, the performance of a given IC design can be predicted and compared against the desired wafer quality and electrical parameters as well as design rule criteria 16032. The dynamic measurement plan 16035 component performs two basic functions. The first is to compare predicted and desired parameters and the second is to generate the wafer measurement plan for a particular metrology tool. The comparison can be a simple check to see if the predicted wafer or electrical parameters exceed the design threshold or are within a specified tolerance. If so, the location of that position on the die is entered into the measurement plan for a specific tool.

Often a measurement site may require multiple recipe settings to direct the tool appropriately. For example, a profilometry scan requires not only the scan location but also a start and end point as well as the number of sample to take along the scan length. As such, the approach could specify these recipe parameters based upon film thickness variation. The site locations and other parameters may be used to generate complete measurement recipes for one or more metrology tools to be used at a particular point in a process flow. The locations to be measured, the associated measurement plans and measurement recipes are stored in a database 17552 for presentation and review by the user or automatic electronic transfer to a metrology tool 16036.

The metrology tool 16036 uses the measurement recipe (e.g. one or more measurement site locations and tool parameters such as where a profile scan is to begin and end) to direct where to measure 16039 on a wafer 16037 that is processed by one or more process steps (e.g. a process flow) 16038. An optional application 16040 of this system can repeatedly store any errors between predicted and measured sites 16041 to refine the models 16042 and achieve better prediction. This may be useful to account for process drift that may occur after a tool has been calibrated. In some cases, process drift can be accounted for by tuning the model and not require a full re-calibration of the tool.

Illustrative embodiments of a method for measurement are described in the following sections. Section a. describes the extraction of layout parameters related to process variation as a method to transform the large design files into a manageable set of features. Layout extraction is not required but is useful. Section b. describes a desirable use of process and electrical models to characterize the impact of process variation on wafer-state specifications and electrical performance. Section c. describes how model based predictions are used to manually and automatically generate measurement plans for metrology tools. Section d. describes the construction and computational framework used to implement the dynamic measurement system as well as the operation of the system and methods by users.

a. Layout Parameter Extraction

A layout is a set of electronic files that store the spatial locations of structures and geometries that comprise each layer of an integrated circuit. It is known that process variation, which negatively impacts the planarity of processed films, is related to the variation in spatial densities and linewidths of a given design. To characterize this relationship, our method uses layout extraction, in which linewidth and density features are extracted spatially across a chip from the geometric descriptions in layout files. The extracted information may then be used to determine areas of the chip that exceed design rule criteria regarding designed linewidth and density.

The layout parameters used to compute dummy fill include the effective pattern density and linewidth. Although the dummy fill method works with extracted densities and linewidths, it is useful to include the extracted linespace, as well as linewidth and density.

The flowchart in FIGS. 105A and 105B provides a detailed flow of the layout extraction component 16031 of FIG. 104. In FIG. 105, the layout file is transferred or uploaded to the dummy fill system 17311. The layout is divided into discrete grids, small enough so that aggregate computations of mean, maximum and minimum features can be used to represent the structures in the grid and still allow accurate dummy placement 17312. A typical grid size could be 40 µm×40 µm. The grids are ordered or queued for processing 17313. One desirable approach is to use multiple processors to compute the grids in parallel 17314. A grid is selected 17315 and within that grid the linewidth of each object 17316 is computed 17317. This process is repeated for every object within that grid 17318. For each set of neighboring objects (e.g. adjacent objects or objects within some defined distance) the maximum, minimum and mean linespace is computed 17319. The effective density for the entire grid is then computed 17310. This process is repeated for all the remaining grids 17311. Once all the grids are processed, the extracted features such as linewidth, linespace and density are re-assembled from the different processors 17312.

A table is then created and the maximum, minimum and mean linewidth, linespace, and density for each grid are placed in it as well as the maximum, minimum and mean linewidth for the whole chip 17313. The minimum and maximum linewidths for the whole chip used to compute a range.

Bins are useful for computing statistical and probabilistic distributions for layout parameters within the range specified by the bin. The linewidth range (M) for the chip is divided by a number of desired bins (N) 17314 to determine the relative size of each of the N bins. For example the first bin would be the minimum linewidth or small nonzero value A to the linewidth (M/N) and continue until the $N^{th}$ bin which will span the linewidth from min $LW_{BinN}=(N-1)\cdot(M/N)$ to max $LW_{BinN}=(N)\cdot(M/N)$, which is also the maximum linewidth. The limits for these bins may also be set manually by the user. There are three sets of bins, a set of bins for each of maximum, minimum and mean linewidth. Each grid is placed in the appropriate bins according to its max, min and mean linewidth 17315. A histogram is also created for each bin showing the distribution of values within that bin 17316. This information is stored in the database and fed into process models, for example, ECD models, as well as the dummy fill rules generation 17317.

The maximum, minimum and mean linespace ranges are computed for the full chip 17318. The linespace range (M) is divided by the number of desired bins (N) 17319 to determine the relative size of each of the N bins. For example the first bin would be the minimum linespace or small nonzero value A to the linespace (M/N) and continue until the $N^{th}$ bin which will span the linespace from min $LW_{BinN}=(N-1)\cdot(M/N)$ to max $LW_{BinN}=(N)\cdot(M/N)$, which is also the maximum linespace. The limits for these bins may also be set manually by the user. There are three sets of bins, a set of bins for each of maximum, minimum and mean linespace for the full chip. Each grid is separated into the appropriate bins according to its max, min and mean linespace 17320. A histogram is also created for each bin showing the distribution of values within that bin 17321. This information is stored in the database and fed into process models, in particular ECD models, as well as the dummy fill rules generation 17322.

The density range is computed for the full chip 17323. The density range (M) is divided by the number of desired bins (N) 17324 to determine the relative size of each of the N bins. For example the first bin would be the minimum density or small nonzero value A to the density value (M/N) and continue until the Nth bin which will span the density from min $LW_{BinN}=(N-1)\cdot(M/N)+A$ to max $LW_{BinN}=(N)\cdot(M/N)$, which is also the maximum density. The limits for these bins may also be set manually by the user. There is one set of bins for density. Each grid is assigned to the appropriate bins according to its density 17325. A histogram is also created for each bin showing the distribution of values within that bin 17326. This information is stored in the database and fed into process models, in particular ECD models, as well as the dummy fill rules generation 17327. Finally all the linewidth, linespace and density information are stored either in the database or on the file system 17522 for later use in process model prediction 17328.

An illustration of how an extraction table 16044 (for all the grids across the full-chip or die) is generated is shown in FIG. 106. The chip or die 16043 is segmented into discrete grids 16045 and the extraction procedure, described in FIG. 105, is used to compute the linewidth 16047 linespace 16048, and density 16049 for each grid element 16046. FIG. 106 also illustrates how the linewidth (LW) 16047, linespace (LS) 16048 and density 16049 values placed 16050 in an extraction table relate to the grid 16045 at (y,x) coordinate (1,1) and the grid at (y,x) coordinate (2,1). In many cases, the max, min and mean of the features within each grid are stored in the table 16044 as well.

b. Process and Electrical Models

A process model or a series of models (i.e. a flow) can be used to predict the manufactured variation in physical and electrical parameters from an IC design. By characterizing the process variation relative to IC structures, the appropriate measurement sites can be determined to characterize those sites where physical and electrical parameters are likely to exceed desired values.

Each process tool generally has unique characteristics and thus a model needs to be calibrated to a particular recipe and tool. It is common practice to process a given IC design to determine the impact of processing on physical and electrical parameters and to develop or calibrate process models specific to a particular tool or recipe, as shown in FIG. 107A. In FIG. 107A, the actual product wafer 16064 is processed using a recipe 16065 on a particular tool 16066. The pre-process wafer measurements 16067 and post-process wafer measurements 16068 are used to fit model parameters 16069. A semi-empirical model is used to characterize pattern dependencies in the given process. The calibration model parameters or fitting parameters 16070 may be extracted using any number of computational methods such as regression, nonlinear optimization or learning algorithms (e.g. neural networks). The result is a model that is calibrated to this particular tool for a given recipe 16071.

Certain IC characteristics such as feature density, linewidth and linespace are directly related to variation in topography for plating, deposition, and CMP processes. Test wafers that vary these features throughout some range across the die can be used to build a mapping from design parameters (e.g. linewidth, linespace, density) to manufacturing variation (e.g. film thickness, dishing and erosion) for a given tool and recipe. Test wafers are an attractive alternative for assessing process impact in that they are generally less expensive to manufacture and one test wafer design can be used to characterize any number of processes or recipes for a wide range of IC designs. As shown in FIG. 107B, a test wafer 16701 can be also be used to generate a calibrated process model or multiple process models or a process flow. The calibration model parameters may be computed using the same method in FIG. 107A. One difference is that the pre-process measurement, 16074, may be conducted by the test wafer manufacturer and retrieved in an electronic form, such as via the internet, email, disc or CD or paper form. Another difference is that the resulting calibration 16078 normally spans a much larger range of linespace, linewidth and density features and thus is more applicable to a broad range of devices.

More details regarding the use of test wafers in calibrating a process are provided in FIG. 108A. A test wafer die 16079 is patterned with a range of linewidth and linespace values 16080. The test wafer is processed (e.g. by CMP, ECD or deposition) on a tool using a given recipe 16081 and the resulting variation in a parameter is measured across the chip 16083 using a metrology tool (e.g. film thickness, 16084). This mapping may be considered a model that maps a wide range of linewidth and linespace values to a particular film thickness variation for this tool and recipe. These mappings are useful for predicting process variation for new IC designs, as shown in FIG. 108B. Linewidth and linespace features that fall within the range 16086 spanned by the test die and wafer are extracted 85 from a new IC layout. The extracted linewidth and linespace features for spatial locations across the chip 16086 are input into the mapping 16087 and an accurate prediction of film thickness variation across the chip 16089 and 16090 can be acquired for a given tool and a given recipe before processing of the new IC design.

As shown in FIG. 108C, the predicted process variation 16091 can be fed into electrical models or simulations 16092 to assess the impact of processing on the electrical performance of the chip 16093. Some of the electrical parameters that may be computed using the models include variation in sheet resistance, resistance, capacitance, interconnect RC delay, voltage drop, drive current loss, dielectric constant or crosstalk noise. These predictions can be used to determine the appropriate locations for measuring.

The following paragraphs and figure descriptions provide a detailed flow of the use of process and electrical models to characterize variation, as implemented for dummy fill.

FIG. 109 describes the steps involved in calibrating a process model to a particular tool or recipe. As described in FIG. 105, 16031 layout extraction parameters are computed, or in the case of test wafers, uploaded from the wafer provider. The second step 17441 pre-measures the wafer using metrology equipment. These measurements may include film thickness and profilometry scans to acquire array and step heights. The third step 17442 processes the test wafer using the particular process or process flow that is to be characterized. Such processes or flows may include plating, deposition and/or polishing steps. It is particularly useful to calibrate on individual processes and also to calibrate on sections of the flow as a way to capture any coupling of variation between subsequent process steps in a flow. It is also recommended to calibrate the model for different recipe parameters such as time. The processed wafers are measured 17443 at the same locations as the pre-measurements; such measurements may include film thickness, profilometry, or electrical; and the variation for the given process may be characterized 17444. Process models or representations are uploaded in 17445 and the pre and post measurements as well as computed variation may be used to calibrate or fit the model or representation to a particular tool and/or recipe or recipes. These models may be formulated and uploaded by a user or selected from a library of models on the modeling computer system. The pre and post measurements and computed process variation are used to fit the model or simulation parameters for the given tool and recipe 17446. The result 17447 is a process model calibrated to a particular tool and recipe or recipes. The result may also include a series of calibrated process models that can be used to simulate a process flow.

FIG. 110 describes the steps involved in using calibration models to predict the impact of process variation and subsequent variation in electrical parameters and performance. A new layout or set of layout files as well as desired IC features, geometries and design rule information are loaded into the system 16030. The second step performs layout extraction 16031 to extract a description or set of features relevant to process variation for a number of locations across the chip. One common approach is to discretize the layout into a number of grids and compute the structure density for each grid element. However, our approach computes the effective linewidth and linespace for each grid element as well. The calibrated process models are uploaded or assembled to simulate processing 16034. The extracted layout parameters for each spatial location are fed into the model and the resulting process parameters are computed, such as film thickness, dishing, erosion, array and step heights 17501. The difference between the target and predicted IC parameters are used to compute the process variation. The predicted process parameters may also be fed into electrical models or simulations to characterize the electrical performance of the IC, which when compared with the desired performance allows for the electrical variation to be computed 17502. Some of the electrical parameters that may be computed include variation in sheet resistance, resistance, capacitance, interconnect RC delay, voltage drop, drive current loss, dielectric constant or crosstalk noise. Some of the electrical models and simulators that may be used include electrical timing, extractor and other IC related CAD software components.

Our approach is particularly suited for measuring sites in interconnect layers. Thus, interconnect metrics (R, C, L variation) are used as general metrics for all areas of the chip, as shown in the following table. Other critical areas may require simulating the circuit performance effects, including the addition of dummy fill. For example, a metric for the signal delay variation may be imposed in addition to a percentage RC variation to ensure that timing constraints of critical paths meet the circuit specifications. Similarly, clock skew and crosstalk noise simulations may be used to determine whether or not the circuit will function properly. This way, RC (or RLC) criteria can be used as a first pass estimate of where to add the dummy fill. Then the dummy fill placement can be fine tuned in the next iteration by selectively performing circuit simulations for specific signals or certain areas of the chip. Once dummy fill is finally placed and the circuit manufactured the predicted critical variation locations are then selected for in-line or in-situ measurements. In other words, the dynamic measurement system is then used to determine how the chip should be measured or tested to confirm this. The term dynamic includes the use of measurement data from test wafers and the models to determine measurement sites for a new IC layout. The term dynamic also includes the use of the same prior measurement data and models but adds feedback from prior metrology tool measurements on a production wafer to determine measurement sites for the current production wafer. For example, predictions of variation in sheet resistance in a location may prompt a profilometry scan over that feature to measure dishing and erosion.

TABLE 1

Electrical performance metrics for dummy fill adjustment

| Performance Metric | Metric Type | Example Application |
|---|---|---|
| Resistance (R) | Interconnect | ECD, oxide dummy fill |
| Capacitance (C) | Interconnect | ECD, oxide dummy fill, metal dummy fill |
| Inductance (L) | Interconnect | High frequencies (ECD, oxide and metal fill) |
| Signal Delay | Circuit | Routing, Buses, Critical Paths |
| Skew | Circuit | Clocks |
| Crosstalk Noise | Circuit | Low swing/noise sensitive circuits |

The result of models and simulations described in this section is a full-chip prediction of process and electrical parameters and performance for a new IC design, as well as prediction of how these parameters may be impacted with the addition of dummy fill 17503. The next section describes how these parameters are input into the measurement plan generation component which compares them with the design specifications and requirements and determines which sites to measure and with which tool.

c. Dynamic Measurement Plan Generation

As shown in FIG. 104, the dynamic sample plan generation component 16035 compares predicted wafer-state parameters such as film thickness and electrical parameters such as sheet resistance with design specifications or requirements. The locations of the chip that exceed or are sufficiently close (e.g. as defined by the user, in that different circuit designs may dictate different distances) to a particular design constraint are used to generate a measurement plan for a particular metrology tool. The generation of a measurement plan is illustrated in FIG. 111A and FIG. 111B. FIG. 111A shows the model prediction of film thickness 16094 over two metal lines 16095 and 16096 as a result of copper polishing. Residual copper across the two lines results in a jumper or short 16097 at that location. Although the target thickness is T, the location where the jumper or short exists has a thickness of T plus an additional thickness of copper of R. The result of the model prediction stage is a computation of film thickness or electrical parameters such as sheet resistance for the complete chip.

The model may predict that the thickness bounds or shorts may not be a problem, but the measurement site locations of the thickest and thinnest spots may also be predicted from the model such that the measurement tool can actually measure those locations.

The use of the model prediction to determine locations for measurement is illustrated in FIG. 111B. The design specifications for the chip are used to determine the tolerances on prediction parameters such as film thickness variation. For example, a large positive variation or increase in film thickness, due to CMP, would result in jumpers 16105. A large negative variation or reduction in copper thickness, due to CMP, results in the dishing of lines and a subsequent increase in sheet resistance 16107. When predicted film thicknesses reach some pre-defined amount or exceed such thickness variation levels, the location is selected for measurement. It is likely that the locations selected for measurement would include the maximum and minimum variation levels associated with a particular wafer or electrical parameter and in the case of FIG. 111A and FIG. 111B, this parameter is film thickness. In this case, the maximum copper film thickness variation (where jumpers are likely to occur) is defined as T+$\Delta$T 16101. The predicted film thickness over the metal lines, as illustrated in FIG. 111A, is plotted in FIG. 111B and the maximum height, 16103, where the jumper occurs has the height, T+R 16102. In this case, the location of the point where the jumper occurs, 16103, would be entered into the sampling plan for film thickness measurement. This is one example of a threshold based cost function but other types of cost functions may be used to help determine which sites are to be selected.

The types of measurements and tools used also have an impact on which parameters are monitored. For example, dishing, which impacts interconnect sheet resistance, is normally measured with a profilometry tool whereas copper film thickness is normally measured with a film thickness tool. So the measurement plans generated may be specific to the particular tool type or types indicated by the user as available. Once the measurement plan is generated, it may be displayed to the user through a graphical user interface (FIG. 111C) and the user may choose to manually load in the measurement sites. The measurement plan may be automatically transferred and loaded into a particular measurement tool.

The steps involved in generating the measurement plan are described in the flow diagram of FIG. 112. Full-chip predictions of wafer-state and electrical parameters, 16033, are input along with chip design specifications and requirements, 17452, and the selected metrology tools, 16035. The full-chip wafer and electrical parameters are compared against the design specifications and requirements, 17453. As described in FIG. 111, the design constraints are used to set up thresholds on the predicted wafer-state and electrical parameters. Also a tolerance region is defined where if a particular prediction is within some distance, for example 15% of the limit, or exceeds the constraint, that location is flagged and stored. A tolerance region is preferred in that predictions may be off by 10-15% depending upon the amount of drift in the process. As such, some modeling error needs to be accounted for. The tolerances may also be defined statistically so that there is a limit on the number of measurements to be taken and the most likely locations to create problems are given higher priority. This computation could also be extended to hypothesis testing and other statistical fault diagnostic methods where the probabilistic likelihood of a particular location or feature impacting chip performance is maintained.

The x and y coordinates of all the measurement locations are consolidated 17455 and heuristics are used to generate measurement plans for selected metrology tools 17456. For example, severe dishing which results in higher sheet resistance may be measured using a profilometry tool whereas residual copper that may result in a jumper could be measured using a film thickness metrology equipment. Measurement tools require recipes and as such, the heuristics are used to generate the measurement recipes and format it appropriately for a given tool.

The measurement site plans and recipes are stored in the database 17457, which allows for transfer to the user via the GUI or electronic file transfer 17457. It is useful to automatically transfer 17457 and load 16036 the measurement plan and recipe to the metrology tool. It is possible to supply the metrology tool with a measurement plan consisting of a number of sites to measure and metrology tool settings, in which the plan is generated based only upon model prediction outputs. As stated previously, the approach may also generate measurement recipes for more than one metrology tool, as in the example of using both thickness and profilometry to measure copper erosion. In such cases, the measurement recipes for both tools may be stored in the database 17457.

The advent of computer controlled measurement decision systems also allows the method to be used dynamically, that is to iteratively provide measurement site and recipe information to direct measurements and use the results of those measurements to generate additional measurement sites or recipes. Measurement data often indicates drift in a manufacturing process and as such the model used for prediction needs to be tuned or a more accurate calibration acquired. In such cases, there is little value in continuing to make measurements until a more accurate prediction and measurement directive is obtained. A more accurate prediction may be acquired with a model calibrated for a different process state and may be selected from other calibration models 16257, 16260 and 16263 in a database 17522, as described in more detail later in FIGS. 124A, 124B, and 125.

A heuristic may use the method to measure one site at a time, for example maximum thickness variation, to check where the copper may not have cleared in a CMP process. Another heuristic may supply measurement sites to the tool and based upon the actual measurements, select another calibrated model that better fits the current state of the process. FIG. 113 provides examples of the some of the heuristics the system may use for post-CMP measurements in damascene process flows. In FIGS. 113A and 113B, heuristics are illustrated for the serial approach where the measurement plan is generated from the model prediction only (FIG. 113A) and for the iterative approach where the heuristic uses iterative measurements along with the full-chip prediction to select the next measurement site or sites (FIG. 113B).

Thus, the method may be used with any number of heuristics to determine problematic areas across the chip or wafer. An application of the method for dynamic measurement and graphical description of several heuristics are described later.

d. Implementation and Operation

A common use of the method is to direct metrology tools where to measure within a die and within one or more dies across a wafer. This direction is primarily based upon the effects of pattern dependencies on processing at the die and wafer level. The method may be used any kind of metrology too, including with film thickness, resistivity, ellipsometry, profilometry, atomic force microscopy, optical measurement equipment, electrical capacitance and resistance testers, or electrical material property testers (e.g. four-point probe sheet resistance testers). The method may be used in any mode of operation of metrology tools, for example, in an off-line, in-line and in-situ manner.

Figure 4A:
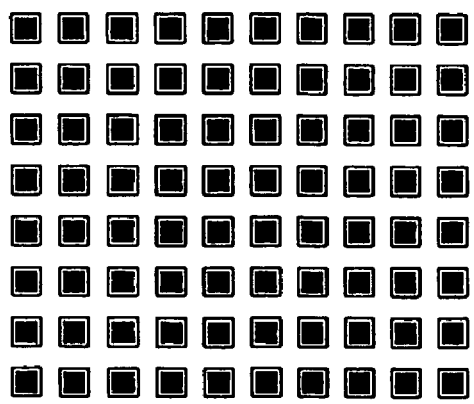
FIG. 4A illustrates a symmetric dummy fill pattern.
Figure 4B:
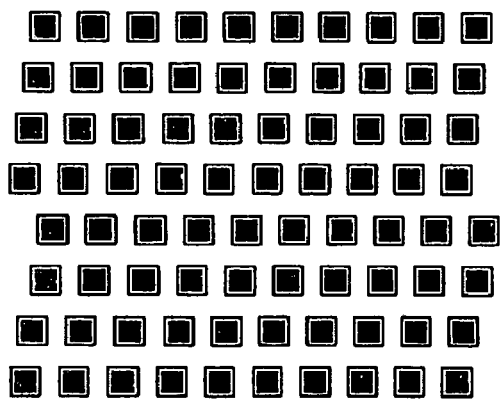
FIG. 4B illustrates an asymmetric dummy fill pattern in one direction.
Figure 4C:
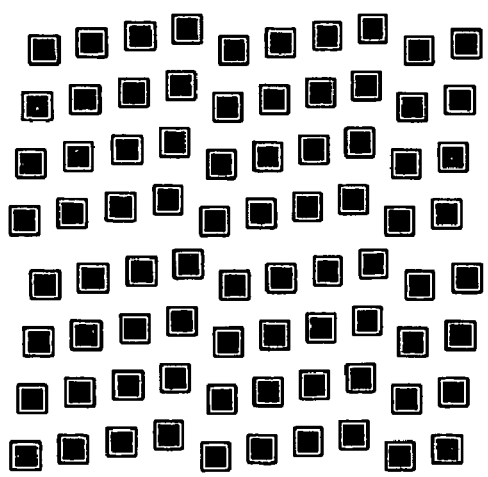
FIG. 4C illustrates an asymmetric dummy fill pattern in two directions.

FIGS. 114A through 114C describe implementations of the method to characterize variation at the die and wafer level, as well as, wafer-to-wafer. As shown in FIG. 114A, the method may be used to determine measurement locations across a full-die 16110 based upon wafer-state or electrical variation across the die 16111. As shown in FIG. 114B, the method also allows for multiple die 16113 to be characterized across the wafer 16112 by using models calibrated for each die location, see 34 in FIG. 4. In this application, the model predictions are generated for each die 16115. The individual and aggregate die variation 16114 is compared against design specs and measurement plans generated accordingly, see 16035 in FIG. 104. Variation at the wafer level is often radial, so normally three die are used; one at the edge of wafer, one at the center of the wafer, and one at some distance in-between. As shown in FIG. 114C, the method can be used to characterize and direct measurement across multiple wafers 16117. Often process drift results in changes in how a wafer is processed. By utilizing a drift component with the process models, model based prediction can be used to identify problematic areas that require measurement or that may be drifting toward a design specification or constraint. In this approach, models calibrated at different times in the process life cycle are used to predict how variation will behave from wafer to wafer 16118. This characterization can be used to direct the metrology tool on which areas need to be measured and potentially add problematic sites as drift gets worse.

There are different ways in which to interact with the metrology tool, as shown in FIG. 115A. One approach is to have the system 16122 reside on a computer 16121 directly connected to the metrology tool 16123 or housed within the computer control system of the metrology tool. The design specifications and layout files (if extraction has yet to be done) or layout extractions 16120 for the production wafer are input into the method. The system 16122 processes the design and generates a measurement plan, which is communicated to the software that actually commands the measurement process. After a particular process step 16124 such as CMP, the wafer 16125 is measured by the tool 16123. The measurements are normally stored on electronic media and may be transferred to the operator or process engineer via a GUI 16126. An optional approach is for the method to reside on a computer that is connected to the metrology tool via a network connection. A network may include electrical or optical communication via an extranet, intranet, internet or VPN.

Another implementation of the method uses the optional component (see 16040 in FIG. 104) to tune the models when errors occur between the predicted variation and the actual measurements. In this approach, shown in FIG. 115B, the design specs and layout information 16127 are provided to the dynamic measurement method 16129. The method 16129 may reside on a computer 16128 connected to the metrology tool or housed within the computer control system inside the metrology tool 16130. The design specifications and layout files (if extraction has yet to be done) or layout extractions 16127 for the production wafer are input into the method. The method 16129 processes the design and generates a measurement plan, which is communicated to the software that actually commands the measurement process. After a particular process step 16131 such as CMP, the wafer 16132 is measured by the tool 16130. The measurements are normally stored on electronic media 17464 and may be transferred to the operator or process engineer via a GUI 16133. The actual measurements are also communicated back to the method where the errors between the predicted and actual measured parameters are used to tune or recalibrate the models and thus improve prediction for subsequent wafers 16134.

Another implementation, shown in FIG. 115C, uses the same approach described in FIG. 115B but adds a component 16143 that provides feedback to a process control system or to tools for optimizing process settings and performing recipe synthesis.

Another implementation, shown in FIG. 115D, uses the same framework show in FIG. 115C, but also adds a component 16149 that communicates measured variation to components or other systems, such as dummy fill tools 16152 or process optimization methods 16151 for minimizing the variation. Dummy fill tools modify the IC design to minimize the measured variation while process optimization seeks to adapt process conditions to minimize process effects that cause variation. An additional component 16150 may also use the measurement feedback to schedule calibration and maintenance of the process tool.

The components that comprise the method are constructed in software (e.g. Java, Tcl, Basic, SQL) and modularized such that the method may or may not use all the components in the generation of measurement plans. For example, the method may only use process models to generate film thickness variation, compare this with design specifications and determine those locations that are most likely to violate the specification. The following descriptions will attempt to provide the general computational framework for the method.

FIG. 116 shows a useful software architecture described in the following paragraphs. The user 16153 communicates to the system through a graphical user interface (GUI) 16154 (I don't see 16154 on the figure), such as a web browser. The GUI 16154 allows the user to choose and upload electronic layout design files into the system and view measurement plans and measurement results. When the system is housed within a metrology tool, as described in FIG. 115, the user may be a tool operator, and the system may reside on the tool's command and control computer. The GUI may also reside on a computer monitor or touch screen built into the tool. An example of a GUI is shown in FIG. 111C.

In general the GUI, as defined and used throughout this section, allows the user to choose, upload or transfer from another form of electronic media, the desired design rules and electrical performance for the particular device described by the design files. The user may also use the interface to select process and electrical models from a server or transfer or load models from another electronic media source or computer. The user may also use the interface to monitor the selection of measurement sites and manually add sites to generated measurement plans. The user may also use the interface to review the results of tool measurements and direct how those measurements may be used to generate process recipes or improve dummy fill. These results may be in the form of, for example:

histograms and other statistical plots,
full-chip images of wafer-state or electrical parameters at some point in time,
movies of full-chip film thickness, dishing, erosion progression during a process step or flow,
movies of full-chip electrical parameter variation such as sheet resistance and capacitance, and
tables of values.

The GUI 16154 communicates with a series of software components, services or functions 16155 (referred to here as the service module) that manage the flow of information throughout the system to the database and file system 16158 and computational core processes 16156 as well. The services 16155 are modular and serve to initiate the computational core processes 16156 that execute portions of the method and to assemble and format the content for display in the GUI. The modules may be created as Java or Tcl scripts which enable easier interaction with the database using embedded SQL code and with the GUI using HTML, XML or dynamic HTML interpretation. These components also allow the ability to initiate mathematical processes that perform the computation necessary to determine the correct placement of dummy fill within the layout.

The service module 16155 communicates with the computational core of processes and functions 16156 that execute computational steps of generating measurement plans and heavy computational processes such as the process and electrical models and simulations. This core also does the effective pattern density computation. This communication may include instructions, data, model parameters, prediction results in tabular, image or movie forms and pointers to files in the file system.

The service module 16155 also communicates with electronic IC design software or layout manipulation software 16157 to manipulate layout information during extraction or to communicate measured variation to assist in the addition of dummy fill.

The database 16158 communicates with the service module 16155 via SQL commands to manage system data such as measurement sites and locations, user profiles that specify permissions and preferred content and presentation, user data which may include layout extraction data, design specifications and rules, model parameters for particular tools and processes and full-chip prediction results such as surface topology, resistance and capacitance. Examples of databases that may be used include Oracle, Informix, Access, SQL Server and FoxPro. The file system 16158 communicates with all the components to retrieve and store information saved as files, typically too large to efficiently store in the database.

The system may communicate measurement plans directly with the control software that directs the measurement tool where to measure. This communication may be done via a computer network 16159 or computer bus.

If the functionality shown in boxes A 16160 and B 16161 resides on one computer then the system is configured as stand-alone. If A and B reside on different computers and communicate across a network, the system is normally considered a client-server configuration. A network may include electrical and optical communication via an extranet, intranet, internet or VPN. In some cases both A and B will be part of the metrology tool and the user, 16153, is the tool operator.

Here we describe a few useful operational frameworks for applying the system with a dummy fill method. Other frameworks are also possible. There are three basic computational frameworks described in this section that constitute good methods of operation and delivery of the functionality based upon a user's needs. The first framework presented is a stand-alone configuration, shown in FIG. 117A, where all the components (16154-16159 of FIG. 116) reside in 16163 and data in and out 16164 and 16165 are accessed from a single computer. The second framework is a client-server configuration, shown in FIG. 117B, where the GUI resides on a client computer 16167 also shown as box A in FIG. 116, which accesses, via a network 16170 the other components, shown as box B in FIG. 116, residing on a server or multiple servers, a server farm 16171. The communication could be done via internet, intranet or extranet networks 16170 and the server may serve one or more clients or users.

The third framework, FIG. 117C, is an extension of the client-server model that includes communication via a network 16176 with additional computers that may contain one of more components (16177-16183) of the system. For example, a design house may utilize the dynamic measurement plan generation via the server 16180 but remotely utilize separate computers which house process models or model parameters 16179 and design specifications and constraints 16178 that are provided by the fab or a process development group. This framework also includes the transfer of measurement plan data to control computers on metrology equipment 16181 the return of actual measurements to the server 180 and the use of measurement functions by servers that contain tools to improve process recipe selection 182 or place dummy fill 16183 via a direct network connection or web services 16176.

The frameworks shown in FIGS. 116 and 117 can be used with multiple metrology tools, where the dynamic measurement software resides on a server and communicates with the metrology tools via a network 16194. A network may include electrical or optical communication via an extranet, intranet, internet or VPN. This configuration is shown in FIG. 118 where the user 16184 and client 16185 communicate to the method residing on a server or utilizing a server farm 16186. Models are calibrated for each process step in the process flow 16187. In this example, calibrations 16195 and 16196 are performed on models for process steps A 16188, B 16190, and possibly C 16193. The calibrated process models are used as part of the method, shown in FIG. 104, and the server 16186 generates measurement plans for the metrology tools A 16189, B 16191, and C 16192. In this framework, all the functionality described in FIG. 117C, such as the use of measurement data as feedback for process optimization and dummy fill, is available.

e. Applications of Method

The method may be applied to a wide range of metrology applications. The implementations described above may be particularly useful for the development of interconnect structures and processes as well as the introduction of low-k materials. Metrology efforts will transition from measurement of test structures in scribe lines to measurement of active areas. This is particularly true for copper and low-k interconnect.

Interconnect technology poses challenges in the introduction of copper damascene and low-k dielectric materials. Copper damascene processes may require metrology to determine the local and global planarity of electrically chemically deposited and chemically mechanically polished films. The largest variation in thickness is due to pattern dependencies and this variation is exacerbated as more interconnect (metal) levels are added. Film thickness may be measured using profilometry, optical reflectance, ellipsometry and future methods (e.g., measuring multiple-film layers may include laser stimulation of acoustic and thermal waves).

In particular, the method may be applied to determine measurement sites and sample plans based upon a prediction of film thickness variation in electrically chemically deposited (ECD) film thicknesses and dishing and erosion in chemical mechanical polished films. These wafer-state parameters may be used with electrical models to predict electrical impact across a chip and thus identify potential problematic areas for measurement.

The electrical performance of a circuit can be determined by the electrical characteristics of its interconnect, and the interconnect is often the limiting factor in high performance designs. These electrical parameters include the interconnect resistance and capacitance. Circuit performance metrics such as signal delay, clock skew, and crosstalk noise are functions of the interconnect resistance and capacitance. The interconnect resistance is a function of the wire resistivity, metal thickness, interconnect length, and linewidth. The interconnect capacitance is a function of the metal thickness, interconnect length, linewidth, linespace, and dielectric constant of the insulator (oxide) between the wires. The geometry of the interconnect structures impact their electrical properties. Therefore, significant variation in the geometry may affect the electrical performance metrics and thus may require in-situ measurement during fabrication.

A flow diagram for how the method may be applied to a damascene process is described in FIG. 119. Similar to the steps shown in FIG. 104, pattern dependent models 16033 are calibrated 16034 for the ECD 16194, CMP bulk removal 16195, CMP endpoint 16196 and CMP barrier removal 16197 process steps and used to generate full-chip film thickness, dishing and erosion 16199. Electrical models 16198 are used to generate full-chip sheet resistance variation 199. Some of the electrical parameters that may also be computed include variation in capacitance, interconnect RC delay, voltage drop, drive current loss, dielectric constant or cross-talk noise. The measurement plan generation component 16035 receives design specifications and requirements that are compared with full-chip parameter variation and as described in section c., those parameters that fall within some specified tolerance or that exceed the design constraints are flagged for measurement and their location stored. The measurement sites and sample plan are uploaded into the appropriate metrology tool 16036, either directly or via a network. Architectures for how the method or the system may operate with a metrology tool are described in the prior section d. and in the FIGS. 115 through 118.

The most common metrology tools for determining planarity use profilometry and optical methods. The most common tools for determining electrical parameters use probe based current measurement in electrical structures. The measurement sites may also be used as feedback to a dummy fill tool or process control system 16200, illustrated in FIG. 115D and described in Section d. Note the method may also be used to determine measurement sites for intermittent metrology between the process flow steps shown in 16033. Such an implementation is shown in FIG. 118.

The damascene process flow described in FIG. 119 is for one interconnect layer. Often pattern dependencies and film thickness variation in a lower interconnect level propagate to higher interconnect levels. The method may be extended to characterize and identify problematic areas of a chip or wafer due to multi-level pattern effects. As shown in FIG. 120, process flow models may be extended to predict multi-level effects and the method may be used to determine the associated measurement sites that may violate design specifications. FIG. 120 illustrates that multi-level pattern dependent models may be used to capture effects between metal levels 1 17201, metal level 2 17203 to some higher metal level N 17204. In this case, each level is represented by pattern-dependent process flow models 17202. The method may be used to characterize multi-level effects and identify measurement sites after each subsequent metal level has been created. The measurement plans 16036 are transferred to a metrology tool 16039 or a user or operator and can be used to direct the tool 16039 to measure the wafer after processing 16038.

The thinning of low-k dielectric material during CMP is a concern with regard to structural and electrical properties of the integrated circuit. There are several challenges for introducing low-k dielectrics into a damascene process flow. It is not only difficult to create a quality low-k film but also to maintain the dielectric constant after all the integration steps such as etch stop layers and barrier caps on copper and CMP stop layers. Many low-k yield problems are related to copper CMP where the softness of the low-k films results in CMP damage, dishing and erosion and subsequent electrical defects.

The method may be used with process steps calibrated for low-k materials to ensure local and global planarity. In particular this method may be used with stylus profilers and scanned probe microscopes to reduce the amount of necessary measurements and input throughput of low-k process flows. This method may be used with optical measurement tools as well.

A flow diagram is provided in FIG. 121 illustrating how the method can be used with low-k process introduction into a damascene process flow. In this mode, the method is used to select measurement sites throughout the process flow with regard to problematic areas that result from low-k material and process introduction. This application requires the addition of process models that capture film thickness variation and related electrical and structural impact. Low-k material properties and the process steps in forming the ILD is modeled, added to the flow by the user and calibrated for a particular tool 17207.

The ILD layer is patterned using a combination of lithography and etch. Dummy fill materials may be inserted in low-k films to adapt structural properties of these films with the intent of achieving a desired effective dielectric constant and reducing capacitance spatially across the full-chip when integrated into an interconnect process flow.

Metal or copper films are electrochemically deposited 17209 and CMP is used to polish the metal film, often using a three-step CMP process composed of bulk removal, endpoint and barrier removal. Pattern dependencies resulting from this process may be characterized relative to changes in the effective dielectric constant (including the use of wafer-state models and electrical parameters) and other capacitance effects. These pattern dependencies are used to extract full-chip variation in effective dielectric constant as a function of film thickness uniformity, dishing or erosion 208. Often electrical models 17213 for resistance and capacitance are used to transform structural properties such as film thickness variation, dishing and erosion to full-chip electrical characterization. Some of the electrical parameters that may be computed 17208 include variation in sheet resistance, resistance, capacitance, interconnect RC delay, voltage drop, drive current loss, dielectric constant or crosstalk noise.

The predicted variation is compared against design specifications and requirements and measurement sites are appropriately selected 16035 using approaches described in section c. The measurement sites and sample plan are uploaded into the appropriate metrology tool 16036 either directly or via a network. Architectures for how the method or the system may operate with a metrology tool are described in the prior section d. and in FIGS. 115 through 118.

The method may also be used to enable active-area metrology with new processes to better enable process integration and improve film thickness uniformity. Most conventional bulk copper fill is done using electrochemical deposition where various chemical schemes that use additives, such as accelerators, leveler or suppressors, are used to improve planarity of metal film. The addition of dummy fill structures may be used with these various chemical improvements to achieve better planarity. Equipment makers are also looking to mechanical approaches to improve uniformity. NuTool has proposed such an approach that rotates the wafer and uses a pad to introduce the electroplating solution. The advantage of this contact plating technology is that the plated Cu film may be both locally and globally planarized. Another advantage is that this approach results in a thinner overburden of Cu that reduces the amount of CMP required in the next process step. This method may applied to any electrochemical mechanical deposition (ECMD) process by introducing a calibrated full-chip ECMD model into the process flow using methods described in the flow diagrams of FIG. 4.

The described functionality could be achieved with any process where a model of full-chip pattern dependencies is available. Current work in developing models that capture full-chip pattern-dependencies in plasma etch and lithography could be integrated into the process model flows of FIGS. 119, 120 and 121. The method may be used as shown in FIG. 18 to identify problematic areas after process steps in the process flow. However the method may also be used with in-situ metrology and cluster tools containing multiple process steps.

The described functionality could be achieved using in-situ metrology sensors and cluster tools where several tools and process steps are combined into one large piece of equipment. The similarity between application to on-line metrology tools and application of the method for in-situ sensing and cluster tools is illustrated in FIG. 122. For comparison purposes, FIG. 122A shows a section of FIG. 118 where the method is applied for use with in-line metrology tools within a process flow. (The flow is described in section d. description of FIG. 118.) FIG. 122B illustrates how the method similarly be used with in-situ metrology sensors and cluster tools. In this application, the method is implemented on a computer 17215 which performs calibrations 17216 on process models A, B, C, D and E. Pattern-dependencies are extracted and used to predict full-chip wafer-state and electrical parameters, which are compared against design specifications as described in section c. Measurement sites and measurement plans are chosen using steps described in section c. The computer communicates with the appropriate sensors or tools using a network or directly through a bus 17217. A measurement plan is communicated to the in-situ metrology sensor 17220 embedded in process tool B, which takes data at chosen measurement sites during processing. Measurement plans are also communicated to in-situ metrology sensors C 17223 and E 17225, which are embedded in a cluster tool 17222. The cluster tool assembles multiple process steps and tools into one piece of equipment where metrology may be done either in-situ or in-line. In this example, a measurement plan is also communicated to an in-line metrology tool D 17224, which is part of the cluster tool 17222.

The applications described in this section may be used with any number of heuristics that determine the proper measurement plan. As shown in FIG. 123A, this measurement plan, consisting of one or more sites, may be generated from the full-chip predictions from one or more die across the wafer and transmitted to the metrology tool. In this application the processed wafer 17228 is loaded 17229 into a metrology tool 17229. The method, as part of the tool's measurement decision system, generates a full-chip prediction for one or more die across the wafer. A heuristic is used to determine which sites to measure 17231, for examples associated with a copper damascene process flow see FIG. 113A. The tool performs measurements 17232 based upon the selected site or sites 17231. The wafer is output and continues processing, 17233. This application shows the metrology tool as in-line with production flow but someone skilled in the art can directly apply the same approach to use in-situ metrology as well. The measurement decision system may be integrated within the metrology tool or communicating via a network or bus.

As shown in FIG. 123B, the method may used to generate dynamic measurement directives to the metrology tool. In this application, the measurement decision system iteratively directs measurements based on prior measurements of a given wafer. The incoming wafer 16236 is loaded 16237 into the metrology tool 16234. The method, implemented within the measurement decision system 16235, generates a prediction 238 and selects sites 16239 based on a heuristic as defined in FIGS. 113A and 113B. The metrology tool 16234 measures 16240 those sites. Software that is part of either the tool or the measurement decision system determines 16241 whether the measured site meets the design specifications, in this case the check is to see whether all the copper has been cleared or polished from the measured site. If the site does not meet the specifications or has not cleared, then it is output and either reprocessed or scrapped. If the site does meet the specifications, other likely problematic areas may be predicted 16242 and selected 16243 for measurement. The next chosen site or sites 16243 are measured 16244 and the process may repeat (16245-16248) according to the heuristic defined in the measurement decision system 16235 until the wafer is finally output for further processing 249. This application shows the metrology tool as in-line with production flow but the same approach can be applied directly to use in-situ metrology as well. The measurement decision system may be integrated within the metrology tool or communicate via a network or bus. Integrating within the metrology tool allows for a more automated and perhaps shorter metrology step.

Any number of heuristics can be used with the method to generate measurement sites, either in a static or serial implementation, FIG. 113A or in an iterative or dynamic implementation, FIG. 113B. FIG. 124 illustrates two of the more useful heuristics for generating dynamic measurement schemes, using the three prediction blocks, P1 16238, P2 16242, and P3 16246, shown in FIG. 123B.

In the heuristic shown in FIG. 124A, a single model 16250, calibrated for a particular tool and recipe setting, is used to generate full-chip predictions 16251 for one or more dies across the wafer. A site is selected for measurement 16252 based upon maximum variation. The measurement information from that site and the prediction model 16253 may be used to select another site 16254 for measurement. A measurement model, P2 162543, may be the same as P1 16251, or slightly tuned to accommodate process drift measured in sites 16252. (This option is why it is shown as a different model in this application.) This process may continue using sites 16252 or 16254 to tune the model 16255 and predict sites for the next measurement 16256. One of the more simple cases is illustrated in this figure, where the measurement tool steps through site-by-site or die-by-die, by order of highest variation until the heuristic concludes the measurement for this wafer.

Process drift occurs when some element of a manufacturing or measurement process changes as a function of operating hours and re-calibration. For CMP, drift often occurs as a result of wear of the polishing pad. In some cases, pad wear requires a simple change to the effective removal rate in the CMP model, however in other cases a new calibration may be required. A robust measurement approach may be used based upon predictions and site selection for multiple models, calibrated for different tool conditions such as pad wear or for different recipe conditions such as slurry flow rate. One way to implement the robust measurement approach is to calibrate models based upon data taken at different points in the operational cycle of a process. In the case shown in FIG. 24B, three calibrations, 16257, 16260 and 16263, are shown which have been done at 0, 100 and 300 hours for a particular pad. The calibrated models are used to generate three predictions, 16258, 16261 and 16264 and the appropriate sites 16259, 16262 and 16265 are measured. This approach allows the heuristic to span a range of operating parameters to ensure that drift is taken into consideration. Another option is for the heuristic to use the selected measurements from a model P1 16258 to determine whether significant drift has occurred (e.g. predictions do not match the actual measurements for those sites) and if so, load another model P2 16261 and make further measurements until the proper model is determined.

A more complete illustration of the robust approach is illustrated in FIG. 125. A calibrated model 16266 is used to generate a full-chip prediction for one or more die 16267. The predicted thickness 16268 is used to recommend measurement sites 16269 to a metrology tool 16270. The measurements 16271 are made and the measured thickness 16272 is compared 16273 with the predicted thickness 16268. If the error is below some threshold then the calibrated model 16266 is continually used to direct measurements. If the error is above some threshold, then the measured thickness 16272 is compared to a library 16274 of predicted thickness 16276 and 16278 for the same measurement sites but using other models 16275 and 16277 that have been calibrated for different process stages or recipes. This may be determined by least squares fit of the measured and predicted data sites or through some other mathematical or visual inspection method. The prediction that provides a best-fit 16279 is used to generate a new prediction of the chip 16280. Based upon the newly predicted chip topography, other maximum variation thickness sites may be selected 16281. (For example, other areas are determined as likely locations where copper has not cleared 16282.) The site or sites 16283 are used to direct the metrology tool 16284 to make a new measurement 16285. The measured thickness 16286 can be compared to the predicted thickness 16281 to determine the validity of the model and whether further measurement may be necessary.

The approaches may also be used with IC related CAD software components to refine design rules based upon the physical measurement of film and electrical properties. Design rules for a new IC design are often extracted from test wafers and prior production devices. Since there is little or no prior manufacturing data for a new design, the control bands on design parameters are often conservative in nature (i.e. much larger than necessary to accommodate unknown variation). The approaches may be used to confirm or refine design rules for a newly manufactured device, as illustrated in FIGS. 126A and 126B. In this application, a new design is uploaded 16300 to the system and layout extraction 16302 is performed. The extracted parameters are input into calibrated 16308 process and electrical models to acquire film thickness and electrical properties 16306. These properties may be used alone or used within a more extensive circuit simulator to predict variation in circuit performance 16306. The predicted parameters are compared 16310 against current design rules 16304 to determine those parameters well within the design rule bounds. The metric for determining how far within the design rule bounds a parameter must be to be selected for measurement may be selected by the user. For example, this metric may be a statistical threshold such as standard deviation.

The measurement sites and recipes are stored in the system database or file system 16312. Those chip features or site locations well within design limits are selected for measurement to confirm the predicted values. These may be used in the same recipe as the sites where the variation exceeds the design rules, which may provide a distribution for one or more parameters (e.g. sheet resistance). The site locations are used to form a measurement recipe for one or more metrology tools. The measurement recipe is transferred 16314 to in-line or in-situ metrology tool or tools (e.g. optical reflectance, profilometry or CD measurement equipment).

The device is physically processed (i.e. made) on the tools associated with the calibrated models used for prediction. Actual wafers are processed 16318 with the IC layout for device A 16316. In certain cases, more than one wafer is processed to acquire a statistical distribution of measured parameters. The measurement recipe 16314 is used to measure the processed wafer or wafers 16320. The measurements are transmitted to a component that evaluates whether the predicted physical and electrical parameters are supported by actual measurements. The measurement results 16322 are compared 16324 with the predicted features using the approach 16324. If the measured results do not match the prediction, it is recommended that the procedures illustrated in FIGS. 124 and 125 be used to search for a better calibrated model within the system library to improve future predictions.

If the predicted parameters are confirmed, the measured parameters are compared to design rules and specifications 16326. The results are used to adapt the design rules according to the predicted and measured variation to improve the performance or manufacturability of the device 16328. The approach may also be used in this manner to modify design parameter control bands to provide designers with more flexibility for the measured device or future generations of similar devices.

As stated earlier in this section, the approaches may be used to shape feedback control for a number of processes, in particular for damascene process flows. The following paragraphs and figures describe a few control implementations in more detail. This description begins with the application of the approach with pattern dependent etch models for generating measurement recipes for CD and film thickness tools. The process is similar to that described in FIG. 104 using pattern dependent plasma etch models. As shown in FIG. 127, the layout for an IC device is uploaded into the system 16330. Layout extraction is performed to extract feature characteristics associated with etch pattern dependencies (e.g. trench width and depth, aspect ratio). These characteristics are used with a calibrated pattern dependent etch model 16336 or a flow containing an etch process model. The full-chip topographical surface is acquired and may be used to compute the associated electrical characteristics as well 16334. The design rules and specifications (e.g. CD requirements) for the device and wafer are uploaded 16340 and compared 16342 against the predicted chip and wafer parameters.

Based upon the comparison, the measurement recipe is generated. The metrics for which sites are selected are determined using heuristics and thresholds by the user. For example, one heuristic may only select for measurement those parameters that exceed the design parameters or are within some predefined distance from a design constraint. This heuristic is illustrated in FIGS. 111A and 111B. Another heuristic may also select sites where predicted parameters fall well within the design parameters and where an opportunity may exist to sharpen control bands within the design rules. This heuristic is described in the preceding paragraphs and in FIGS. 126A and 126B. The resulting measurement recipe is stored in a database or file system 16344 and transmitted to the appropriate metrology equipment such as CD and film thickness measurement tools 346.

This same process is used in FIG. 128A to illustrate how the dynamic generation of measurement recipes can be used to determine the feedback for process control systems. In this application, the etch pattern dependent approach described in the prior paragraph 16382 is used to generate a measurement recipe 16384 for CD and film thickness metrology tools 16390. The plasma etch process control system 16386 supplies recipe settings (e.g. etch bias) for the etch tool 16388. The metrology tool 16390 uses the approach generated measurement recipe to measure sites on the chip and wafer. The measurement results which represent sites where chip features (e.g. aspect ratio) and wafer (e.g. endpoint uniformity) parameters are fed to the process control system 16386. The controls feedback 16392 may be the raw measurements or it could also be some aggregate statistic or calculation such as using a number of thickness measurements to compute a radial uniformity metric. The process control system 16386 adjusts the recipe settings and updates the etch process tool 16388.

Similarly the approach can be used to shape feedback for control of CMP processes, as illustrated in FIG. 128B. In this application, a pattern-dependent CMP model or a model flow that may include ECD or HDP and CMP are used 16352 to generate the metrology tool recipe 16354. The CMP process control system generates a recipe that may include pressure, slurry flow rate or polish time. The CMP process polishes a wafer which is measured by the metrology tool 16360 using the recipe 16354. The metrology tool or tools 16360 may include optical reflectance or profilometry. The measurements are used as controls feedback 16362 to the process control system 16356. For example, the approach may be used to predict film thickness within die or radially across the wafer, which could be used to adjust the polish time to achieve better clearing. Often in CMP, the process will polish the center of the wafer faster than the edge or vice-versa. CMP polish heads now allows for the radial pressure in the polishing head to be adjusted to compensate for this non-uniformity. The approaches could also be used to adjust radial pressure in CMP polishing head to compensate for non-uniformity where the metrology tool 16360 could be an in-line or in-situ measurement of remaining film thickness.

Similarly the approach can be used to shape feedback for control of CMP processes, as illustrated in FIG. 128C. In this application, a pattern-dependent lithography model (e.g. a model that characterizes the effects of feature density on resulting printed linewidth) is used 16366. The approach is used to generate a metrology recipe 368 for the metrology tool 16374. The lithography process control system changes exposure controls and steps 16370 for the lithography process 16372. Lithography is performed and the resulting wafer measured using the metrology tool 16374. The measurements of printed line and feature dimensions are provided as controls feedback 16376 to the lithography process control system 16370 that adjusts the recipe for the lithography process.

The approaches may also be used to design test structures or devices for devices or relate predicted topography and features with test structures, in particular for designs where measurements are difficult to acquire. In this application, the approach is used to predict chip topography. The approach determines those chip features that result in the greatest variation away from the design specifications, as described in prior sections. These features can be used to design test structures or devices or direct the measurement tool to measure existing test structures or devices already on the chip.

As stated in 2826 in FIG. 95, the method may also be used to select and synthesize recipe and equipment settings or choose consumable sets (e.g. slurry, pad, gas composition) for a process step or multiple process steps (e.g. process flow) that minimize process variation and subsequent variation in electrical parameters. Model based simulation or prediction complements synthesis by verifying that a lower level of abstraction meets the specifications of the next higher level, taking into consideration variation due to manufacturing.

The method may be used for pattern dependent synthesis at the device 16608, process 16610 and fabrication levels 16612 and to provide process 16610 and fabrication 16612 level feedback to higher design levels (16602-16608), as shown in FIG. 129.

To synthesize process flows, a method is described to predict the physical (e.g. surface topology) and electrical characteristics (e.g. sheet resistance and capacitance) as a result of a range of process steps, specific to a particular tool and the particular device to be manufactured. The predictions should be comprehensive, across a variety of structures, such that they can be pieced together, or synthesized, so as to characterize the manufacturability of a device and aid in the development of design rules for sequential processes or a process flow.

The application of the method to process optimization and recipe synthesis uses the calibration and prediction methods described in FIG. 109 and FIG. 110 to characterize integrated circuit pattern dependencies and generate full-chip predictions to compare process and electrical parameter variation for a range of recipe parameters or consumables. Such models can be created for each step and calibrated to a particular process tool. The models may also be assembled to simulate a process flow providing a prediction of a final wafer state in terms of wafer state parameters such as film thickness step and array heights and electrical parameters such as resistance, capacitance and crosstalk noise. The application may allow the selection of process settings, tool recipes, tools or consumable sets based on pattern dependent variation in the manufactured circuit.

FIG. 130 provides a simple example of process synthesis where wafers are actually processed over some range of tool or recipe settings. Consider the four process steps (e.g. ECD 16642, bulk polish 16644, endpoint polish 16646 and barrier removal polish 16648) as a flow. For each process step, three tool recipe settings A, B or C are considered. A wafer with some underlying topography 16666 is processed using a recipe setting A, B or C for step 1 16642. This is done for each recipe or tool setting A, B and C and the resulting topographical variation measured physically or electrically and compared 16650. The comparison identifies the recipe or tool setting with the minimum topographical variation for the first process step 16658. The wafer that was processed using tool setting A is propagated forward 16667 for processing using step 2 16644. This is continued for each process step to be determined and in this example that includes four process steps (16642-16648).

The method may be used to model and predict the variation for each process step. This may allow process synthesis to be performed over a range of different designs and process settings on computers rather than having to actually create lithography masks and process (manufacture) each circuit design at each process setting. FIG. 131 describes how the method may be used for process synthesis using the same example described in FIG. 130.

Each process step, tool and consumable set may have unique pattern dependencies and thus, require calibration using a test or an actual product wafer as described in FIGS. 107A, 107B and 109. In this application, the pre and post wafer state measurements are used to calibrate the model for a given recipe setting, in this case there are three process settings considered, A, B or C. For each process step (16684, 16686, 16688 and 16690), a calibration needs to be done for each recipe setting A, B or C to generate a corresponding pattern dependency mapping for each setting. If performed over a sufficient range of settings, a universal model may be acquired that spans the complete operating region of the given process step. In the simple case illustrated in FIGS. 130 and 131, the region is defined by three settings A, B or C for a single process parameter. However the application may be applied to any number of process parameters, any number of unique settings and any number of consumable sets (e.g. slurries, pads, gas compositions).

A new IC design is uploaded into the system 16682 and extraction may be performed as described in FIGS. 105A and 105B to generate a table of values described in FIG. 106. The calibrated model for each recipe setting A, B and C is loaded 16698 and the extraction 16682 used to generate a full-chip topographical prediction of physical or electrical variation, as described in FIG. 110. To evaluate electrical variation, an RC extraction tool or other electrical simulation tools may be used in conjunction with the physical topographical full or partial chip prediction. The full chip topography for each recipe setting is propagated forward to the next process step 2, 16686. This is continued until all the recipe settings for all process steps (16684, 16686, 16688 and 16690) have been processed.

All the recipe combinations (or sequences) 16706 are evaluated using pre-determined criteria. For the example illustrated in FIG. 131 there is a total of $3^4$ or 81 different settings. Criteria for determining the ideal process setting sequence can be as simple as summing the mean topographical variation for each different sequence or as complex as to use a cost function formula based on multiple criteria weighted according to importance.

Characterization of how well a particular set of recipes and process steps meet the desired film topography and electrical performance specifications may be performed using some form of cost function. A cost function can be as simple as a check to see if a particular film thickness non-uniformity threshold is exceeded or it could be as complex as a quadratic function of non-uniformity and undesirable electrical effects that are to be minimized in a feedback type system. The approach may use process and electrical impact criteria, as such a cost function may optimize the following parameters:

Thickness Non-uniformity=function of (LW, LS, density)
Electrical Performance=RC||Delay||Skew||Noise
Delay=function of (R, C, L, $R_{tr}$, $C_L$)
Skew=function of (R, C, L, $R_{tr}$, $C_L$)
Noise=function of (R, $C_{coupling}/C_{total}$, L, $R_{tr}$, $T_r$, l)
Where:
   R=interconnect resistance
   C=interconnect capacitance
   L=inductance
   $R_{tr}$=driver resistance
   $T_r$=signal rise time
   $C_L$=load capacitance
   $C_{coupling}$=intra-layer coupling capacitance
   $C_{total}$=total capacitance (coupling+overlap+fringe)
   l=interconnect length The cost may be a quadratic error function U based on a weighted sum of process (film thickness) non-uniformity and electrical performance variation, where the electrical performance is taken as one or more of the following metrics: RC, delay, skew, noise.

$$Error_T = (T_{target} - T_{actual})$$

$$Error_{EP} = (EP_{target} - EP_{actual})$$

$$U = (Error_T^T \cdot K_1 \cdot Error_T) + (Error_{EP}^T \cdot K_2 \cdot Error_{EP})$$

where:
$T_{target}$=vector of desired film thickness measurements
$T_{actual}$=vector of actual or predicted film thickness measurements
$EP_{target}$=vector of desired electrical performance metrics
$EP_{actual}$=vector of actual or predicted electrical performance metrics
$Error_T$=column vector of film thickness errors
$Error_{EP}$=column vector of electrical performance metrics
U=quadratic error, a scalar value, to be minimized
$K_1$=Diagonal matrix with weights for 1 through q total film thickness measurements along the diagonal elements.

$$k_1 = \begin{bmatrix} w_{T1} & 0 & 0 \\ 0 & \ddots & 0 \\ 0 & 0 & w_{Tq} \end{bmatrix}$$

$K_2$=Diagonal matrix with weights for 1 through p total electrical performance metrics along the diagonal elements.

$$k_2 = \begin{bmatrix} w_{EP1} & 0 & 0 \\ 0 & \ddots & 0 \\ 0 & 0 & w_{EPp} \end{bmatrix}$$

The cost may encompass each signal line or a section of the chip and the film thickness vectors and weighting matrices can be easily modified to provide the correct quadratic error to be minimized over the entire chip. There is normally some tuning of the weighting parameters based upon those elements where the need to be minimized is greatest. This tuning may be automated or the user may be prompted for a weighting scheme. Additional concerns that may be minimized in a cost function include environmental impact and energy parameters. This may be accomplished by introducing an additional error, E, and weighting matrix, $K_3$, that takes into account environmental or energy parameters that are minimized while meeting wafer state and electrical criteria.

The error for each recipe sequence in FIG. 131 is computed 16692 and stored 16694. The recipe that produces the most desirable outcome (e.g. minimum error) may be chosen 16696.

When a new IC design is received and a process flow must be designed, layout extraction is performed to characterize key features such as linespace, linewidth and effective density spatially across the chip. Pattern dependent variation is predicted across the full-chip and a cost function may be used to measure the total variation for a given recipe.

The method illustrated in FIG. 131 uses exhaustive search to select every recipe choice combination and store the results for each. This approach may not be useful for modern semiconductor facilities because of the complexity and computational burden of analyzing every potential recipe combination. Consider the example shown in FIG. 132 where a semiconductor fabrication facility (fab) wants to develop a process flow to build an IC. Device specifications, design rules and process constraints would be used to generate a knowledge base of $(Q \times m^n)$ unique process flows, where Q represents the number of devices, m the number of recipe settings for each step and n is the number of process steps in the flow.

This knowledge base could grow quite large. Assume a device requires n=30 steps and each step has m=5 different recipe settings. The total number of flows one would have to either actually run or simulate would be $5^{30}$, note that the number of possible flows grows exponentially with the number of process steps. If the fab wants to select a process flow to manufacture more than one device, then it's a direct multiple Q of m recipe settings to the $n^{th}$ power.

So while using the method with exhaustive search approaches allows for very simple recipe selection such as that shown in FIG. 131, the size and complexity of modern semiconductor process flows may necessitate the use of optimization methods that can determine promising recipe selections without having to do exhaustive examination of each possible setting. Potential optimization approaches that may be used with the method to synthesize recipe settings or consumable sets over multiple process steps include the following:

visual inspection and selection from plots of variation versus recipe settings
  table look-up
  simplex
  conjugate gradient methods
  simulated annealing
  approximate linear programming
  dynamic programming
  approximate dynamic programming In particular, linear and dynamic programming methods may be used to find the optimal trajectory through the cost function associated with each process step to minimize pattern dependencies for one or more designs. This approach can be used to select tool settings, recipes and consumable sets for deposition, lithography, etch, ECD and CMP process steps.

The variation produced by a given process or tool will often vary over time. This variation often described by process drift (a gradual change) or process shift (a more sudden change). Pattern dependent models may also be used to select recipe settings and consumable sets based on process induced variation over a period of time. FIG. 133 illustrates how pattern dependent models may be used to characterize variation over a number of process hours. A test wafer 16802 is processed using recipe setting 1 16806 for some time period t and measurements are taken from one or more die across the wafer 16608. A test wafer 16804 is processed 16812 using recipe setting 1 for a time period of t+1000 hours and measurements are taken from one or more die across the wafer 16614. This process can be repeated for 2 to N total recipe settings or consumable sets. A test wafer 16803 is processed using recipe setting N for some time period t and measurements are taken from one or more die across the wafer 16618. A test wafer 16805 is processed using recipe setting 2 16822 for a time period (e.g. t+1000 hours or t+100 wafers) and measurements are taken from one or more die across the wafer 16624.

Each of the 2×N total data sets are used to calibrate a unique model using the steps described in FIGS. 107A, 107B and 109. These models represent the operating space 16824 for the tool over N recipe settings and over 1000 hours of use. These models can be used with new designs 16826 to predict 16828 the pattern dependent variation for a process over the range of some number of hours of operation or number of wafers processed (e.g. 1000 hours or 100 wafers). This allows recipe synthesis to take into consideration process drift and shifts into the selection of process settings. This approach can also be used to formulate control and measurement strategies for a given process step or tool. For example, if it is found that process drift results in the particular sidewall effect in plasma etch, measurements may be dictated using the method described in FIG. 104 to schedule the next plasma chamber clean operation.

The approaches may be uses to facilitate interaction between equipment and consumable providers and semiconductor design and manufacturing companies, as shown in FIG. 134. Process and tool data 16902 is uploaded to the system 16906 and used to calibrate models as described in FIGS. 107A, 107B and 109 and build a library of calibrated process flows 16908. This data may be from multiple tool settings, tools, consumable sets, process flows or fabrication lines. The semiconductor company may upload designs 16904 and use the system and models to predict or simulate physical or electrical behavior of the designs. A library of design prediction may be generated as well 16910. The semiconductor company 16918 may use a network connection and a web browser to view results 16914. The equipment or consumable provider 16916 may use a network connection and a web browser to view results 16912. The results available to the equipment and consumable and semiconductor company may be used to facilitate analysis and diagnosis 16920 of the tool or consumables. Additional diagnostic methods may be used with the system or server to improve remote diagnostics. This may be particularly helpful for remote analysis and diagnosis across large geographical distances.

The approaches may be used to compare consumable sets, equipment or tool settings for semiconductor design and manufacturing companies. In this use, tool or consumable providers 16952 would provide process data for consumable sets 16954, 16956 or 16958 to calibrate process models or flows, as described in FIGS. 107A, 107B and 109, on the system 16950. A company 16940 may upload their designs 16948 and generate predictions for different tools or consumable sets and compare the results 16946. A company 16940, 16942, 16944 may use these results to select or purchase a particular consumable set or tool.

The method may be applied to shallow trench isolation (STI) process flows. STI is used to form dielectric material filled trenches that provide electrical isolation between adjacent devices in an IC. The STI process includes several steps such as:

1. Grow Pad Oxide—pad oxide is grown, normally using a thermal oxidation process.
2. Deposit Silicon Nitride—silicon nitride is deposited on top of the pad oxide using CVD.
3. Lithographic Printing of Trench Geometries—Lithography process is used to print the trench dimensions across the die and wafer. These features dimensions dictate where etching does and does not occur using a photoresist mask.
4. Etch Trenches—a nitride etch and silicon etch are used to create deep trenches (e.g. 5000 angstroms) in the lithography defined trench areas.
5. Fill Trenches—The mask is removed and the trench is filled with silicon oxide using a CVD process. The deposited oxide forms a thick layer over nitride layer (areas where trenches are not present) as well.
6. Remove Oxide—CMP is used to remove all the oxide material above the nitride layer. The goal is to leave a planar level of the adjoining oxide and nitride materials.
7. Strip Nitride and Pad Oxide—nitride and pad oxide are stripped where only the oxide trench and bare silicon remain. In subsequent steps, the transistor will be formed in the clear silicon area between trenches.

The goal is an oxide trench 16962 in silicon 16960 that resembles that shown in FIG. 136A. Pattern dependencies in the CMP step often cause excess removal or dishing 16966 of oxide resulting in a profile shown in FIG. 136B. The dishing of oxide in the trench can have significant impact on subsequent process steps that define the interface between the device active region and the isolation region as well as the resulting electrical performance of the formed device.

The physical dishing into the oxide trench region may impact the subsequent formation of gate oxide and the polysilicon gate features which may lead to undesirable electrical characteristics such as a change in the threshold voltage, increase in leakage current or polysilicon stringers that reduce performance and robustness of the manufactured device. In these cases, pattern dependencies due to CMP produce dishing which may lead to corner rounding at the active device and isolation region interface.

The method may be used with the STI process flows, including the introduction of new dielectric materials, to predict pattern dependencies in STI trench formation across the chip. In the application shown in FIG. 137, STI models that characterize pattern dependencies are formed using the calibration process described in FIGS. 107A, 107B and 109. This calibration process may use STI characterization wafers designed to promote such a characterization. The STI design may be uploaded to the system 16982 and layout extraction 16984 performed as described in FIGS. 105A and 105B to generate a table of values described in FIG. 106, related to pattern sensitivities in STI designs. The calibrated model or models may be used to predict resulting trench geometries 16986. These models may include CMP, etch, deposition or lithography. The resulting trench geometries may then be used with electrical models or simulations to predict 16990 the impact on electrical characteristics such as leakage current, threshold voltage, polysilicon stringer occurrence and overall device performance.

The predicted physical characteristics of the trench dimensions may be also be used in a strategy to size and place additional oxide trenches as a form of dummy fill to modify the pattern and thus, reduce dishing or minimize electrical impact of dishing. This application may use many of the dummy fill techniques described in FIGS. 16-25.

Although some implementations have been described above, other implementations are also within the scope of the following claims.

The invention claimed is:

1. A computer implemented method, comprising:
   using at least one processor that is programmed for performing a process comprising:
      using a pattern dependent model to determine one or more manufacturing recipes and one or more equipment settings for a process used to fabricate an integrated circuit (IC), wherein
         the one or more manufacturing recipes and the one or more equipment settings reduce process-induced variation in one or more wafer state parameters or electrical performance; and
      performing an electrical impact analysis to adjust at least a part of an integrated circuit design of the integrated circuit to reduce an electrical impact that is caused by the process-induced variation or a variation of a feature of the integrated circuit design.

2. The computer implemented method of claim 1, in which the one or more wafer state parameters comprise at least one of film thickness across the full fabricated IC.

3. The computer implemented method of claim 1, also including using one or more test wafers to characterize pattern dependencies in at least a portion of the integrated circuit fabrication process and using the pattern dependencies in the model.

4. The computer implemented method of claim 3, in which the portion of the fabrication process comprises electroplating.

5. The computer implemented method of claim 3, in which the portion of the fabrication process comprises oxide deposition.

6. The computer implemented method of claim 3, in which the portion of the fabrication process comprises chemical mechanical polishing (CMP).

7. The computer implemented method of claim 3, in which the portion of the fabrication process comprises plasma etch.

8. The computer implemented method of claim 3, in which the portion of the fabrication process comprises a lithography process.

9. The computer implemented method of claim 1, 2, 3, 4, 5, 6, 7, or 8, in which the model maps pattern dependent features to the process induced variation in the one or more wafer state parameters.

10. The computer implemented method of claim 1, in which the pattern dependent model maps the pattern dependent features to the process induced variation in the one or more wafer state parameters that include at least one of film thickness, array height, step height, sheet resistance, capacitance, crosstalk noise, and coupling capacitance.

11. The computer implemented method of claim 1, in which the pattern dependent model maps the pattern dependent features to the process induced variation in the one or more wafer state parameters, and the pattern dependent features include at least one of linespace, linewidth, and effective density.

12. The computer implemented method of claim 1, also including using at least the pattern dependent model to generate full-chip predictions of variation in wafer state and one or more electrical parameters.

13. The computer implemented method of claim 1 or 12, also including using a cost-function to measure results of one or more predictions in wafer state or in one or more electrical parameters generated by using at least the pattern dependent model.

14. The computer implemented method of claim 1, also including:
   using a cost-function to measure results of one or more predictions of variation in wafer state or in one or more electrical parameters generated using at least the pattern dependent model; and
   using the cost function to compare one set of recipe or one or more equipment settings to another.

15. The computer implemented method of claim 1, also including:
   using a cost-function to measure results of one or more predictions of variation in wafer state or in one or more electrical parameters generated by using at least the pattern dependent model; and
   using optimization methods to select recipe and equipment settings that minimize variation in wafer-state or one or more electrical parameters.

16. The computer implemented method of claim 1, comprising:
   using a cost-function to measure results of one or more predictions of variation in wafer state or in one or more electrical parameters generated by using at least the pattern dependent model; and
   using one or more optimization methods to select recipe and one or more equipment settings that minimize variation in the wafer-state or the one or more electrical parameters, in which the one or more optimization methods include at least one of simplex, conjugate gradient, simulated annealing, dynamic programming, approximate dynamic programming, linear programming, and approximate linear programming.

17. The computer implemented method of claim 1, also including:
- using a cost-function to measure results of one or more predictions of variation in wafer state or in one or more electrical parameters generated by using at least the pattern dependent model;
- using one or more optimization methods to select recipe and one or more equipment settings that minimize variation in wafer-state or one or more electrical parameters, in which the one or more optimization methods include at least one of simplex, conjugate gradient, simulated annealing, dynamic programming, approximate dynamic programming, linear programming, and approximate linear programming; and
- using one or more quadratic cost functions to facilitate convergence of the one or more optimization methods.

18. The computer implemented method of claim 1, in which the process comprises a single process step.

19. The computer implemented method of claim 1, in which the process comprises more than one process step or a process flow.

20. The computer implemented method of claim 1, also including communicating one or more sets of the one or more manufacturing recipes and equipment settings to a user through a graphical user interface.

21. The computer implemented method of claim 1, also including communicating at least one of the one or more manufacturing recipes directly to a process tool or a fabrication automation system.

22. The computer implemented method of claim 1, also including communicating at least one of the one or more manufacturing recipes directly to a memory device attached to a wafer carrier or prescribed to a particular wafer lot.

23. The computer implemented method of claim 1, also including using the pattern dependent model to predict or simulate electrical performance or electrical parameters as a result of a single process step.

24. The computer implemented method of claim 1, also including using the pattern dependent model to predict or simulate electrical performance or electrical parameters as a result of more than one process steps or a process flow.

25. The computer implemented method of claim 1, also including using actual product wafers to develop the model, the model mapping pattern dependent features to at least one of process-induced variation in the one or more wafer state parameters or variation in electrical parameters.

26. The computer implemented method of claim 25, in which the pattern dependent features include at least one of lines pace, linewidth, and effective density.

27. The computer implemented method of claim 25, in which the one or more wafer state parameters include at least one of film thickness, array height, step height.

28. The computer implemented method of claim 25, in which the electrical parameters include at least one of sheet resistance, capacitance, crosstalk noise, and coupling capacitance.

29. The computer implemented method of claim 25, also including certifying manufacturability of the IC device before mask tape-out and manufacturing.

30. The computer implemented method of claim 1, also including simulating a final electrical performance of the IC before mask tape-out and manufacturing.

31. The computer implemented method of claim 1, also including determining a process flow, among several candidates, for an IC design.

32. The computer implemented method of claim 1, also including varying recipe parameters to characterize pattern dependencies in an IC manufacturing process.

33. The computer implemented method of claim 32, also including processing the recipe at points of a life cycle of the process to characterize process drift.

34. The computer implemented method of claim 33, in which the process drift comprises CMP pad wear or build up on the walls of a plasma reactor.

35. The computer implemented method of claim 1 implemented in software carried on a non-transitory computer accessible storage medium.

36. The computer implemented method of claim 1, also including providing a graphical user interface to permit a user to access results.

37. The computer implemented method of claim 1 used for process synthesis and implemented on a web server.

38. The computer implemented method of claim 1 used for process optimization and implemented on a web server.

39. The computer implemented method of claim 1 implemented on a web server.

40. The computer implemented method of claim 37, 38 or 39, also including generating custom web applications for the web server with respect to different users.

41. The computer implemented method of claim 1, also including identifying post-manufacture faults spatially across a die for one process step or multiple process steps in a flow.

42. The computer implemented method of claim 1, also including receiving, through a web server, manufacturability predictions for the IC using a particular process or tool.

43. The computer implemented method of claim 1, also including using a web server to provide automatically chosen recipe or equipment settings directly to a process tool or flow of process tools or steps.

44. The computer implemented method of claim 1, also including providing an optimization to a user from a web server in response to a single click.

45. The computer implemented method of claim 1, also including using at least an electrical impact analysis with the pattern dependent model to determine the one or more manufacturing recipes and one or more equipment settings.

46. The computer implemented method of claim 1, also including characterizing process drift and shifts over a number of process hours or a number of wafers processed.

47. The computer implemented method of claim 1, also including scheduling maintenance and repair of process tools.

48. The computer implemented method of claim 1, also including selecting consumable sets.

49. The computer implemented method of claim 1, in which the consumable sets include polishing pads, polishing slurries, or gas composition.

50. A system, comprising:
- at least one processor that is programmed for performing a process comprising:
  - using a pattern dependent model to determine one or more manufacturing recipes and one or more equipment settings for a process used to fabricate an integrated circuit (IC), wherein
    the one or more manufacturing recipes and the one or more equipment settings reduce process-induced variation in one or more wafer state parameters or electrical performance; and
  - performing an electrical impact analysis to adjust at least a part of an integrated circuit design of the integrated circuit to reduce an electrical impact that is caused by the process-induced variation or a variation of a feature of the integrated circuit design.

51. The system of claim 50, in which the at least one processor is programmed for performing the process, the process further comprising:
using a cost-function to measure results of one or more predictions of variation in wafer state or in one or more electrical parameters generated using at least the pattern dependent model.

52. The system of claim 51, in which the at least one processor is programmed for performing the process, the process further comprising:
using the cost function to compare one set of recipe or one or more equipment settings to another.

53. The system of claim 51, in which the at least one processor is programmed for performing the process, the process further comprising:
using optimization methods to select recipe and equipment settings that minimize variation in wafer-state or one or more electrical parameters.

54. The system of claim 51, in which the at least one processor is programmed for performing the process, the process further comprising:
using one or more optimization methods to select recipe and one or more equipment settings that minimize variation in the wafer-state or the one or more electrical parameters, in which the one or more optimization methods include at least one of simplex, conjugate gradient, simulated annealing, dynamic programming, approximate dynamic programming, linear programming, and approximate linear programming.

55. The system of claim 51, in which the at least one processor is programmed for performing the process, the process further comprising:
using one or more optimization methods to select recipe and one or more equipment settings that minimize variation in wafer-state or one or more electrical parameters, in which the one or more optimization methods include at least one of simplex, conjugate gradient, simulated annealing, dynamic programming, approximate dynamic programming, linear programming, and approximate linear programming; and
using one or more quadratic cost functions to facilitate convergence of the one or more optimization methods.

56. An article of manufacture comprising a non-transitory computer readable storage medium having stored thereupon a sequence of instructions which, when executed by at least one processor, causes the at least one processor to execute a process, the process comprising:
using the at least one processor that is programmed for performing a process comprising:
using a pattern dependent model to determine one or more manufacturing recipes and one or more equipment settings for a process used to fabricate an integrated circuit (IC), wherein
the one or more manufacturing recipes and the one or more equipment settings reduce process-induced variation in one or more wafer state parameters or electrical performance; and
performing an electrical impact analysis to adjust at least a part of an integrated circuit design of the integrated circuit to reduce an electrical impact that is caused by the process-induced variation or a variation of a feature of the integrated circuit design.

57. The article of manufacture of claim 56, the process further comprising:
using a cost-function to measure results of one or more predictions of variation in wafer state or in one or more electrical parameters generated using at least the pattern dependent model.

58. The article of manufacture of claim 57, the process further comprising:
using the cost function to compare one set of recipe or one or more equipment settings to another.

59. The article of manufacture of claim 57, the process further comprising:
using optimization methods to select recipe and equipment settings that minimize variation in wafer-state or one or more electrical parameters.

60. The article of manufacture of claim 57, the process further comprising:
using one or more optimization methods to select recipe and one or more equipment settings that minimize variation in the wafer-state or the one or more electrical parameters, in which the one or more optimization methods include at least one of simplex, conjugate gradient, simulated annealing, dynamic programming, approximate dynamic programming, linear programming, and approximate linear programming.

61. The article of manufacture of claim 57, the process further comprising:
using one or more optimization methods to select recipe and one or more equipment settings that minimize variation in wafer-state or one or more electrical parameters, in which the one or more optimization methods include at least one of simplex, conjugate gradient, simulated annealing, dynamic programming, approximate dynamic programming, linear programming, and approximate linear programming; and
using one or more quadratic cost functions to facilitate convergence of the one or more optimization methods.

* * * * *